US012178116B2

(12) United States Patent
Lee et al.

(10) Patent No.: US 12,178,116 B2
(45) Date of Patent: Dec. 24, 2024

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicants: Samsung Electronics Co., Ltd., Suwon-si (KR); Korea Advanced Institute of Science and Technology, Daejeon (KR)

(72) Inventors: Kum Hee Lee, Suwon-si (KR); Seungyeon Kwak, Suwon-si (KR); Aram Jeon, Seoul (KR); Whail Choi, Seoul (KR); Kyuyoung Hwang, Anyang-si (KR); Yoonhyun Kwak, Seoul (KR); Sangdong Kim, Seongnam-si (KR); Won-joon Son, Yongin-si (KR); Byoungki Choi, Hwaseong-si (KR); Hyeonho Choi, Seoul (KR); Wooyoun Kim, Daejeon (KR)

(73) Assignees: SAMSUNG ELECTRONICS CO., LTD., Gyeonggi-Do (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 155 days.

(21) Appl. No.: 17/038,319

(22) Filed: Sep. 30, 2020

(65) Prior Publication Data

US 2022/0013734 A1 Jan. 13, 2022

(30) Foreign Application Priority Data

Feb. 17, 2020 (KR) ........................ 10-2020-0019077

(51) Int. Cl.
*H01L 51/00* (2006.01)
*C07F 15/00* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
CPC ............. H01L 51/0085; H01L 51/0067; C07F 15/0033; C09K 2211/185; C09K 2211/1044; H10K 85/342; H10K 85/654
See application file for complete search history.

(56) References Cited

U.S. PATENT DOCUMENTS 9,554,442 B2 1/2017 Kamatani et al.
2007/0122655 A1* 5/2007 Deaton ............... C07F 15/0033 428/917
(Continued)

FOREIGN PATENT DOCUMENTS

CN 107827933 A 3/2018
KR 20180052096 A 5/2018
(Continued)

OTHER PUBLICATIONS

Sylvia M. Draper et al., "Complexed Nitrogen Heterosuperbenzene: The Coordinating Properties of a Remarkable Ligand," J. Am. Chem. Soc., Jun. 22, 2004, pp. 8694-8701, vol. 126.
(Continued)

*Primary Examiner* — Alexander C Kollias
(74) *Attorney, Agent, or Firm* — CANTOR COLBURN LLP

(57) ABSTRACT

An organometallic compound represented by Formula 1:

$$M(L_1)_{n1}(L_2)_{n2} \quad \text{Formula 1}$$

In Formula 1, M is a transition metal; $L_1$ is a ligand represented by Formula 2 as disclosed herein; $L_2$ is a monodentate ligand, a bidentate ligand, a tridentate ligand, or a tetradentate ligand; n1 is 1, 2, or 3, wherein, when n1 is 2 or greater, ligands $L_1$ are identical to or different from each other; and n2 is 0, 1, 2, 3, or 4, wherein, when n2 is 2 or greater, ligands $L_2$ are identical to or different from each other.

15 Claims, 1 Drawing Sheet

(51) Int. Cl.

| | |
|---|---|
| ***C09K 11/06*** | (2006.01) |
| ***H10K 85/30*** | (2023.01) |
| *H10K 50/11* | (2023.01) |
| *H10K 101/10* | (2023.01) |

(52) U.S. Cl.

CPC ................. *C09K 2211/1007* (2013.01); *C09K 2211/1044* (2013.01); *C09K 2211/1048* (2013.01); *C09K 2211/185* (2013.01); *H10K 50/11* (2023.02); *H10K 2101/10* (2023.02)

(56) References Cited

U.S. PATENT DOCUMENTS

2015/0105843 A1* 4/2015 Heun .................. A61N 5/0616 546/4
2016/0111661 A1* 4/2016 Boudreault .......... H10K 85/342 546/4
2018/0130956 A1* 5/2018 Boudreault ......... H01L 51/0085
2018/0277774 A1 9/2018 Boudreault et al.
2019/0252619 A1* 8/2019 Tsai ....................... H10K 50/18
2020/0212319 A1 7/2020 Choi et al.
2021/0002311 A1* 1/2021 Ji ......................... H10K 85/342
2021/0101921 A1* 4/2021 Boudreault .......... H10K 85/346

FOREIGN PATENT DOCUMENTS

KR 1020200083198 A 7/2020
KR 20210004861 A 1/2021

OTHER PUBLICATIONS

Office Action issued Aug. 28, 2024 of KR Patent Application No. 10-2020-0019077.

* cited by examiner

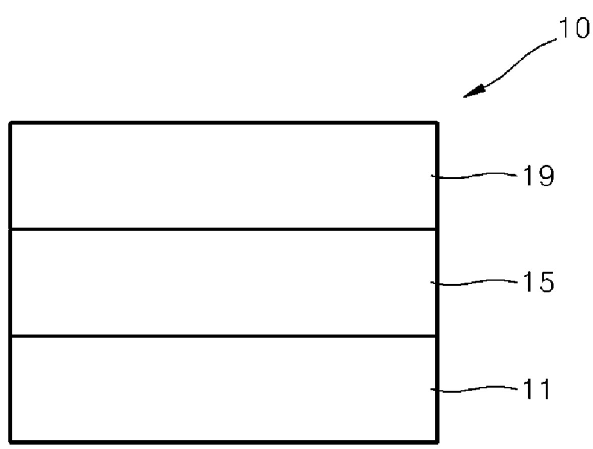
10
19
15
11

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims the benefit of and priority to Korean Patent Application No. 10-2020-0019077, filed on Feb. 17, 2020, in the Korean Intellectual Property Office, and all the benefits accruing therefrom under 35 U.S.C. § 119, the content of which is incorporated herein in its entirety by reference.

BACKGROUND

1. Field

One or more embodiments relate to an organometallic compound, an organic light-emitting device including the same, and an electronic apparatus including the organic light-emitting device.

2. Description of Related Art

Organic light-emitting devices (OLEDs) are self-emission devices, which have improved characteristics in terms of viewing angles, response times, brightness, driving voltage, and response speed, and produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

SUMMARY

One or more embodiments relate to an organometallic compound, an organic light-emitting device including the same, and an electronic apparatus including the organic light-emitting device.

Additional aspects will be set forth in part in the description which follows and, in part, will be apparent from the description, or may be learned by practice of the presented embodiments of the disclosure.

According to an aspect, provided is an organometallic compound represented by Formula 1.

$$M(L_1)_{n1}(L_2)_{n2} \quad \text{Formula 1}$$

In Formula 1,

M is a transition metal, $L_1$ is a ligand represented by Formula 2, n1 is 1, 2, or 3, wherein, when n1 is 2 or greater, two or more ligands $L_1$ are identical to or different from each other, $L_2$ is a monodentate ligand, a bidentate ligand, a tridentate ligand, or a tetradentate ligand, n2 is 0, 1, 2, 3, or 4, and wherein, when n2 is 2 or greater, two or more ligands $L_2$ are identical to or different from each other, and $L_1$ and $L_2$ are different from each other, Formula 2

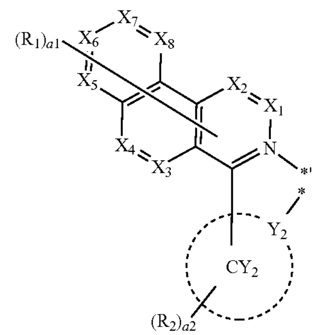

In Formula 2, $X_1$ to $X_8$ are each independently C or N, and at least one of $X_1$ to $X_8$ is N, $Y_2$ is C or N, ring $CY_2$ is a first ring or a condensed ring in which a first ring and at least one second ring are condensed with each other, wherein the first ring is a 6-membered ring, and the second ring is a $C_5$-$C_{30}$ carbocyclic group or a $C_1$-$C_{30}$ heterocyclic group, wherein one ring-forming atom of the first ring is $Y_2$ in Formula 2, $R_1$ and $R_2$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, a1 is an integer from 0 to 7, a2 is an integer from 0 to 20, two or more of a plurality of groups $R_1$ are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of groups $R_2$ are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as described in connection with $R_2$,

* and *' each indicate a binding site to M in Formula 1, substituents of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the $C_7$-$C_{60}$ alkylaryl group, the substituted $C_6$-$C_{60}$ aryloxy group, the substituted $C_6$-$C_{60}$ arylthio group, the substituted or unsubstituted $C_7$-$C_{60}$ arylalkyl group, the substituted $C_1$-$C_{60}$ heteroaryl group, the substituted or unsubstituted $C_1$-$C_{60}$ heteroaryloxy group, the substituted or unsubstituted $C_1$-$C_{60}$ heteroarylthio group, the substituted or unsubstituted $C_2$-$C_{60}$ heteroarylalkyl group, the substituted or unsubstituted $C_2$-$C_{60}$ alkylheteroaryl group, the substituted monovalent non-aromatic condensed polycyclic group, and the substituted monovalent non-aromatic condensed heteropolycyclic group are each independently:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, or $—P(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group, each unsubstituted or substituted with at least one of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, or $—P(Q_{28})(Q_{29})$;

$—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$; or a combination thereof; and $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with at least one of deuterium, a $C_1$-$C_{60}$ alkyl group, or a $C_6$-$C_{60}$ aryl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with at least one of deuterium, a $C_1$-$C_{60}$ alkyl group, or a $C_6$-$C_{60}$ aryl group; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a $C_2$-$C_{60}$ alkylheteroaryl group; a monovalent non-aromatic condensed polycyclic group; or a monovalent non-aromatic condensed heteropolycyclic group.

According to another aspect, provided is an organic light-emitting device including a first electrode, a second electrode, and an organic layer disposed between the first electrode and the second electrode and including an emission layer, wherein the organic layer includes at least one organometallic compound represented by Formula 1.

The organometallic compound may be included in the emission layer of the organic layer, and the organometallic compound included in the emission layer may act as a dopant.

According to another aspect, provided is an electronic apparatus including the organic light-emitting device.

BRIEF DESCRIPTION OF THE DRAWING

The above and other aspects, features, and advantages of certain embodiments of the disclosure will be more apparent from the following description taken in conjunction with the FIGURE, which shows a schematic cross-sectional view of an organic light-emitting device according to one or more embodiments.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects.

The terminology used herein is for the purpose of describing exemplary embodiments only and is not intended to be limiting. As used herein, the singular forms "a," "an," and "the" are intended to include the plural forms as well, unless the context clearly indicates otherwise. The term "or" means "and/or." As used herein, the term "and/or" includes any and all combinations of one or more of the associated listed items. Expressions such as "at least one of," when preceding a list of elements, modify the entire list of elements and do not modify the individual elements of the list.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10%, 5% of the stated value.

An aspect of the present disclosure provides an organometallic compound represented by Formula 1 below:

$$M(L_1)_{n1}(L_2)_{n2} \quad \text{Formula 1}$$

In Formula 1, M may be a transition metal.

For example, M may be a first-row transition metal of the Periodic Table of Elements, a second-row transition metal of the Periodic Table of Elements, or a third-row transition metal of the Periodic Table of Elements.

In an embodiment, M may be iridium (Ir), platinum (Pt), osmium (Os), titanium (Ti), zirconium (Zr), hafnium (Hf), europium (Eu), terbium (Tb), thulium (Tm)), or rhodium (Rh).

In an embodiment, M may be Ir, Pt, Os, or Rh.

In Formula 1, $L_1$ may be a ligand represented by Formula 2:

Formula 2

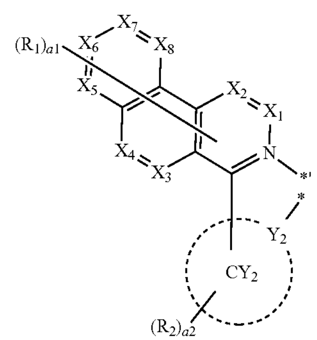

The groups $X_1$ to $X_8$, $R_1$, $R_2$, $CY_2$, $Y_2$, a1, and a2 of Formula 2 are the same as described in the present specification.

In Formula 1, n1 indicates the number of ligands $L_1$ and may be 1, 2, or 3. When n1 is 2 or greater, two or more of ligands $L_1$ may be identical to or different from each other. For example, n1 may be 1 or 2. As used herein, the term "ligand $L_1$" is interchangeable with the term "$L_1$ ligand" and both refer to an $L_1$ group in Formula 1.

In Formula 1, $L_2$ may be a monodentate ligand, a bidentate ligand, a tridentate ligand, or a tetradentate ligand. $L_2$ is the same as described in the present specification.

In Formula 1, n2 indicates the number of ligands $L_2$ and may be 0, 1, 2, 3, or 4. When n2 is 2 or greater, two or more ligands $L_2$ may be identical to or different from each other. For example, n2 may be 0, 1, or 2. As used herein, the term "ligand $L_2$" is interchangeable with the term "$L_2$ ligand" and both refer to an $L_2$ group in Formula 1.

In an embodiment, in Formula 1, i) M may be Ir or Os, and the sum of n1 and n2 may be 3 or 4; or ii) M may be Pt, and the sum of n1 and n2 may be 2.

In Formula 1, $L_1$ and $L_2$ may be different from each other.

In Formula 2, $X_1$ to $X_8$ may each independently be C or N, and at least one of $X_1$ to $X_8$ may be N.

In an embodiment, one or two of $X_1$ to $X_8$ in Formula 2 may be N.

In one or more embodiments, $X_2$ in Formula 2 may be N.

In one or more embodiments, in Formula 2, 1) $X_2$ may be N, 2) $X_2$ and $X_6$ may be N, or 3) $X_2$ and $X_7$ may be N.

In Formula 1, $Y_2$ may be C or N.

For example, $Y_2$ in Formula 2 may be C.

In Formula 2, ring $CY_2$ may be a first ring or a condensed ring in which a first ring and at least one second ring are condensed with each other, wherein the first ring is a 6-membered ring, and the second ring is a $C_5$-$C_{30}$ carbocyclic group or a $C_1$-$C_{30}$ heterocyclic group, wherein one ring-forming atom of the first ring may be $Y_2$ in Formula 2. Accordingly, one of the ring-forming atoms of the first ring, which may be a first ring alone or a first ring that is condensed with the at least one second ring, may be $Y_2$ in Formula 2 and thus $Y_2$ represents a ring-forming atom of the first ring.

For example, the first ring may be a cyclohexane group, a cyclohexene group, a benzene group, a pyridine group, a pyrimidine group, a pyrazine group, a pyridazine group, or a triazine group, and the second ring may be a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In an embodiment, ring $CY_2$ in Formula 2 may be a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In one or more embodiments, ring $CY_2$ in Formula 2 may be a benzene group, a naphthalene group, a 1,2,3,4-tetrahydronaphthalene group, a carbazole group, a fluorene group, a dibenzosilole group, a dibenzothiophene group, a dibenzofuran group, an azacarbazole group, an azafluorene group, an azadibenzosilole group, an azadibenzothiophene group, an azadibenzofuran group, a pyridine group, a pyrimidine group, a pyrazine group, or a pyridazine group.

In Formula 2, $R_1$ and $R_2$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$.

For example, $R_1$ and $R_2$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_2$-$C_{20}$ alkenyl group, a $C_1$-$C_{20}$ alkoxy group, or a $C_1$-$C_{20}$ alkylthio group;

a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group(bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group; or —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), wherein $Q_1$ to $Q_9$ may each independently be:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, or a phenyl group.

In one or more embodiments, $R_1$ and $R_2$ in Formula 2 may each independently be hydrogen, deuterium, —F, —$CH_3$, —$CD_3$, —$CD_2H$, —$CDH_2$, —$CF_3$, —$CF_2H$, —$CFH_2$, a $C_2$-$C_{10}$ alkenyl group, a $C_1$-$C_{10}$ alkoxy group, a $C_1$-$C_{10}$ alkylthio group, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201- to 9-237, a group represented by one of Formulae 9-201 to 9-237 in which at least one hydrogen is substituted with deuterium, a group represented by one of Formulae 9-201 to 9-237 in which at least one hydrogen is substituted with —F, a group represented by one of Formulae 10-1 to 10-129, a group represented by one of Formulae 10-1 to 10-129 in which at least one hydrogen is substituted with deuterium, a group represented by one of Formulae 10-1 to 10-129 in which at least one hydrogen is substituted with —F, a group represented by one of Formulae 10-201 to 10-350, a group represented by one of Formulae 10-201 to 10-350 in which at least one hydrogen is substituted with deuterium, a group represented by one of Formulae 10-201 to 10-350 in which at least one hydrogen is substituted with —F, —Si($Q_3$)($Q_4$)($Q_5$), or —Ge($Q_3$)($Q_4$)($Q_5$) (wherein $Q_3$ to $Q_5$ are the same as described in the present specification):

9-1
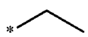
9-2
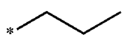
9-3
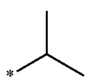
9-4
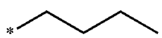
9-5
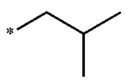
9-6
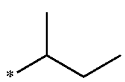
9-7
9-8
9-9
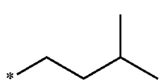
9-10
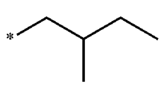
9-11
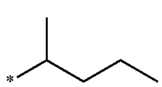
9-12
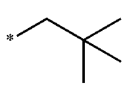
9-13
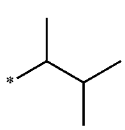
9-14
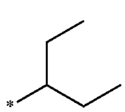

-continued 9-15
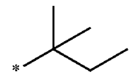
9-16
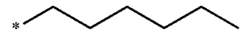
9-17
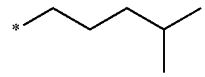
9-18
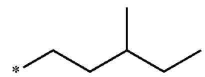
9-19
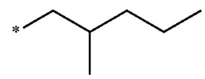
9-20
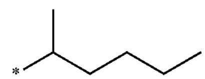
9-21
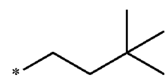
9-22
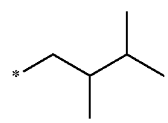
9-23
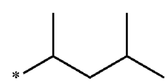
9-24
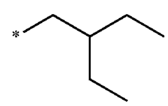
9-25
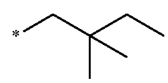
9-26
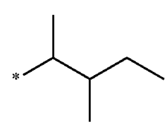
9-27
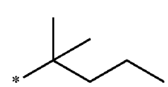
9-28
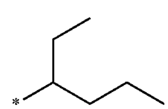
9-29
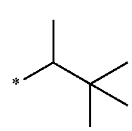
9-30
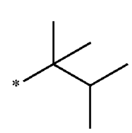

-continued
9-31
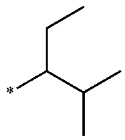
9-32
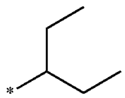
9-33
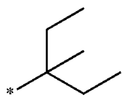
9-34
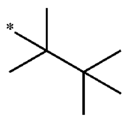
9-35
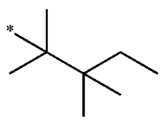
9-36
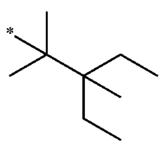
9-37
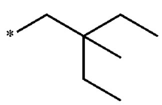
9-38
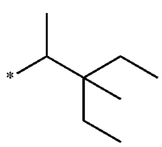
9-39
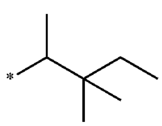
9-201
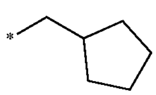
9-202
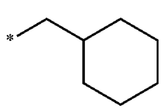
9-203
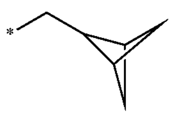
9-204
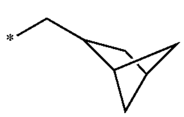
-continued
9-205
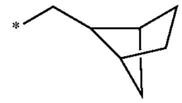
9-206
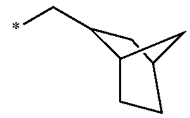
9-207
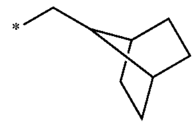
9-208
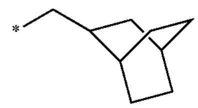
9-209
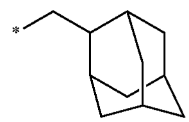
9-210
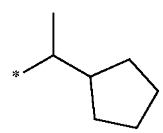
9-211
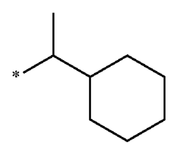
9-212
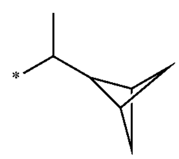
9-213
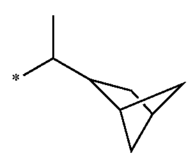
9-214
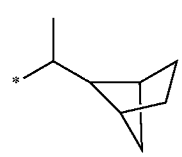
9-215
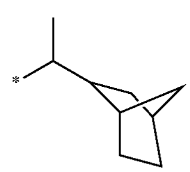

-continued
9-216
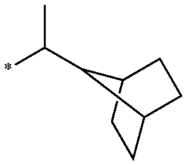
9-217
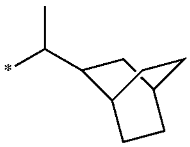
9-218
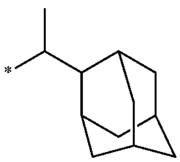
9-219
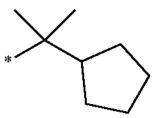
9-220
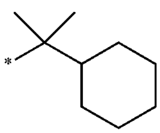
9-221
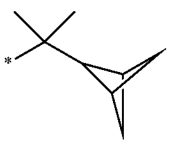
9-222
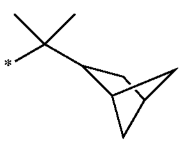
9-223
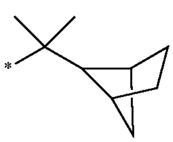
9-224
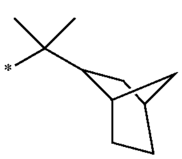
9-225
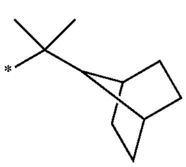
-continued
9-226
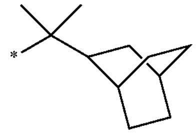
9-227
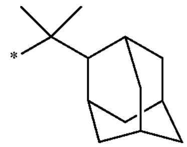
9-228
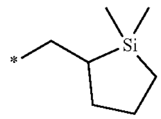
9-229
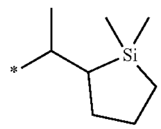
9-230
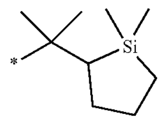
9-231
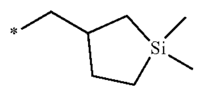
9-232
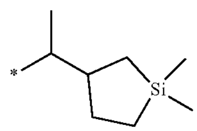
9-233
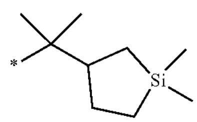
9-234
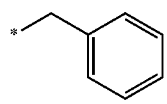
9-235
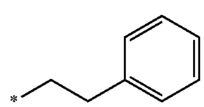
9-236
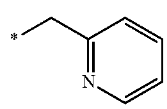
9-237
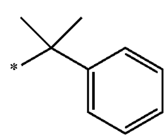
10-1
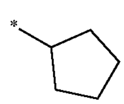

-continued
10-2
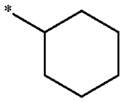
10-3
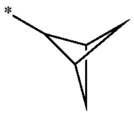
10-4
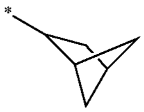
10-5
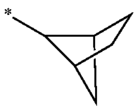
10-6
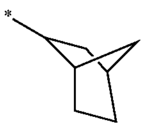
10-7
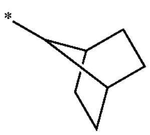
10-8
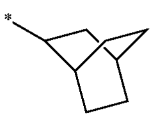
10-9
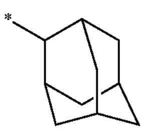
10-10
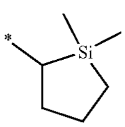
10-11
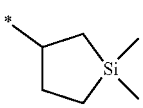
10-12
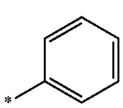
10-13
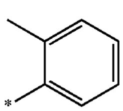
10-14
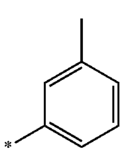
-continued
10-15
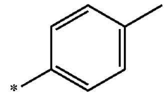
10-16
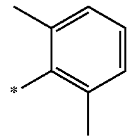
10-17
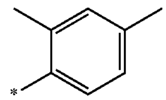
10-18
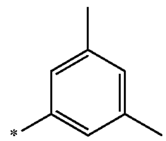
10-19
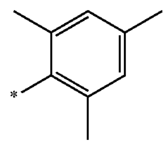
10-20
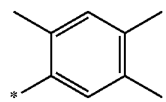
10-21
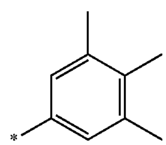
10-22
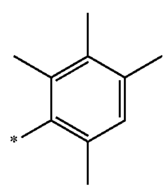
10-23
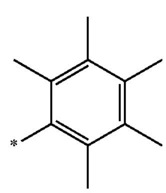
10-24
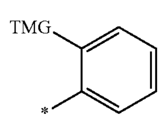
10-25
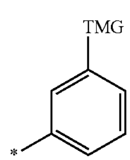

-continued
10-26
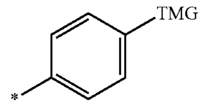
10-27
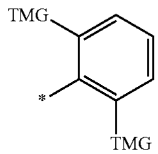
10-28
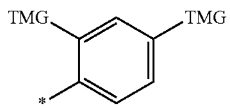
10-29
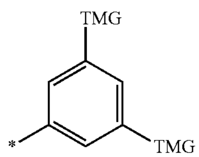
10-30
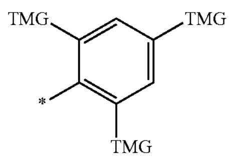
10-31
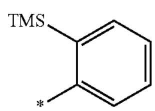
10-32
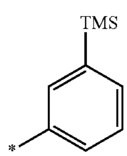
10-33
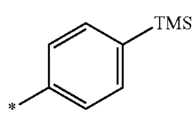
10-34
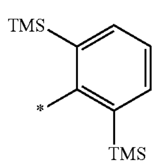
10-35
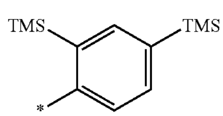
10-36
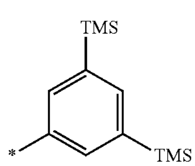
-continued
10-37
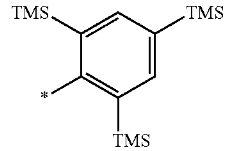
10-38
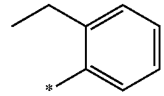
10-39
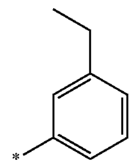
10-40
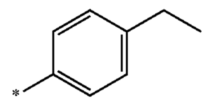
10-41
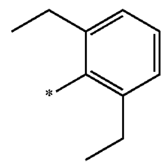
10-42
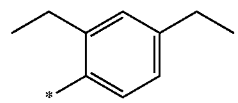
10-43
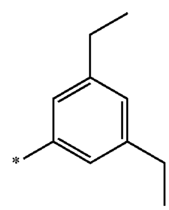
10-44
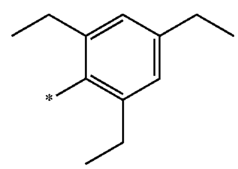
10-45
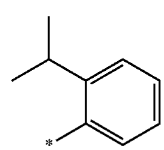
10-46
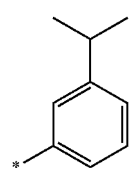

-continued
10-47
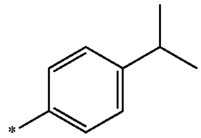
10-48
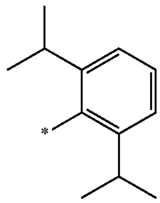
10-49
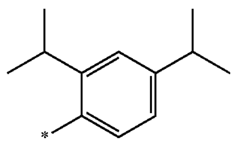
10-50
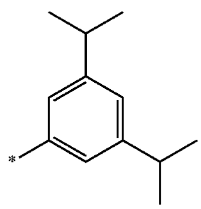
10-51
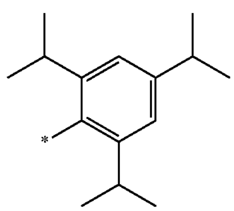
10-52
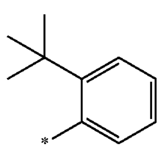
10-53
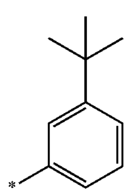
10-54
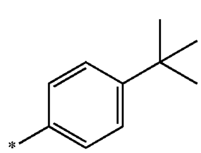
-continued
10-55
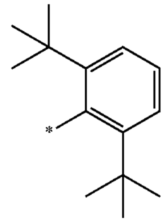
10-56
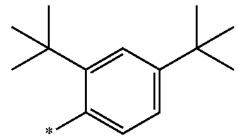
10-57
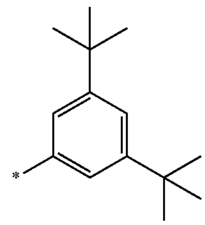
10-58
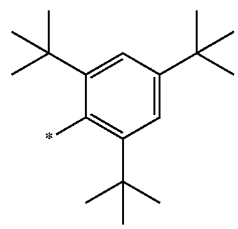
10-59
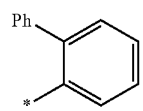
10-60
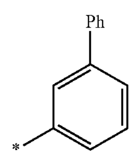
10-61
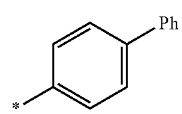
10-62
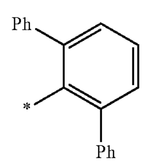
10-63
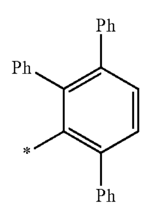

-continued
10-64
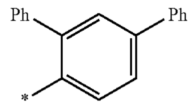
10-65
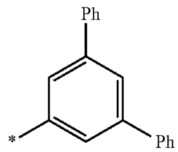
10-66
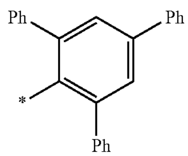
10-67
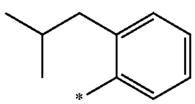
10-68
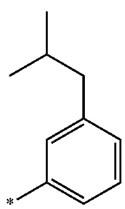
10-69
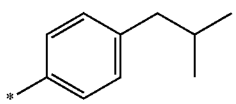
10-70
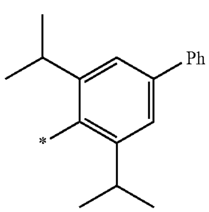
10-71
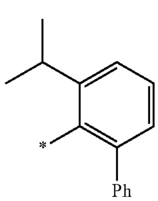
10-72
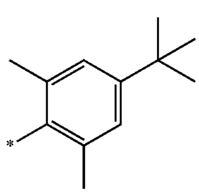
-continued
10-73
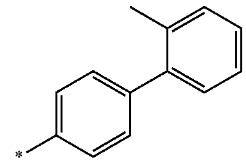
10-74
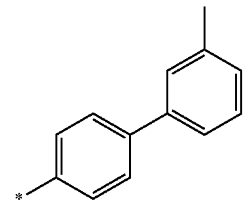
10-75
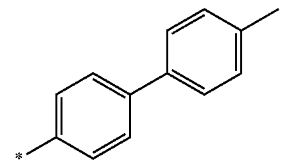
10-76
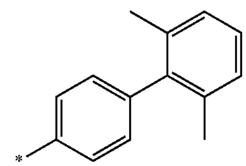
10-77
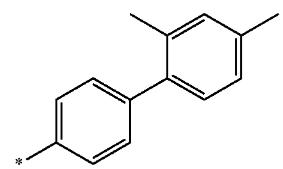
10-78
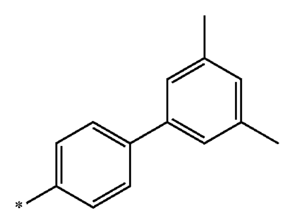
10-79
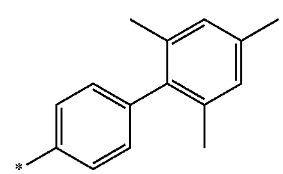
10-80
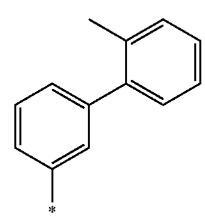

-continued
10-81
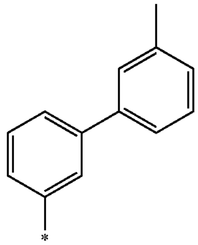
10-82
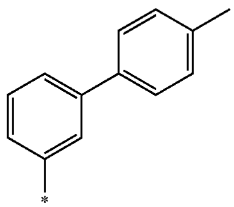
10-83
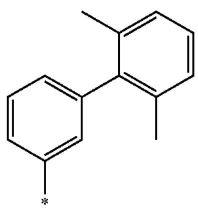
10-84
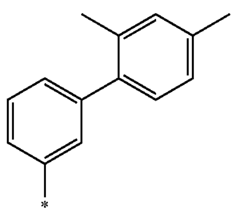
10-85
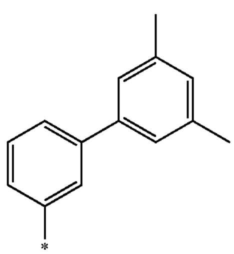
10-86
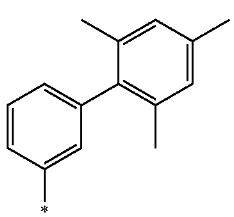
10-87
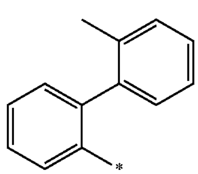
-continued
10-88
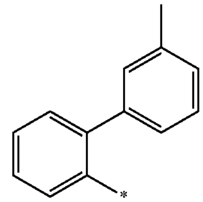
10-89
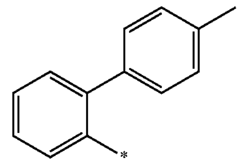
10-90
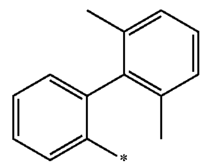
10-91
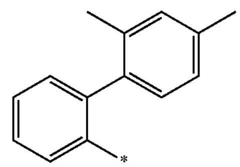
10-92
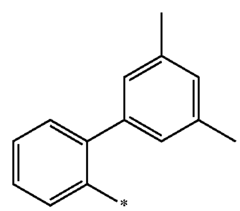
10-93
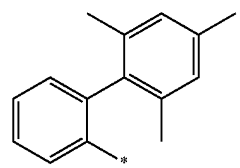
10-94
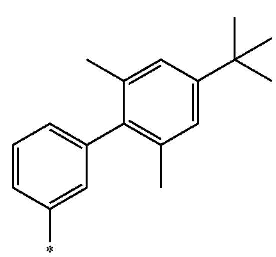
10-95
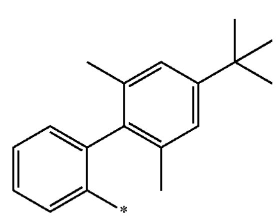

-continued
10-96
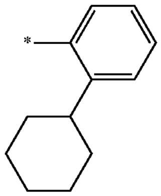
10-97
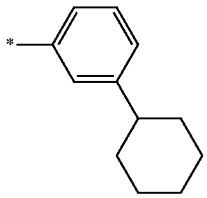
10-98
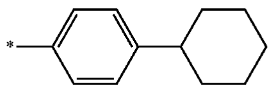
10-99
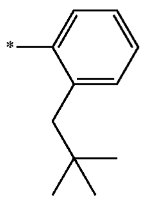
10-100
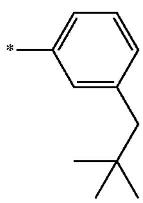
10-101
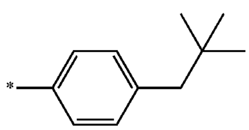
10-102
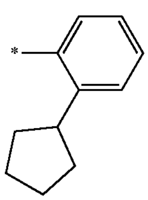
10-103
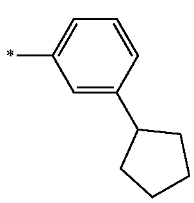
10-104
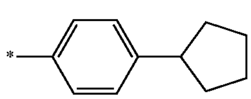
-continued
10-105
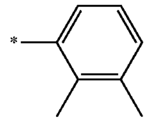
10-106
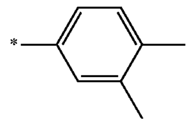
10-107
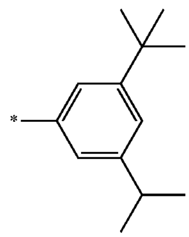
10-108
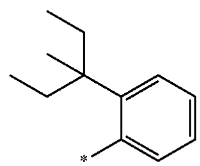
10-109
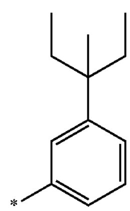
10-110
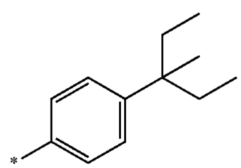
10-111
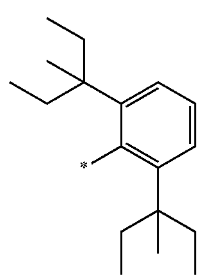
10-112
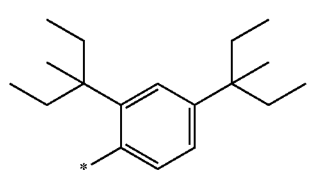

-continued
10-113
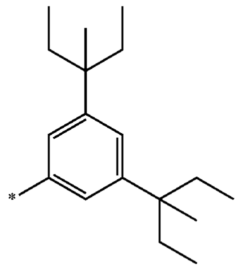
10-114
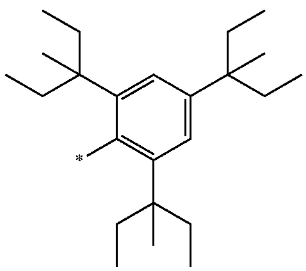
10-115
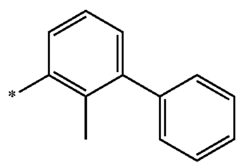
10-116
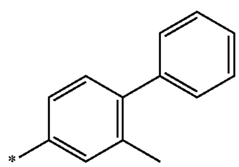
10-117
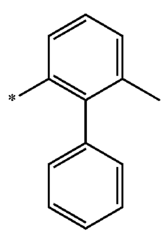
10-118
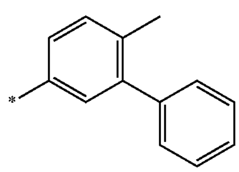
10-119
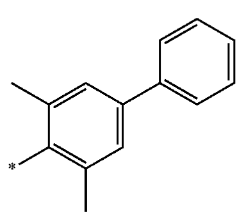
-continued
10-120
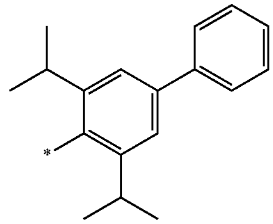
10-121
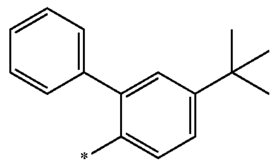
10-122
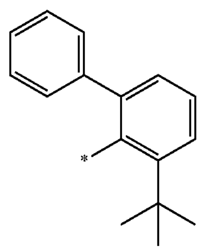
10-123
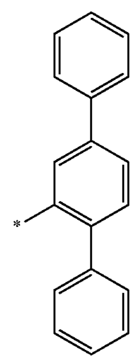
10-124
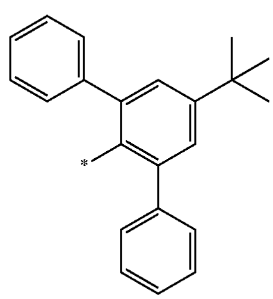
10-125
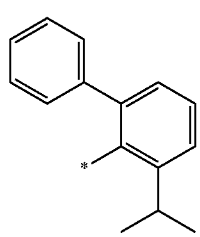

10-126
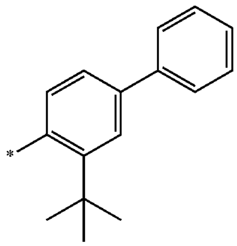
10-127
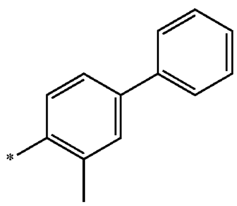
10-128
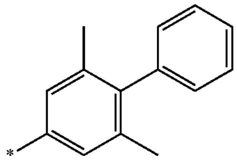
10-129
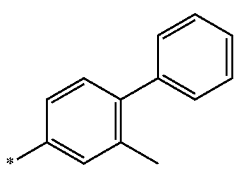
10-201
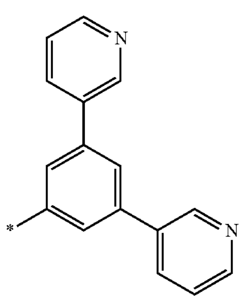
10-202
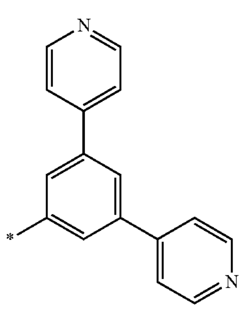
10-203
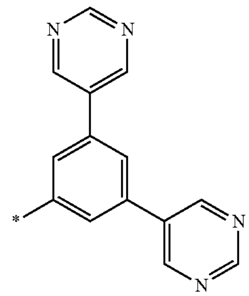
10-204
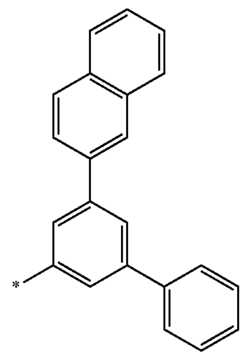
10-205
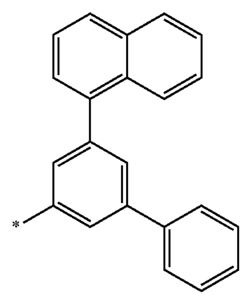
10-206
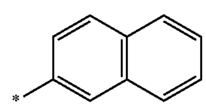
10-207
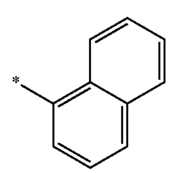
10-208
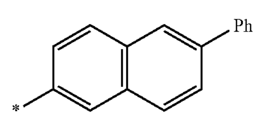
10-209
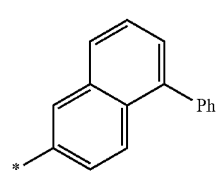

-continued
10-210
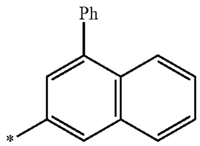
10-211
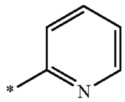
10-212
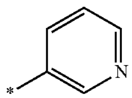
10-213
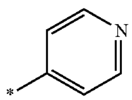
10-214
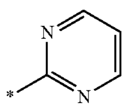
10-215
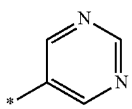
10-216
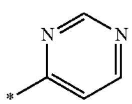
10-217
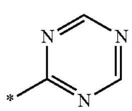
10-218
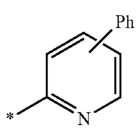
10-219
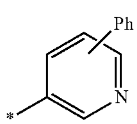
10-220
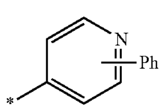
10-221
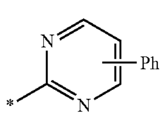
10-222
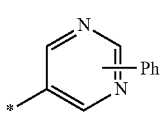
-continued
10-223
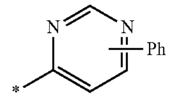
10-224
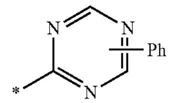
10-225
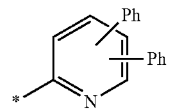
10-226
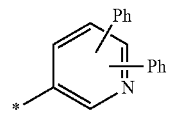
10-227
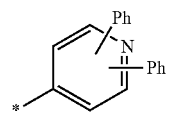
10-228
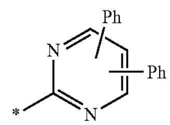
10-229
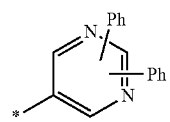
10-230
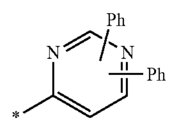
10-231
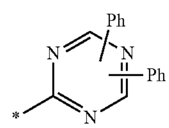
10-232
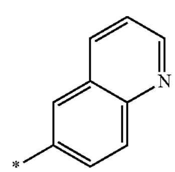
10-233
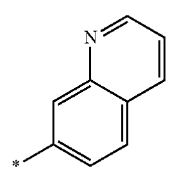
10-234
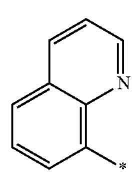

-continued
1-235
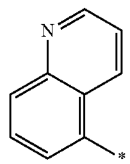
10-236
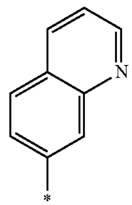
10-237
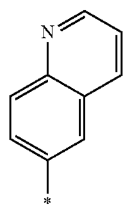
10-238
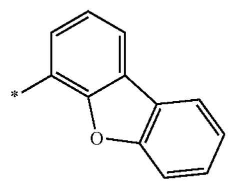
10-239
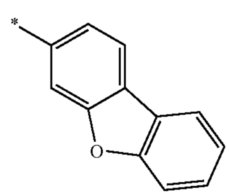
10-240
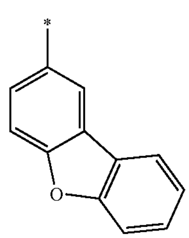
10-241
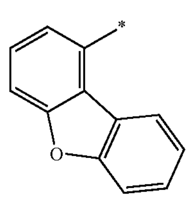
10-242
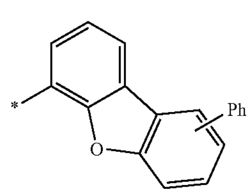
-continued
10-243
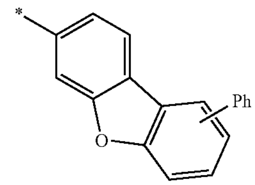
10-244
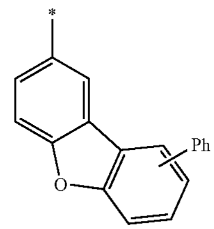
10-245
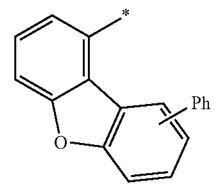
10-246
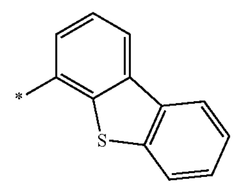
10-247
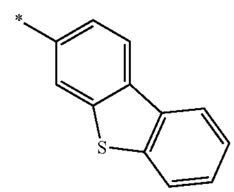
10-248
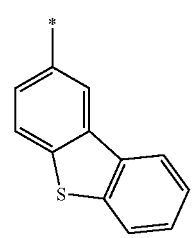
10-249
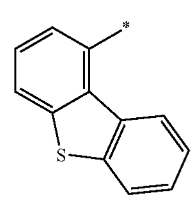
10-250
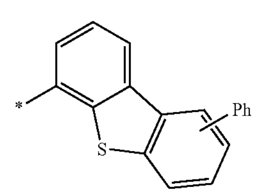

-continued
10-251
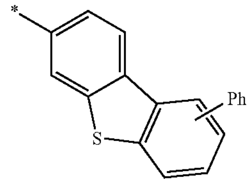
10-252
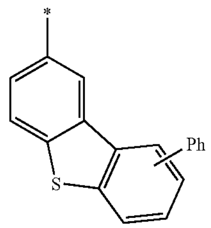
10-253
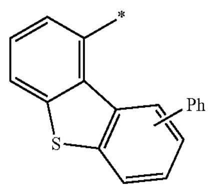
10-254
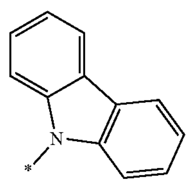
10-255
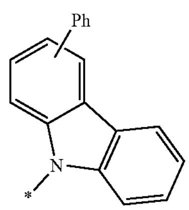
10-256
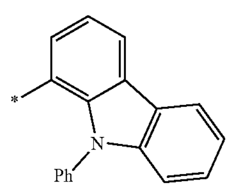
10-257
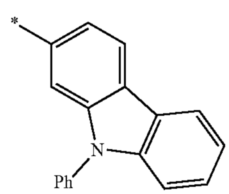
10-258
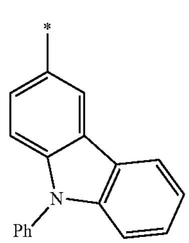
-continued
10-259
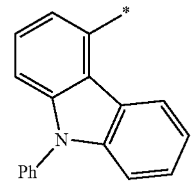
10-260
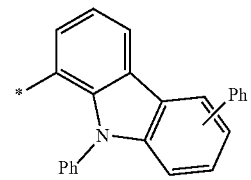
10-261
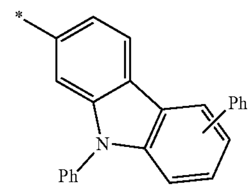
10-262
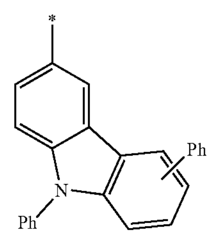
10-263
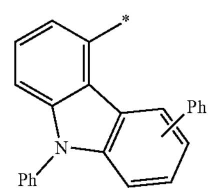
10-264
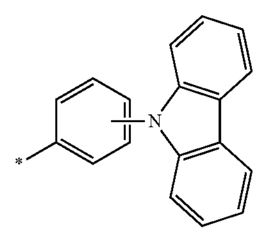
10-265
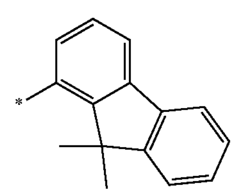
10-266
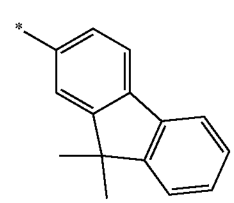

-continued
10-267
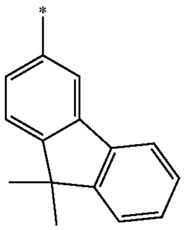
10-268
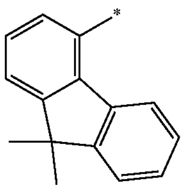
10-269
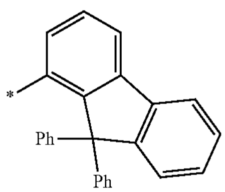
10-270
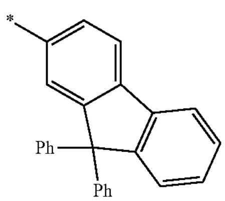
10-271
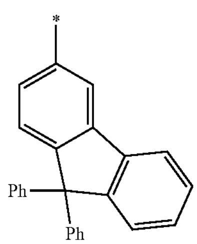
10-272
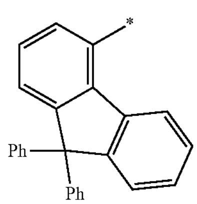
10-273
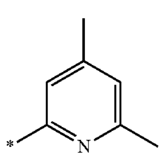
10-274
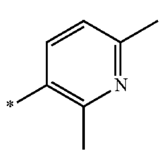
-continued
10-275
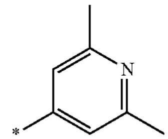
10-276
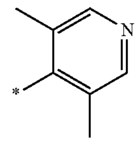
10-277
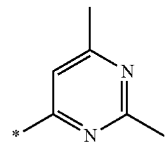
10-278
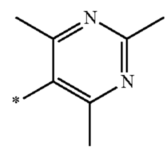
10-279
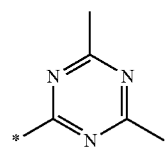
10-280
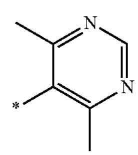
10-281
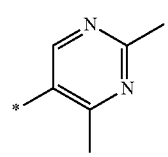
10-282
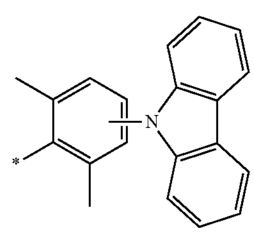
10-283
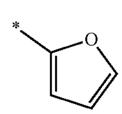
10-284
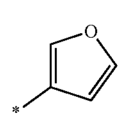

-continued
10-285
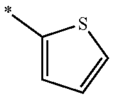
10-286
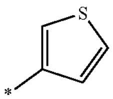
10-287
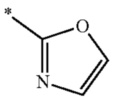
10-288
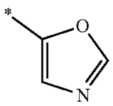
10-289
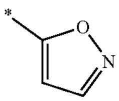
10-290
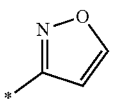
10-291
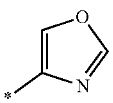
10-292
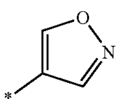
10-293
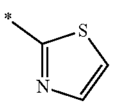
10-294
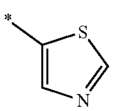
10-295
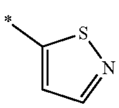
10-296
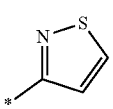
10-297
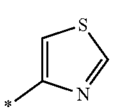
10-298
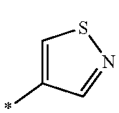
-continued
10-299
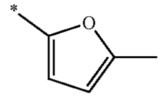
10-301
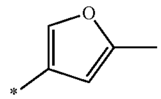
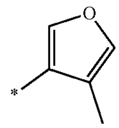
10-302
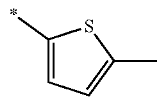
10-303
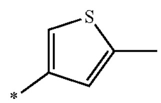
10-304
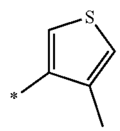
10-305
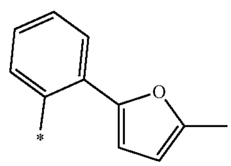
20-306
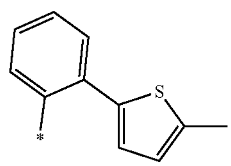
10-307
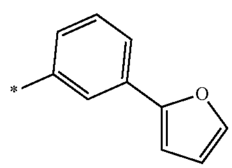
10-308
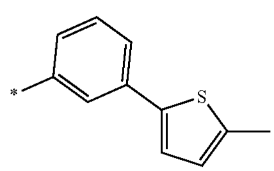
10-309
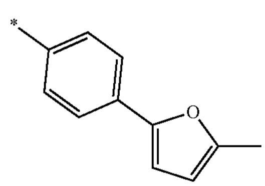

-continued
10-310
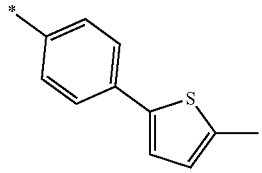
10-311
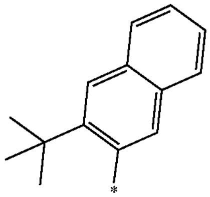
10-312
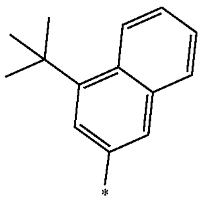
10-313
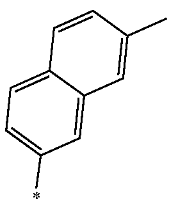
10-314
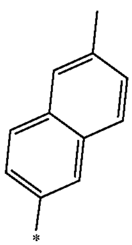
10-315
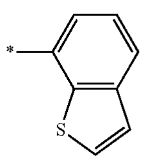
10-316
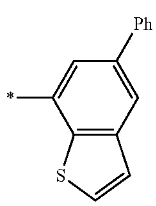
10-317
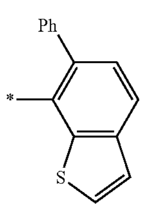
-continued
10-318
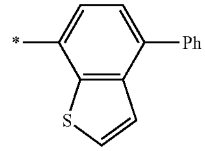
10-319
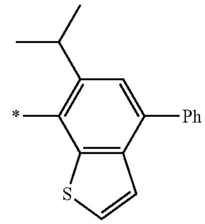
10-320
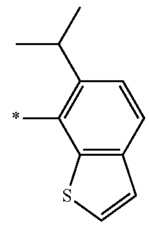
10-321
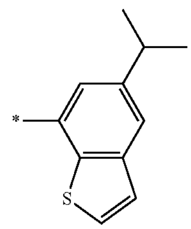
10-322
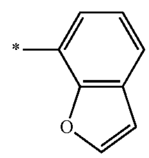
10-323
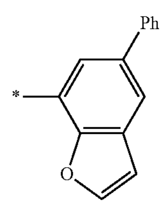
10-324
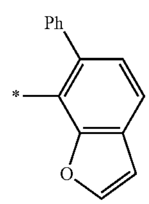
10-325
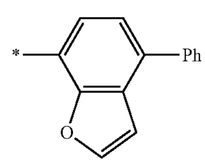

-continued
10-326
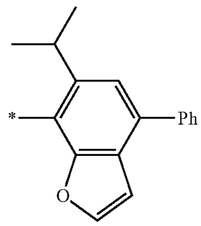
10-327
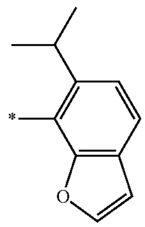
10-328
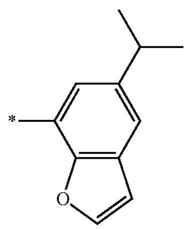
10-329
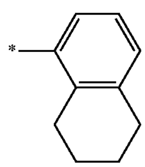
10-330
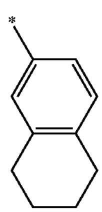
10-331
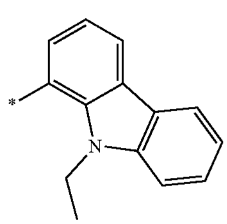
10-332
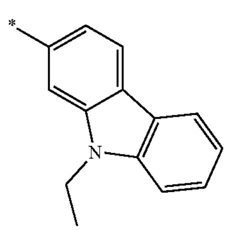
-continued
10-333
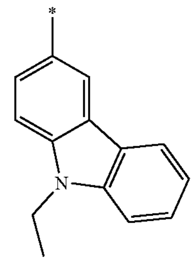
10-334
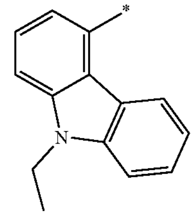
10-335
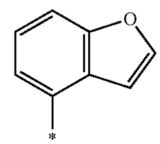
10-336
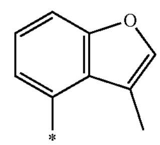
10-337
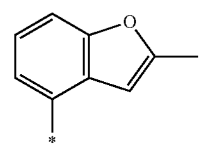
10-338
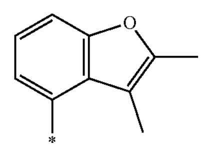
10-339
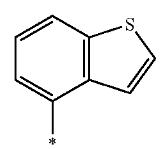
10-340
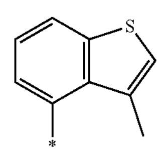
10-341
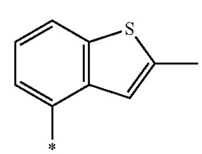

-continued 10-342

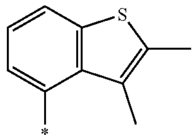

10-343

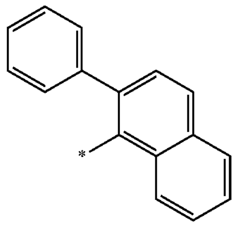

10-344

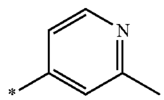

10-345

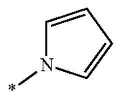

10-346

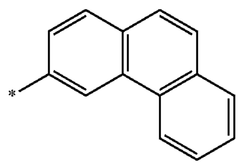

10-347

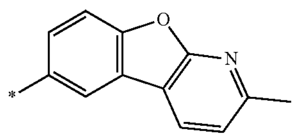

10-348

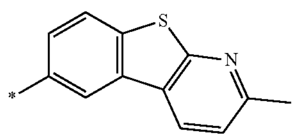

10-349

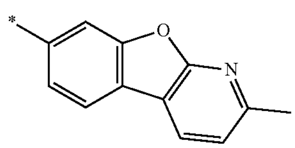

10-350

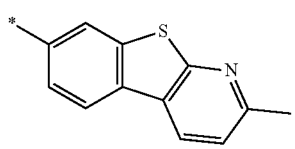

In Formulae 9-1 to 9-39, 9-201 to 9-237, 10-1 to 10-129, and 10-201 to 10-350 "*" indicates a binding site to a neighboring atom, Ph is a phenyl group, TMS is a trimethylsilyl group, and TMG is a trimethylgermyl group.

The "group represented by one of Formulae 9-1 to 9-39 in which at least one hydrogen is substituted with deuterium" and the "group represented by one of Formulae 9-201 to 9-237 in which at least one hydrogen is substituted with deuterium" may be, for example, a group represented by one of Formulae 9-501 to 9-514 and 9-601 to 9-636:

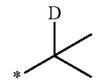

9-501

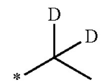

9-502

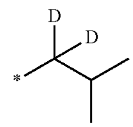

9-503

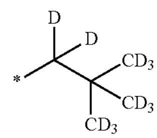

9-504

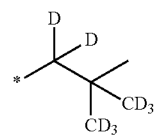

9-505

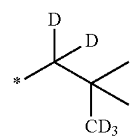

9-506

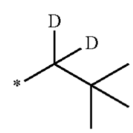

9-507

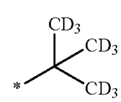

9-508

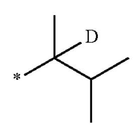

9-509

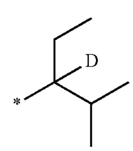

9-510

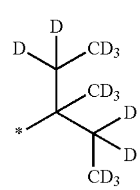

9-511

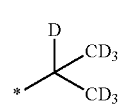

9-512

-continued
9-513
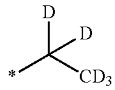
9-514
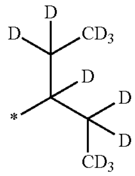
9-601
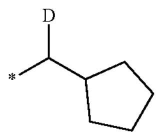
9-602
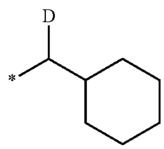
9-603
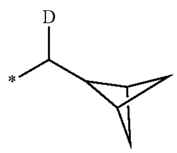
9-604
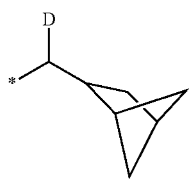
9-605
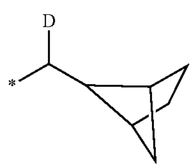
9-606
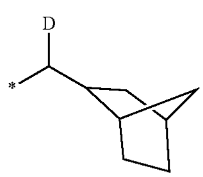
9-607
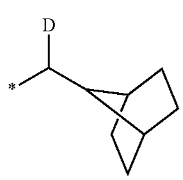
9-608
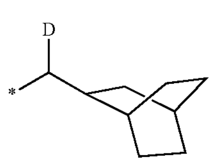
-continued
9-609
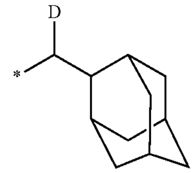
9-610
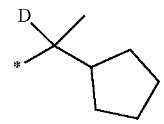
9-611
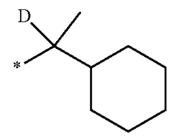
9-612
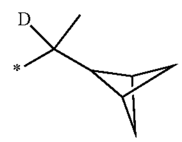
9-613
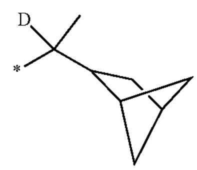
9-614
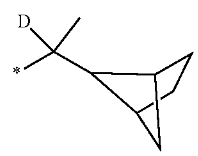
9-615
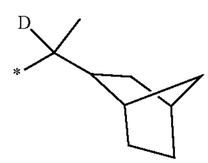
9-616
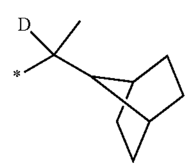
9-617
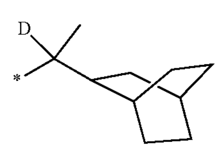
9-618
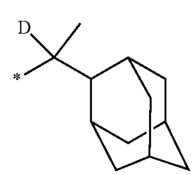

-continued
9-619
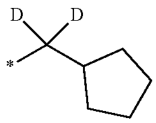
9-620
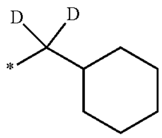
9-621
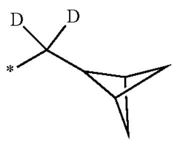
9-622
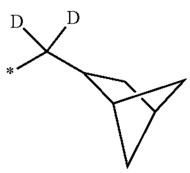
9-623
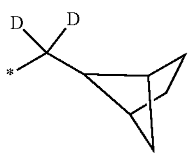
9-624
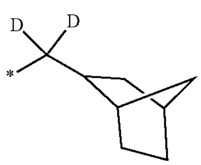
9-625
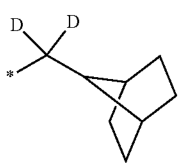
9-626
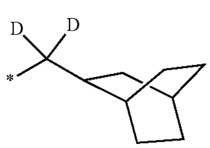
9-627
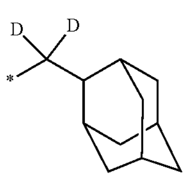
9-628
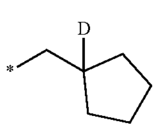
-continued
9-629
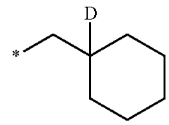
9-630
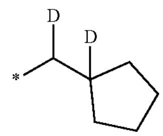
9-631
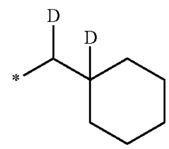
9-632
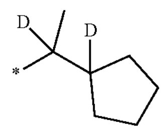
9-633
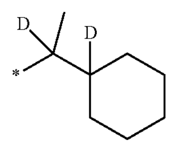
9-634
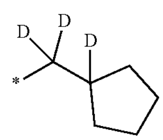
9-635
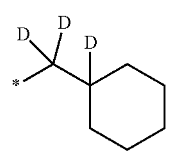
9-636
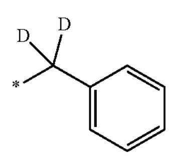
The "group represented by one of Formulae 9-1 to 9-39 in which at least one hydrogen is substituted with —F" and the "group represented by one of Formulae 9-201 to 9-237 in which at least one hydrogen is substituted with —F" may be, for example, a group represented by one of Formulae 9-701 to 9-710:
9-701
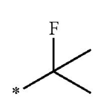
9-702
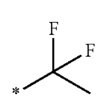

-continued
9-703
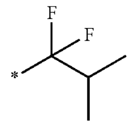
9-704
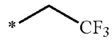
9-705
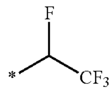
9-706
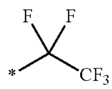
9-707
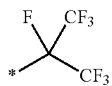
9-708
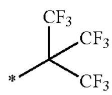
9-709
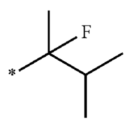
9-710
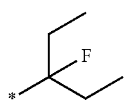
The "group represented by one of Formulae 10-1 to 10-129 in which at least one hydrogen is substituted with deuterium" and the "group represented by one of Formulae 10-201 to 10-350 in which at least one hydrogen is substituted with deuterium" may be, for example, a group represented by one of Formulae 10-501 to 10-553:
10-501
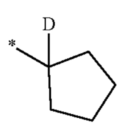
10-502
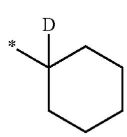
10-503
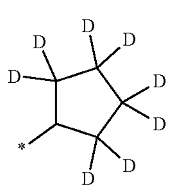
-continued
10-504
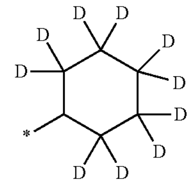
10-505
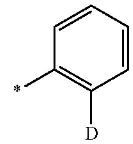
10-506
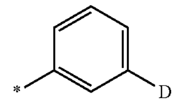
10-507
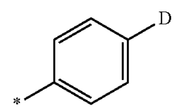
10-508
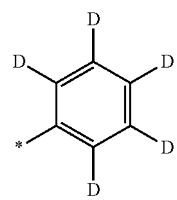
10-509
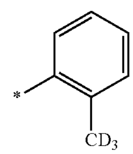
10-510
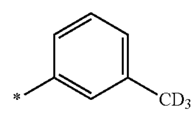
10-511
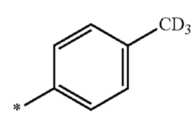
10-512
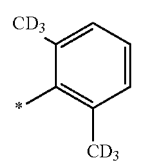
10-513
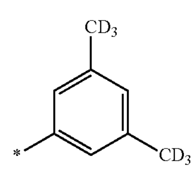

-continued
10-514
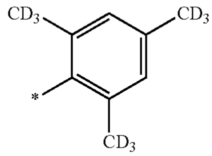
10-515
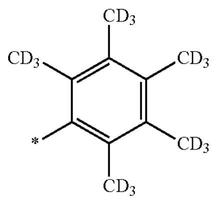
10-516
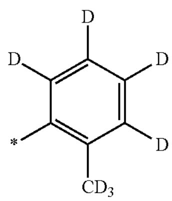
10-517
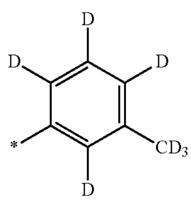
10-518
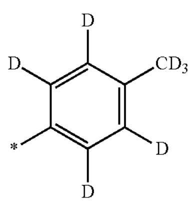
10-519
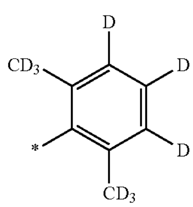
10-520
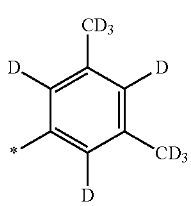
10-521
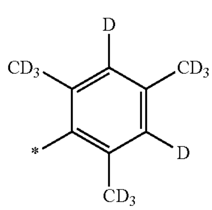
-continued
10-522
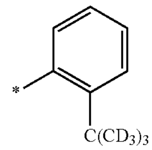
10-523
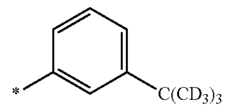
10-524
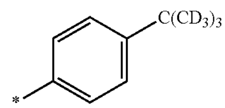
10-525
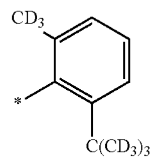
10-526
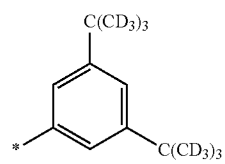
10-527
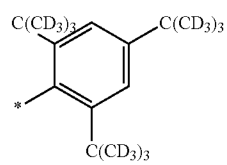
10-528
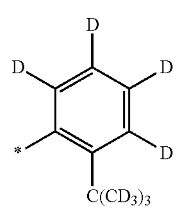
10-529
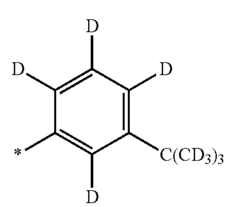
10-530
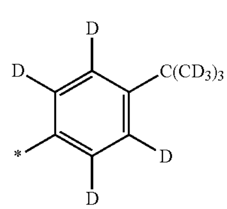

-continued
10-531
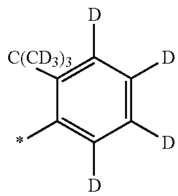
10-532
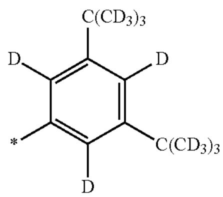
10-533
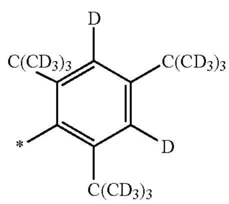
10-534
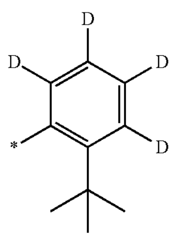
10-535
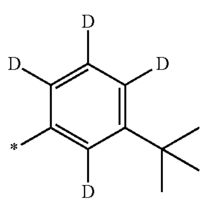
10-536
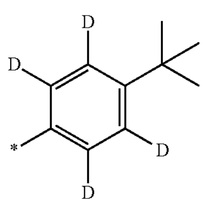
10-537
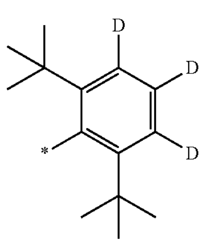
-continued
10-538
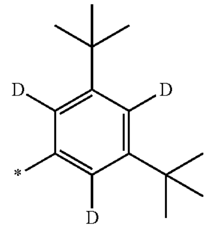
10-540
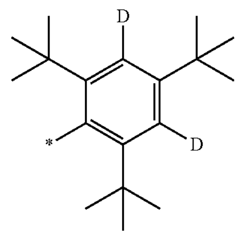
10-541
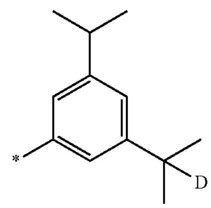
10-542
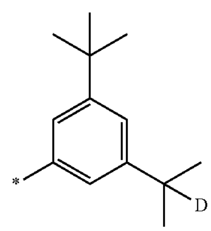
10-543
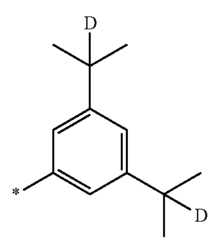
10-544
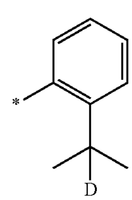
10-545
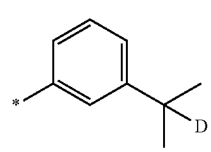

-continued
10-546
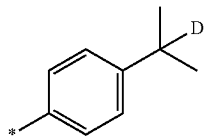
10-547
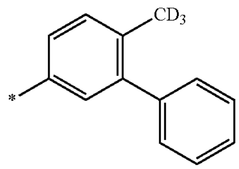
10-548
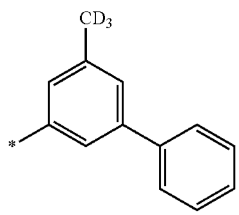
10-549
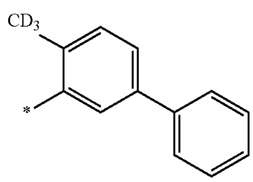
10-550
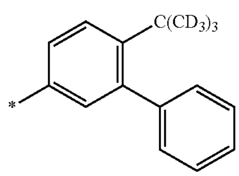
10-551
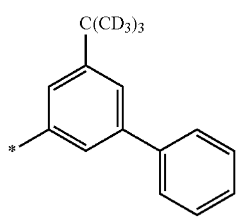
10-552
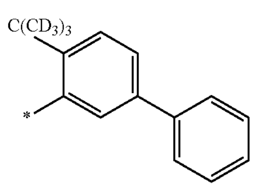
10-553
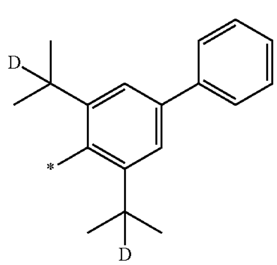
The "group represented by one of Formulae 10-1 to 10-129 in which at least one hydrogen is substituted with —F" and the "group represented by one of Formulae 10-201 to 10-350 in which at least one hydrogen is substituted with —F" may be, for example, a group represented by one of Formulae 10-601 to 10-617:
10-601
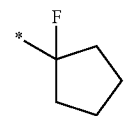
10-602
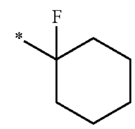
10-603
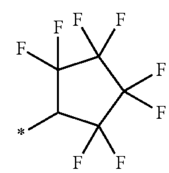
10-604
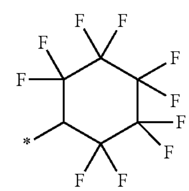
10-605
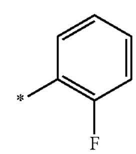
10-606
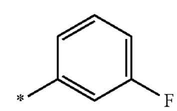
10-607
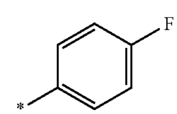
10-608
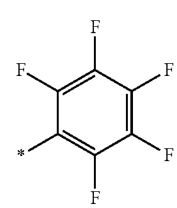
10-609
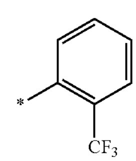
10-610
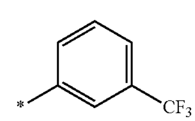

-continued 10-611

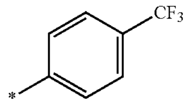

10-612

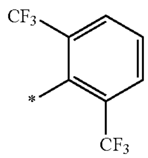

10-613

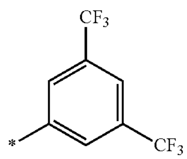

10-614

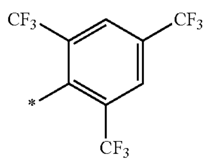

10-615

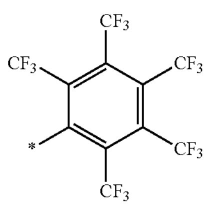

10-616

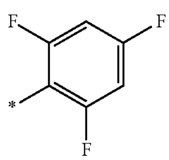

10-617

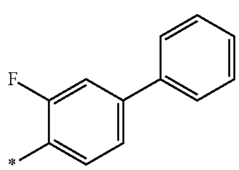

- a1 in Formula 2 indicates the number of groups $R_1$ and may be an integer from 0 to 7. When a1 is 2 or greater, two or more groups $R_1$ may be identical to or different from each other. For example, a1 may be 0, 1, 2, or 3.
- a2 in Formula 2 indicates the number of groups $R_2$ and may be an integer from 0 to 20. When a2 is 2 or greater, two or more of groups $R_2$ may be identical to or different from each other. For example, a2 may be an integer from 0 to 6.

In Formula 2, 1) two or more of a plurality of groups $R_1$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and 2) two or more of a plurality of groups $R_2$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$. Here, $R_{10a}$ is the same as described in connection with $R_2$ in the present specification.

In Formula 2, "*" and "*'" each indicate a binding site to M in Formula 1.

In an embodiment, a1 in Formula 2 may be an integer from 1 to 7, and $R_1$ may not be hydrogen.

In one or more embodiments, a group represented by

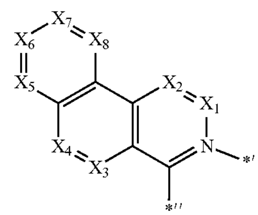

in Formula 2 may be represented by one of Formulae CY1-A to CY1-C:

CY1-A

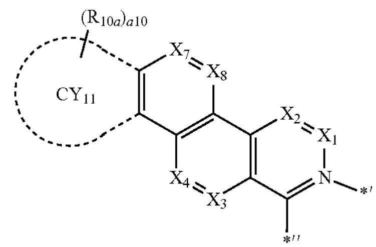

CY1-B

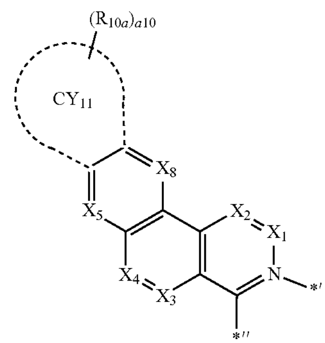

CY1-C

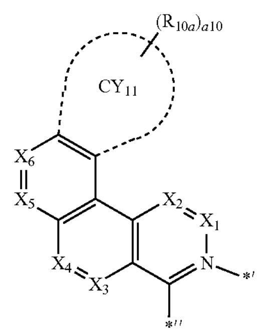

In Formulae CY1-A to CY1-C,

- $X_1$ to $X_8$ may each independently be C or N, at least one of $X_1$, $X_2$, $X_3$, $X_4$, $X_7$, and $X_8$ in Formula CY1-A may be N, at least one of $X_1$, $X_2$, $X_3$, $X_4$, $X_5$ and $X_8$ in Formula CY1-B may be N, and at least one of $X_1$ to $X_6$ in Formula CY1-C may be N,
- ring $CY_{11}$ may be a $C_5$-$C_{30}$ carbocyclic group or a $C_1$-$C_{30}$ heterocyclic group, $R_{10a}$ is the same as described in the present specification, a10 may be an integer from 0 to 20,

*' indicates a binding site to M in Formula 1, and

*" indicates a binding site to ring $CY_2$ in Formula 2.

For example, ring $CY_{11}$ in Formulae CY1-A to CY1-C may be a cyclohexane group, a benzene group, a naphthalene group, a pyridine group, or a pyrimidine group.

In one or more embodiments, a group represented by

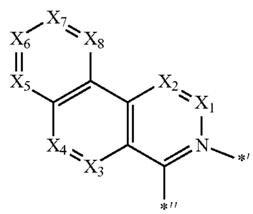

in Formula 2 may be represented by one of Formulae CY1-A(1) to CY1-C(1):

CY1-A(1)

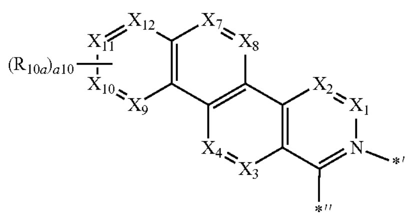

CY1-B(1)

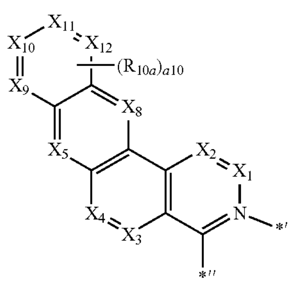

CY1-C(1)

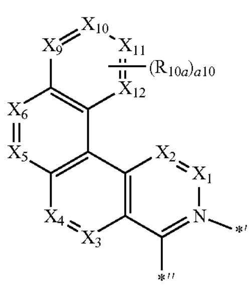

In Formulae CY1-A(1) to CY1-C(1), $X_1$ to $X_{12}$ may each independently be C or N, at least one of $X_1$, $X_2$, $X_3$, $X_4$, $X_7$, and $X_8$ in Formula CY1-A(1) may be N, at least one of $X_1$, $X_2$, $X_3$, $X_4$, $X_5$ and $X_8$ in Formula CY1-B(1) may be N, and at least one of $X_1$ to $X_6$ in Formula CY1-C(1) may be N, $R_{10a}$ is the same as described in the present specification, a10 in Formulae CY1-A(1) to CY1-C(1) may be an integer from 0 to 4,

*' indicates a binding site to M in Formula 1, and

*" indicates a binding site to ring $CY_2$ in Formula 2.

For example, $X_9$ to $X_{12}$ in Formulae CY1-A(1) to CY1-C(1) may be C.

In one or more embodiments, a group represented by

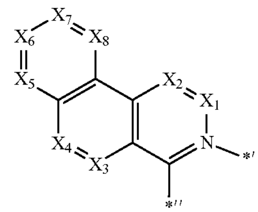

in Formula 2 may be represented by one of Formulae CY1(1) to CY1(27):

CY1(1)

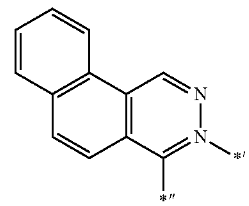

CY1(2)

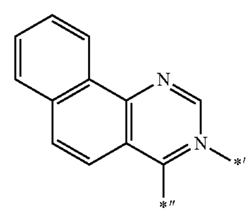

CY1(3)

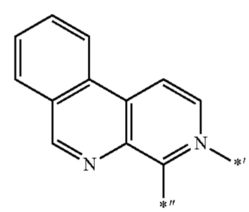

CY1(4)

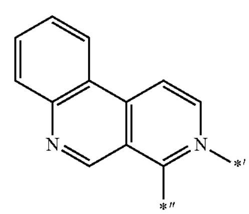

CY1(5)

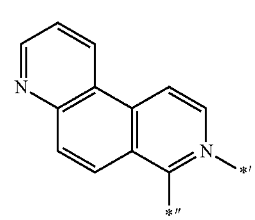

-continued
CY1(6)
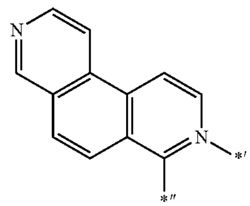
CY1(7)
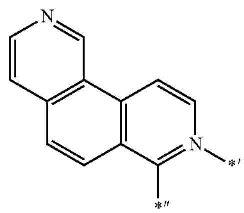
CY1(8)
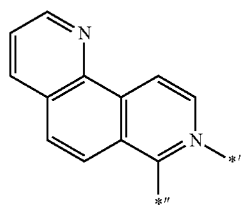
CY1(9)
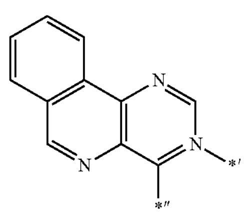
CY1(10)
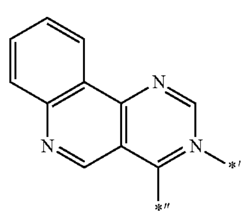
CY1(11)
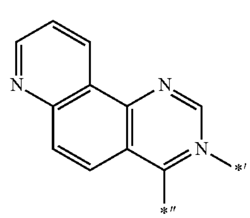
CY1(12)
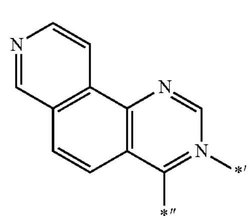
-continued
CY1(13)
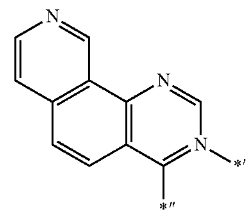
CY1(14)
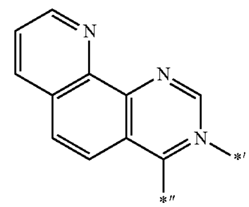
CY1(15)
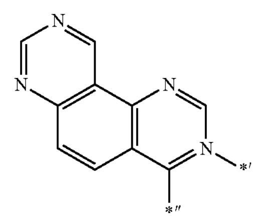
CY1(16)
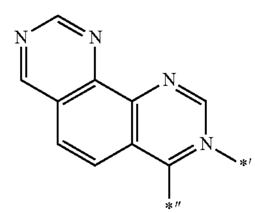
CY1(17)
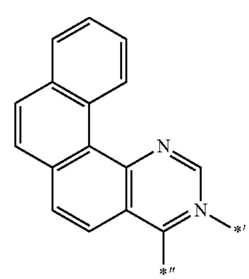
CY1(18)
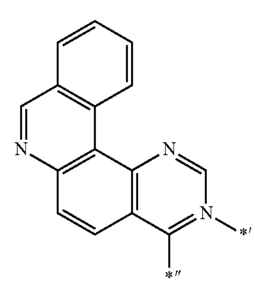

-continued
CY1(19)
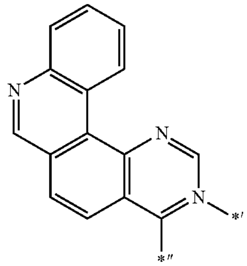
CY1(20)
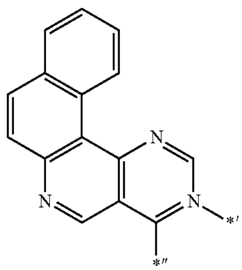
CY1(21)
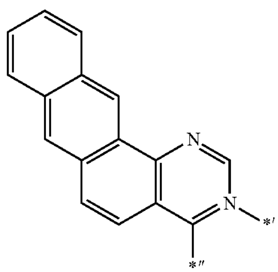
CY1(22)
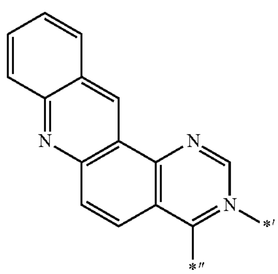
CY1(23)
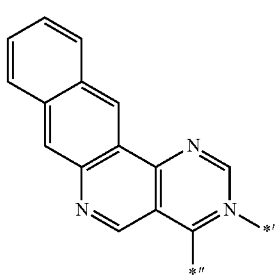
CY1(24)
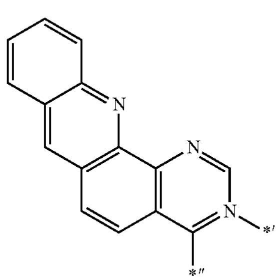
-continued
CY1(25)
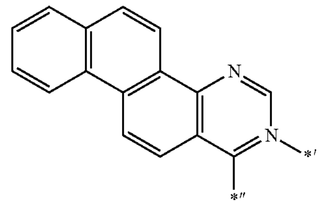
CY1(26)
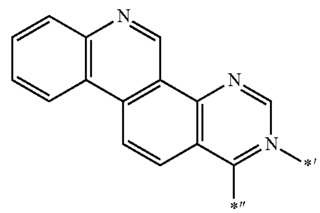
CY1(27)
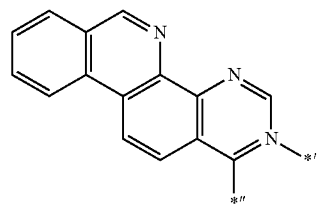
In Formulae CY1(1) to CY1(27), *' indicates a binding site to M in Formula 1, and *" indicates a binding site to ring $CY_2$ in Formula 2.
In one or more embodiments, a group represented by
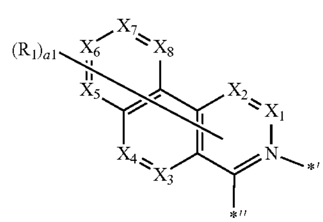
in Formula 2 may be represented by one of Formulae CY1-1 to CY1-128:
CY1-1
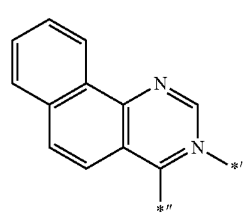
CY1-2
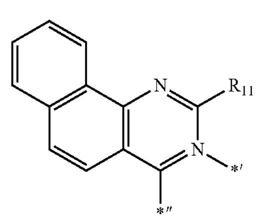

-continued
CY1-3
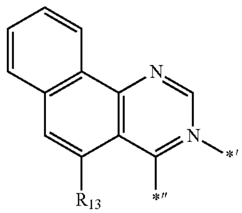
CY1-4
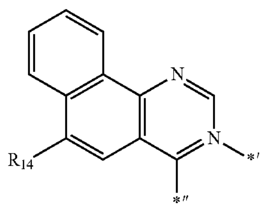
CY1-5
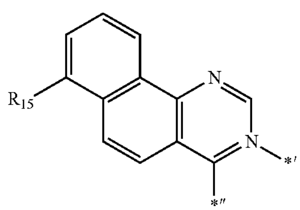
CY1-6
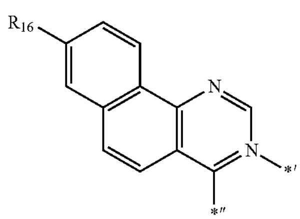
CY1-7
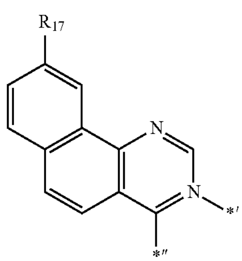
CY1-8
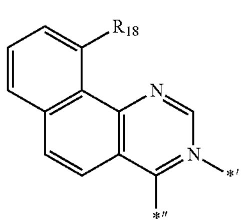
CY1-9
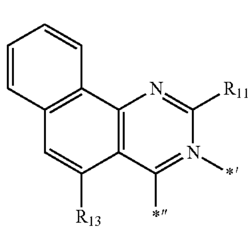
-continued
CY1-10
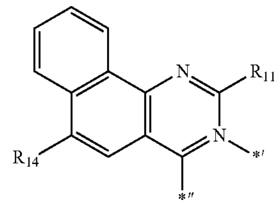
CY1-11
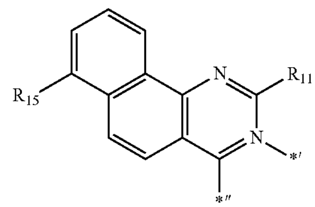
CY1-12
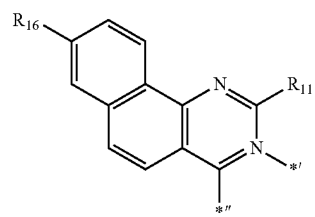
CY1-13
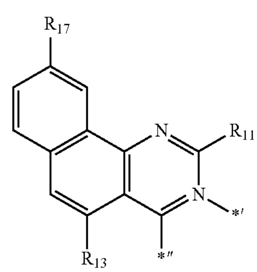
CY1-14
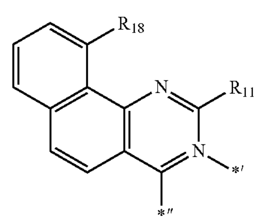
CY1-15
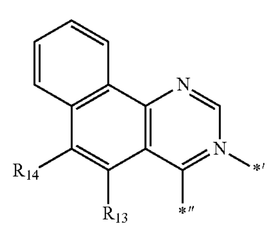
CY1-16
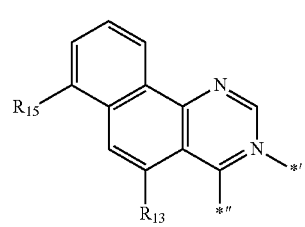

CY1-17
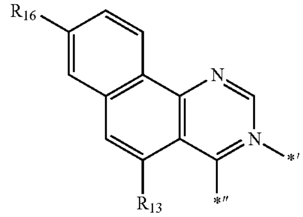
CY1-18
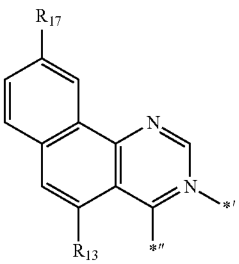
CY1-19
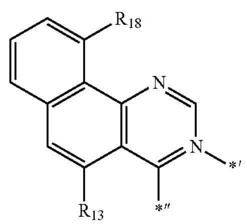
CY1-20
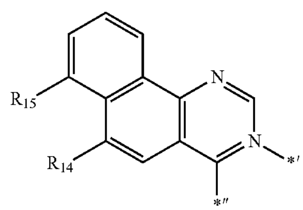
CY1-21
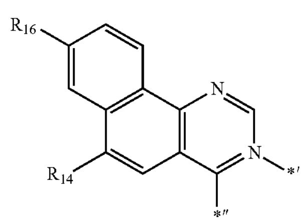
CY1-22
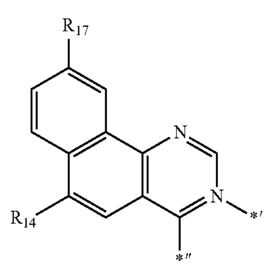
CY1-23
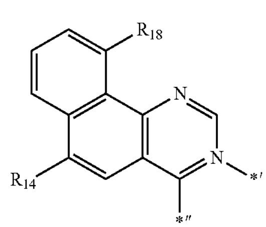
CY1-24
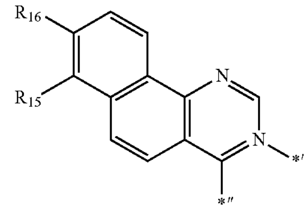
CY1-25
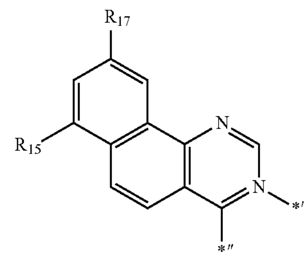
CY1-26
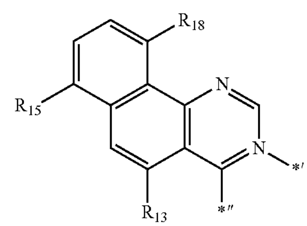
CY1-27
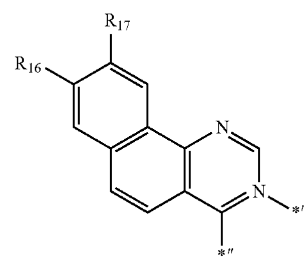
CY1-28
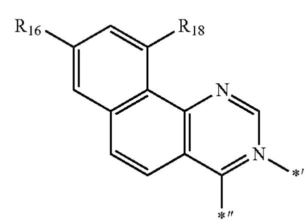
CY1-29
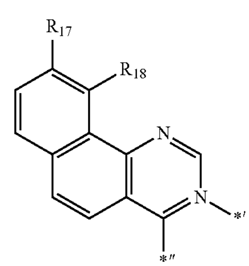

-continued
CY1-30
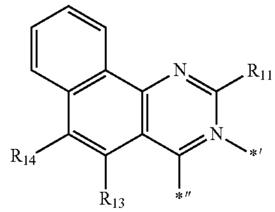
CY1-31
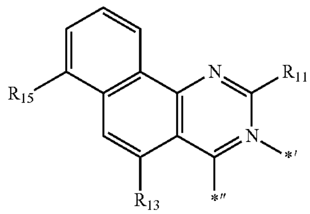
CY1-32
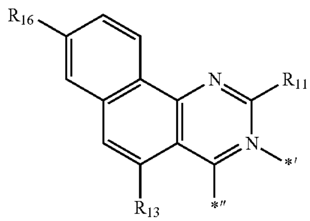
CY1-33
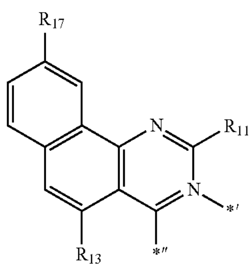
CY1-34
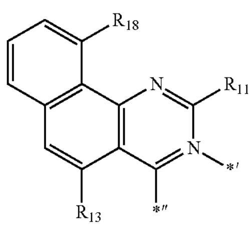
CY1-35
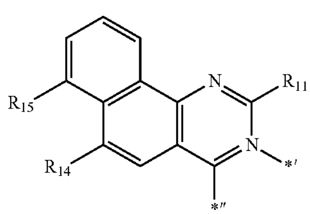
CY1-36
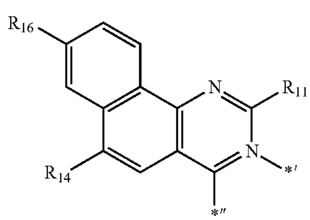
-continued
CY1-37
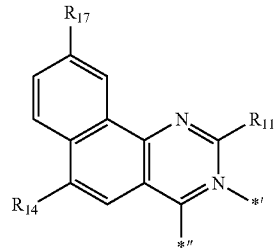
CY1-38
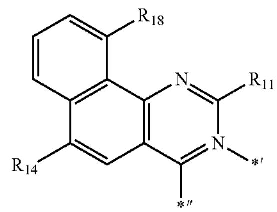
CY1-39
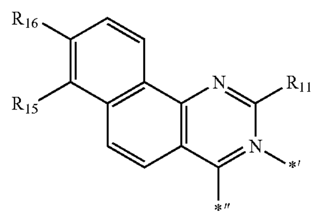
CY1-40
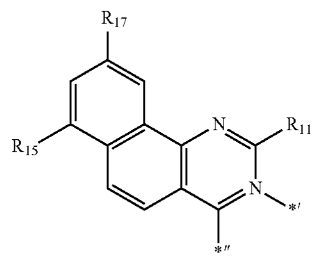
CY1-41
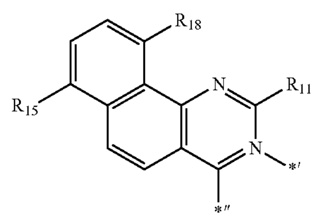
CY1-42
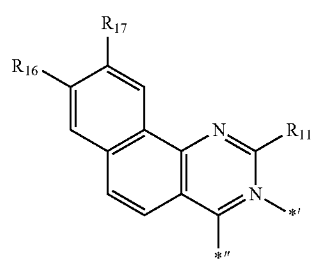
CY1-43
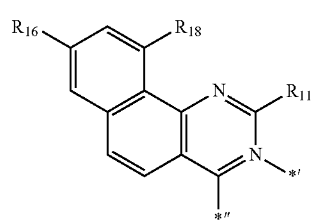

-continued
CY1-44
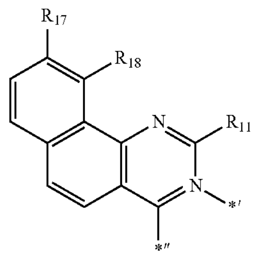
CY1-45
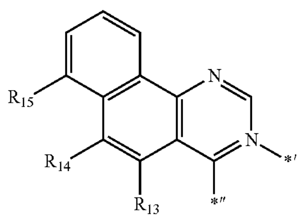
CY1-46
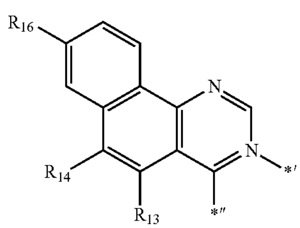
CY1-47
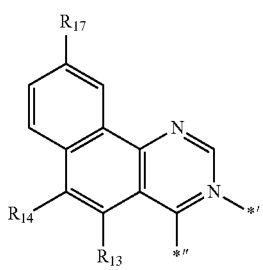
CY1-48
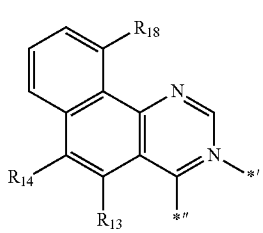
CY1-49
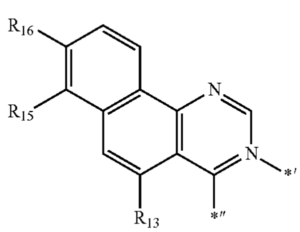
-continued
CY1-50
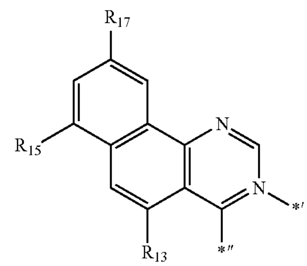
CY1-51
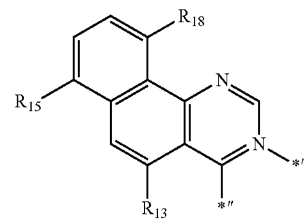
CY1-52
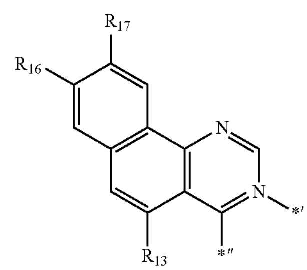
CY1-53
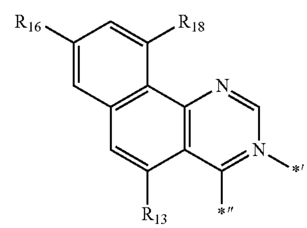
CY1-54
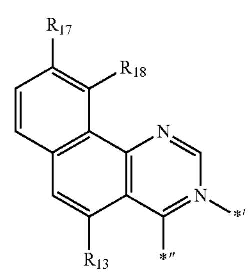
CY1-55
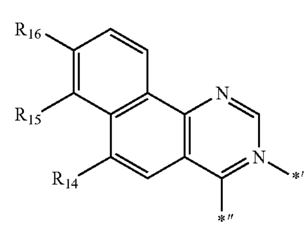

-continued
CY1-56
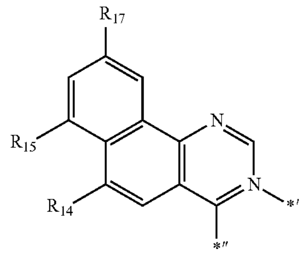
CY1-57
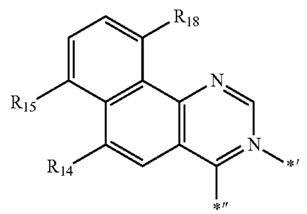
CY1-58
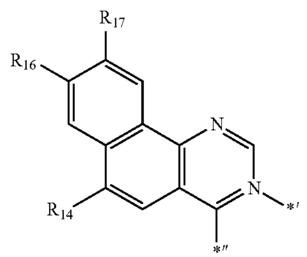
CY1-59
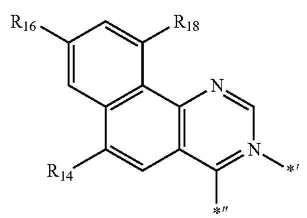
CY1-60
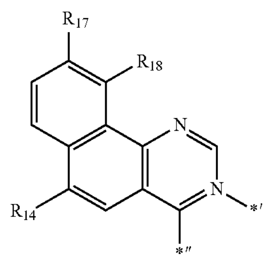
CY1-61
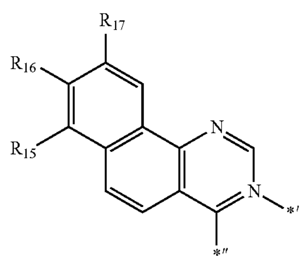
-continued
CY1-62
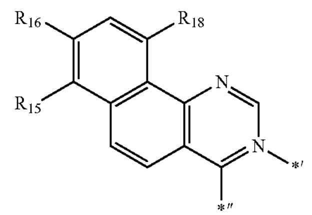
CY1-63
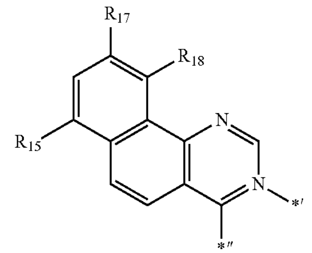
CY1-64
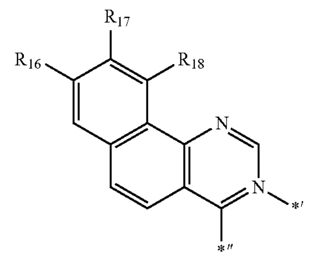
CY1-65
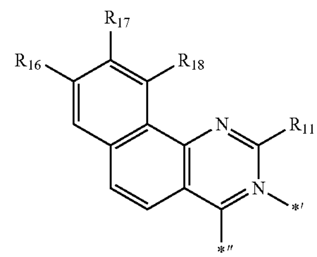
CY1-66
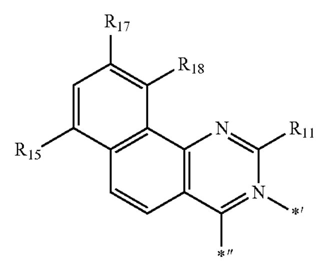
CY1-67
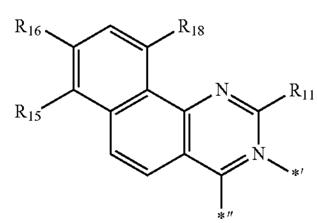

-continued
CY1-68
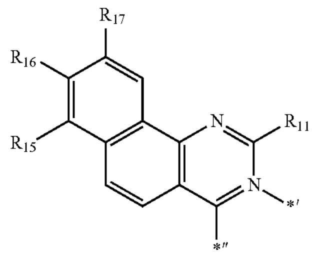
CY1-69
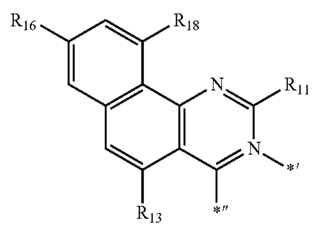
CY1-70
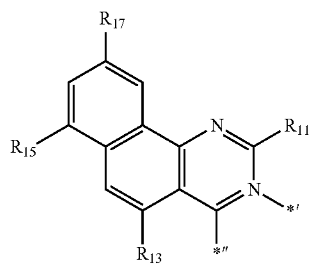
CY1-71
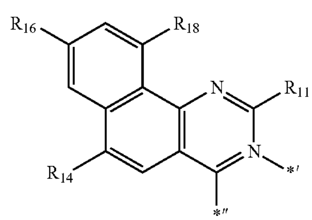
CY1-72
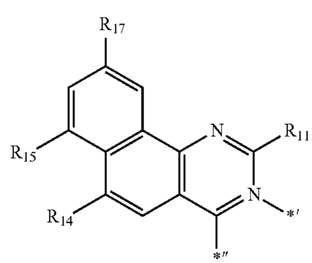
CY1-73
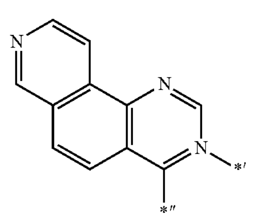
-continued
CY1-74
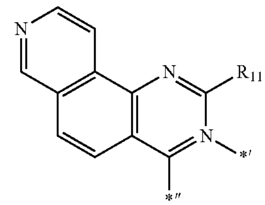
CY1-75
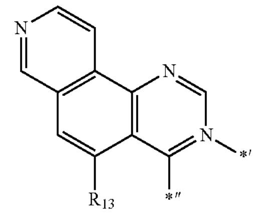
CY1-76
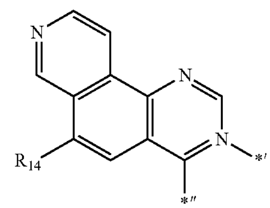
CY1-77
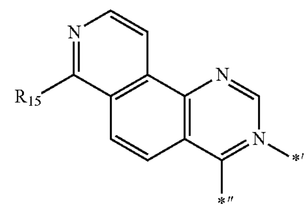
CY1-78
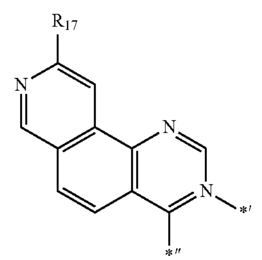
CY1-79
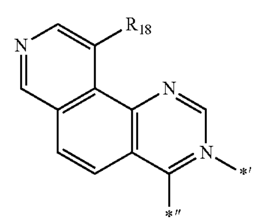
CY1-80
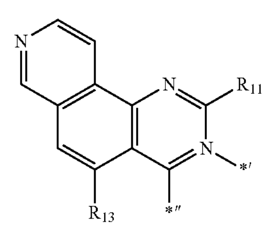

-continued
CY1-81
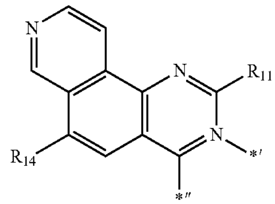
CY1-82
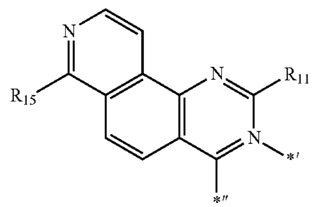
CY1-83
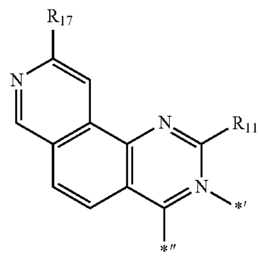
CY1-84
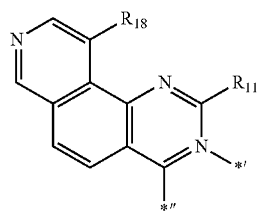
CY1-85
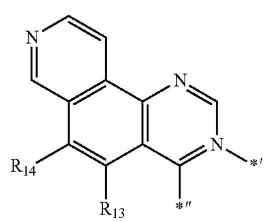
CY1-86
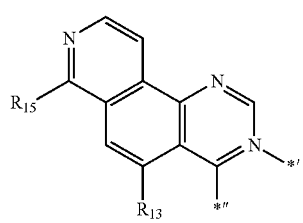
CY1-87
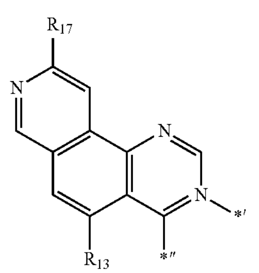
-continued
CY1-88
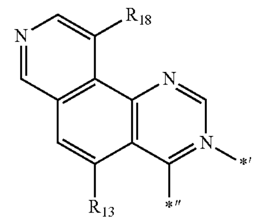
CY1-89
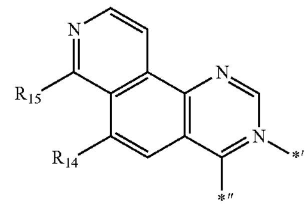
CY1-90
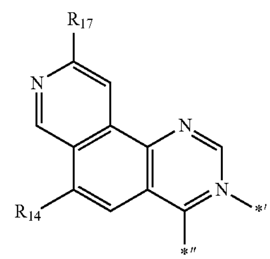
CY1-91
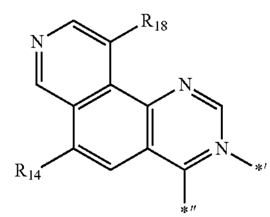
CY1-92
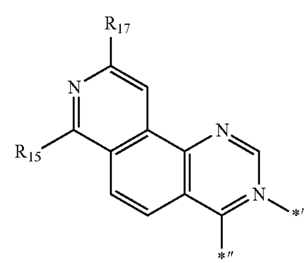
CY1-93
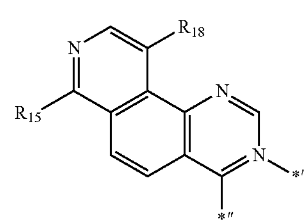

-continued
CY1-94
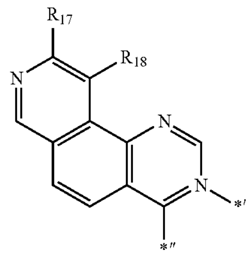
CY1-95
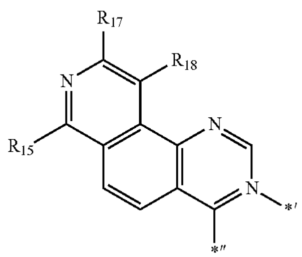
CY1-96
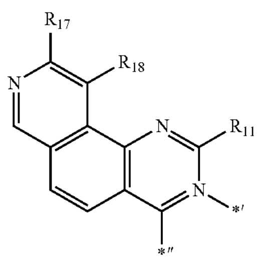
CY1-97
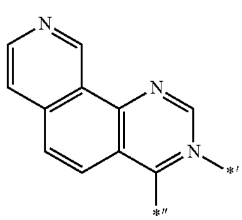
CY1-98
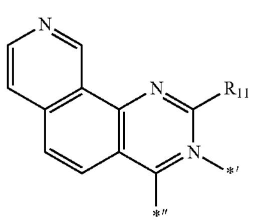
CY1-99
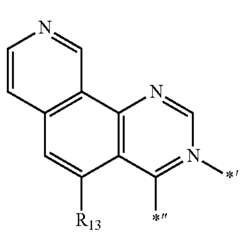
-continued
CY1-100
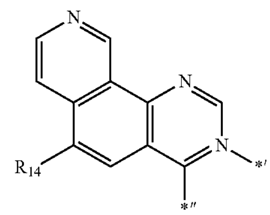
CY1-101
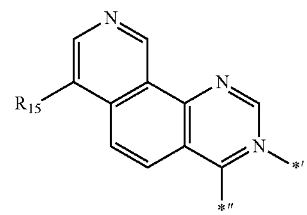
CY1-102
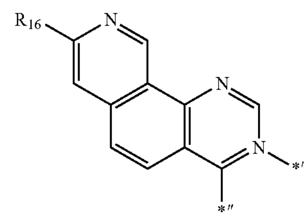
CY1-103
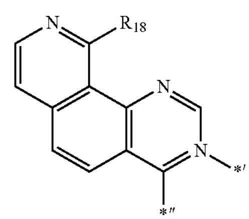
CY1-104
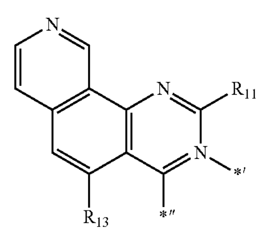
CY1-105
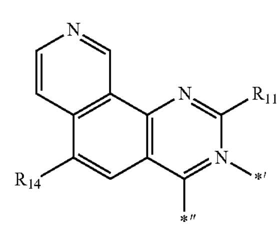
CY1-106
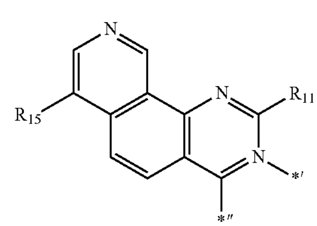

-continued
CY1-106
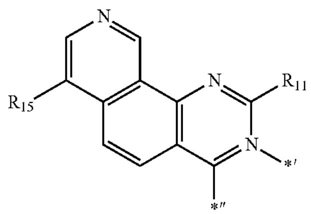
CY1-107
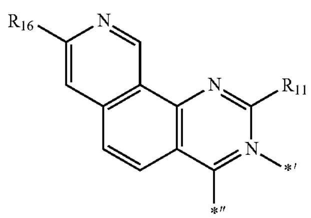
CY1-108
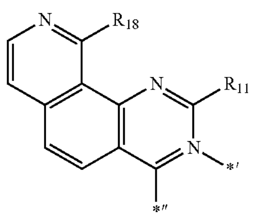
CY1-109
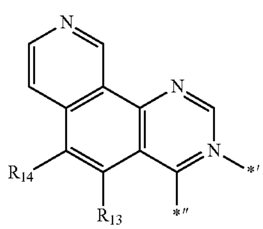
CY1-110
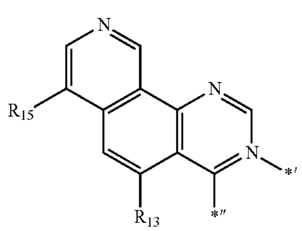
CY1-111
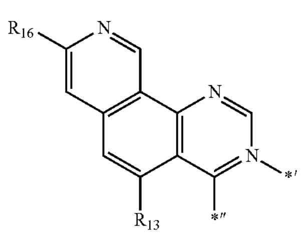
CY1-112
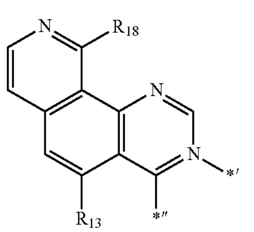
-continued
CY1-113
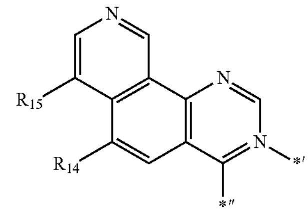
CY1-114
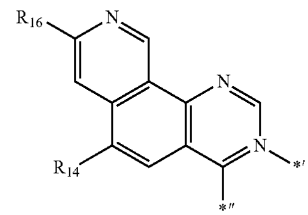
CY1-115
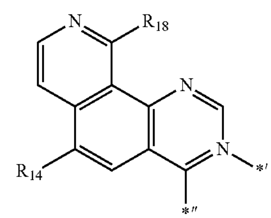
CY1-116
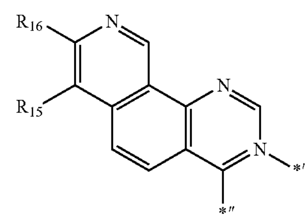
CY1-117
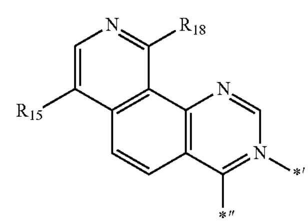
CY1-118
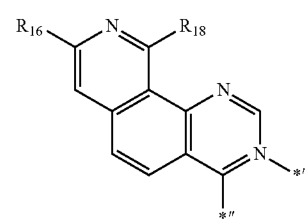
CY1-119
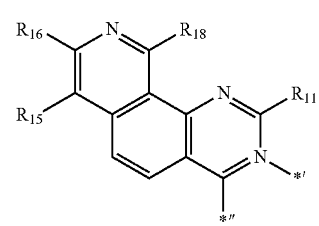

-continued

CY1-120

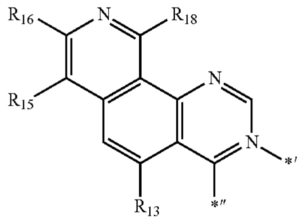

CY1-121

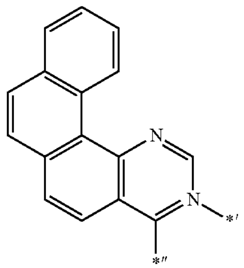

CY1-122

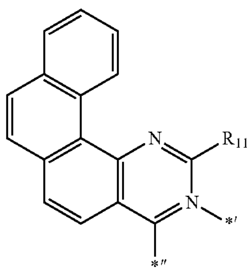

CY1-123

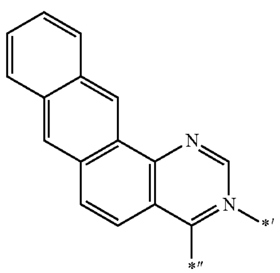

CY1-124

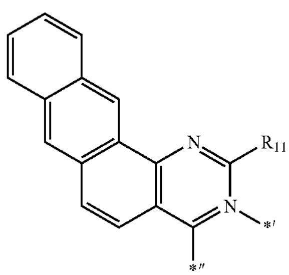

CY1-125

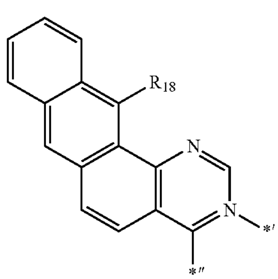

-continued

CY1-126

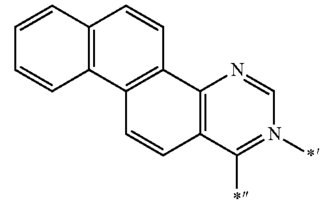

CY1-127

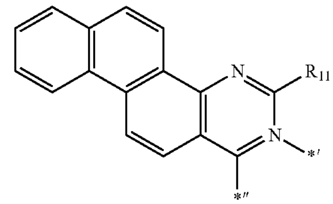

CY1-128

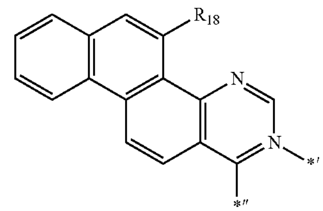

In Formulae CY1-1 to CY1-128, $R_{11}$ to $R_{18}$ are the same as described in connection with $R_1$ in the present specification, and each of $R_{11}$ to $R_{18}$ may not be hydrogen,

*' indicates a binding site to M in Formula 1, and

*" indicates a binding site to ring $CY_2$ in Formula 2.

In one or more embodiments, the ligand represented by Formula 2 may include:

a $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, a fluoro group(—F), or deuterium;

a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, or a fluorinated terphenyl group, each unsubstituted or substituted with at least one of deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group;

a deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, a deuterated biphenyl group, or a deuterated terphenyl group, each unsubstituted or substituted with at least one of —F, a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group;

—Si($Q_3$)($Q_4$)($Q_5$) or —Ge($Q_3$)($Q_4$)($Q_5$); or a combination thereof.

In one or more embodiments, group $R_1$ in the number of a1 in Formula 2 may each independently be:

a $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, a fluoro group(—F), or deuterium;

a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, or a fluorinated terphenyl group, each unsubstituted or substituted with at least one of deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group;

a deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, a deuterated biphenyl group, or a deuterated terphenyl group, each unsubstituted or substituted with at least one of —F, a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group; or —Si($Q_3$)($Q_4$)($Q_5$) or —Ge($Q_3$)($Q_4$)($Q_5$).

In one or more embodiments, group $R_2$ in the number of a2 in Formula 2 may each independently be:

a $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or deuterium; or a deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, a deuterated biphenyl group, or a deuterated terphenyl group, each unsubstituted or substituted with at least one of a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group.

In one or more embodiments, Formula 2 may satisfy at least one of Condition A to Condition G:

Condition A a1 is not 0, and at least one group $R_1$ in the number of a1 is a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group.

Condition B a1 is not 0, and at least one group $R_1$ in the number of a1 is:

a fluoro group(—F); or a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, or a fluorinated terphenyl group, each unsubstituted or substituted with at least one of deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group.

Condition C a1 is not 0, and at least one group $R_1$ in the number of a1 is:

deuterium; or a deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, a deuterated biphenyl group, or a deuterated terphenyl group, each unsubstituted or substituted with at least one of —F, a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group.

Condition D a1 is not 0, and at least one group $R_1$ in the number of a1 is —Si($Q_3$)($Q_4$)($Q_5$).

Condition E a1 is not 0, and at least one group $R_1$ in the number of a1 is —Ge($Q_3$)($Q_4$)($Q_5$).

Condition F a2 is not 0, and at least one group $R_2$ in the number of a2 is a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group.

Condition G a2 is not 0, and at least one group $R_2$ in the number of a2 is:

deuterium; or a deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, a deuterated biphenyl group, or a deuterated terphenyl group, each unsubstituted or substituted with at least one of a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group.

In one or more embodiments, a group represented by:

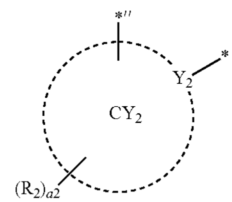

in Formula 2 may be a group represented by one of Formulae CY2-1 to CY2-31:

CY2-1

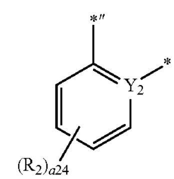

CY2-2

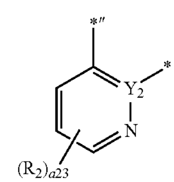

CY2-3

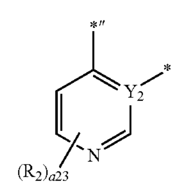

CY2-4

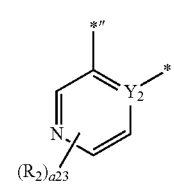

CY2-5

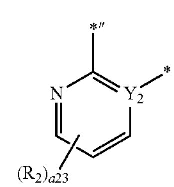

-continued
CY2-6
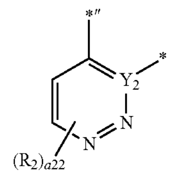
CY2-7
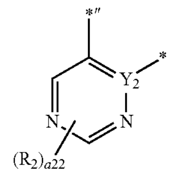
CY2-8
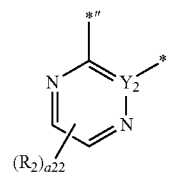
CY2-9
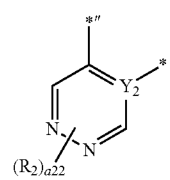
CY2-10
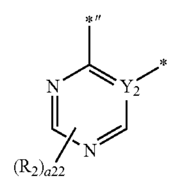
CY2-11
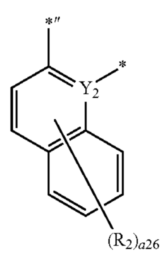
CY2-12
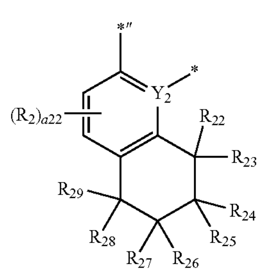
-continued
CY2-13
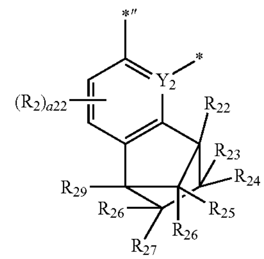
CY2-14
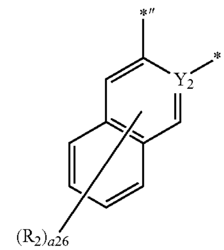
CY2-15
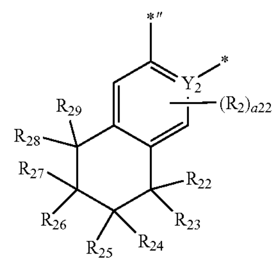
CY2-16
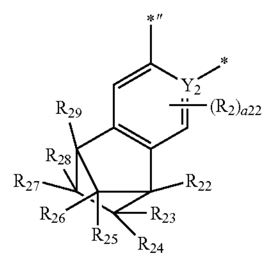
CY2-17
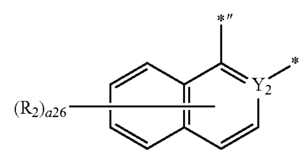
CY2-18
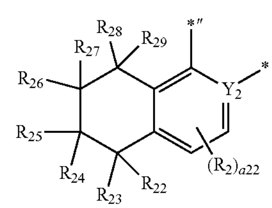
CY2-19
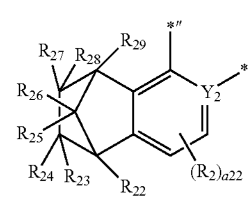

-continued
CY2-20
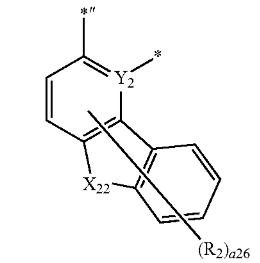
CY2-21
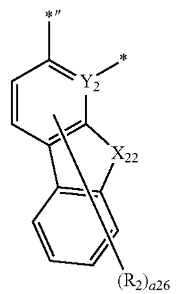
CY2-22
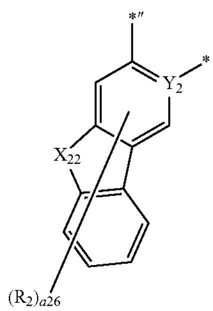
CY2-23
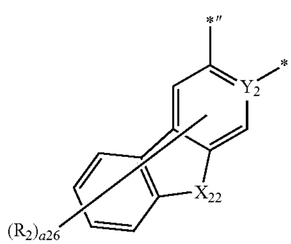
CY2-24
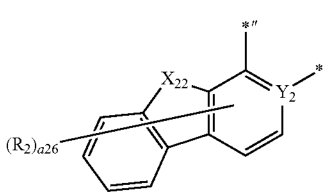
CY2-25
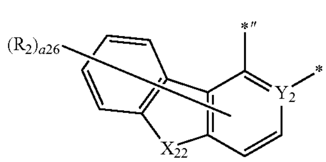
-continued
CY2-26
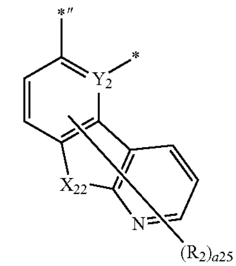
CY2-27
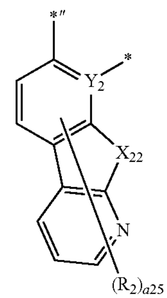
CY2-28
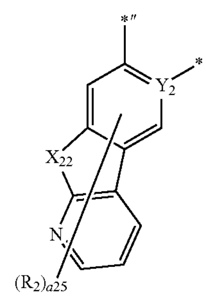
CY2-29
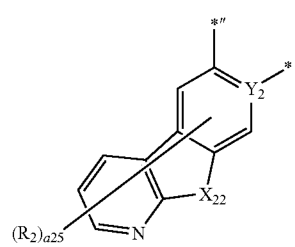
CY2-20
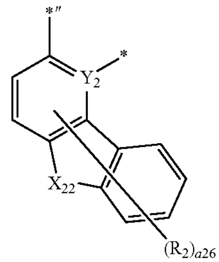

-continued

CY2-21

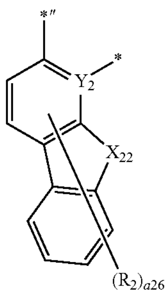

CY2-22

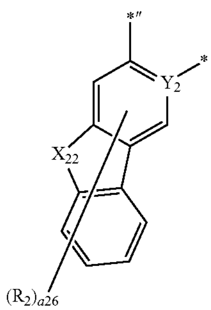

CY2-23

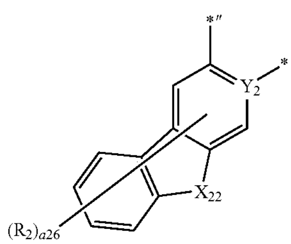

CY2-24

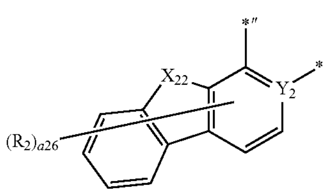

CY2-25

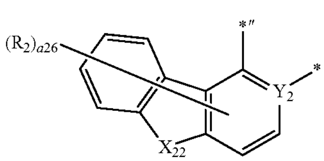

CY2-26

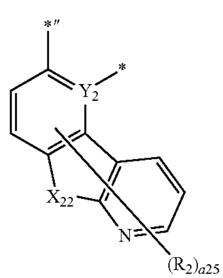

-continued

CY2-27

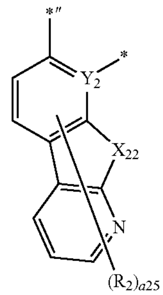

CY2-28

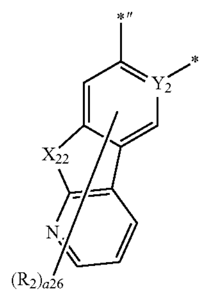

CY2-29

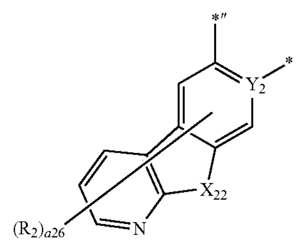

CY2-30

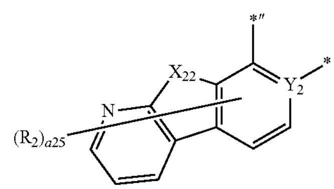

CY2-31

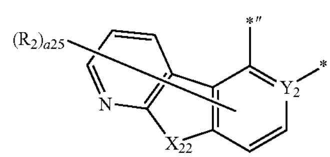

In Formulae CY2-1 to CY2-31, $Y_2$ and $R_2$ are the same as described in the present specification, $X_{22}$ may be $C(R_{28})(R_{29})$, $N(R_{28})$, O, S, or $Si(R_{28})(R_{29})$, $R_{22}$ to $R_{29}$ are the same as described in connection with $R_2$ in the present specification, a26 may be an integer from 0 to 6, a25 may be an integer from 0 to 5, a24 may be an integer from 0 to 4, a23 may be an integer from 0 to 3, a22 may be an integer from 0 to 2,

*" indicates a binding site to a carbon atom of a neighboring 6-membered ring in Formula 2, and

* indicates a binding site to M in Formula 1.

In one or more embodiments, a group represented by
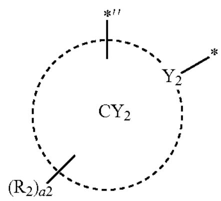
in Formula 2 may be a group represented by one of Formulae CY2(1) to CY2(68):
CY2(1)
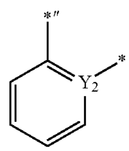
CY2(2)
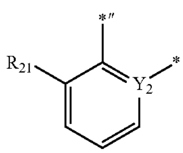
CY2(3)
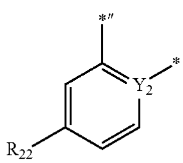
CY2(4)
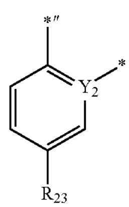
CY2(5)
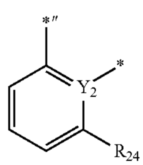
CY2(6)
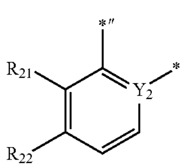
CY2(7)
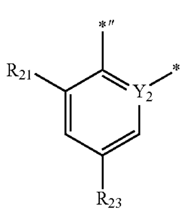
-continued
CY2(8)
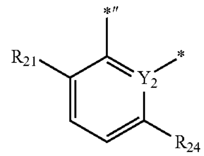
CY2(9)
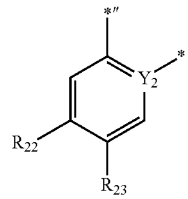
CY2(10)
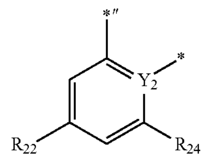
CY2(11)
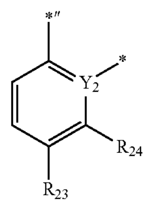
CY2(12)
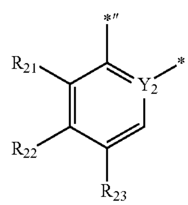
CY2(13)
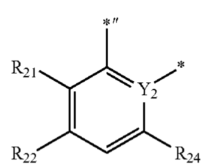
CY2(14)
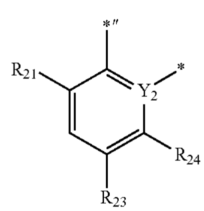
CY2(15)
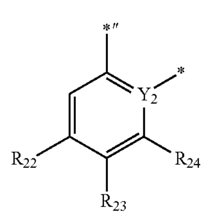

-continued
CY2(16)
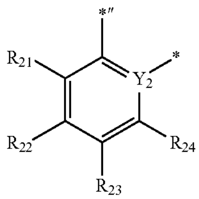
CY2(17)
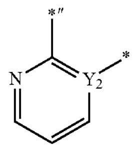
CY2(18)
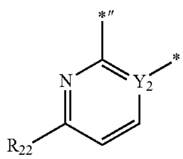
CY2(19)
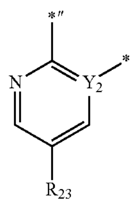
CY2(20)
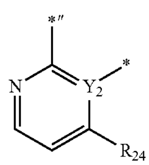
CY2(21)
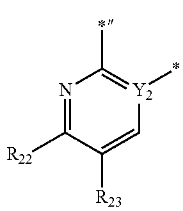
CY2(22)
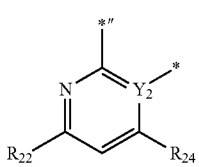
CY2(23)
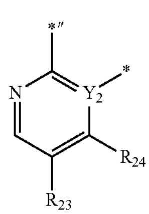
-continued
CY2(24)
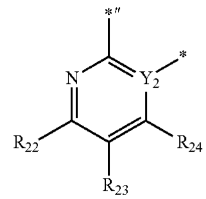
CY2(25)
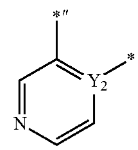
CY2(26)
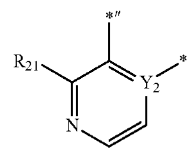
CY2(27)
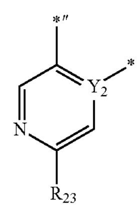
CY2(28)
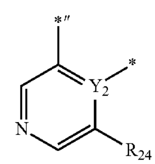
CY2(29)
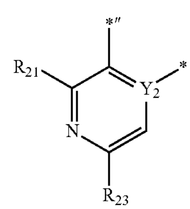
CY2(30)
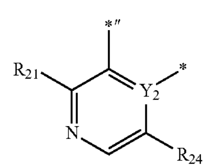
CY2(31)
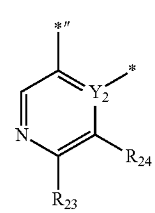

CY2(32)
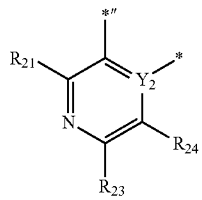
CY2(33)
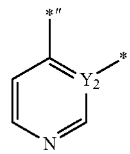
CY2(34)
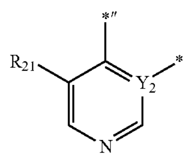
CY2(35)
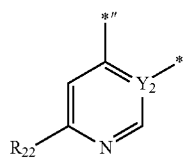
CY2(36)
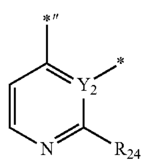
CY2(37)
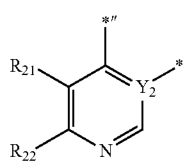
CY2(38)
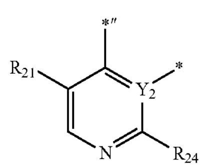
CY2(39)
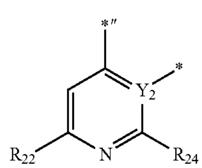
CY2(40)
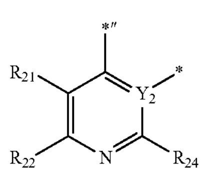
CY2(41)
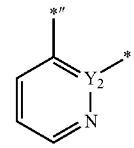
CY2(42)
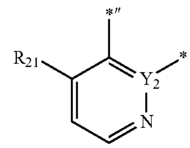
CY2(43)
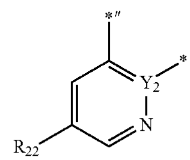
CY2(44)
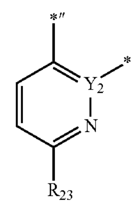
CY2(45)
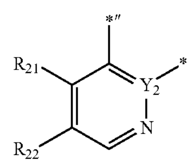
CY2(46)
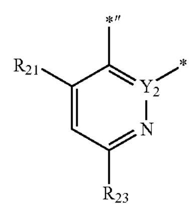
CY2(47)
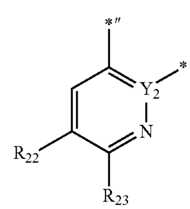
CY2(48)
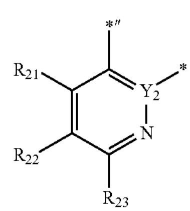
CY2(49)
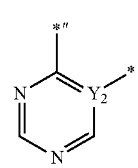

CY2(50)
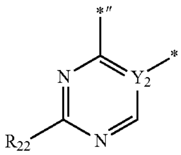
CY2(51)
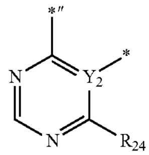
CY2(52)
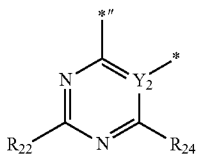
CY2(53)
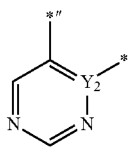
CY2(54)
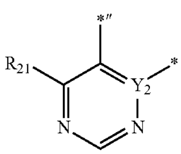
CY2(55)
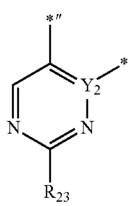
CY2(56)
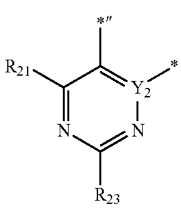
CY2(57)
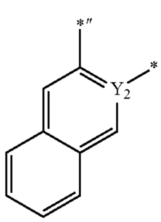
CY2(58)
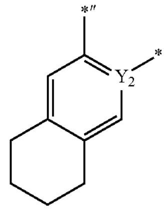
CY2(59)
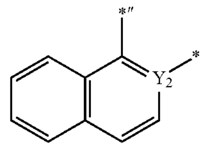
CY2(60)
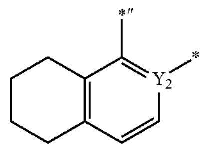
CY2(61)
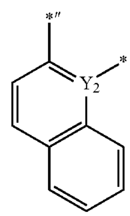
CY2(62)
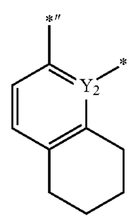
CY2(63)
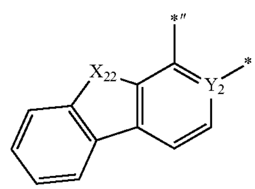
CY2(64)
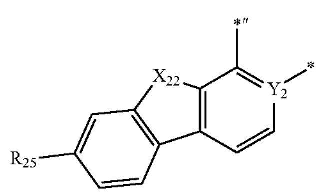
CY2(65)
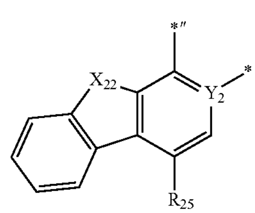

-continued

CY2(66)

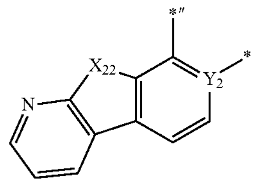

CY2(67)

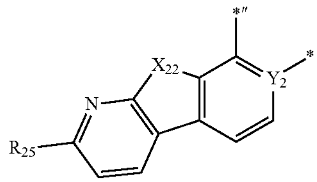

CY2(68)

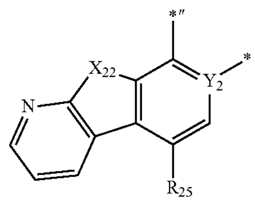

In Formulae CY2(1) to CY2(68), $Y_2$ is the same as described in the present specification, $X_{22}$ may be $C(R_{28})(R_{29})$, $N(R_{28})$, O, S, or $Si(R_{28})(R_{29})$, $R_{21}$ to $R_{25}$, $R_{28}$, and $R_{29}$ are the same as described in connection with $R_2$ in the present specification, and each of $R_{21}$ to $R_{24}$ may not be hydrogen,

*" indicates a binding site to a carbon atom of a neighboring 6-membered ring in Formula 2, and

* indicates a binding site to M in Formula 1.

In one or more embodiments, at least one group $R_2$ in the number of a2 in Formula 2 may be a substituted or unsubstituted $C_1$-$C_{60}$ alkyl group, a substituted or unsubstituted $C_3$-$C_{10}$ cycloalkyl group, or a substituted or unsubstituted phenyl group.

In one or more embodiments, $R_2$ in Formula 2 may not be hydrogen, and a2 may be 1, 2, or 3.

In one or more embodiments, $R_2$ in Formula 2 may not include a fluoro group and a cyano group.

In one or more embodiments, a group represented by

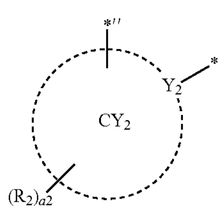

in Formula 2 may be a group represented by Formula CY2(10).

For example, $R_{22}$ and $R_{24}$ in Formula CY2(10) may each independently be a $C_1$-$C_{20}$alkyl group or a $C_3$-$C_{10}$ cycloalkyl group, each unsubstituted or substituted with at least one of deuterium, a $C_1$-$C_{20}$ alkyl group, or a $C_3$-$C_{10}$ cycloalkyl group.

In an embodiment, $R_{22}$ and $R_{24}$ in Formula CY2(10) may be identical to each other.

In an embodiment, $R_{22}$ and $R_{24}$ in Formula CY2(10) may be different from each other.

In an embodiment, in Formula CY2(10), the number of carbons included in $R_{22}$ may be greater than the number of carbons included in $R_{24}$.

$L_2$ in Formula may be a bidentate ligand of which two atoms are each bonded with M in Formula 1 via O, S, N, C, P, Si, or As.

For example, $L_2$ in Formula 1 may be a bidentate ligand represented by Formula 3:

Formula 3

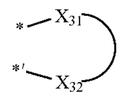

In Formula 3, $X_{31}$ and $X_{32}$ may be O, $X_{31}$ may be O, and $X_{32}$ may be N, or $X_{31}$ may be N, and $X_{32}$ may be C, the structure  indicates a divalent group linking $X_{31}$ and $X_{32}$ together, and

* and *' each indicate a binding site to M in Formula 1.

For example, in Formula 3, i) $X_{31}$ and $X_{32}$ may be O; ii) $X_{31}$ may be O, and $X_{32}$ may be N, or iii) $X_{31}$ may be N, and $X_{32}$ may be C.

In one or more embodiments, $L_2$ in Formula 1 may be a monodentate ligand, for example, $I^-$, $Br^-$, $Cl^-$, sulfide, nitrate, azide, hydroxide, cyanate, isocyanate, thiocyanate, water, acetonitrile, pyridine, ammonia, carbon monoxide, $P(Ph)_3$, $P(Ph)_2CH_3$, $PPh(CH_3)_2$, $P(CH_3)_3$, or a combination thereof.

In one or more embodiments, $L_2$ in Formula 1 may be bidentate ligands, for example, oxalate, acetylacetonate, picolinic acid, 1,2-bis(diphenylphosphino)ethane, 1,1-bis(diphenylphosphino)methane, glycinate, or ethylenediamine.

In one or more embodiments, $L_2$ in Formula 1 may be a group represented by one of Formulae 3A to 3F:

3A

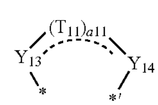

3B

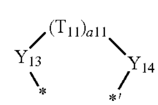

3C

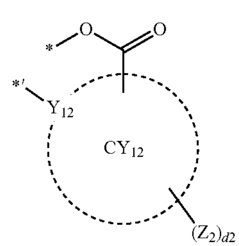

-continued

3D

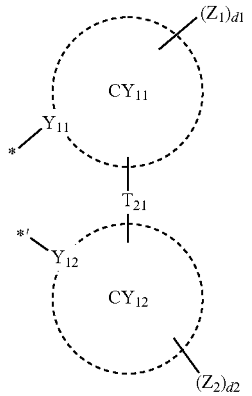

3E $*—C\equiv C—Z_1$

3F

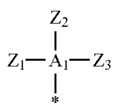

In Formulae 3A to 3F, $Y_{13}$ may be O, N, $N(Z_1)$, $P(Z_1)(Z_2)$, or $As(Z_1)(Z_2)$, $Y_{14}$ may be O, N, $N(Z_3)$, $P(Z_3)(Z_4)$, or $As(Z_3)(Z_4)$, $T_{11}$ may be a single bond, a double bond, $*—C(Z_{11})(Z_{12})—*'$, $*—C(Z_1)=C(Z_{12})—*'$, $*=C(Z_{11})—*'$, $*—C(Z_{11})=*'$, $*=C(Z_{11})—C(Z_{12})=C(Z_{13})—*'$, $*—C(Z_{11})=C(Z_{12})—C(Z_{13})=*'$, $*—N(Z_{11})—*'$, or a $C_5$-$C_{30}$ carbocyclic group that is unsubstituted or substituted with at least one $Z_{11}$, a11 may be an integer from 1 to 10, wherein, when a11 is 2 or greater, two or more groups $T_{11}$ may be identical to or different from each other, $Y_{11}$ and $Y_{12}$ may each independently be C or N, $T_{21}$ may be a single bond, a double bond, O, S, $C(Z_{11})(Z_{12})$, $Si(Z_{11})(Z_{12})$, or $N(Z_{11})$, ring $CY_{11}$ and ring $CY_{12}$ may each independently be a $C_5$-$C_{30}$ carbocyclic group or a $C_1$-$C_{30}$ heterocyclic group, $A_1$ may be P or As, $Z_1$ to $Z_4$ and Z to $Z_{13}$ are the same as described in connection with $R_2$ in the present specification, d1 and d2 may each independently be an integer from 0 to 20,

* and *' each indicate a binding site to M in Formula 1, and two or more of Z to $Z_{13}$ may optionally be linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

For example, $L_2$ in Formula 1 may be a group represented by one of Formulae 3A to 3C.

For example, a group represented by

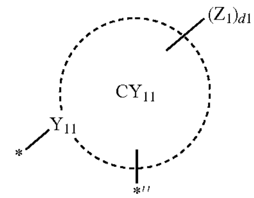

in Formula 3D may be a group represented by Formulae CY11-1 to CY11-34, or a group represented by

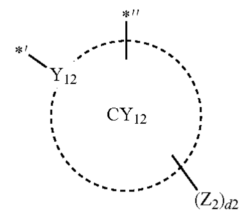

in Formulae 3C and 3D may be a group represented by one of Formulae CY12-1 to CY12-34:

CY11-1

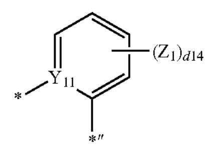

CY11-2

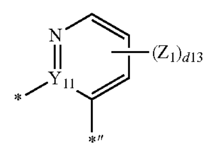

CY11-3

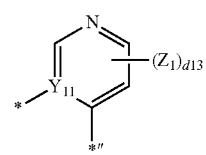

CY11-4

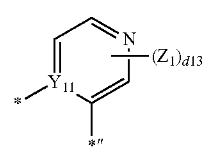

CY11-5

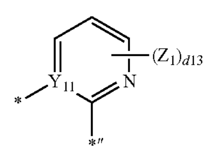

CY11-6

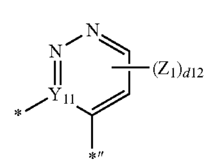

-continued
CY11-7
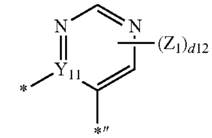
CY11-8
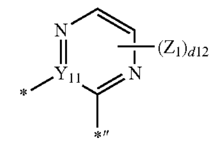
CY11-9
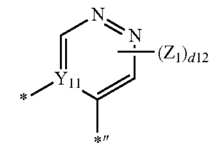
CY11-10
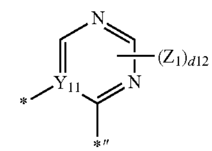
CY11-11
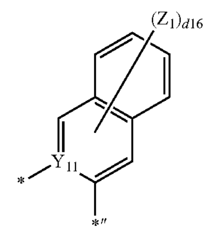
CY11-12
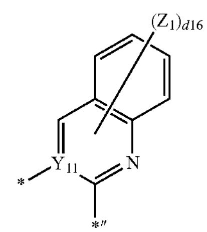
CY11-13
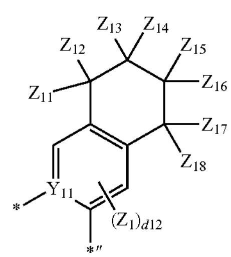
CY11-14
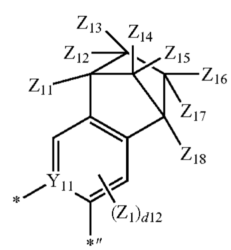
-continued
CY11-15
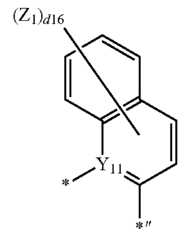
CY11-16
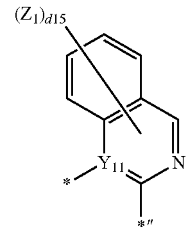
CY11-17
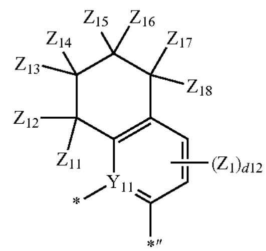
CY11-18
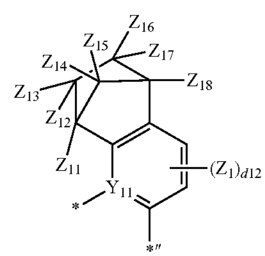
CY11-19
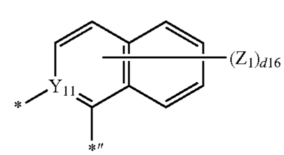
CY11-20
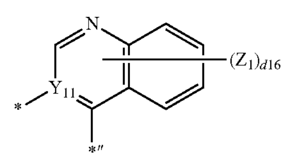
CY11-21
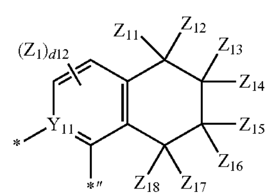

CY11-22
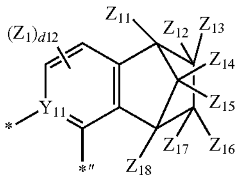
CY11-23
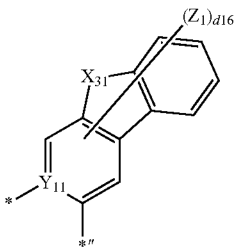
CY11-24
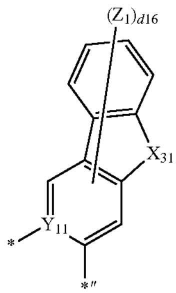
CY11-25
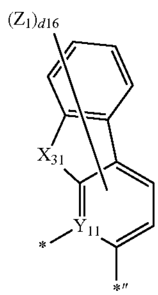
CY11-26
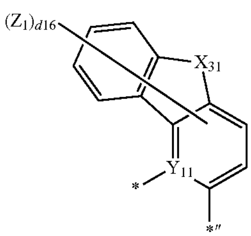
CY11-27
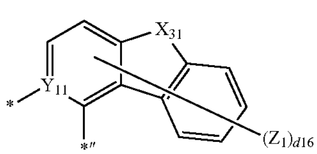
CY11-28
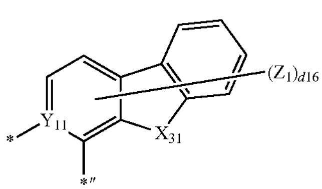
CY11-29
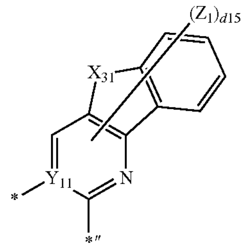
CY11-30
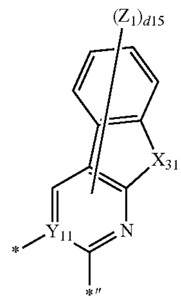
CY11-31
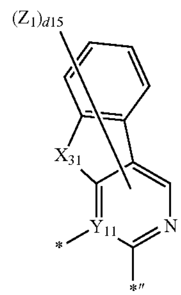
CY11-32
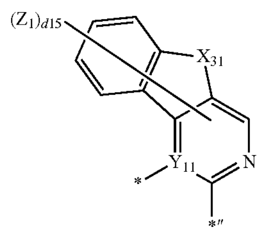
CY11-33
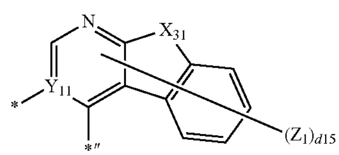
CY11-34
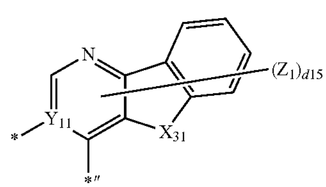
CY12-1
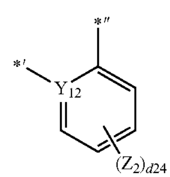

-continued
CY12-2
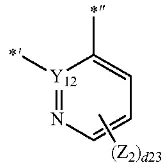
CY12-3
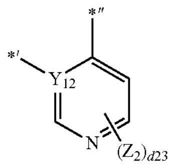
CY12-4
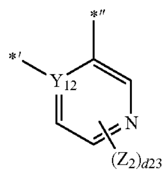
CY12-5
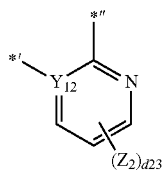
CY12-6
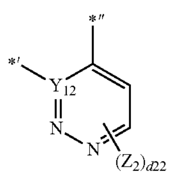
CY12-7
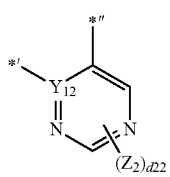
CY12-8
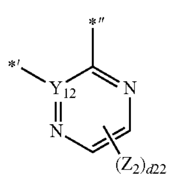
CY12-9
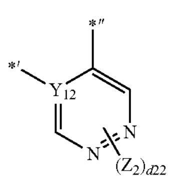
CY12-10
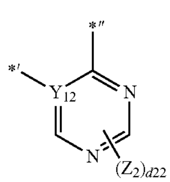
-continued
CY12-11
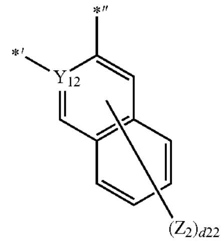
CY12-12
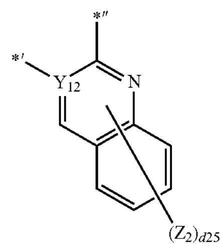
CY12-13
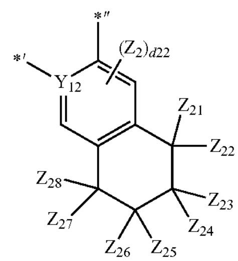
CY12-14
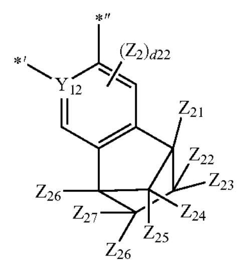
CY12-15
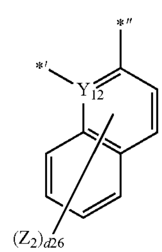
CY12-16
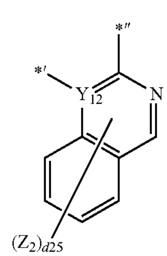

-continued
CY12-17
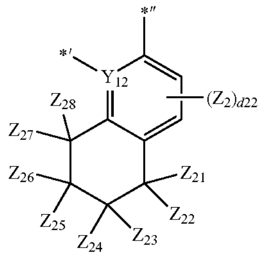
CY12-18
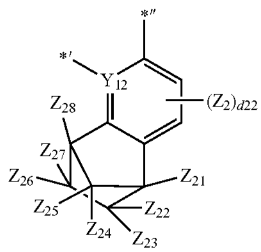
CY12-19
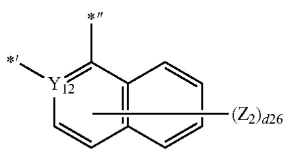
CY12-20
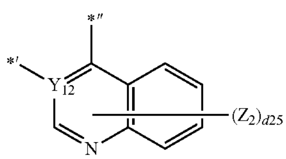
CY12-21
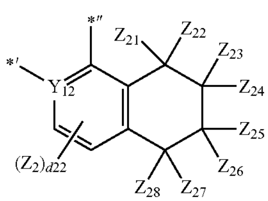
CY12-22
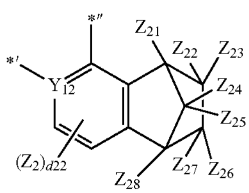
CY12-23
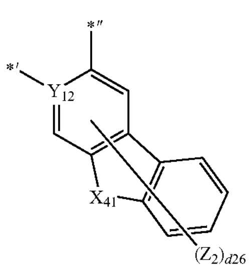
-continued
CY12-24
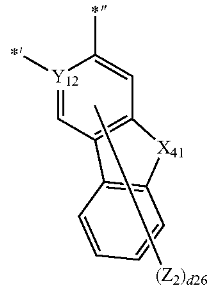
CY12-25
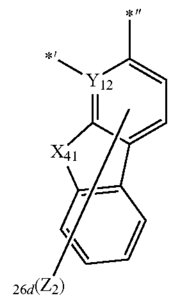
CY12-26
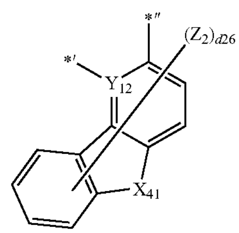
CY12-27
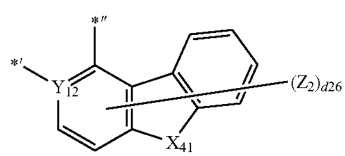
CY12-28
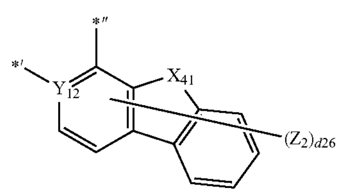
CY12-29
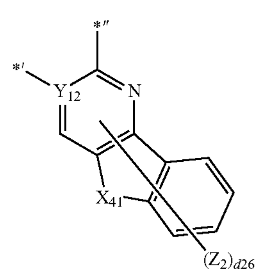

-continued

CY12-30

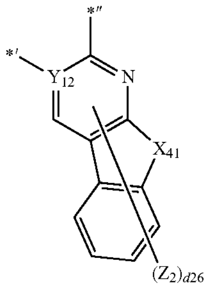

CY12-31

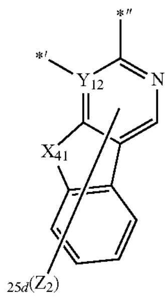

CY12-32

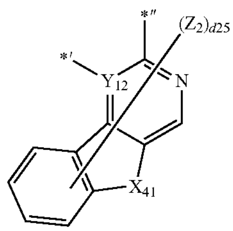

CY12-33

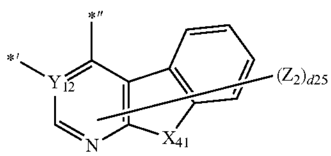

CY12-34

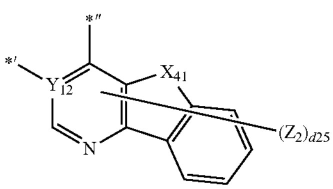

In Formulae CY11-1 to CY11-34 and CY12-1 to CY12-34, $X_{31}$ may be O, S, $N(Z_{11})$, $C(Z_{11})(Z_{12})$, or $Si(Z_{11})(Z_{12})$, $X_{41}$ may be O, S, $N(Z_{21})$, $C(Z_{21})(Z_{22})$, or $Si(Z_{21})(Z_{22})$, $Y_{11}$, $Y_{12}$, $Z_1$, and $Z_2$ are the same as described in the present specification, $Z_{11}$ to $Z_{18}$ and $Z_{21}$ to $Z_{28}$ are the same as described in connection with $R_2$ in the present specification, d12 and d22 may each independently be an integer from 0 to 2, d13 and d23 may each independently be an integer from 0 to 3, d14 and d24 may each independently be an integer from 0 to 4, d15 and d25 may each independently be an integer from 0 to 5, d16 and d26 may each independently be an integer from 0 to 6, and

* and *' each indicate a binding site to M in Formula 1, and *" indicates a binding site to a neighboring atom in Formula 3C or $T_{21}$ in Formula 3D.

In an embodiment, $L_2$ in Formula 1 may be a group represented by one of Formulae 3-1(301) to 3-1(309):

3-1(301)

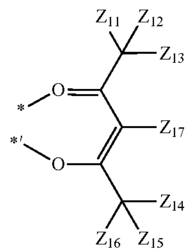

3-1(302)

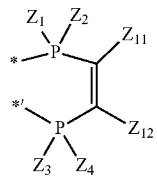

3-1(303)

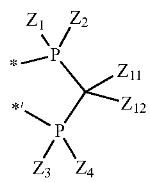

3-1(304)

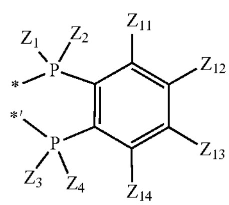

3-1(305)

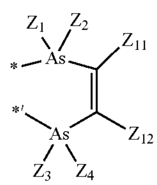

3-1(306)

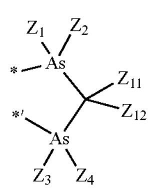

3-1(307)

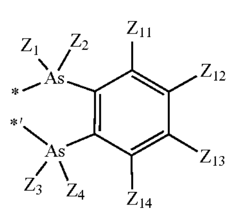

-continued

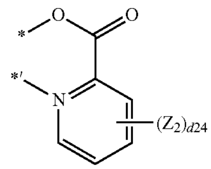

3-1(308)

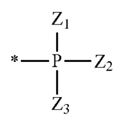

3-1(309)

In Formulae 3-1(301) to 3-1(309), $Z_1$ to $Z_4$ and $Z_{11}$ to $Z_{17}$ are the same as described in connection with $R_2$ in the present specification, d24 may be an integer from 0 to 4, and

* and *' each indicate a binding site to M in Formula 1.

In an embodiment, $L_2$ in Formula 1 may be a group represented by Formula 3-1(301), and Formula 3-1(301) may satisfy at least one of Condition 1 to Condition 3 below:

Condition 1

$Z_{11}$ to $Z_{16}$ in Formula 3-1(301) are each independently a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group.

Condition 2

At least one of $Z_{11}$ to $Z_{16}$ in Formula 3-1(301) (for example, at least one of $Z_{11}$ to $Z_{13}$ and at least one of $Z_{14}$ to $Z_{16}$) is each independently a substituted or unsubstituted $C_2$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group.

Condition 3

$Z_{17}$ in Formula 3-1(301) is deuterium, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group.

In an embodiment, Formula 3-1(301) may satisfy at least one of above-described Condition 1 and Condition 2.

Without wishing to be bound by theory, since Formula 3-1(301) satisfies at least one of above-described Condition 1 and Condition 2, the organometallic compound represented by Formula 1 may have relatively large steric hindrance, thereby reducing triplet-triplet extinction. As such, an electronic device, such as an organic light-emitting device, including the organometallic compound represented by Formula 1 may have excellent internal quantum emission efficiency.

In one or more embodiments, $L_2$ in Formula 1 may be a group represented by Formula 3-1(301), and Formula 3-1(301) may satisfy at least one of Condition 4 and Condition 5 below:

Condition 4

Two or more of $Z_1$ to $Z_{13}$ in Formula 3-1(301) are linked to each other such that a group represented by *—C($Z_{11}$)($Z_{12}$)($Z_{13}$) in the group represented by Formula 3-1(301) is a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

Condition 5

Two or more of $Z_4$ to $Z_6$ in Formula 3-1(301) are linked to each other such that a group represented by *—C($Z_{14}$)($Z_{15}$)($Z_{16}$) in the group represented by Formula 3-1(301) is a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

In one or more embodiments, $L_2$ in Formula 1 may be a group represented by Formula 3-1(301), and a group represented by *—C($Z_{11}$)($Z_{12}$)($Z_{13}$) in Formula 3-1(301) and a group represented by *—C($Z_{14}$)($Z_{15}$)($Z_{16}$) in Formula 3-1(301) may be identical to each other.

In one or more embodiments, $L_2$ in Formula 1 may be a group represented by Formula 3-1(301), and a group represented by *—C($Z_{11}$)($Z_{12}$)($Z_{13}$) in Formula 3-1(301) and a group represented by *—C($Z_{14}$)($Z_{15}$)($Z_{16}$) in Formula 3-1(301) may be different from each other.

In one or more embodiments, $L_2$ in Formula 1 may be a group represented by Formula 3-1(301), and the number of carbons included in a group represented by *—C($Z_{11}$)($Z_{12}$)($Z_{13}$) in Formula 3-1(301) may be 4 or more, 5 or more, or 6 or more.

In one or more embodiments, $L_2$ in Formula 1 may be a group represented by Formula 3-1(301), and the number of carbons included in a group represented by *—C($Z_{14}$)($Z_{15}$)($Z_{16}$) in Formula 3-1(301) may be 4 or more, 5 or more, or 6 or more.

In one or more embodiments, $L_2$ in Formula 1 may be a group represented by Formula 3-1(301), and a case in which, in Formula 3-1(301), 1) $Z_{17}$ is hydrogen, and 2) both a group represented by *—C($Z_{11}$)($Z_{12}$)($Z_{13}$) and a group represented by *—C($Z_{14}$)($Z_{15}$)($Z_{16}$) are methyl groups, may be excluded.

In one or more embodiments, $L_2$ in Formula 1 may be a group represented by Formula 3-1(301), and a case in which, in Formula 3-1(301), 1) $Z_{17}$ is hydrogen, and 2) each of $Z_1$ to $Z_{16}$ is a methyl group, may be excluded.

In an embodiment, the organometallic compound represented by Formula 1 may emit red light or green light, for example, red or green light having a maximum emission wavelength of about 500 nm or more, for example, about 500 nm or more and about 650 nm or less.

In one or more embodiments, the organometallic compound may be one of Compounds 1 to 694 below:
1
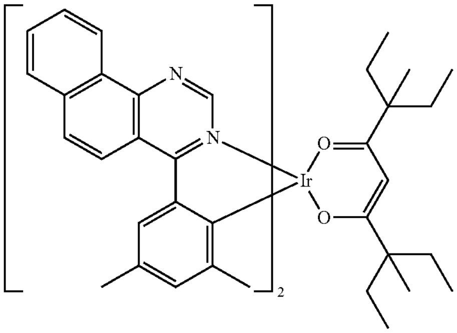
2
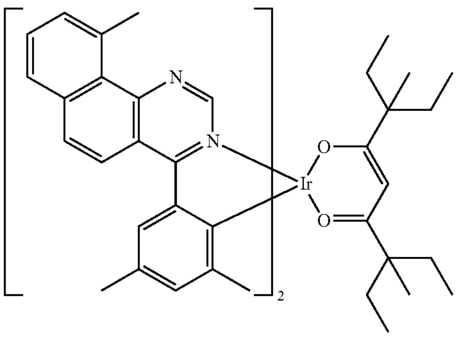
3
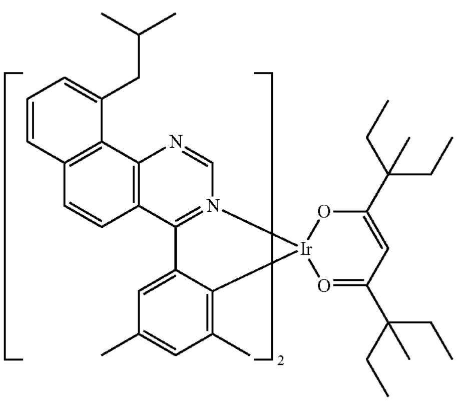
4
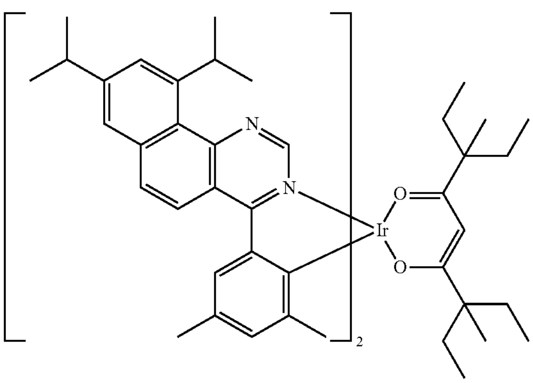
-continued
5
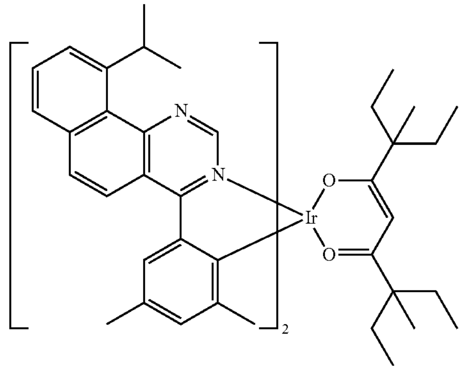
6
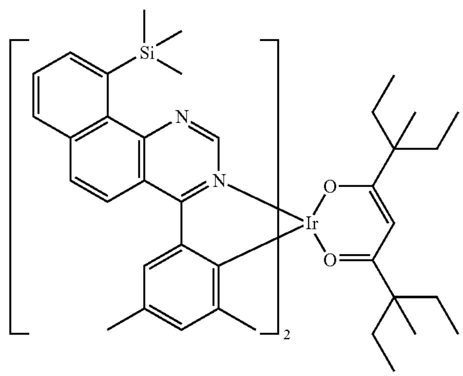
7
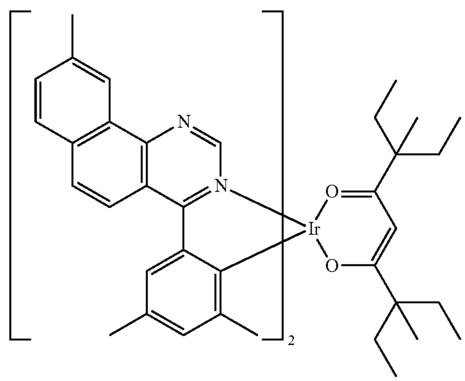
8
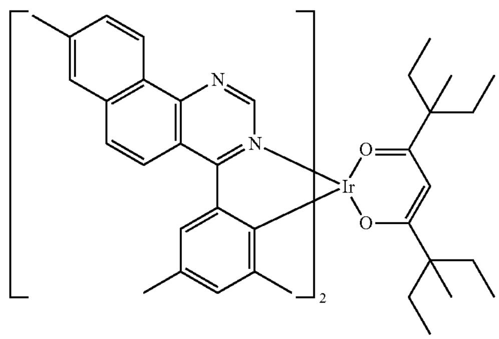

-continued
9
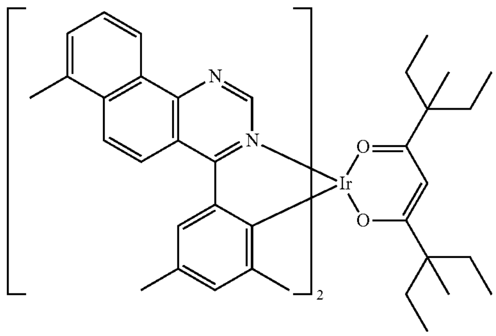
10
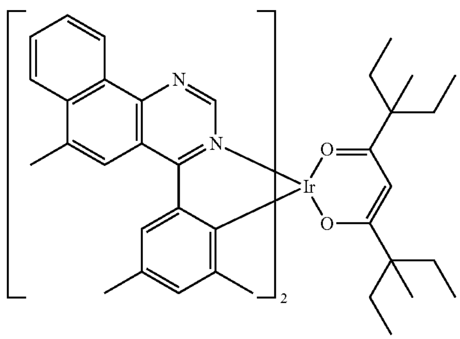
11
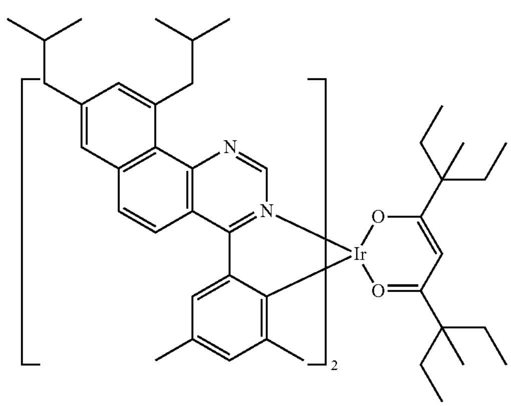
12
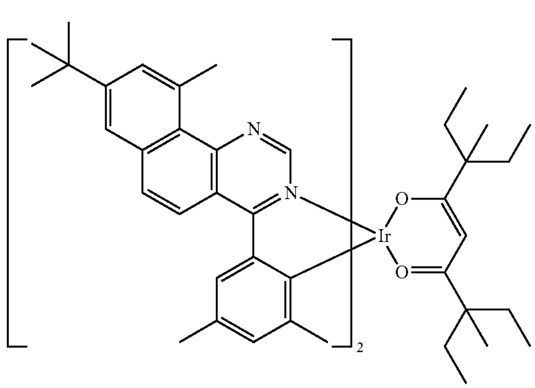
-continued
13
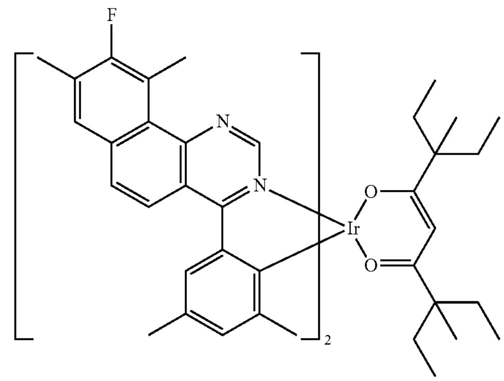
14
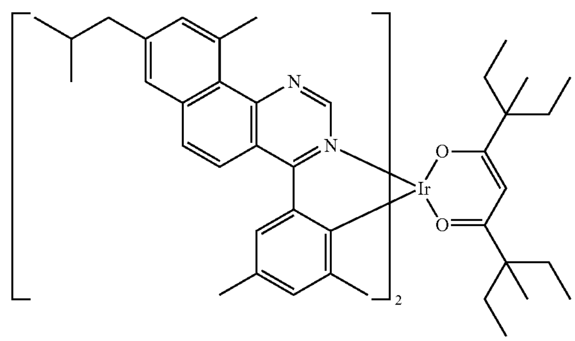
15
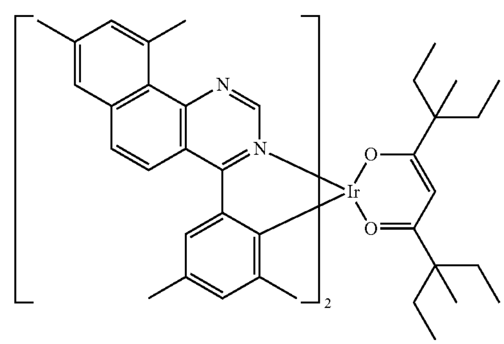
16
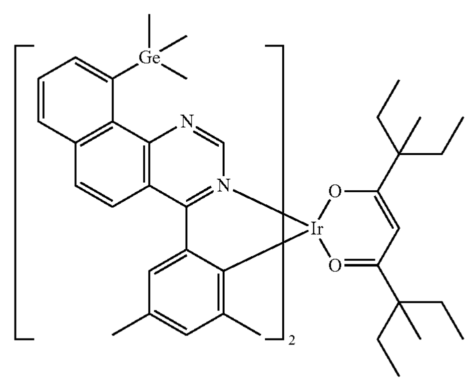

17
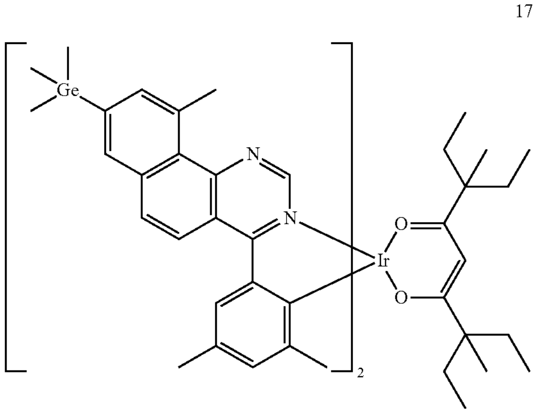
18
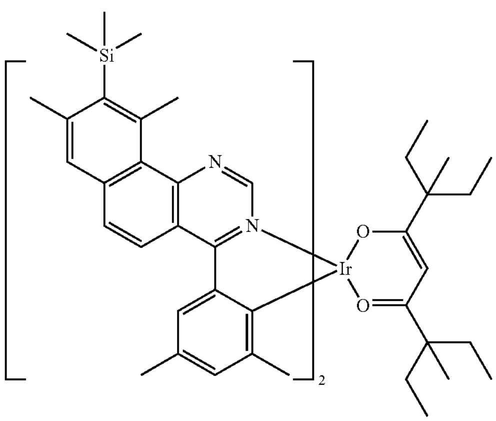
19
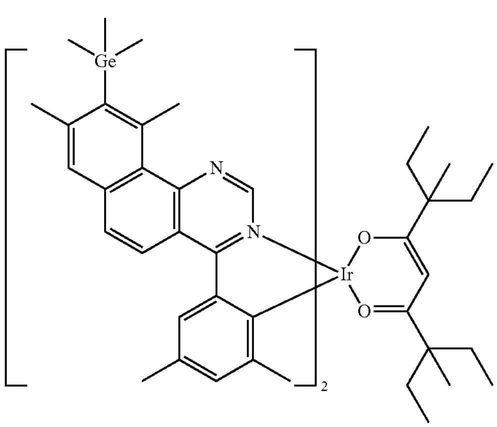
20
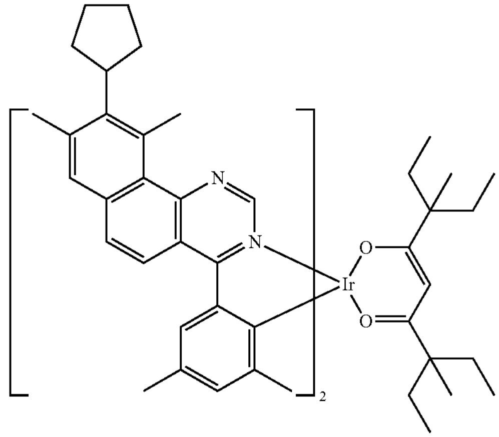
21
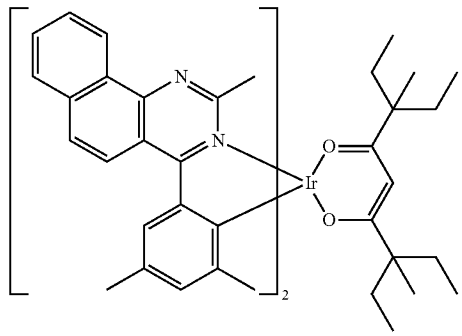
22
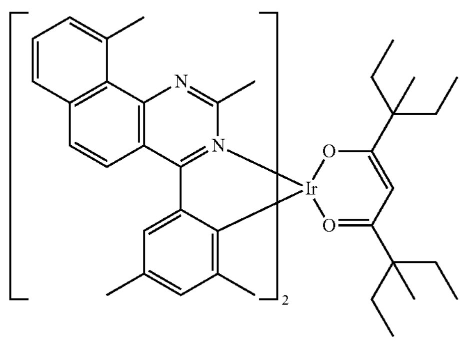
23
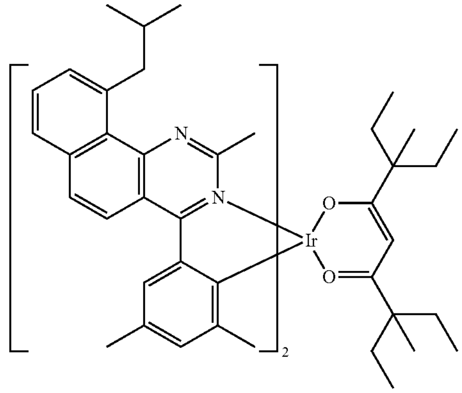

-continued
24
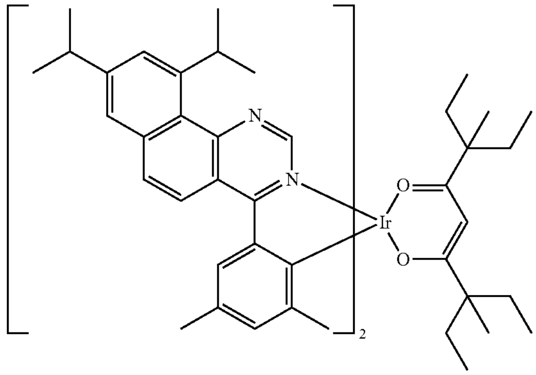
25
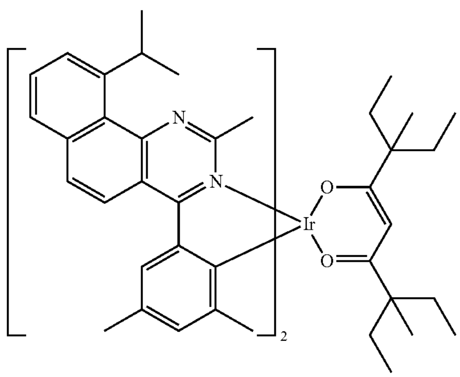
26
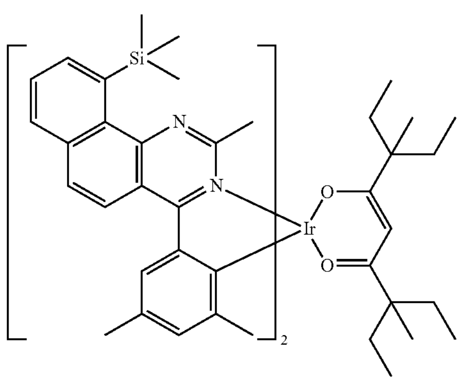
27
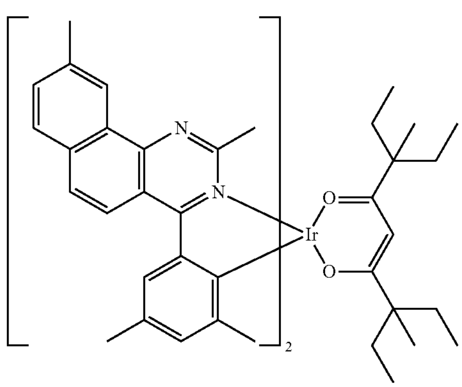
-continued
28
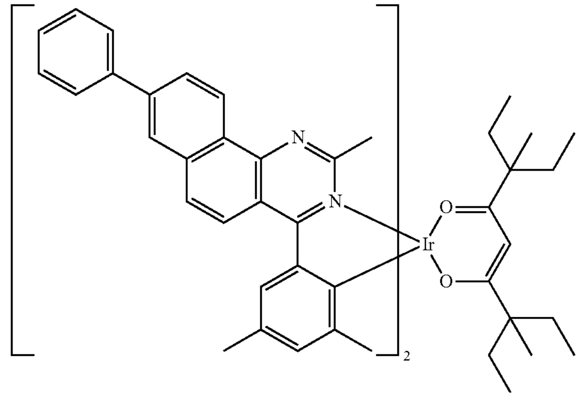
29
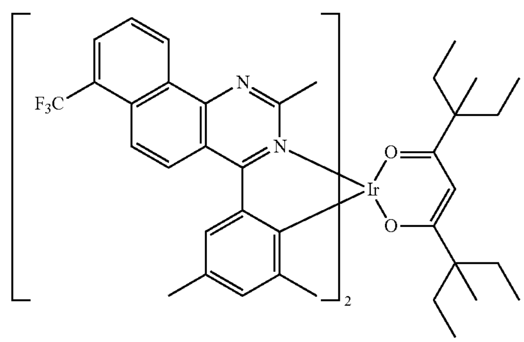
30
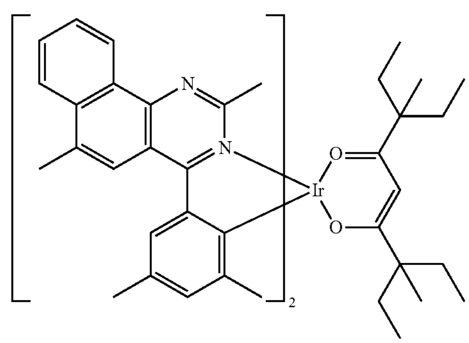
31
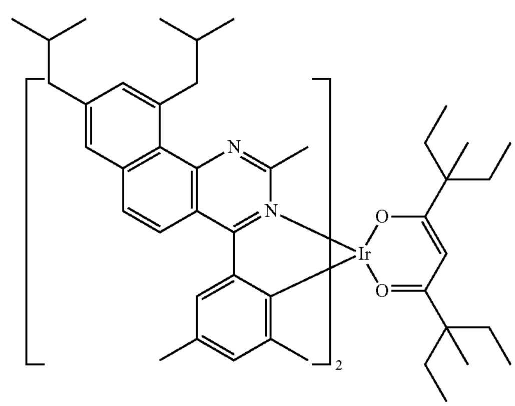

-continued
32
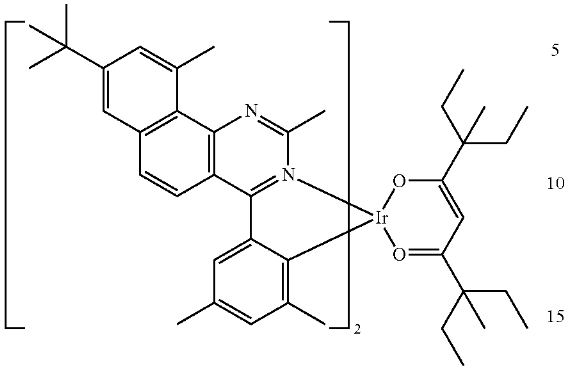
33
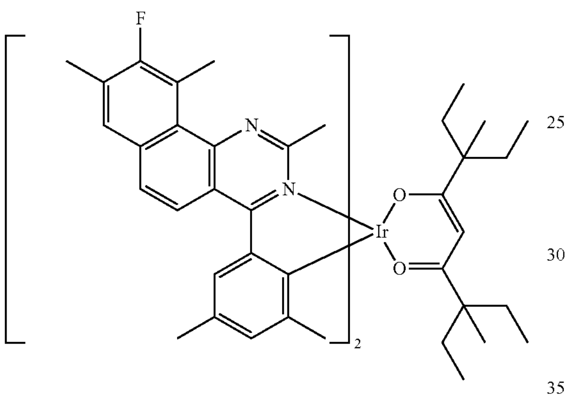
34
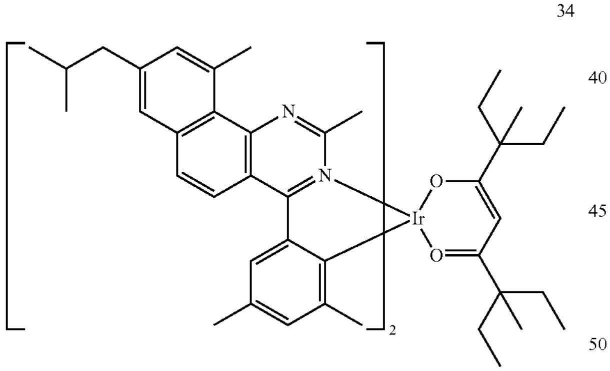
35
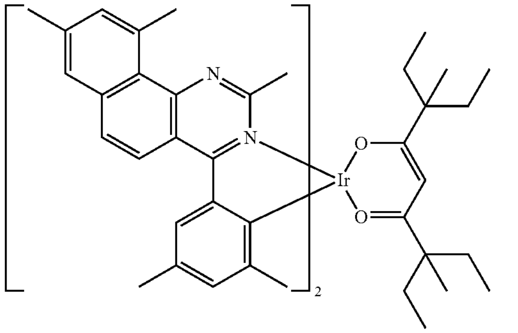
-continued
36
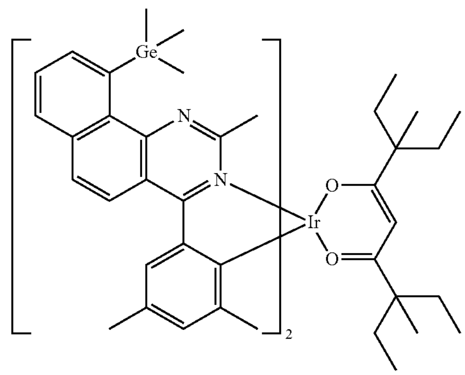
37
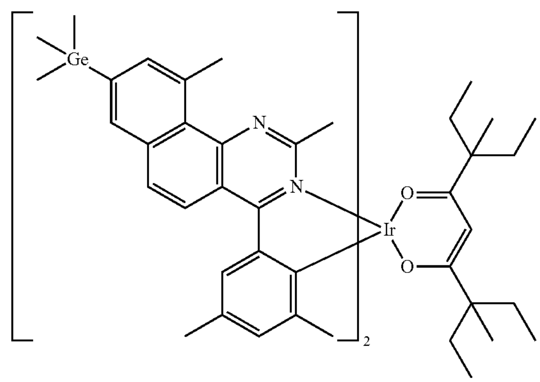
38
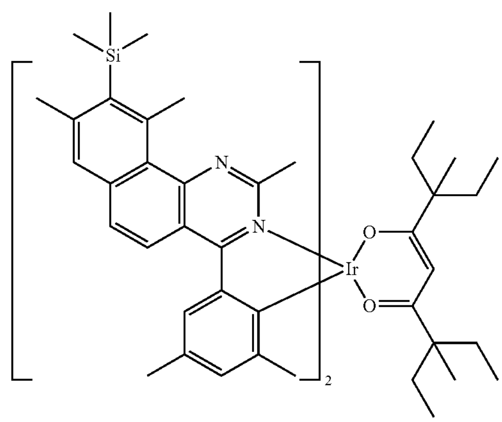
39
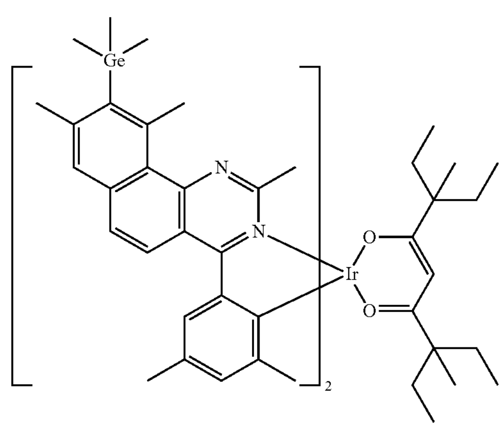

40
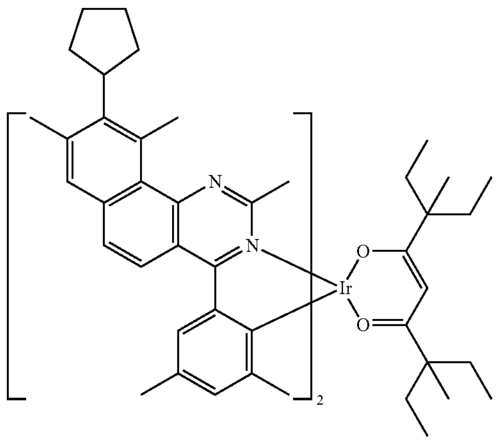
41
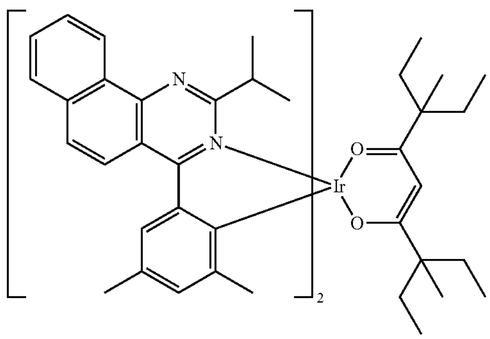
42
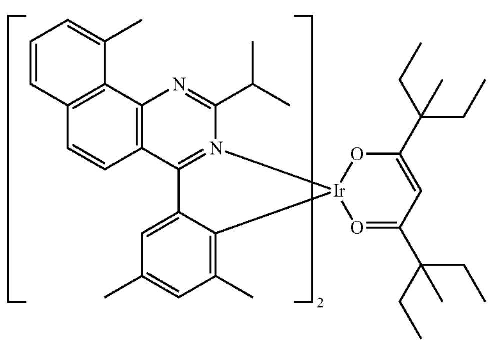
43
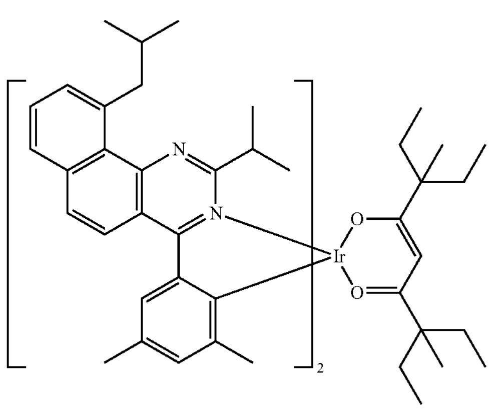
44
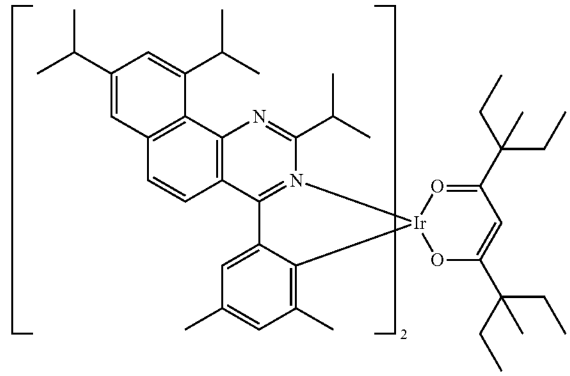
45
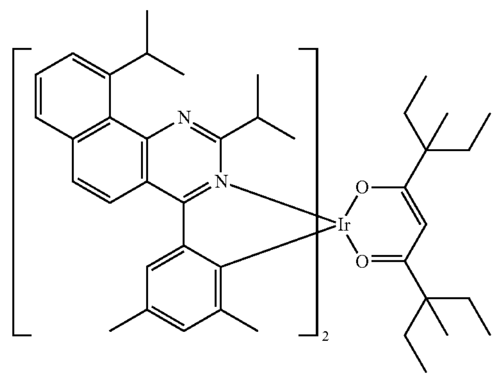
46
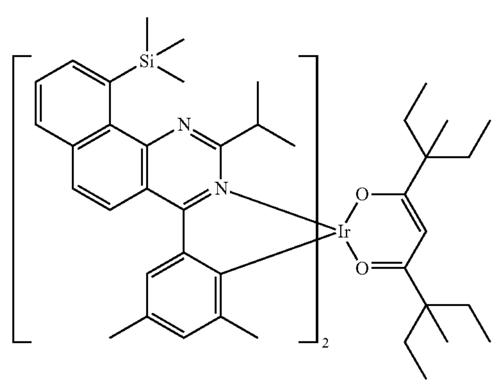
47
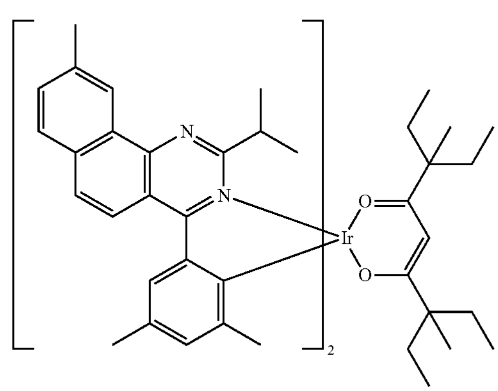

48
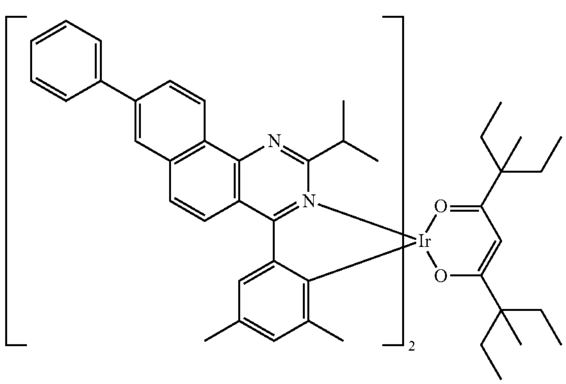
49
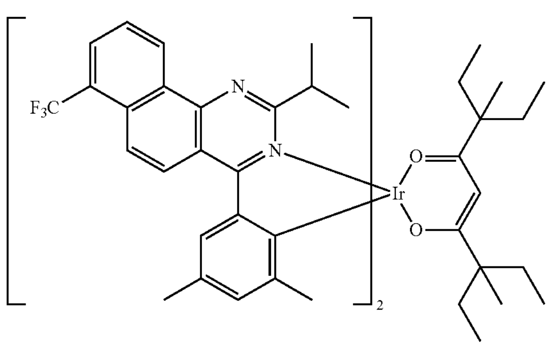
50
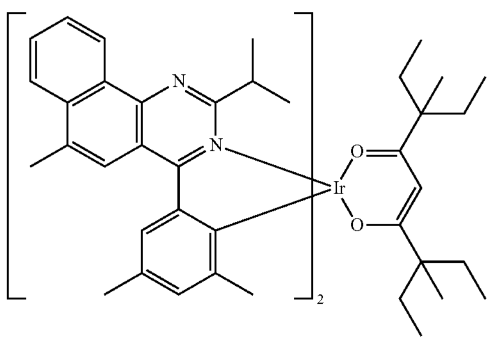
51
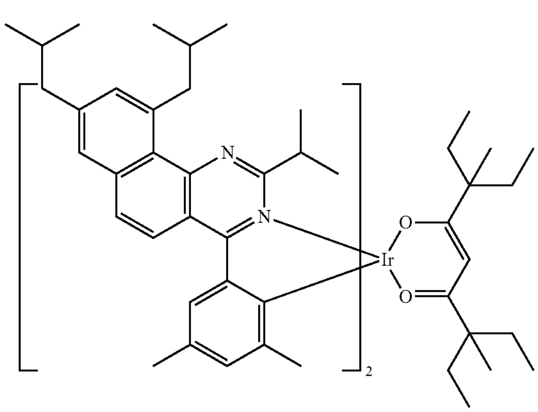
52
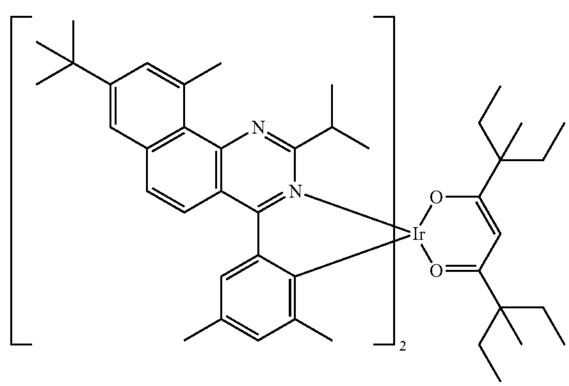
53
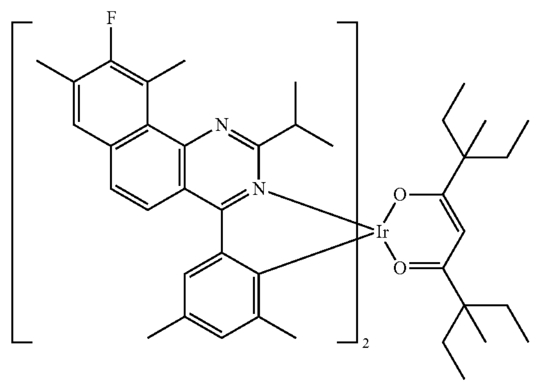
54
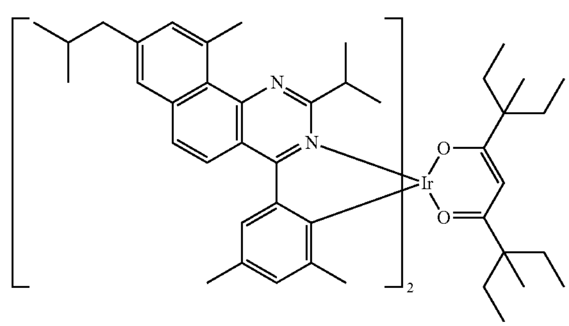
55
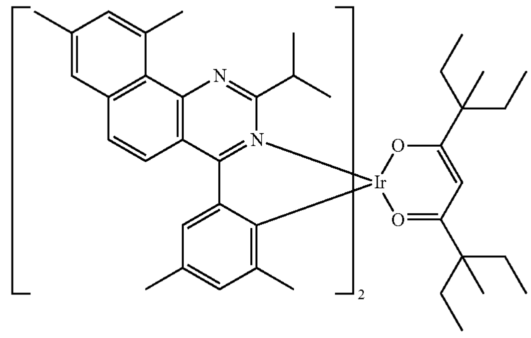

-continued
56
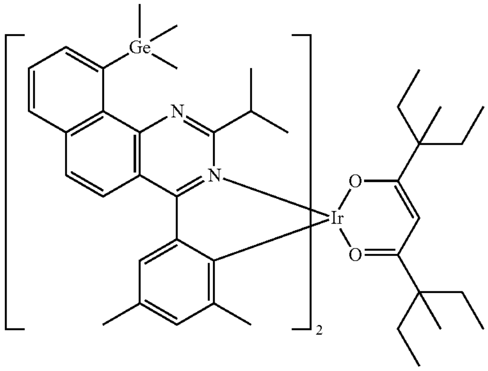
57
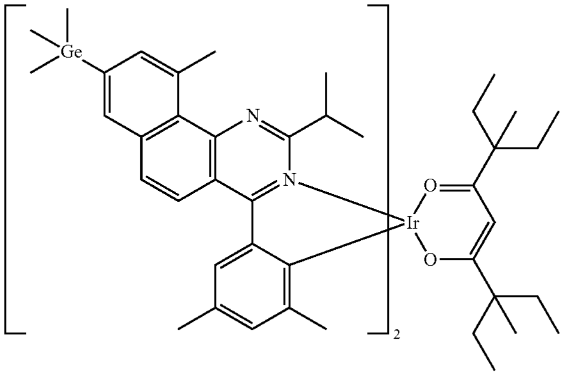
58
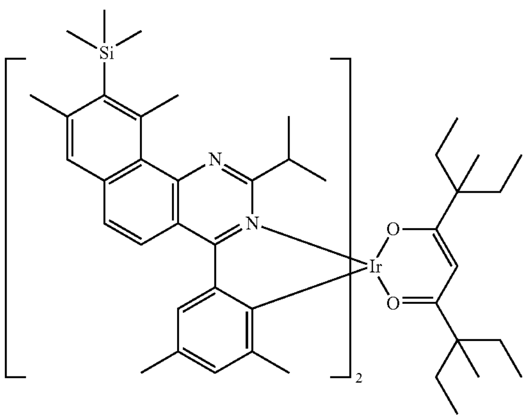
59
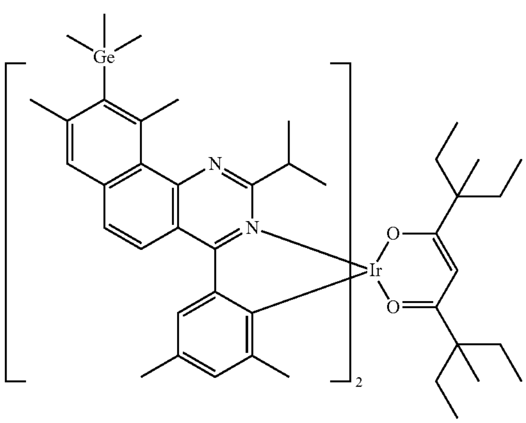
-continued
60
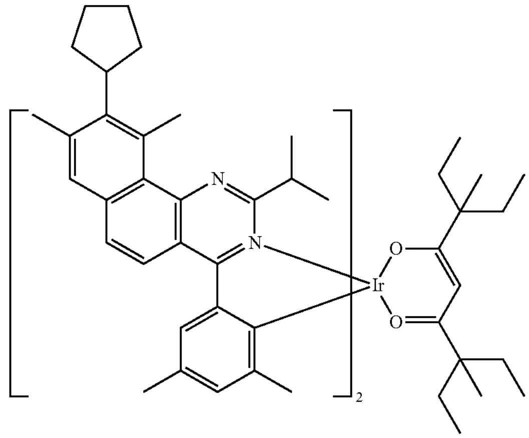
61
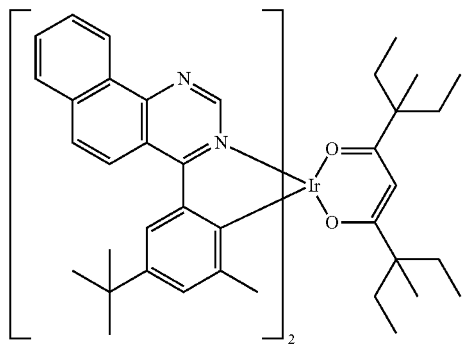
62
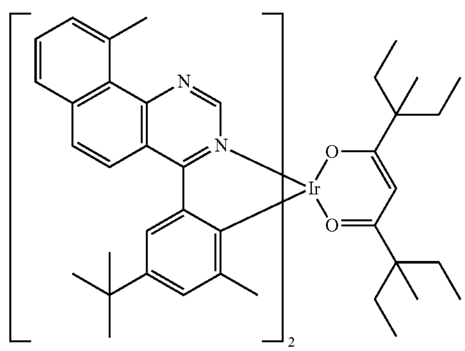
63
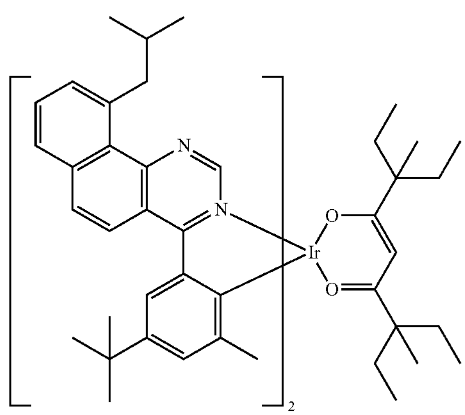

-continued
64
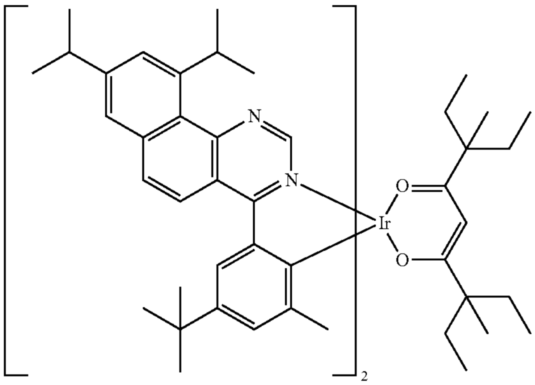
65
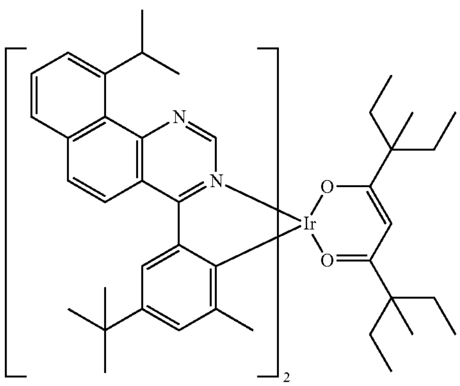
66
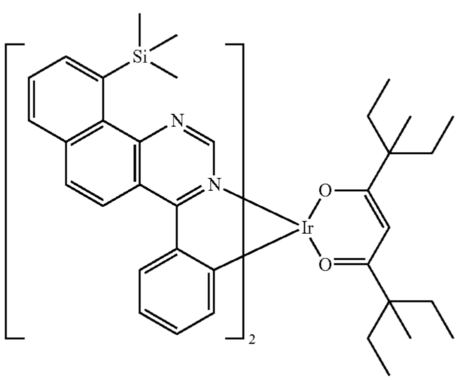
67
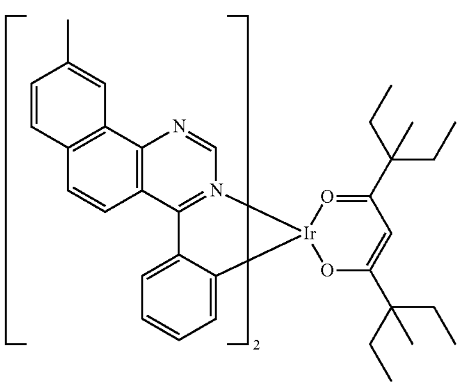
-continued
68
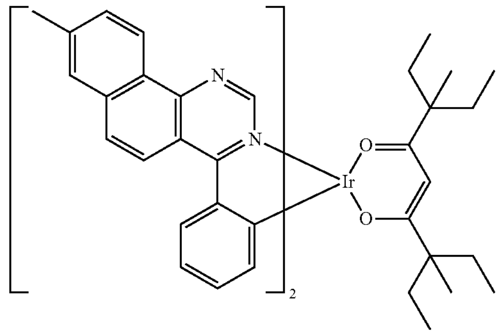
69
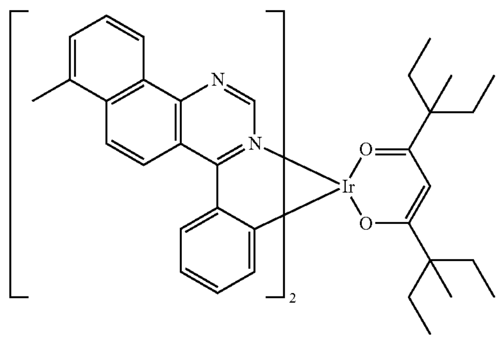
70
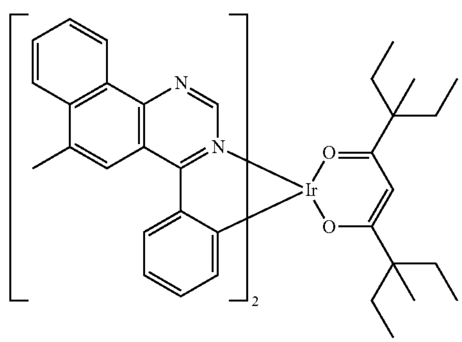
71
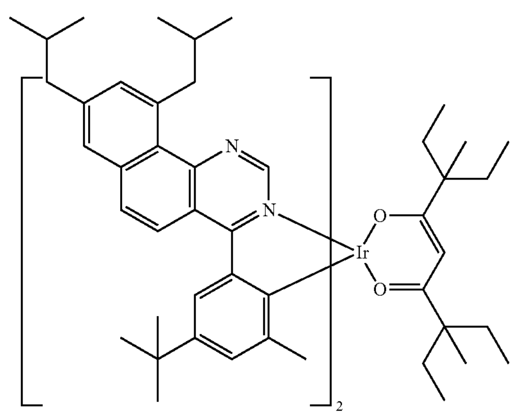

72
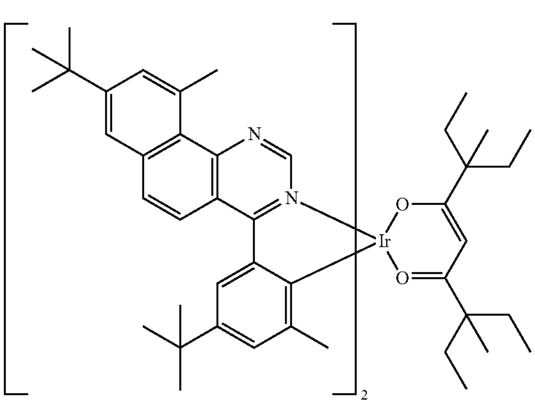
73
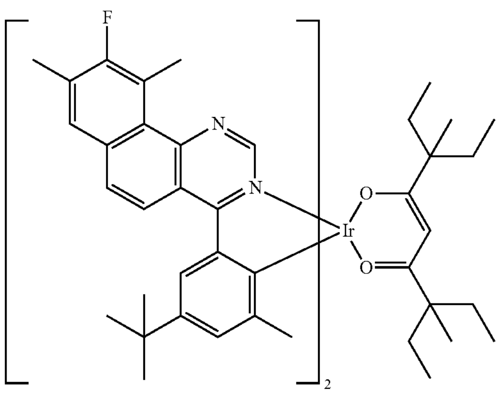
74
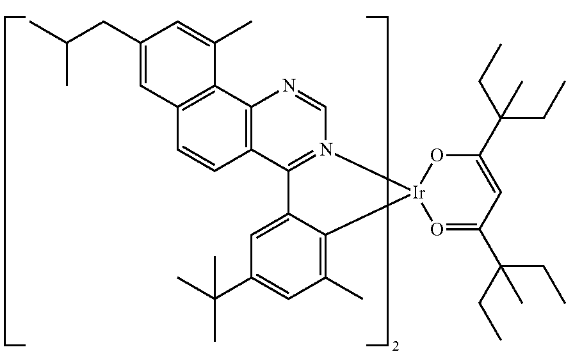
75
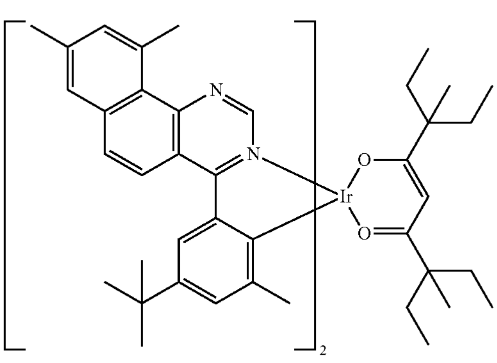
76
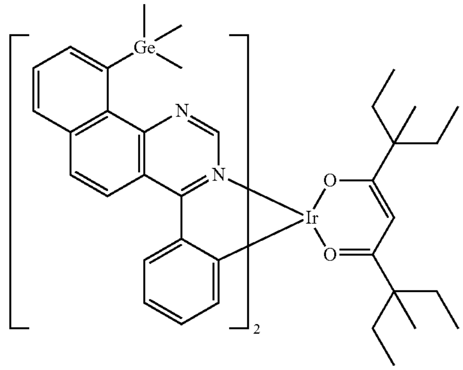
77
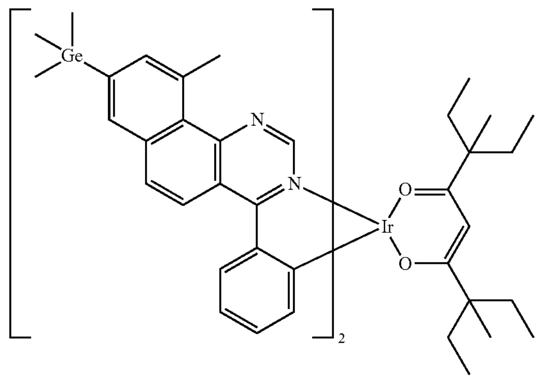
78
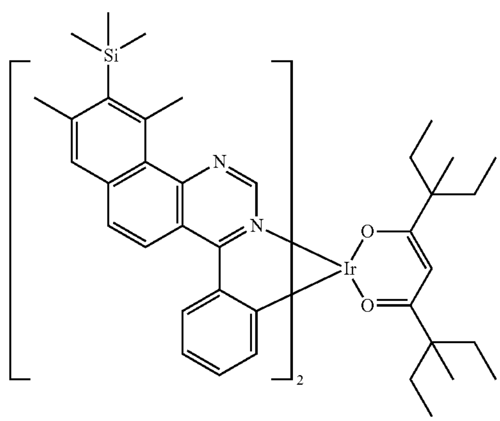
79
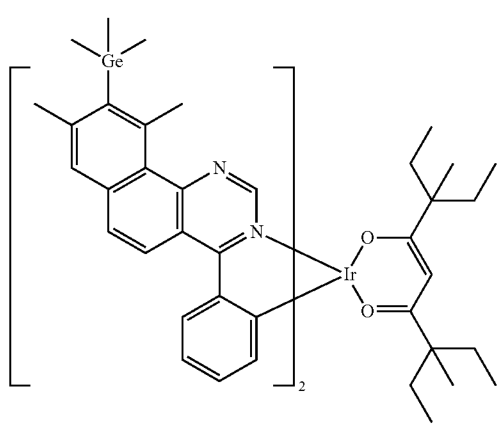

80
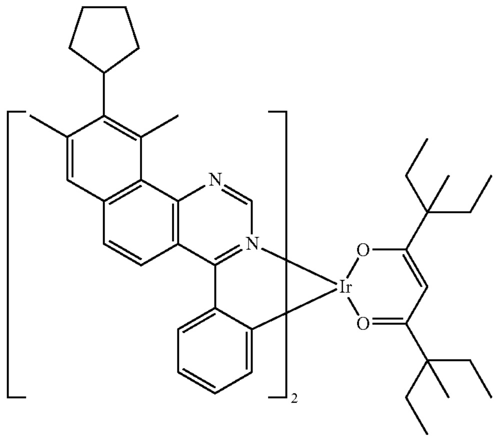
81
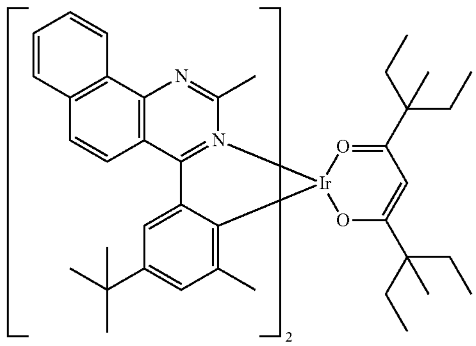
82
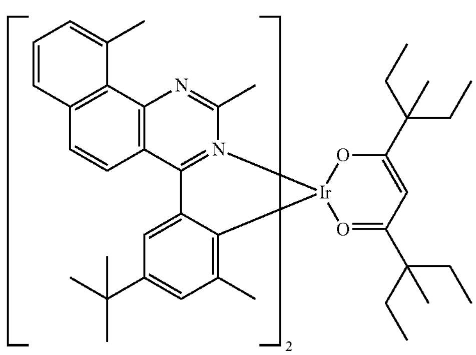
83
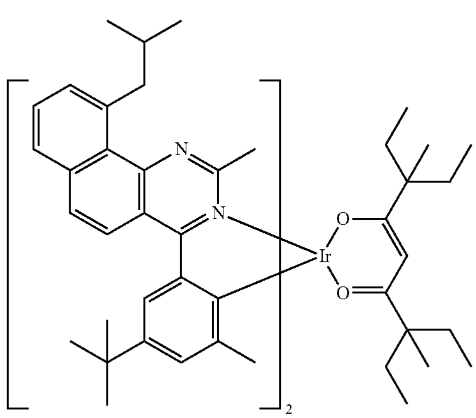
84
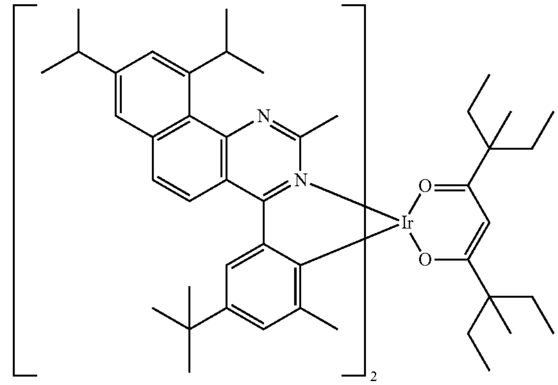
85
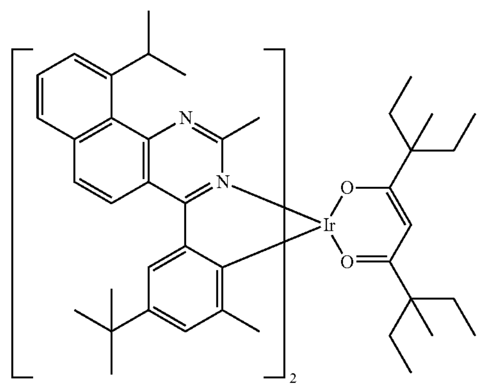
86
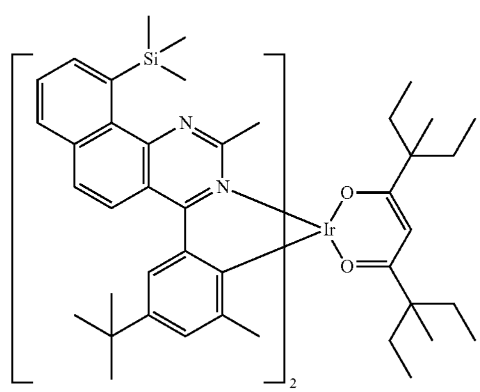
87
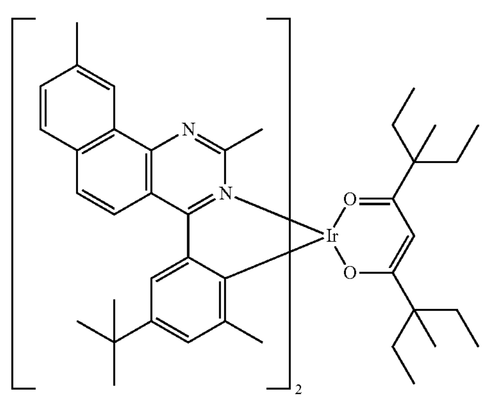

-continued
88
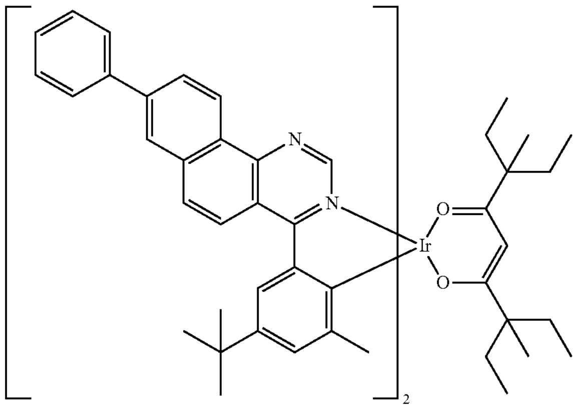
89
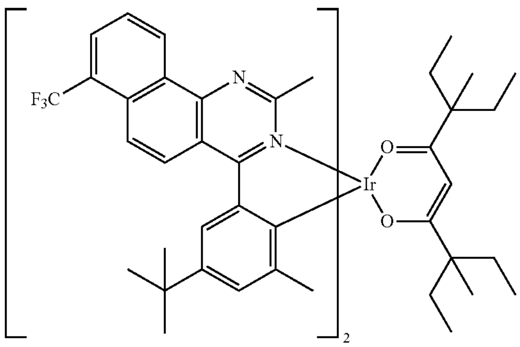
90
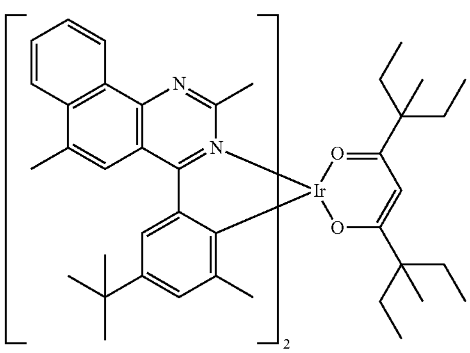
91
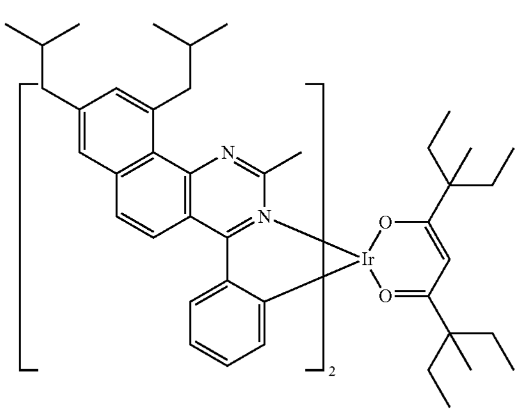
-continued
92
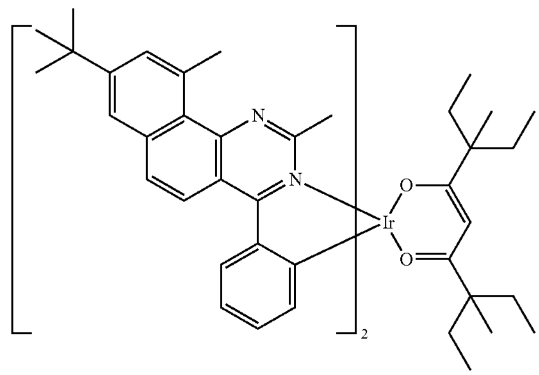
93
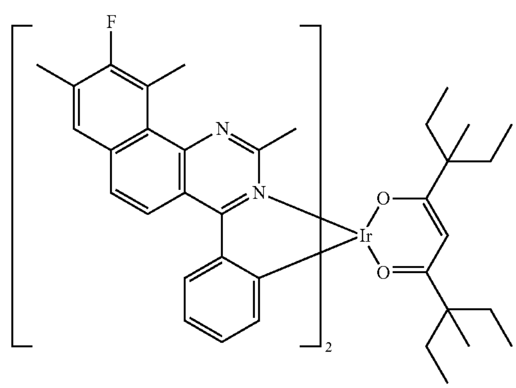
94
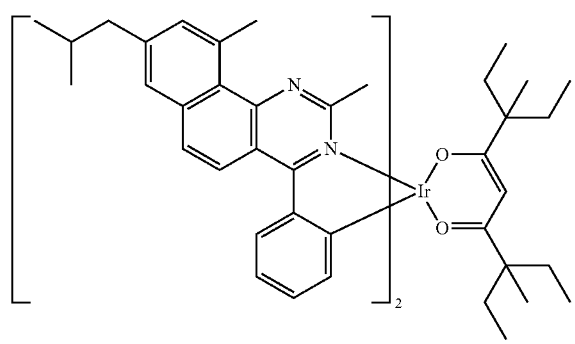
95
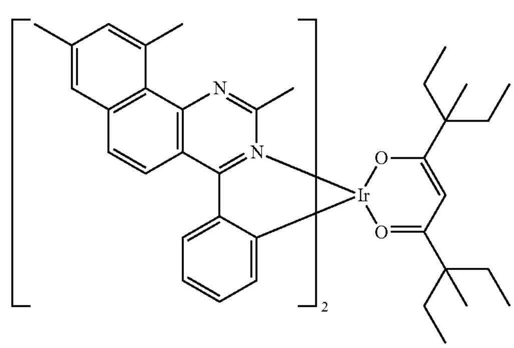

-continued
96
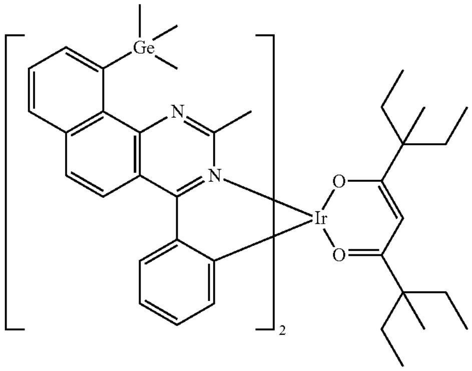
97
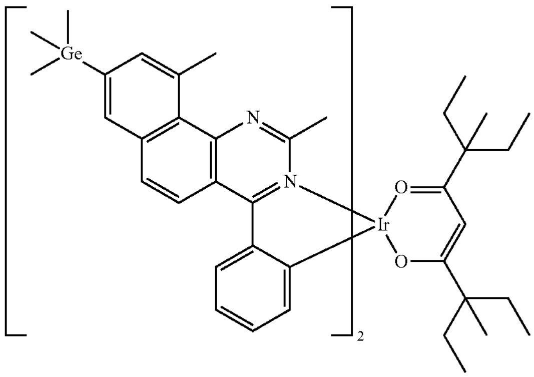
98
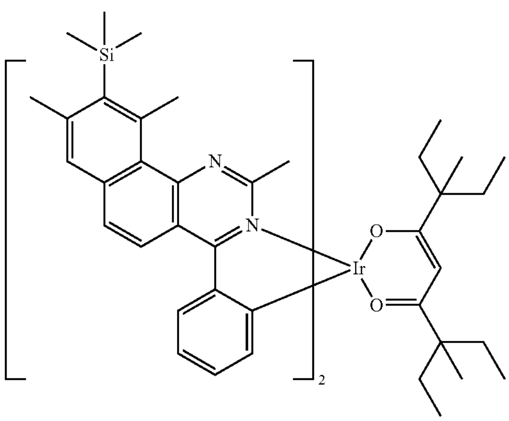
99
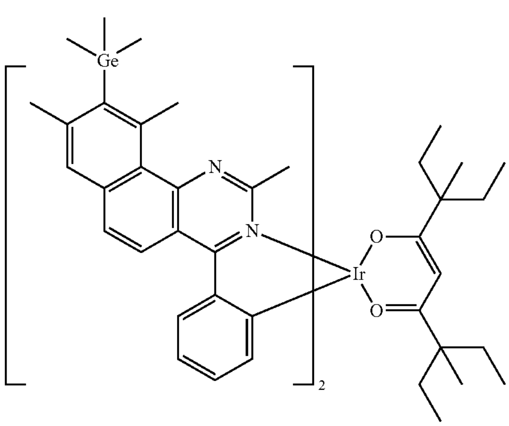
-continued
100
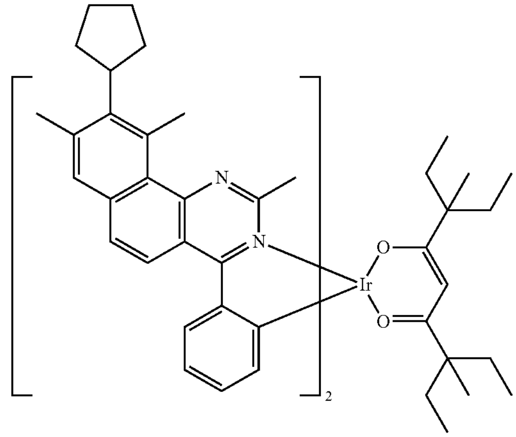
101
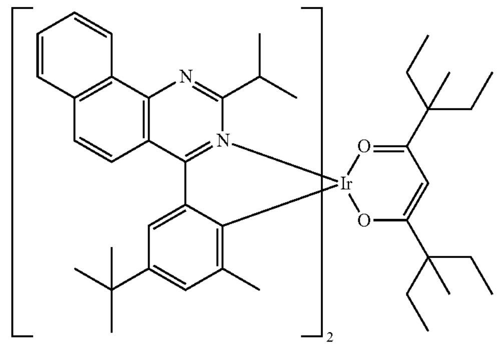
102
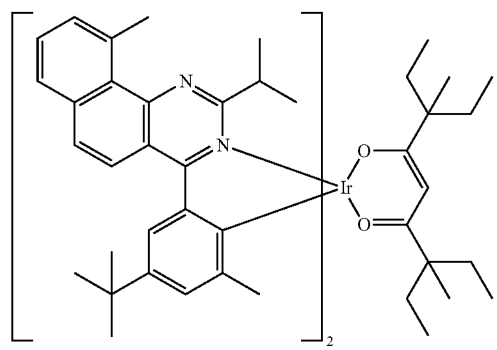
103
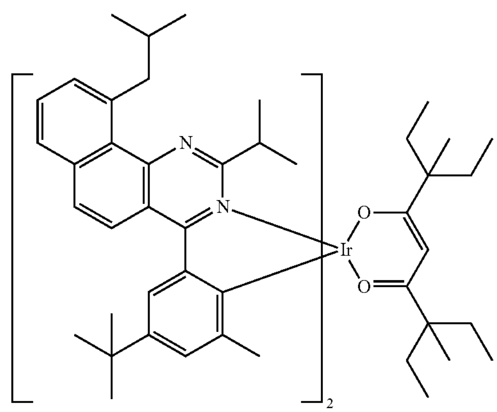

-continued
104
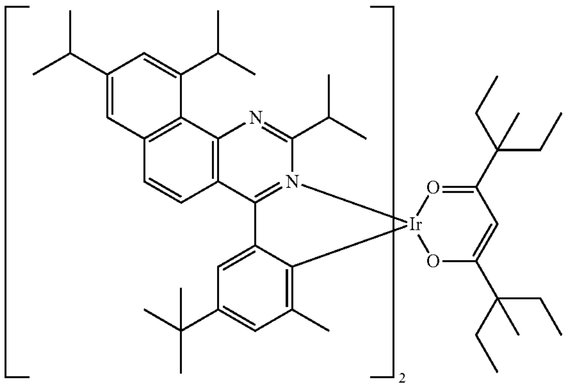
105
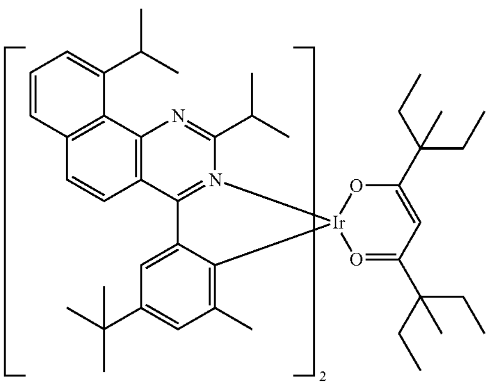
106
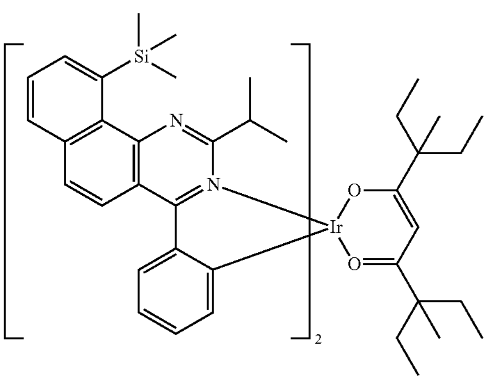
107
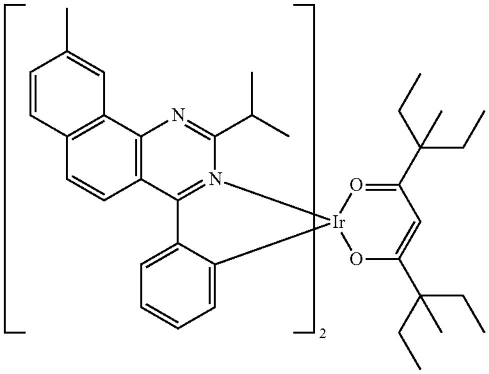
-continued
108
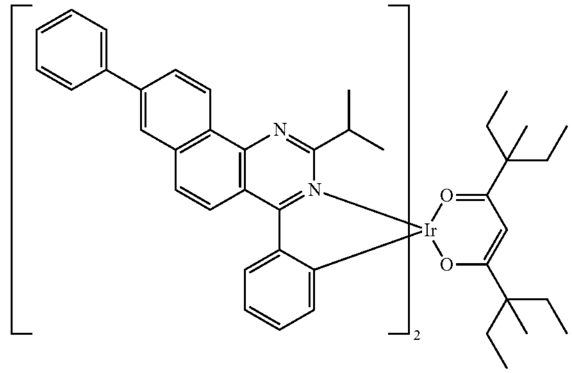
109
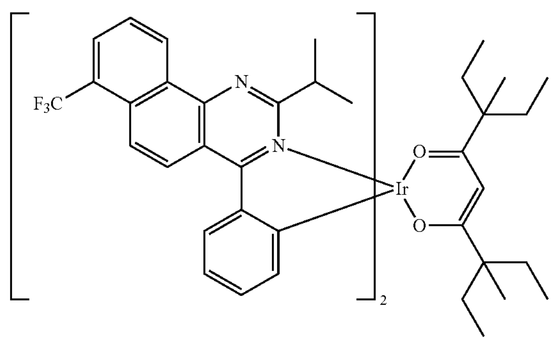
110
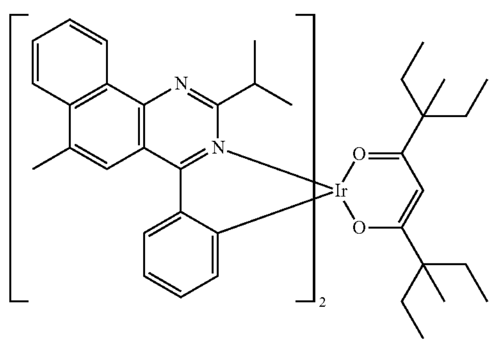
111
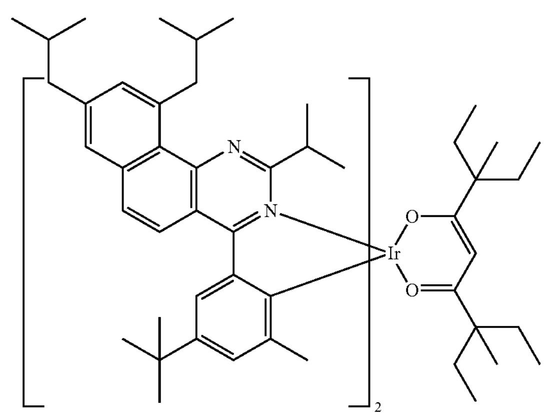

112
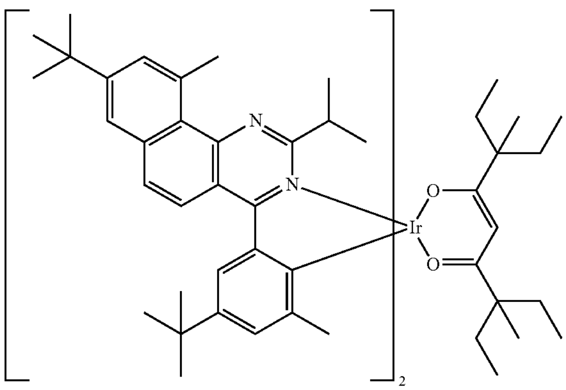
113
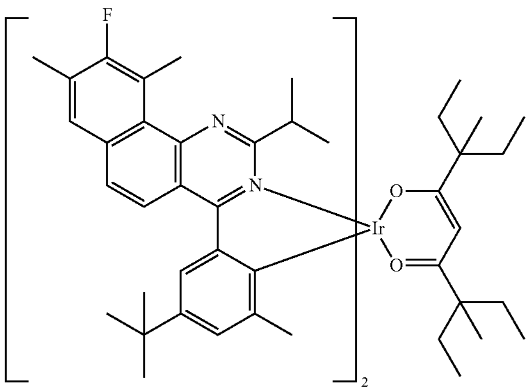
114
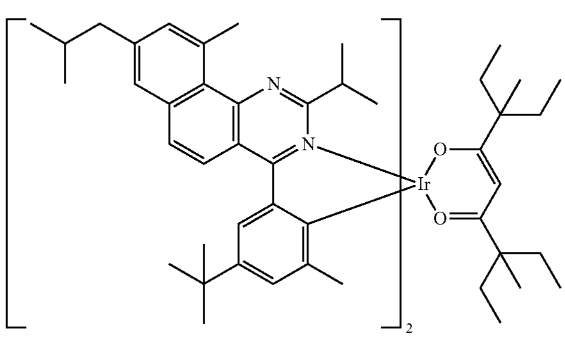
115
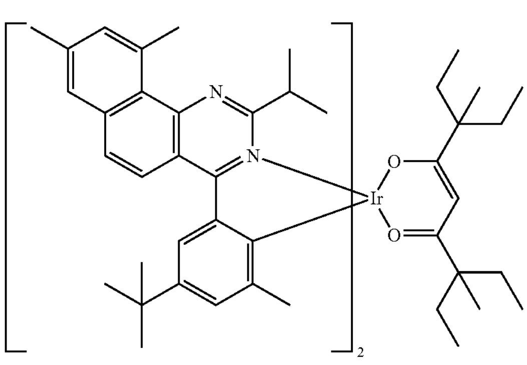
116
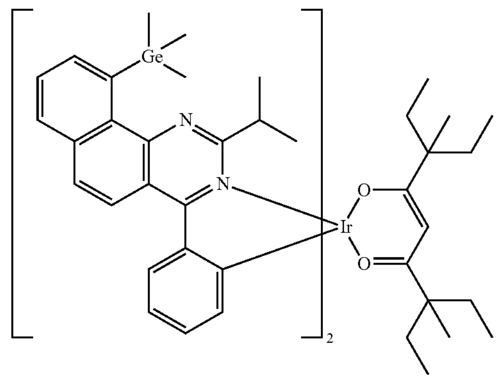
117
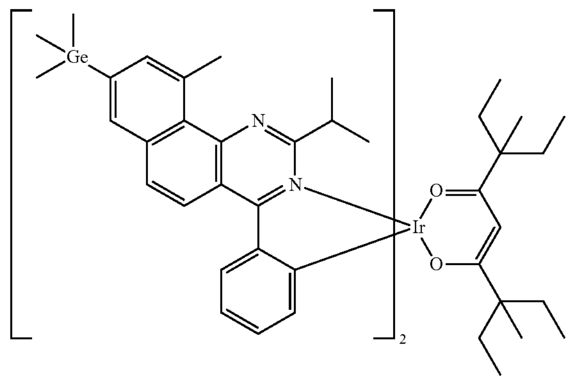
118
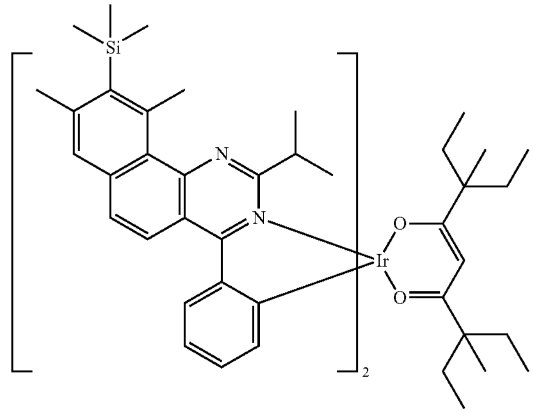

-continued
119
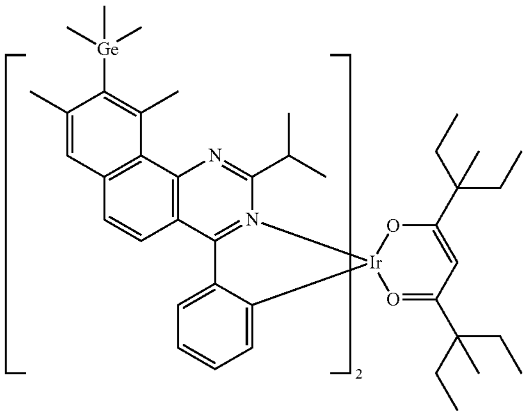
120
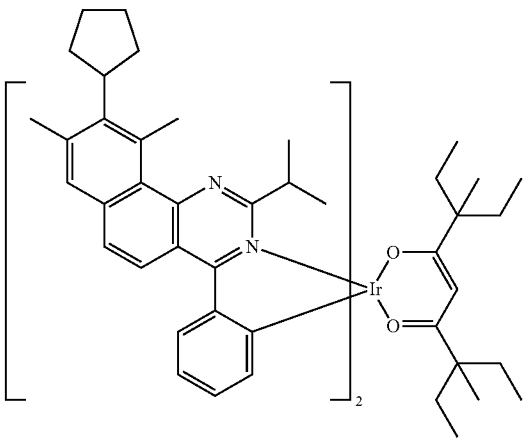
121
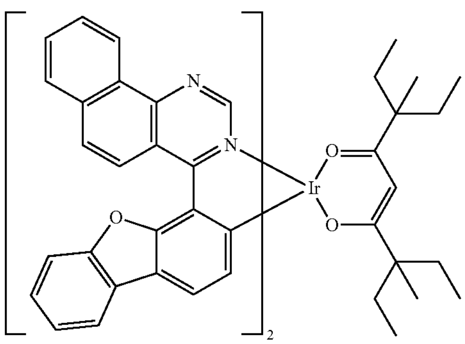
122
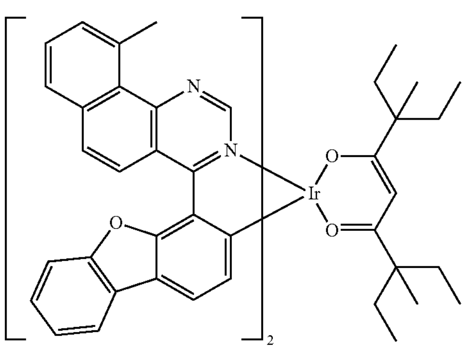
-continued
123
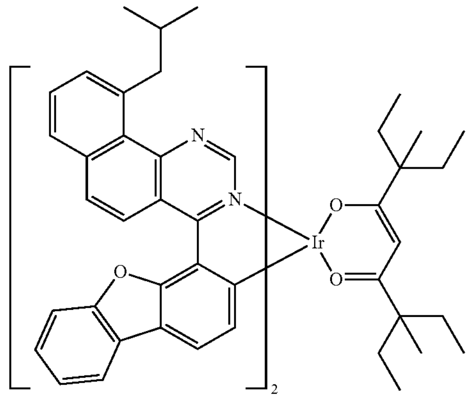
124
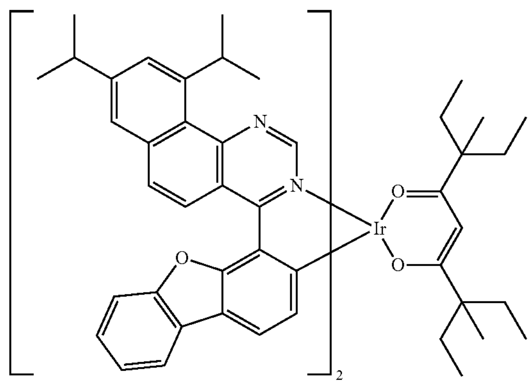
125
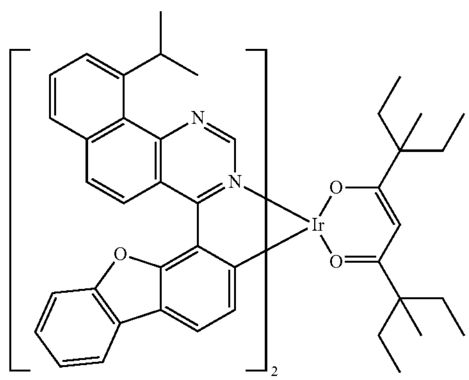
126
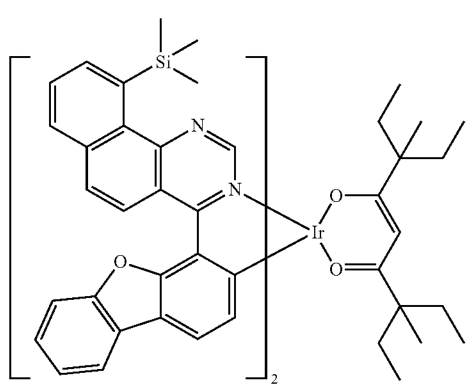

127
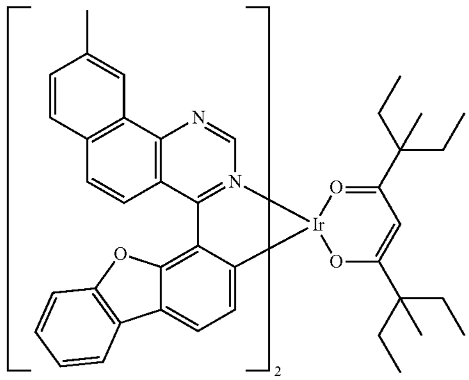
128
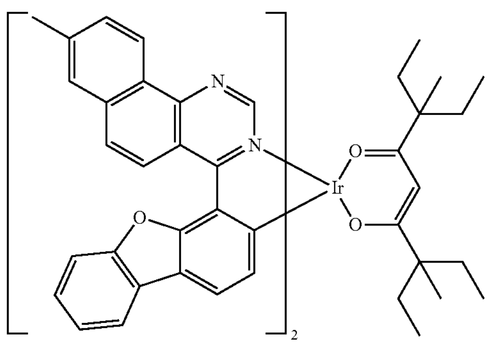
129
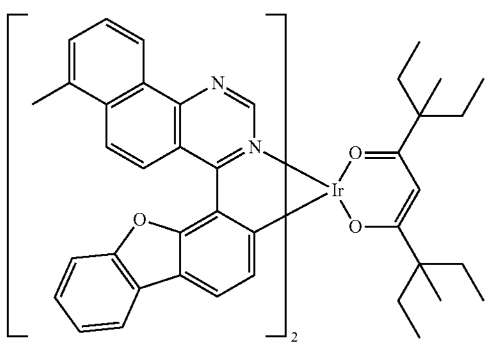
130
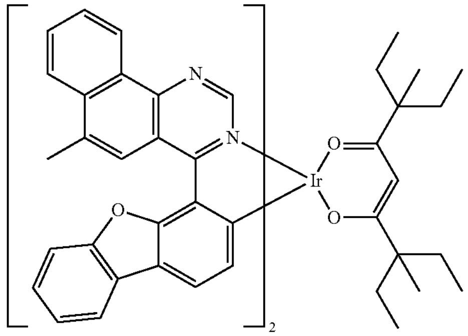
131
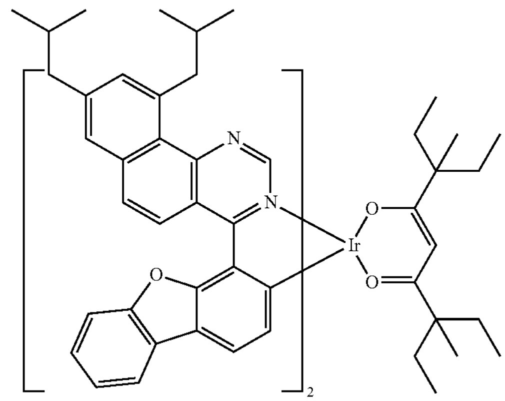
132
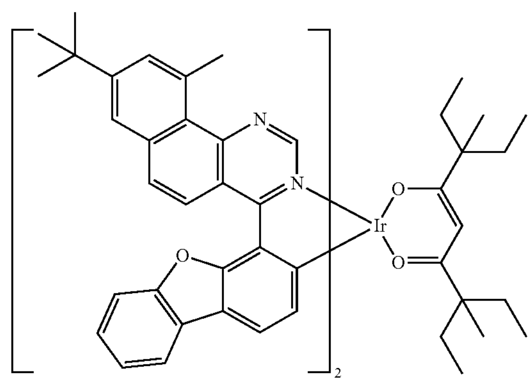
133
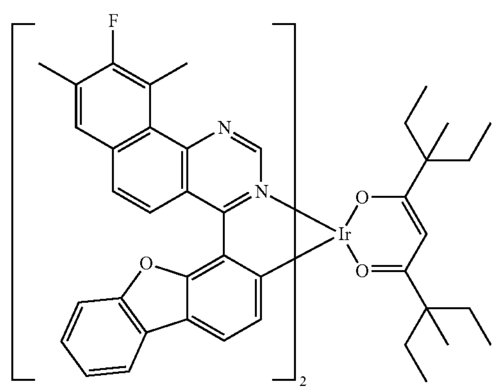
134
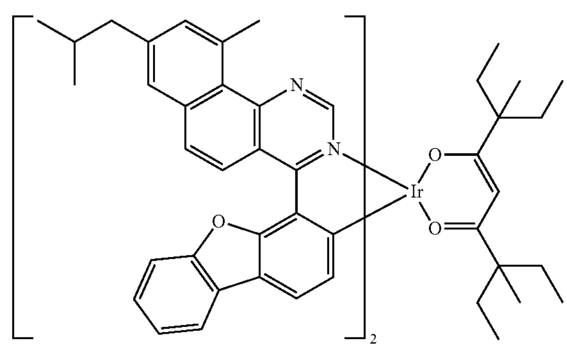

135
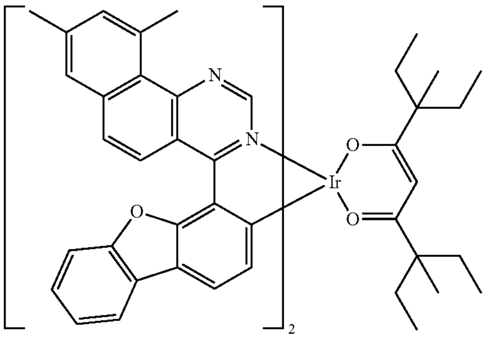
136
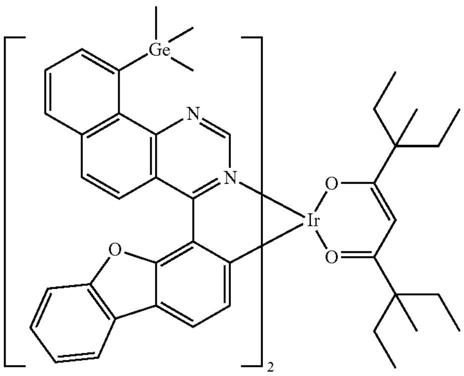
137
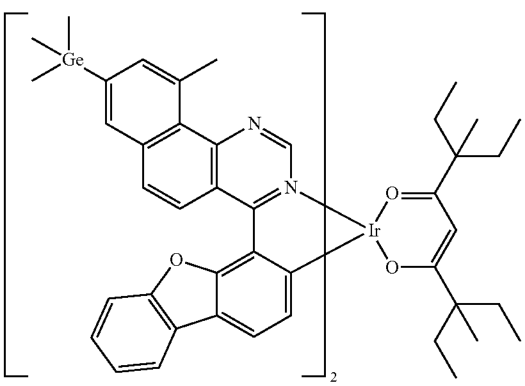
138
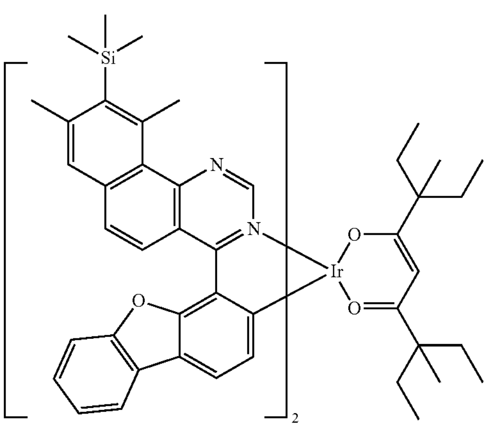
139
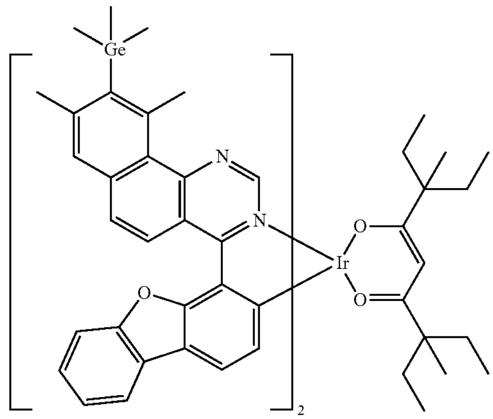
140
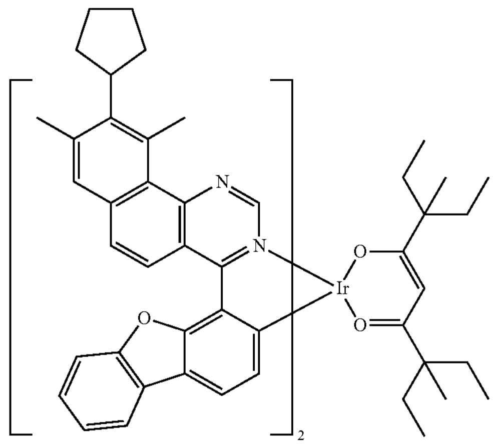
141
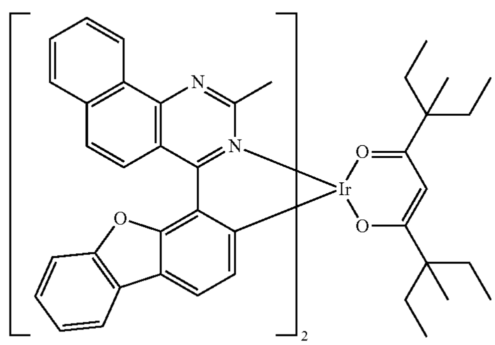
142
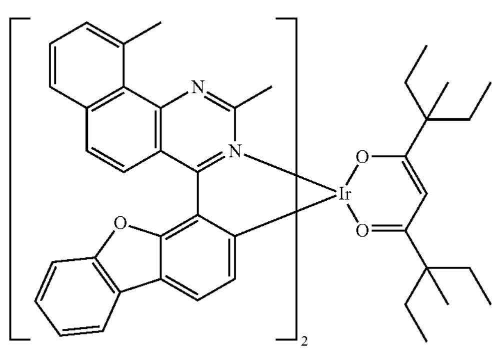

-continued
143
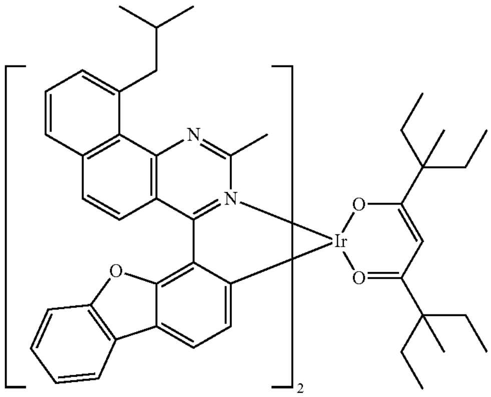
144
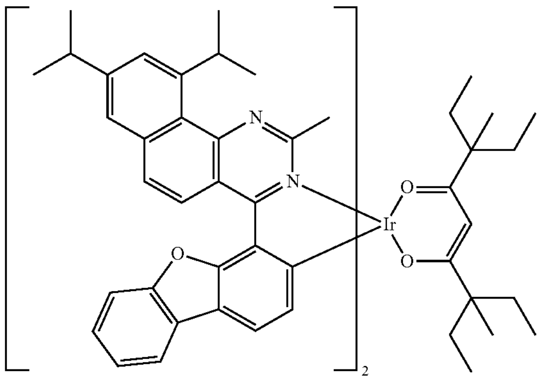
145
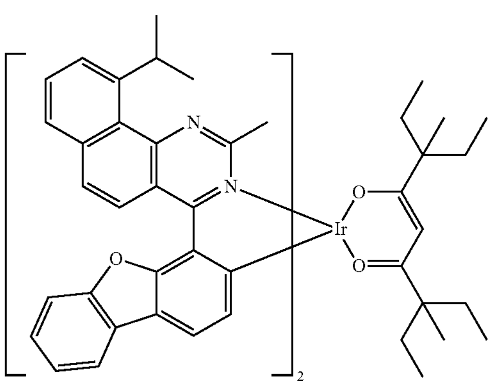
146
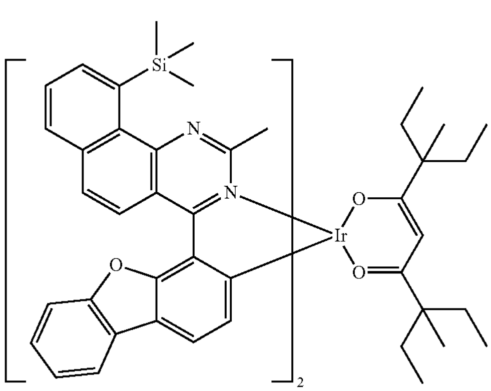
-continued
147
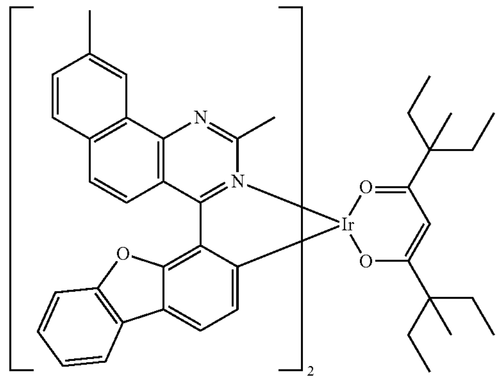
148
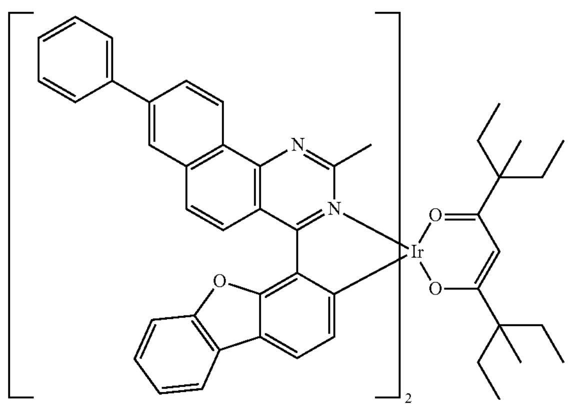
149
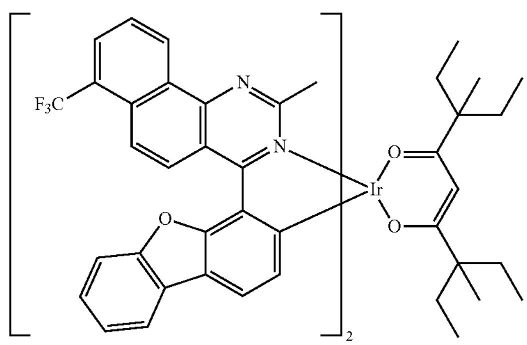
150
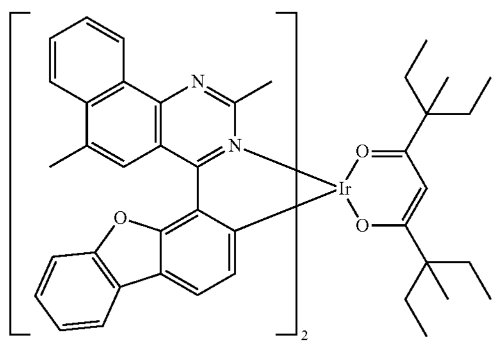

151
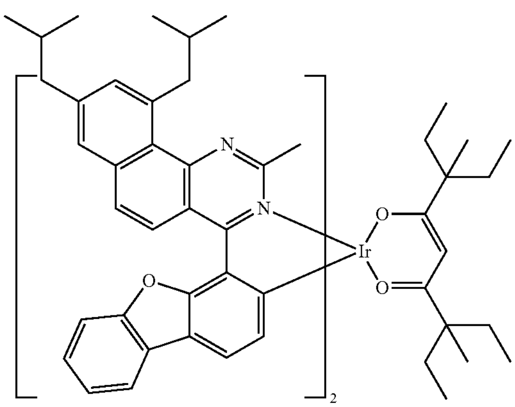
152
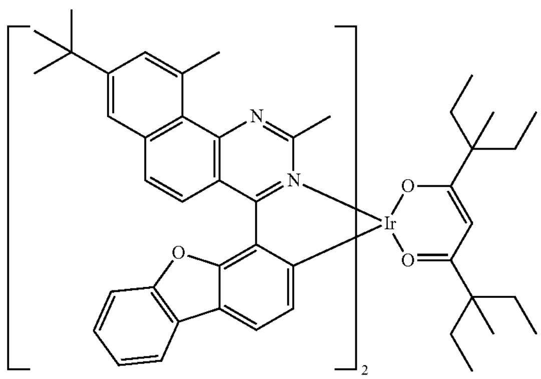
153
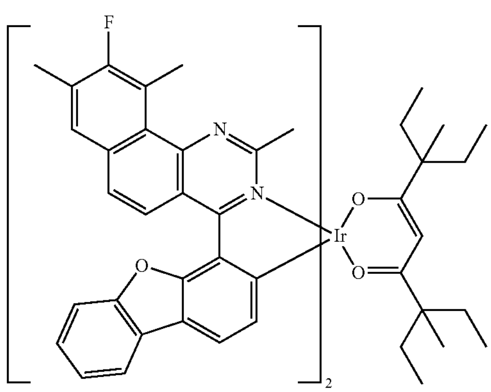
154
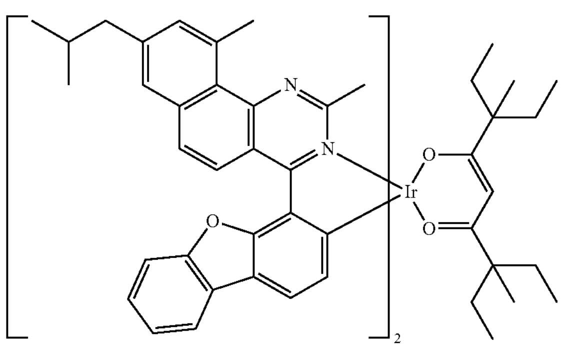
155
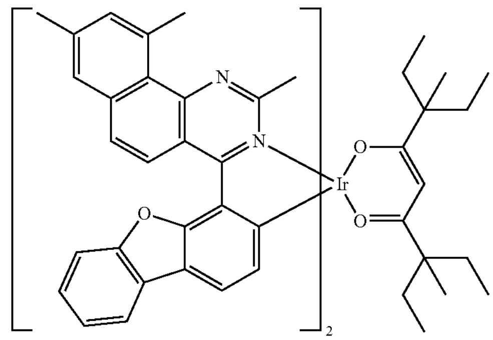
156
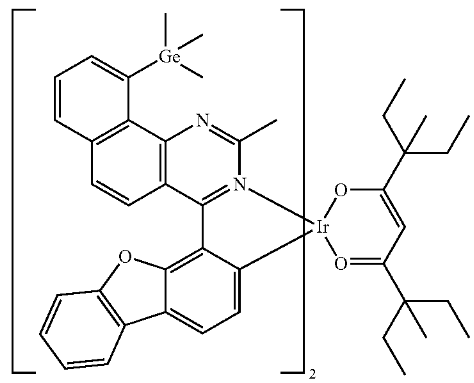
157
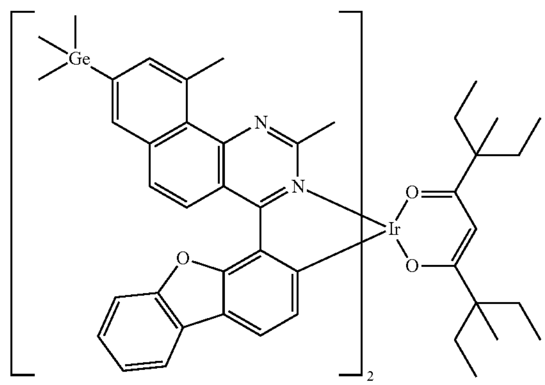
158
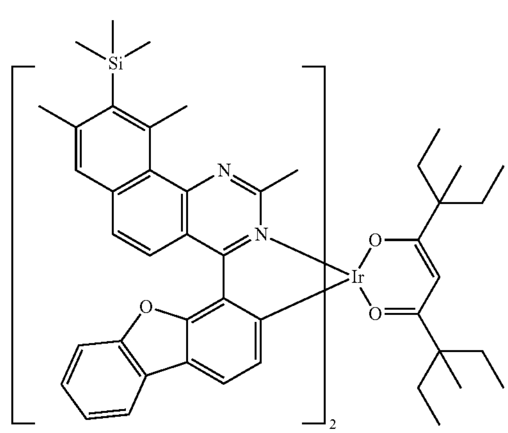

159
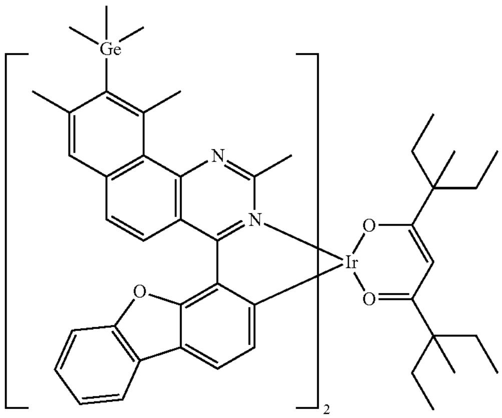
160
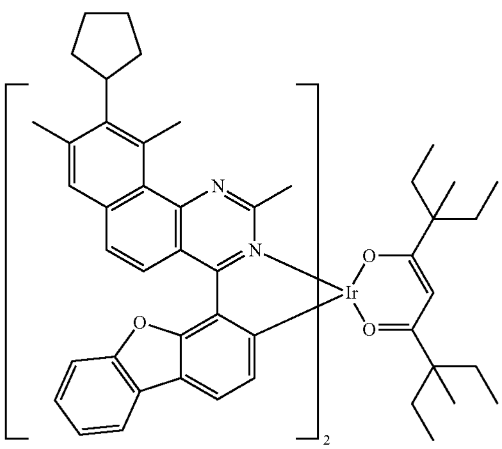
161
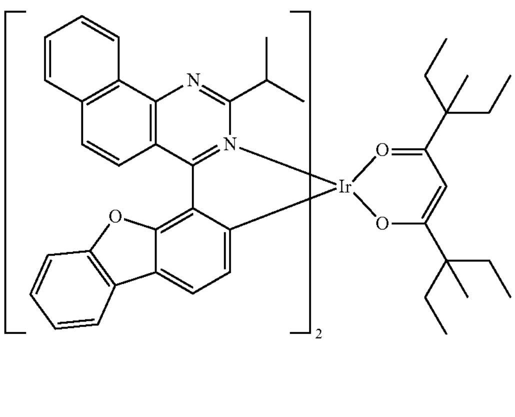
162
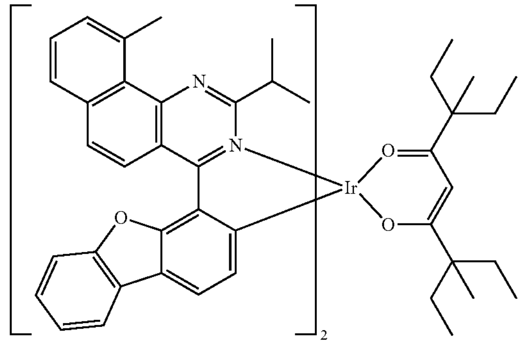
163
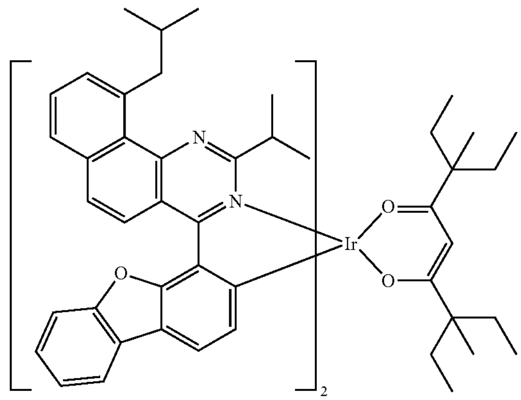
164
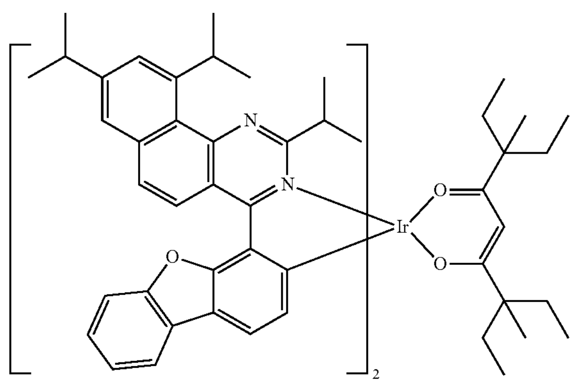
165
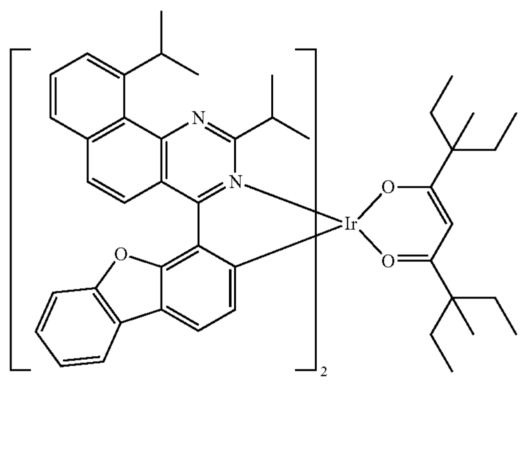

-continued
166
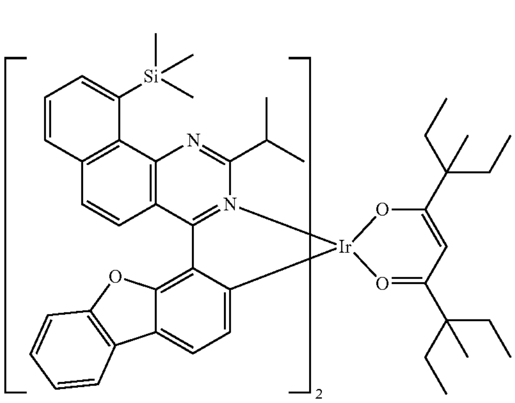
167
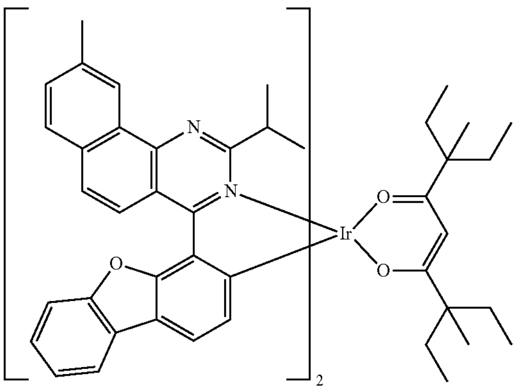
168
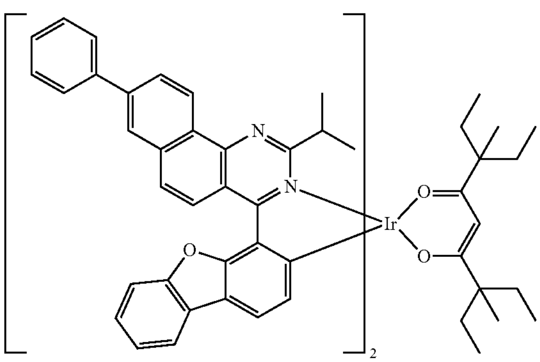
169
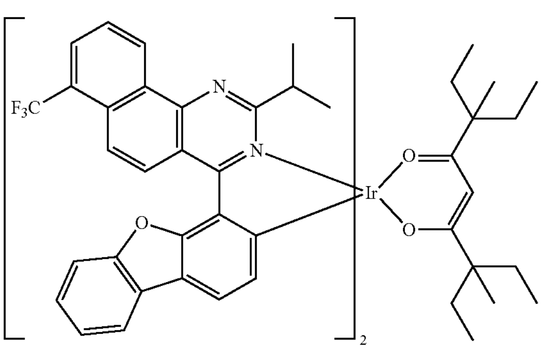
-continued
170
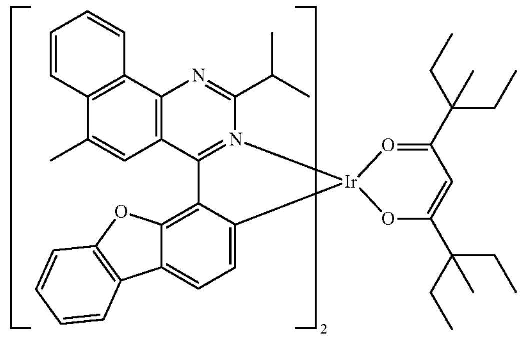
171
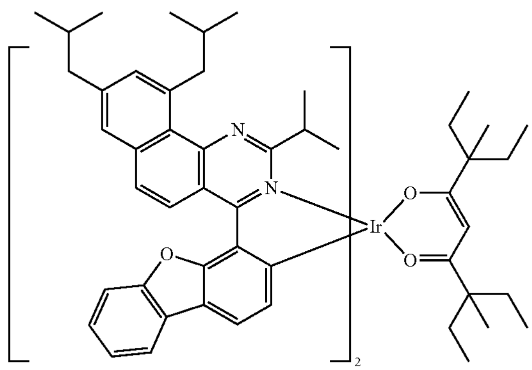
172
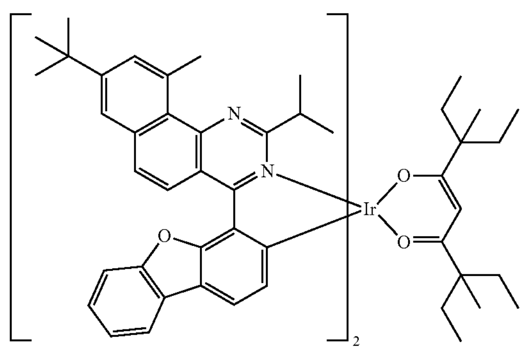
173
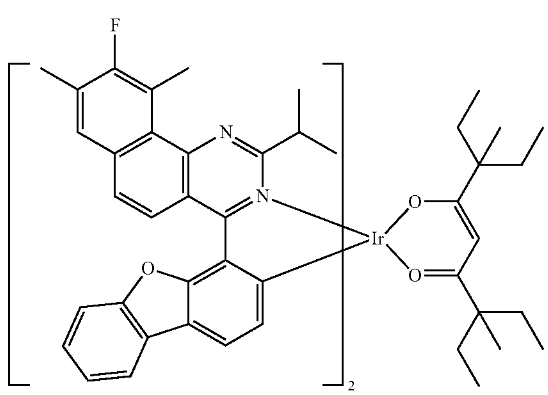

-continued
174
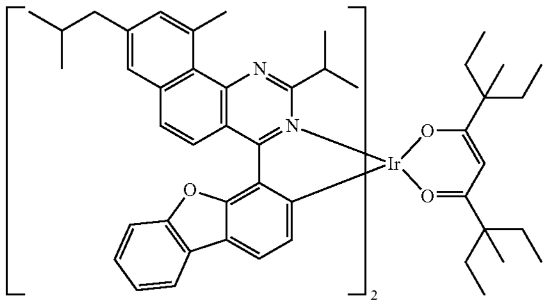
175
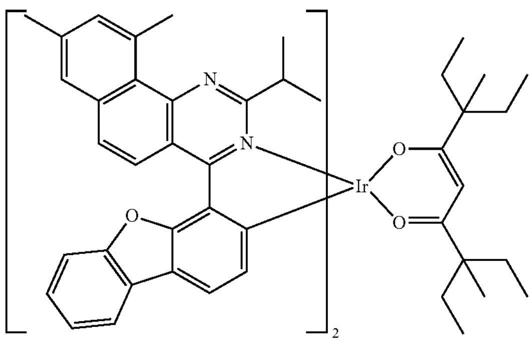
176
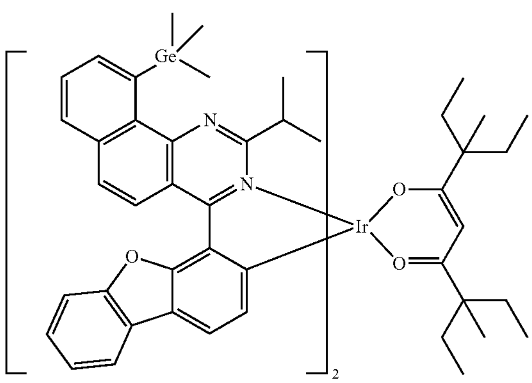
177
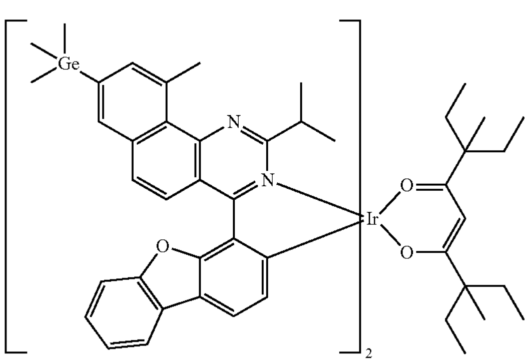
-continued
178
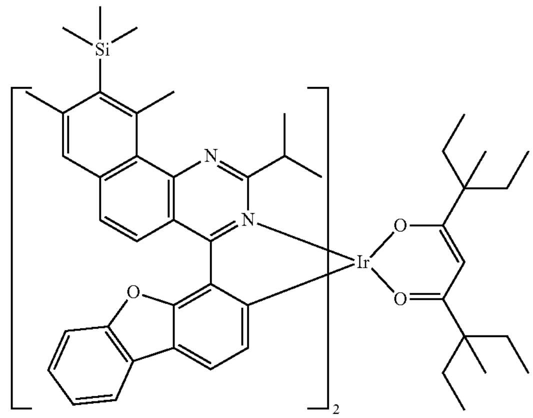
179
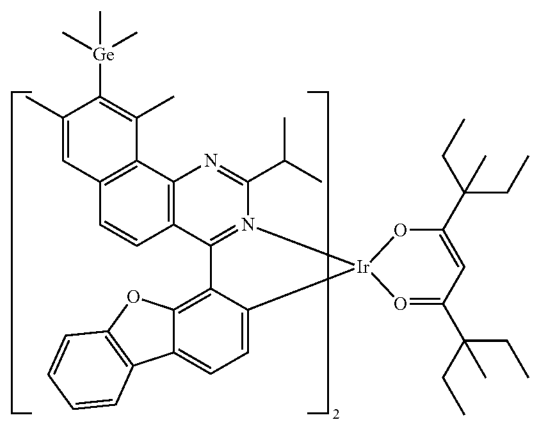
180
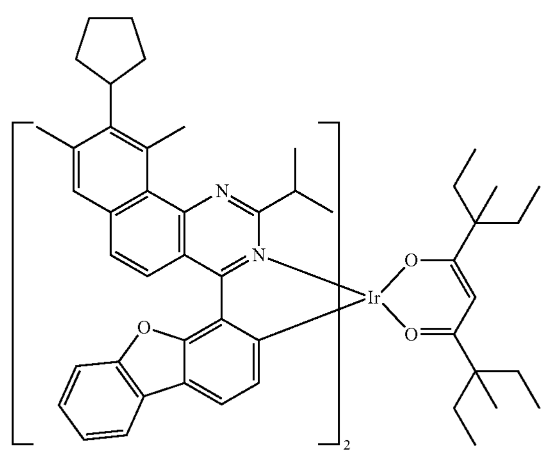

-continued
181
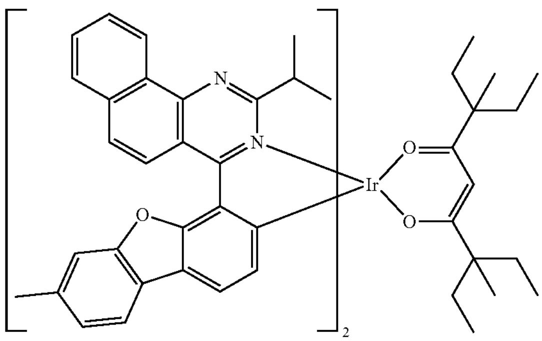
182
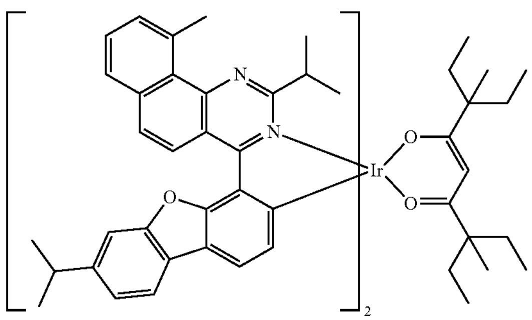
183
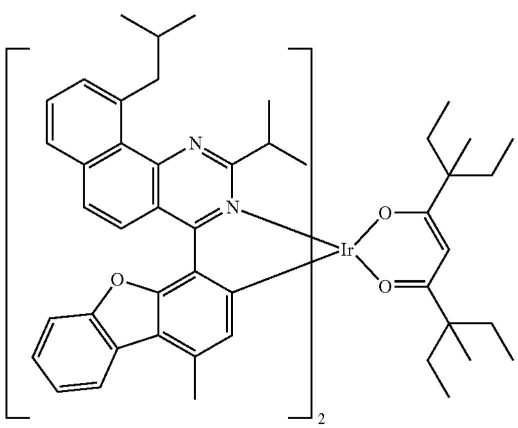
184
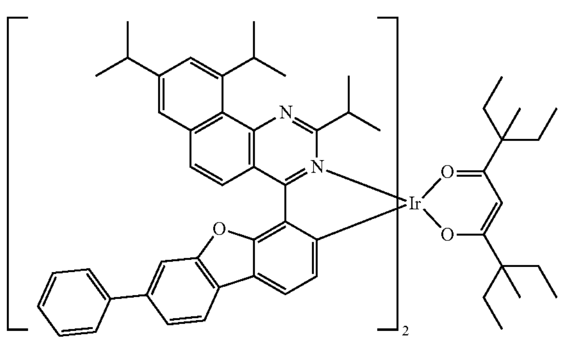
-continued
185
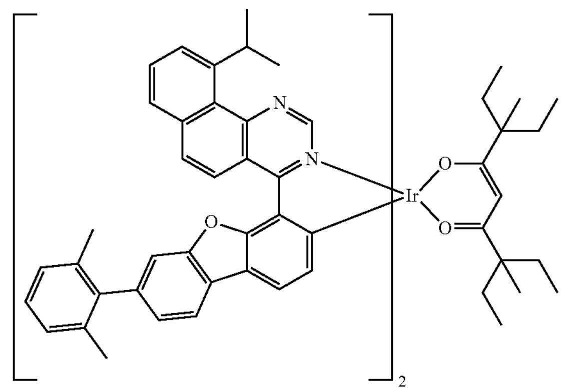
186
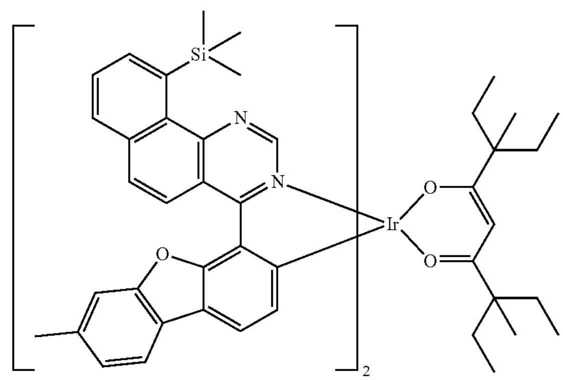
187
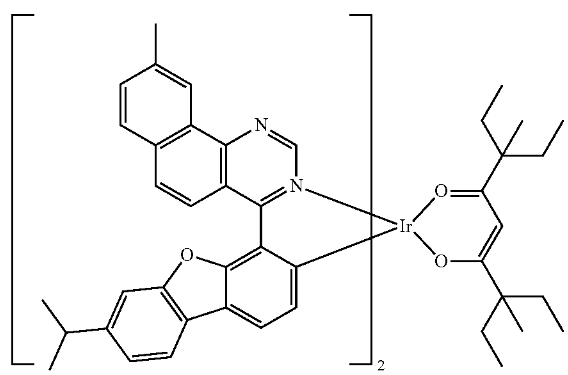
188
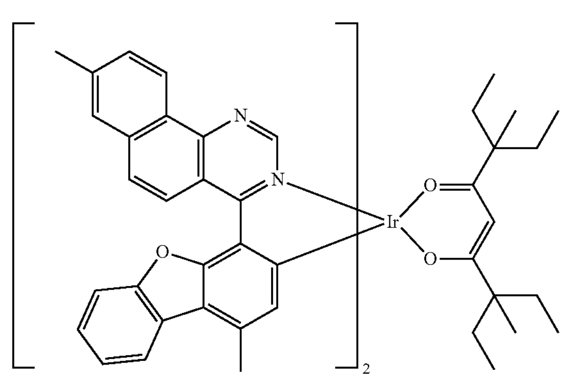

-continued
189
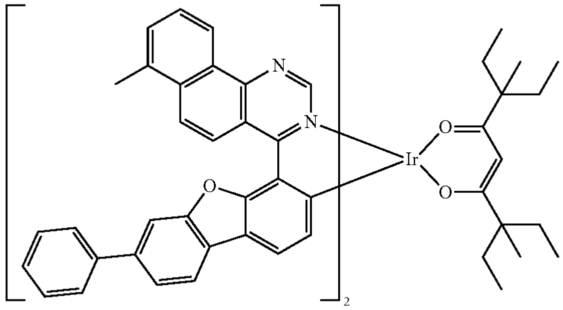
190
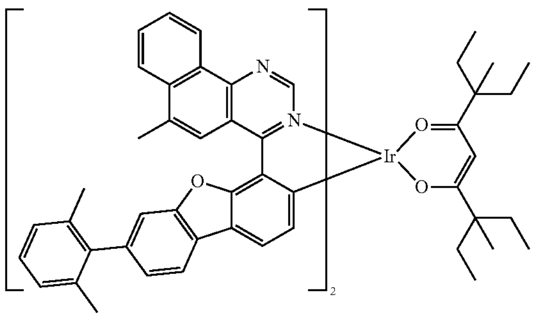
191
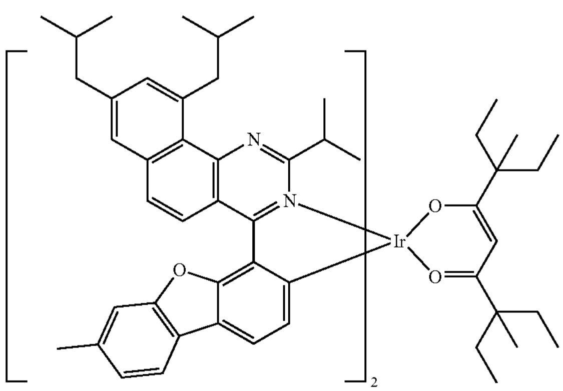
192
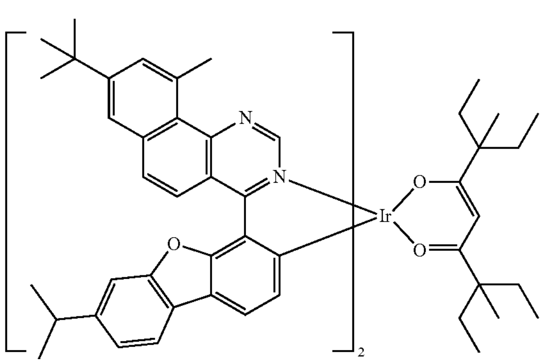
-continued
193
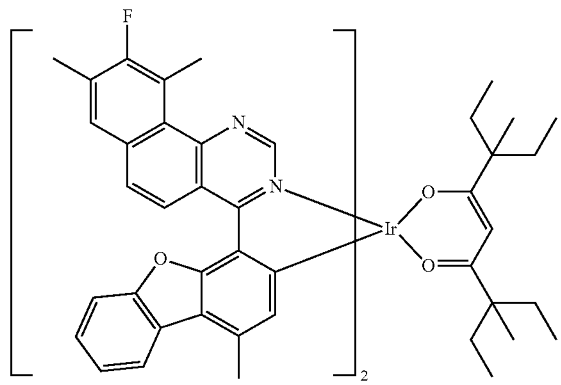
194
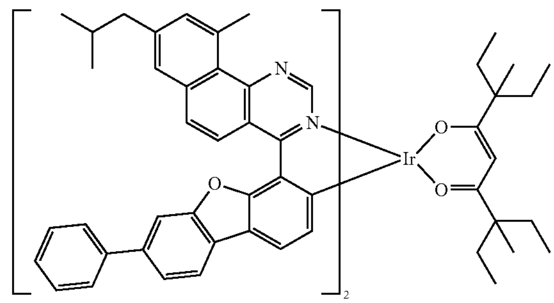
195
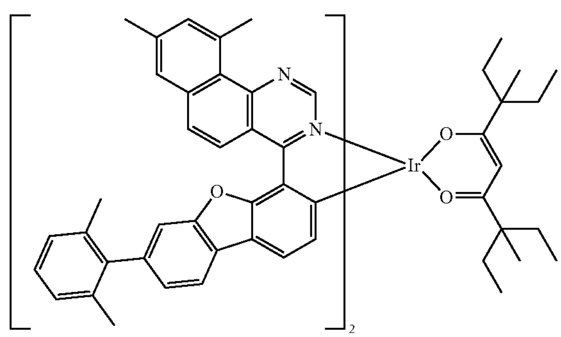
196
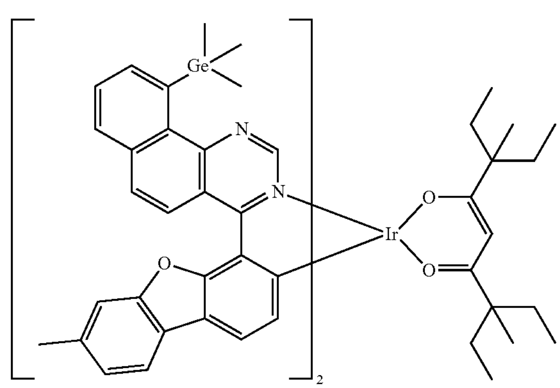

-continued
197
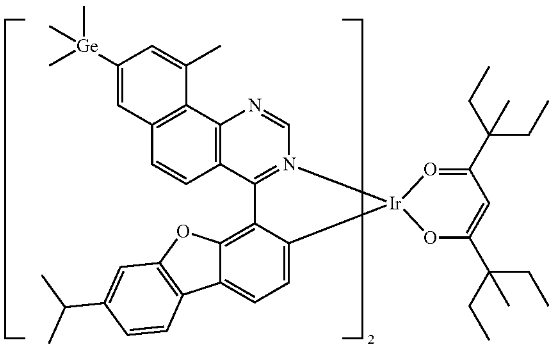
198
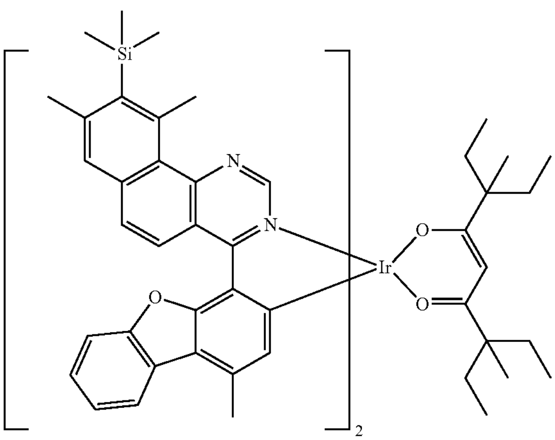
199
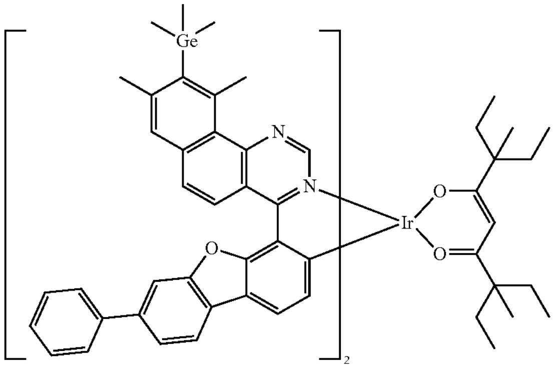
200
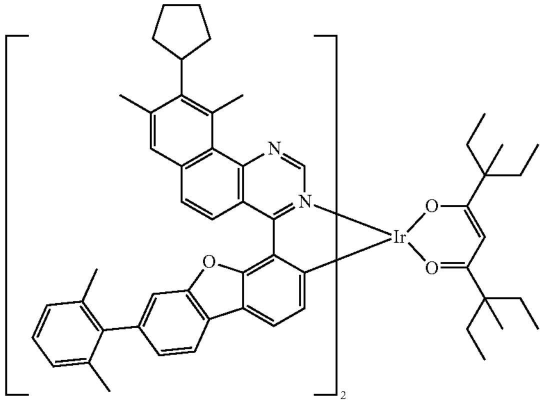
-continued
201
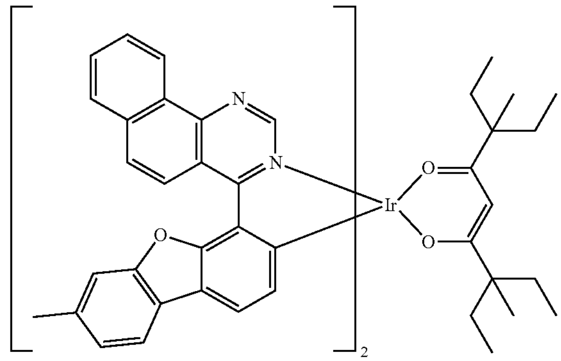
202
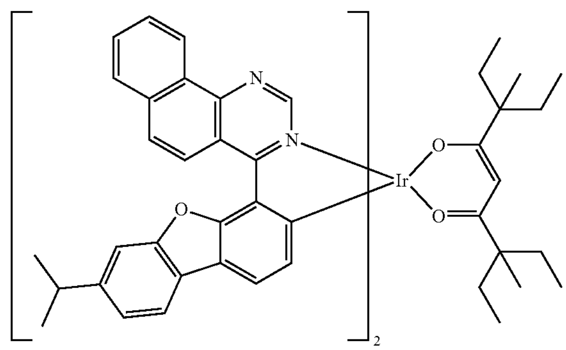
203
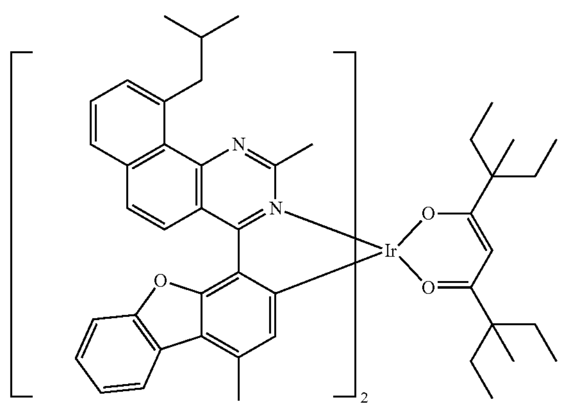
204
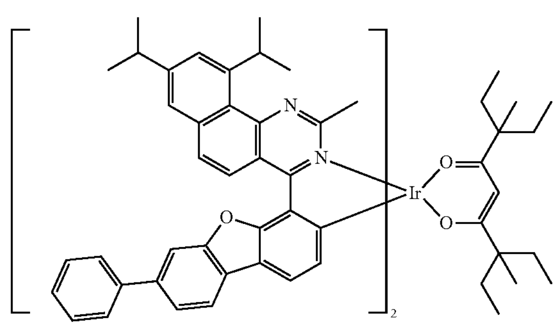

205
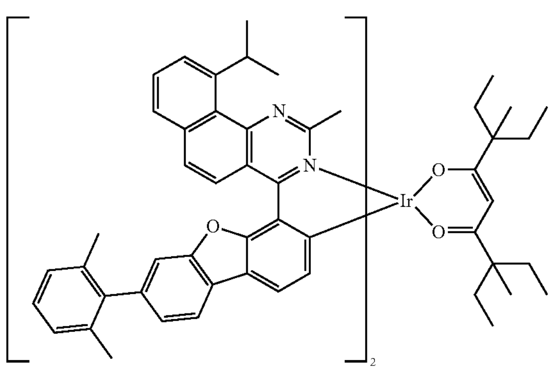
206
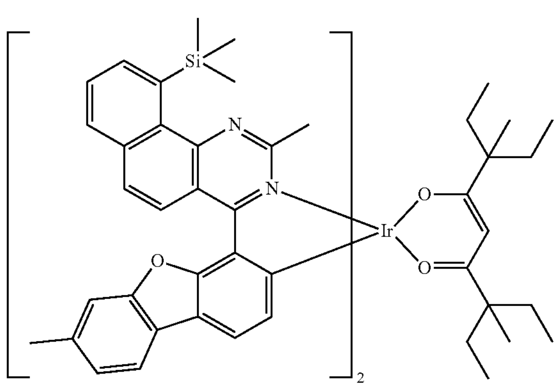
207
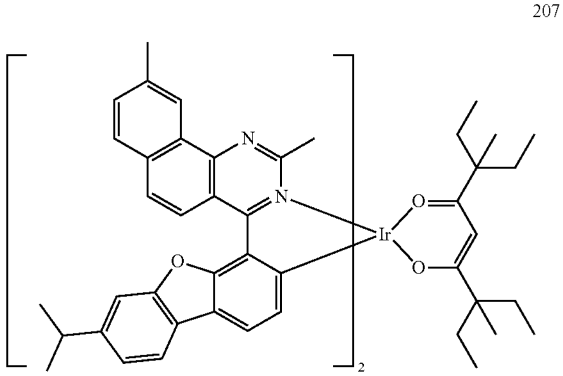
208
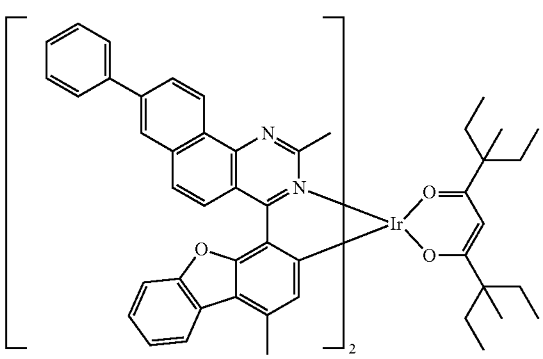
209
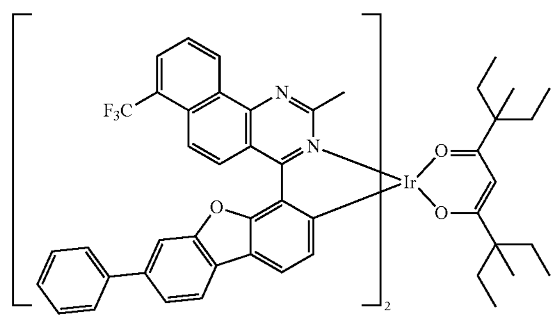
210
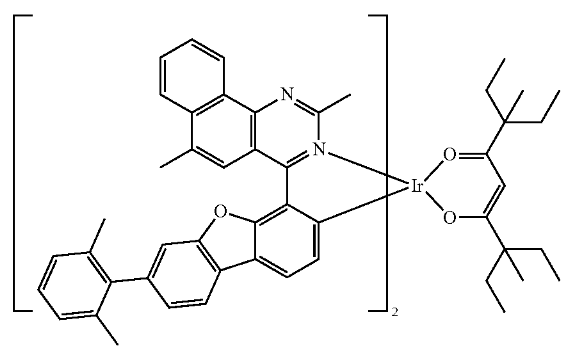
211
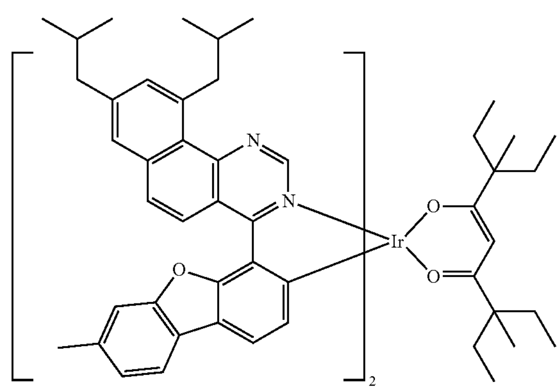
212
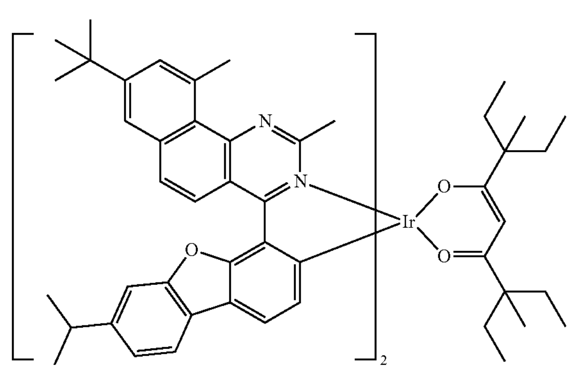

-continued
213
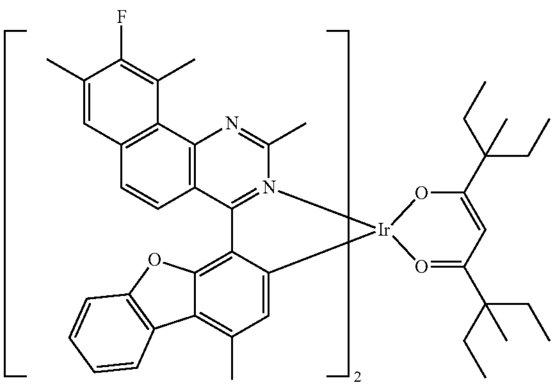
214
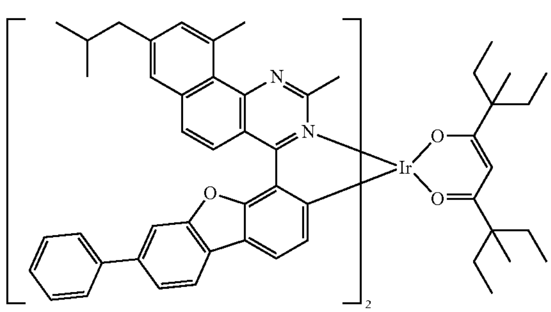
215
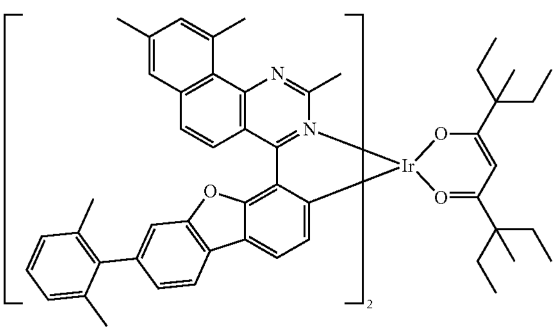
216
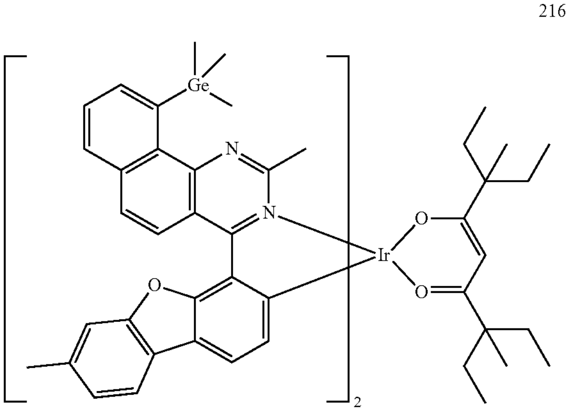
-continued
217
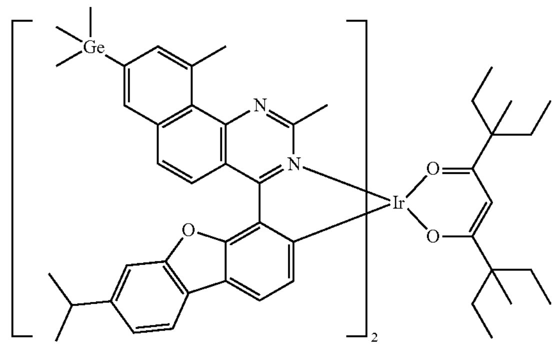
218
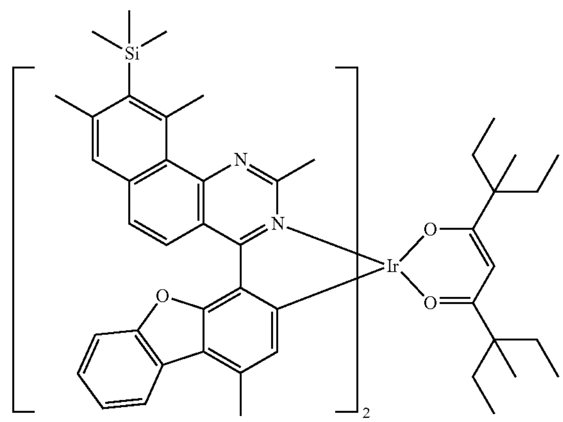
219
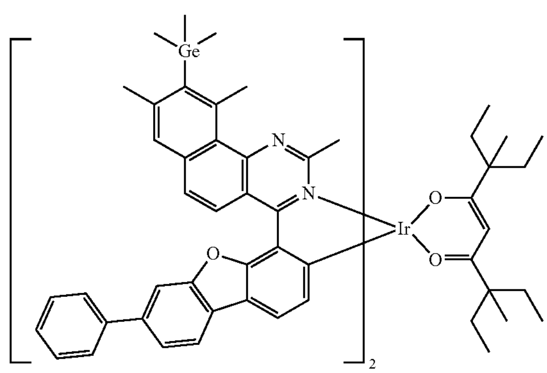
220
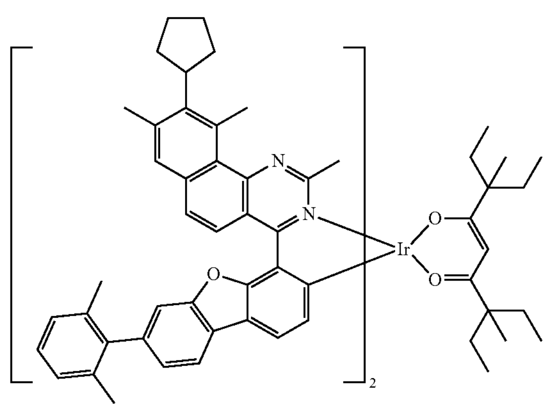

-continued
221
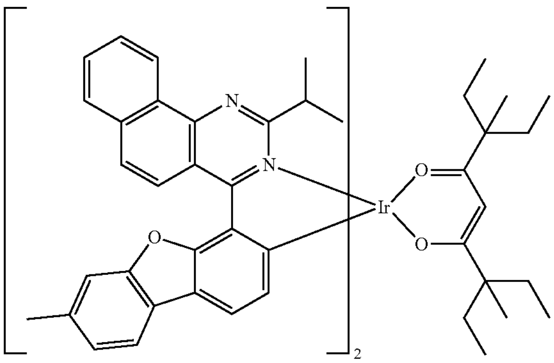
222
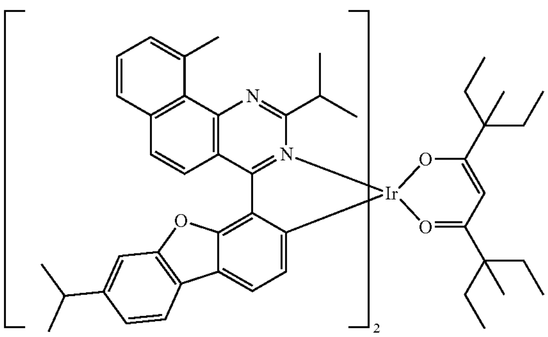
223
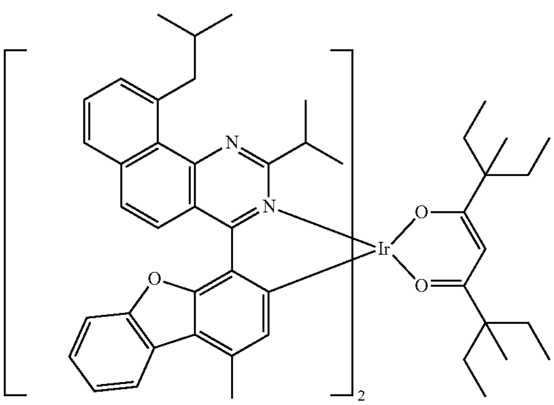
224
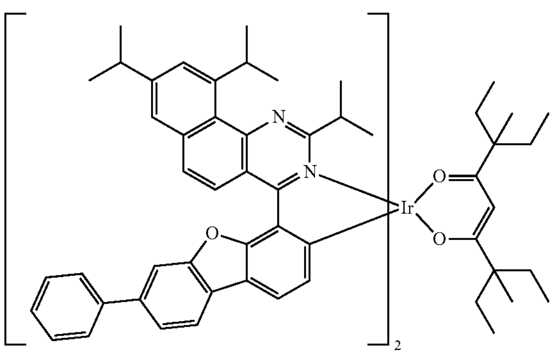
-continued
225
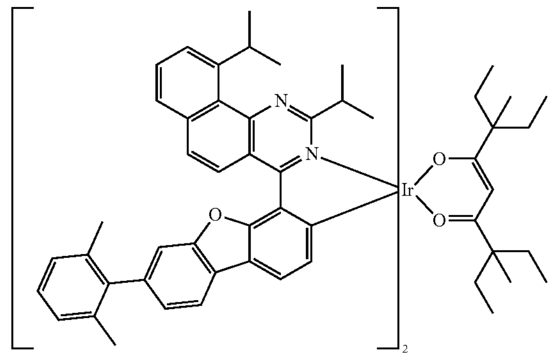
226
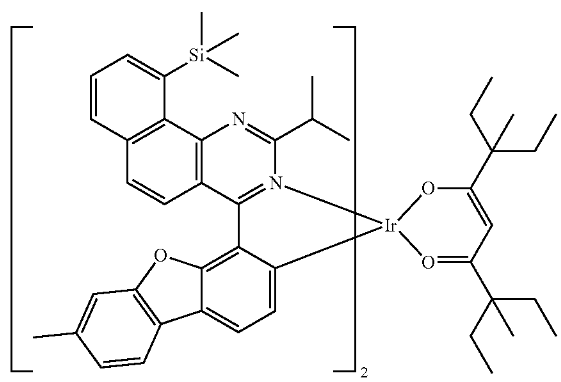
227
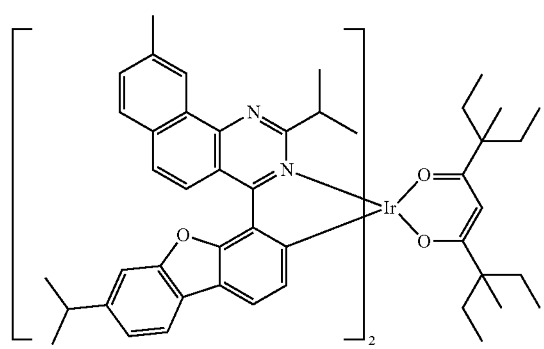
228
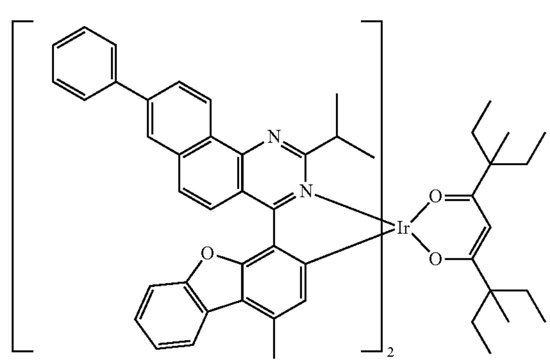

-continued
229
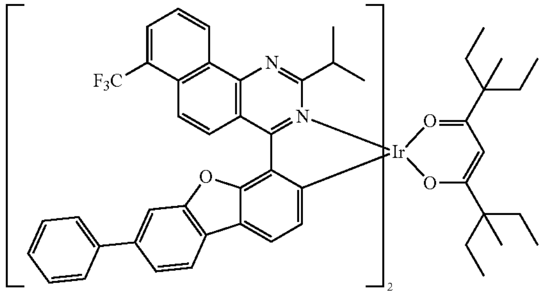
230
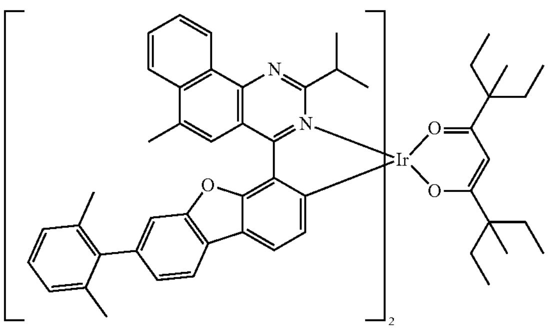
231
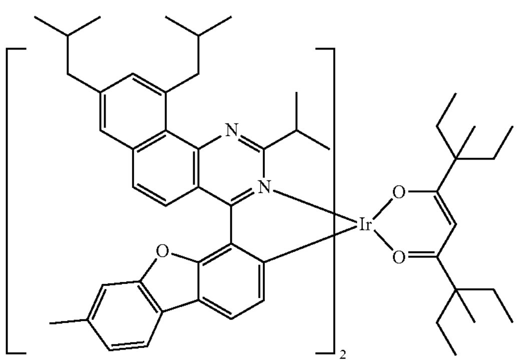
232
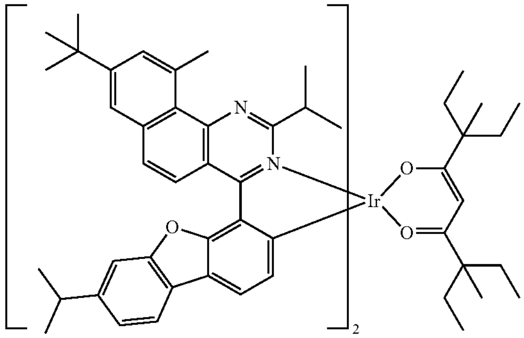
-continued
233
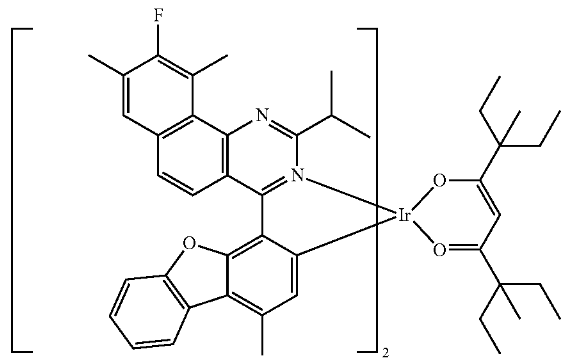
234
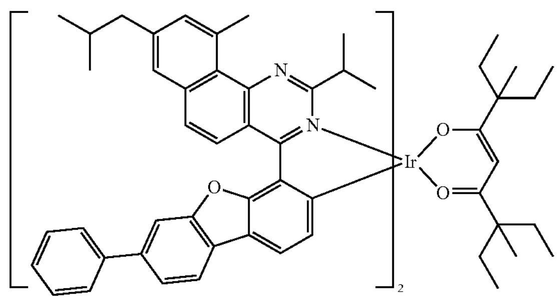
235
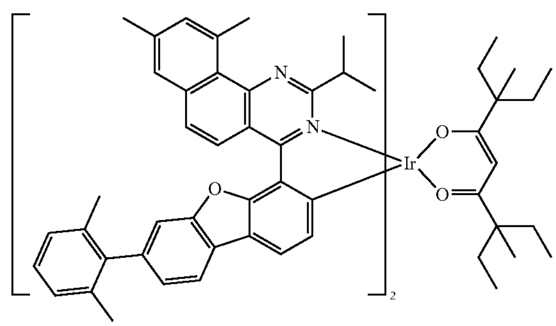
236
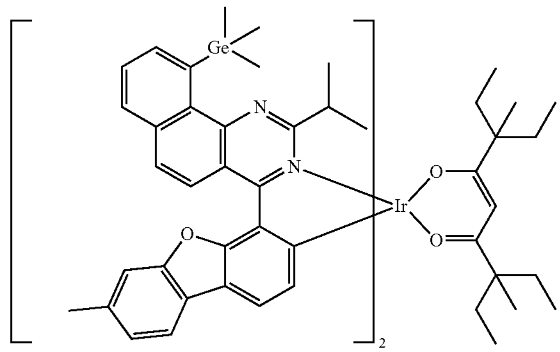

237
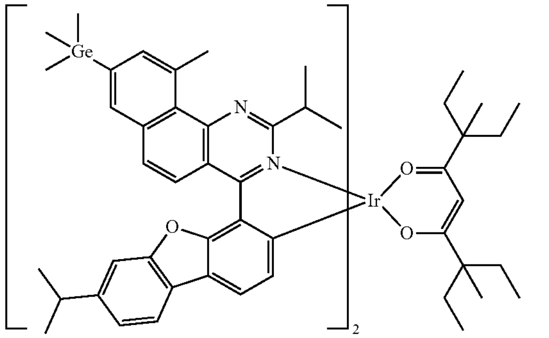
238
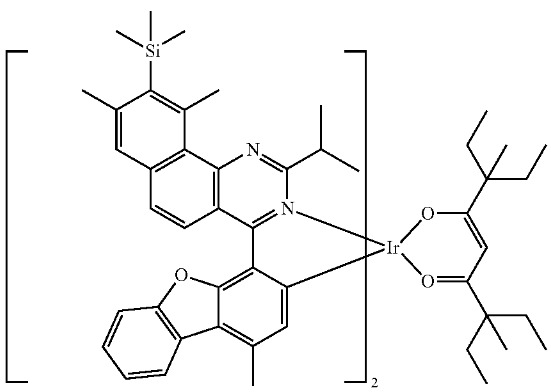
239
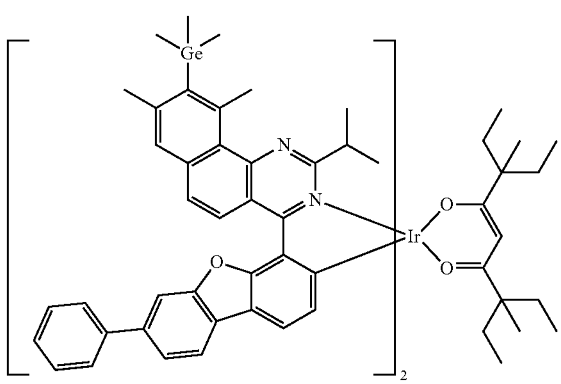
240
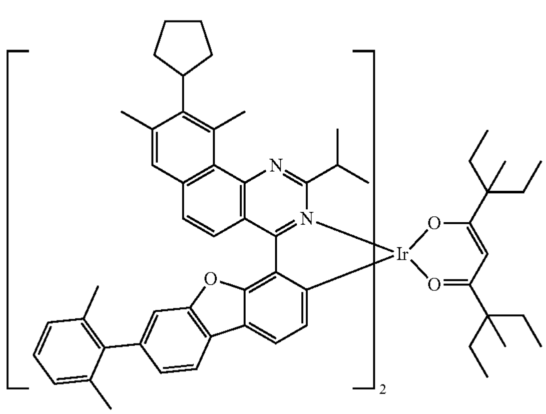
241
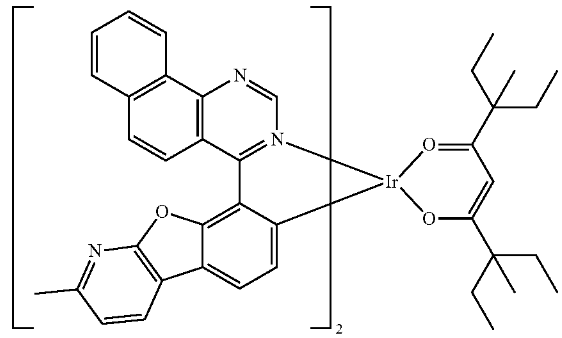
242
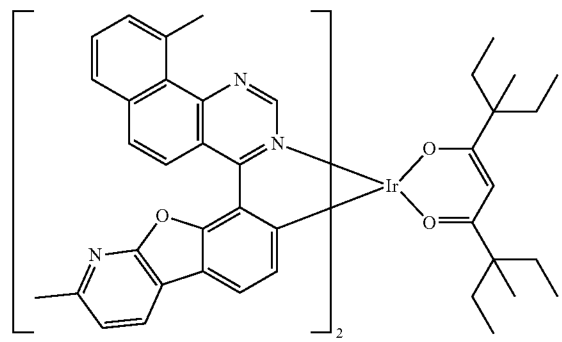
243
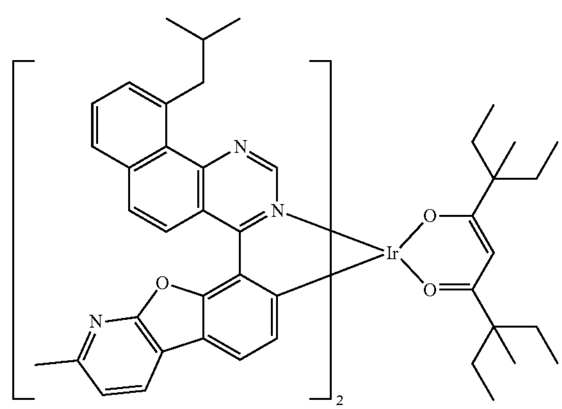
244
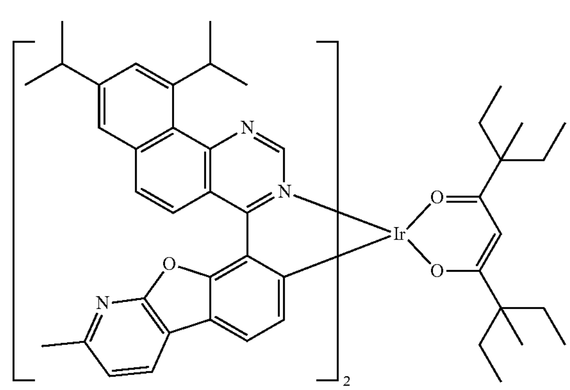

-continued
245
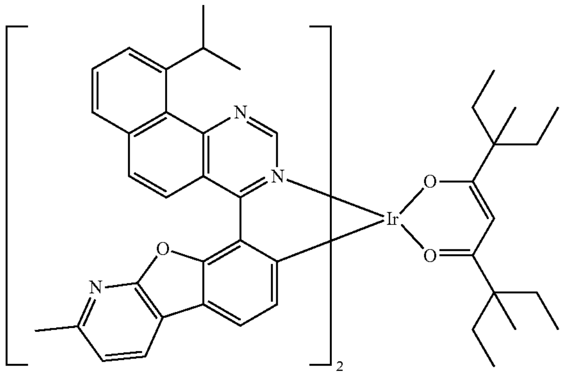
246
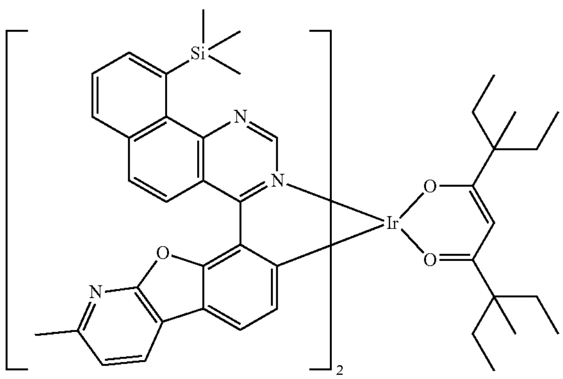
247
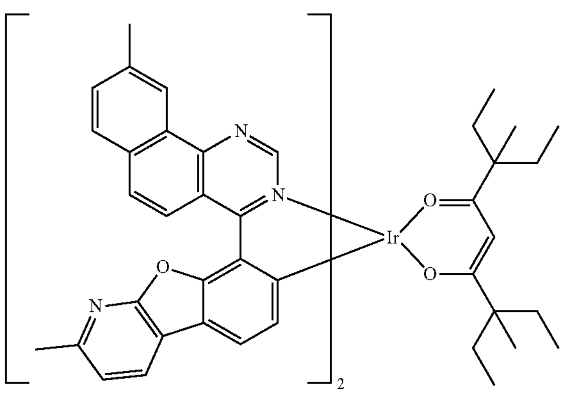
248
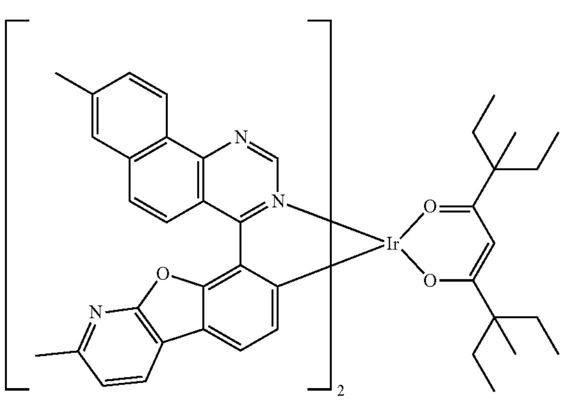
-continued
249
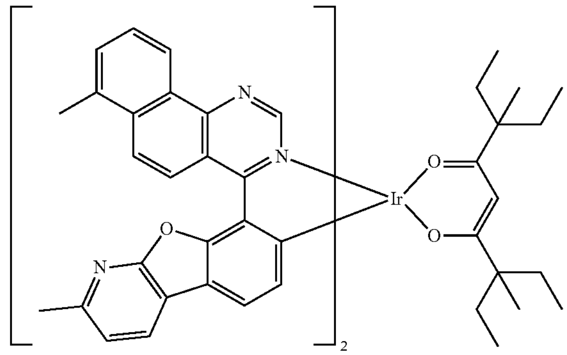
250
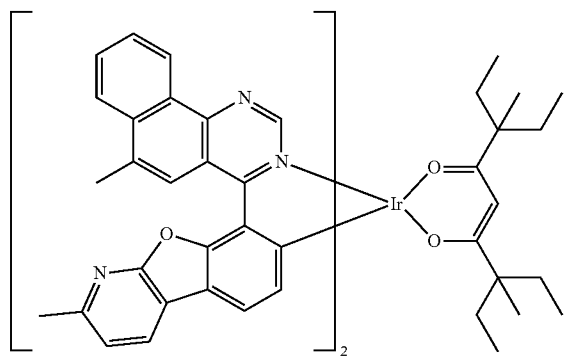
251
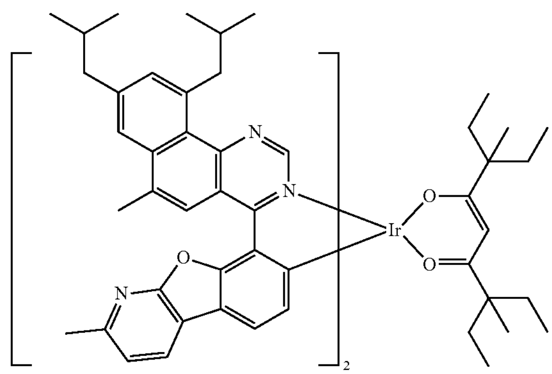
252
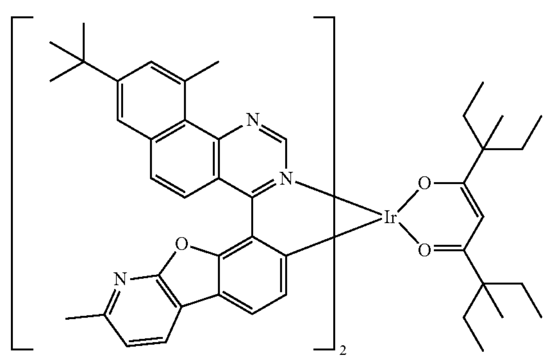

-continued
253
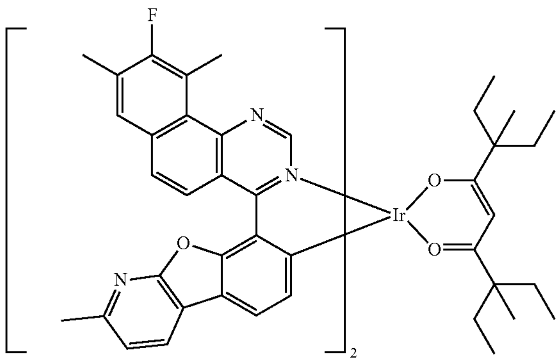
254
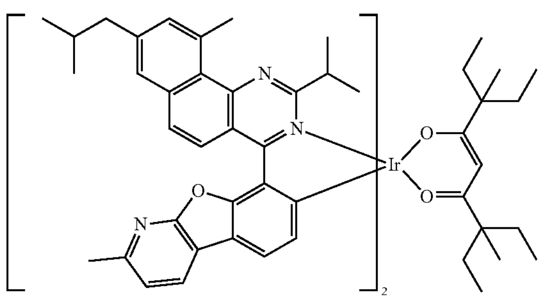
255
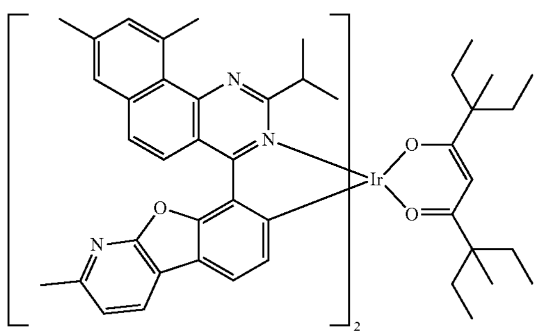
256
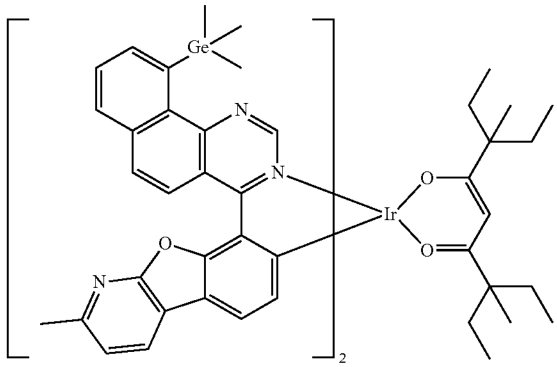
-continued
257
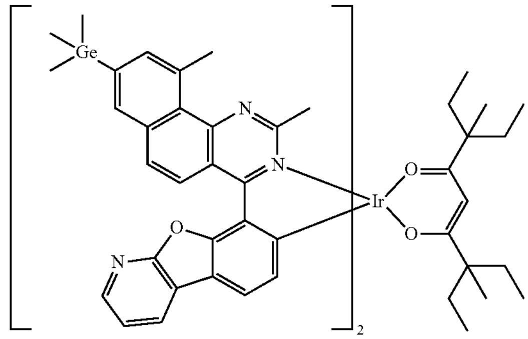
258
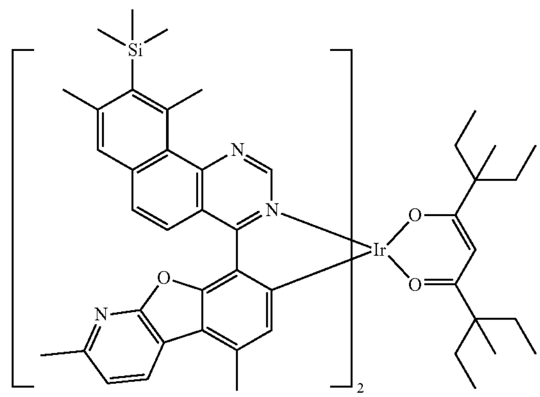
259
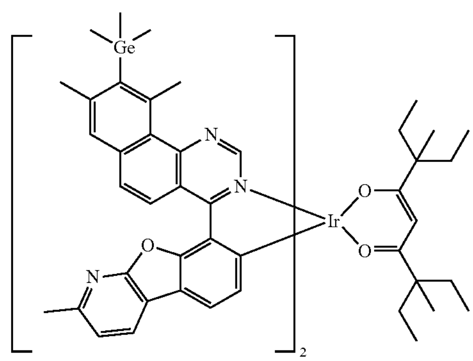
260
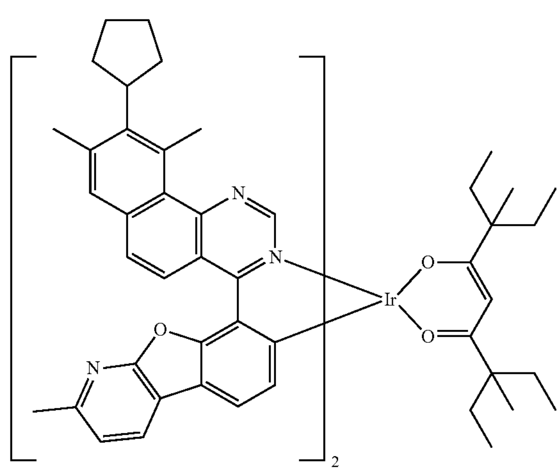

-continued
261
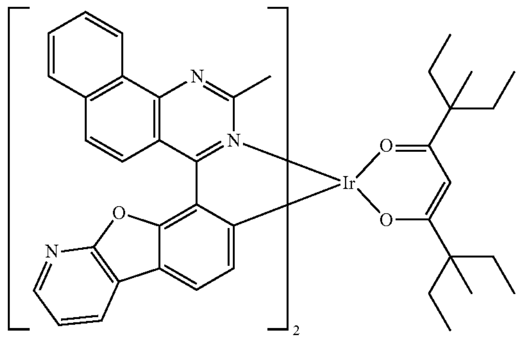
262
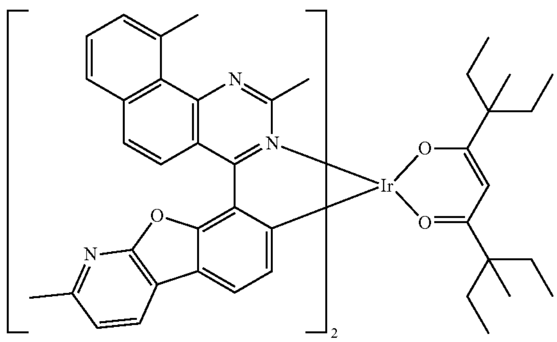
263
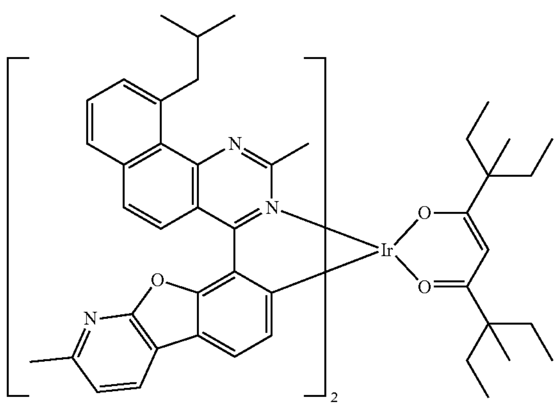
264
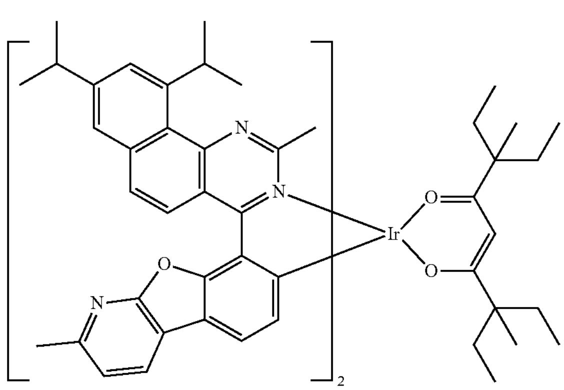
-continued
265
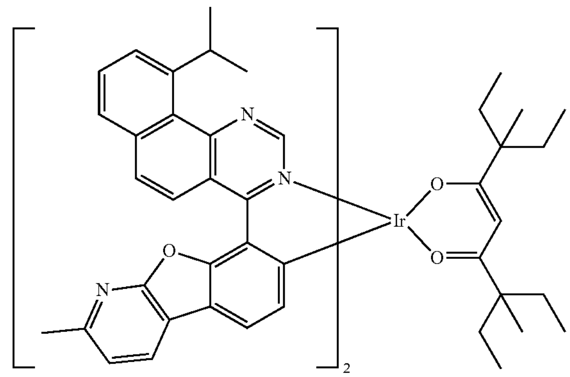
266
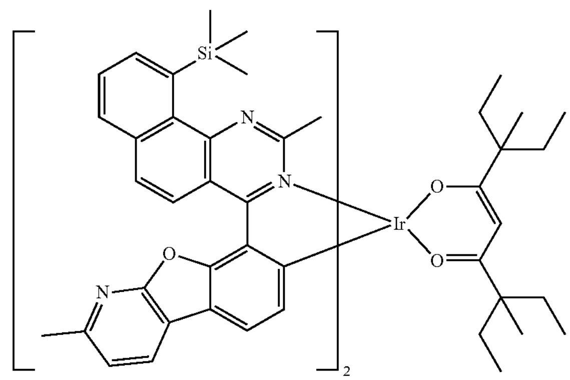
267
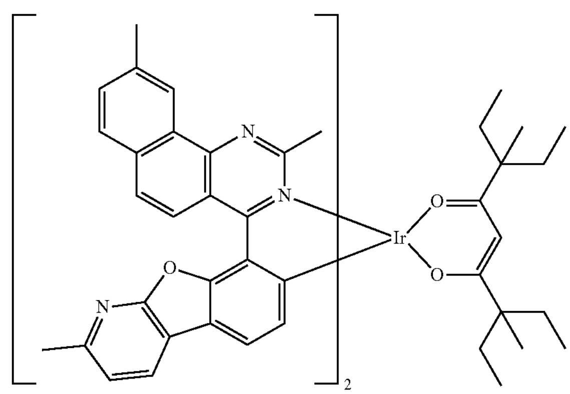
268
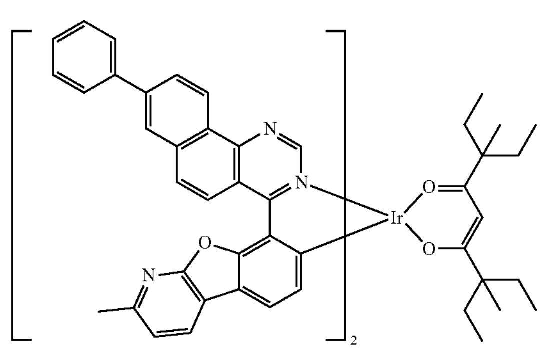

-continued
269
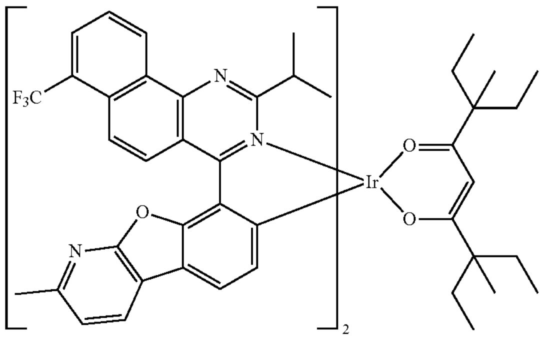
270
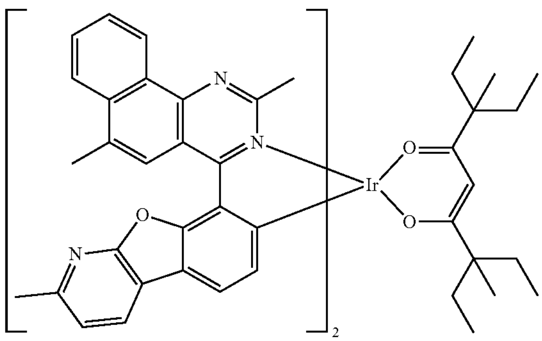
271
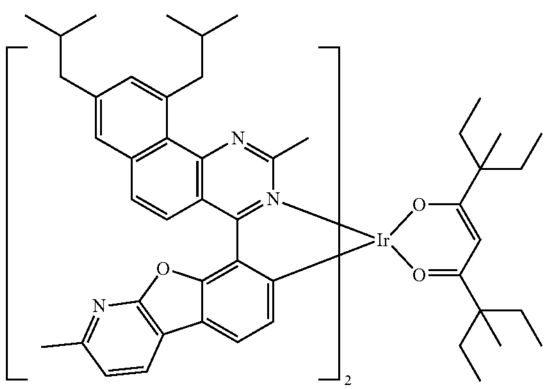
272
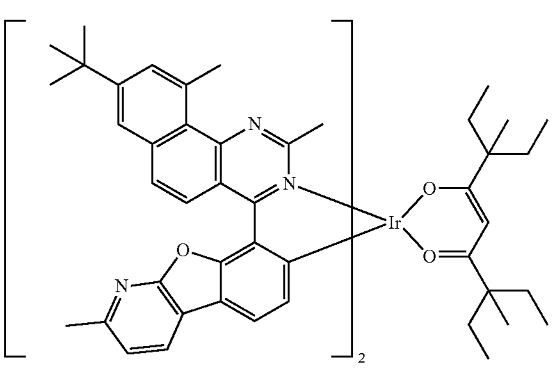
-continued
273
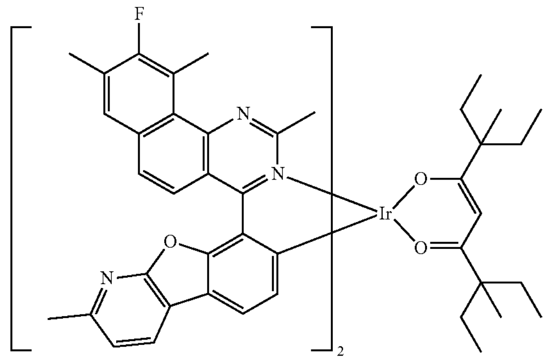
274
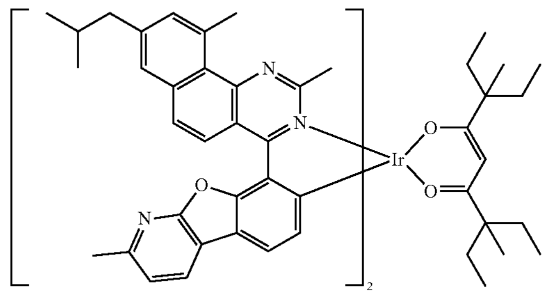
275
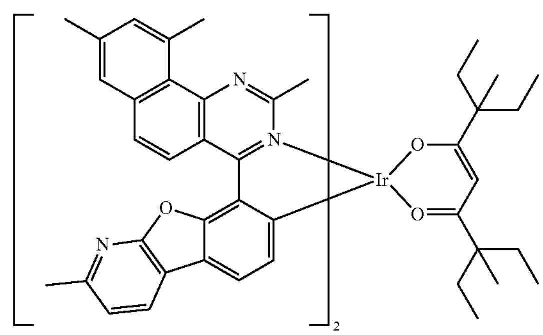
276
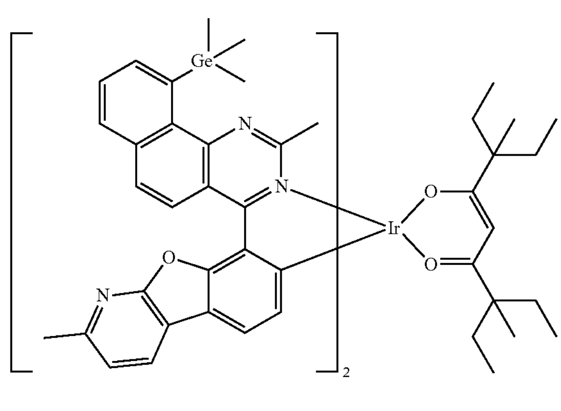

277
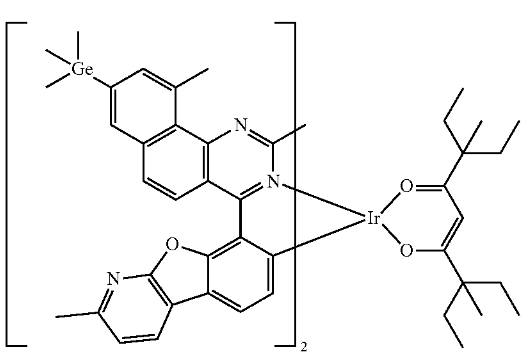
278
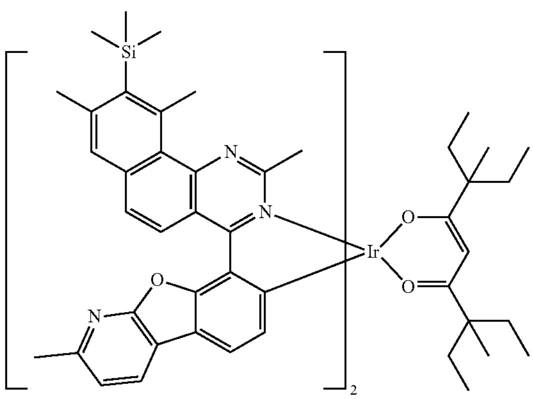
279
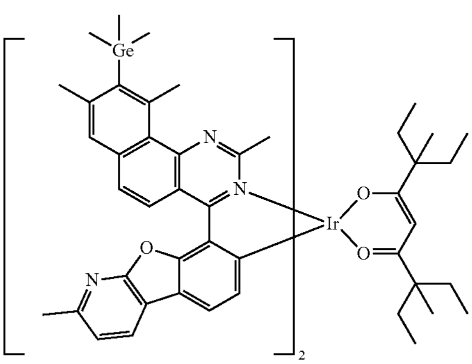
280
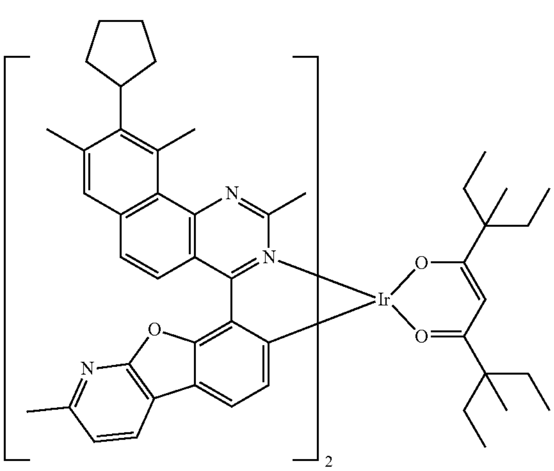
281
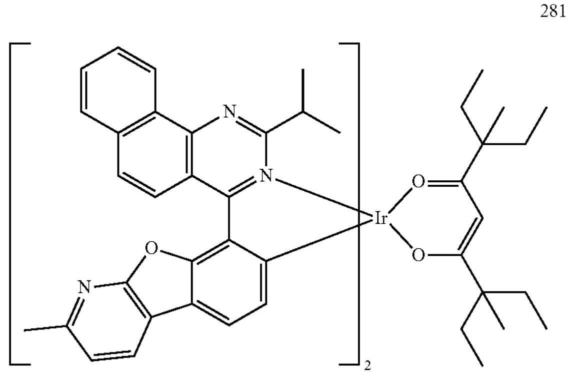
282
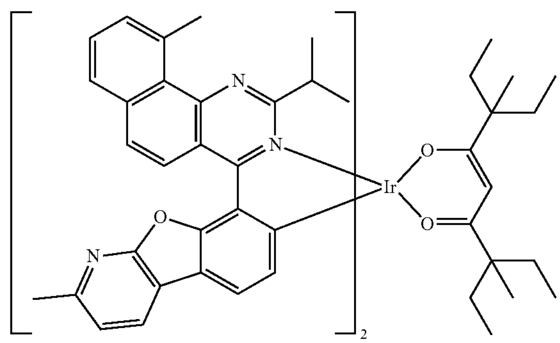
283
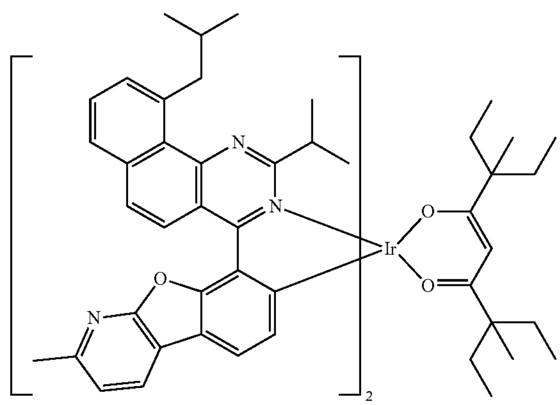
284
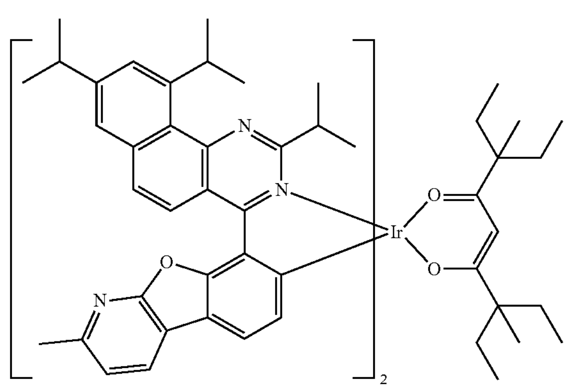

285
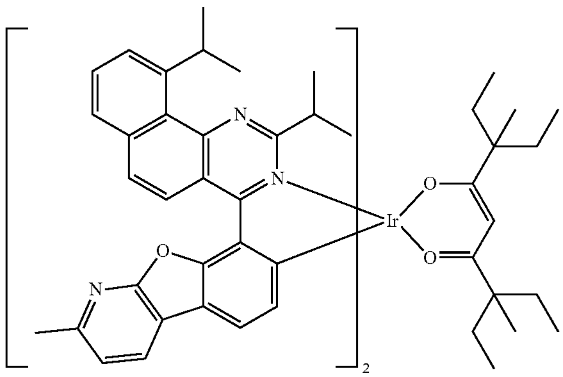
286
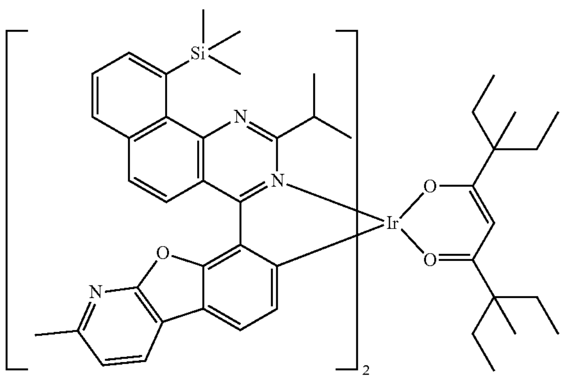
287
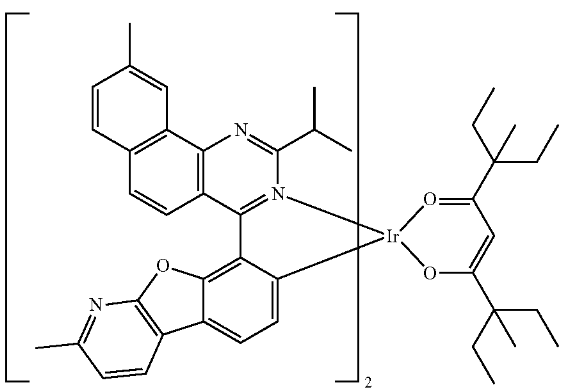
288
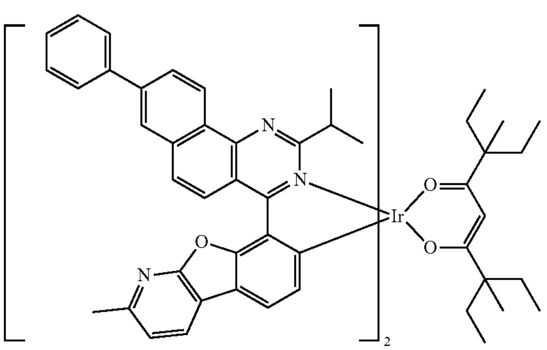
289
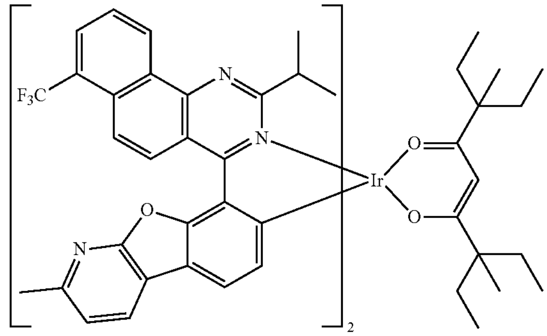
290
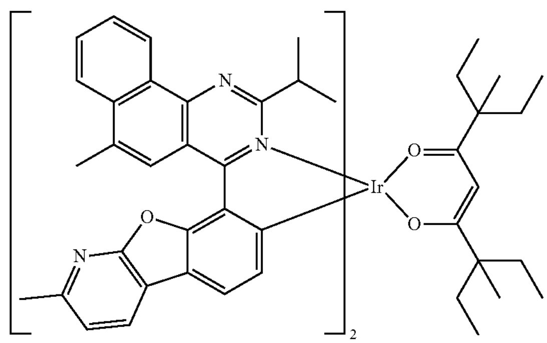
291
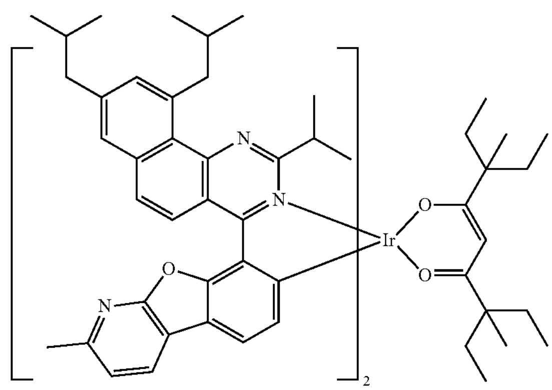
292
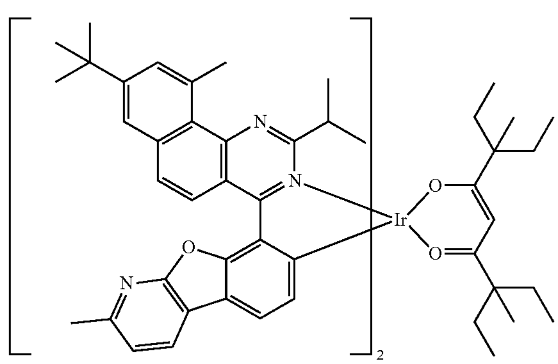

-continued
293
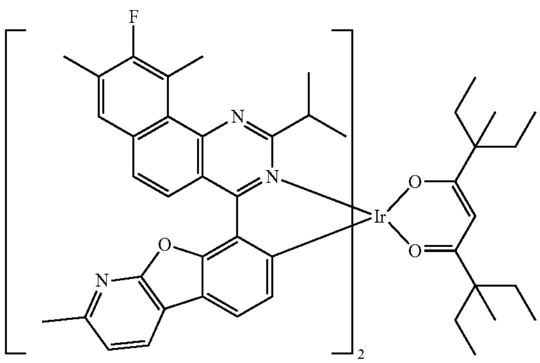
294
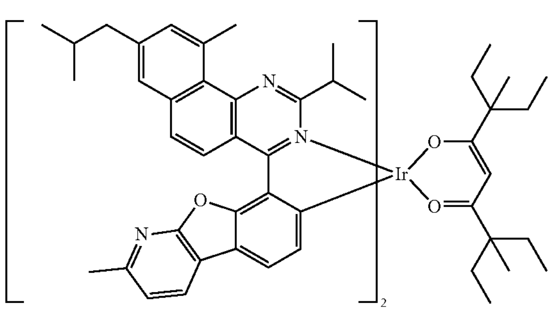
295
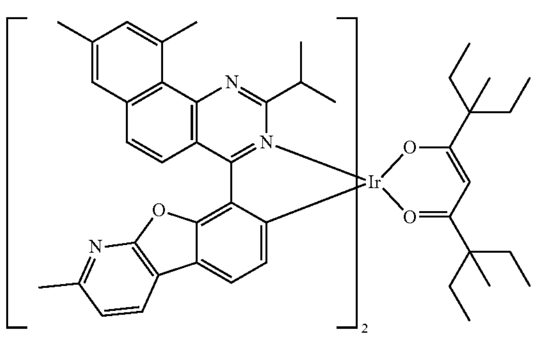
296
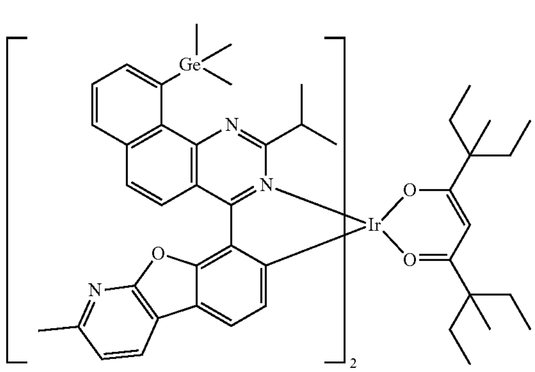
-continued
297
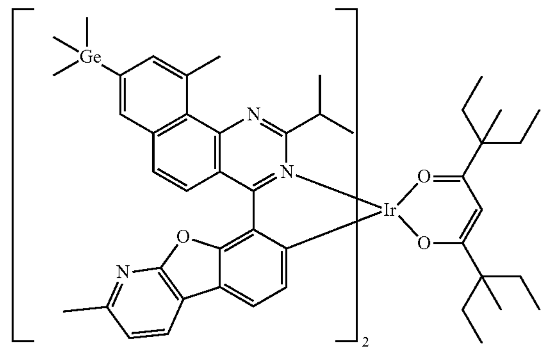
298
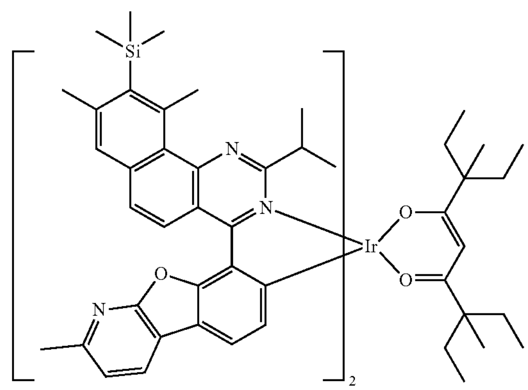
299
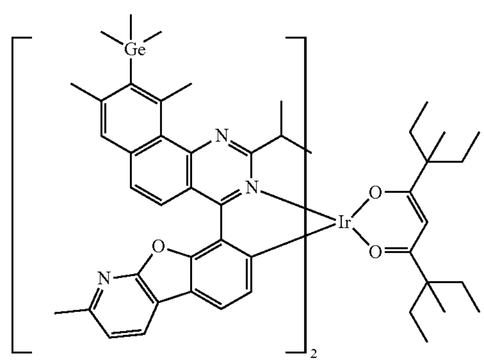
300
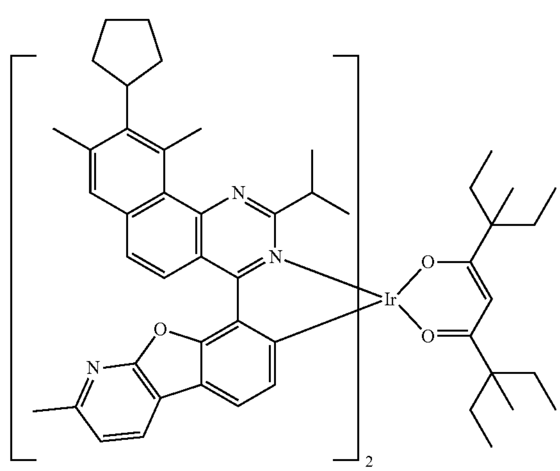

-continued
301
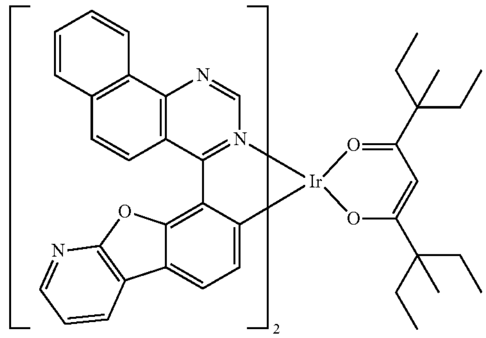
302
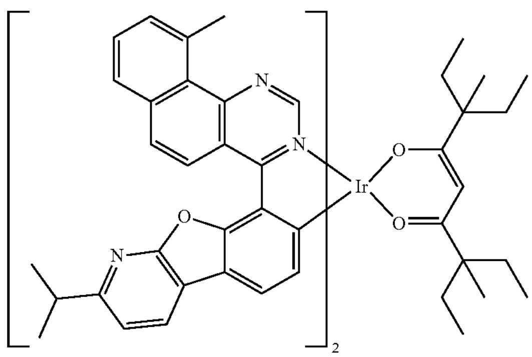
303
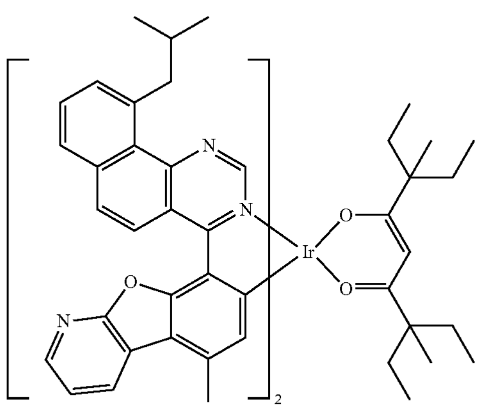
304
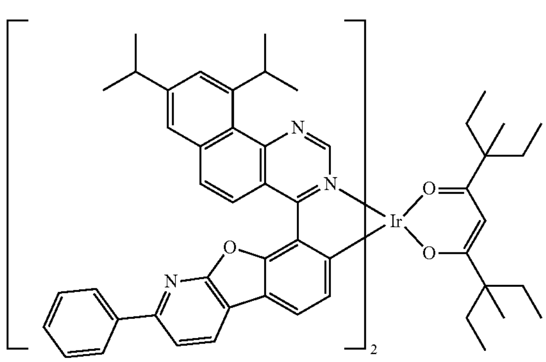
-continued
305
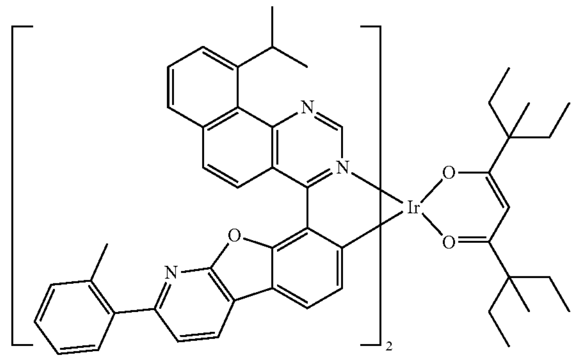
306
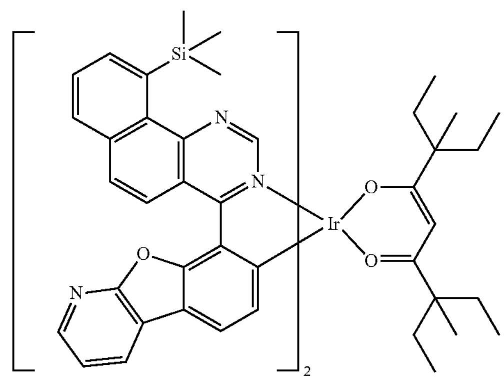
307
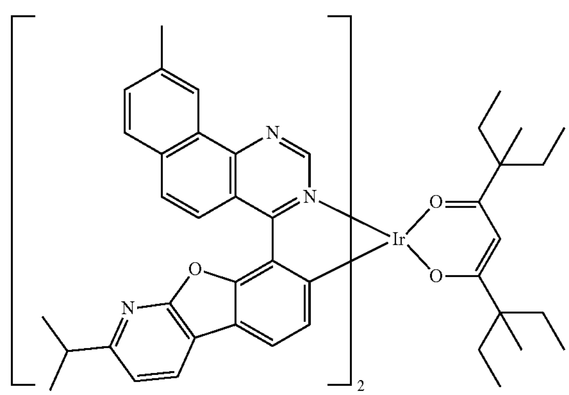
308
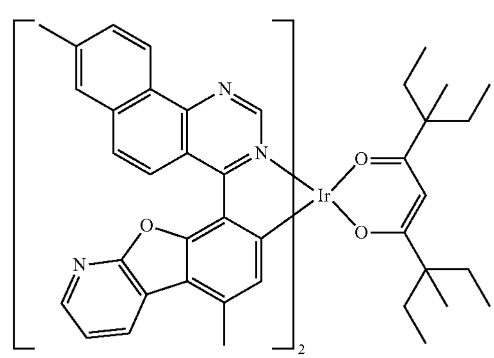

-continued
309
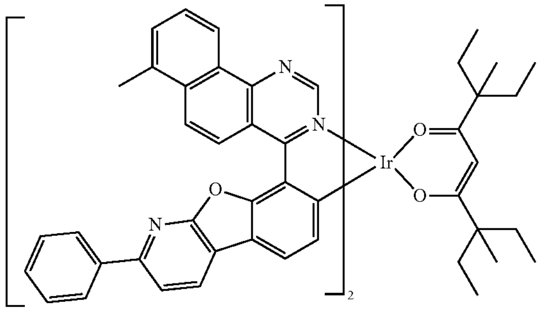
310
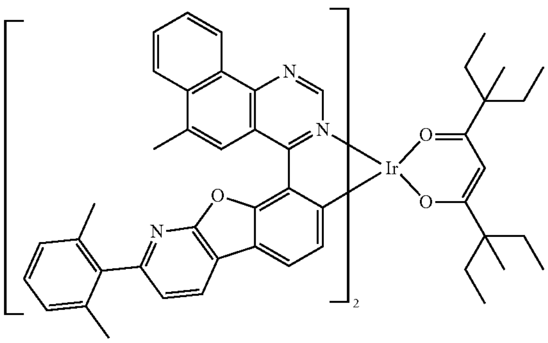
311
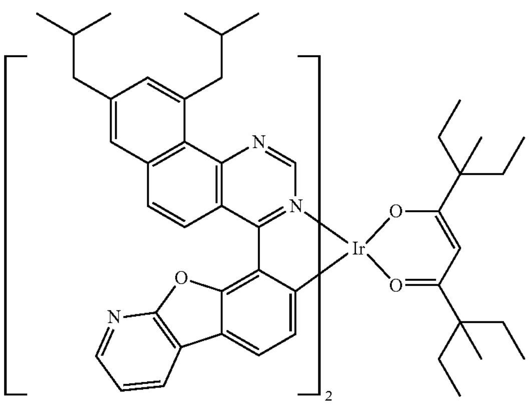
312
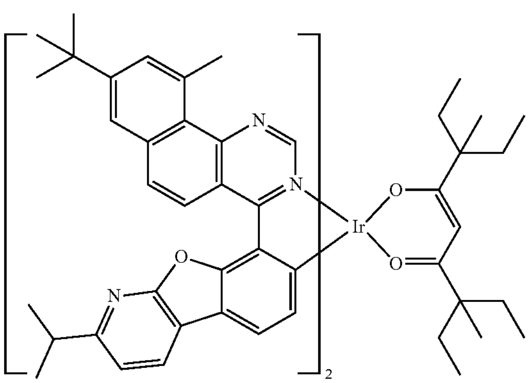
-continued
313
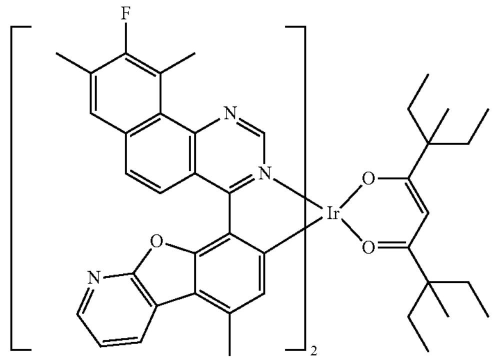
314
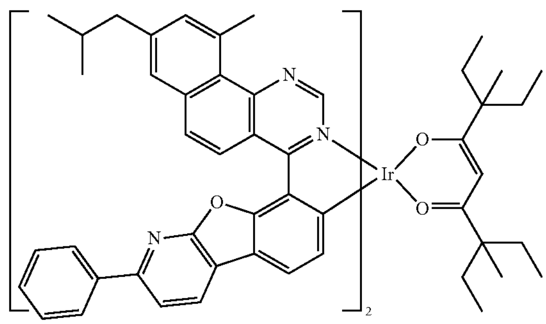
315
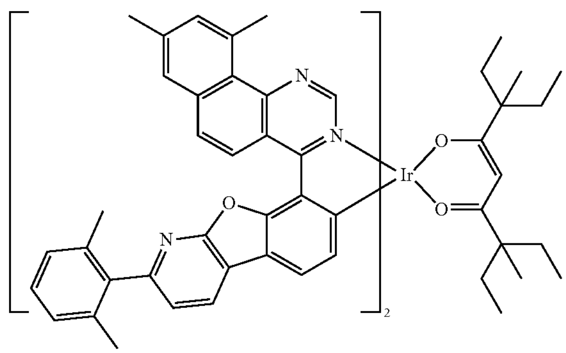
316
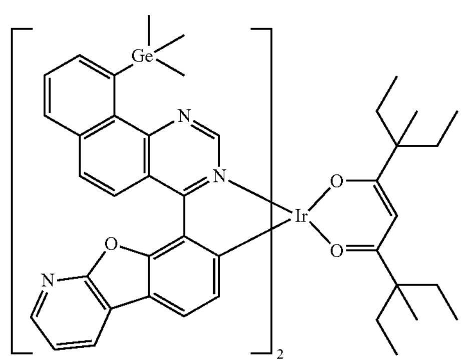

-continued
317
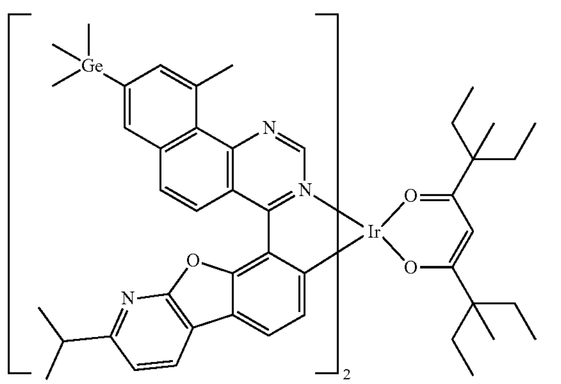
318
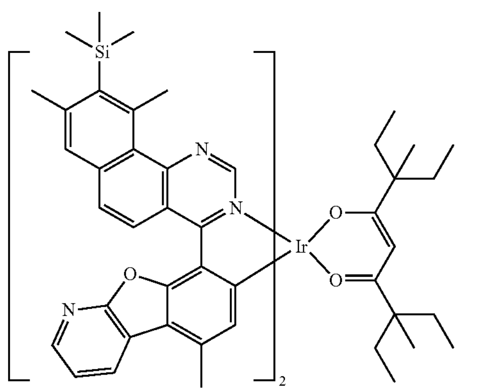
319
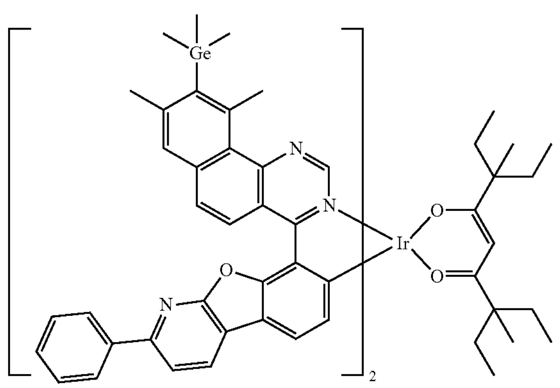
320
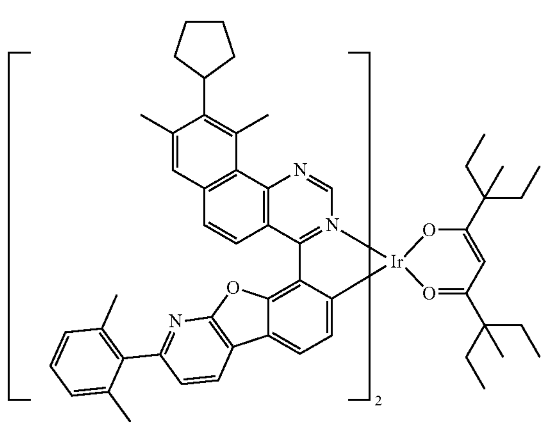
321
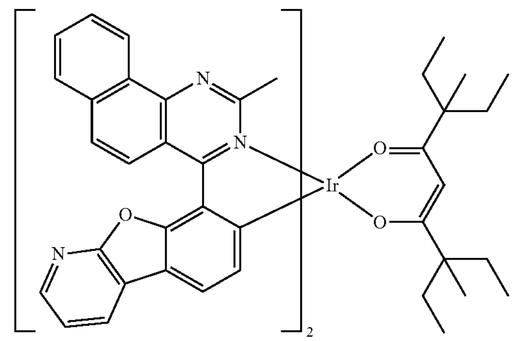
322
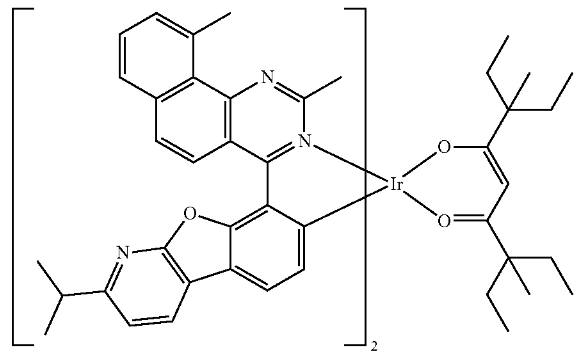
323
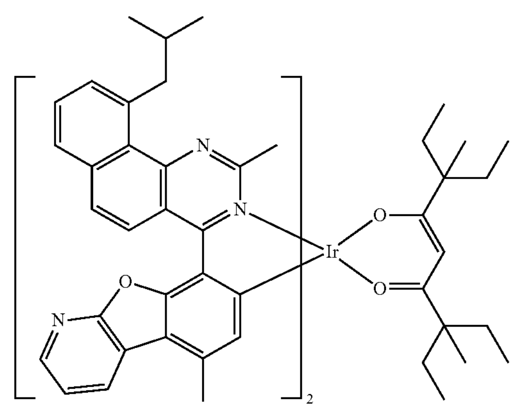
324
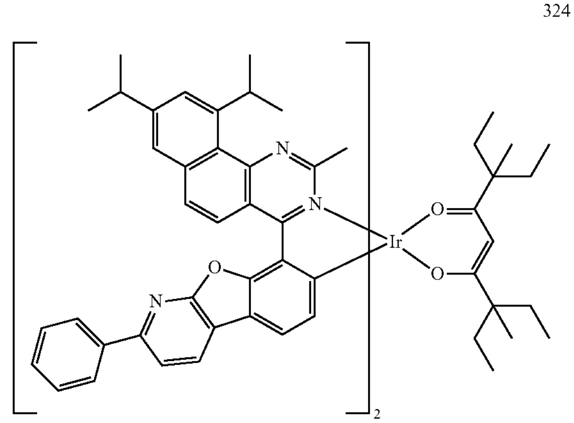

-continued
325
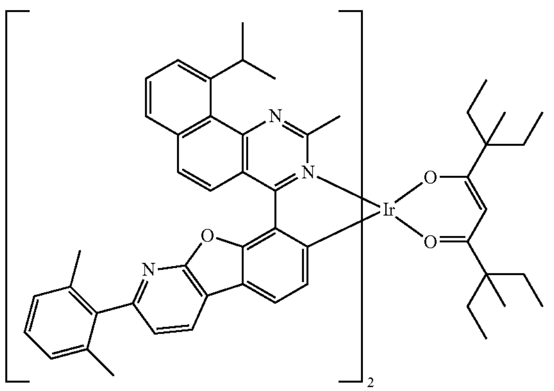
326
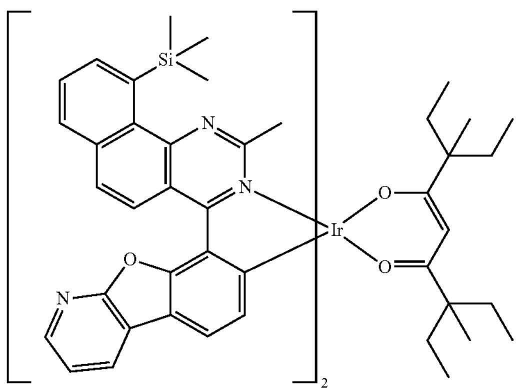
327
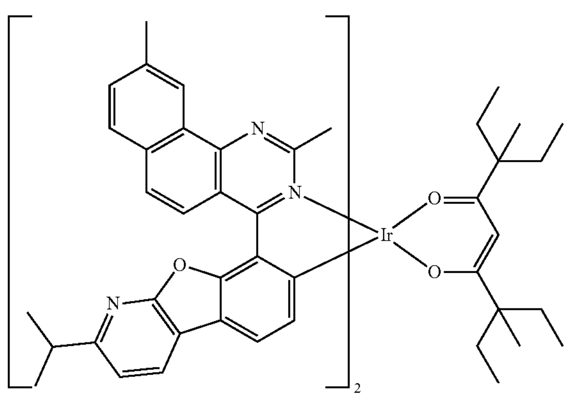
328
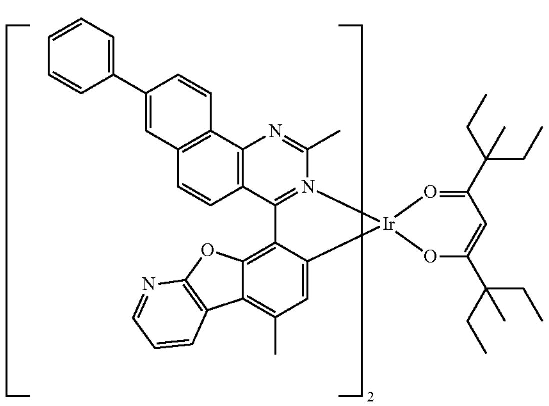
-continued
329
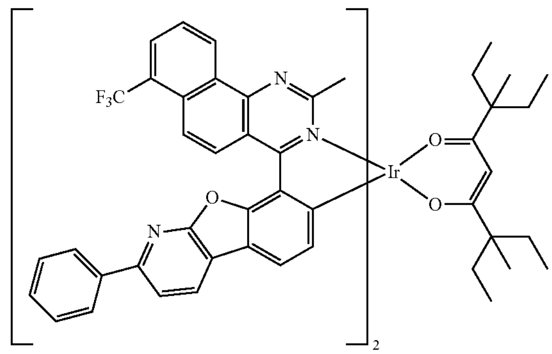
330
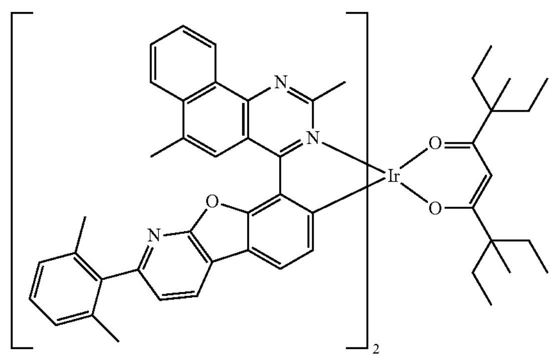
331
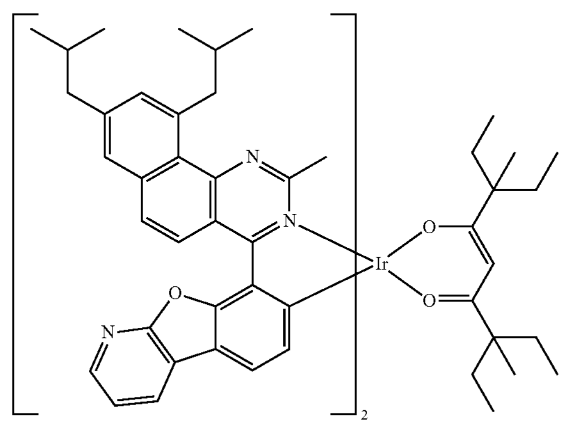
332
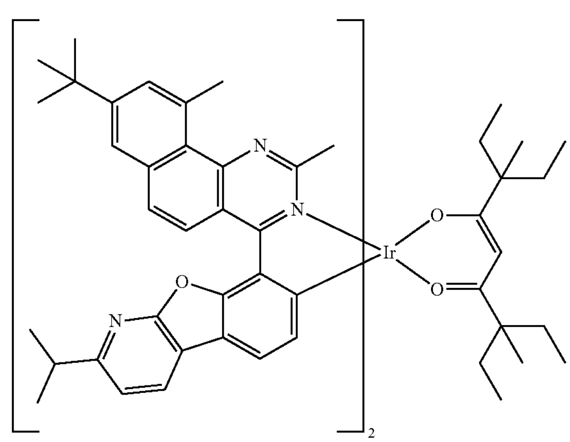

333
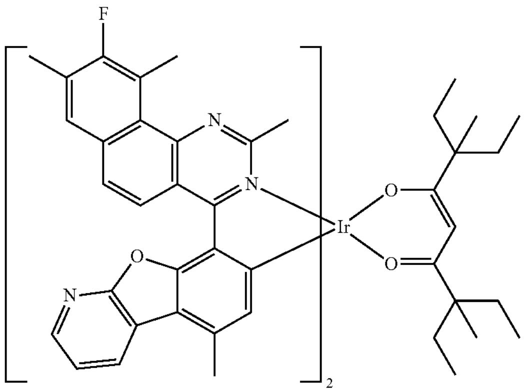
334
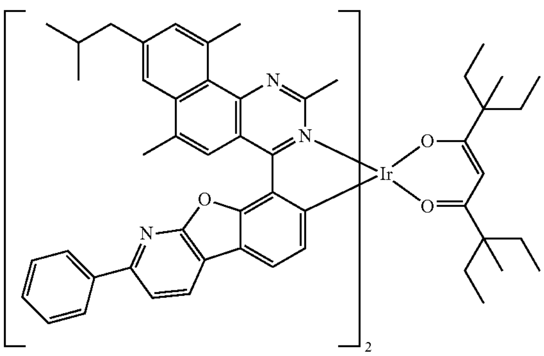
335
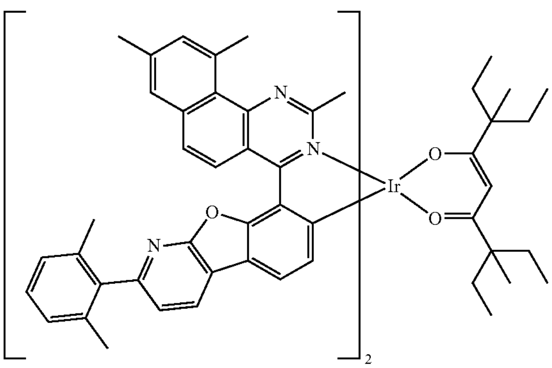
336
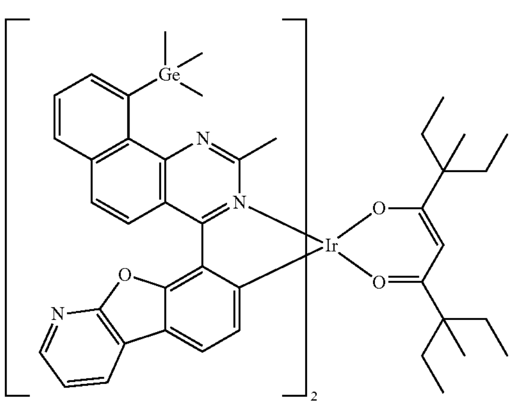
337
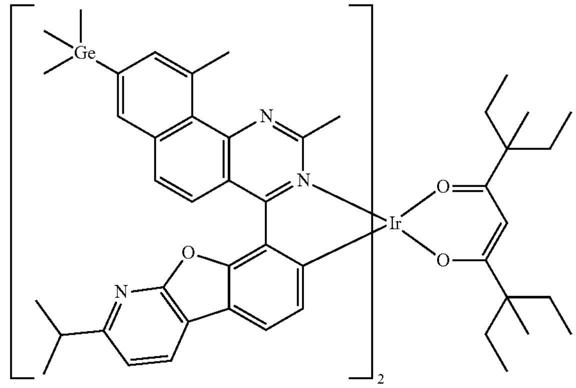
338
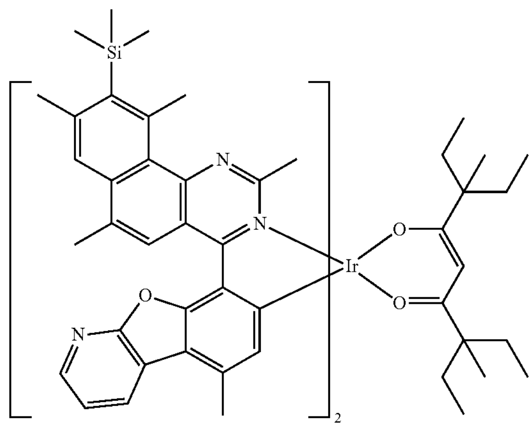
339
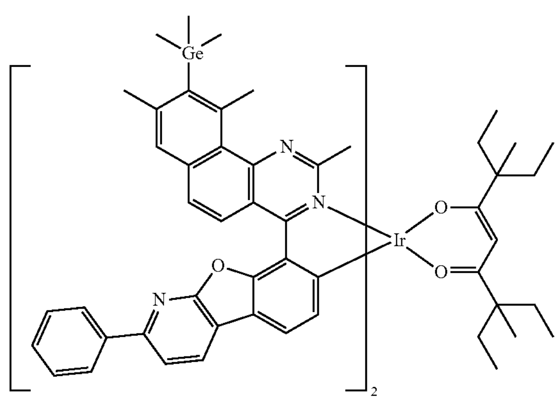

-continued
340
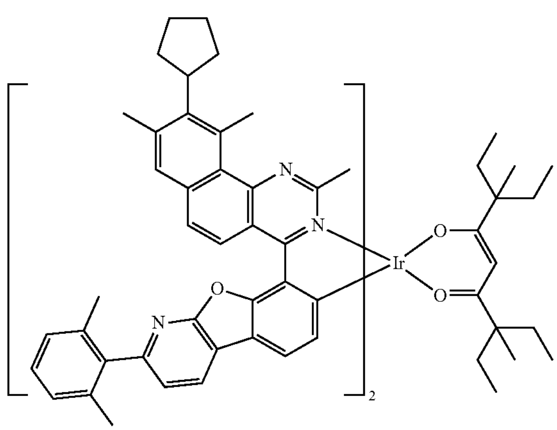
341
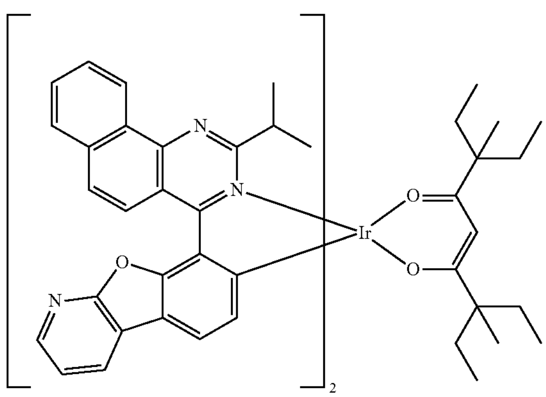
342
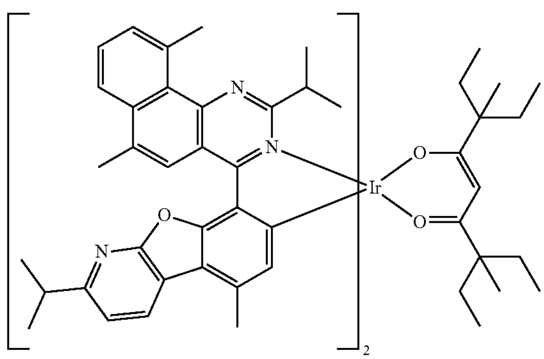
-continued
343
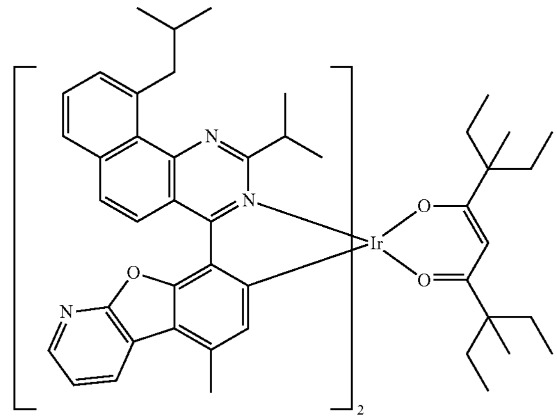
344
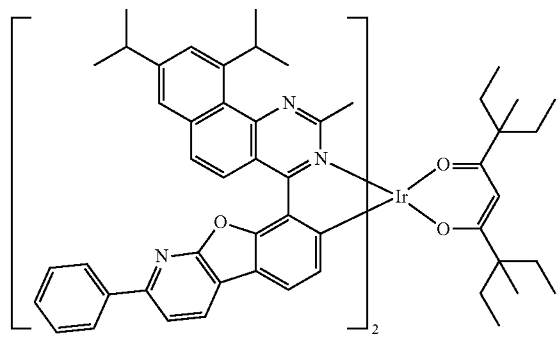
345
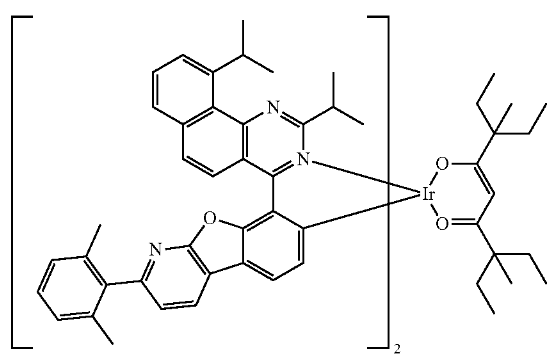
346
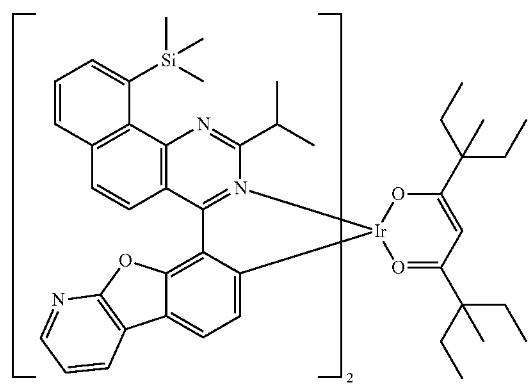

347
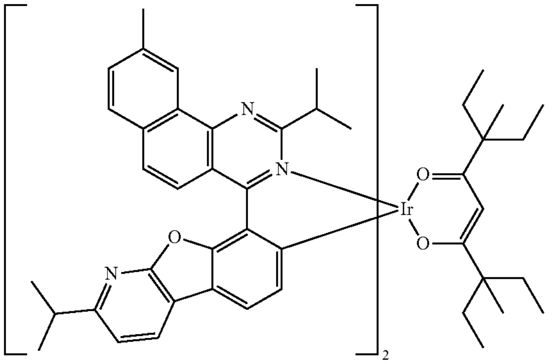
348
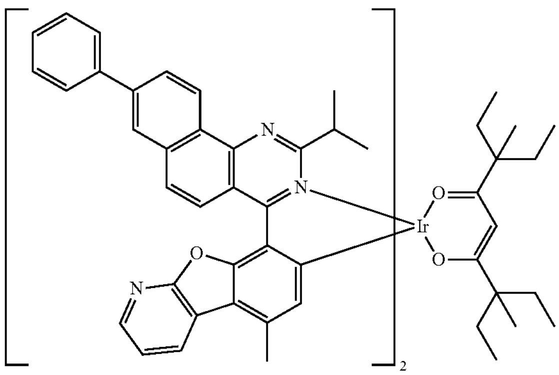
349
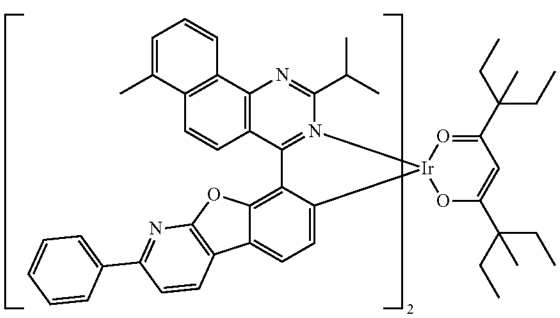
350
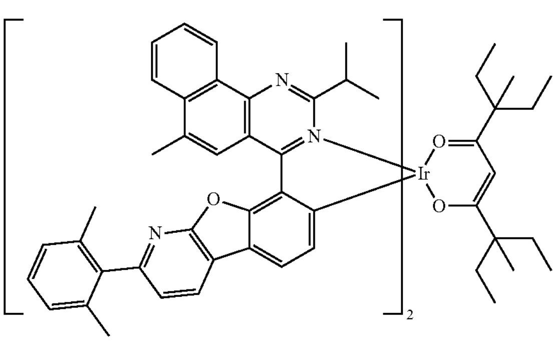
351
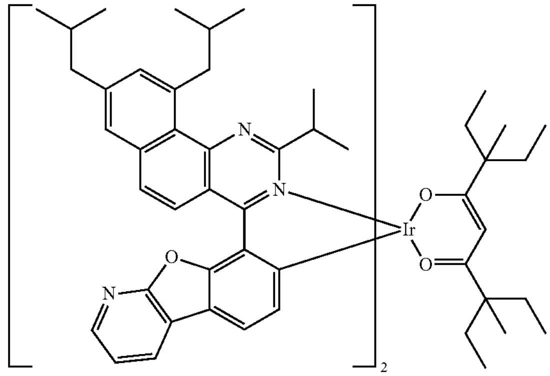
352
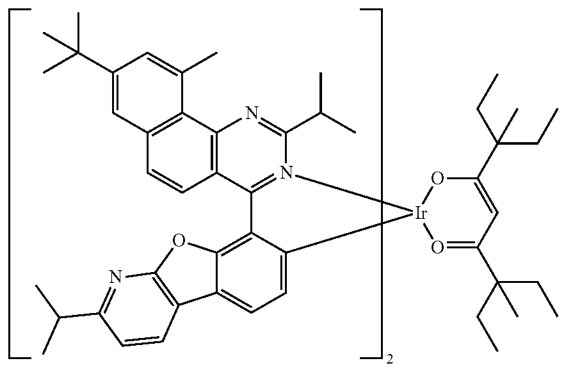
353
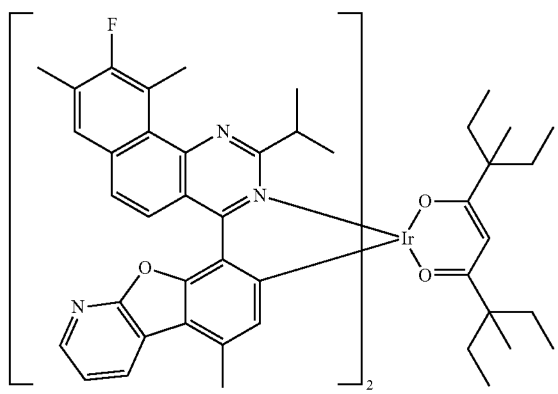
354
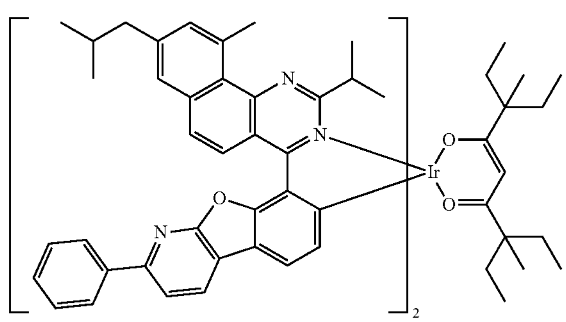

-continued
355
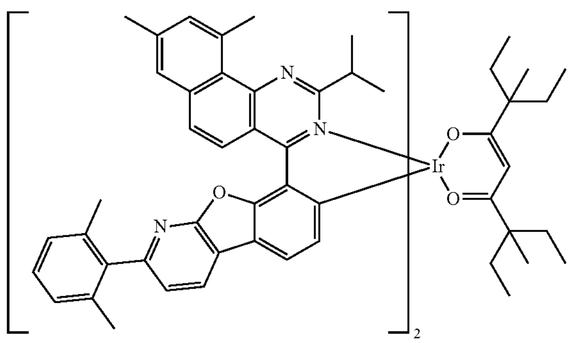
356
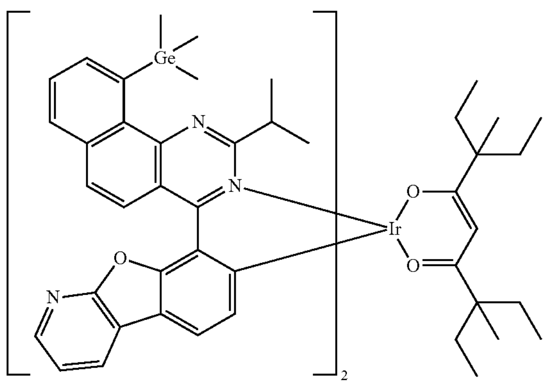
357
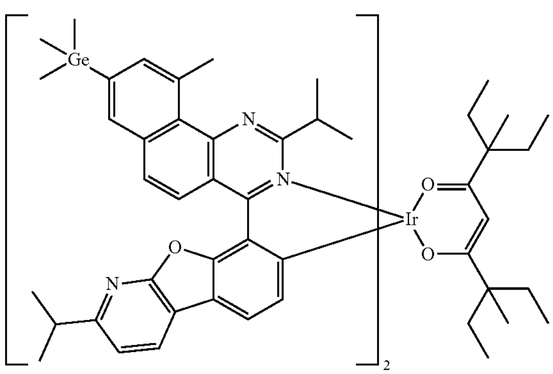
358
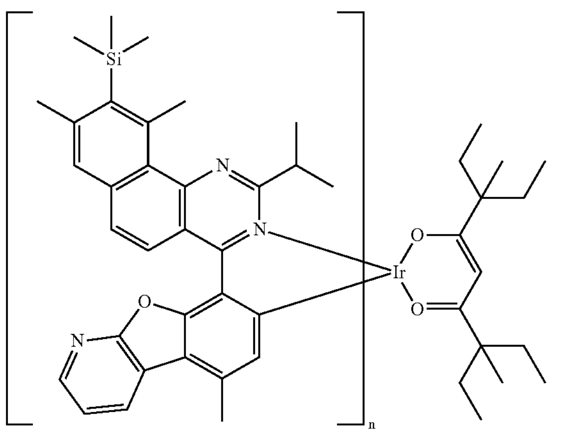
-continued
359
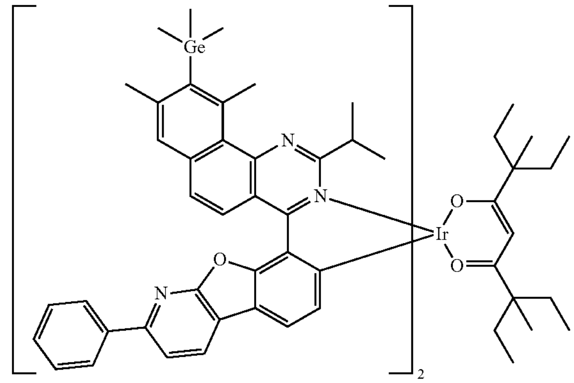
360
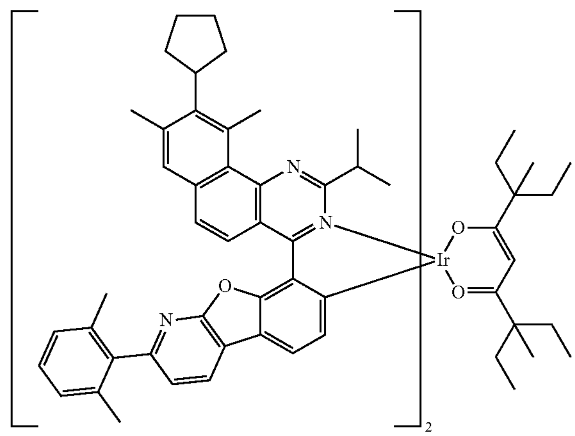
361
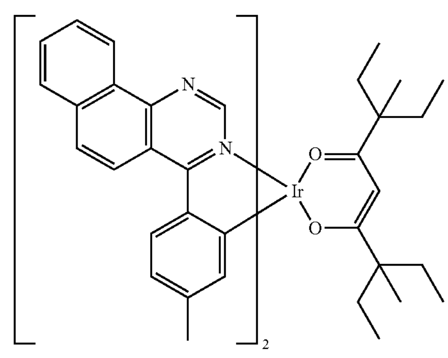
362
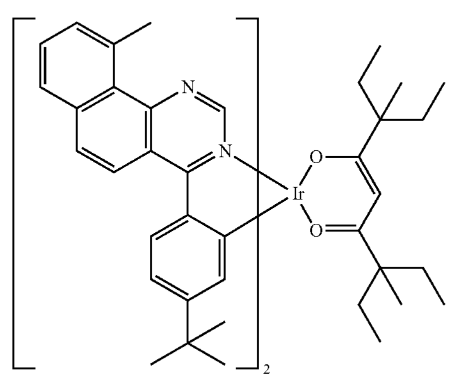

-continued
363
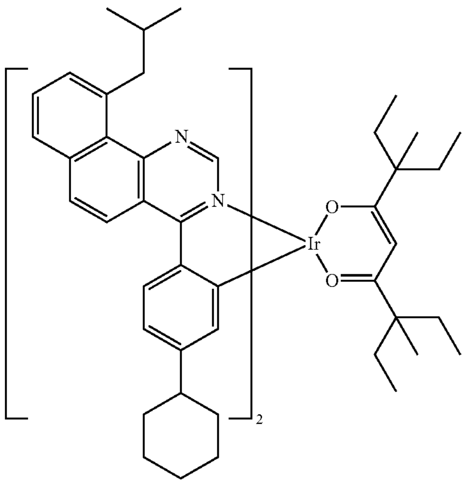
364
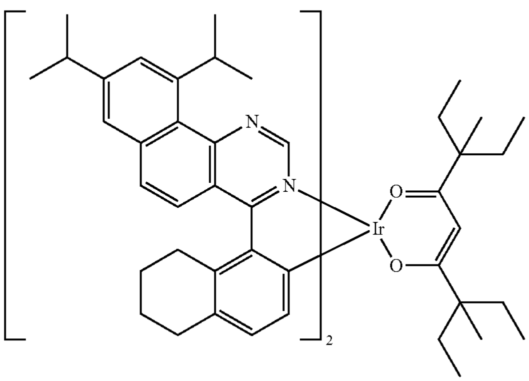
365
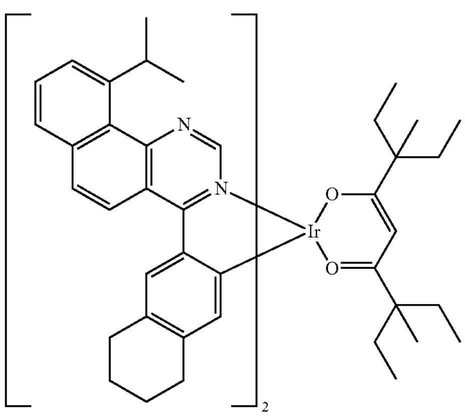
-continued
366
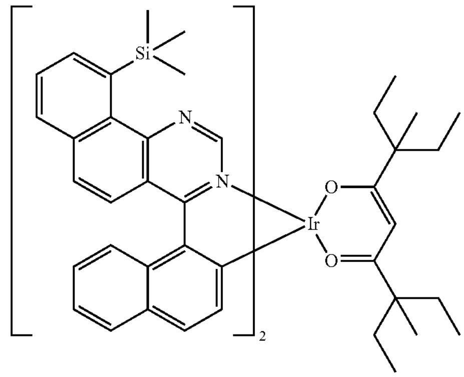
367
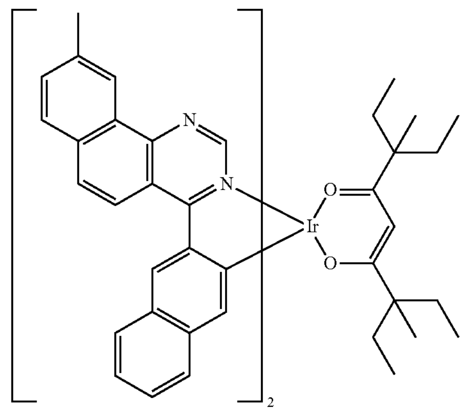
368
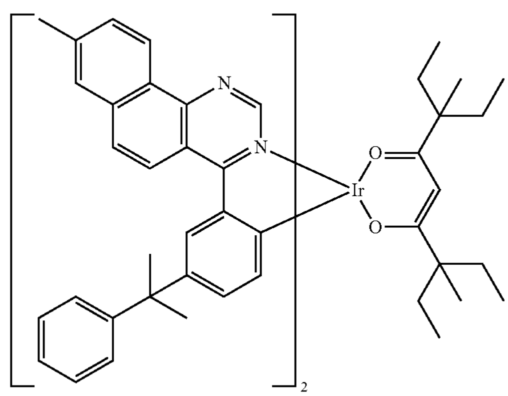
369
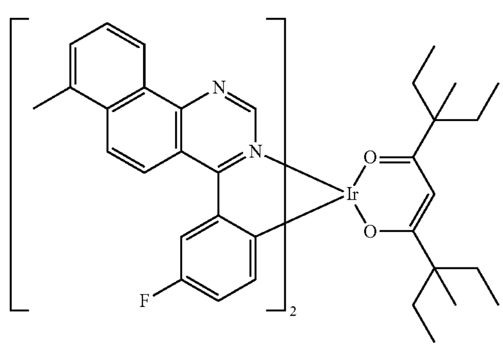

-continued
370
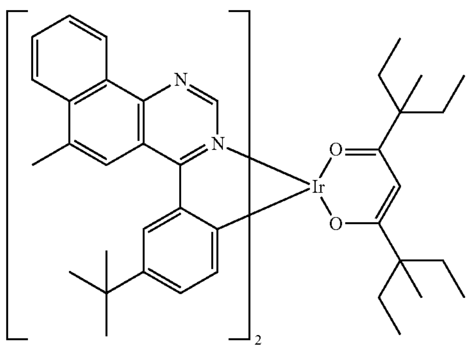
371
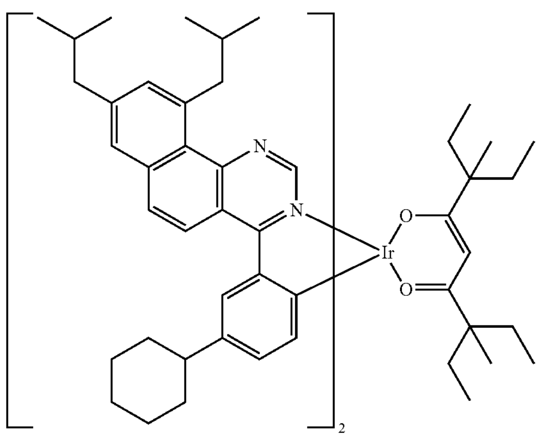
372
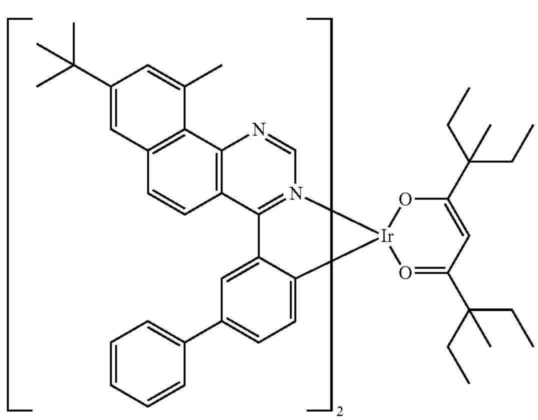
373
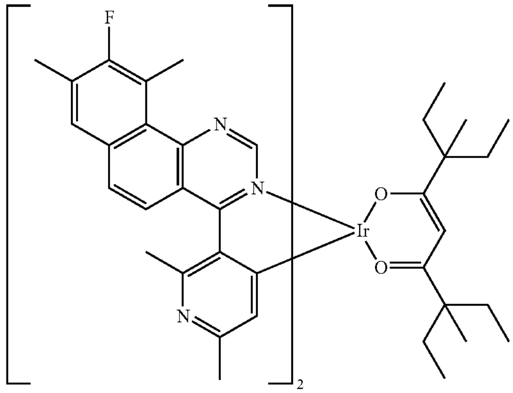
-continued
374
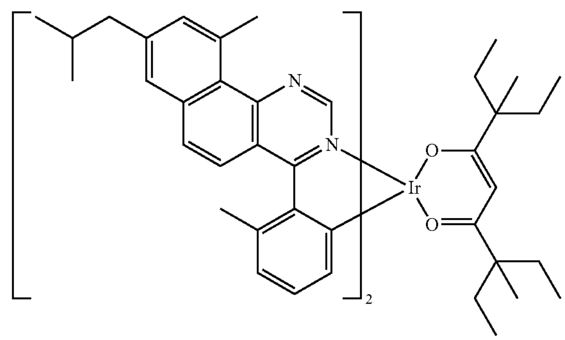
375
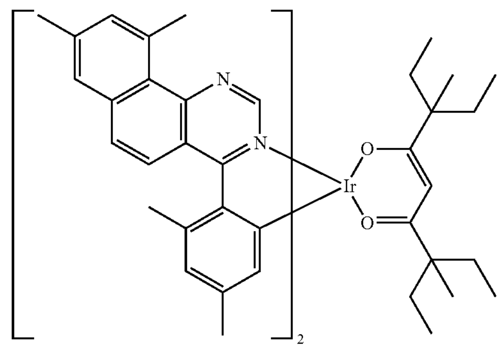
376
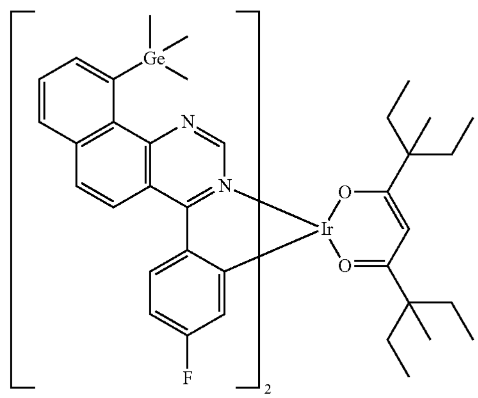
377
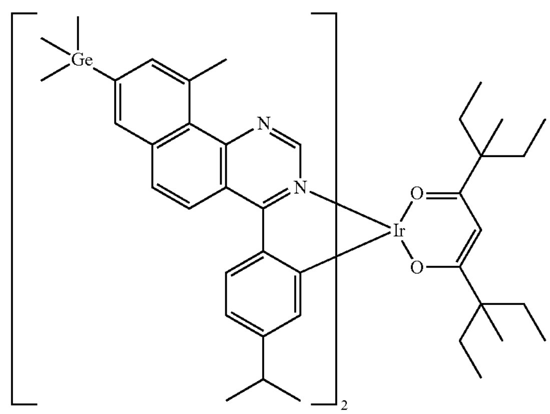

-continued
378
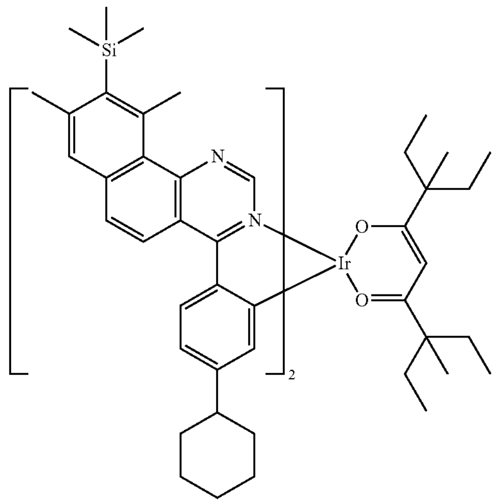
379
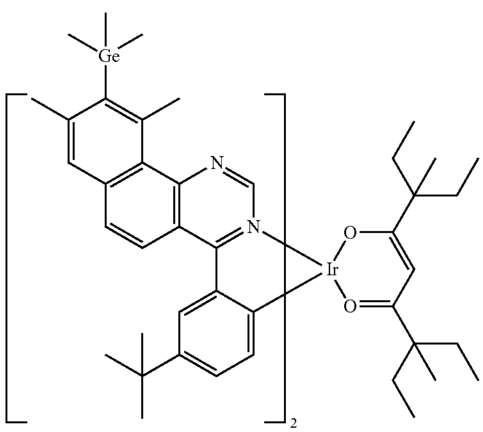
380
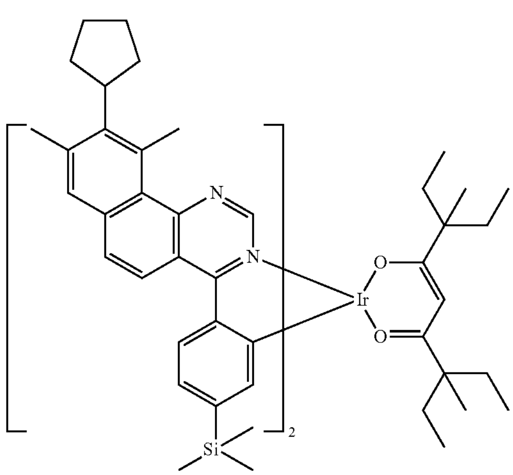
-continued
381
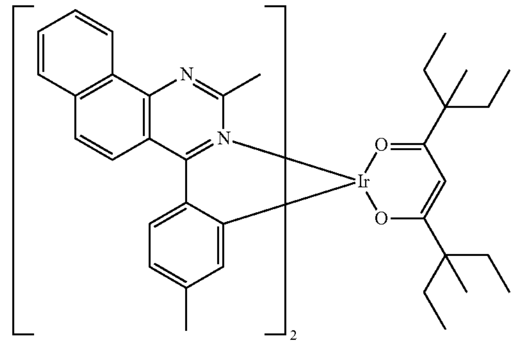
382
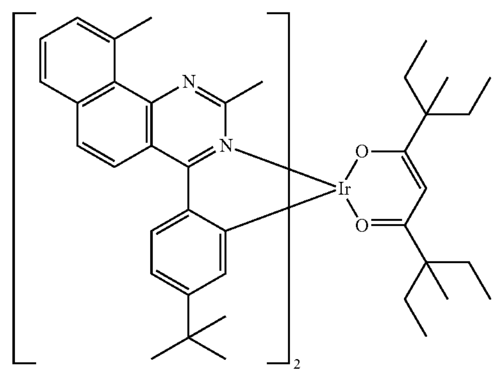
383
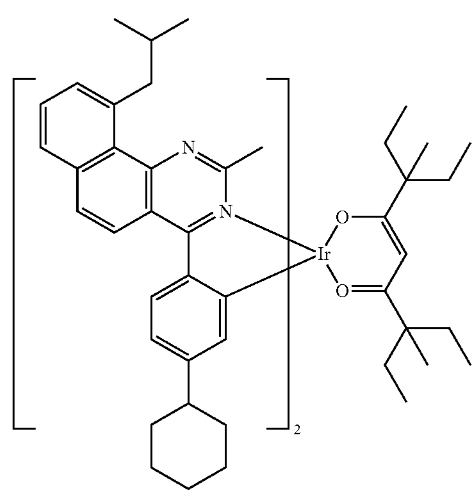

384
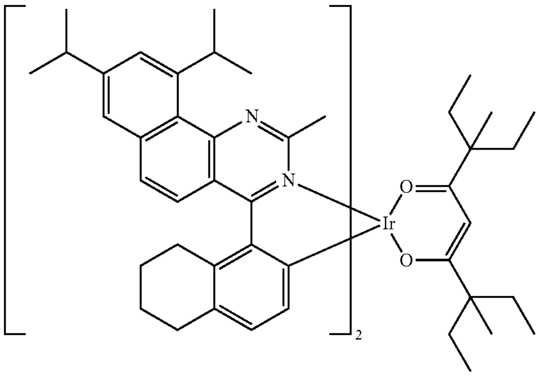
385
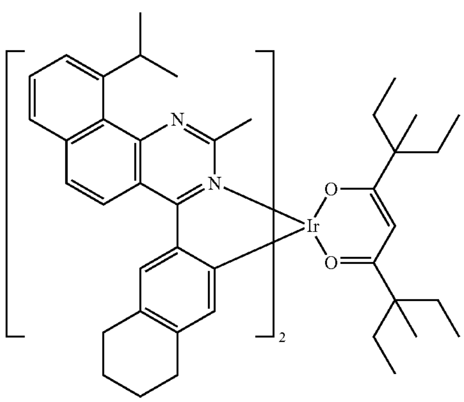
386
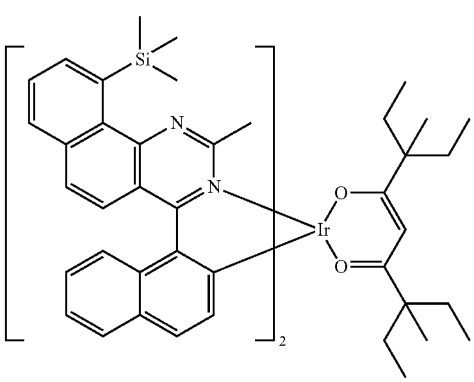
387
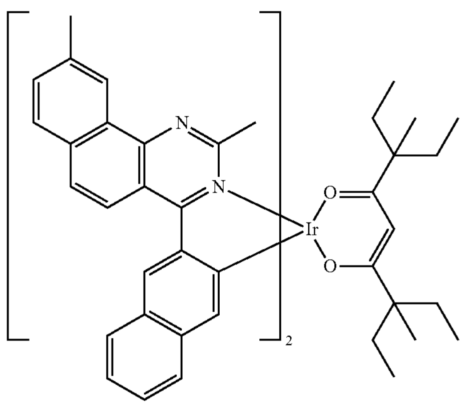
388
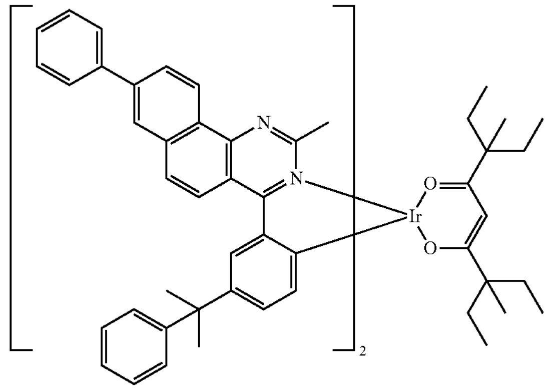
389
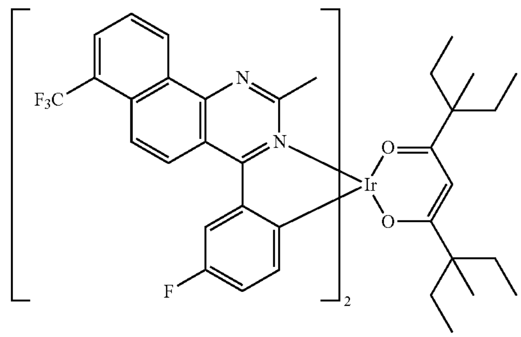
390
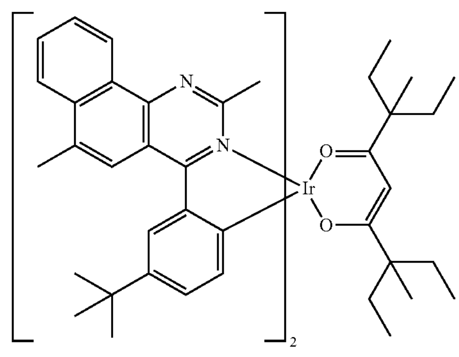
391
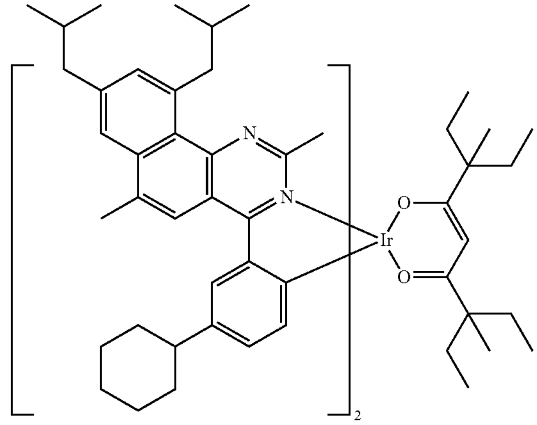

392
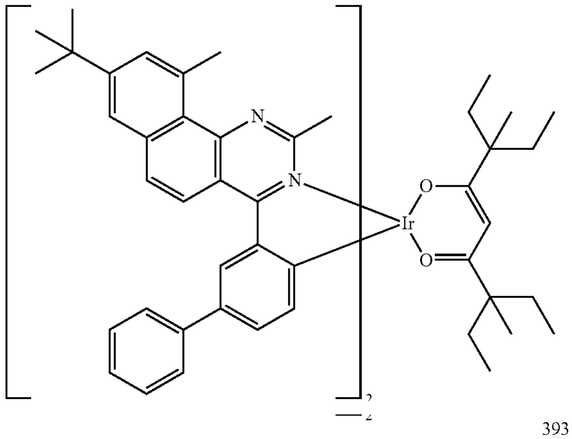
393
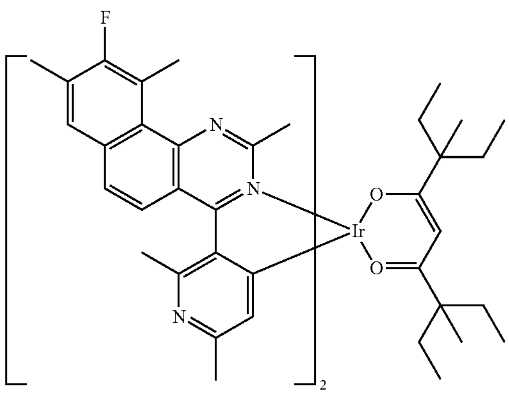
394
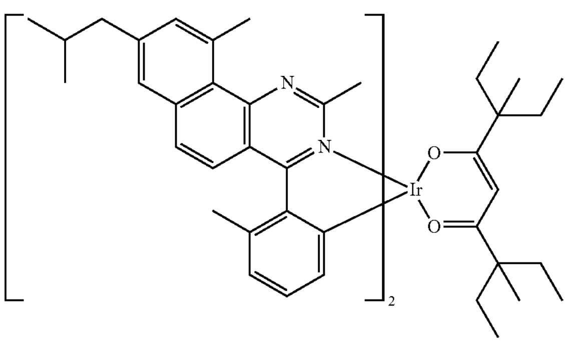
395
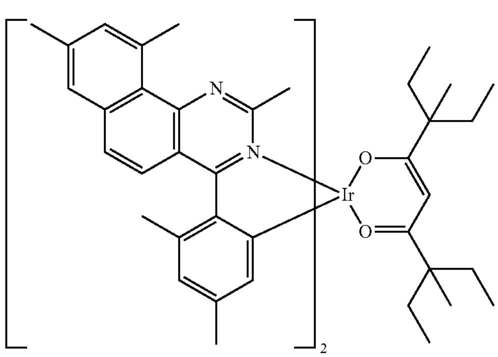
396
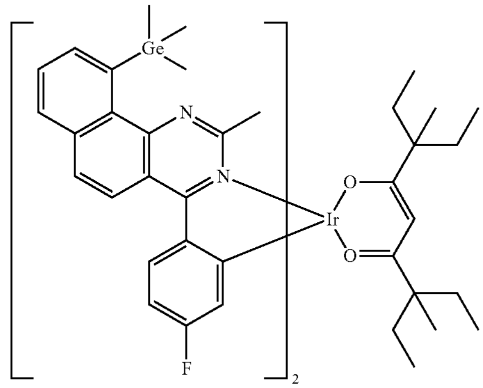
397
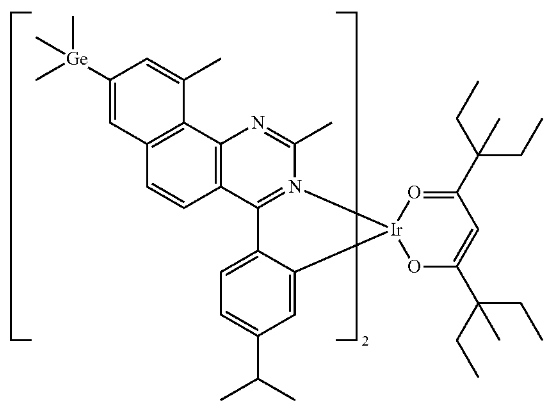
398
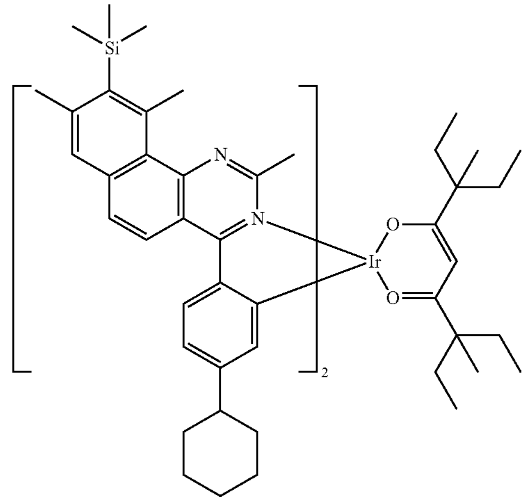

-continued
399
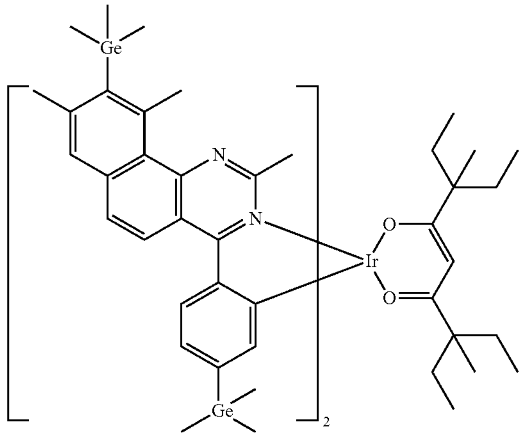
400
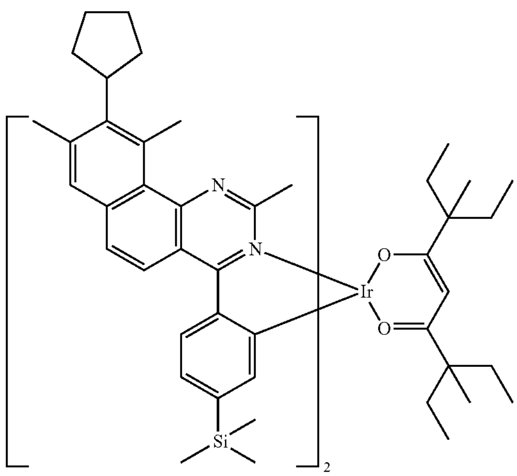
401
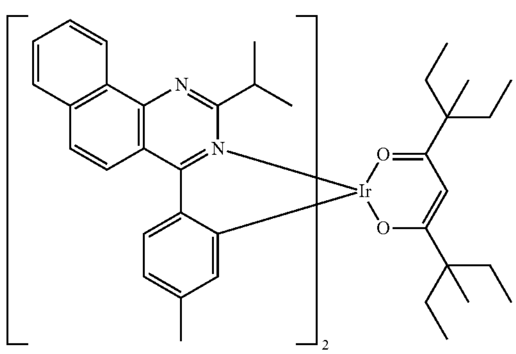
402
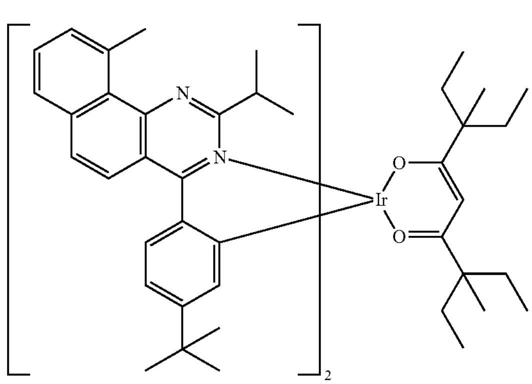
-continued
403
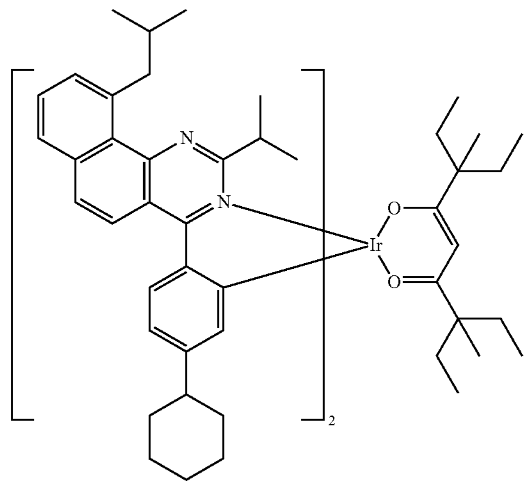
404
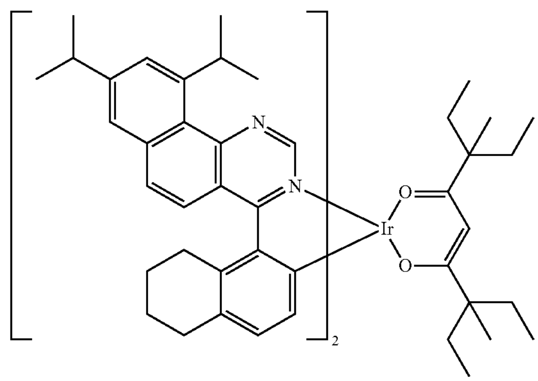
405
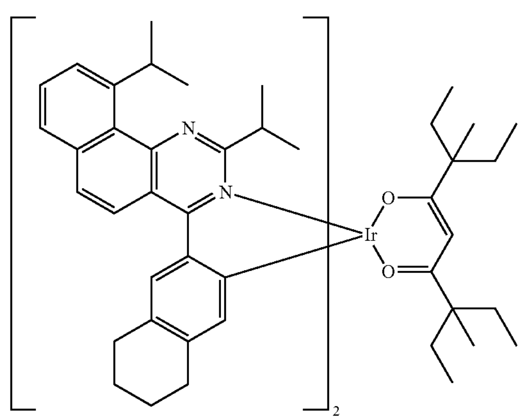

-continued
406
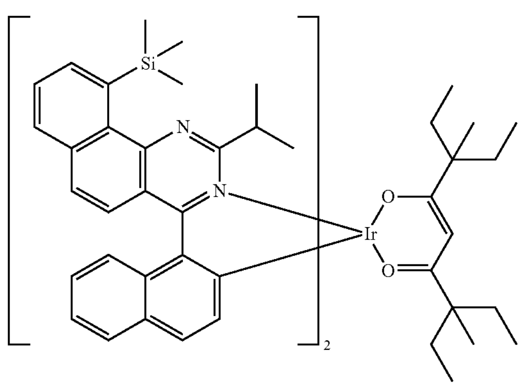
407
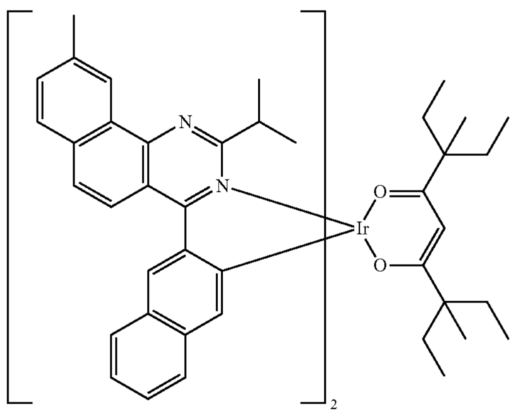
408
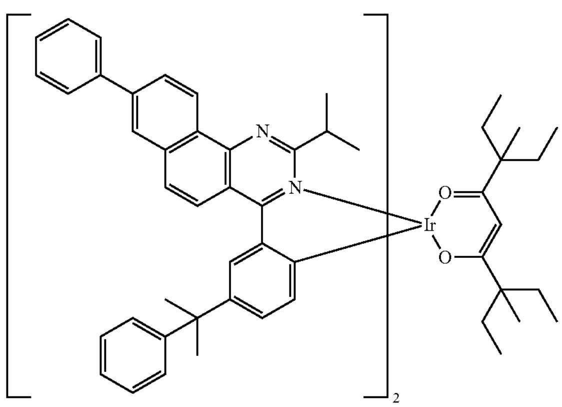
409
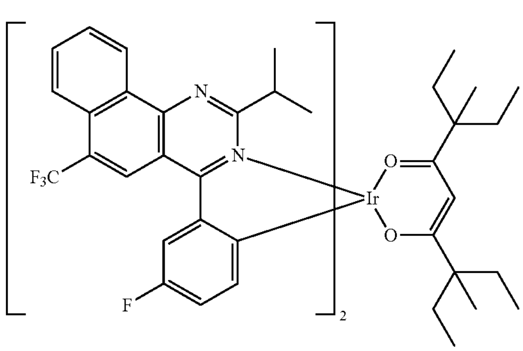
-continued
410
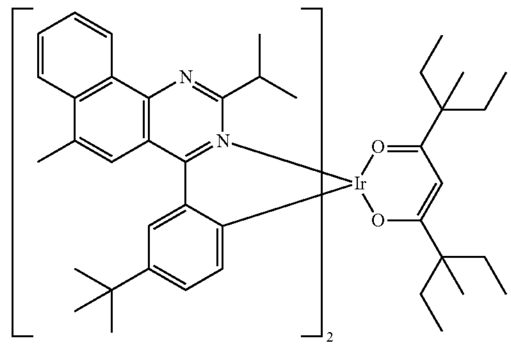
411
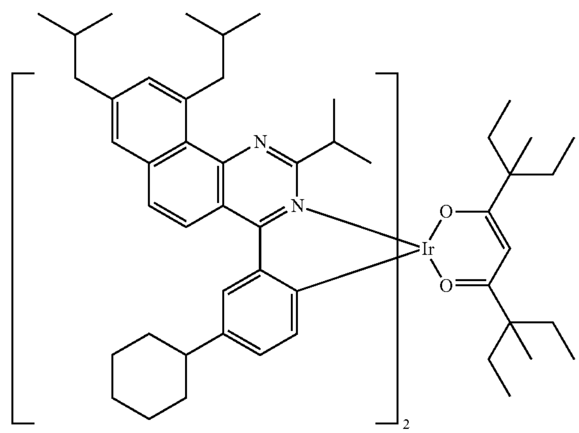
412
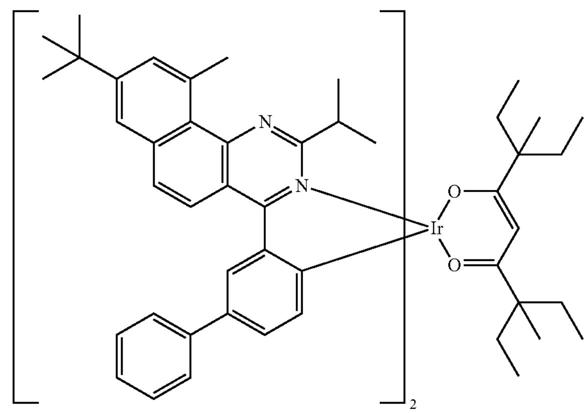
413
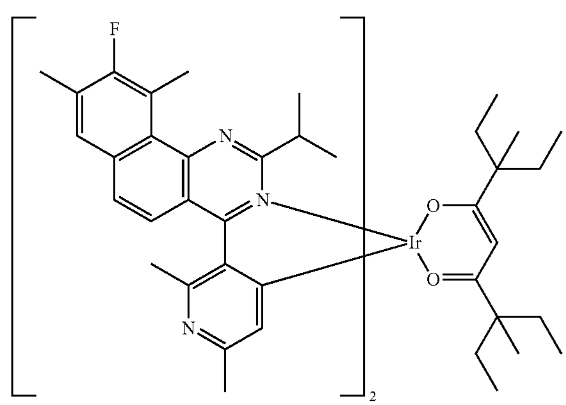

-continued
414
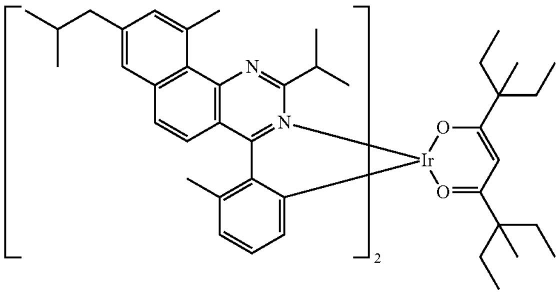
415
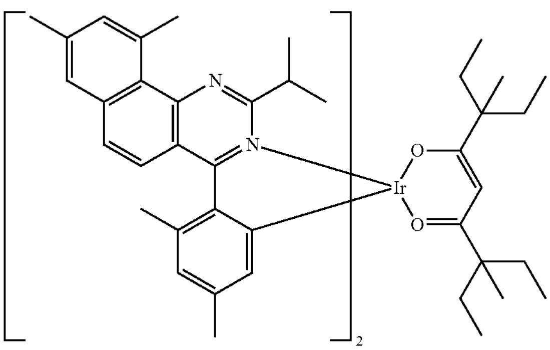
416
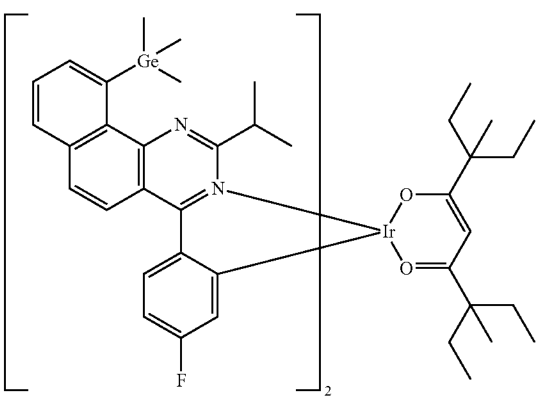
417
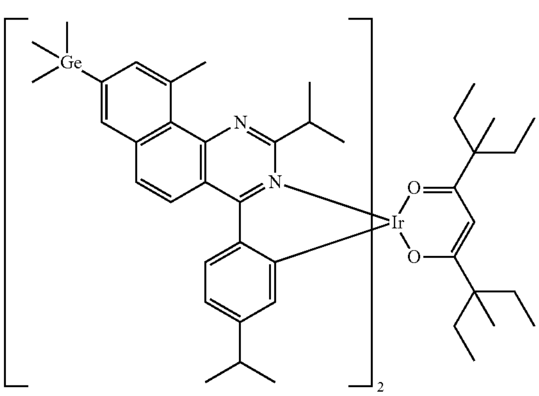
-continued
418
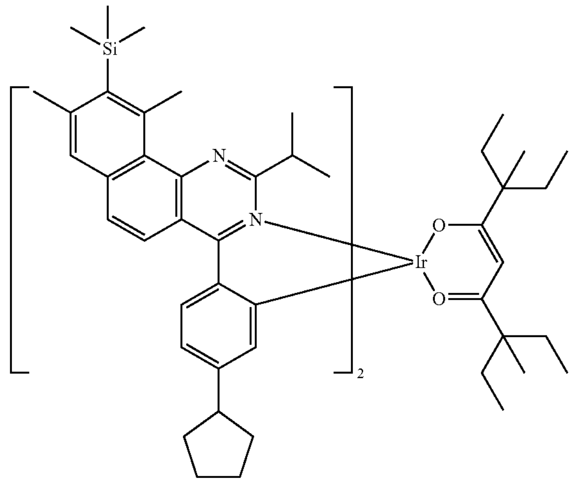
419
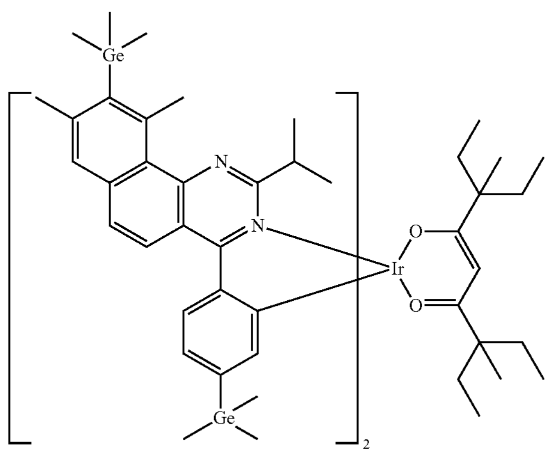
420
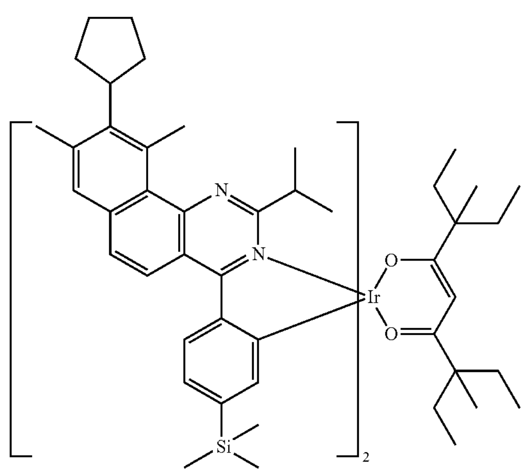

421
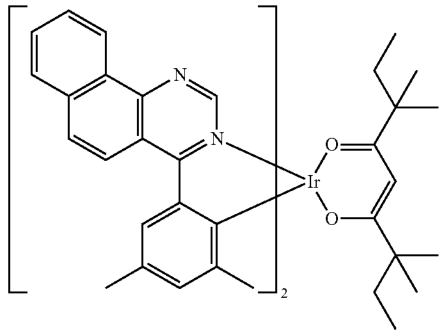
422
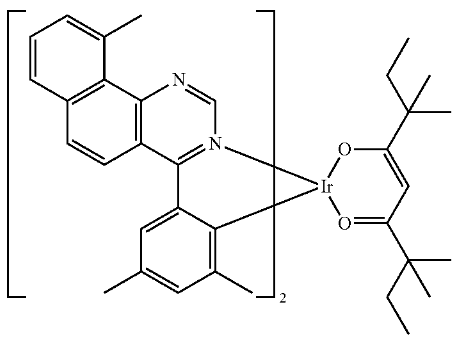
423
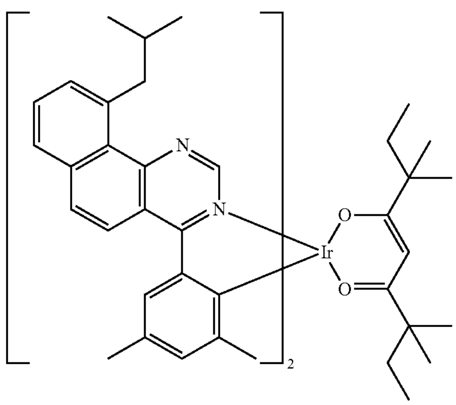
424
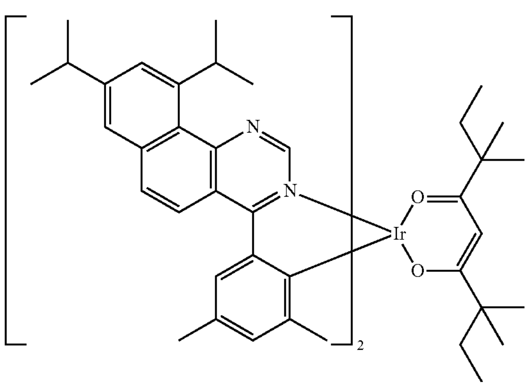
425
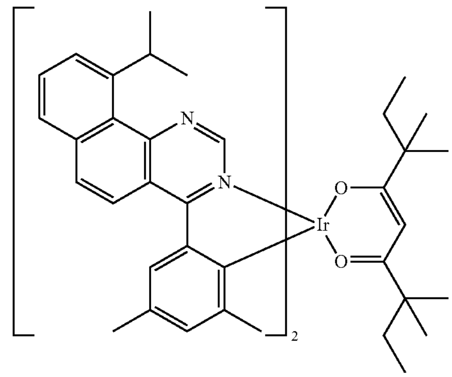
426
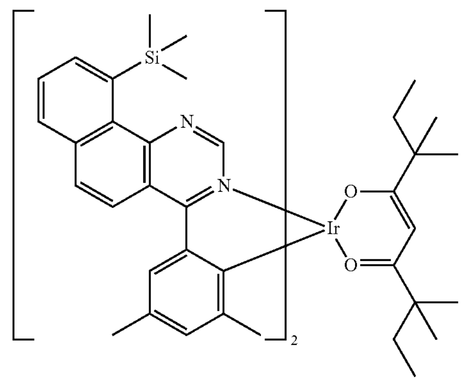
427
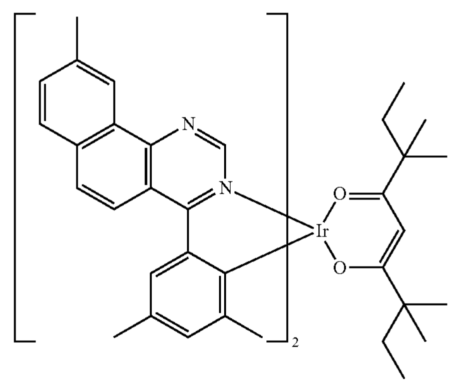
428
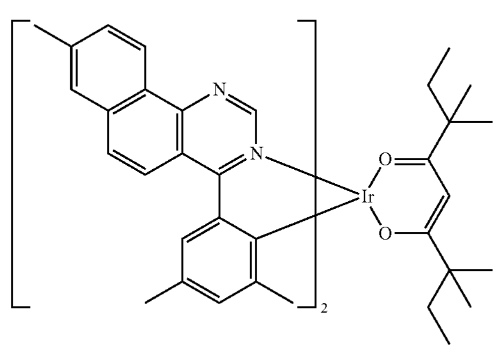

-continued
429
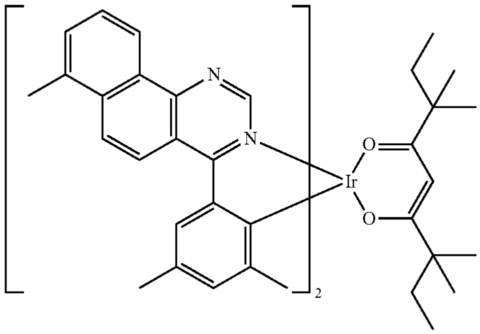
430
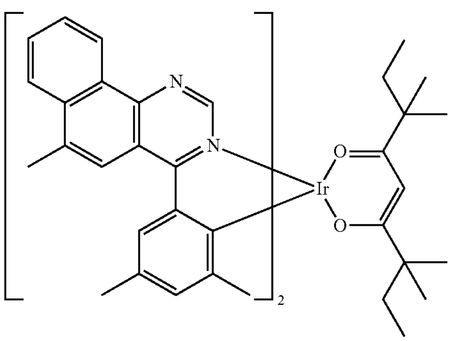
431
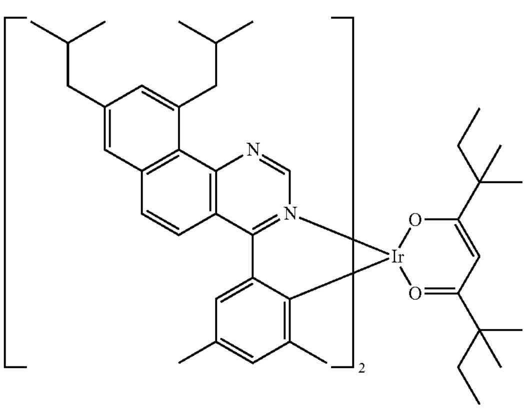
432
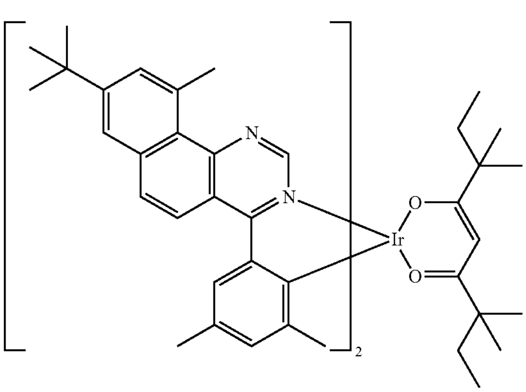
-continued
433
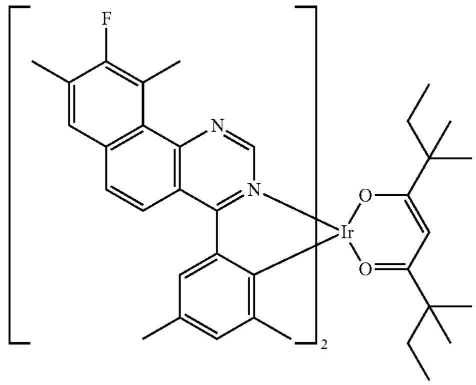
434
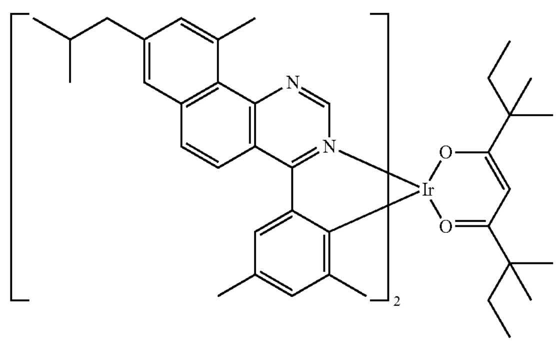
435
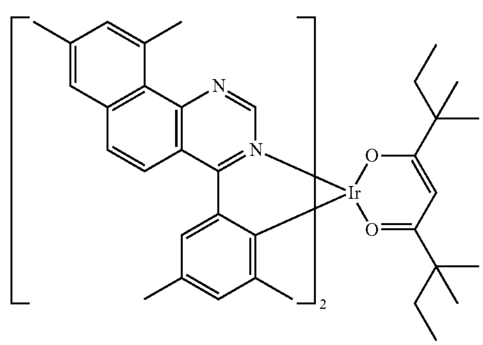
436
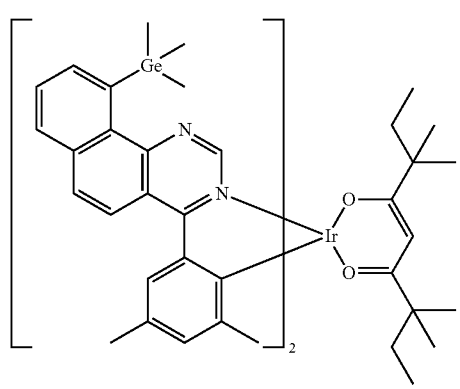

437
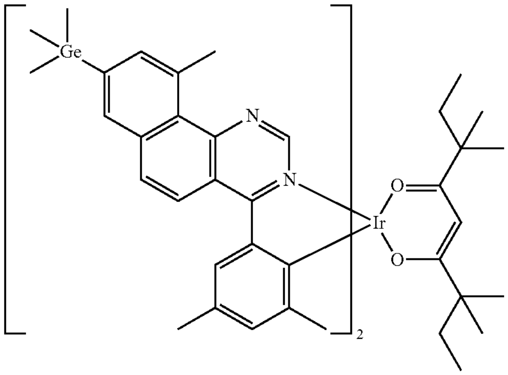
438
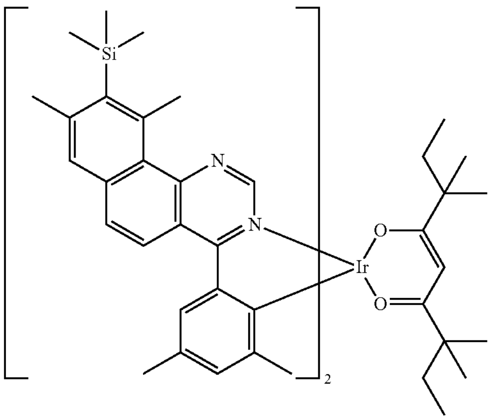
439
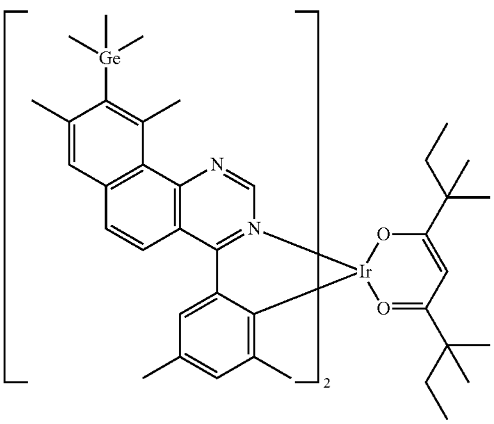
440
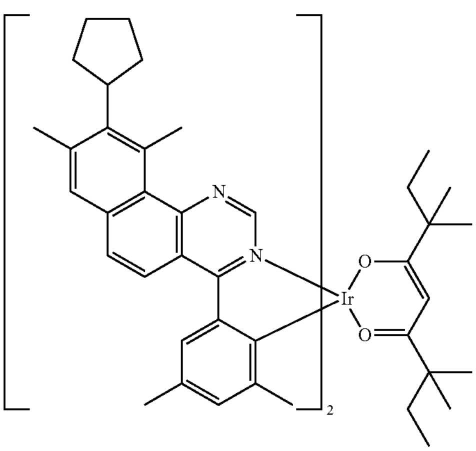
441
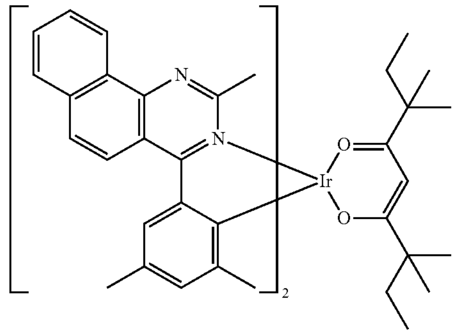
442
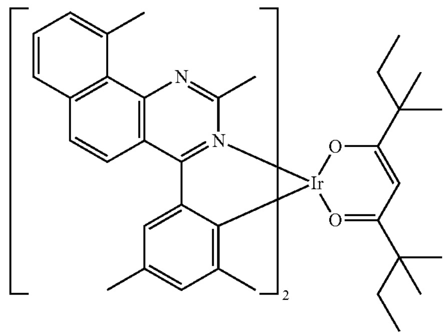
443
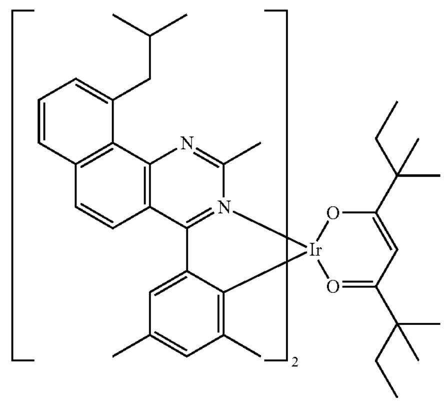
444
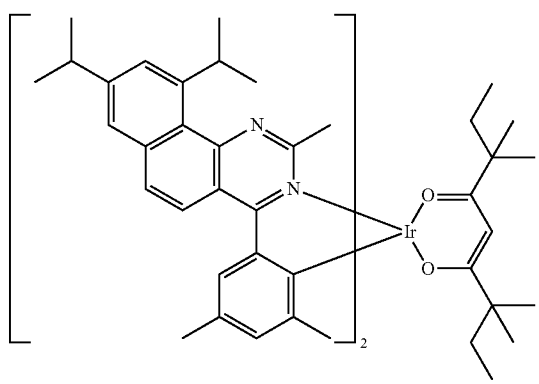

445
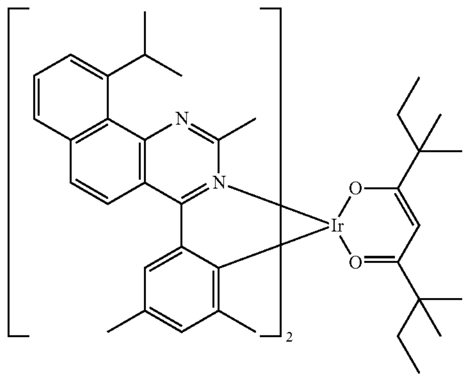
446
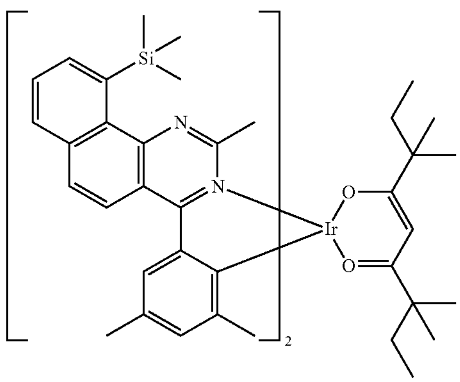
447
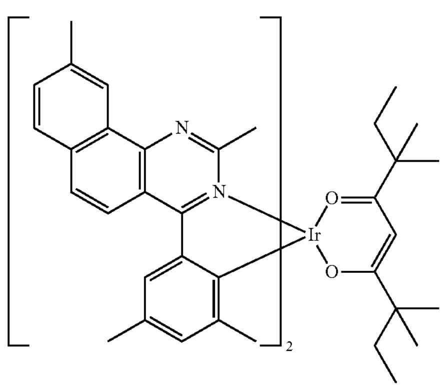
448
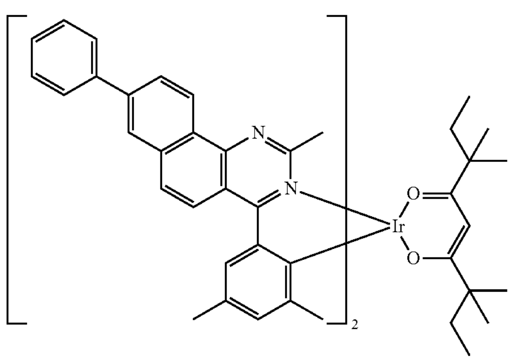
449
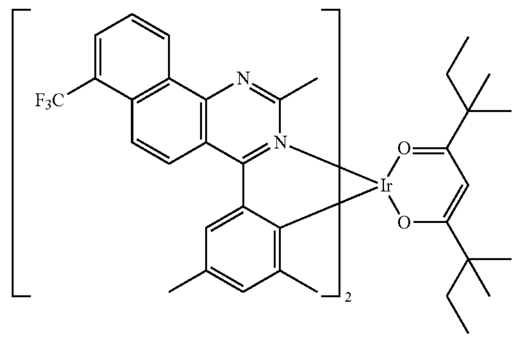
450
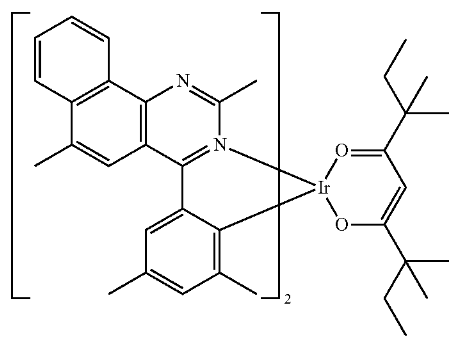
451
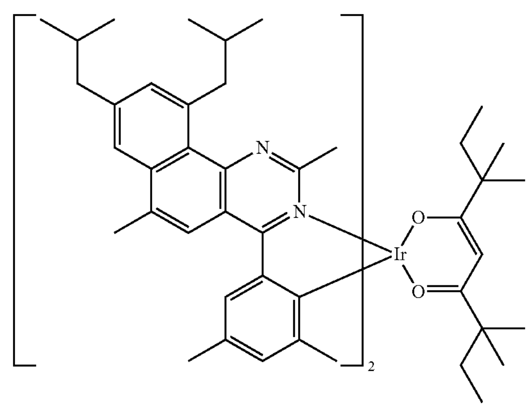
452
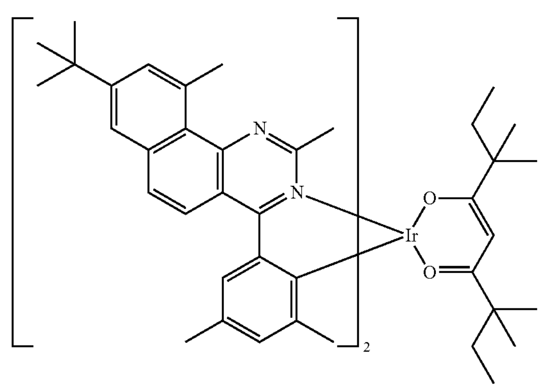

-continued
453
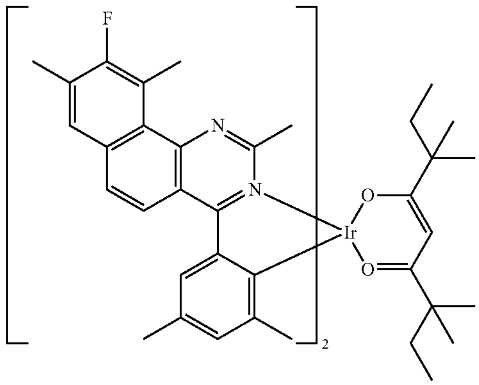
454
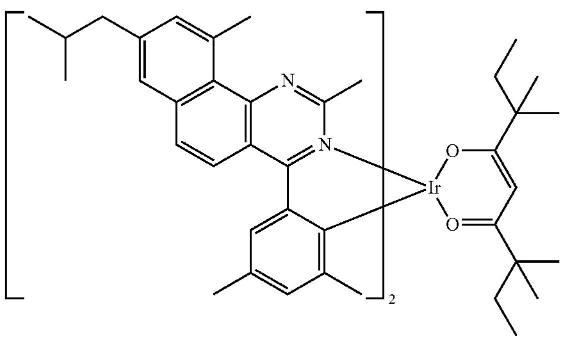
455
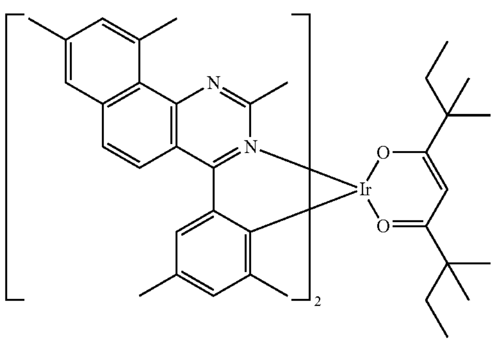
456
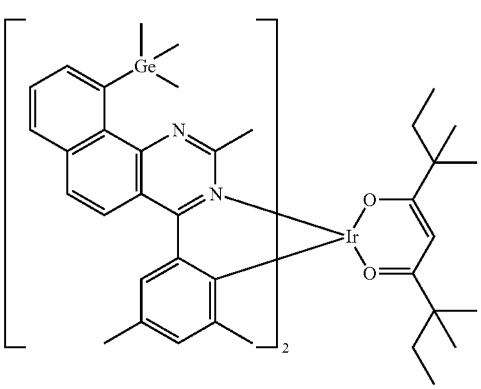
-continued
457
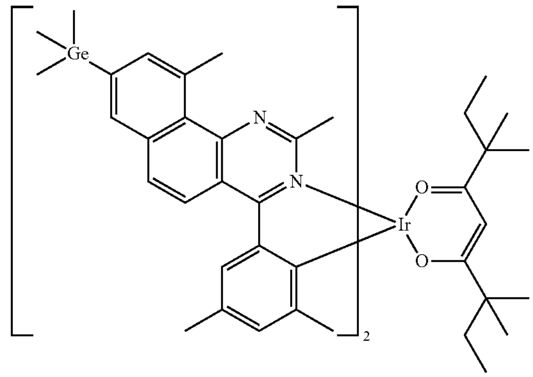
458
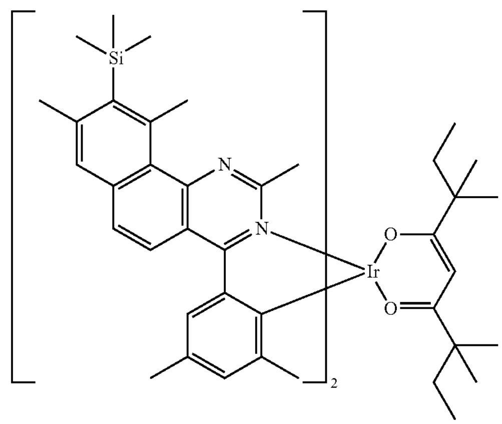
459
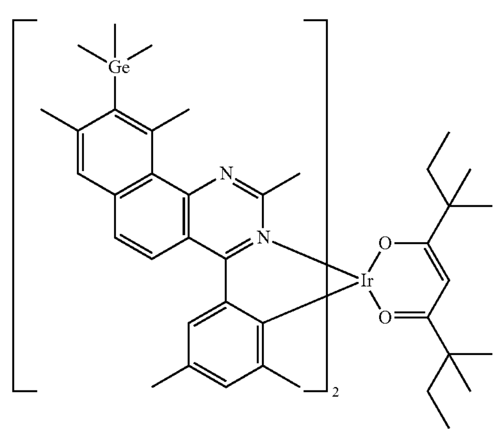

-continued
460
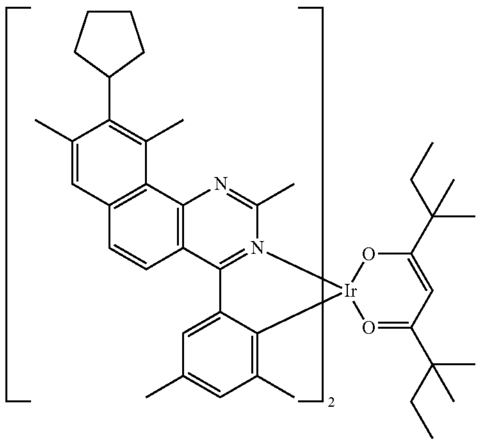
461
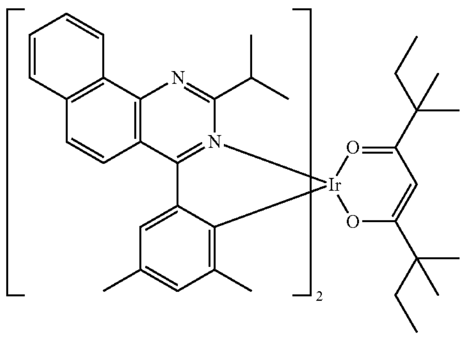
462
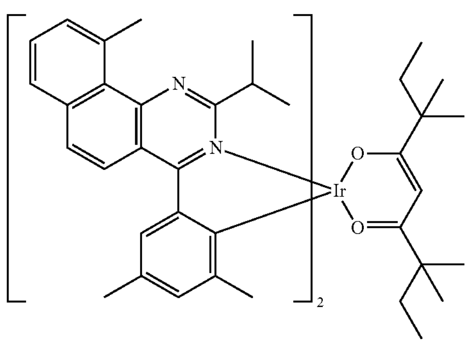
463
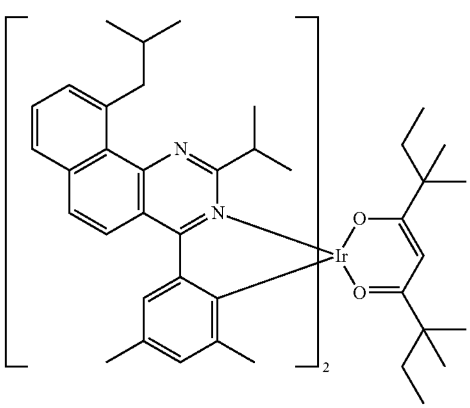
-continued
464
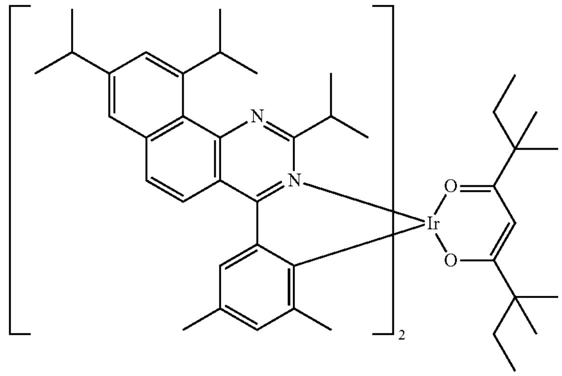
465
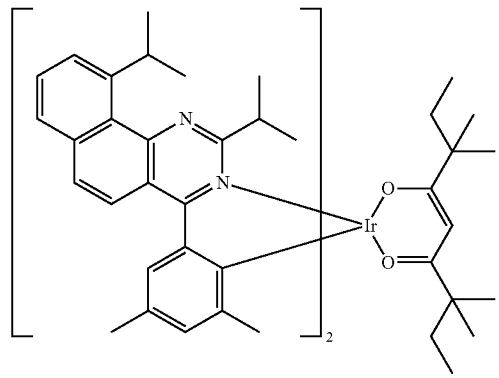
466
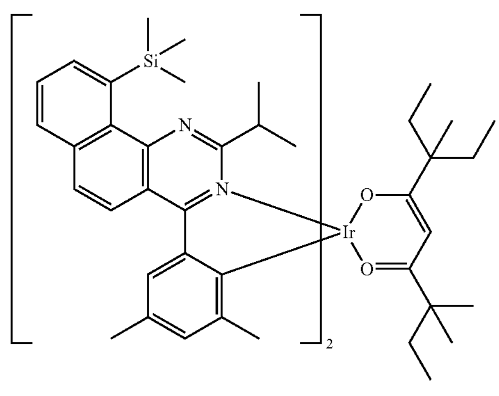
467
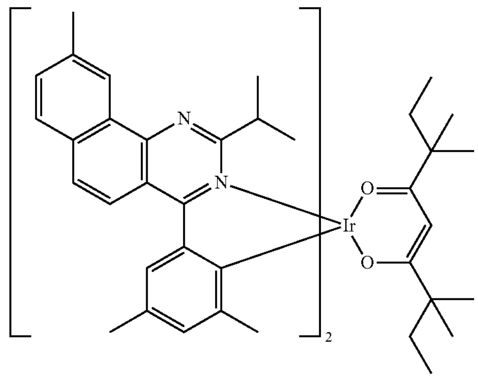

-continued
468
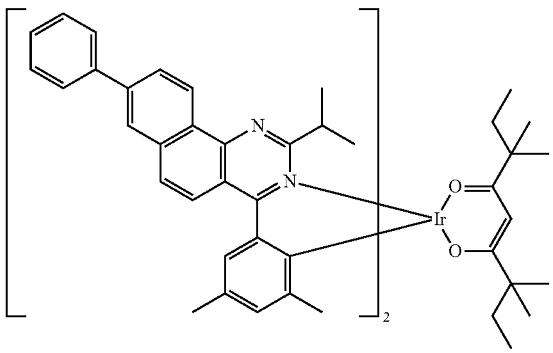
469
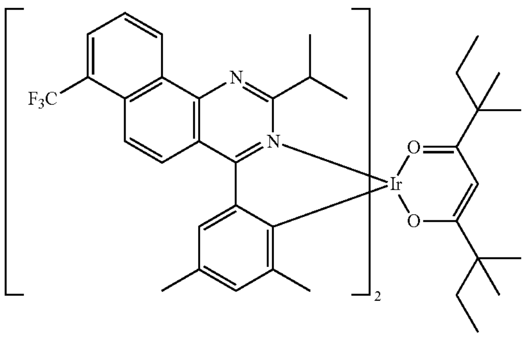
470
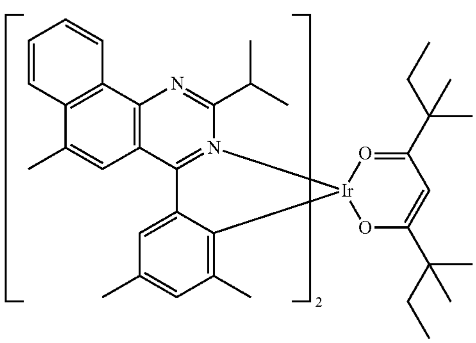
471
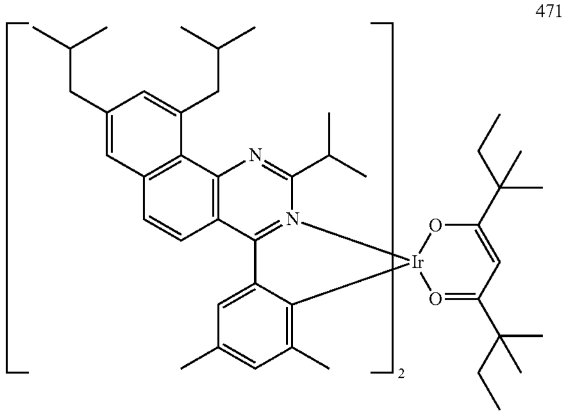
-continued
472
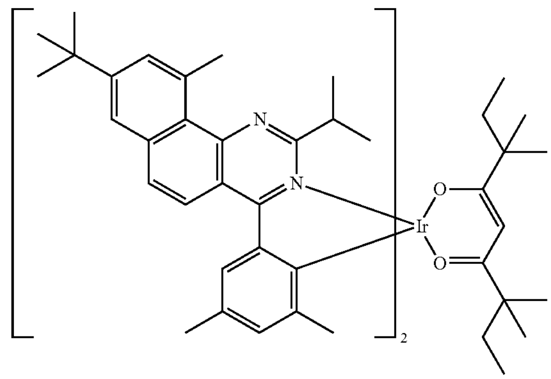
473
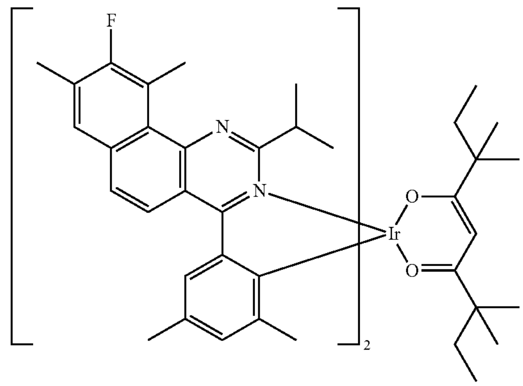
474
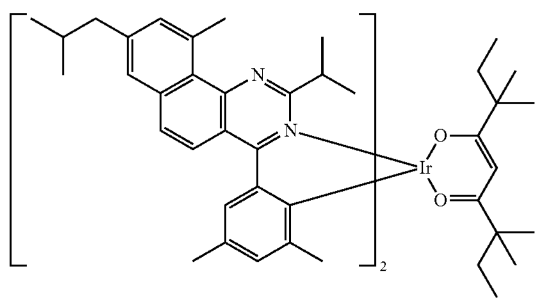
475
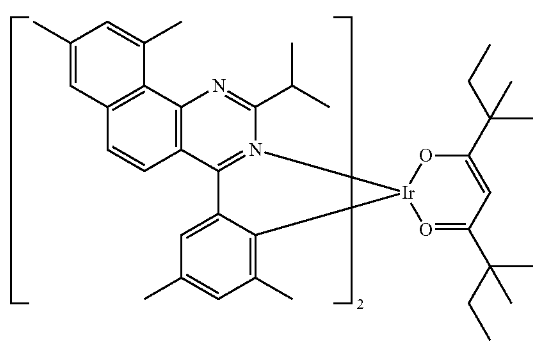

-continued
476
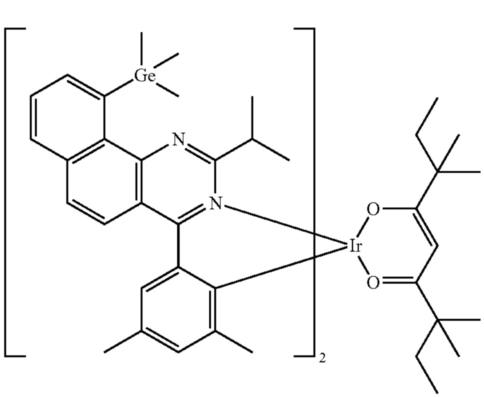
477
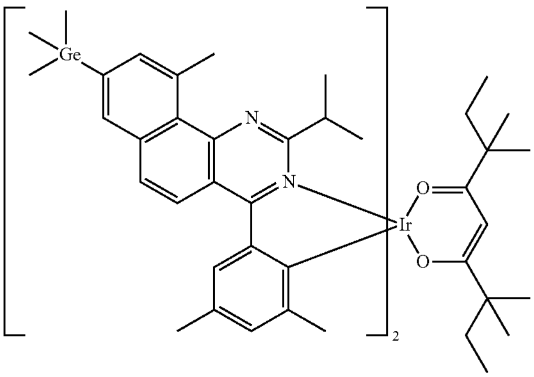
478
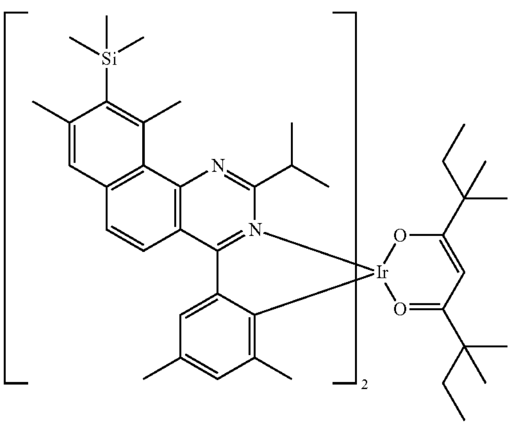
479
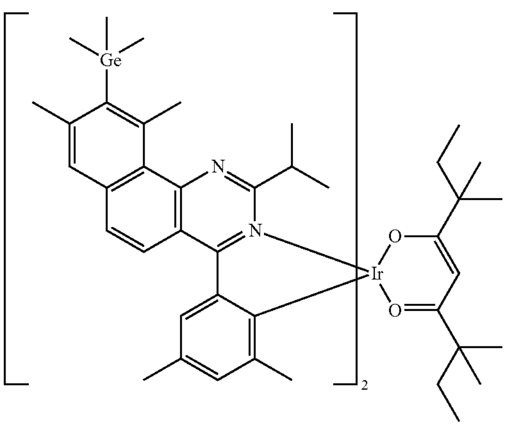
-continued
480
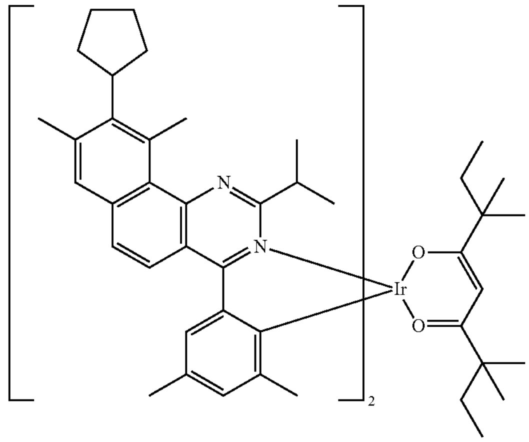
481
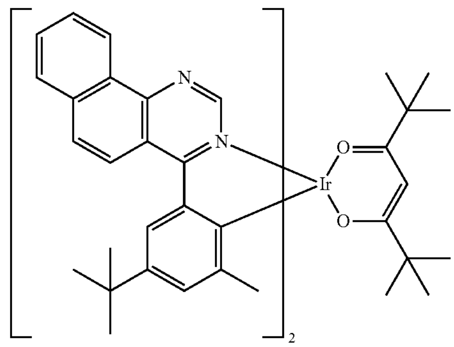
482
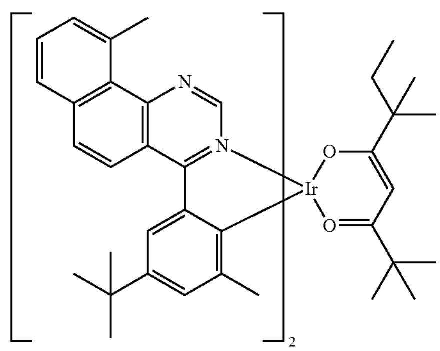
483
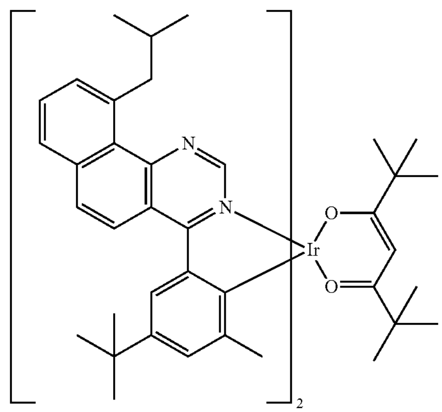

-continued
484
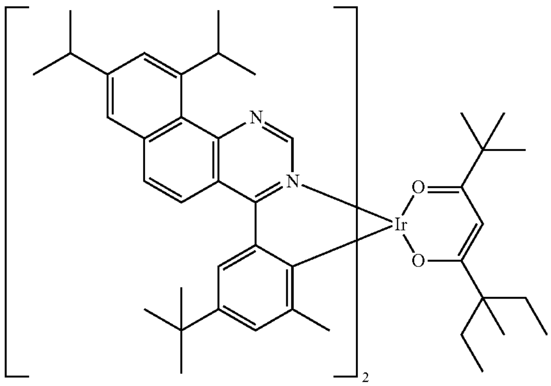
485
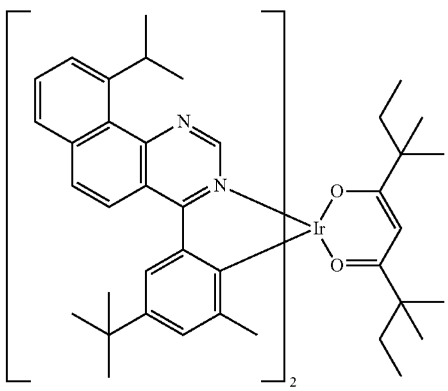
486
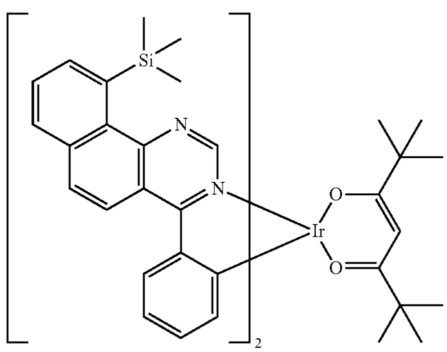
487
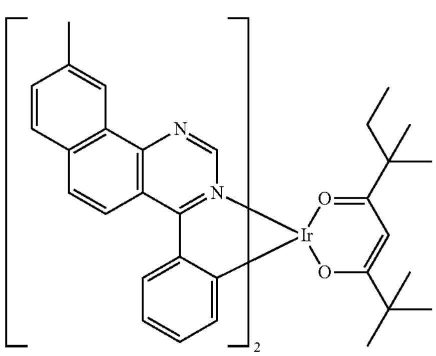
-continued
488
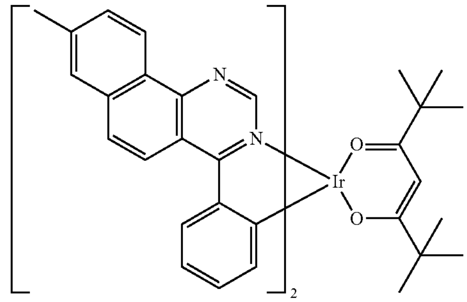
489
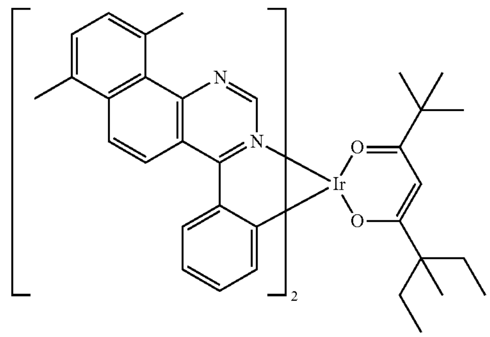
490
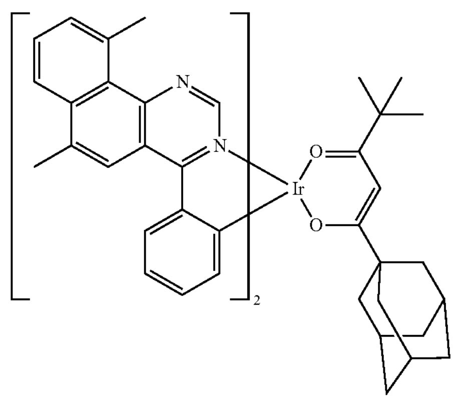
491
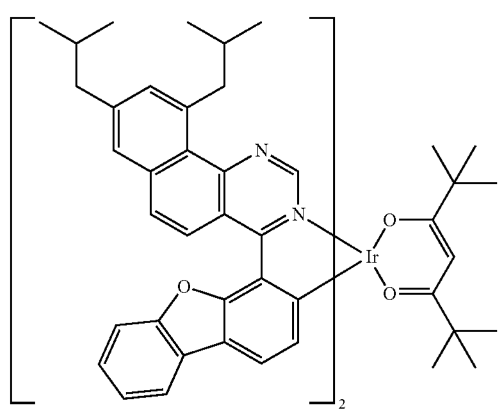

-continued
492
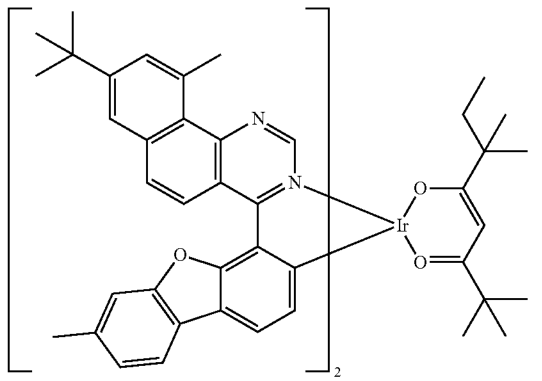
493
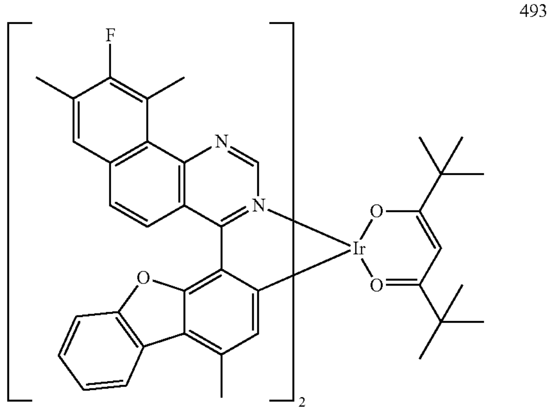
494
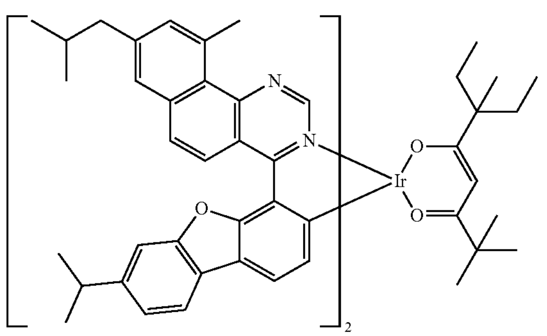
495
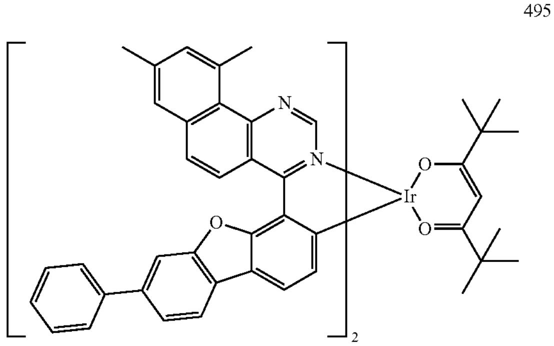
-continued
496
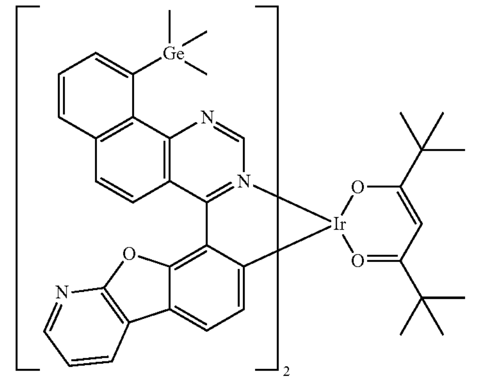
497
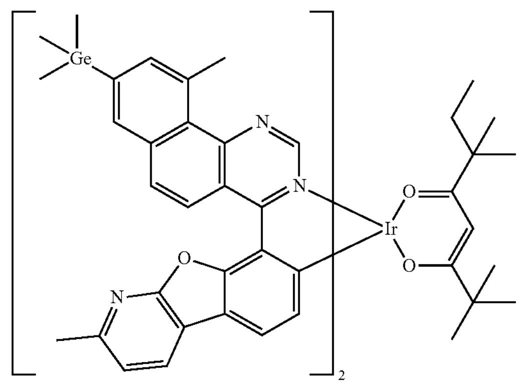
498
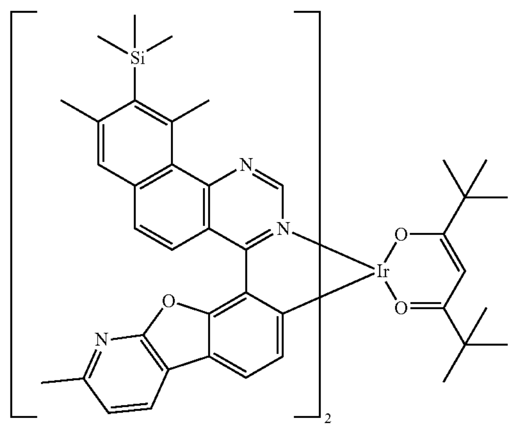
499
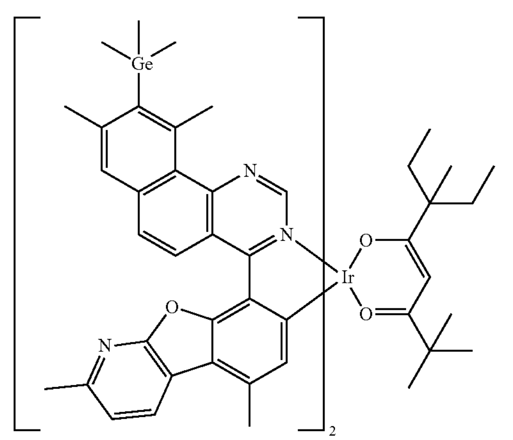

-continued
500
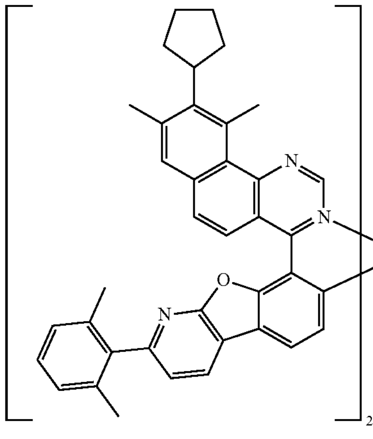
501
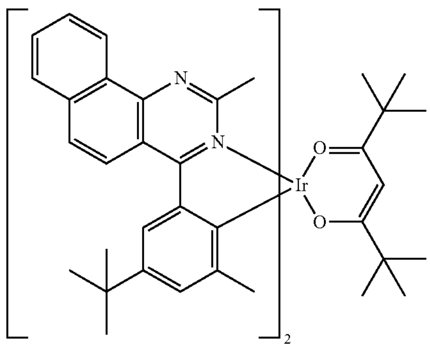
502
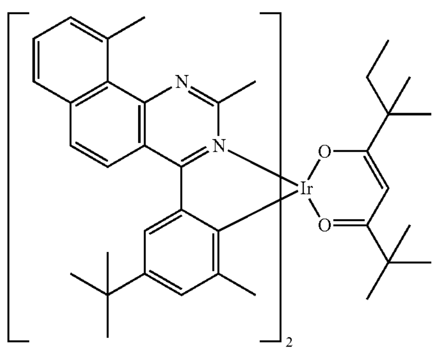
503
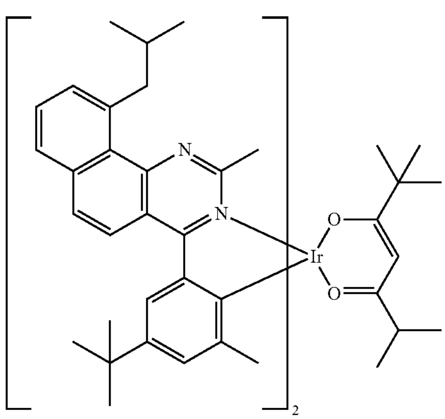
-continued
504
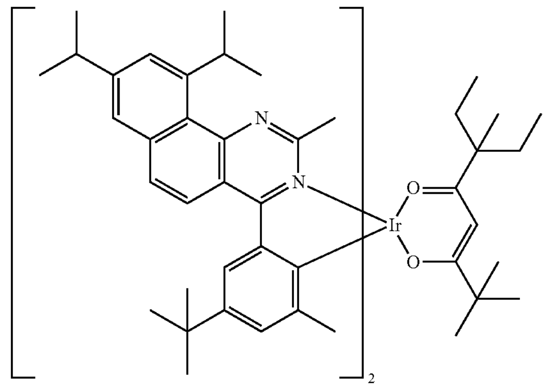
505
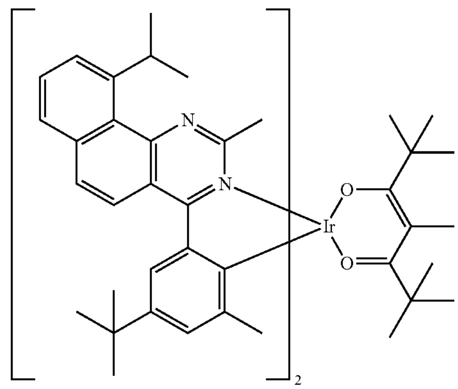
506
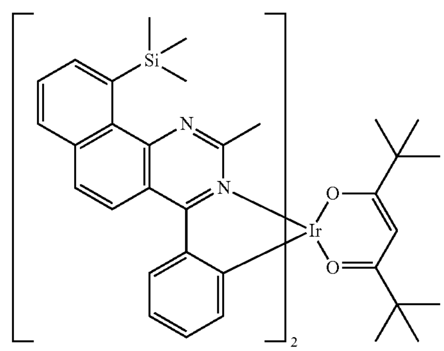
507
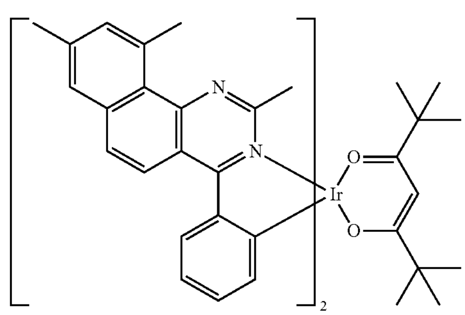

-continued
508
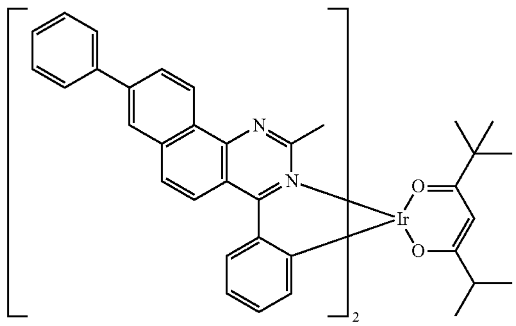
509
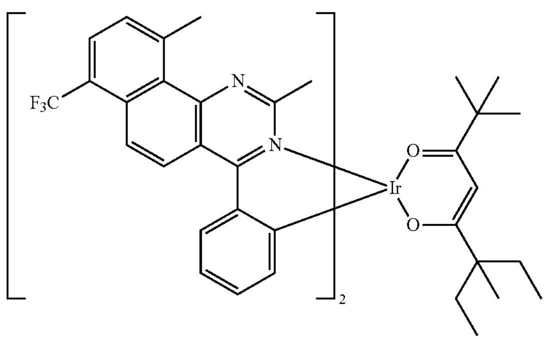
510
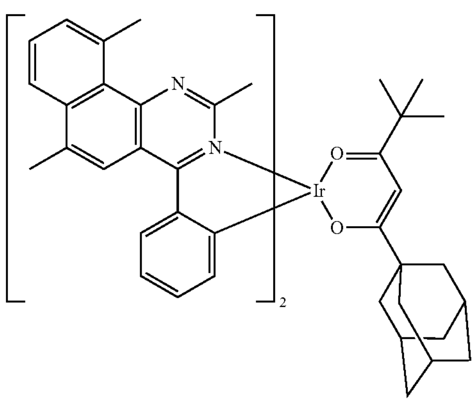
511
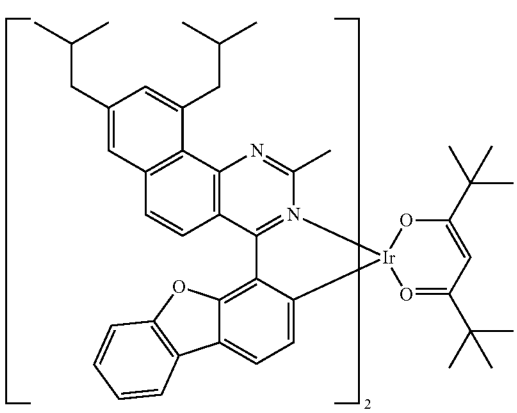
-continued
512
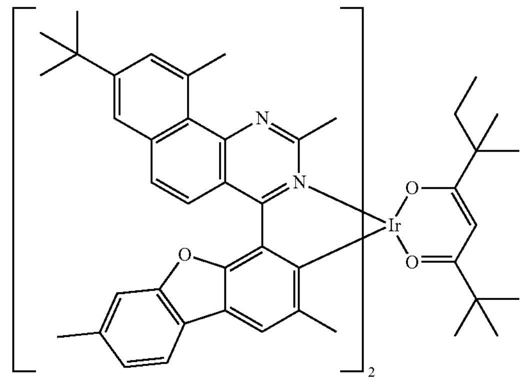
513
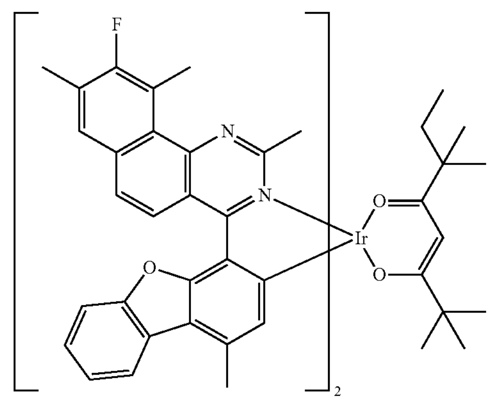
514
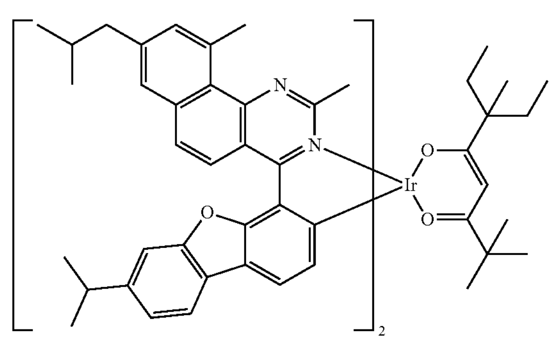
515
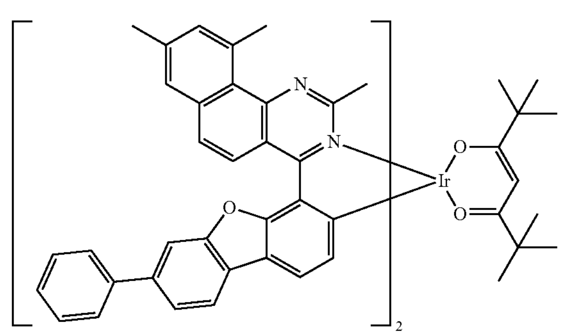

516
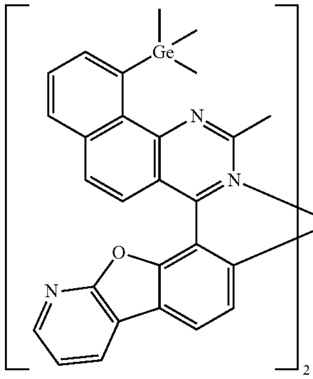
517
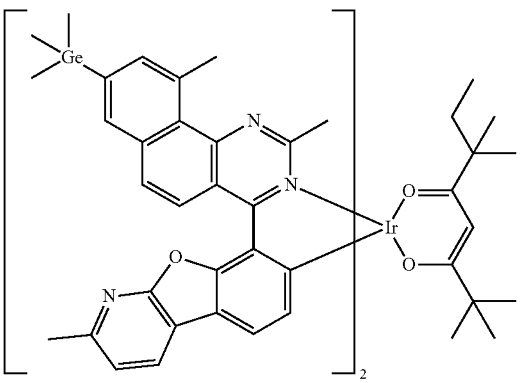
518
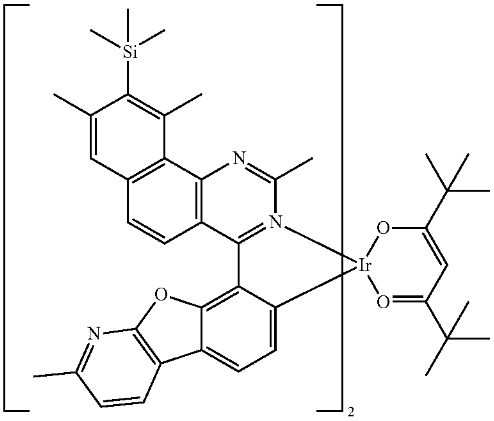
519
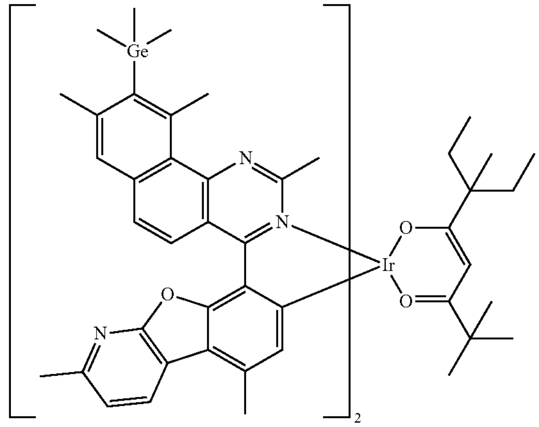
520
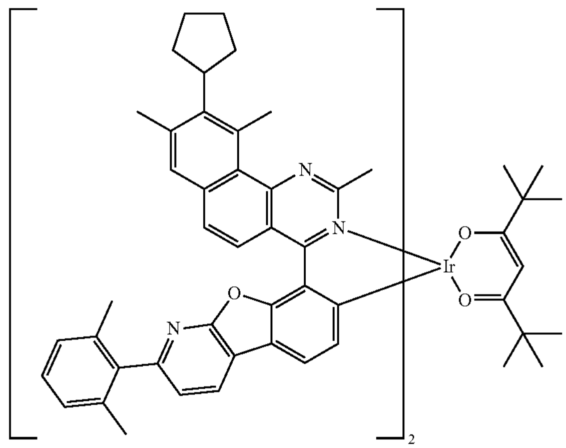
521
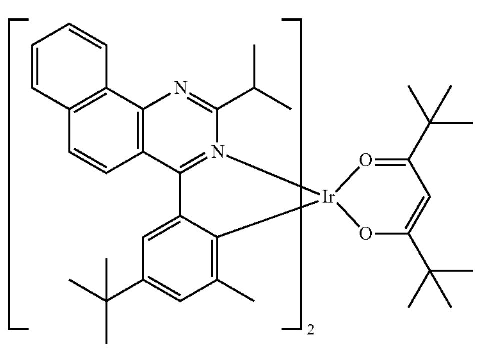

-continued
522
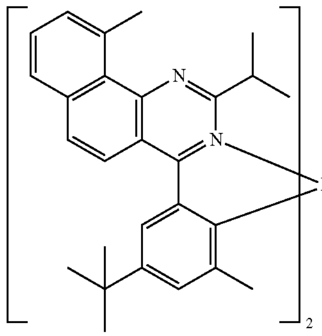
523
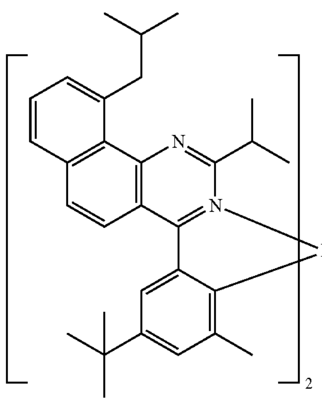
524
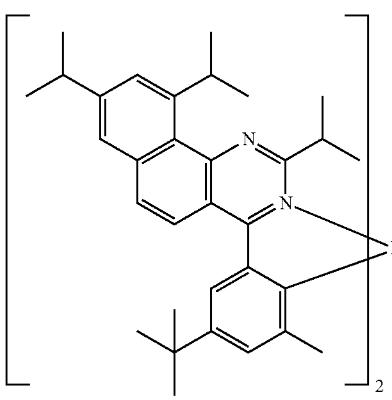
525
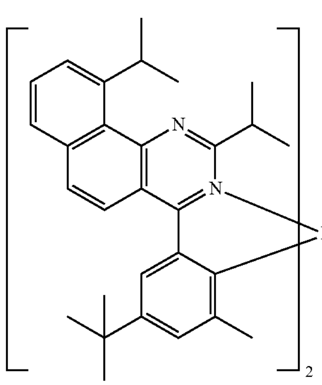
-continued
526
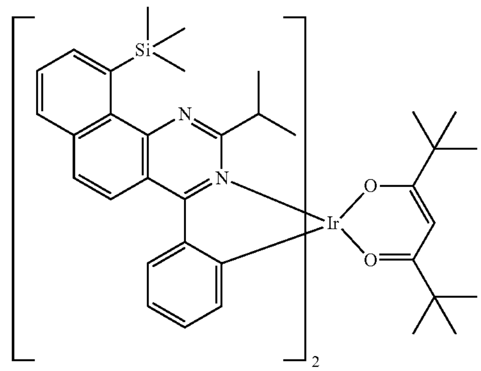
527
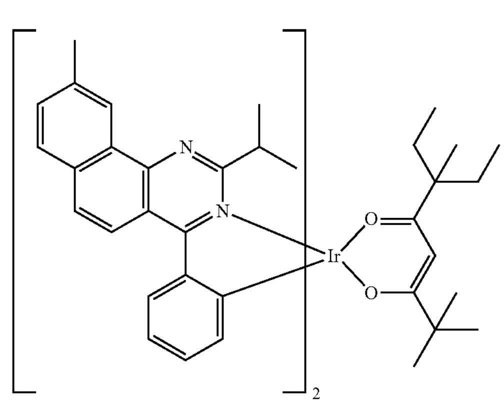
528
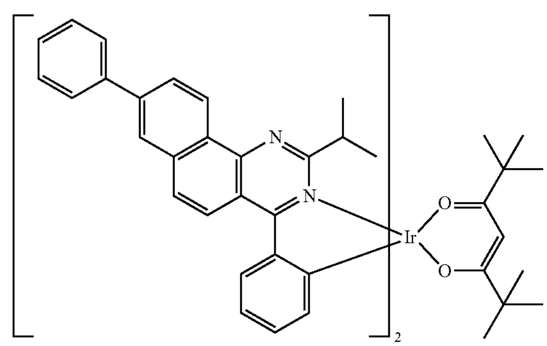
529
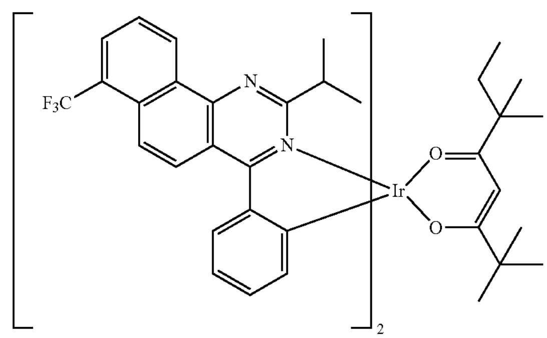

-continued
530
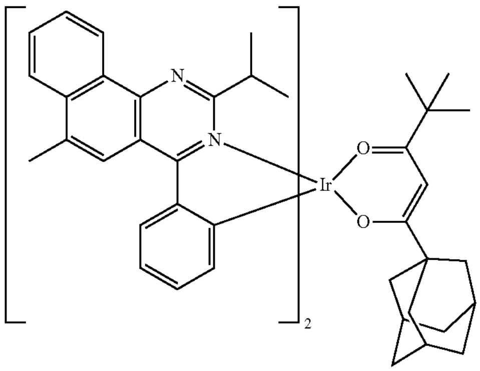
531
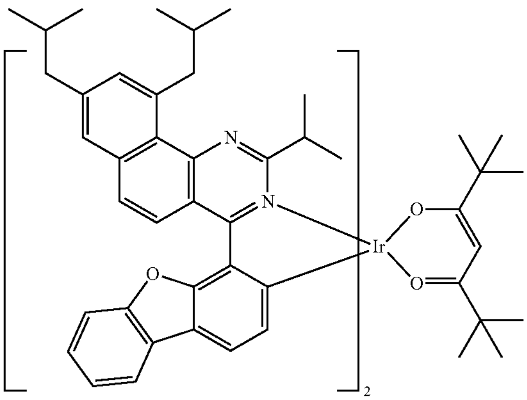
532
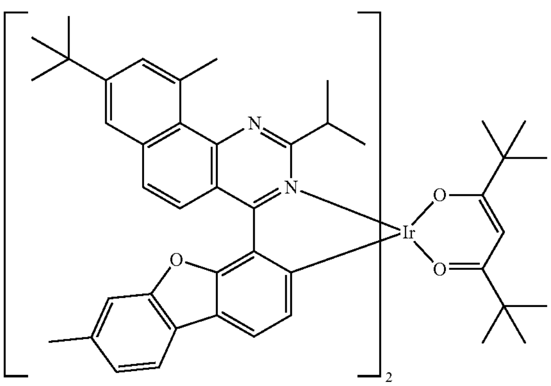
533
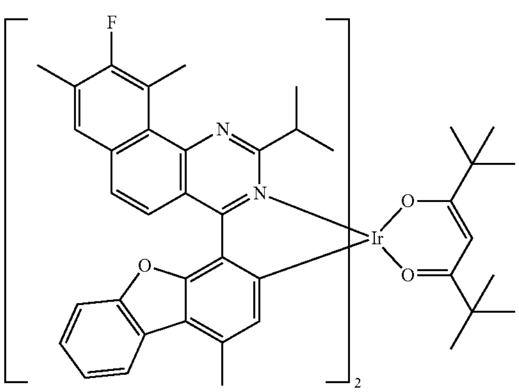
-continued
534
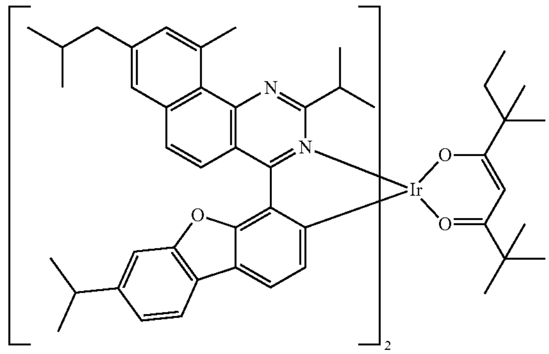
535
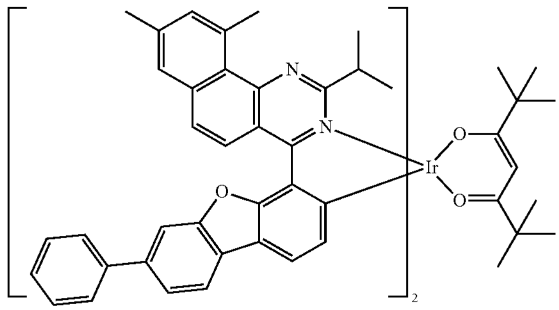
536
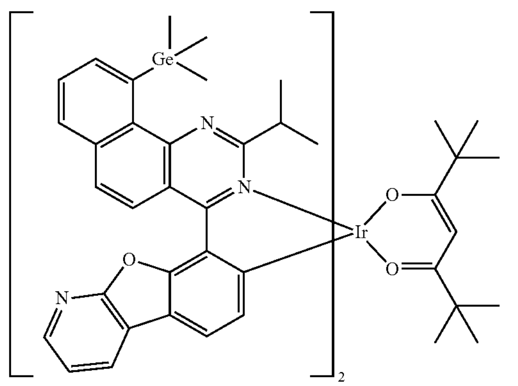
537
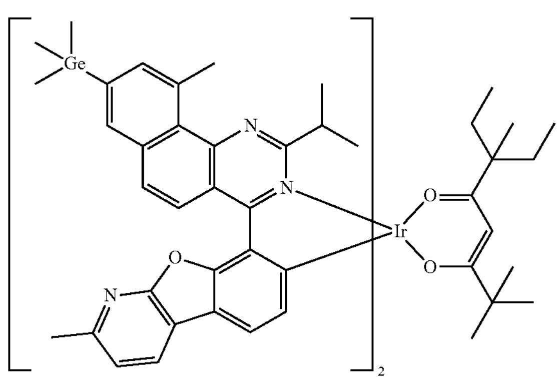

-continued
538
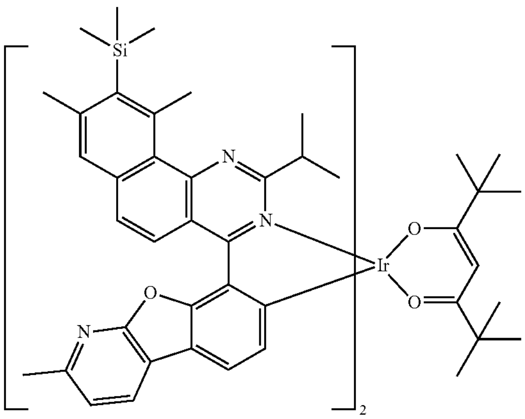
539
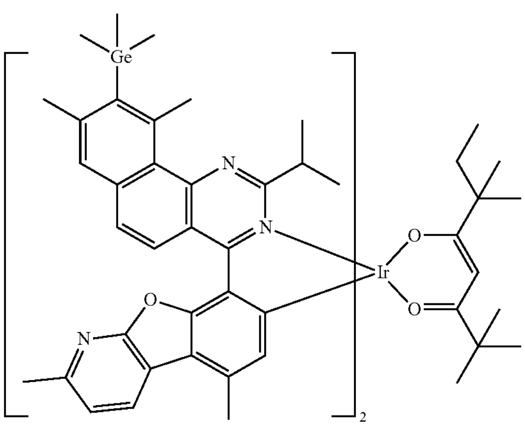
540
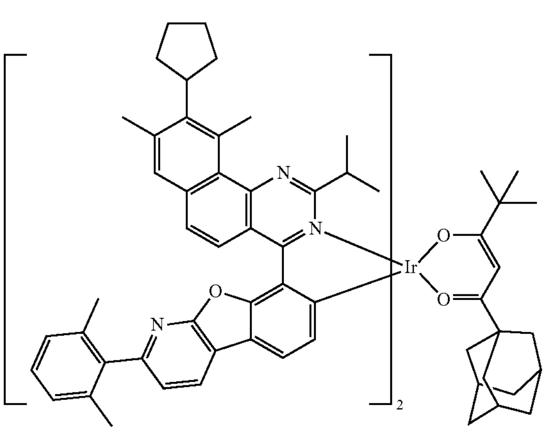
-continued
541
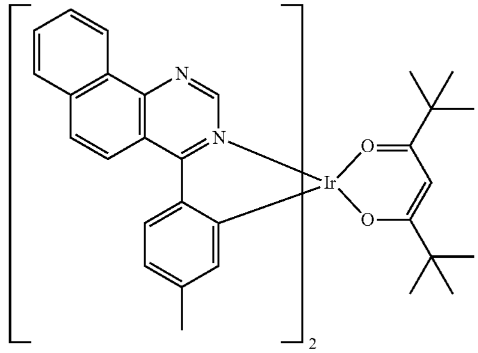
542
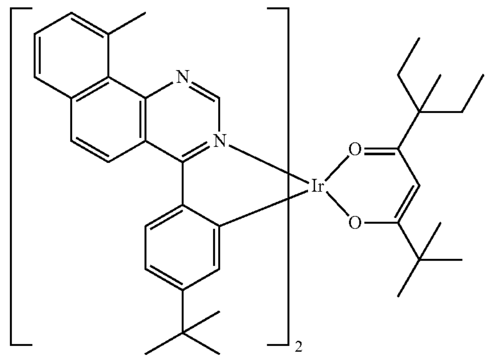
543
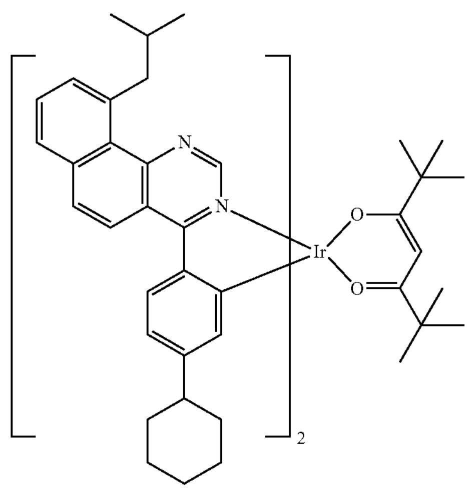
544
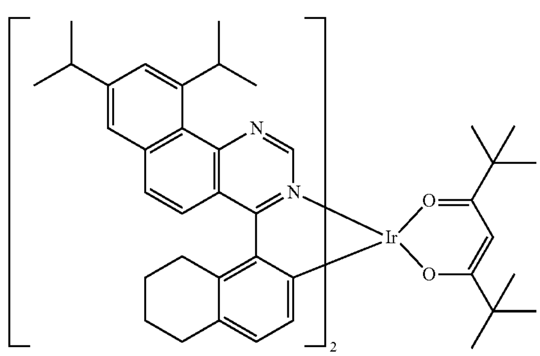

-continued
545
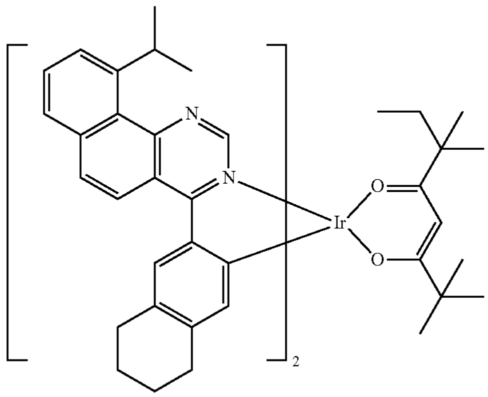
546
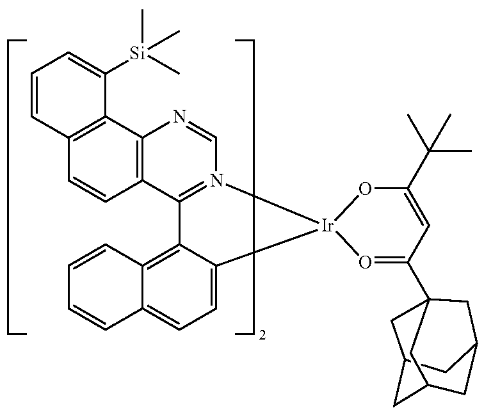
547
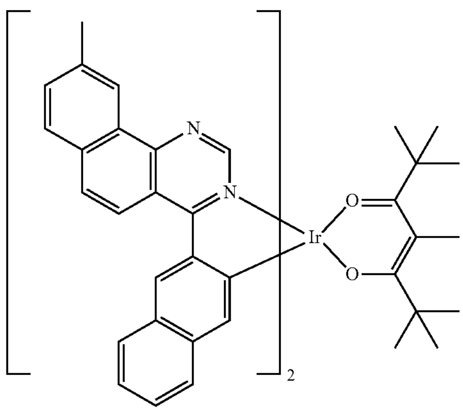
548
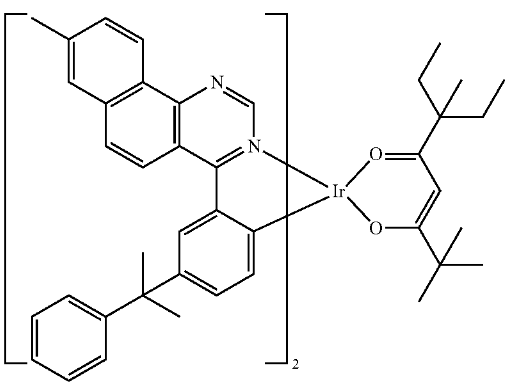
-continued
549
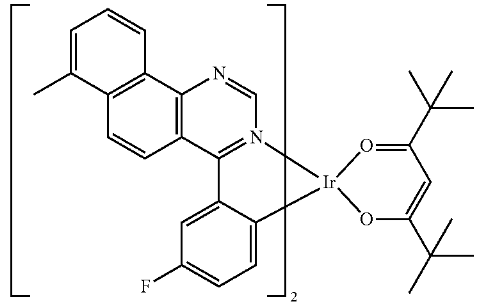
550
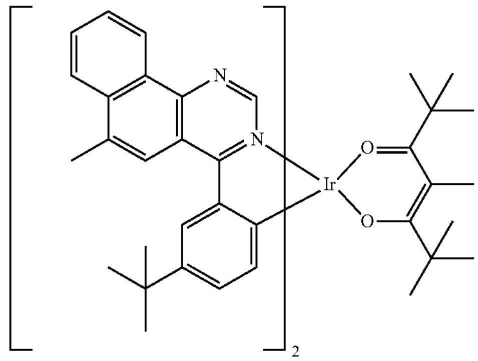
551
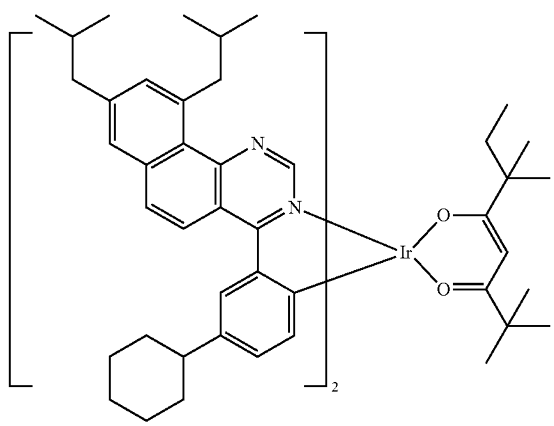
552
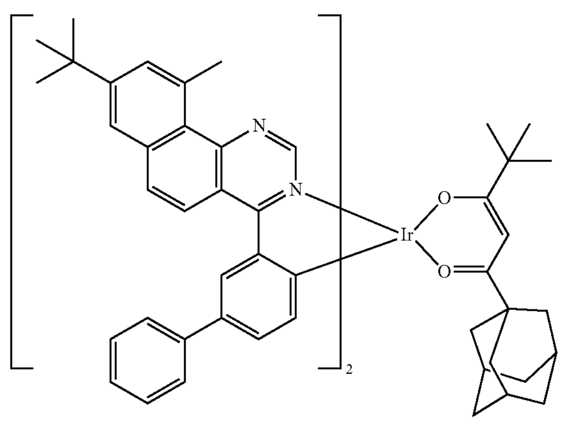

-continued
553
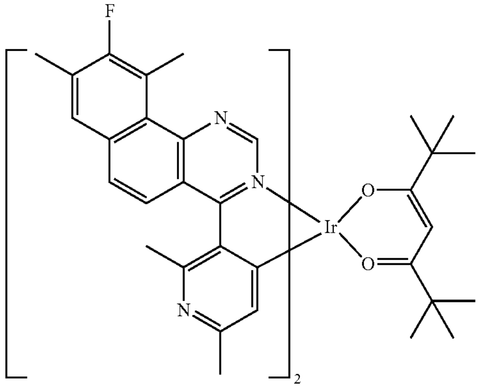
554
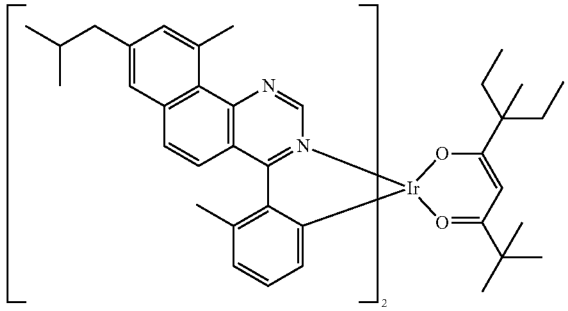
555
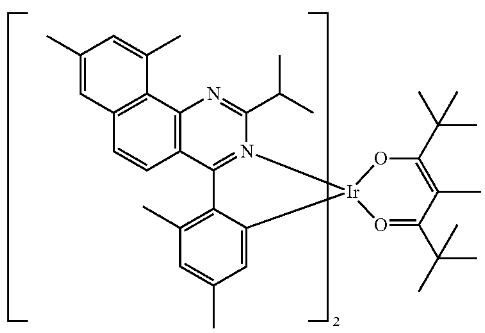
556
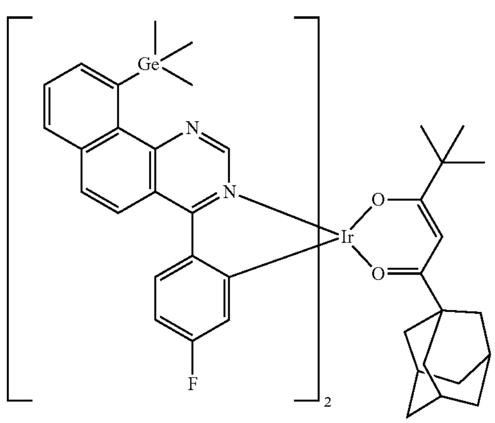
-continued
557
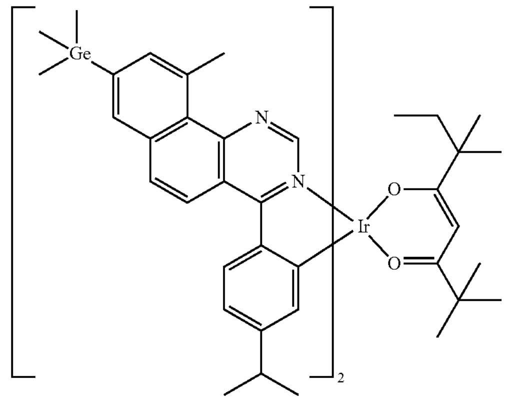
558
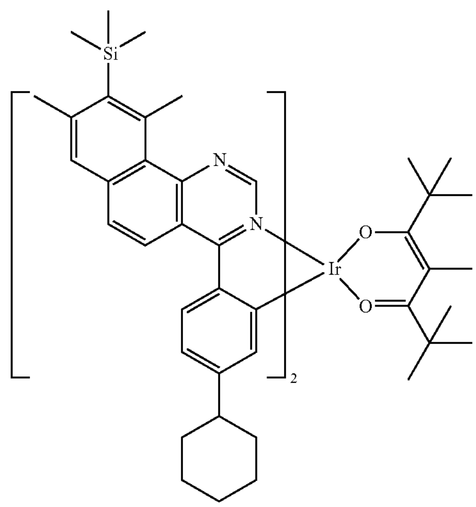
559
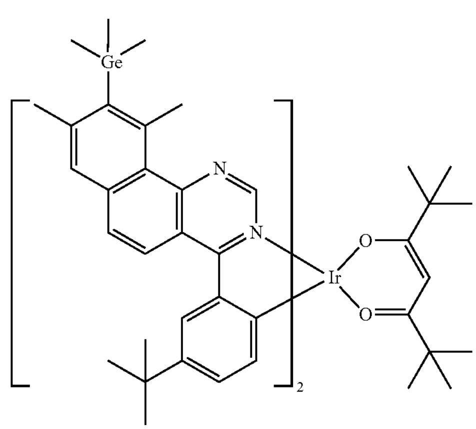

-continued
560
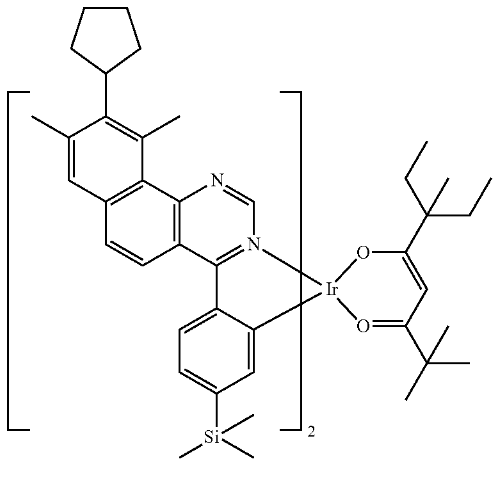
561
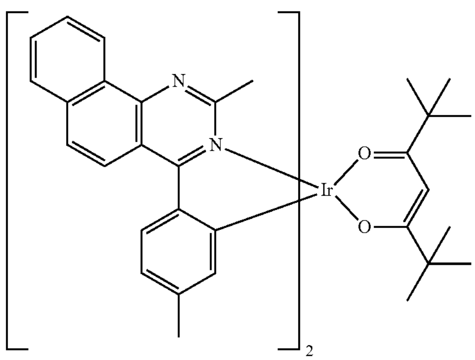
562
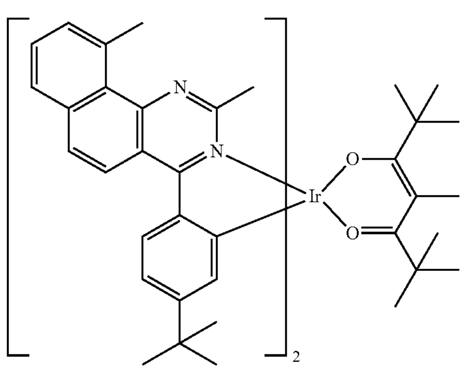
-continued
563
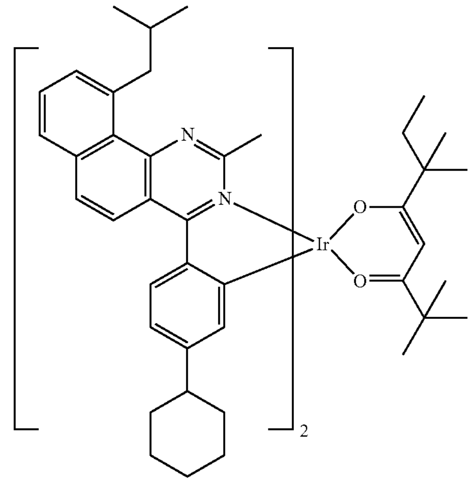
564
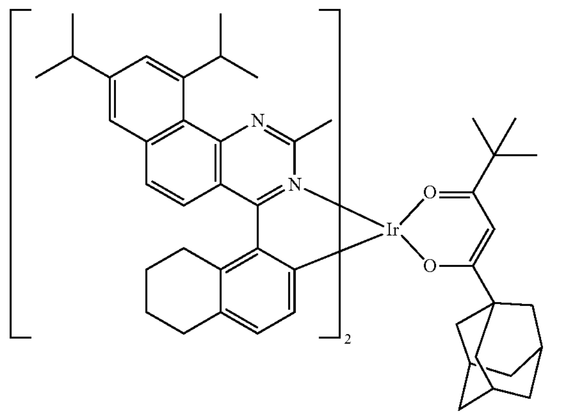
565
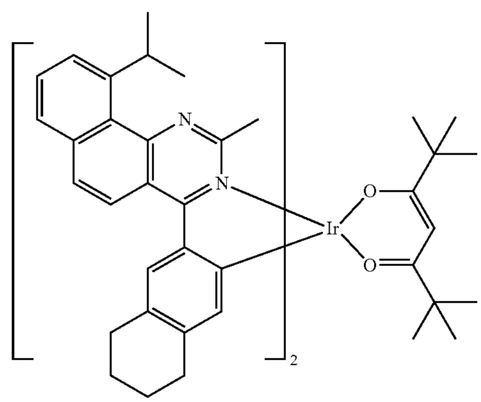
566
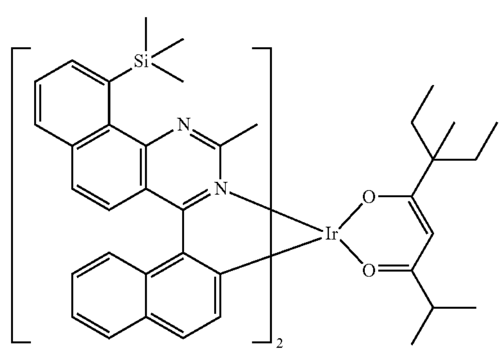

-continued
567
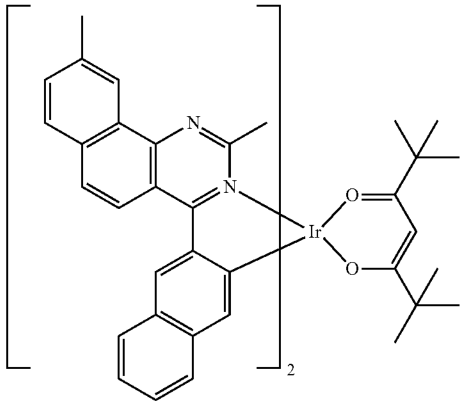
568
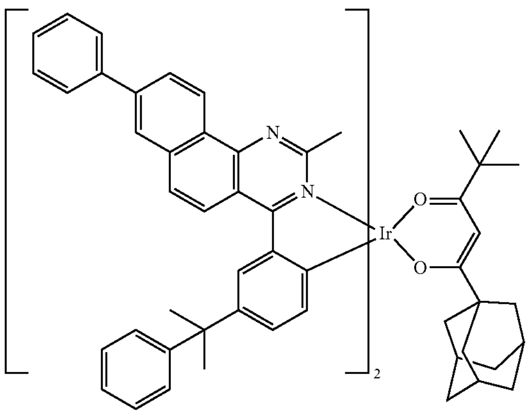
569
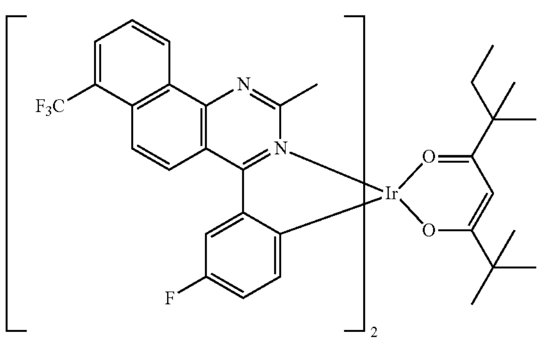
570
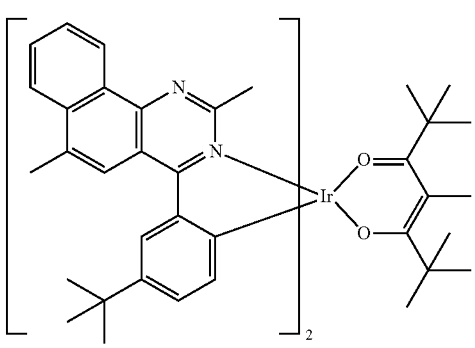
-continued
571
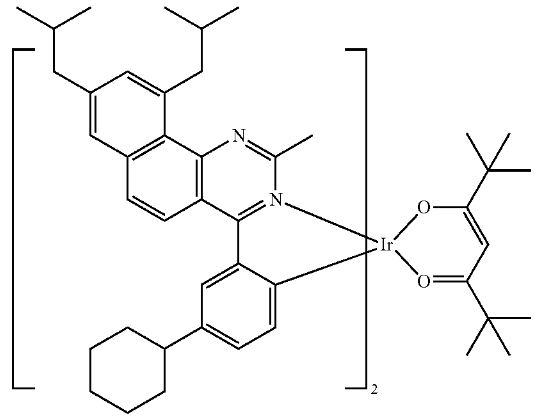
572
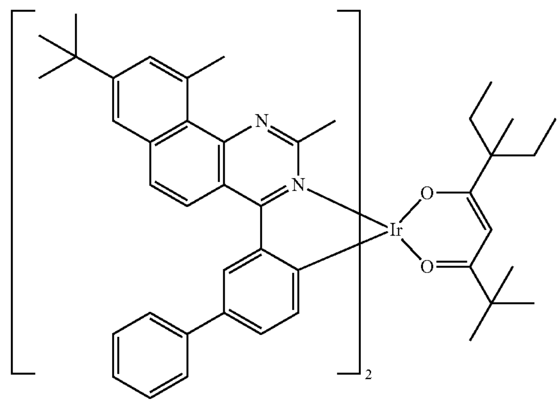
573
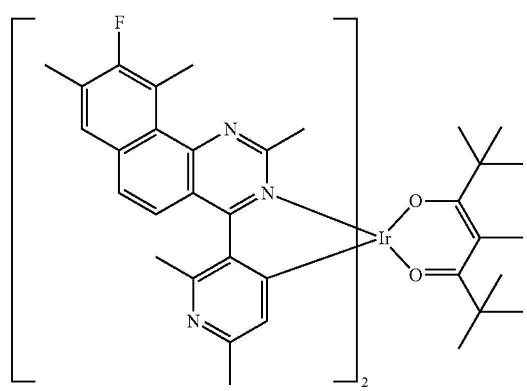
574
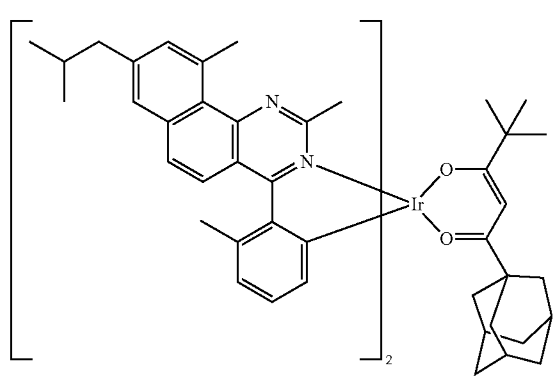

-continued
575
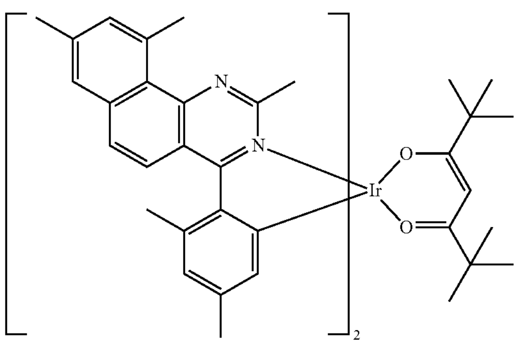
576
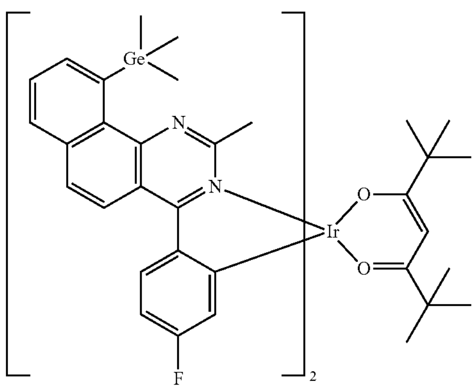
577
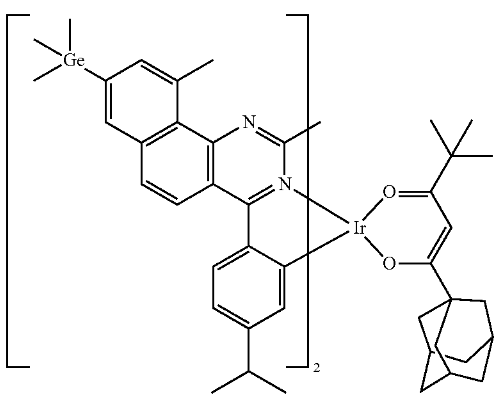
-continued
578
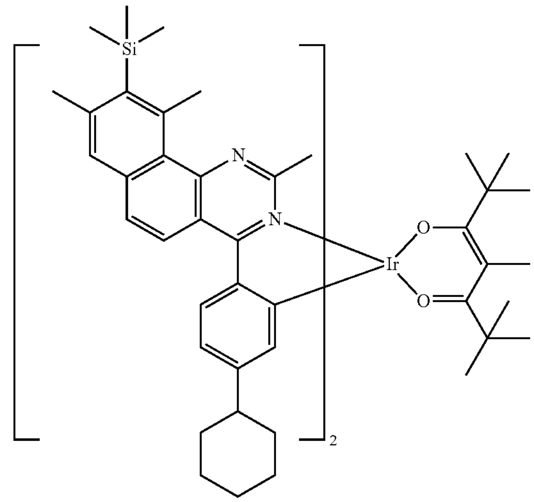
579
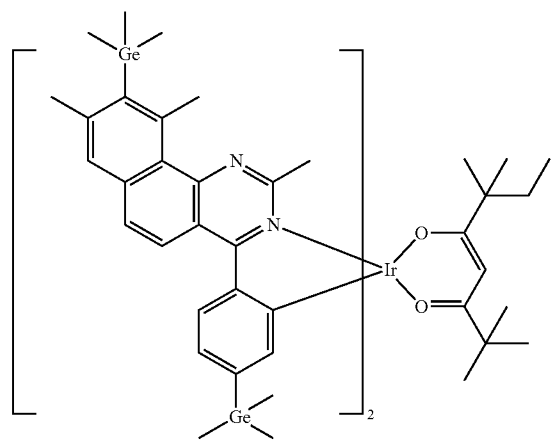
580
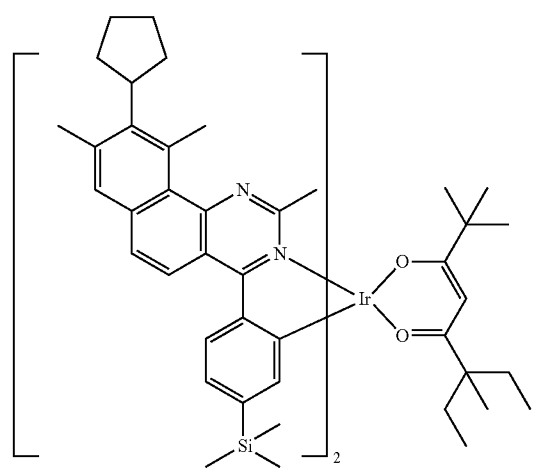

-continued
581
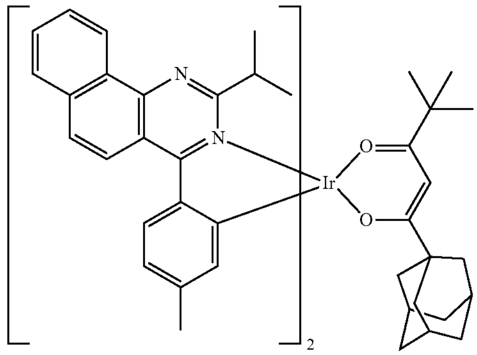
582
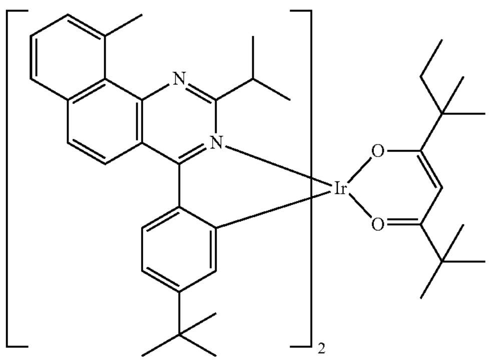
583
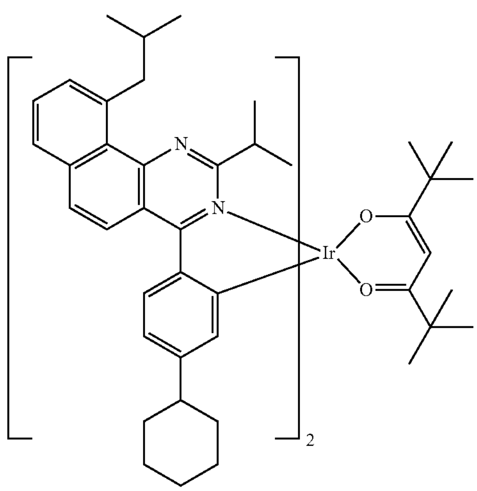
584
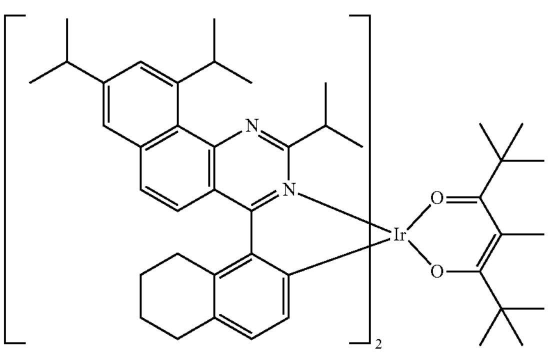
-continued
585
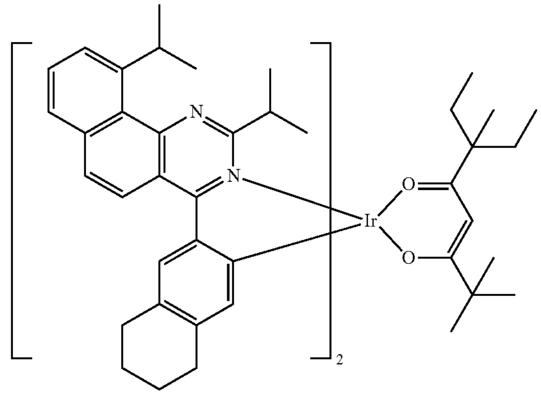
586
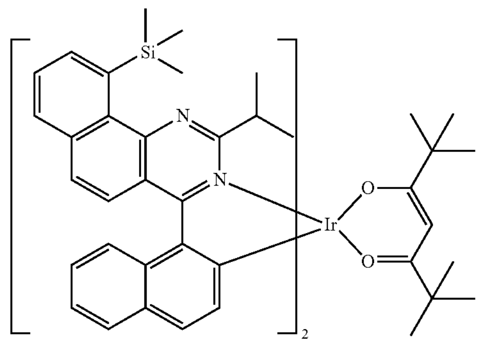
587
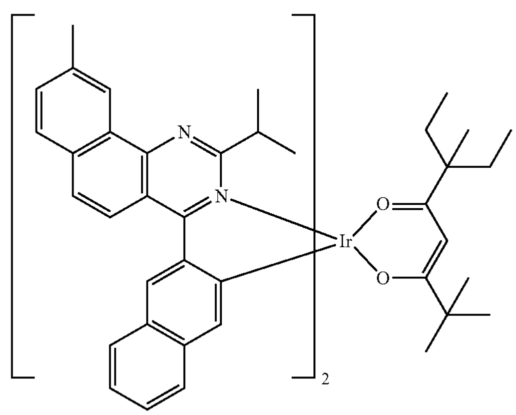
588
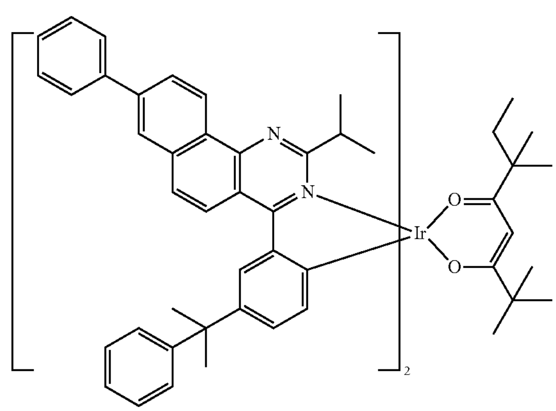

589
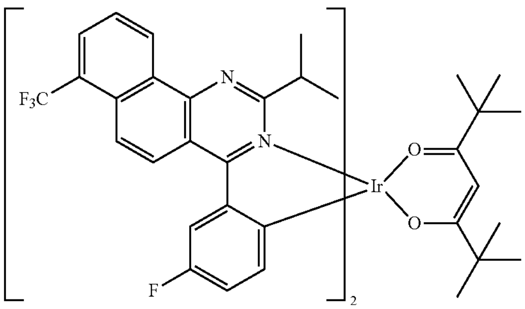
590
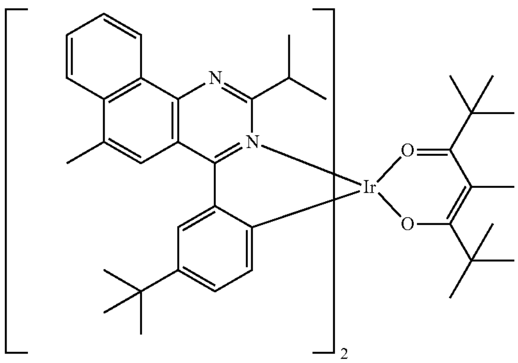
591
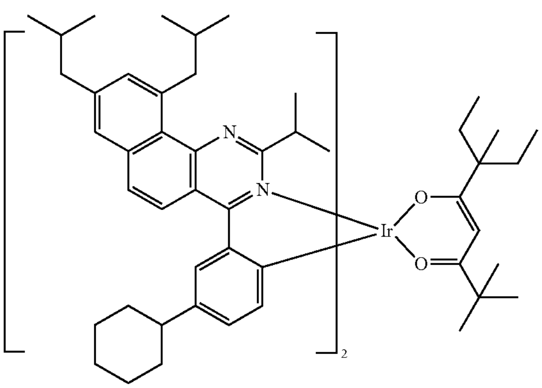
592
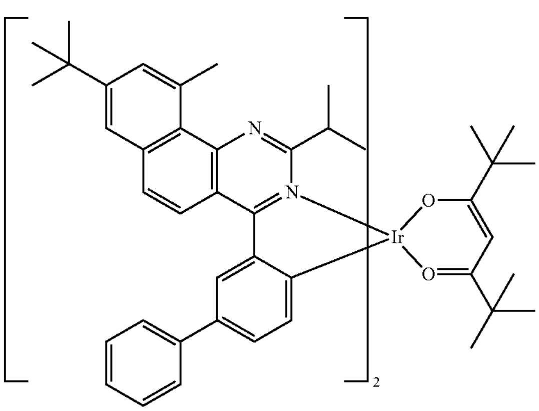
593
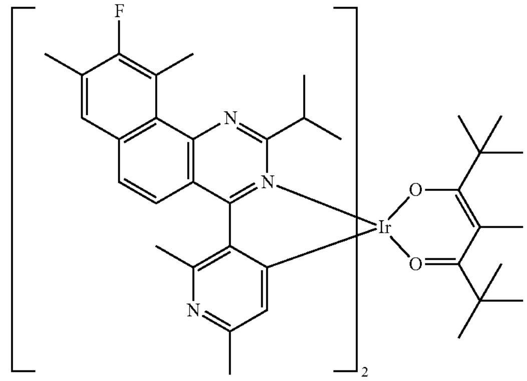
594
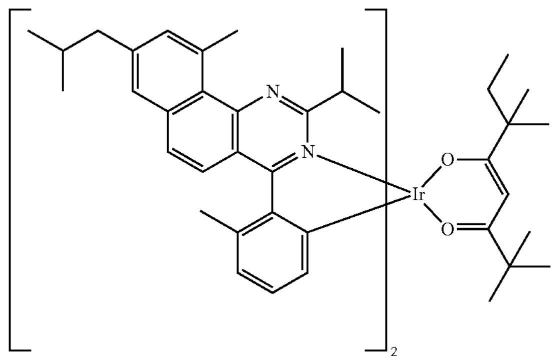
595
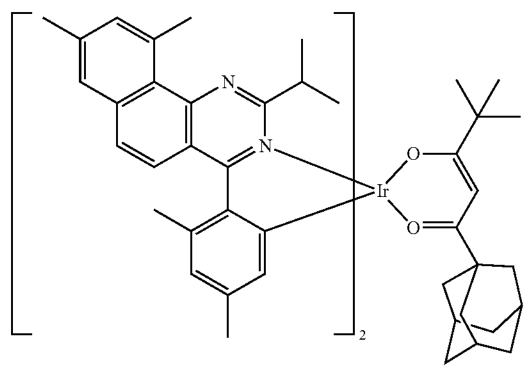
596
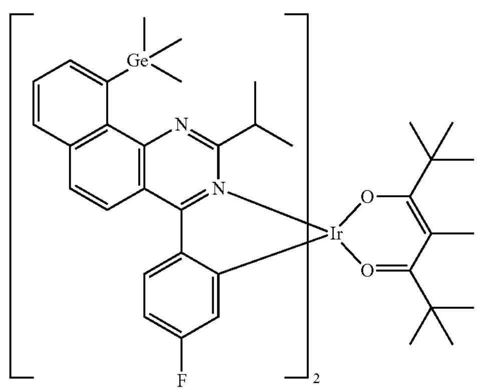

-continued
597
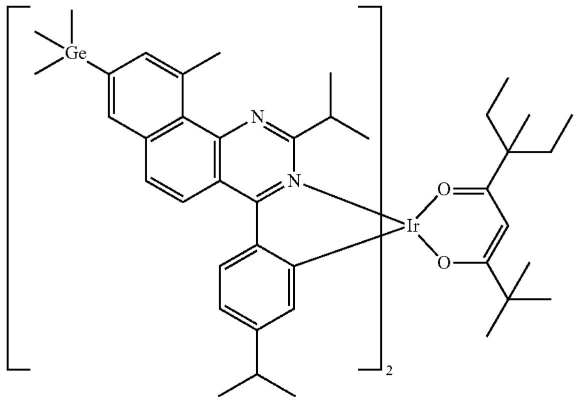
598
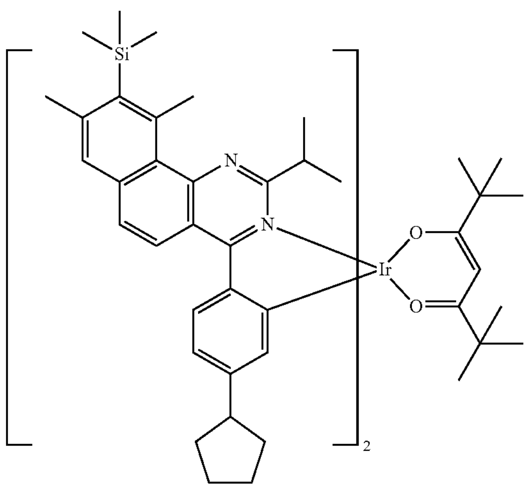
599
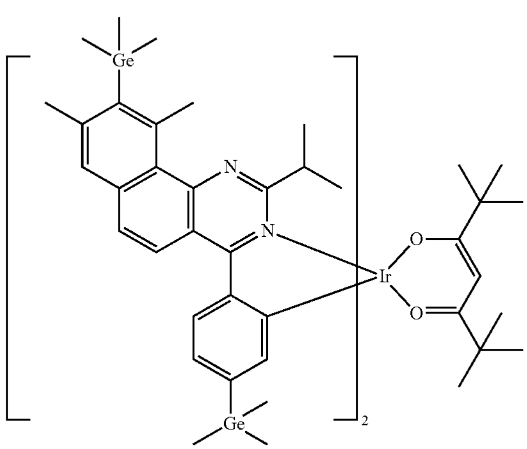
-continued
600
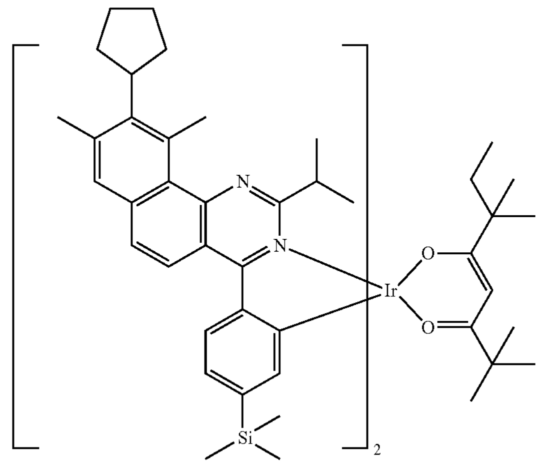
601
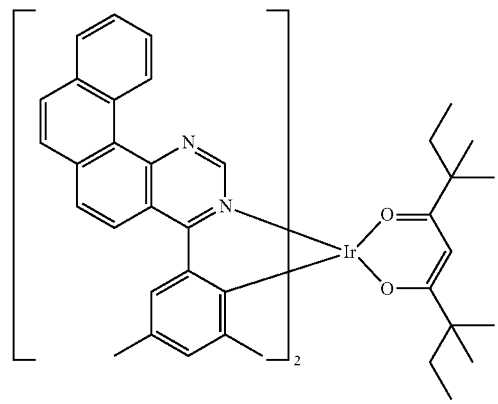
602
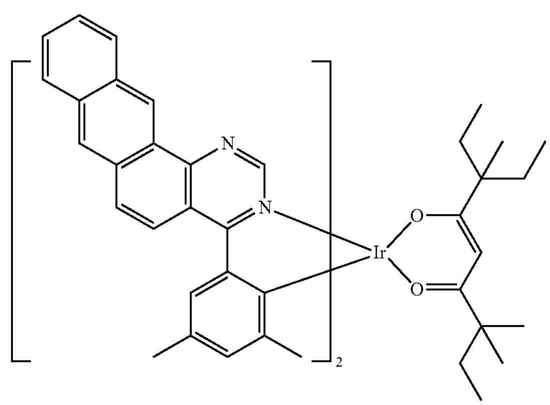
603
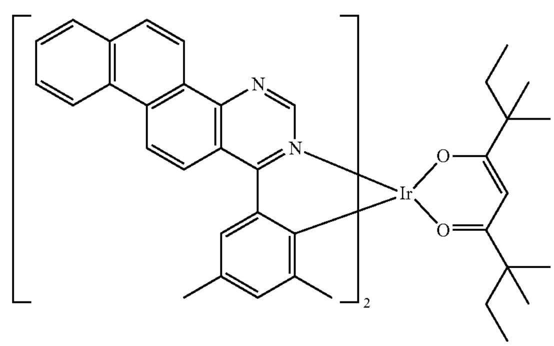

604
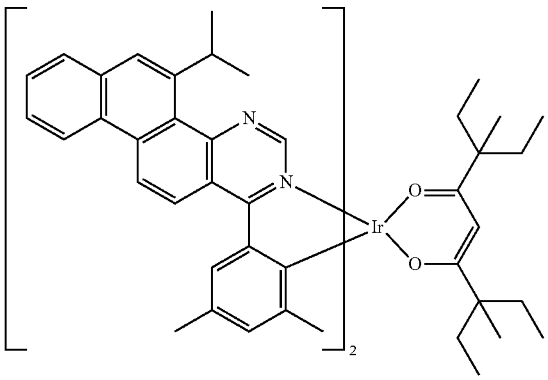
605
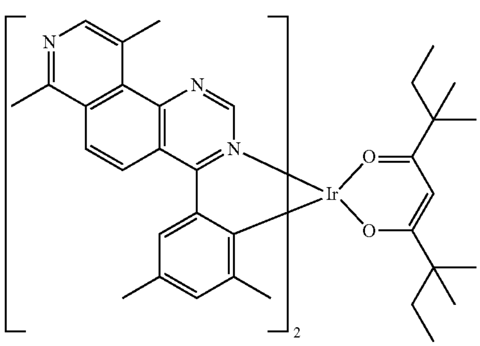
606
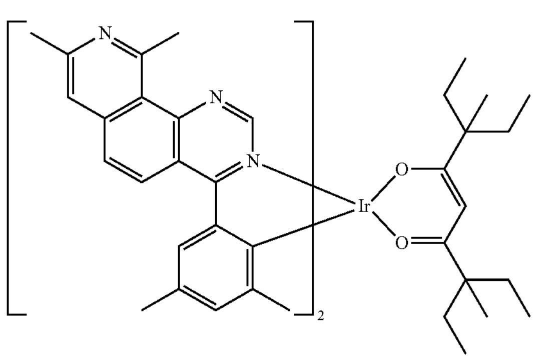
607
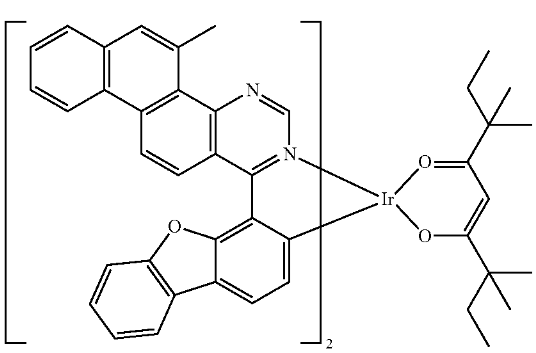
608
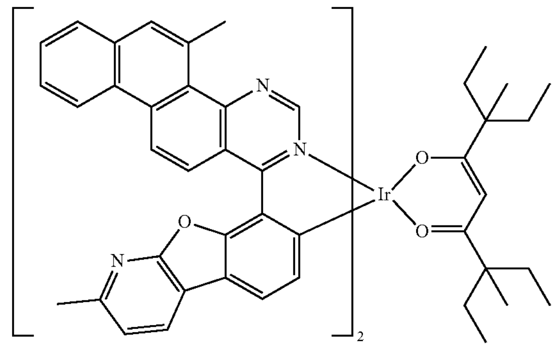
609
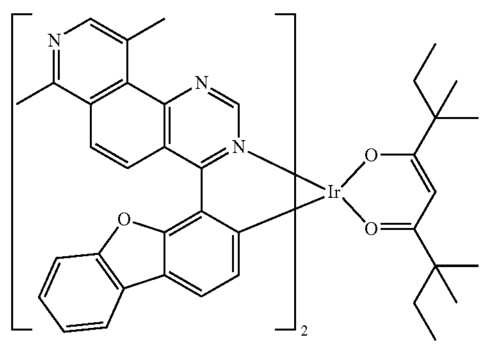
610
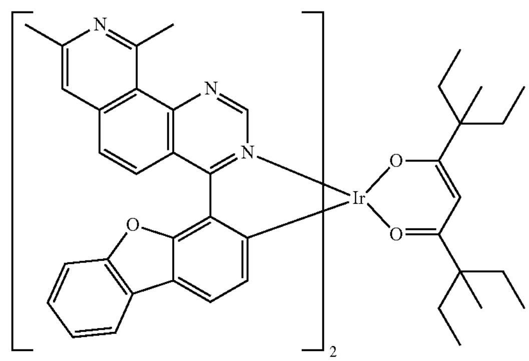
611
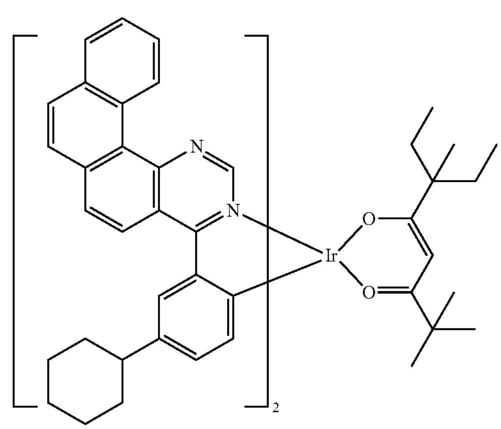

-continued
612
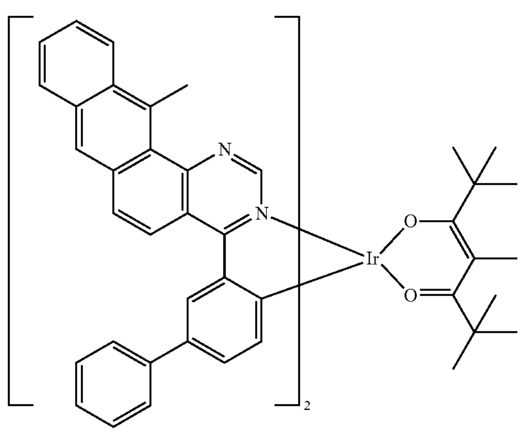
613
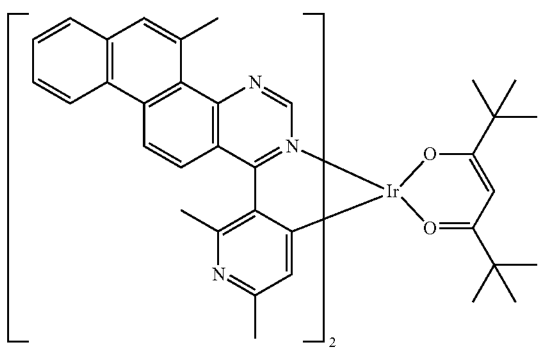
614
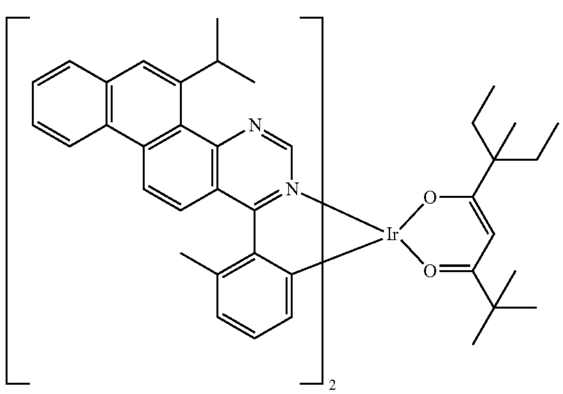
615
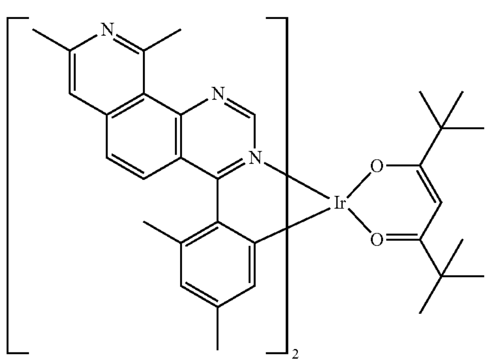
-continued
616
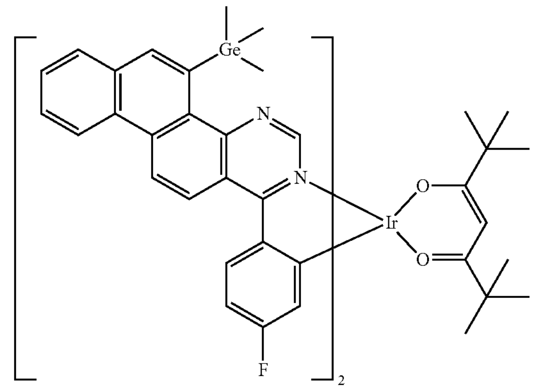
617
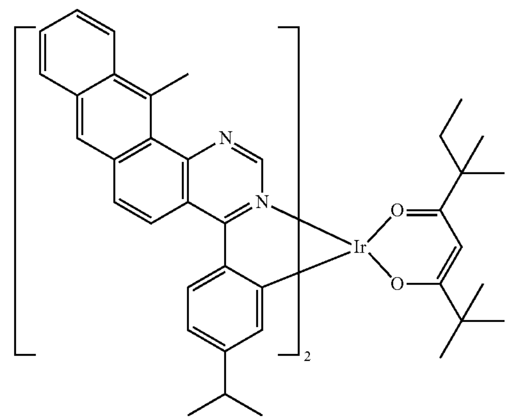
618
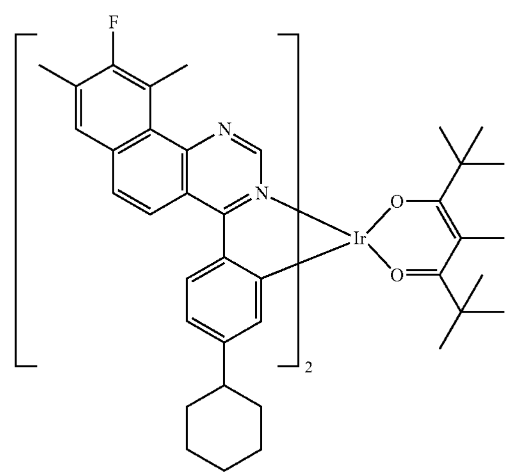

-continued
619
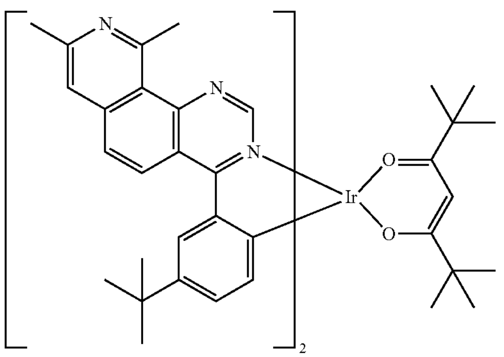
620
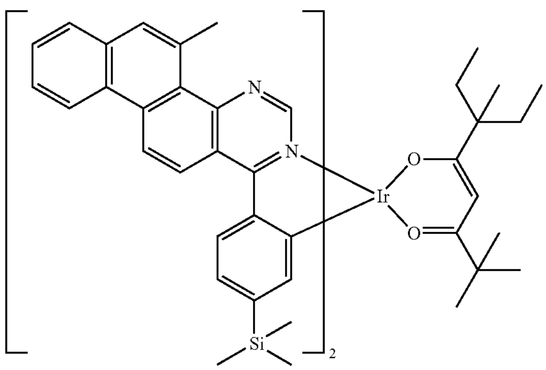
621
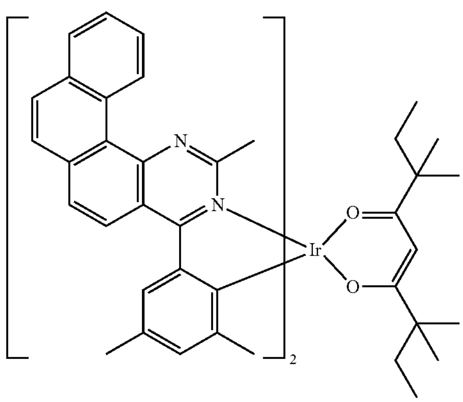
622
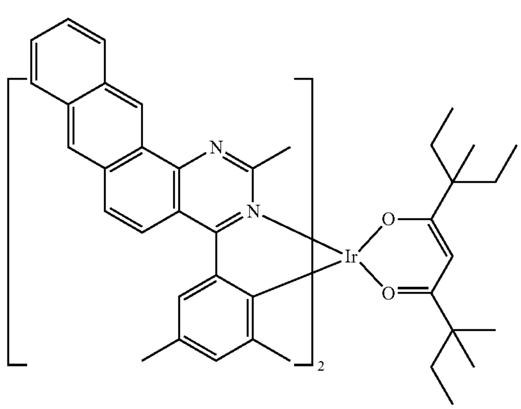
-continued
623
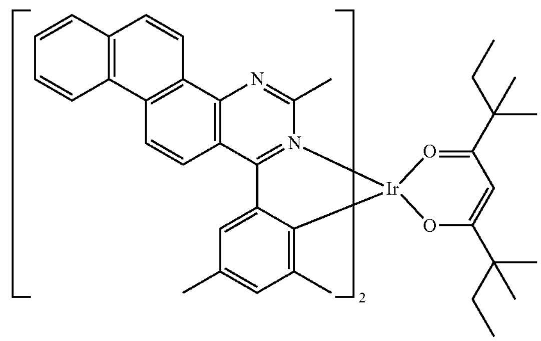
624
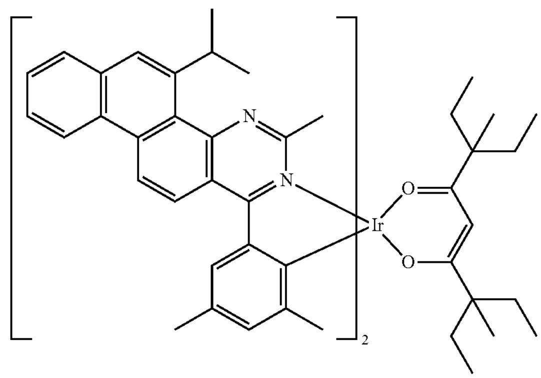
625
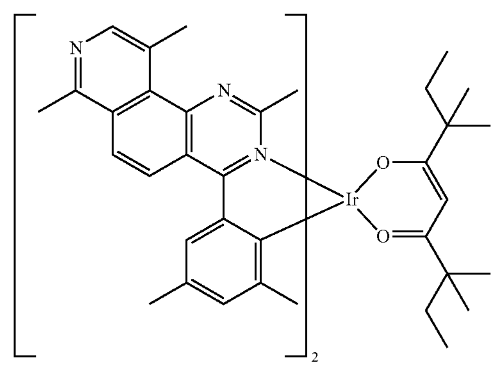
626
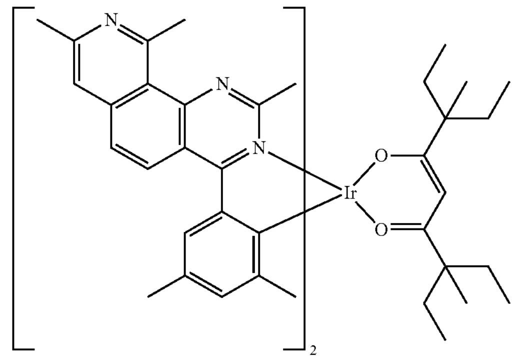

-continued
627
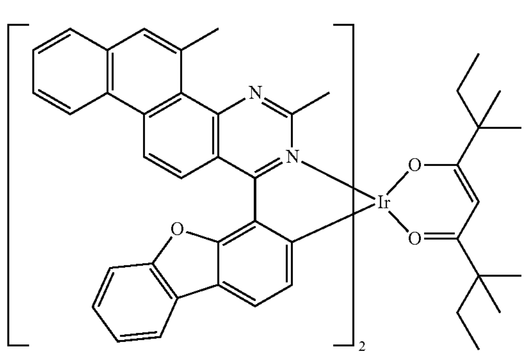
628
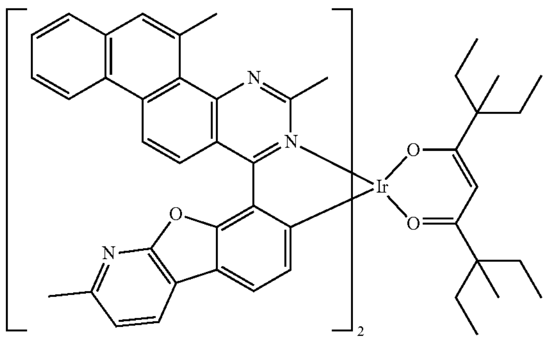
629
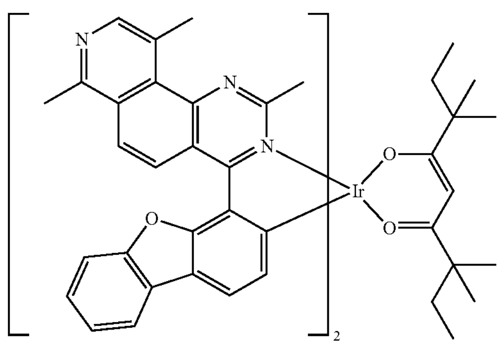
630
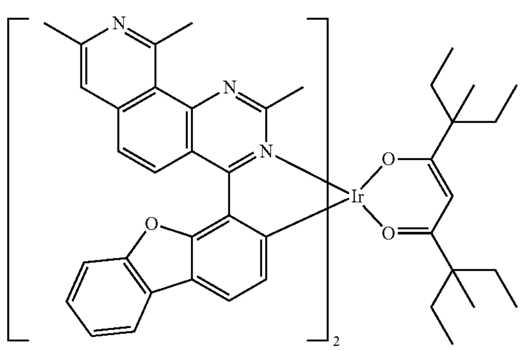
-continued
631
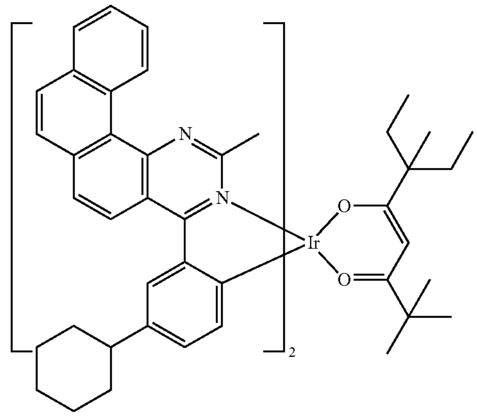
632
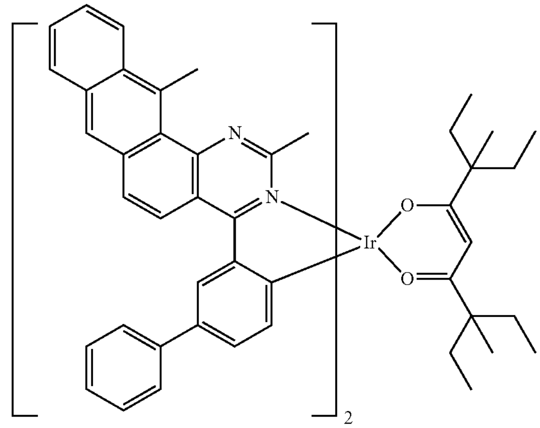
633
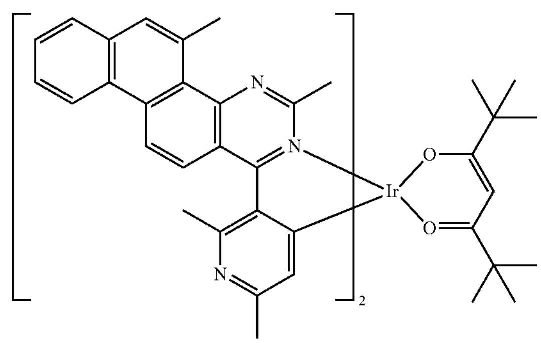
634
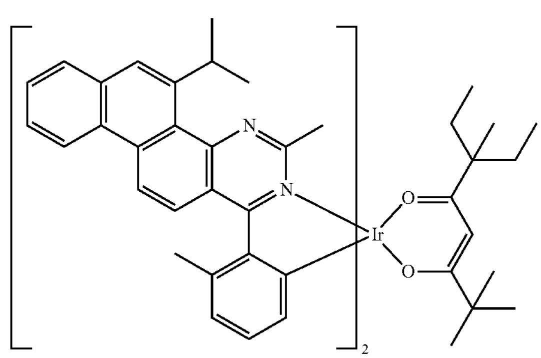

-continued
635
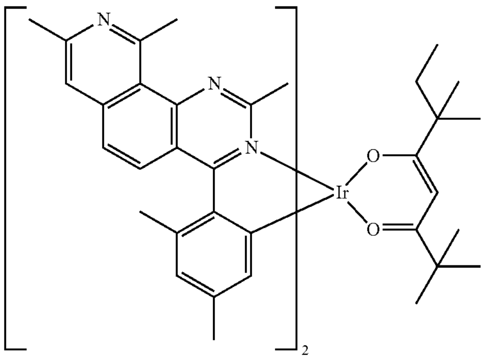
636
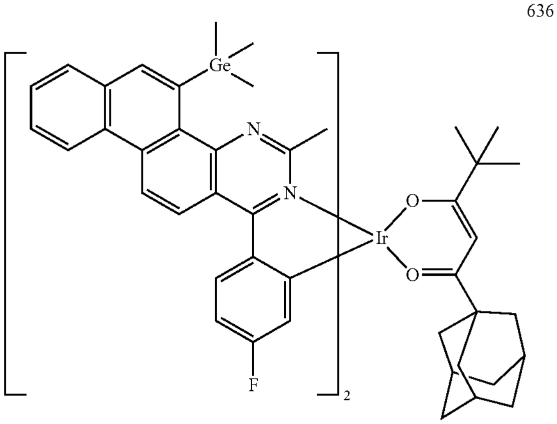
637
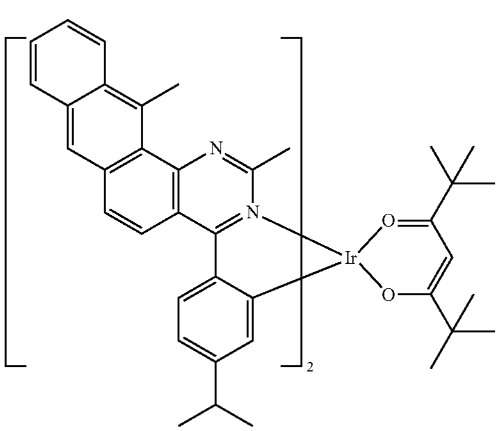
-continued
638
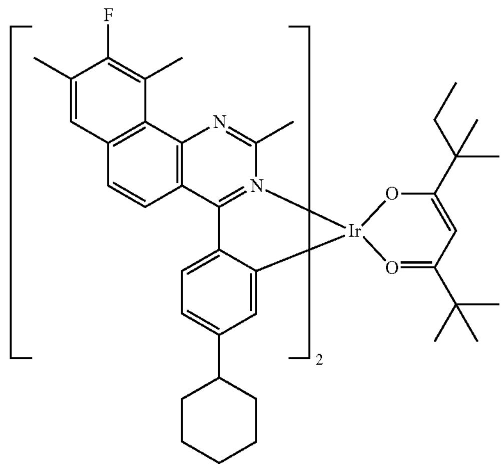
639
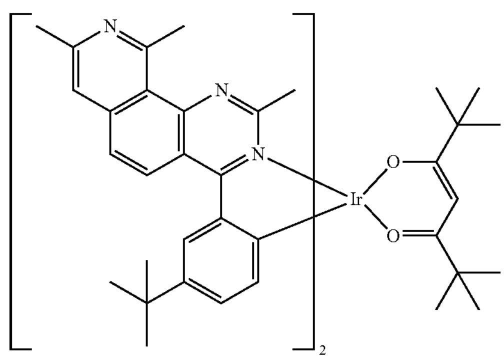
640
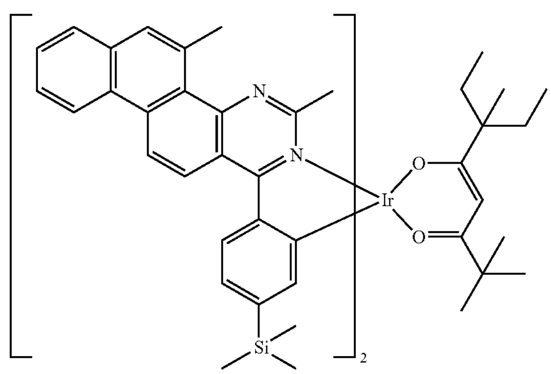
641
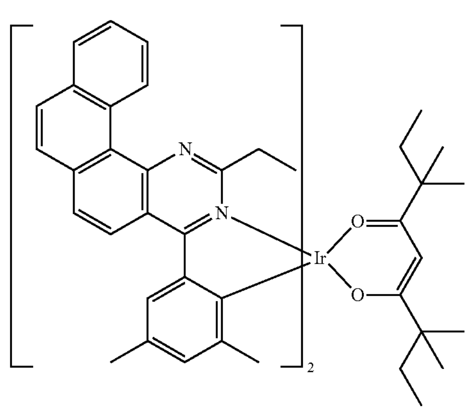

642
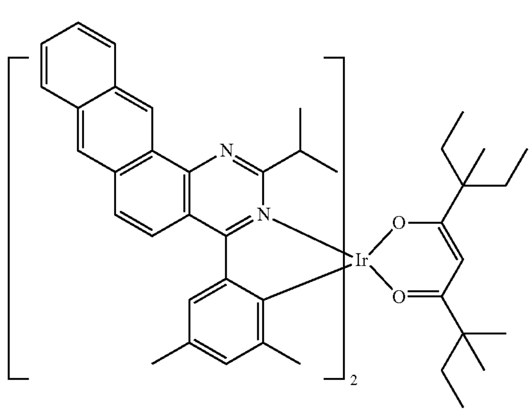
643
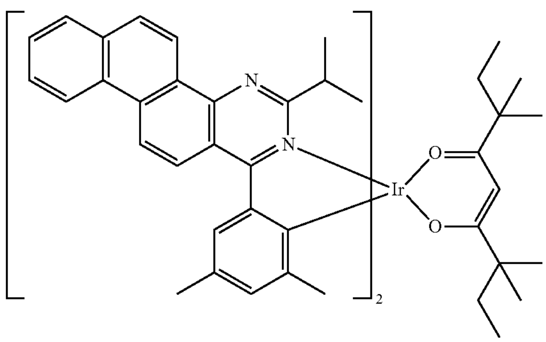
644
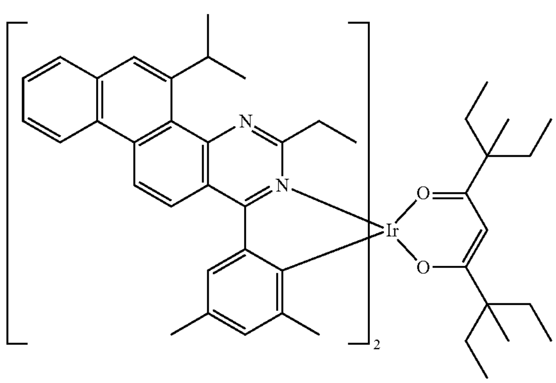
645
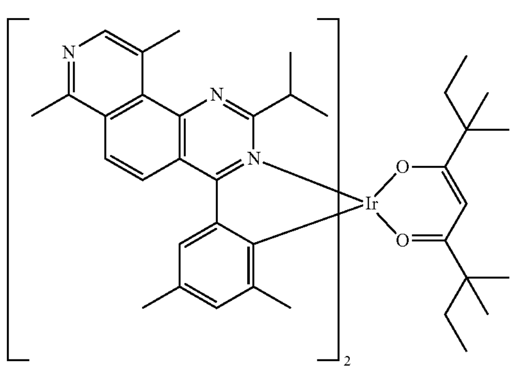
646
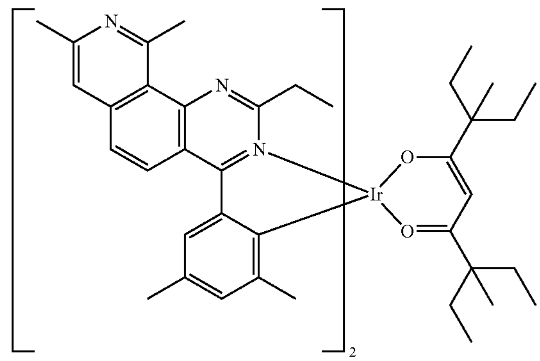
647
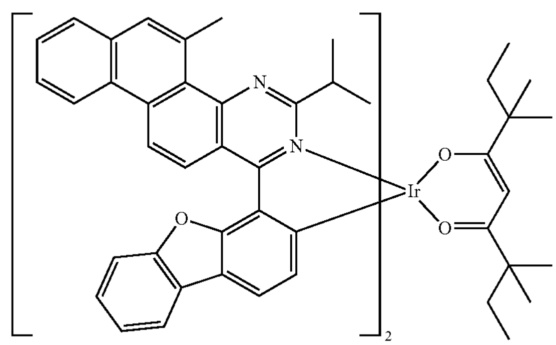
648
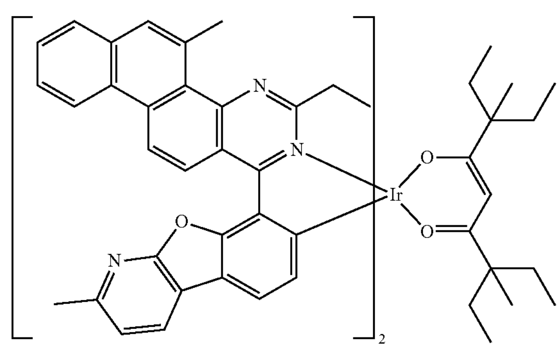
649
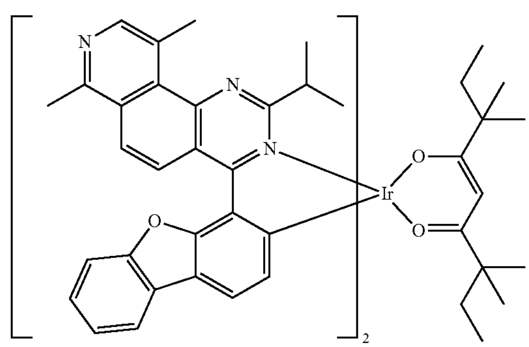

-continued
650
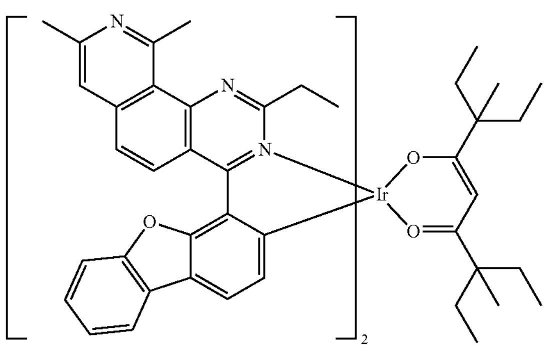
651
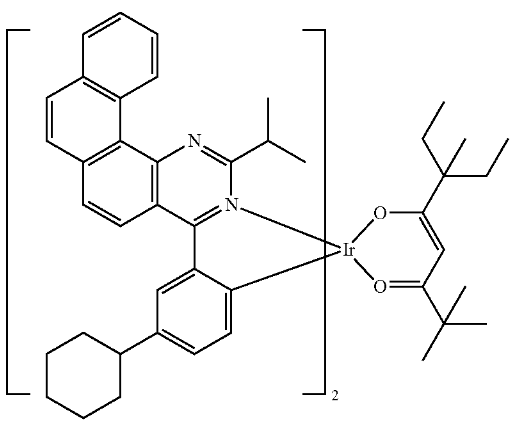
652
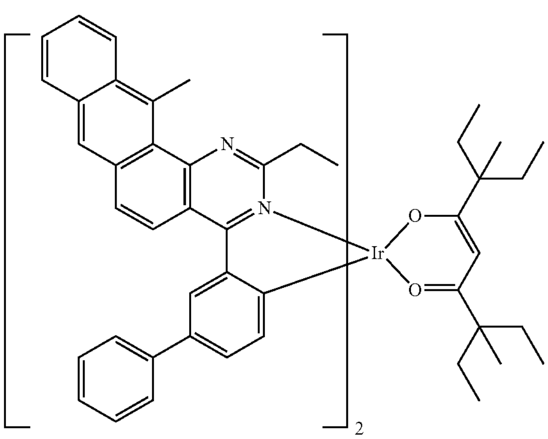
653
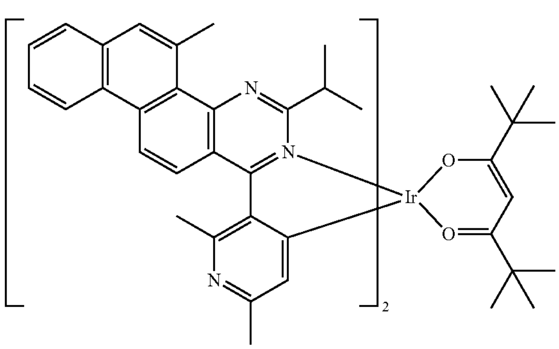
-continued
654
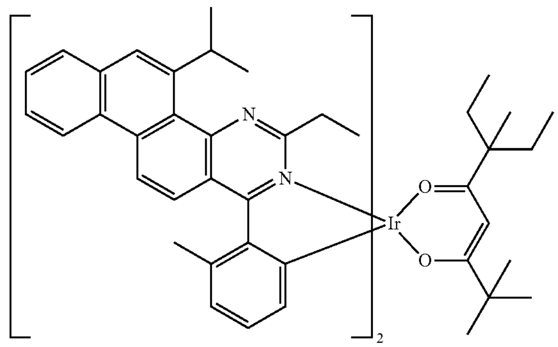
655
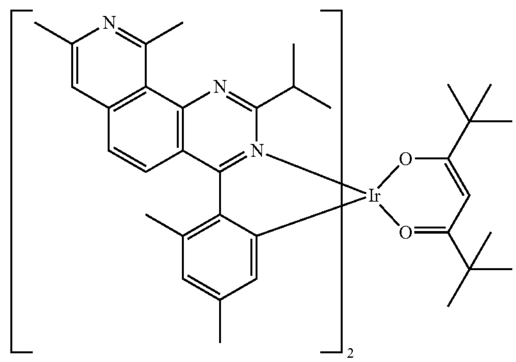
656
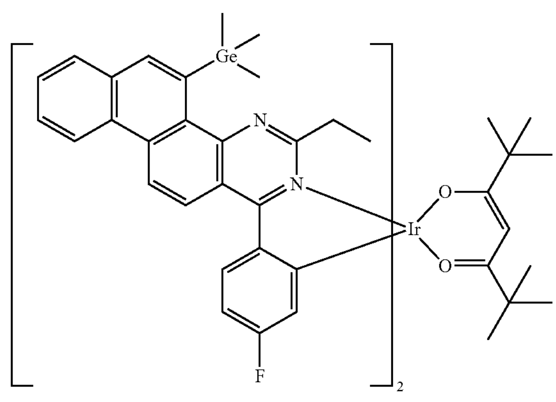
657
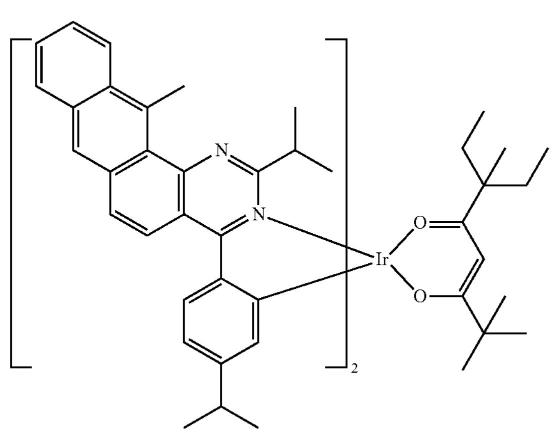

-continued
658
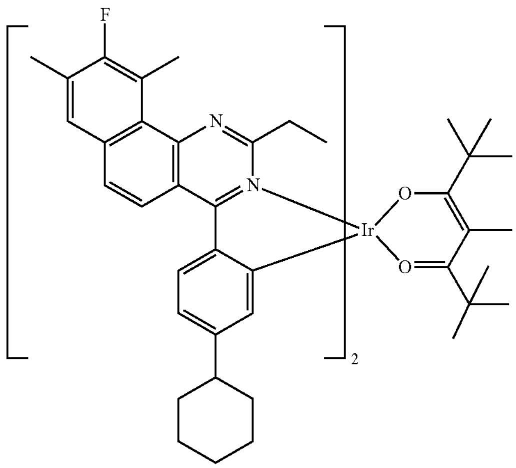
659
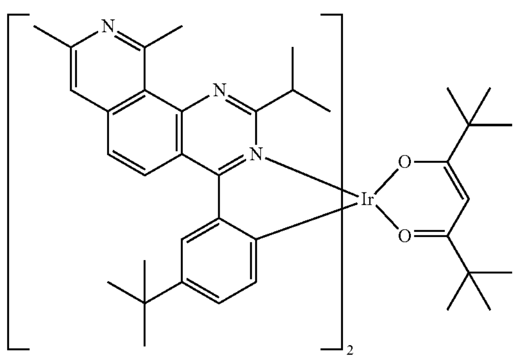
660
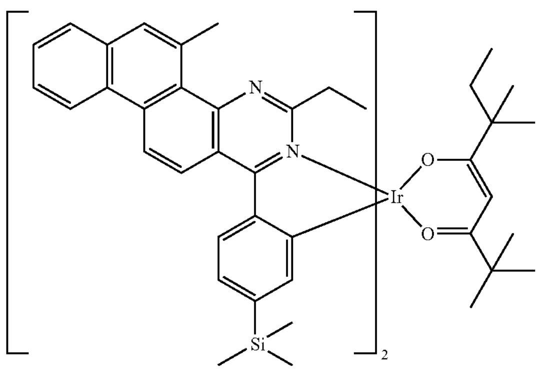
661
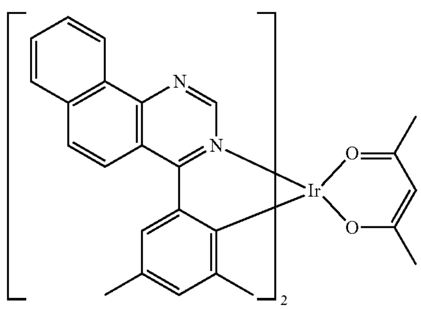
-continued
662
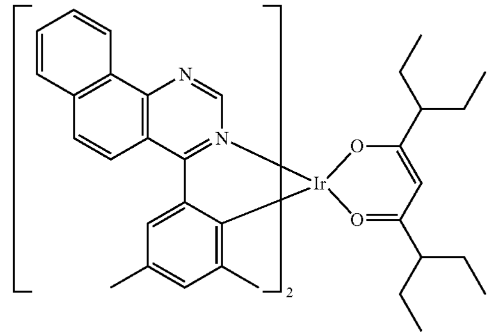
663
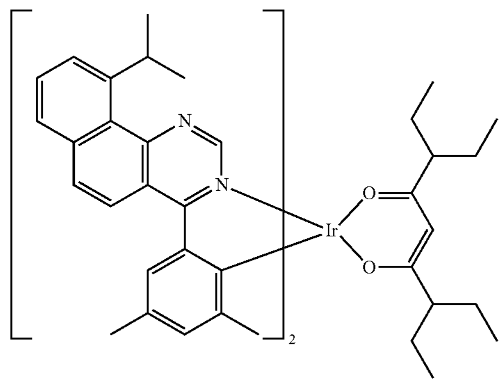
664
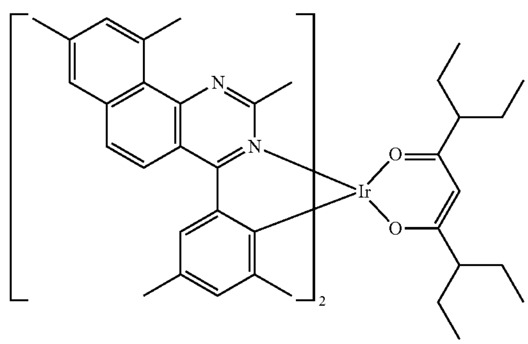
665
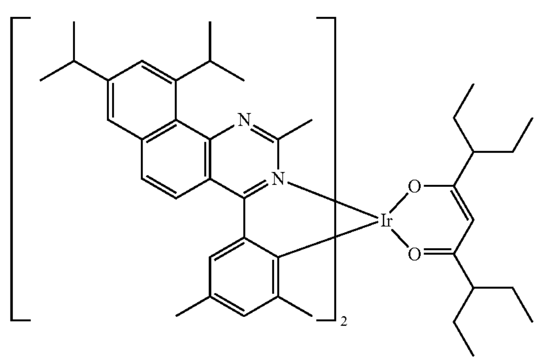

-continued
666
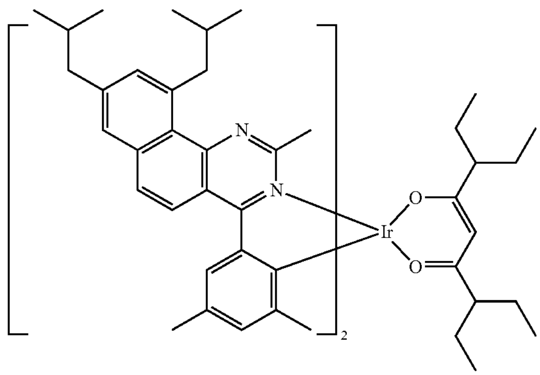
667
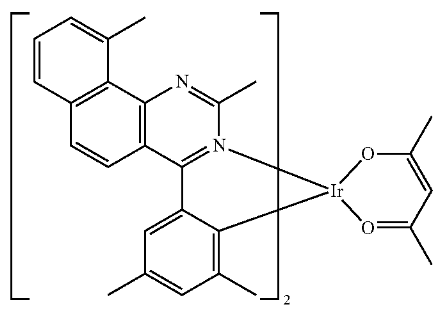
668
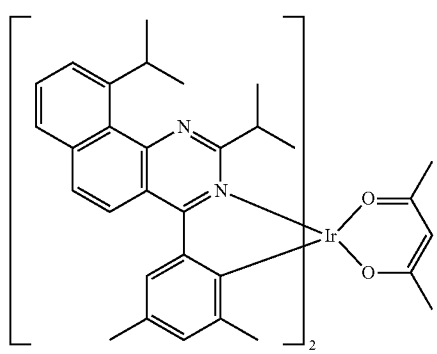
669
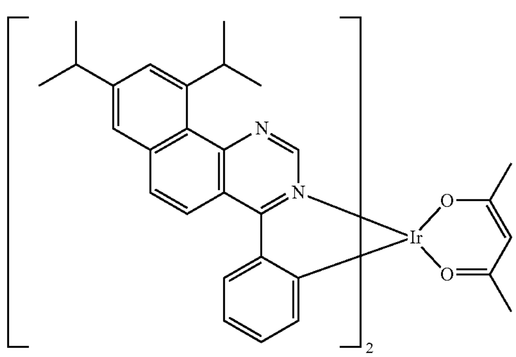
-continued
670
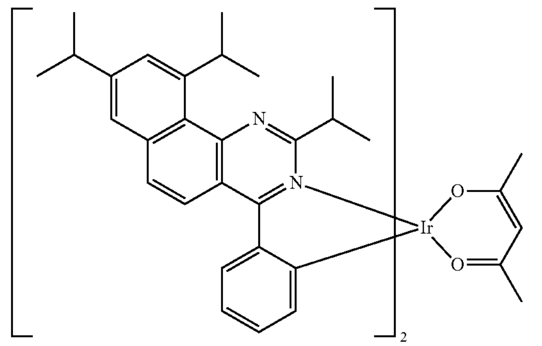
671
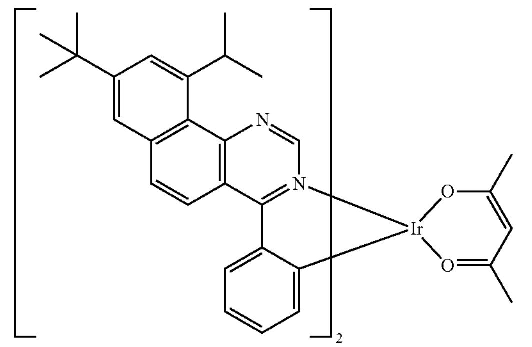
672
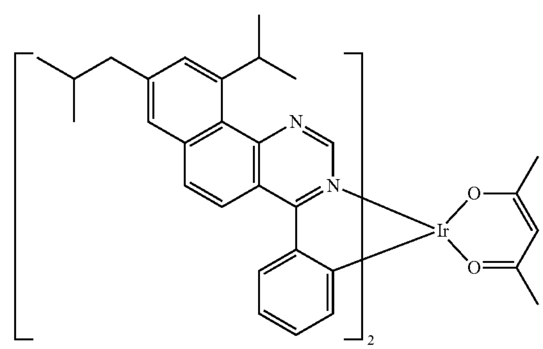
673
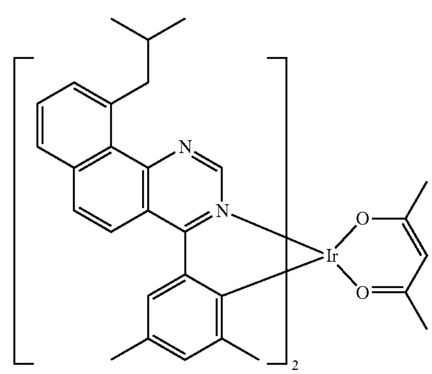

-continued
674
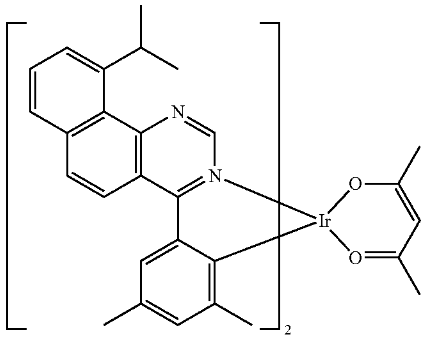
675
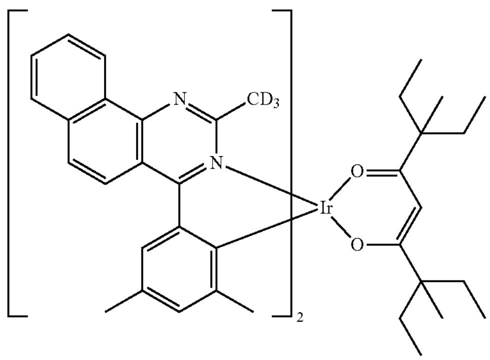
677
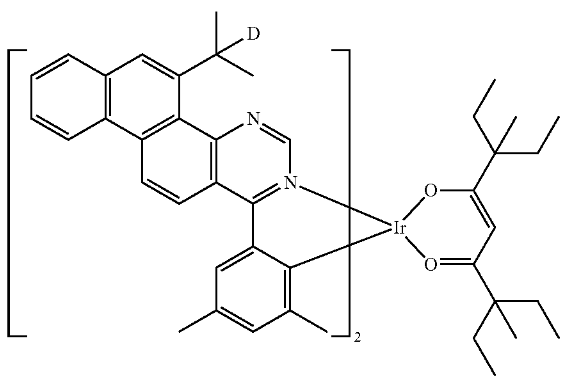
678
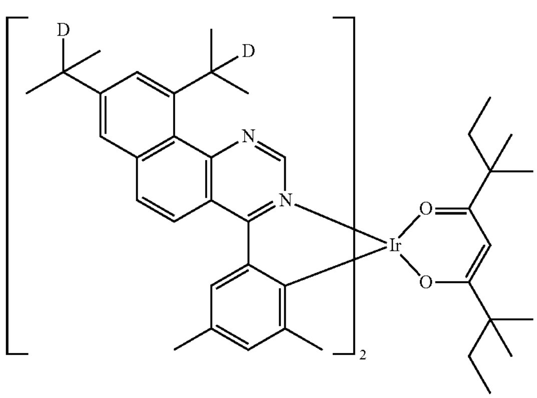
-continued
679
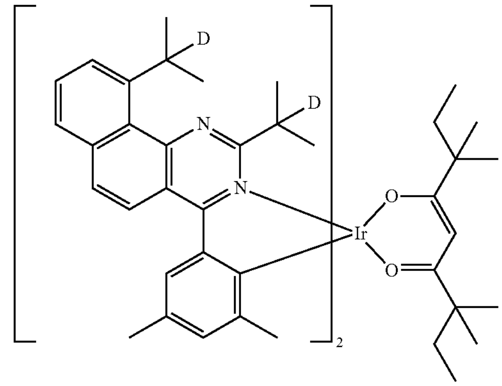
680
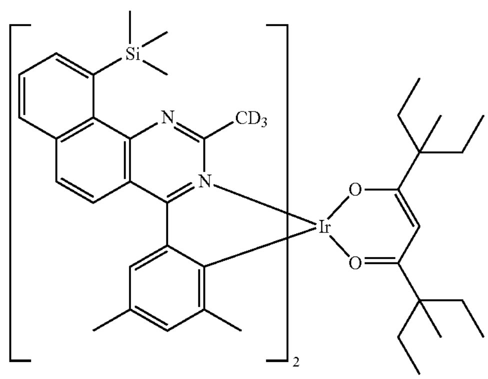
681
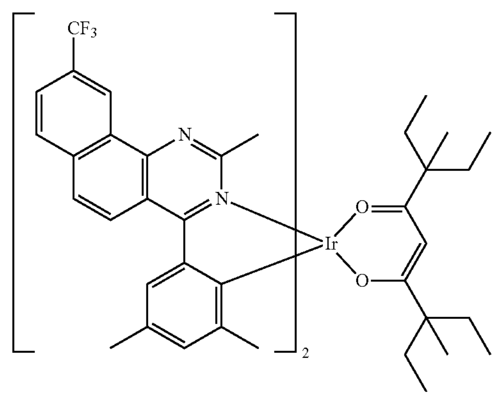
682
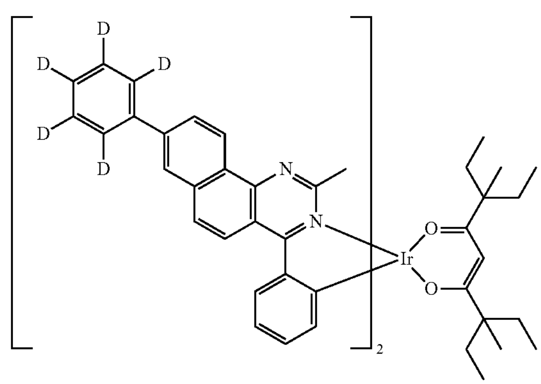

683
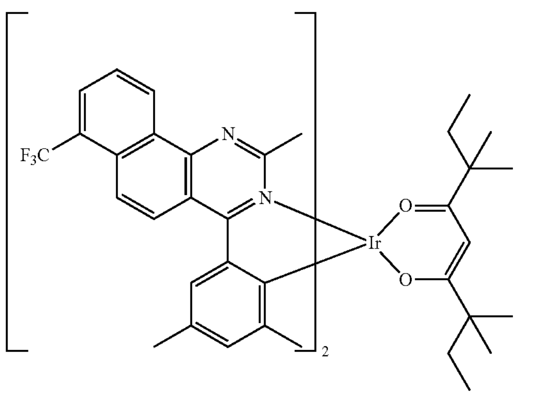
684
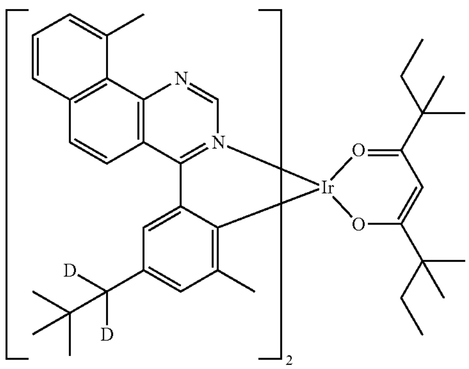
685
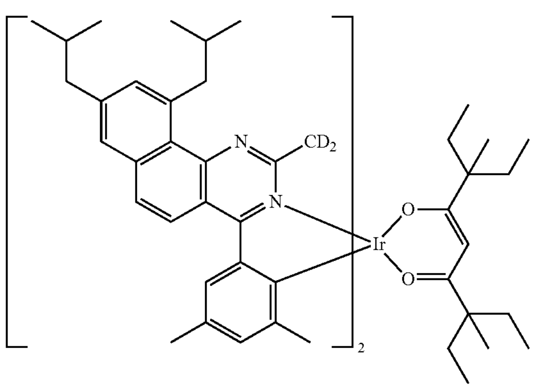
686
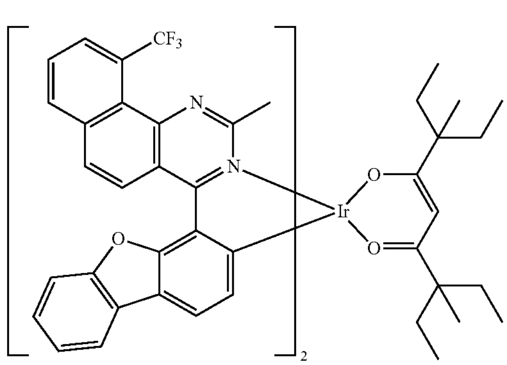
687
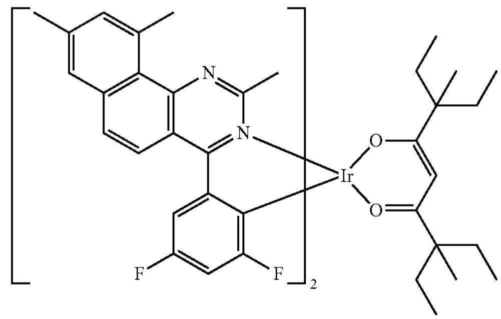
688
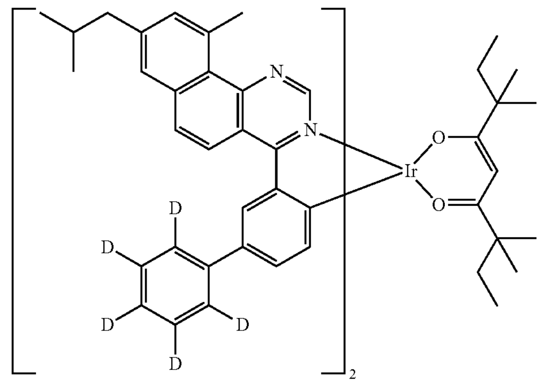
689
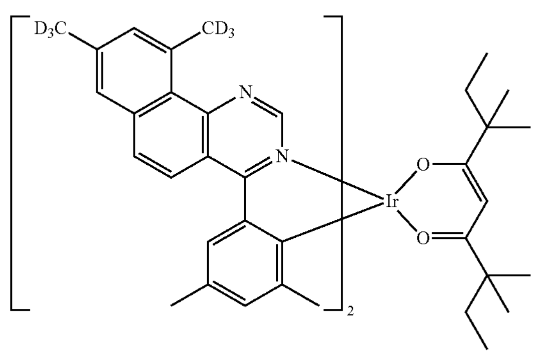
690
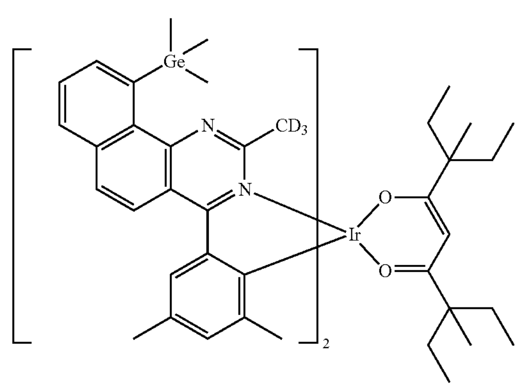

-continued

691

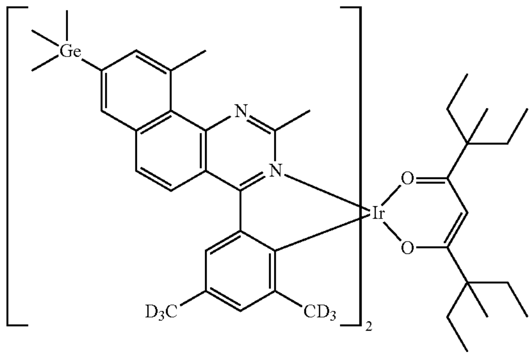

692

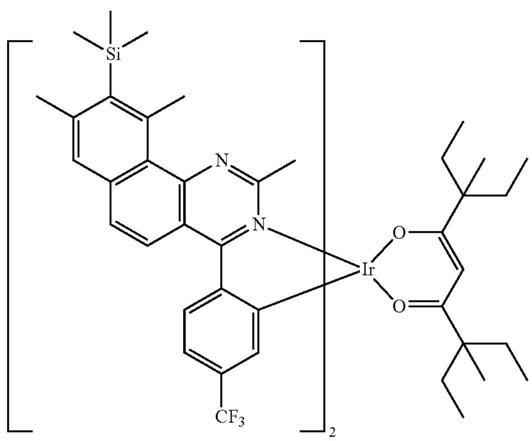

693

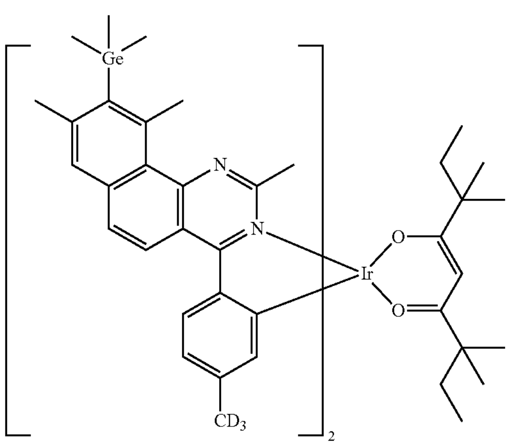

-continued

694

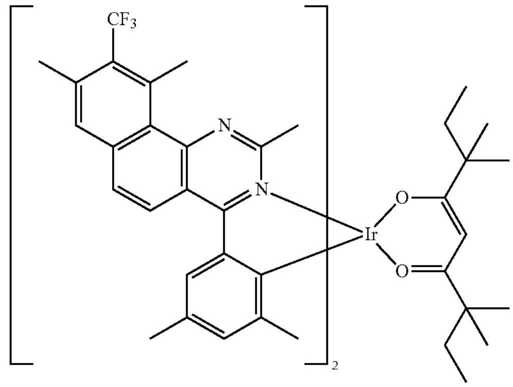

In the organometallic compound represented by Formula 1, $L_1$ is a ligand represented by Formula 2, and n1 indicating the number groups $L_1$ is 1, 2, or 3. That is, the organometallic compound essentially includes at least one ligand represented by Formula 2, as a ligand linked to metal.

In a ligand represented by Formula 2, ring $CY_2$ is a first ring or a condensed ring in which a first ring and at least one second ring are condensed with each other, wherein the first ring is a 6-membered ring, and the second ring is a $C_5$-$C_{30}$ carbocyclic group or a $C_1$-$C_{30}$ heterocyclic group, wherein one ring-forming atom of the first ring, which may be a first ring or a first ring that is condensed with the second ring, is $Y_2$ in Formula 2. In addition, at least one of $X_1$ to $X_8$ in Formula 2 is N. Furthermore, in a ligand represented by Formula 2, a benzo ring 1 is condensed at the same position as in Formula 2' below. Without wishing to be bound by theory, since transition dipole moment increases in the direction of the orientation axis of Formula 2, a conjugation length of the organometallic compound represented by Formula 1 relatively increases, and sterical rigidity of the organometallic compound represented by Formula 1 increases, thereby reducing non-radiative transition of the organometallic compound represented by Formula 1. As such, an electronic device, such as an organic light-emitting device, including the organometallic compound represented by Formula 1 may have improved emission efficiency and improved lifespan.

Formula 2'

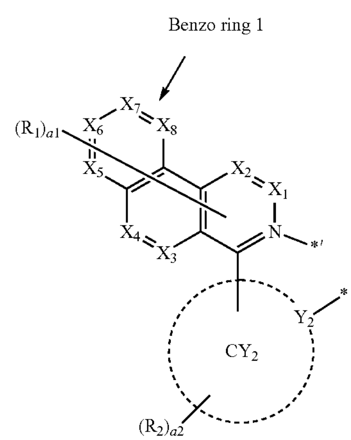

With respect to some of organometallic compounds represented by Formula 1, highest occupied molecular orbital (HOMO) energy levels, lowest unoccupied molecular orbital (LUMO) energy levels, $S_1$ energy levels, and $T_1$ energy levels were evaluated using Gaussian 09 program with molecular structure optimization by density functional theory (DFT) based on B3LYP, and results thereof are as follows in Table 1.

TABLE 1

| Compound No. | HOMO (eV) | LUMO (eV) | $T_1$ (eV) |
|---|---|---|---|
| 1 | −4.879 | −2.006 | 1.983 |
| 24 | −4.833 | −1.927 | 2.014 |
| 82 | −4.902 | −1.960 | 2.055 |
| 161 | −5.027 | −2.131 | 2.026 |
| 252 | −4.985 | −2.019 | 2.089 |
| 418 | −4.825 | −1.924 | 2.016 |
| 437 | −4.825 | −1.924 | 2.016 |
| 485 | −4.902 | −1.988 | 2.028 |
| 507 | −4.980 | −1.894 | 2.166 |
| 531 | −4.991 | −2.066 | 2.056 |
| 603 | −4.892 | −2.097 | 1.937 |

Referring to Table 1, it is confirmed that organometallic compounds represented by Formula 1 have such electrical characteristics that are suitable for use as a material for an electronic device, for example a dopant for an organic light-emitting device.

Synthesis methods of the organometallic compound represented by Formula 1 may be recognizable by one of ordinary skill in the art by referring to Synthesis Examples provided below.

The organometallic compound represented by Formula 1 is suitable for use as a material for an organic layer, for example a dopant for an emission layer of the organic layer, of an organic light-emitting device. Thus, according to another aspect, provided is an organic light-emitting device including: a first electrode; a second electrode; and an organic layer disposed between the first electrode and the second electrode and including an emission layer, wherein the organic layer includes at least one organometallic compound represented by Formula 1.

Since the organic light-emitting device has an organic layer containing the organometallic compound represented by Formula 1 as described above, excellent characteristics may be obtained with respect to driving voltage, external quantum efficiency, and lifespan, and the full width at half maximum (FWHM) of the emission peak in the electroluminescence (EL) spectrum is relatively narrow (or, small).

The organometallic compound of Formula 1 may be disposed between a pair of electrodes of an organic light-emitting device. For example, the organometallic compound represented by Formula 1 may be included in the emission layer. In this regard, the organometallic compound may act as a dopant, and the emission layer may further include a host (that is, an amount (weight) of the organometallic compound represented by Formula 1 in the emission layer is smaller than an amount (weight) of the host). The emission layer may emit red light or green light, for example, red or green light having a maximum emission wavelength of about 500 nm or more, for example, about 500 nm or more and about 650 nm or less.

In an embodiment, the emission layer may emit red light.

The expression "(an organic layer) includes at least one organometallic compound" used herein may include a case in which "(an organic layer) includes identical organometallic compounds represented by Formula 1" and a case in which "(an organic layer) includes two or more different organometallic compounds represented by Formula 1".

For example, in some aspects the organic layer may include, as the organometallic compound, only Compound 1 (where Compound 1 is a hypothetical organometallic compound). In this regard, Compound 1 may be present only in the emission layer of the organic light-emitting device. In one or more embodiments, the organic layer may include, as the organometallic compound, Compound 1 and Compound 2 (where Compound 2 is another hypothetical organometallic compound that is different from Compound 1). In this regard, Compound 1 and Compound 2 may exist in the same layer (for example, both Compound 1 and Compound 2 may be present in the emission layer). It is to be understood that at least one of Compound 1 or Compound 2 is an organometallic compound represented by Formula 1, and for the case where "(an organic layer) includes two or more different organometallic compounds represented by Formula 1", it is to be understood that Compound 1 and Compound 2 are each a different organometallic compound represented by Formula 1.

The first electrode may be an anode, which is a hole injection electrode, and the second electrode may be a cathode, which is an electron injection electrode, or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer may further include a hole transport region between the first electrode and the emission layer and an electron transport region disposed between the emission layer and the second electrode, the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" used herein refers to a single layer and/or a plurality of layers disposed between the first electrode and the second electrode of the organic light-emitting device. The "organic layer" may include, in addition to an organic compound, an organometallic complex including metal.

The FIGURE is a schematic cross-sectional view of an organic light-emitting device 10 according to an embodiment. Hereinafter, the structure of an organic light-emitting device according to an embodiment and a method of manufacturing an organic light-emitting device according to an embodiment will be described in connection with FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may include indium tin oxide (ITO), indium zinc oxide (IZO), tin oxide ($SnO_2$), zinc oxide (ZnO), or any combination thereof. In one or more embodiments, the material for forming the first electrode 11 may include a metal or a metal alloy, such as magnesium (Mg), aluminum (Al), aluminum-lithium (Al—Li), calcium (Ca), magnesium-indium (Mg—In), magnesium-silver (Mg—Ag), or any combination thereof.

The first electrode 11 may have a single-layered structure or a multi-layered structure including two or more different layers. For example, the first electrode 11 may have a three-layered structure of ITO/Ag/ITO.

The organic layer 15 is located on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or a combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, wherein, for each structure, each layer is sequentially stacked in this stated order from the first electrode 11 in a direction towards the second electrode 19.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Angstrom per second (Å/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include m-MTDATA, TDATA, 2-TNATA, NPB, R-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), polyaniline/poly(4-styrenesulfonate) (PANI/PSS), a compound represented by Formula 201 below, a compound represented by Formula 202 below, or a combination thereof:

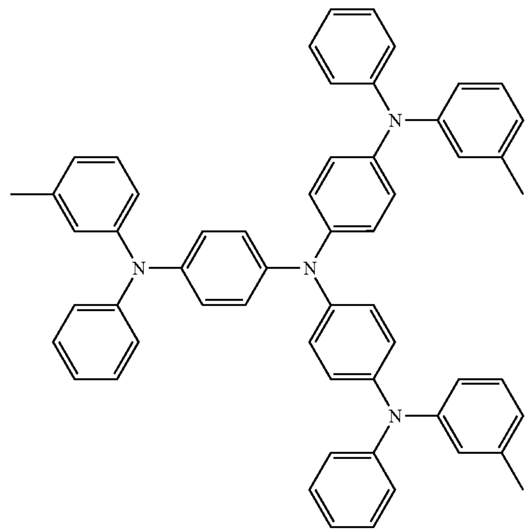

m-MTDATA

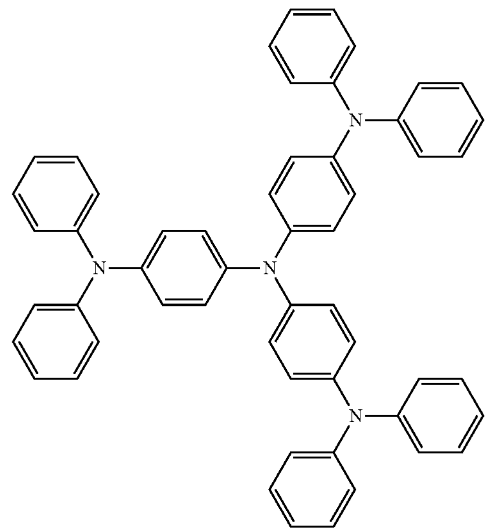

TDATA

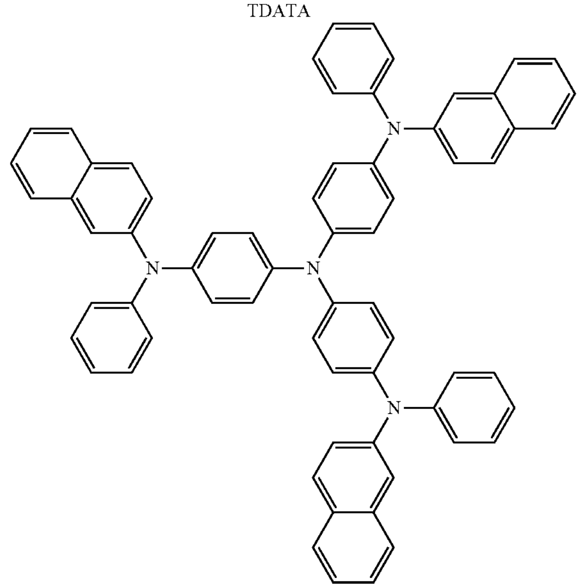

2-TNATA

-continued
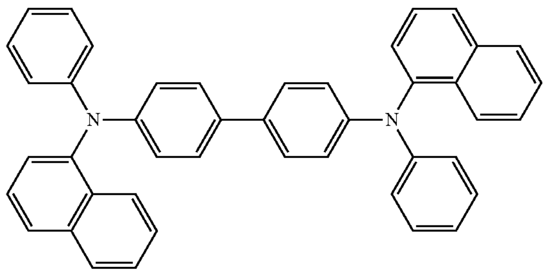
NPB
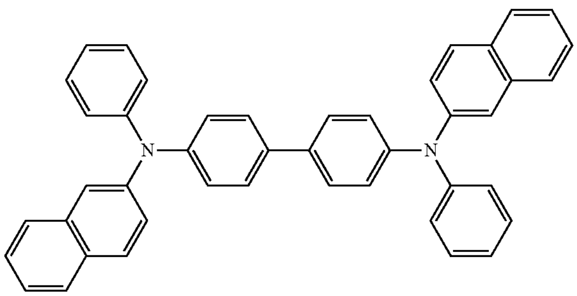
β-NPB
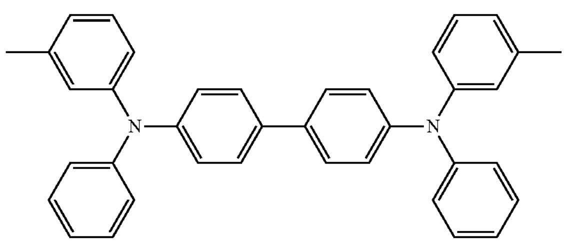
TPD
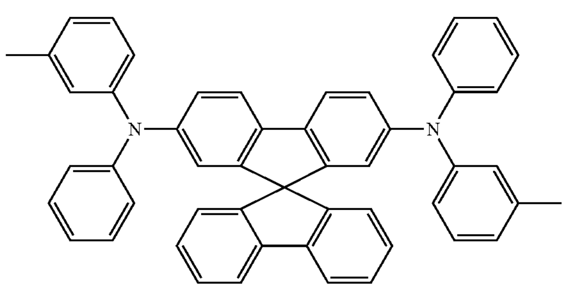
Spiro-TPD
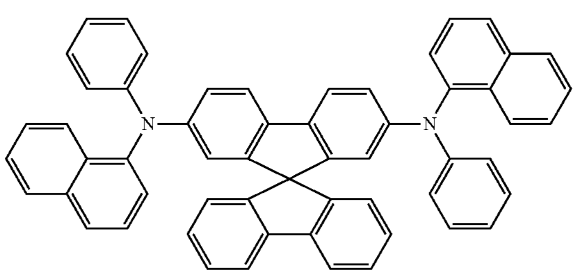
Spiro-NPB
-continued
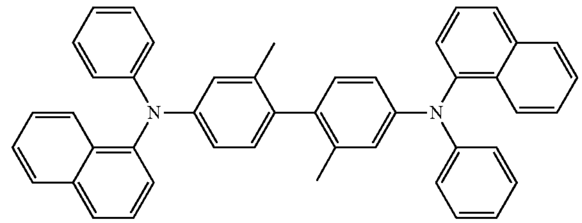
methylated NPB
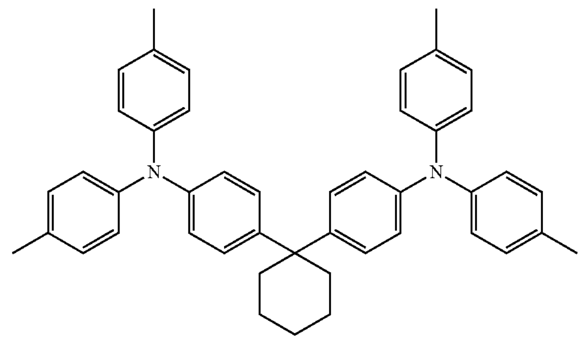
TAPC
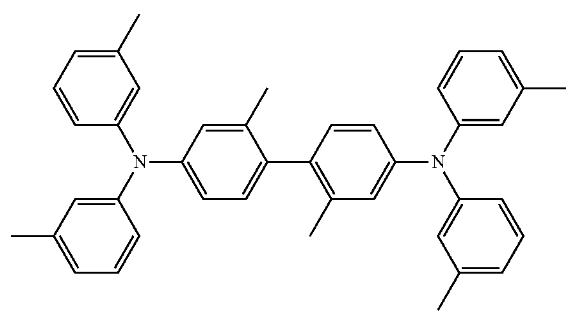
HMTPD
Formula 201
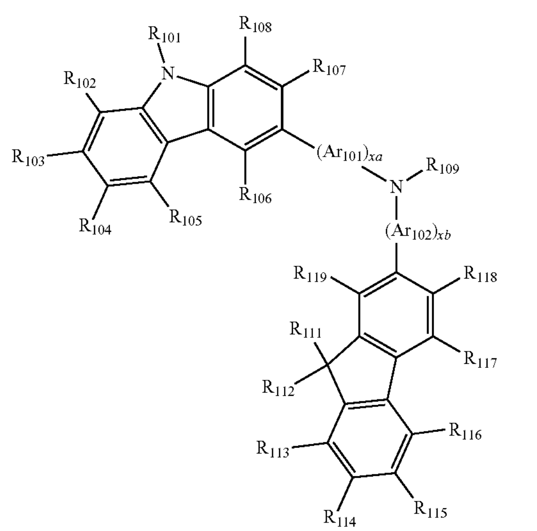

-continued

Formula 202

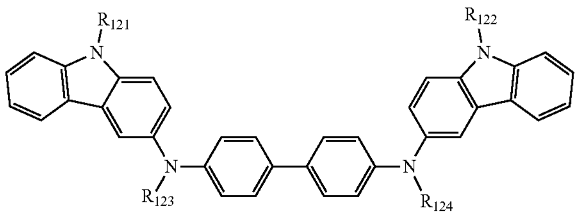

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_3$-$C_{10}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group.

In Formula 201, xa and xb may each independently be an integer from 0 to 5, or 0, 1, or 2. For example, xa may be 1 and xb may be 0.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like), or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each unsubstituted or substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof; or a phenyl group, a naphthyl group, an anthracenyl group, a fluorenyl group, or a pyrenyl group, each unsubstituted or substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, or a $C_1$-$C_{10}$ alkoxy group.

In Formula 201, $R_{109}$ may be a phenyl group, a naphthyl group, an anthracenyl group, or a pyridinyl group, each unsubstituted or substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, or a pyridinyl group.

In an embodiment, the compound represented by Formula 201 may be represented by Formula 201A:

Formula 201A

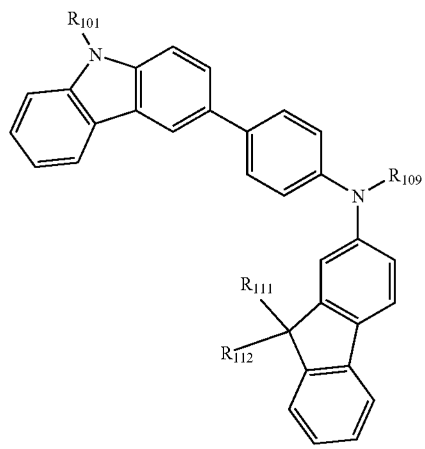

In Formula 201A, $R_{101}$, $R_{111}$, $R_{112}$, and $R_{109}$ are understood by referring to the description provided herein.

For example, the hole transport region may include one of Compounds HT1 to HT21 or a combination thereof:

HT1

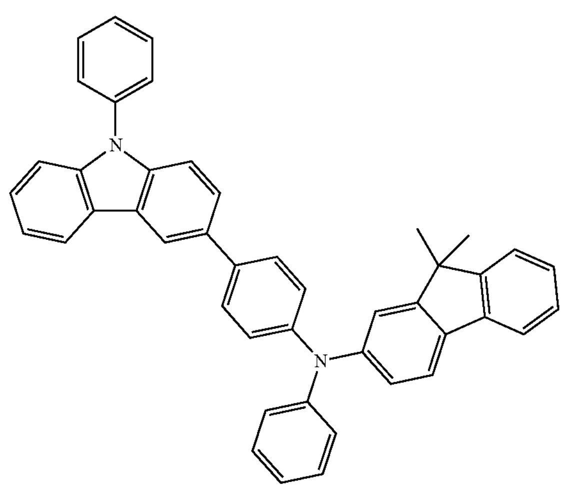

HT2
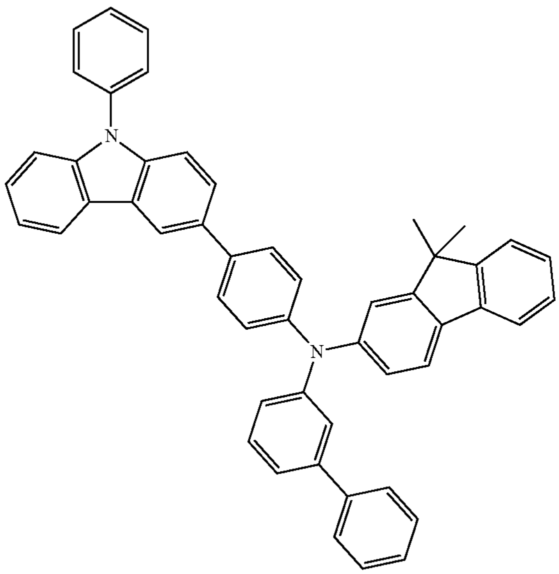
HT3
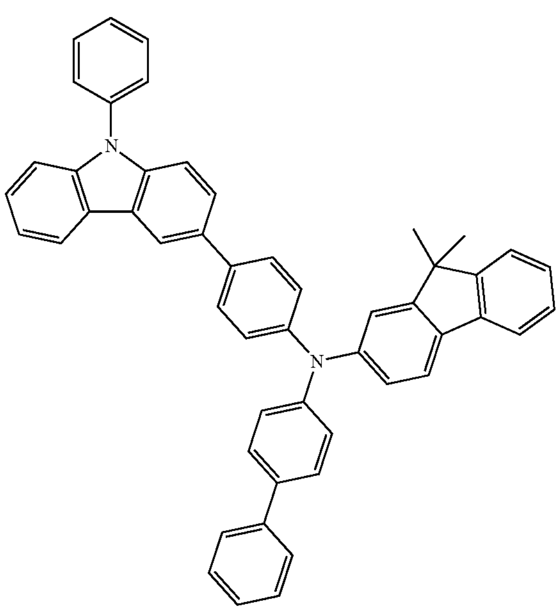
HT4
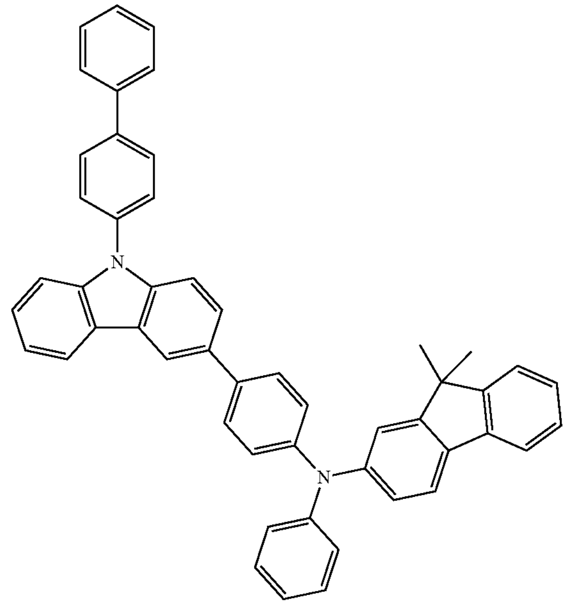
HT5
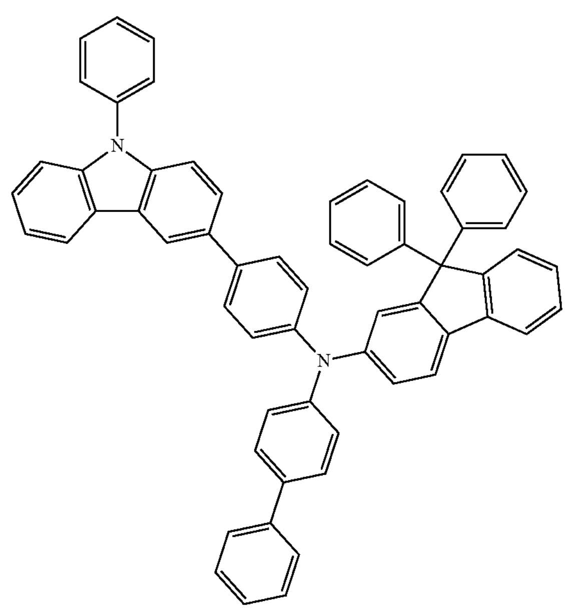

-continued
HT6
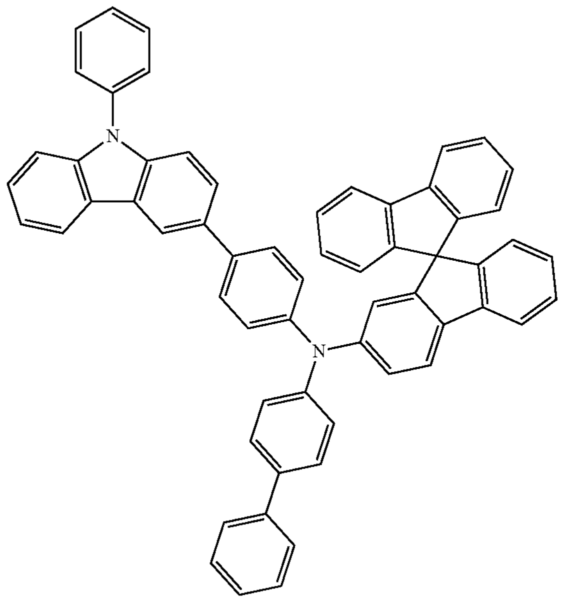
HT7
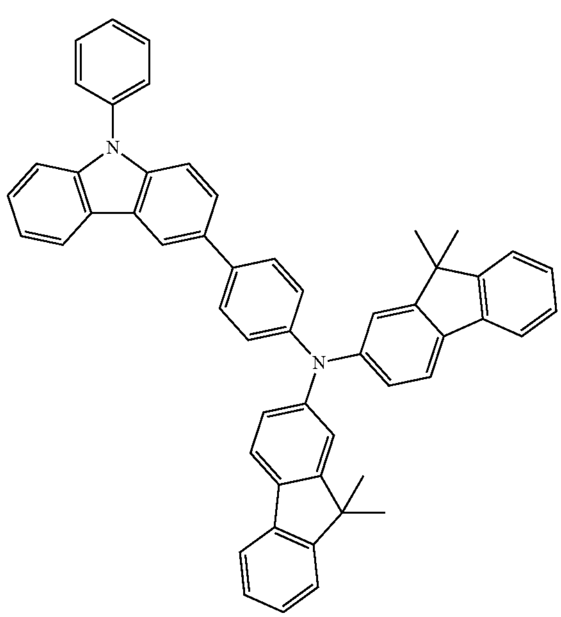
-continued
HT8
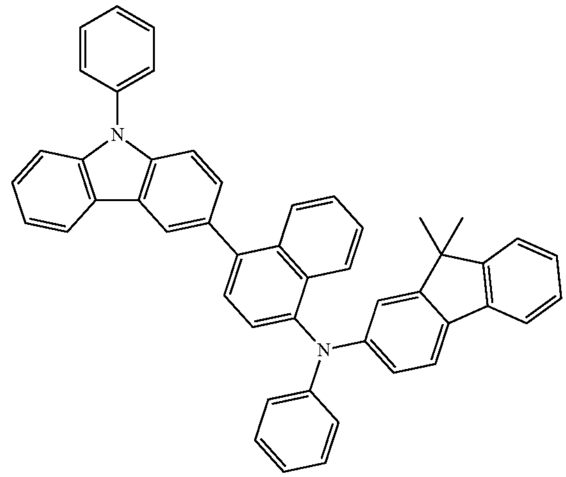
HT9
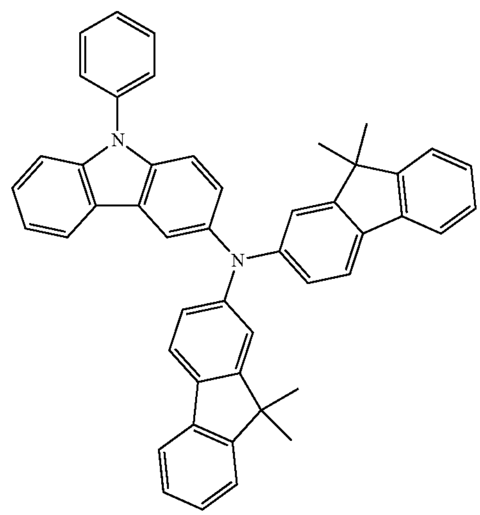
HT10
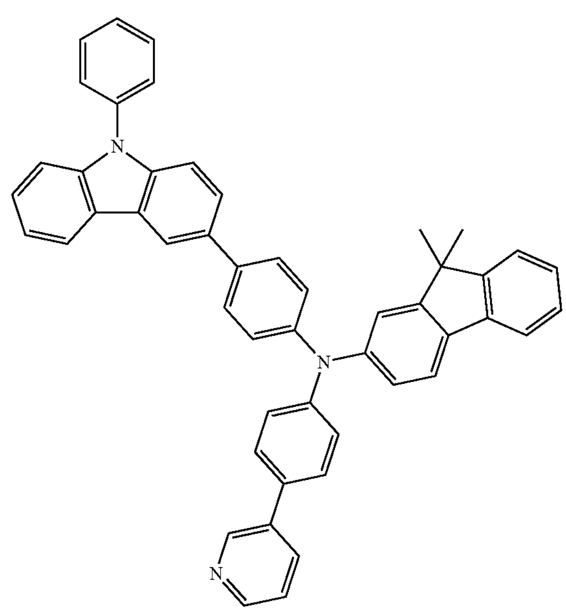

HT11
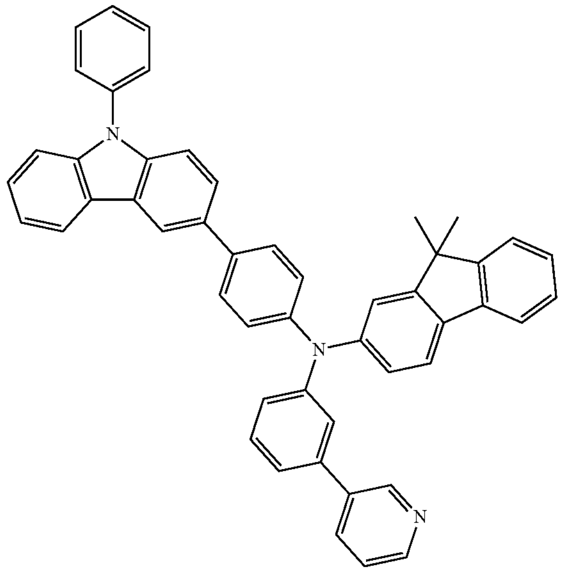
HT12
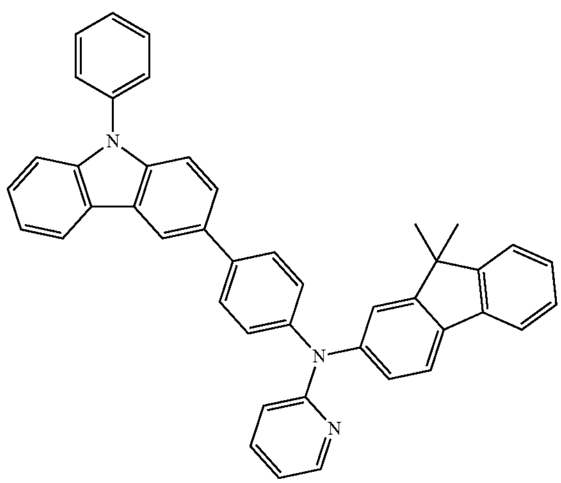
HT13
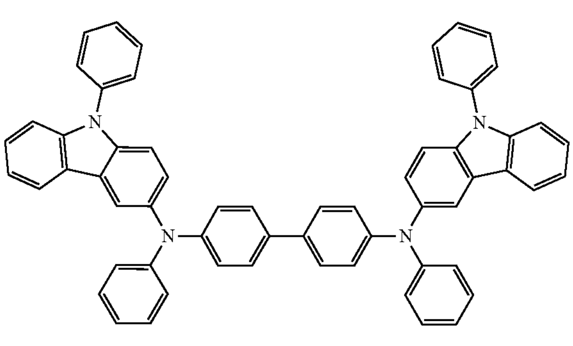
HT14
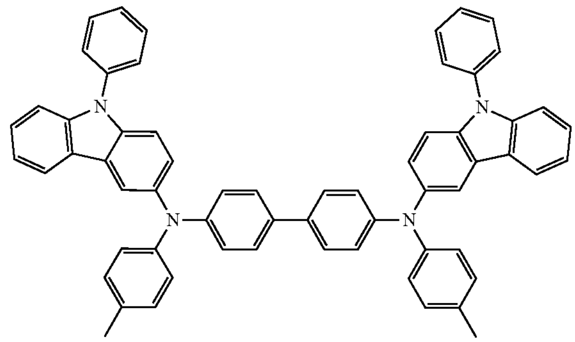
HT15
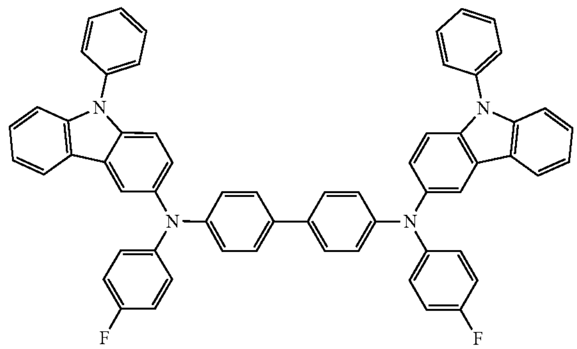
HT16
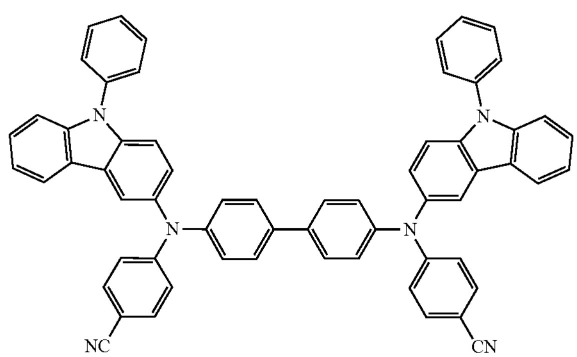
HT17
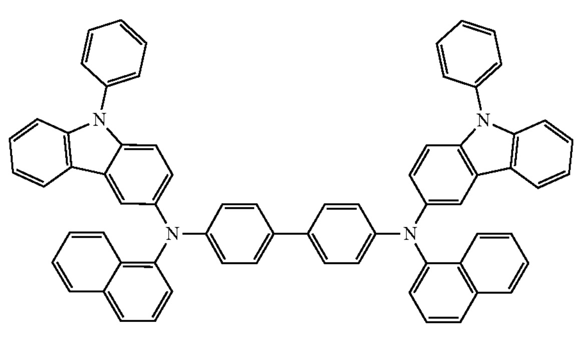

-continued

HT18

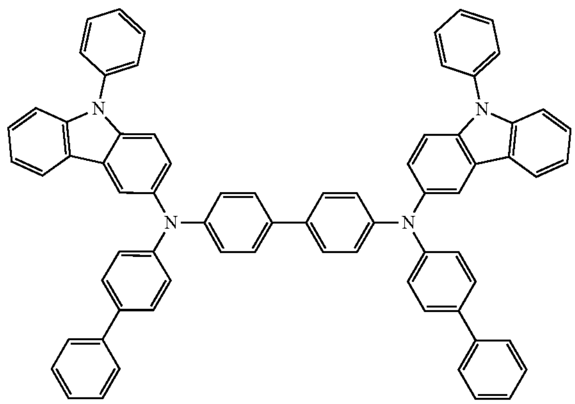

HT19

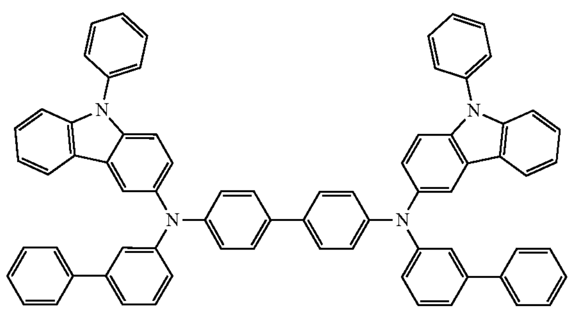

HT20

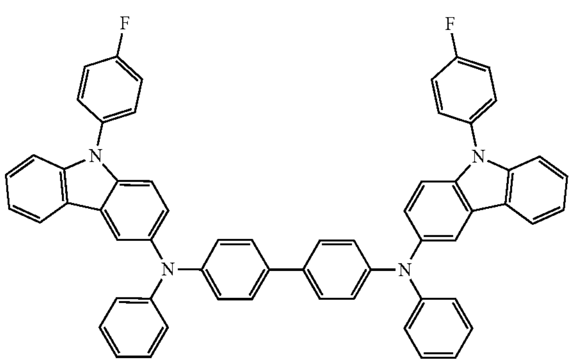

HT21

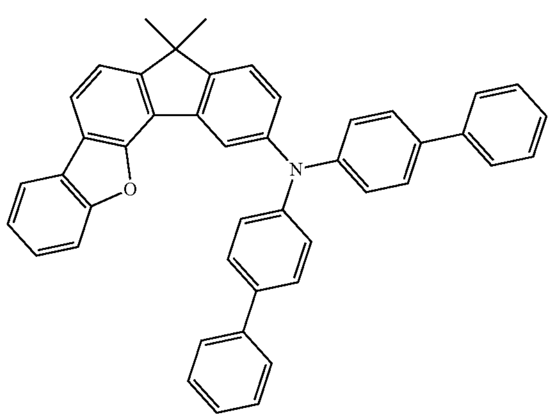

A thickness of the hole transport region may be in a range of about 100 Angstroms (Å) to about 10,000 Å, for example, about 100 Å to about 1,000 Å. When the hole transport region includes a hole injection layer, a hole transport layer, an electron blocking layer, or a combination thereof, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may include a quinone derivative, a metal oxide, a cyano group-containing compound, or a combination thereof. For example, the p-dopant may include: a quinone derivative such as tetracyanoquinodimethane (TCNQ), 2,3,5,6-tetrafluoro-tetracyano-1,4-benzoquinonedimethane (F4-TCNQ), or F6-TCNNQ; metal oxide such as tungsten oxide and molybdenum oxide; a cyano group-containing compound such as Compound HT-D1; or a combination thereof.

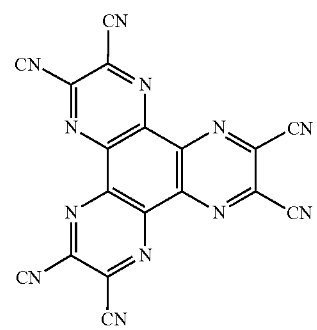

HT-D1

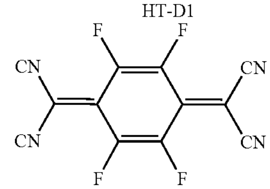

F4-TCNQ

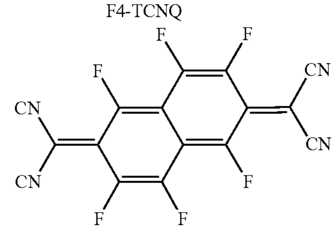

F6-TCNNQ

The hole transport region may include a buffer layer.

The buffer layer may compensate for an optical resonance distance according to a wavelength of light emitted from an emission layer, and thus, emission efficiency of an organic light-emitting device may be improved.

Meanwhile, when the hole transport region includes an electron blocking layer, a material for forming the electron blocking layer may include a material that is used in the hole transport region as described above, a host material described below, or a combination thereof. For example, when the hole transport region includes an electron blocking layer, mCP described below, Compound HT21, or a combination thereof may be used as the material for forming the electron blocking layer.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

The emission layer may include a host and a dopant, and the dopant may include the organometallic compound represented by Formula 1 as described herein.

The host may include TPBi, TBADN, ADN (also referred to as "DNA"), CBP, CDBP, TCP, mCP, Compound H50, Compound H51, Compound H52, or a combination thereof:

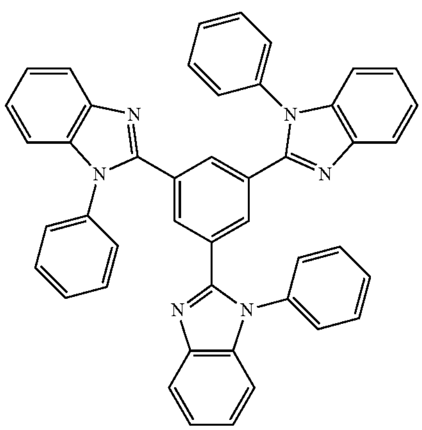

TPBi

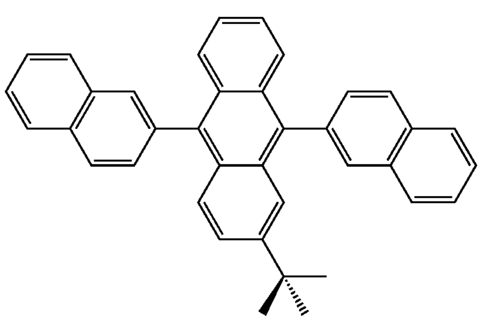

TBADN

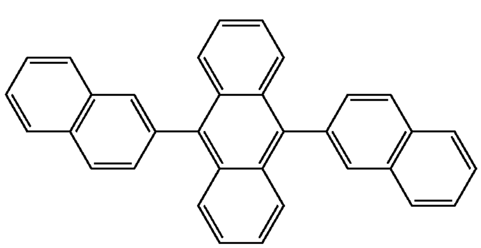

ADN

-continued

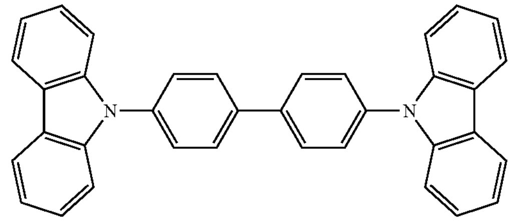

CBP

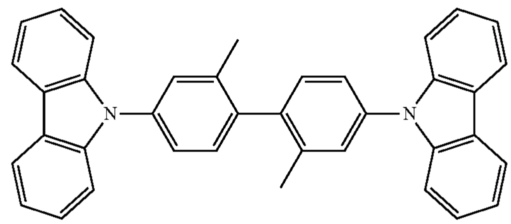

CDBP

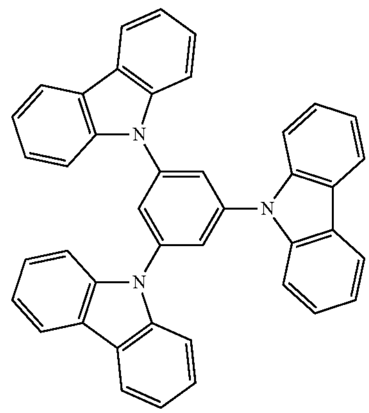

TCP

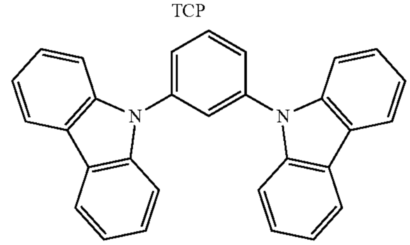

mCP

H50

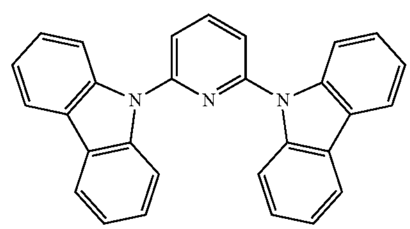

H51

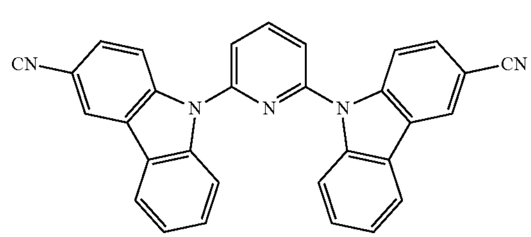

-continued

H52

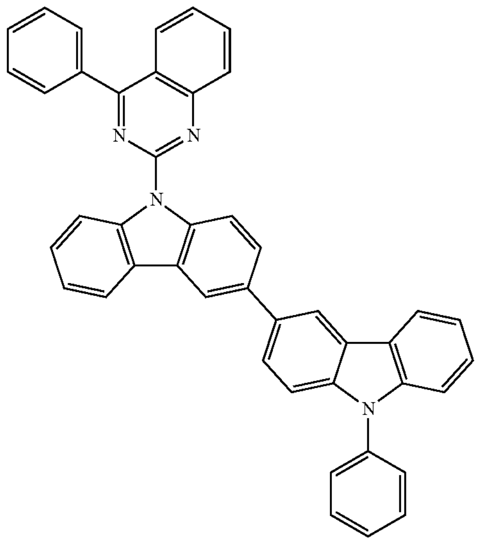

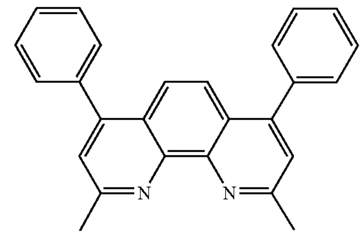

BCP

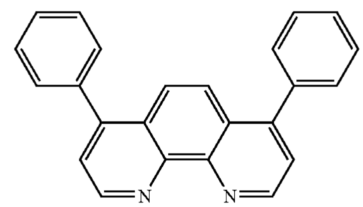

Bphen

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be located on the emission layer.

The electron transport region may include a hole blocking layer, an electron transport layer, an electron injection layer, or a combination thereof.

For example, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which comprise the electron transport region may be understood by referring to the conditions for forming the hole injection layer.

When the electron transport region includes a hole blocking layer, the hole blocking layer may include, for example, BCP, Bphen, BAlq, or any combination thereof.

In one or more embodiments, the hole blocking layer may include the host, a material for forming an electron transport layer as described below, a material for forming an electron injection layer as described below, or a combination thereof.

A thickness of the hole blocking layer may be in a range of about 20 Å to about 1,000 Å, for example, about 30 Å to about 600 Å. Without wishing to be bound by theory, when the thickness of the hole blocking layer is within the range described above, the hole blocking layer may have excellent hole blocking characteristics without a substantial increase in driving voltage.

The electron transport layer may include BCP, Bphen, TPBi, $Alq_3$, BAlq, TAZ, NTAZ, or a combination thereof:

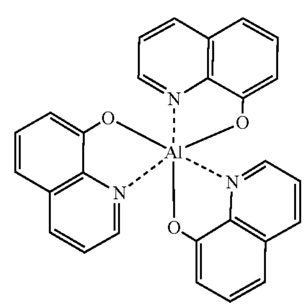

$Alq_3$

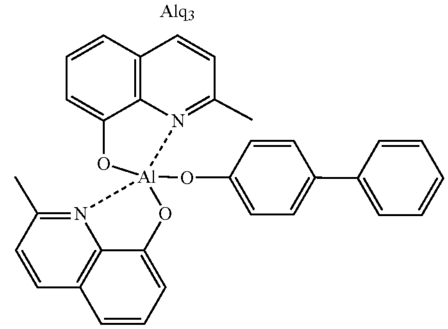

BAlq

-continued
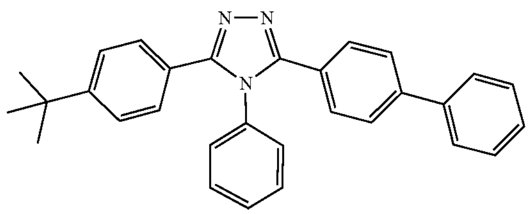
TAZ
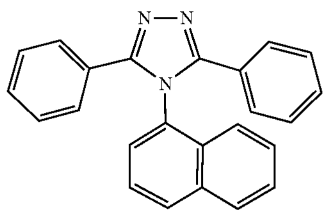
NTAZ
Alternatively, the electron transport layer may include one of Compounds ET1 to ET25 below or a combination thereof:
ET1
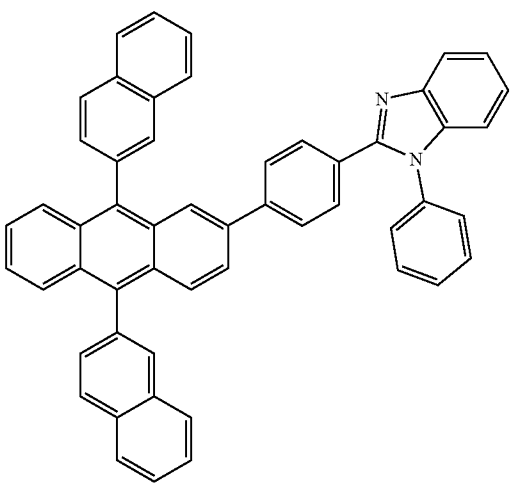
ET2
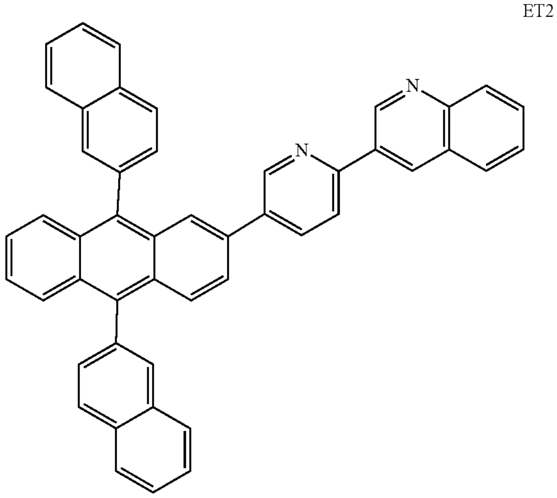
-continued
ET3
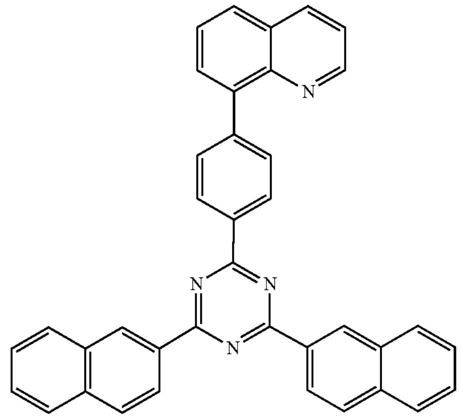
ET4
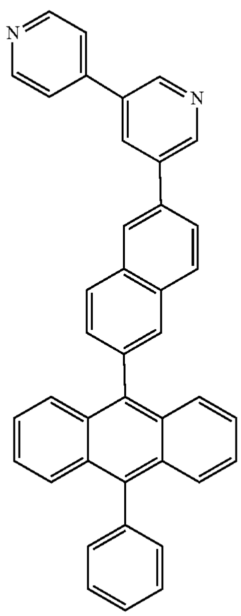
ET5
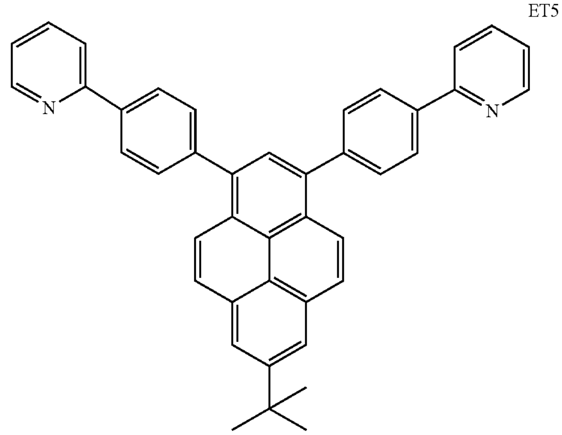

-continued
ET6
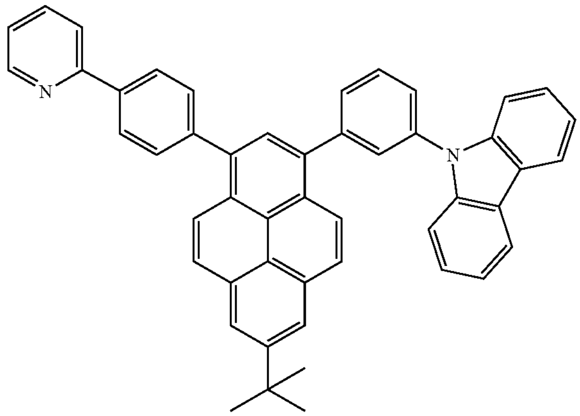
ET7
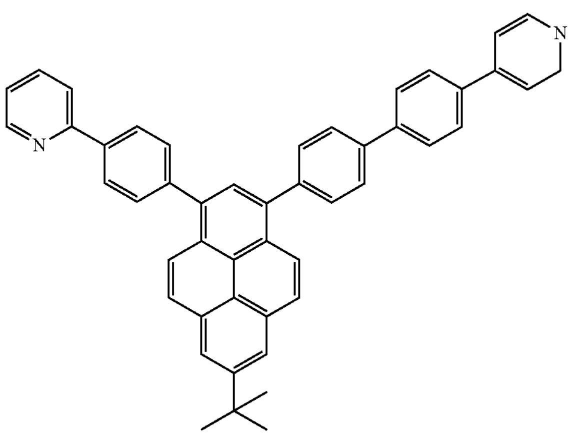
ET8
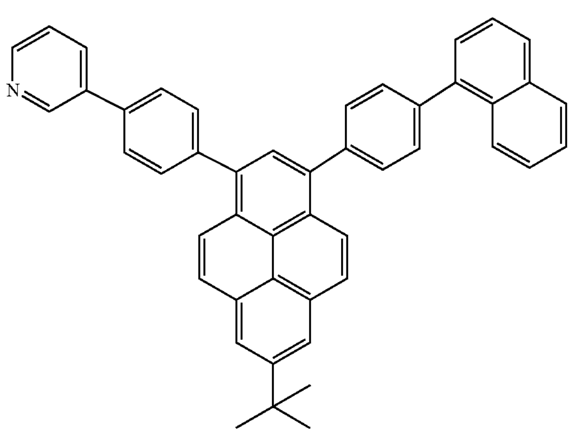
-continued
ET9
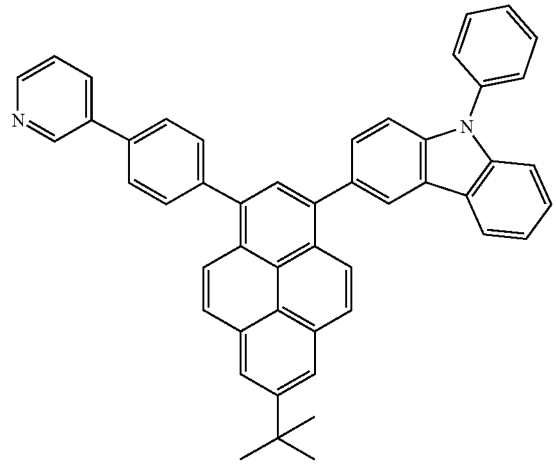
ET10
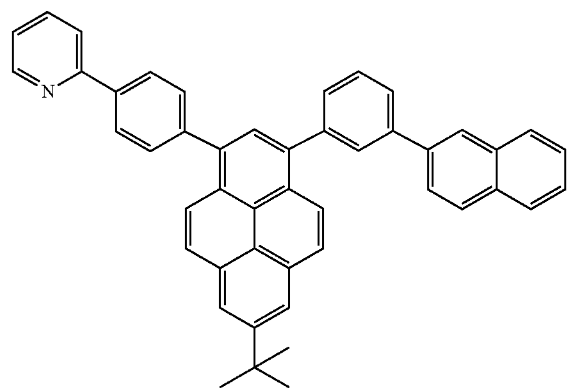
lp;1p
ET11
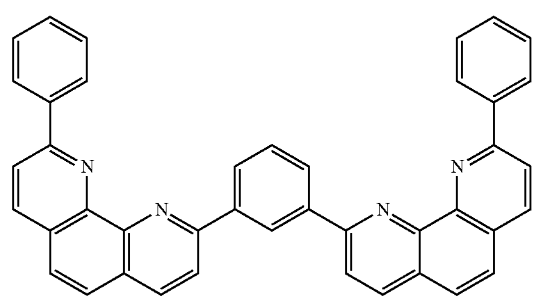
ET12
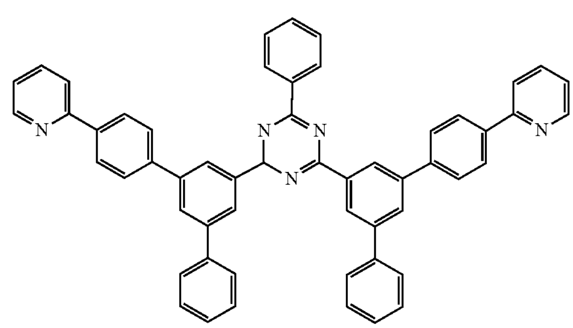

ET13
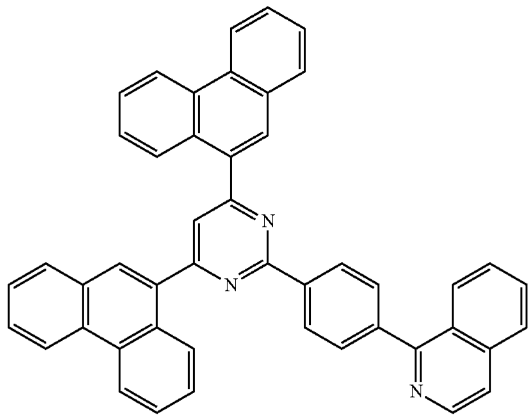
ET14
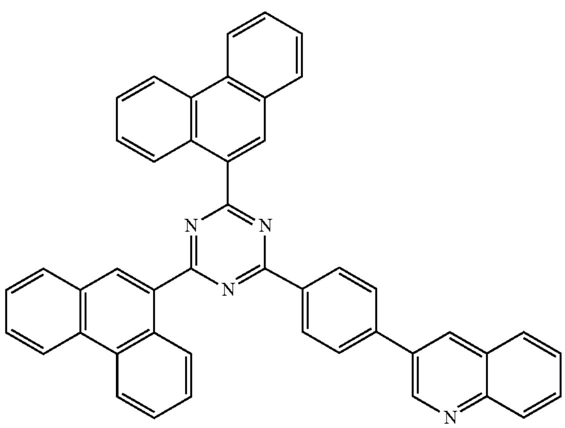
ET15
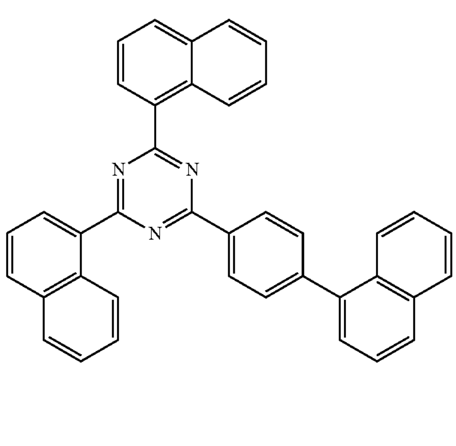
ET16
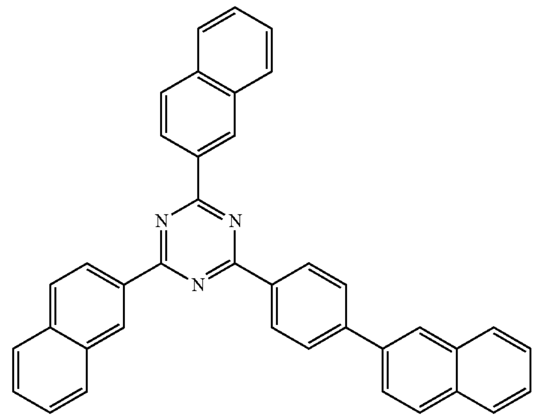
ET17
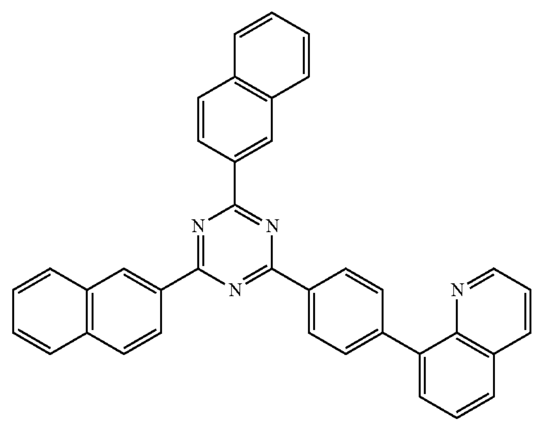
ET18
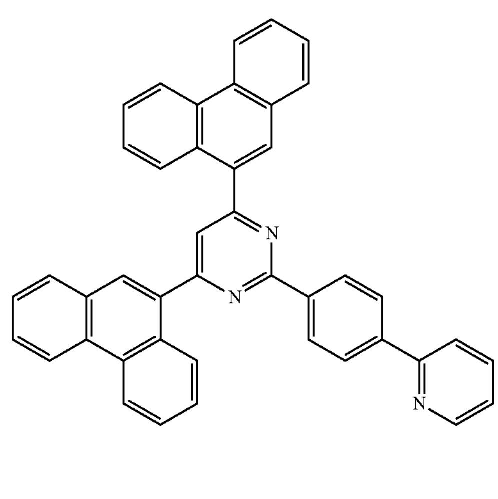

-continued
ET19
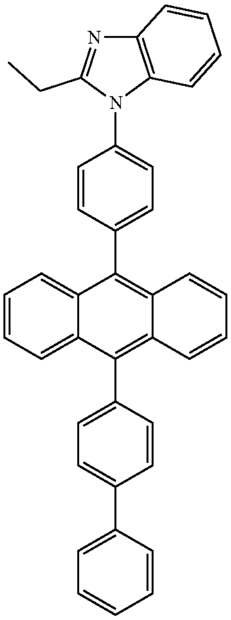
ET20
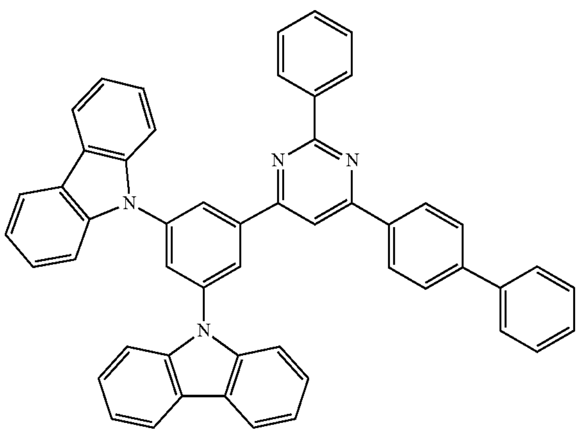
ET21
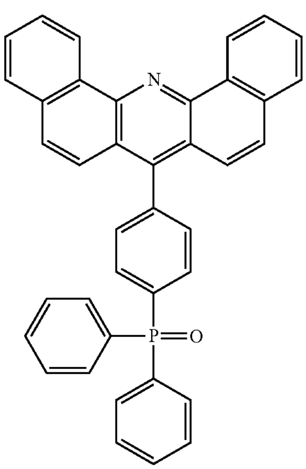
-continued
ET22
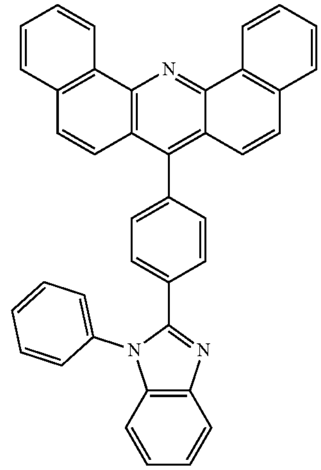
ET23
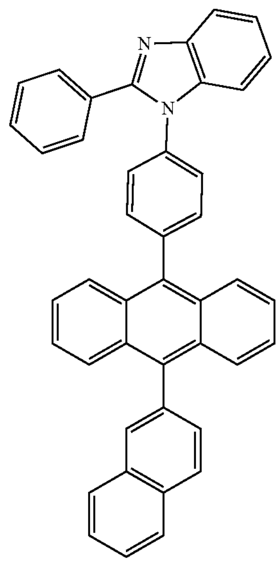
ET24
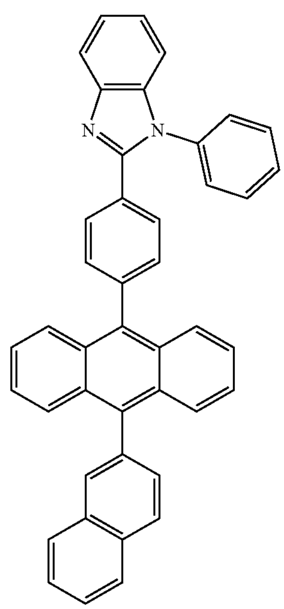

-continued

ET25

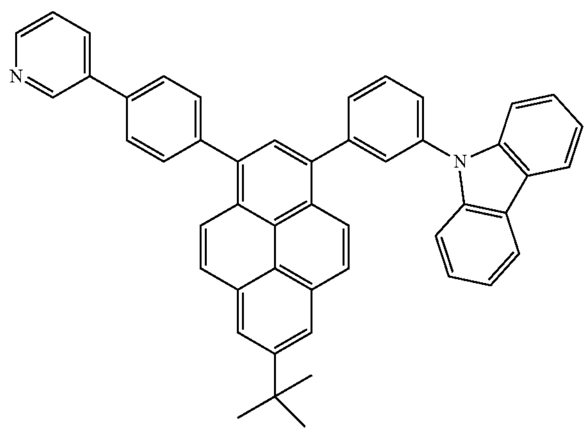

A thickness of the electron transport layer may be in a range of about 100 Å to about 1,000 Å, for example, about 150 Å to about 500 Å. Without wishing to be bound by theory, when the thickness of the electron transport layer is within the range described above, the electron transport layer may have satisfactory electron transport characteristics without a substantial increase in driving voltage.

The electron transport layer may further include, in addition to the materials described above, a metal-containing material.

The metal-containing material may include a Li complex. The Li complex may include, for example, Compound ET-D1 or ET-D2:

ET-D1

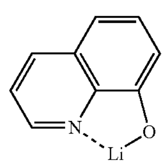

ET-D2

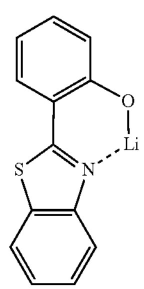

In some embodiments, the electron transport region may include an electron injection layer that promotes the flow of electrons from the second electrode 19 thereinto.

The electron injection layer may include LiF, NaCl, CsF, $Li_2O$, BaO, or a combination thereof.

A thickness of the electron injection layer may be in a range of about 1 Å to about 100 Å, and, for example, about 3 Å to about 90 Å. Without wishing to be bound by theory, when the thickness of the electron injection layer is within the range described above, the electron injection layer may have satisfactory electron injection characteristics without a substantial increase in driving voltage.

The second electrode 19 may be located on the organic layer 15. The second electrode 19 may be a cathode. A material for forming the second electrode 19 may be a metal, an alloy, an electrically conductive compound, or a combination thereof, which has a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission-type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

According to another aspect, the organic light-emitting device may be included in an electronic apparatus. Thus, an electronic apparatus including the organic light-emitting device is provided. The electronic apparatus may include, for example, a display, an illumination, a sensor, and the like.

According to another aspect, provided is a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, for example 1 to 20 carbon atoms, or 1 to 10 carbon atoms. The term "$C_1$-$C_{60}$ alkylene group" as used herein refers to a divalent group having the same structure as the $C_1$-$C_{60}$ alkyl group.

Examples of the $C_1$-$C_{60}$ alkyl group may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with at least one of a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group. For example, Formula 9-33 is a branched $C_6$ alkyl group, for example, a tert-butyl group that is substituted with two methyl groups.

The term "$C_1$-$C_{60}$ alkoxy group" used herein refers to a monovalent group represented by —$OA_{101}$ (wherein $A_{101}$ is the $C_1$-$C_{60}$ alkyl group).

Examples of the $C_1$-$C_{60}$ alkoxy group, the $C_1$-$C_{20}$ alkoxy group, or the $C_1$-$C_{10}$ alkoxy group may include a methoxy group, an ethoxy group, a propoxy group, a butoxy group, or a pentoxy group.

The term "$C_2$-$C_{60}$ alkenyl group" as used herein has a structure including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein has a structure including at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms. The term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group may include a cyclopropyl group, a cyclobutyl group, a cyclopentyl group, a cyclohexyl group, a cycloheptyl group, a cyclooctyl group, an adamantanyl group, a norbornanyl(bicyclo[2.2.1]heptyl) group, a bicyclo[1.1.1]pentyl group, a bicyclo[2.1.1]hexyl group, a bicyclo[2.2.2]octyl group, or the like.

The term "$C_1$-$C_{10}$ heterocycloalkyl group" as used herein refers to a monovalent saturated monocyclic group having at least one heteroatom selected from N, O, P, Si, S, Se, Ge, As, and B as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group may include a silolanyl group, a silinanyl group, a tetrahydrofuranyl group, a tetrahydro-2H-pyranyl group, a tetrahydrothiophenyl group, or the like.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, S, Se, Ge, As, and B as a ring-forming atom, 1 to 10 carbon atoms, and at least one carbon-carbon double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_7$-$C_{60}$ alkylaryl group" as used herein refers to a $C_6$-$C_{60}$ aryl group substituted with at least one $C_1$-$C_{60}$ alkyl group. The term "$C_7$-$C_{60}$ arylalkyl group" as used herein refers to a $C_1$-$C_{60}$ alkyl group substituted with at least one $C_6$-$C_{60}$ aryl group.

The term "$C_1$-$C_{60}$ heteroaryl group" as used herein refers to a monovalent group having at least one hetero atom selected from N, O, P, Si, S, Se, Ge, As, and B as a ring-forming atom and a cyclic aromatic system having 1 to 60 carbon atoms, and the term "$C_1$-$C_{60}$ heteroarylene group" as used herein refers to a divalent group having at least one hetero atom selected from N, O, P, Si, S, Se, Ge, As, and B as a ring-forming atom and a carbocyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_2$-$C_{60}$ alkylheteroaryl group" used herein refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ indicates the $C_6$-$C_{60}$ aryl group), the $C_6$-$C_{60}$ arylthio group indicates —$SA_{103}$ (wherein $A_{103}$ indicates the $C_6$-$C_{60}$ aryl group), and the $C_1$-$C_{60}$ alkylthio group indicates —$SA_{104}$ (wherein $A_{104}$ indicates the $C_1$-$C_{60}$ alkyl group).

The term "$C_1$-$C_{60}$ heteroaryloxy group" as used herein refers to —$OA_{106}$ (wherein $A_{106}$ is the $C_2$-$C_{60}$ heteroaryl group), the term "$C_1$-$C_{60}$ heteroarylthio group" as used herein indicates —$SA_{107}$ (wherein $A_{107}$ is the $C_1$-$C_{60}$ heteroaryl group), and the term "$C_2$-$C_{60}$ heteroarylalkyl group" as used herein refers to -$A_{108}A_{109}$ ($A_{109}$ is a $C_1$-$C_{59}$ heteroaryl group, and $A_{108}$ is a $C_1$-$C_{59}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and non-aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, a heteroatom selected from N, O, P, Si, S, Se, Ge, As, and B, other than carbon atoms, as a ring-forming atom, and non-aromaticity in its entire molecular structure. The monovalent non-aromatic condensed heteropolycyclic group includes a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. The "$C_5$-$C_{30}$ carbocyclic group (unsubstituted or substituted with at least one $R_{10a}$)" may include, for example, an adamantane group, a norbornane (bicyclo[2.2.1]heptane) group, a norbornene group, a bicyclo[1.1.1]pentane group, a bicyclo[2.1.1]hexane group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a silole group, and a fluorene group (each unsubstituted or substituted with at least one $R_{10a}$).

The term "$C_1$-$C_{30}$ heterocyclic group" as used herein refers to a saturated or unsaturated cyclic group having, as a ring-forming atom, at least one hetero atom selected from N, O, P, Si, S, Se, Ge, As, and B other than 1 to 30 carbon atoms. The $C_1$-$C_{30}$ heterocyclic group may be a monocyclic group or a polycyclic group. The "$C_1$-$C_{30}$ heterocyclic group (unsubstituted or substituted with at least one $R_{10a}$)" may include, for example, a thiophene group, a furan group, a pyrrole group, a silole group, borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with at least one $R_{10a}$ as defined herein.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group", and "fluorinated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the term "fluorinated $C_1$ alkyl group (that is, a fluorinated methyl group)" may include —$CF_3$, —$CF_2H$, and —$CFH_2$. The term "fluorinated $C_1$-$C_{60}$ alkyl group (or a fluorinated $C_1$-$C_{20}$ alkyl group or the like)", "fluorinated $C_3$-$C_{10}$ cycloalkyl group", or "fluorinated $C_1$-$C_{10}$ heterocycloalkyl group" may be i) a fully fluorinated $C_1$-$C_{60}$ alkyl group (or, a fully fluorinated $C_1$-$C_{20}$ alkyl group or the like), a fully fluorinated $C_3$-$C_{10}$ cycloalkyl group, or a fully fluorinated $C_1$-$C_{10}$ heterocycloalkyl group, wherein, in each group, all hydrogen atoms included therein are substituted with a fluoro group, or ii) a partially fluorinated $C_1$-$C_{60}$ alkyl group (or a partially fluorinated $C_1$-$C_{20}$ alkyl group or the like), a partially fluorinated $C_3$-$C_{10}$ cycloalkyl group, or a partially fluorinated $C_1$-$C_{10}$ heterocycloalkyl group, wherein, in each group, some of the hydrogen atoms are substituted with a fluoro group but all of the hydrogen atoms included therein are not substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group", and "deuterated phenyl group" respectively indicate a $C_1$-$C_{60}$ alkyl group (or a $C_1$-$C_{20}$alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, a deuterated methyl group)" may include —$CD_3$, —$CD_2H$, and —$CDH_2$, and examples of the "deuterated $C_3$-$C_{10}$ cycloalkyl group" may refer to, for example, Formula 10-501 and the like. The term "deuterated $C_1$-$C_{60}$ alkyl group (or, a deuterated $C_1$-$C_{20}$ alkyl group or the like)", "deuterated $C_3$-$C_{10}$ cycloalkyl group", or "deuterated $C_1$-$C_{10}$ heterocycloalkyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, or a fully deuterated $C_1$-$C_{10}$ heterocycloalkyl group, wherein, in each group, all hydrogen atoms included therein are substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, or a partially deuterated $C_1$-$C_{10}$ heterocycloalkyl group, wherein, in each group, some of the hydrogen atoms are substituted for deuterium but all hydrogen atoms included therein are not substituted with deuterium.

The term "($C_1$-$C_{20}$ alkyl) 'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl)phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene group, and a 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene group, and a 5,5-dioxide group," in which, in each group, at least one of carbon atoms forming rings thereof is substituted with nitrogen.

Substituents of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group may each independently be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, or $—P(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group, each substituted with at least one of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a substituted or unsubstituted $C_7$-$C_{60}$ arylalkyl group, a $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, or $—P(Q_{28})(Q_{29})$;

$—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$; or a combination thereof.

$Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with at least one of deuterium, a $C_1$-$C_{60}$ alkyl group, or a $C_6$-$C_{60}$ aryl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with at least one of deuterium, a $C_1$-$C_{60}$ alkyl group, or a $C_6$-$C_{60}$ aryl group; a $C_6$-$C_{60}$ aryloxy group; a $C_6$-$C_{60}$ arylthio group; a $C_7$-$C_{60}$ arylalkyl group, a $C_1$-$C_{60}$ heteroaryl group; a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group; or a monovalent non-aromatic condensed heteropolycyclic group.

Hereinafter, compounds and organic light-emitting devices according to one or more exemplary embodiments are described in further detail with reference to Synthesis Examples and Examples, but the present disclosure is not limited thereto. The wording "B was used instead of A" used in describing Synthesis Examples means that an amount of A that was used was identical to an amount of B that was used, in terms of a molar equivalent.

EXAMPLES

Synthesis Example 1 (Compound 24)

Scheme 1 shows the synthesis of Compound 24.

Scheme 1

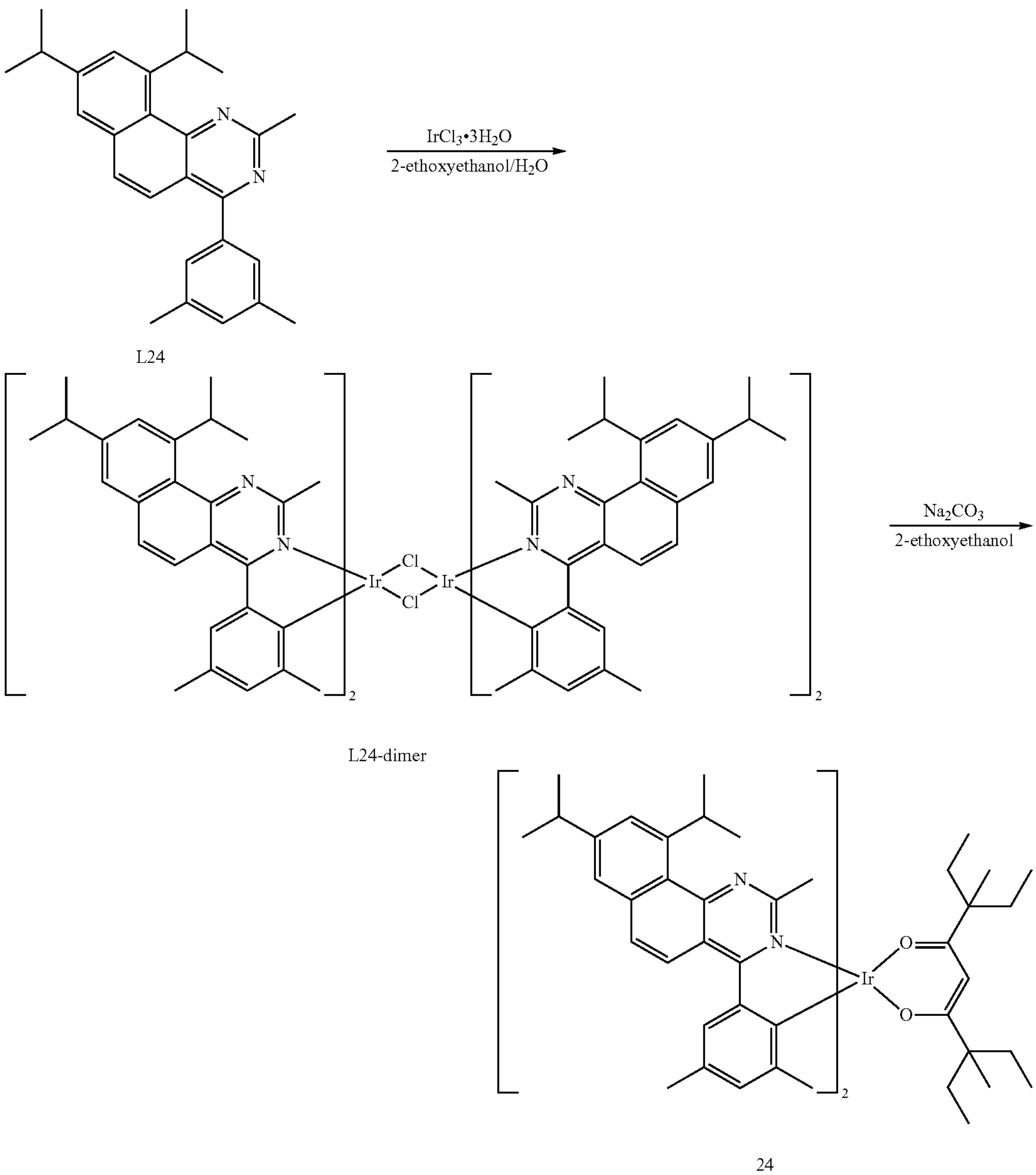

Synthesis of Compound L24-dimer

Compound L24 (4-(3,5-dimethylphenyl)-8,10-diisopropyl-2-methylbenzo[h]quinazoline) (1.86 grams (g), 4.86 millimoles (mmol)) and iridium chloride hydrate (0.76 g, 2.16 mmol) were mixed with 24 milliliters (mL) of 2-ethoxyethanol and 8 mL of deionized water, and the mixture was stirred at reflux for 24 hours at 120° C. and after the reaction, cooled to room temperature (ca. 25° C.). A solid material formed therefrom was separated by filtration and washed thoroughly with water, methanol, and hexane in the stated order to obtain a solid which was then dried in a vacuum oven to obtain Compound L24-dimer (1.50 g, 70%). The obtained compound was used in the synthesis of compound 24 without further purification.

Synthesis of Compound 24

Compound L24-dimer (0.96 g, 0.5 mmol), 3,7-diethyl-3,7-dimethylnonane-4,6-dione (0.72 g, 3.01 mmol), and $Na_2CO_3$ (0.32 g, 3.01 mmol) were mixed with 30 mL of 2-ethoxyethanol, and then stirred for 24 hours to proceed reaction. An organic layer was extracted from the resultant obtained therefrom by using ethyl acetate, anhydrous magnesium sulfate ($MgSO_4$) was added thereto to remove water, and followed by filtration to obtain a filtrate which was then decompressed to obtain residue, which was then purified by performing column chromatography using a mixture of dichloromethane and hexane (1:1 vol/vol), to thereby obtain Compound 24 (0.64 g, 53%). The obtained compound was identified by high resolution mass spectrometry (HRMS) and high performance liquid chromatography (HPLC) analysis.

HRMS (matrix assisted laser desorption ionization-time of flight, MALDI-TOF) calcd. for $C_{69}H_{85}IrN_4O_2$: m/z 1194.6302, Found: 1194.6300.

Synthesis Example 2 (Compound 485)

Scheme 2 shows the synthesis of Compound 485.

Synthesis of Compound L485-Dimer

Compound L485 (4-(3-(tert-butyl)-5-methylphenyl)-10-isopropylbenzo[h]quinazoline) (1.84 g, 5.00 mmol) and iridium chloride hydrate (0.78 g, 2.22 mmol) were mixed with 21 mL of 2-ethoxyethanol and 7 mL of deionized water, and the mixture was stirred at reflux for 24 hours at 120° C. and after the reaction, cooled to room temperature. A solid material formed therefrom was separated by filtration and washed thoroughly with water, methanol, and hexane in the stated order to obtain a solid which was then dried in a vacuum oven to obtain Compound L485-dimer (1.80 g, 84%). The obtained compound was used in the synthesis of compound 485 without further purification.

Scheme 2

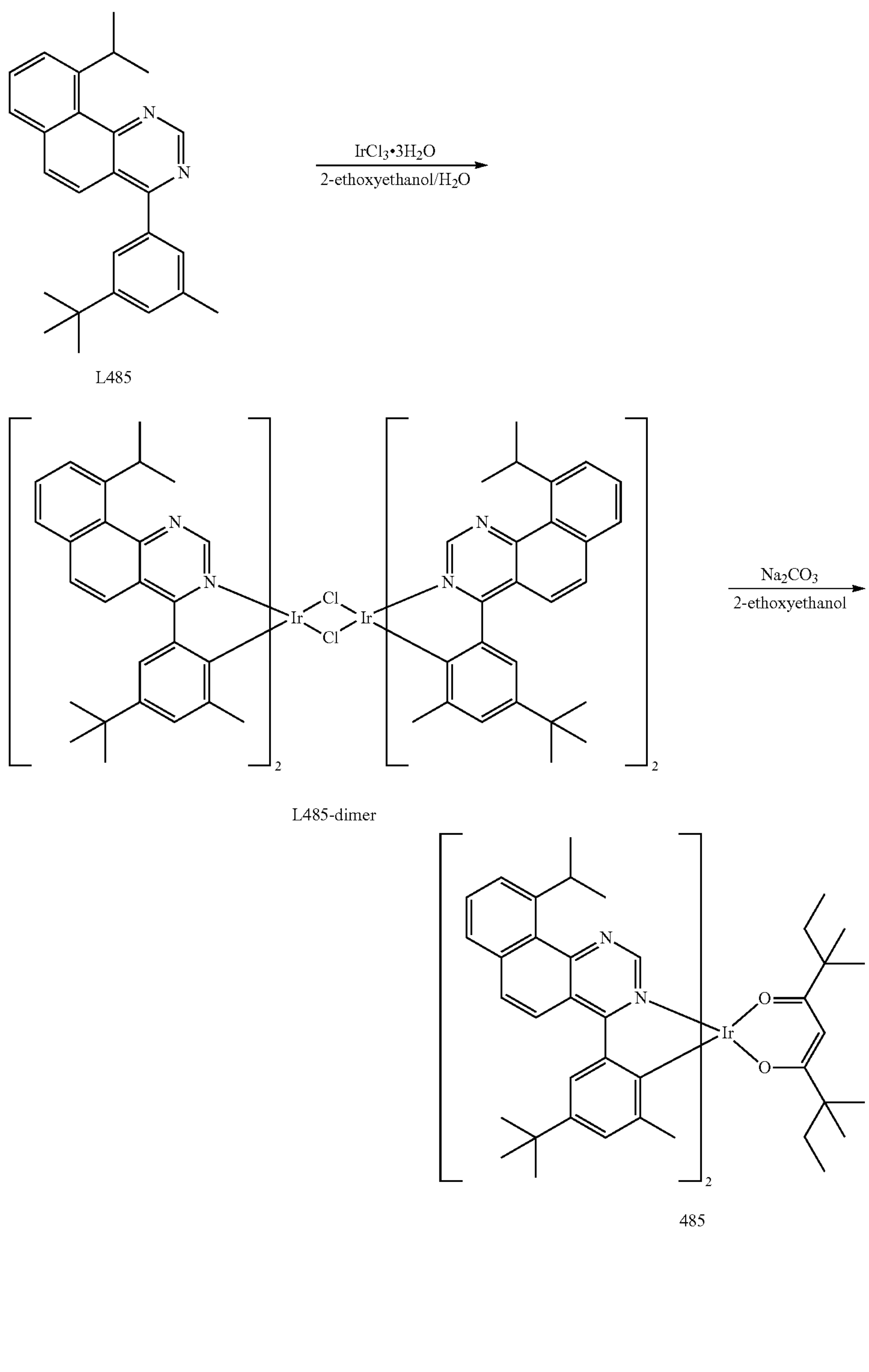

Synthesis of Compound 485

Compound L485-dimer (1.01 g, 0.53 mmol), 3,3,7,7-tetramethylnonane-4,6-dione (0.67 g, 3.16 mmol), and $Na_2CO_3$ (0.34 g, 3.16 mmol) were mixed with 30 mL of 2-ethoxyethanol, and then stirred for 24 hours to proceed reaction. An organic layer was extracted from the resultant obtained therefrom by using ethyl acetate, anhydrous magnesium sulfate ($MgSO_4$) was added thereto to remove water, and followed by filtration to obtain a filtrate which was then decompressed to obtain residue, which was then purified by performing column chromatography using a mixture of dichloromethane and hexane (1:1 vol/vol), to thereby obtain Compound 485 (0.72 g, 60%). The obtained compound was identified by HRMS and HPLC analysis.

HRMS (MALDI-TOF) calcd for $C_{65}H_{77}IrN_4O_2$: m/z 1138.5676, Found: 1138.5676.

Synthesis Example 3 (Compound 507)

Scheme 3 shows the synthesis of Compound 507.

Synthesis of Compound L507-Dimer

Compound L507 (4-(3,5-dimethylphenyl)-2,8,10-trimethylbenzo[h]quinazoline) (1.67 g, 5.12 mmol) and iridium chloride hydrate (0.803 g, 2.28 mmol) were mixed with 18 mL of 2-ethoxyethanol and 6 mL of deionized water, and the mixture was stirred at reflux for 24 hours at 120° C. and after the reaction, cooled to room temperature. A solid material formed therefrom was separated by filtration and washed thoroughly with water, methanol, and hexane in the stated order to obtain a solid which was then dried in a vacuum oven to obtain Compound L507-dimer (1.61 g, 80%). The obtained compound was used in the synthesis of compound 507 without further purification.

Synthesis of Compound 507

Compound L507-dimer (1.11 g, 0.63 mmol), 2,2,6,6-tetramethylheptane-3,5-dione (0.70 g, 3.80 mmol), and $Na_2CO_3$ (0.40 g, 3.80 mmol) were mixed with 20 mL of 2-ethoxyethanol, and then stirred for 24 hours to proceed reaction. An organic layer was extracted from the resultant Scheme 3

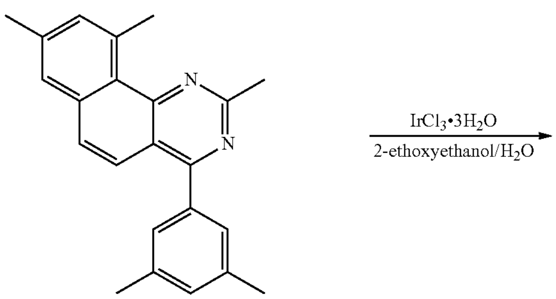

L507

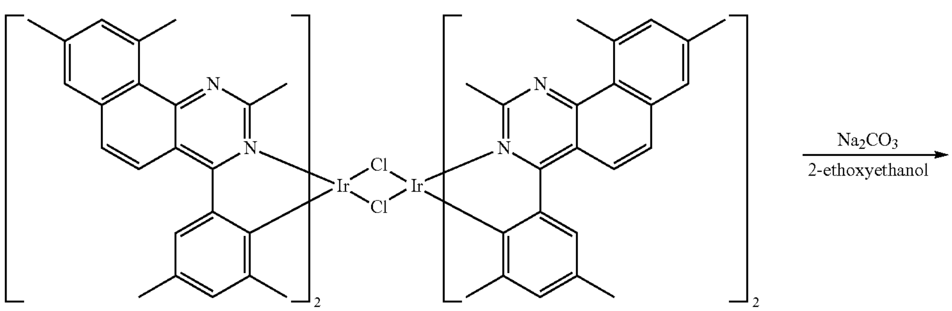

L507-dimer

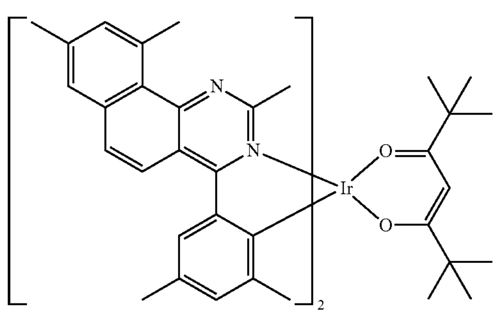

507 obtained therefrom by using ethyl acetate, anhydrous magnesium sulfate ($MgSO_4$) was added thereto to remove water, and followed by filtration to obtain a filtrate which was then decompressed to obtain residue, which was then purified by performing column chromatography using a mixture of dichloromethane and hexane (1:1 vol/vol), to thereby obtain Compound 507 (0.65 g, 50%). The obtained compound was identified by HRMS and HPLC analysis.

HRMS (MALDI-TOF) calcd for $C_{57}H_{61}IrN_4O_2$: m/z 1026.4424, Found: 1026.4422.

Synthesis Example 4 (Compound 531)

Scheme 4 shows the synthesis of Compound 531.

Scheme 4

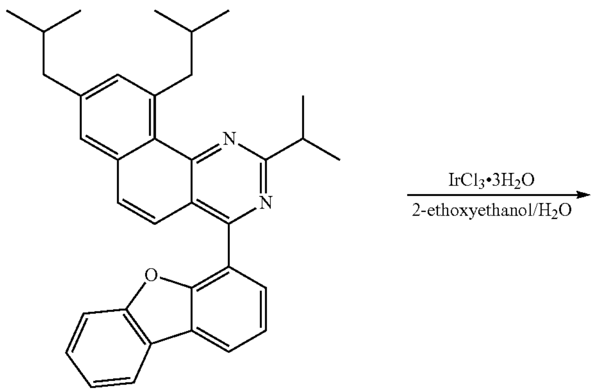

L531

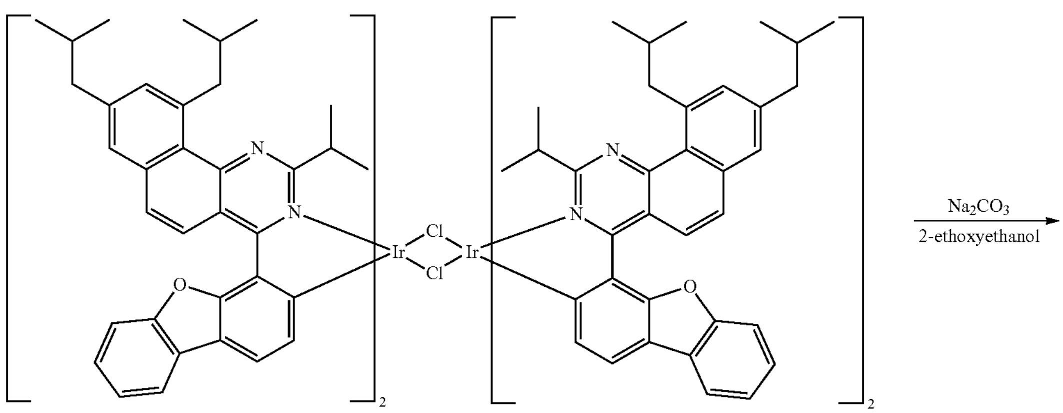

L531-dimer

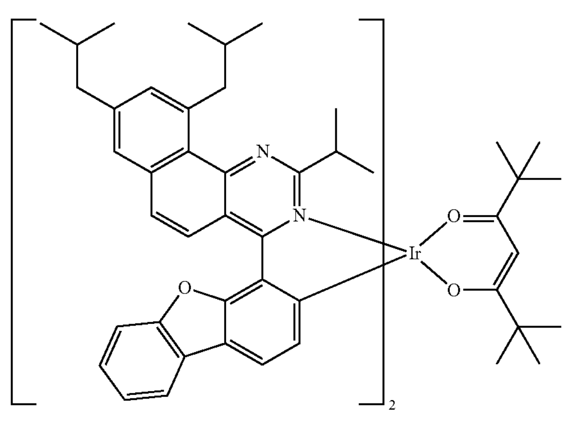

531

Synthesis of Compound L531-Dimer

Compound L531 (4-(dibenzo[b,d]furan-4-yl)-8,10-di-isobutyl-2-isopropylbenzo[h]quinazoline) (1.84 g, 3.67 mmol) and iridium chloride hydrate (0.57 g, 1.63 mmol) were mixed with 18 mL of 2-ethoxyethanol and 6 mL of deionized water, and the mixture was stirred at reflux for 24 hours at 120° C. and after the reaction, cooled to room temperature. A solid material formed therefrom was separated by filtration and washed thoroughly with water, methanol, and hexane in the stated order to obtain a solid which was then dried in a vacuum oven to obtain Compound L531-dimer (1.72 g, 80%). The obtained compound was used in the synthesis of compound 531 without further purification.

Synthesis of Compound 531

Compound L531-dimer (1.21 g, 0.49 mmol), 2,2,6,6-tetramethylheptane-3,5-dione (0.55 g, 2.96 mmol), and $Na_2CO_3$ (0.32 g, 2.96 mmol) were mixed with 20 mL of 2-ethoxyethanol, and then stirred for 24 hours to proceed reaction. An organic layer was extracted from the resultant obtained therefrom by using ethyl acetate, anhydrous magnesium sulfate ($MgSO_4$) was added thereto to remove water, and followed by filtration to obtain a filtrate which was then decompressed to obtain residue, which was then purified by performing column chromatography using a mixture of dichloromethane and hexane (1:1 vol/vol), to thereby obtain Compound 531 (0.55 g, 42%). The obtained compound was identified by HRMS and HPLC analysis.

HRMS (MALDI-TOF) calcd for $C_{77}H_{81}IrN_4O_2$: m/z 1318.5887, Found: 1318.5886.

Synthesis of Compound B

Scheme 5 shows the synthesis of Compound B.

Scheme 5

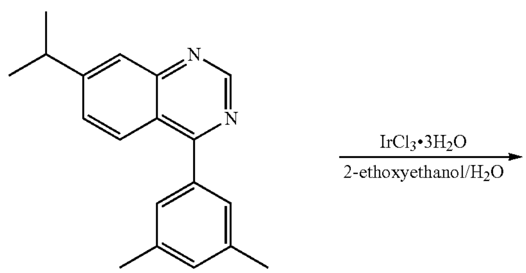

LB

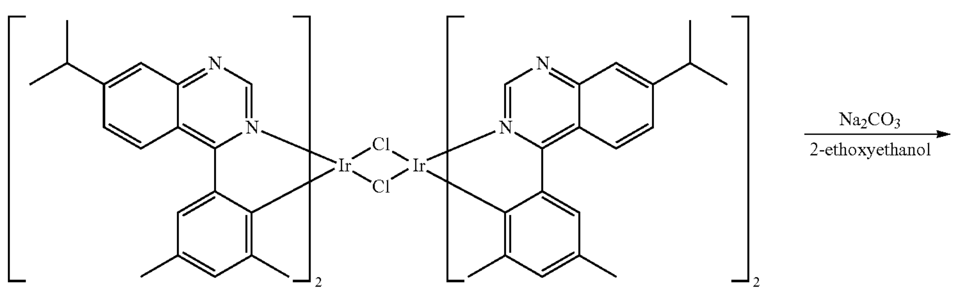

LB-dimer

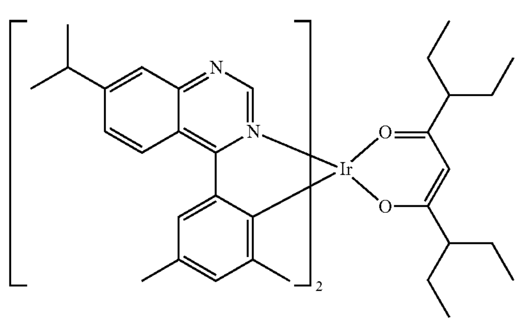

B

Synthesis of Compound LB-Dimer

Compound LB (4-(3,5-dimethylphenyl)-7-isopropylquinazoline) (2.01 g, 7.30 mmol) and iridium chloride hydrate (1.14 g, 3.24 mmol) were mixed with 30 mL of 2-ethoxyethanol and 10 mL of deionized water, and the mixture was stirred at reflux for 24 hours at 120° C. and after the reaction, cooled to room temperature. A solid material formed therefrom was separated by filtration and washed thoroughly with water, methanol, and hexane in the stated order to obtain a solid which was then dried in a vacuum oven to obtain Compound LB-dimer (1.51 g, 60%). The obtained compound was used in the synthesis of Compound B without further purification.

Synthesis of Compound B

Compound LB-dimer (1.05 g, 0.68 mmol), 3,7-diethylnonane-4,6-dione (0.86 g, 4.09 mmol), and $Na_2CO_3$ (0.43 g, 4.09 mmol) were mixed with 20 mL of 2-ethoxyethanol, and then stirred for 24 hours to proceed reaction. An organic layer was extracted from the resultant obtained therefrom by using ethyl acetate, anhydrous magnesium sulfate ($MgSO_4$) was added thereto to remove water, and followed by filtration to obtain a filtrate which was then decompressed to obtain residue, which was then purified by performing column chromatography using a mixture of dichloromethane and hexane (1:1 vol/vol), to thereby obtain Compound B (0.57 g, 42%). The obtained compound was identified by HRMS and HPLC analysis.

HRMS (MALDI-TOF) calcd for $C_{51}H_{61}IrN_4O_2$: m/z 954.4424, Found: 954.4422.

Example 1

As an anode, an ITO-patterned glass substrate was cut to a size of 50 millimeter (mm)×50 mm×0.5 mm, sonicated with isopropyl alcohol and deionized water each for 5 minutes, and then cleaned by exposure to ultraviolet rays and ozone for 30 minutes. The resultant glass substrate was loaded onto a vacuum deposition apparatus.

HT3 and F6-TCNNQ were vacuum-codeposited at the weight ratio of 98:2 on the ITO anode to form a hole injection layer having a thickness of 100 Angstrom (A), HT3 was vacuum-deposited on the hole injection layer to form a hole transport layer having a thickness of 1,350 Å, and then, HT21 was vacuum-deposited on the hole transport layer to form an electron blocking layer having a thickness of 300 Å.

Subsequently, H52 (host) and Compound 24 (dopant) were co-deposited at a weight ratio of 98:2 on the electron blocking layer to form an emission layer having a thickness of 400 Å.

Afterward, ET3 and ET-D1 were co-deposited at a volume ratio of 50:50 on the emission layer to form an electron transport layer having a thickness of 350 Å, ET-D1 was vacuum-deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device having a structure of ITO (1,500 Å)/HT3+F6-TCNNQ (2 wt %) (100 Å)/HT3 (1,350 Å)/HT21 (300 Å)/H52+Compound 24(2 wt %) (400 Å)/ET3+ET-D1 (50%) (350 Å)/ET-D1 (10 Å)/Al (1,000 Å).

HT3

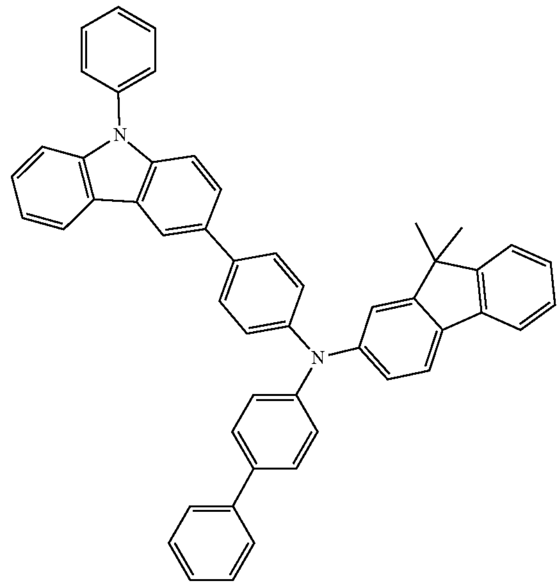

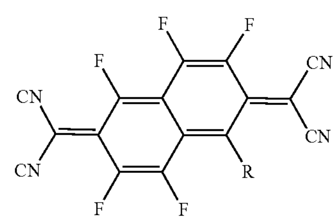

F6-TCNNQ

HT21

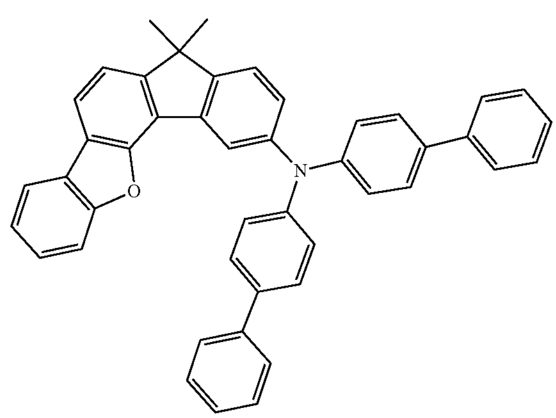

-continued

H52

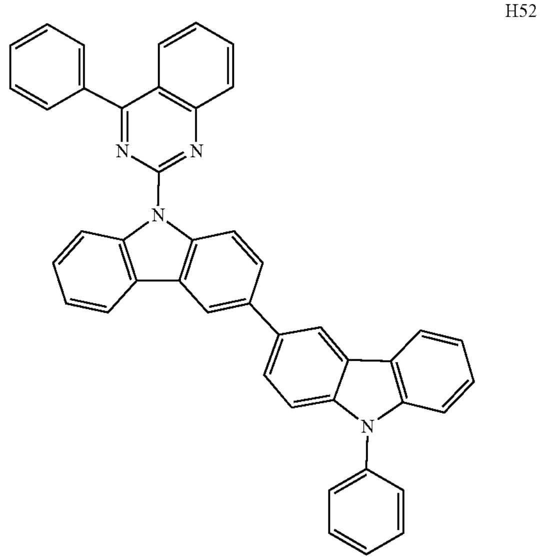

ET3

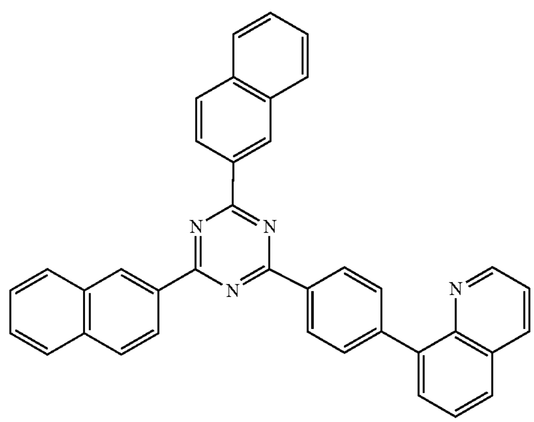

-continued

ET-D1

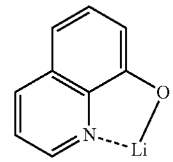

Examples 2 to 4 and Comparative Examples A to B

Organic light-emitting devices were manufactured in the same manner as in Example 1, except that in forming an emission layer, for use as a dopant, corresponding compounds shown in Table 2 were used instead of Compound 24.

Evaluation Example 1

For each organic light-emitting device manufactured according to Examples 1 to 4 and Comparative Examples A to B, driving voltage (voltage, V), a maximum value of external quantum efficiency (Max EQE, %), a roll-off ratio (%), a full width at half maximum (FWHM) of an emission peak in an electroluminescence (EL) spectrum, and lifespan $LT_{97}$ were evaluated, and results thereof are shown in Table 2. As evaluation devices, a current-voltmeter (Keithley 2400) and luminance meter (Minolta Cs-1000A) were used, and the lifespan ($LT_{97}$) (at 3500 candela per square meter, $cd/m^2$) was evaluated as the time (hours, hr) taken for luminance to reduce to 97% of 100% of the initial luminance. In Table 2, listed data of Max EQE and lifespan are in relative values (%). The roll-off ratio was calculated according to Equation 20 below.

$$\text{Roll off ratio}=[1-(\text{efficiency (at 3,500 cd/m}^2\text{)/maximum emission efficiency})]\times 100\% \quad \text{Equation 20}$$

TABLE 2

| | Dopant in emission layer | Driving voltage (V) | Max EQE (Relative value, %) | Roll-off ratio (%) | FWHM (nm) | $LT_{97}$ (3,500 $cd/m^2$) (Relative value, %) |
|---|---|---|---|---|---|---|
| Example 1 | 24 | 4.65 | 188 | 8 | 50 | 329 |
| Example 2 | 485 | 4.63 | 181 | 8 | 52 | 301 |
| Example 3 | 507 | 4.61 | 165 | 7 | 50 | 316 |
| Example 4 | 531 | 4.68 | 176 | 9 | 51 | 308 |
| Comparative Example A | A | 4.94 | 132 | 11 | 72 | 202 |
| Comparative Example B | B | 4.87 | 100 | 12 | 65 | 100 |

TABLE 2-continued
| | Dopant in emission layer | Driving voltage (V) | Max EQE (Relative value, %) | Roll-off ratio (%) | FWHM (nm) | $LT_{97}$ (3,500 cd/$m^2$) (Relative value, %) |
|---|---|---|---|---|---|---|
| 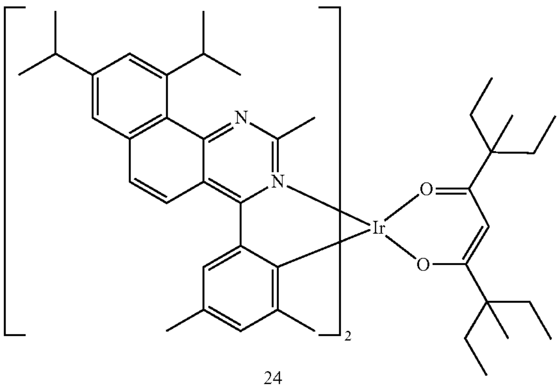 24 | | | | | | |
| 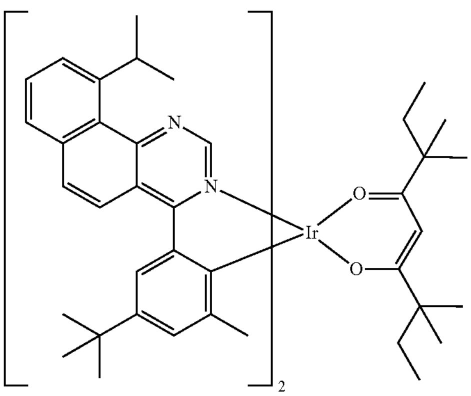 485 | | | | | | |
| 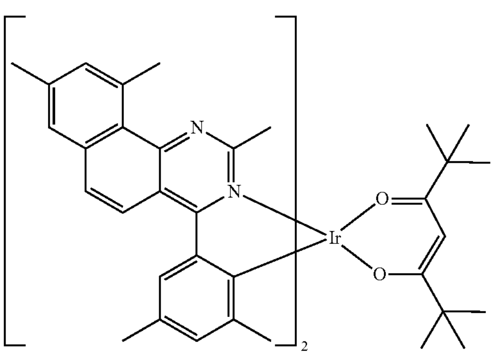 507 | | | | | | |

TABLE 2-continued

| | Dopant in emission layer | Driving voltage (V) | Max EQE (Relative value, %) | Roll-off ratio (%) | FWHM (nm) | $LT_{97}$ (3,500 cd/m$^2$) (Relative value, %) |
|---|---|---|---|---|---|---|
| 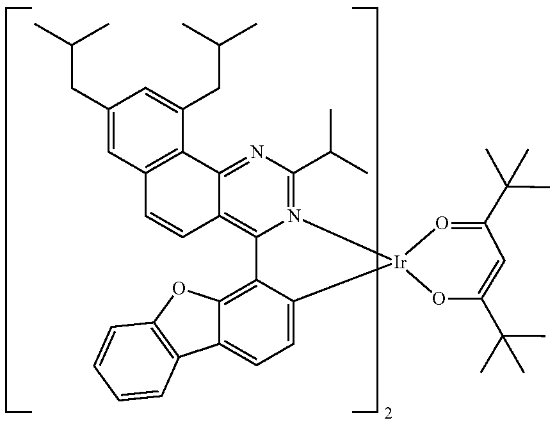 531 | | | | | | |
| 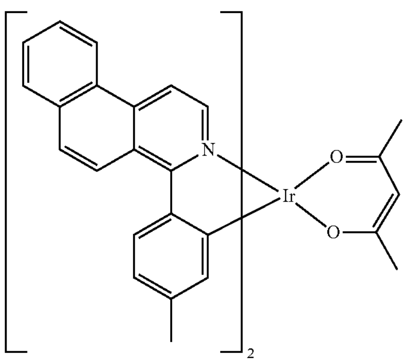 A | | | | | | |
| 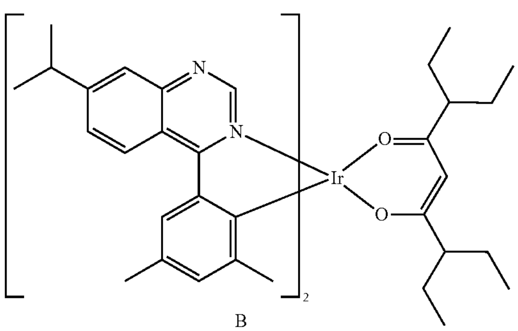 B | | | | | | |

Referring to Table 2, it is confirmed that the organic light-emitting devices manufactured according to Examples 1 to 4 have improved driving voltage, improved external quantum efficiency, improved roll-off ratios, and improved lifespan and may emit light having relatively narrow (or, small) FWHM, compared to the organic light-emitting devices manufactured according to Comparative Examples A and B.

Since the organometallic compound have excellent thermal stability and electrical characteristics, an electronic device, for example, an organic light-emitting device, including the organometallic compound, may have improved characteristics in terms of driving voltage, external quantum efficiency, roll-off ratio, and lifespan and may emit light having relatively narrow (or, small) FWHM, and thus high-quality electronic apparatus may be provided by using the organic light-emitting device.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the FIGURE, it will be understood by those of ordinary skill in the art that various changes in form and details may be made therein without departing from the spirit and scope as defined by the following claims.

What is claimed is:

1. An organometallic compound represented by Formula 1:

$$M(L_1)_{n1}(L_2)_{n2}$$ Formula 1 wherein, in Formula 1,

M is a transition metal, $L_1$ is a ligand represented by Formula 2, n1 is 1, 2, or 3, wherein, when n1 is 2 or greater, ligands Li are identical to or different from each other, $L_2$ is a group represented by Formula 3-1(301), n2 is 0, 1, 2, 3, or 4, wherein, when n2 is 2 or greater, ligands $L_2$ are identical to or different from each other, and $L_1$ and $L_2$ are different from each other, Formula 2

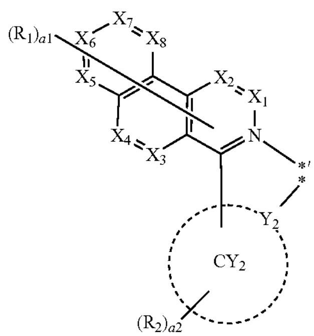

wherein, in Formula 2, $X_1$ to $X_8$ are each independently C or N, and at least one of $X_1$ to $X_8$ is N, $Y_2$ is C, ring $CY_2$ is a group represented by one of Formulae CY2(63) to CY2(68):

CY2(63)

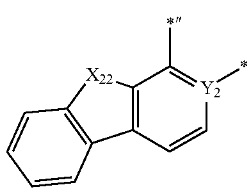

CY2(64)

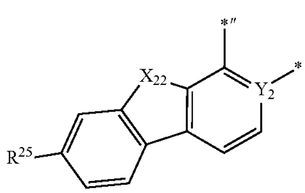

CY2(65)

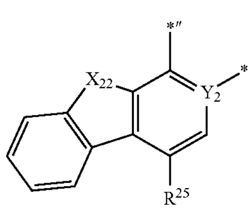

-continued

CY2(66)

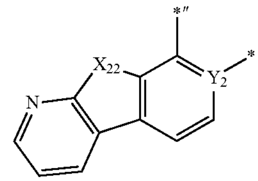

CY2(67)

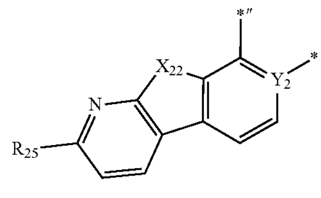

CY2(68)

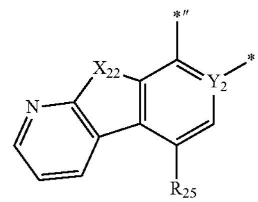

$X_{22}$ is $C(R_{28})(R_{29})$, $N(R_{28})$, O, S, or $Si(R_{28})(R_{29})$, $R_{25}$ is the same as described in connection with $R_2$,

*" indicates a binding site to a carbon atom of a neighboring 6-membered ring in Formula 2, and

* indicates a binding site to M in Formula 1, a25 is an integer from 0 to 5, a26 is an integer from 0 to 6, $R_1$ and $R_2$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, a1 is an integer from 0 to 7, a2 is an integer from 0 to 20, two or more of a plurality of groups $R_1$ are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of groups $R_2$ are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as described in connection with $R_2$,

* and *' each indicate a binding site to M in Formula 1, 3-1(101)

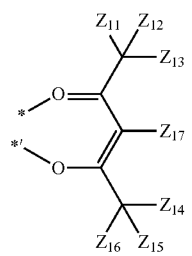

wherein, in Formula 3-1(301), $Z_{11}$ to $Z_{17}$ are the same as described in connection with $R_2$, and substituents of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group are each independently:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, or $—P(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group, each unsubstituted or substituted with at least one of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, or $—P(Q_{28})(Q_{29})$;

$—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$; or a combination thereof, and $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with at least one of deuterium, a $C_1$-$C_{60}$ alkyl group, or a $C_6$-$C_{60}$ aryl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with at least one of deuterium, a $C_1$-$C_{60}$ alkyl group, or a $C_6$-$C_{60}$ aryl group; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a $C_2$-$C_{60}$ alkylheteroaryl group;

a monovalent non-aromatic condensed polycyclic group; or a monovalent non-aromatic condensed heteropolycyclic group.

2. The organometallic compound of claim 1, wherein $R_2$ are each independently:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_2$-$C_{20}$ alkenyl group, a $C_1$-$C_{20}$ alkoxy group, or a $C_1$-$C_{20}$ alkylthio group;

a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl) adamantanyl group, a ($C_1$-$C_{20}$ alkyl) norbornanyl group, a ($C_1$-$C_{20}$ alkyl) norbornenyl group, a ($C_1$-$C_{20}$ alkyl) cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl) bicyclo[1.1.1]pentyl group, a ($C_1$-$C_{20}$ alkyl) bicyclo[2.1.1]hexyl group, a ($C_1$-$C_{20}$ alkyl) bicyclo[2.2.2]octyl group, a phenyl group, a ($C_1$-$C_{20}$ alkyl) phenyl group, a biphenyl group, a terphenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl) adamantanyl group, a ($C_1$-$C_{20}$ alkyl) norbornanyl group, a ($C_1$-$C_{20}$ alkyl) norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl) bicyclo[1.1.1]pentyl group, a ($C_1$-$C_{20}$ alkyl) bicyclo[2.1.1]hexyl group, a ($C_1$-$C_{20}$ alkyl) bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group; or —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, wherein $Q_1$ to $Q_9$ are each independently:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, or a phenyl group.

3. The organometallic compound of claim 1, wherein the ligand represented by Formula 2 comprises:

a $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, a fluoro group, or deuterium;

a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, or a fluorinated terphenyl group, each unsubstituted or substituted with at least one of deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group;

a deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, a deuterated biphenyl group, or a deuterated terphenyl group, each unsubstituted or substituted with at least one of —F, a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group;

—Si($Q_3$)($Q_4$)($Q_5$) or —Ge($Q_3$)($Q_4$)($Q_5$); or a combination thereof.

4. The organometallic compound of claim 1, wherein Formula 3-1(301) satisfies at least one of Condition 1 to Condition 3:

Condition 1

$Z_{11}$ to $Z_{16}$ in Formula 3-1(301) are each independently a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group;

Condition 2 at least one of $Z_{11}$ to $Z_{16}$ in Formula 3-1(301) is a substituted or unsubstituted $C_2$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group; or Condition 3

$Z_{17}$ in Formula 3-1(301) is deuterium, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group.

5. The organometallic compound of claim 4, wherein Formula 3-1(301) satisfies at least one of Condition 4 and Condition 5:

Condition 4 two or more of $Z_{11}$ to $Z_{13}$ in Formula 3-1(301) are linked to each other such that a group represented by *—C($Z_{11}$)($Z_{12}$)($Z_{13}$) in the group represented by Formula 3-1(301) is a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$; or Condition 5 two or more of $Z_{14}$ to $Z_{16}$ in Formula 3-1(301) are linked to each other such that a group represented by *—C($Z_{14}$)($Z_{15}$)($Z_{16}$) in the group represented by Formula 3-1(301) is a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

6. The organometallic compound of claim 1, wherein the organometallic compound is one of:

121

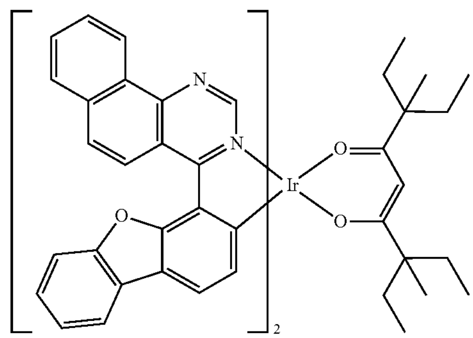

122

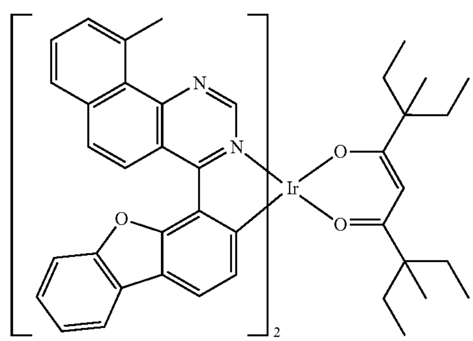

123

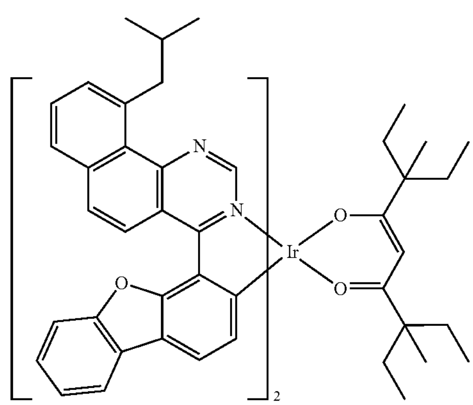

124
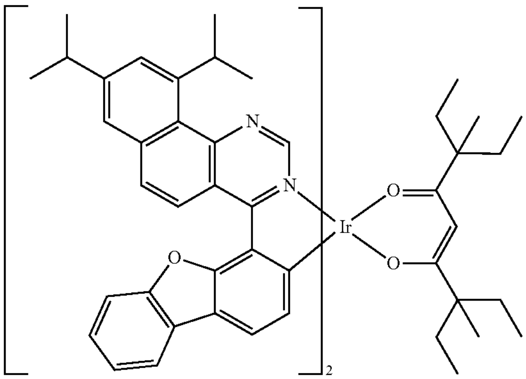
125
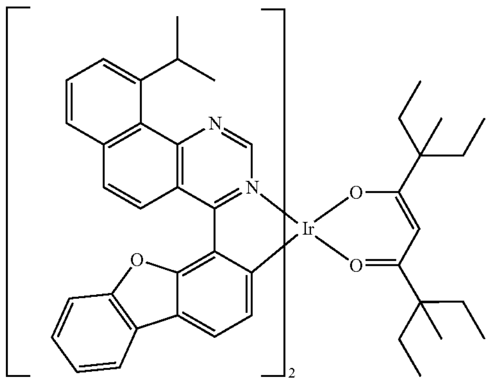
126
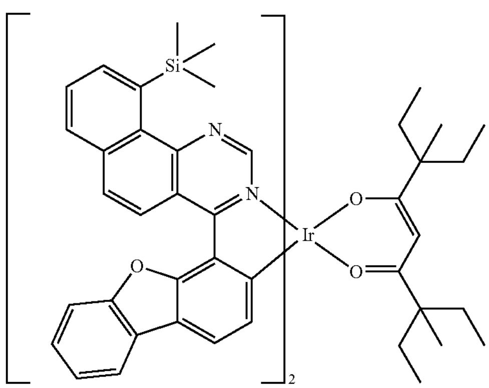
127
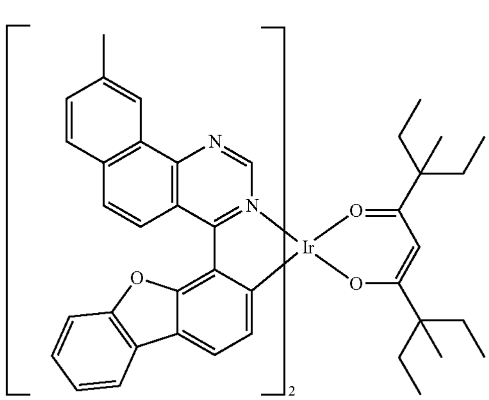
128
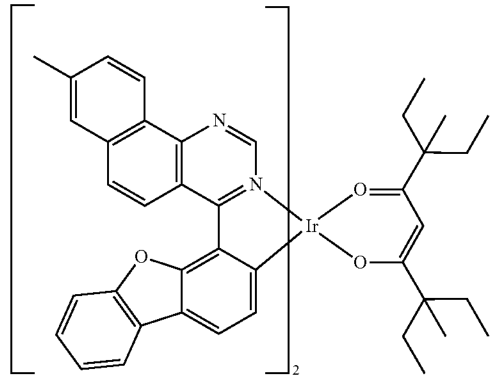
129
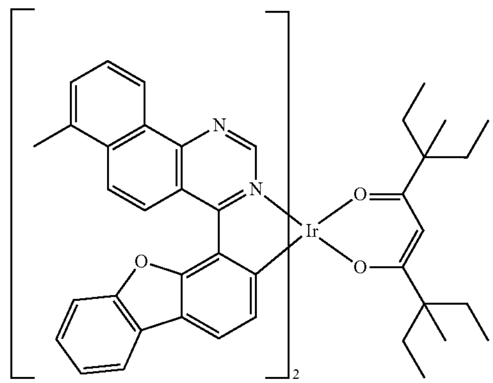
130
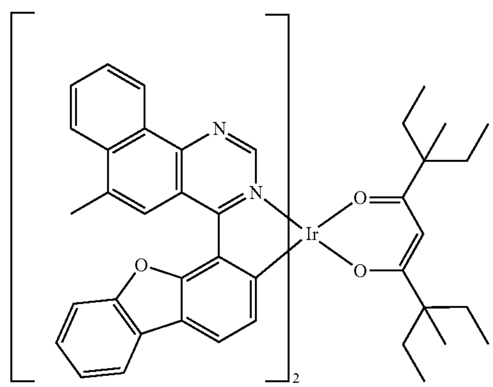
131
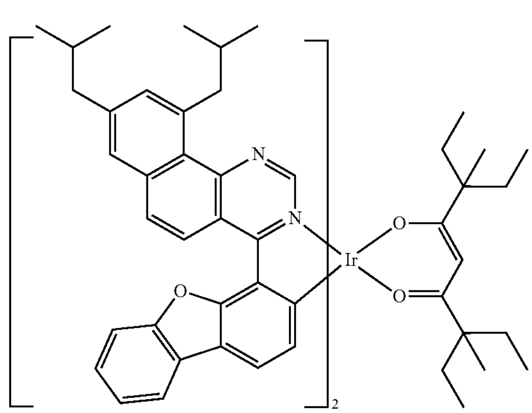

-continued
132
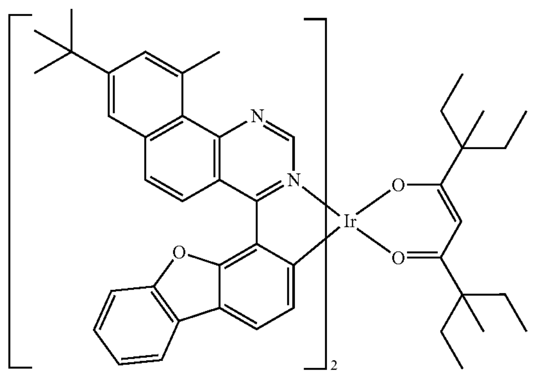
133
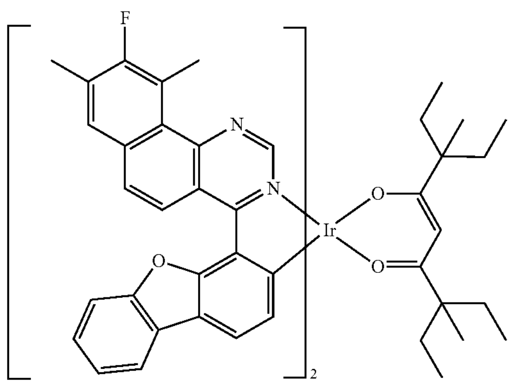
134
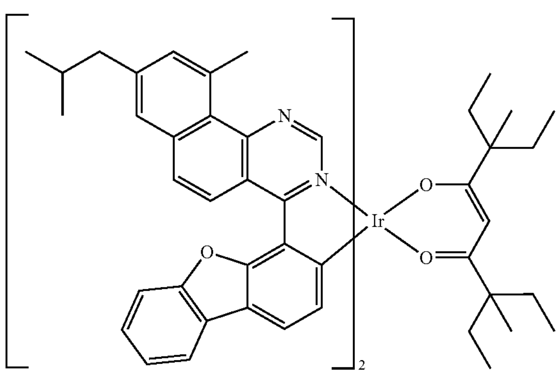
135
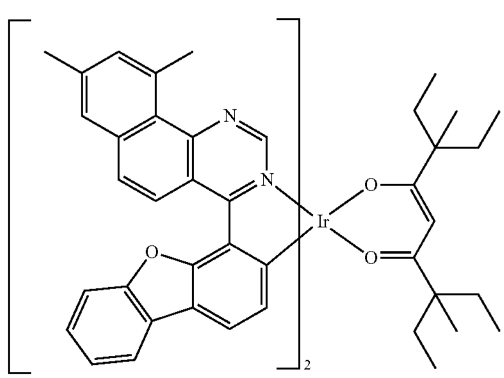
-continued
136
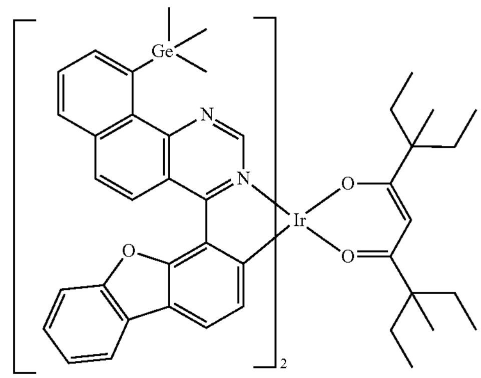
137
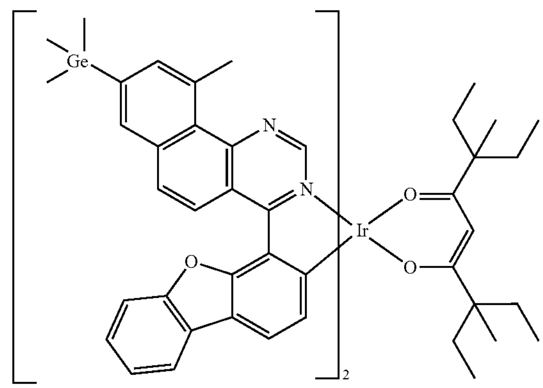
138
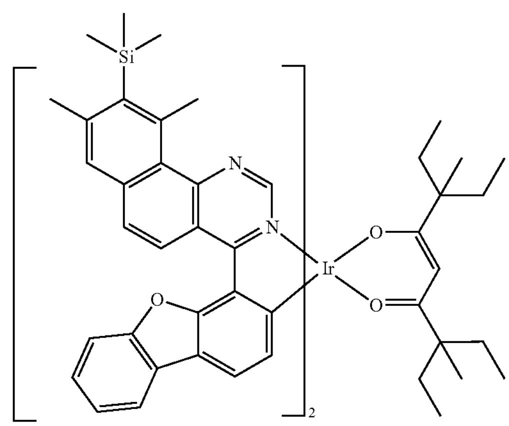
139
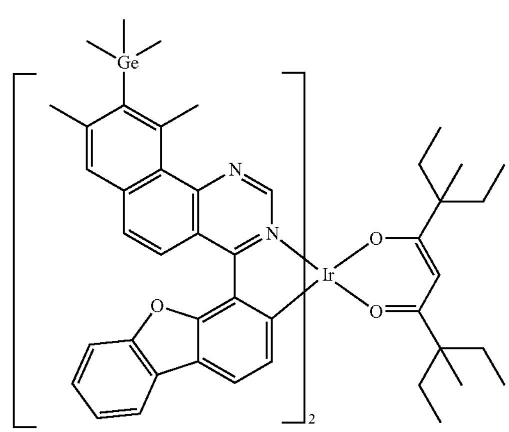

-continued
140
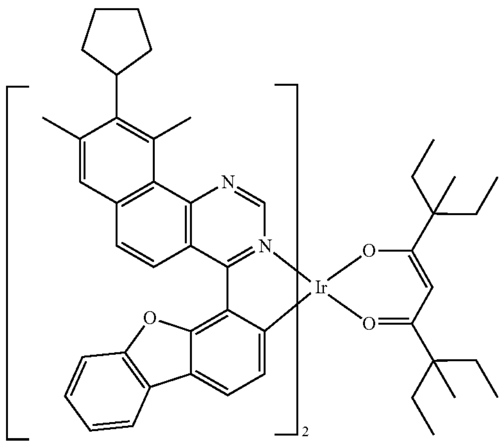
141
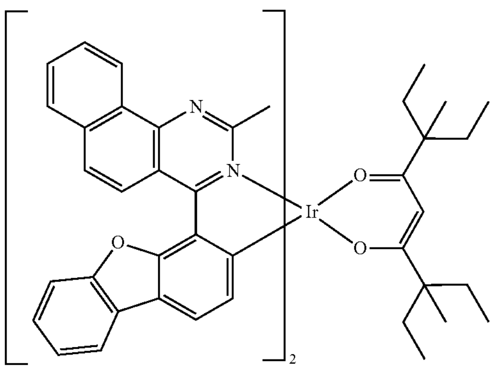
142
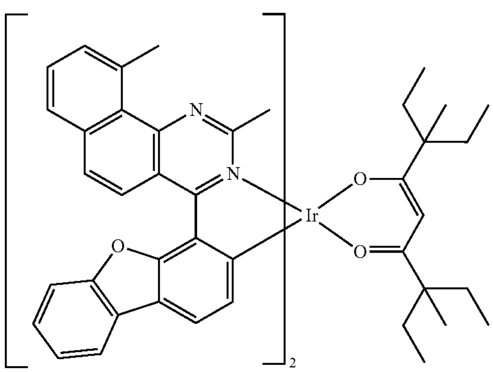
143
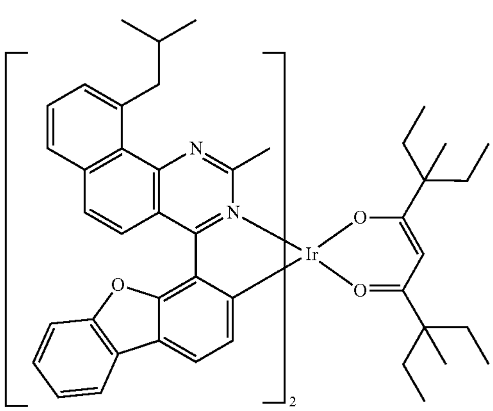
-continued
144
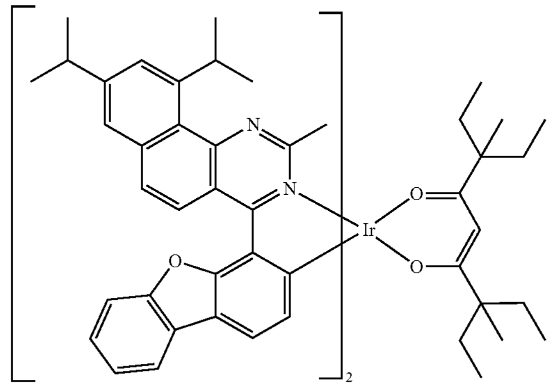
145
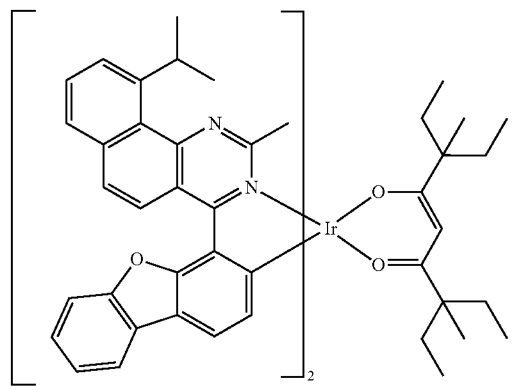
146
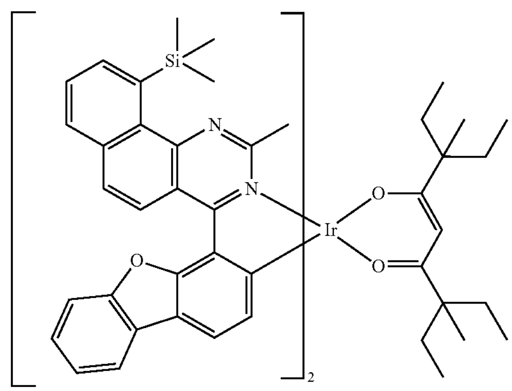
147
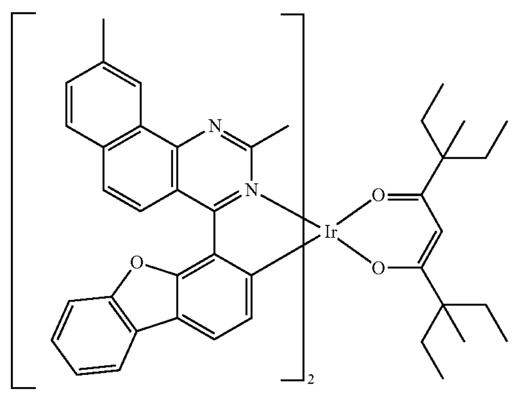

-continued
148
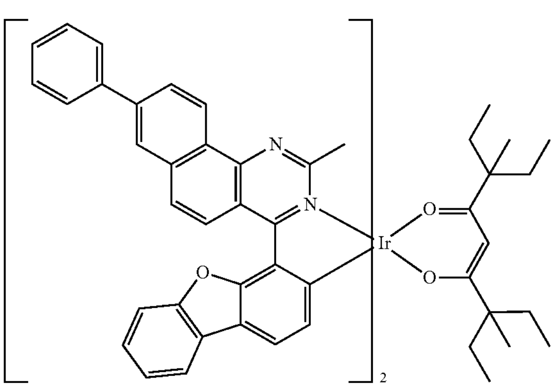
149
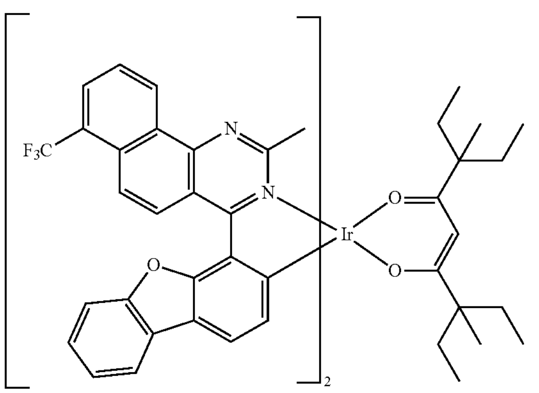
150
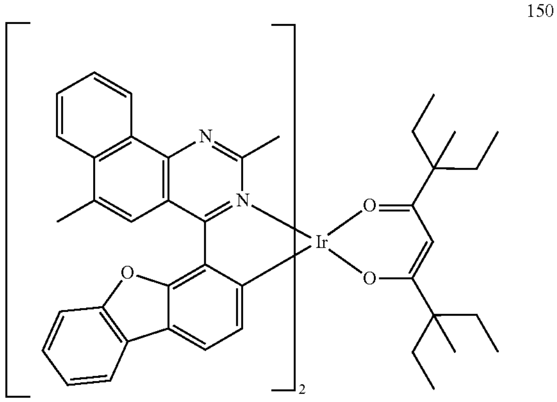
151
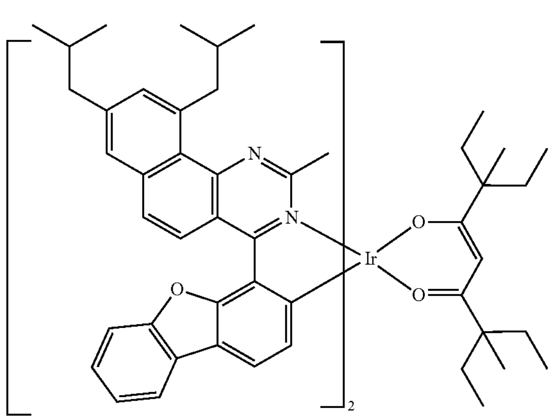
-continued
152
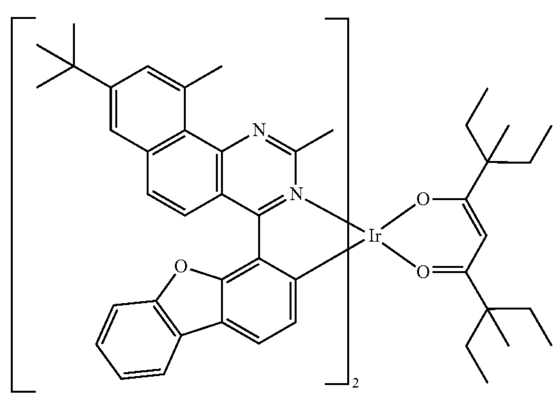
153
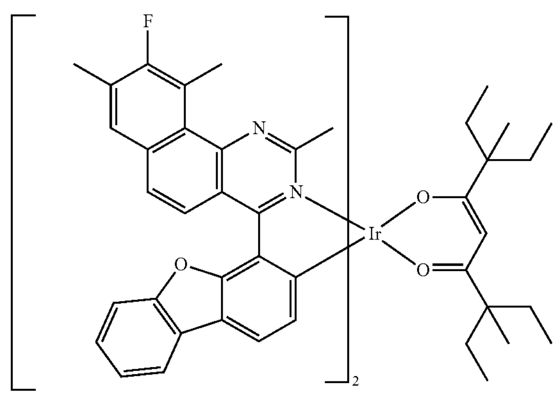
154
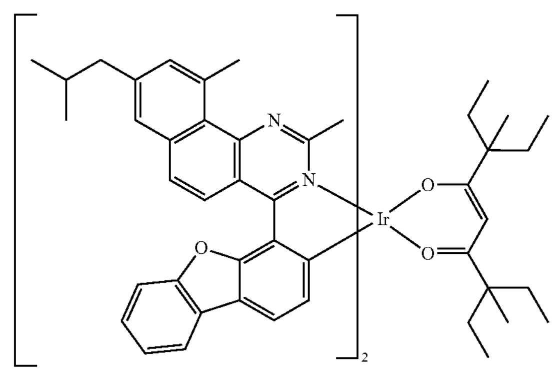
155
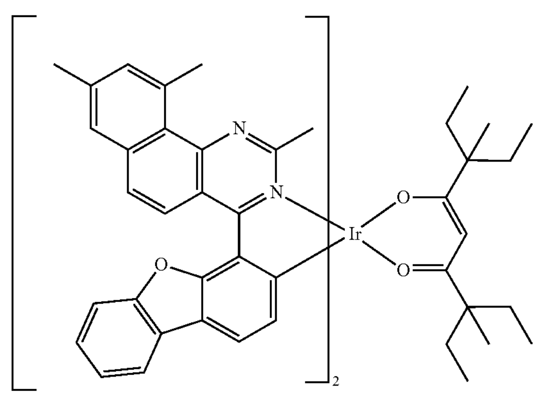

-continued
156
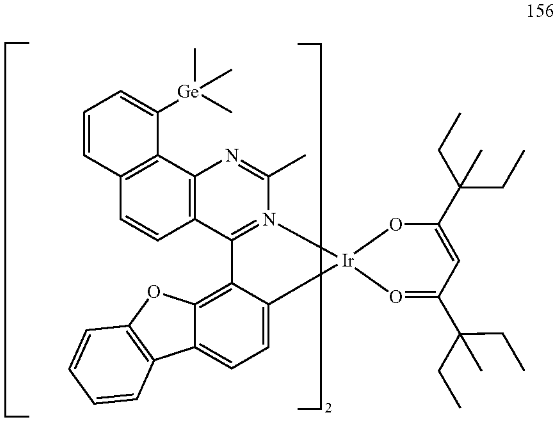
157
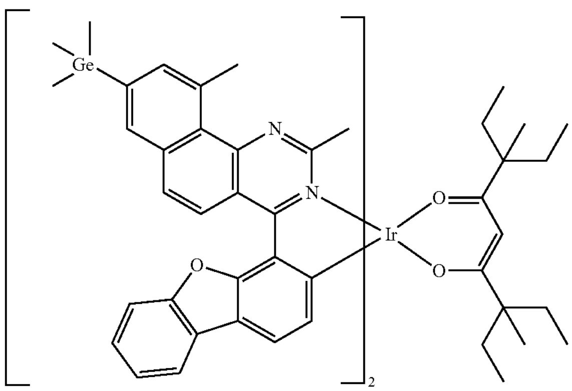
158
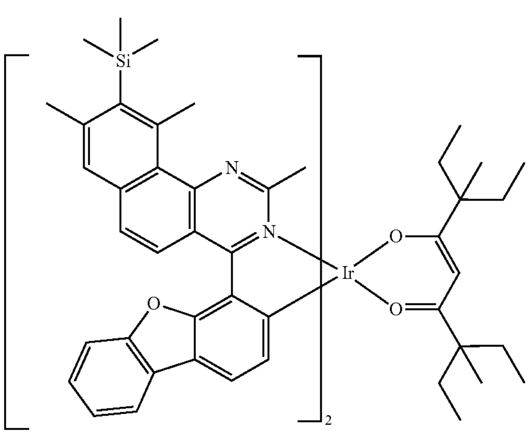
-continued
159
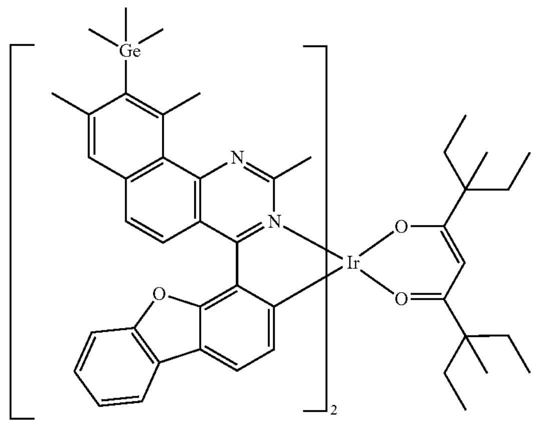
160
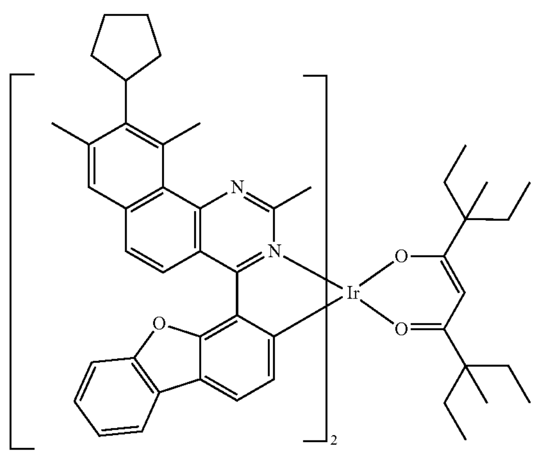
161
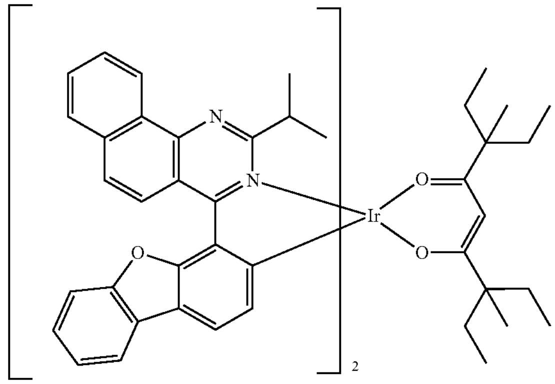

-continued
162
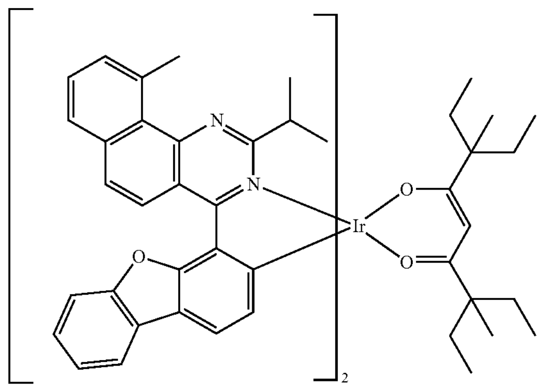
163
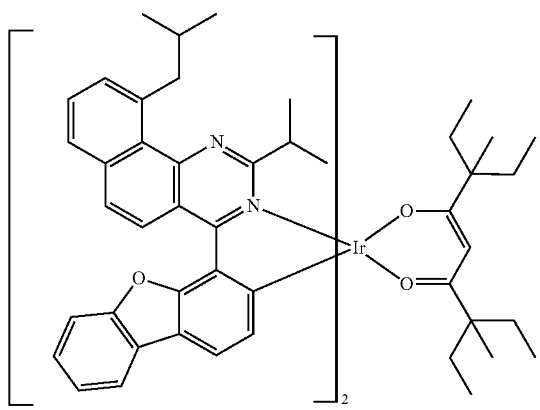
164
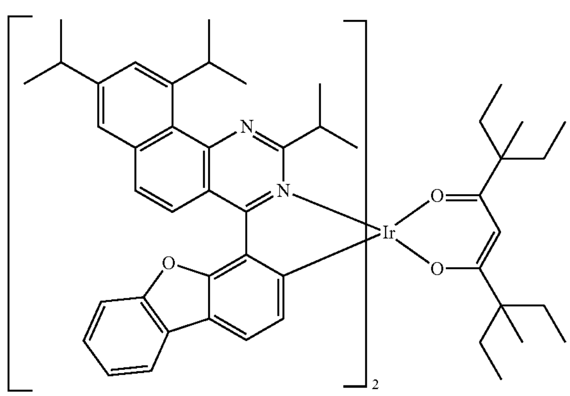
165
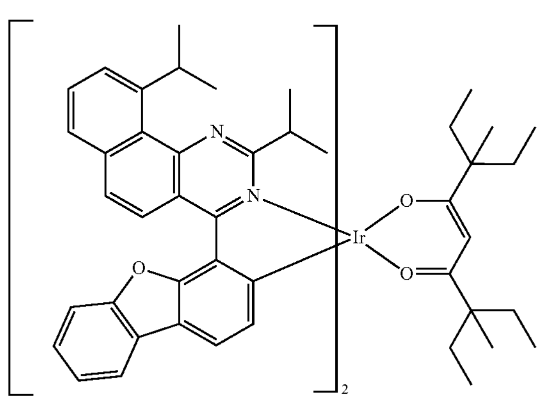
-continued
166
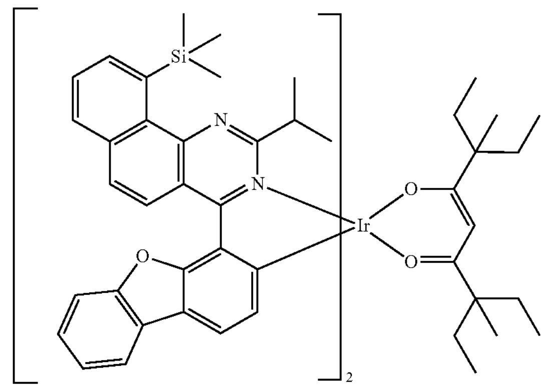
167
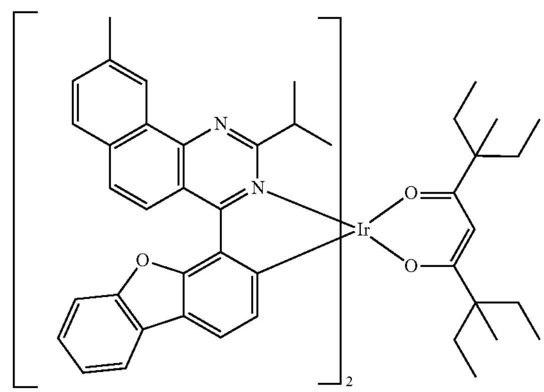
168
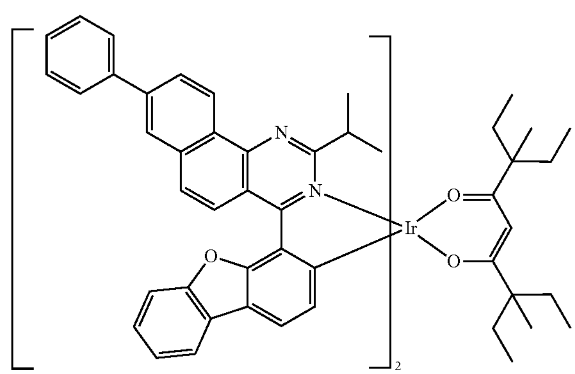
169
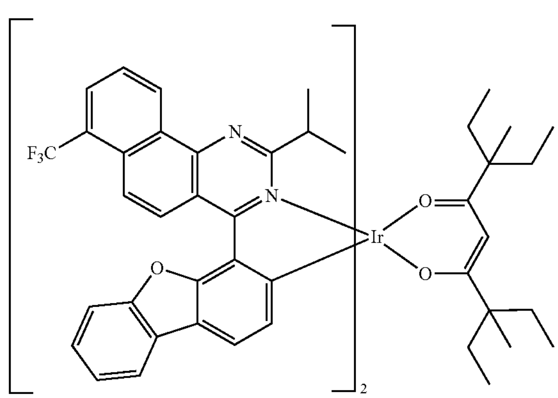

170
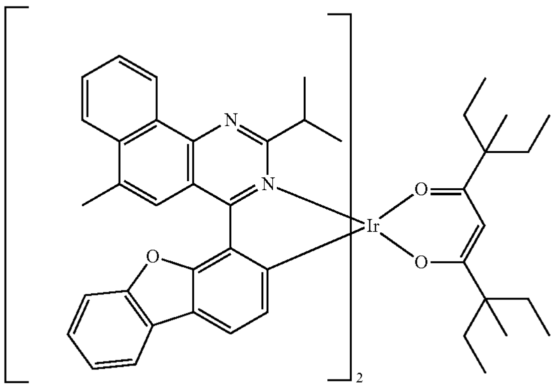
173
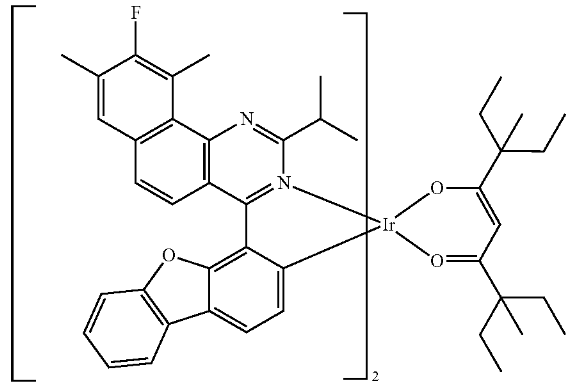
171
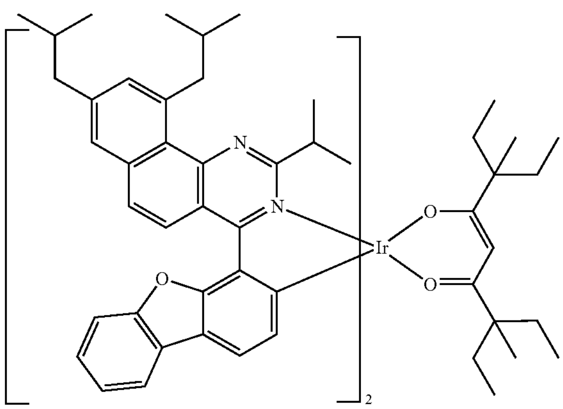
174
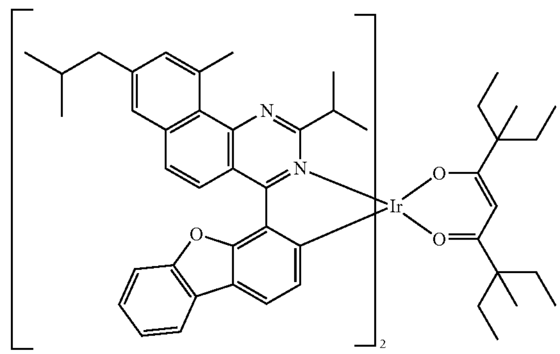
175
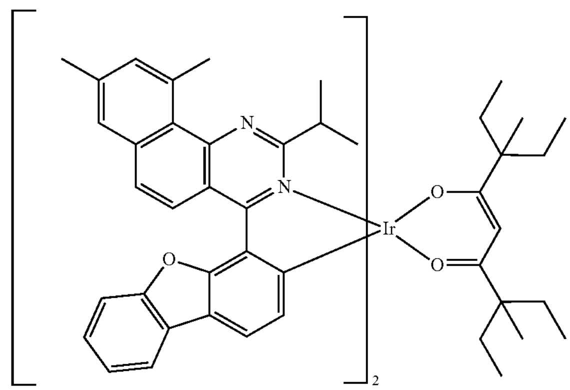
172
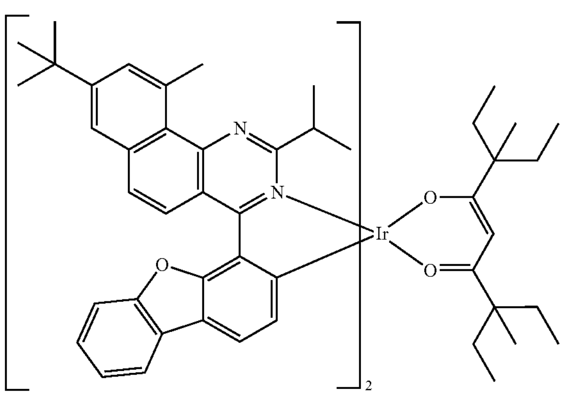
176
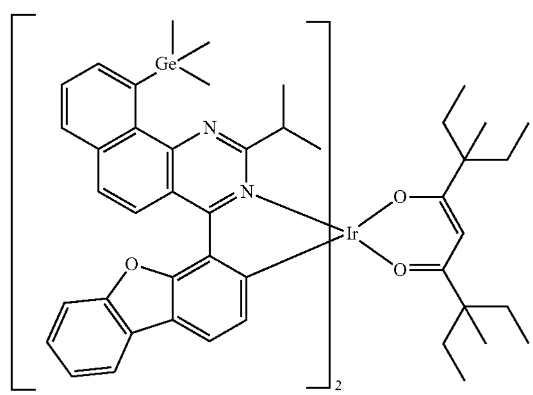

177
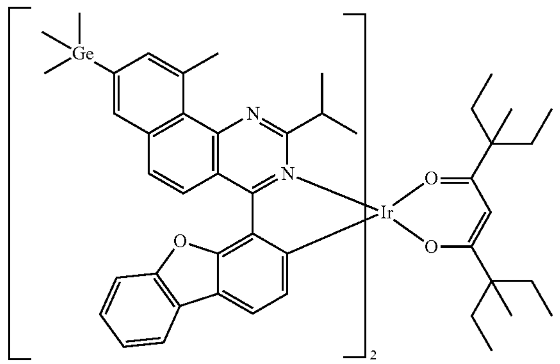
178
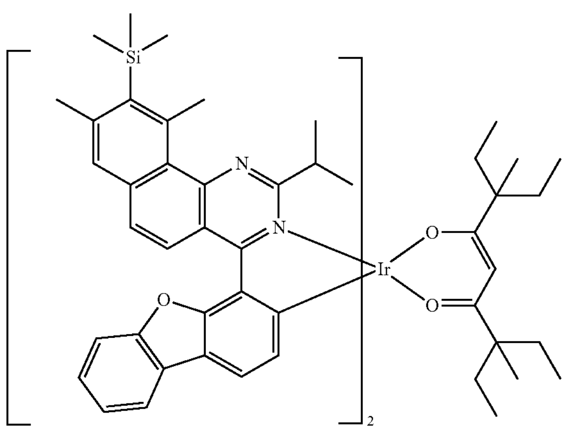
179
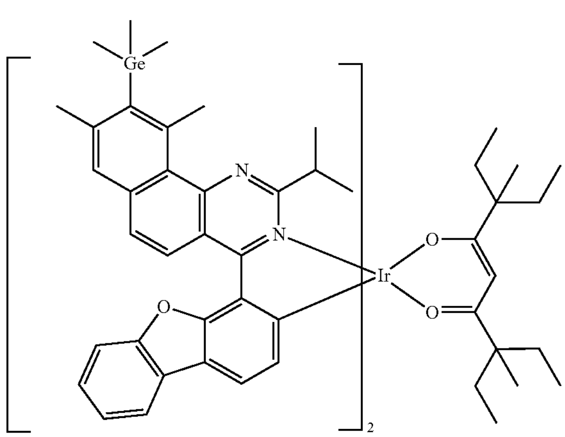
180
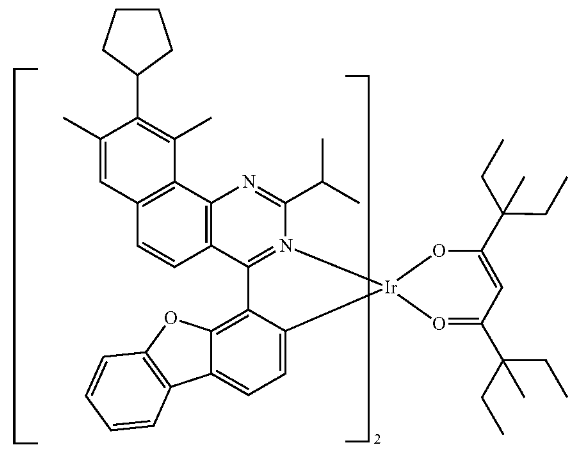
181
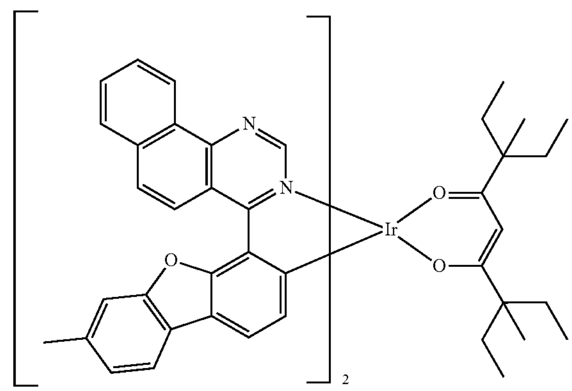
182
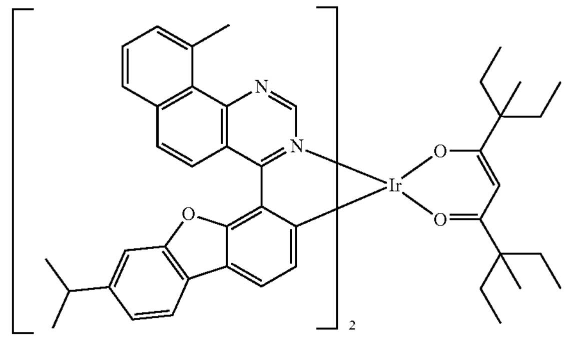

-continued
183
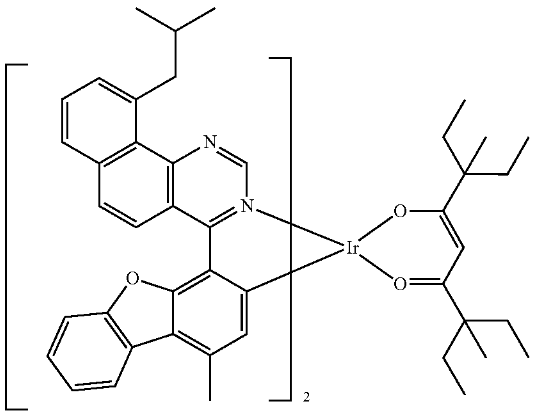
184
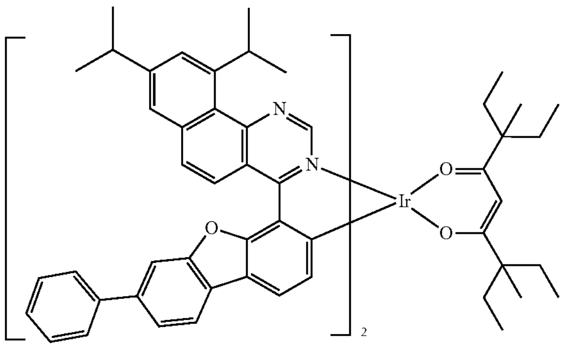
185
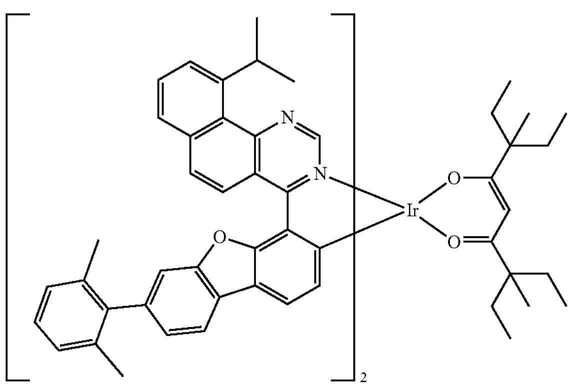
186
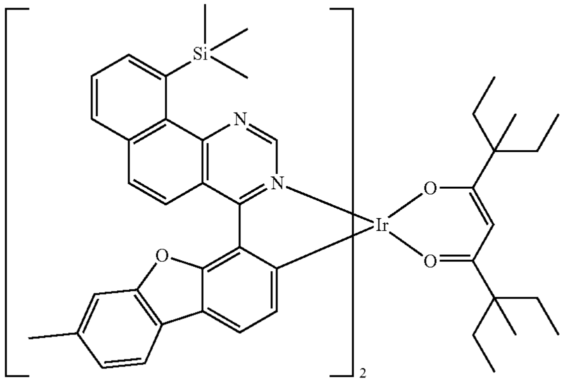
-continued
187
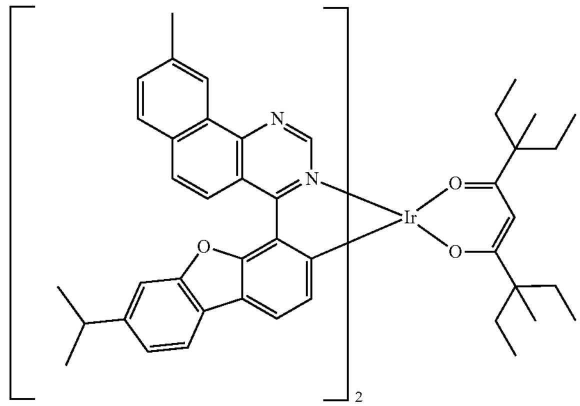
188
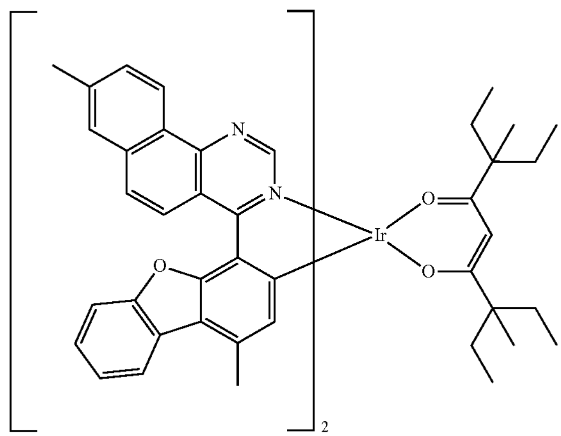
189
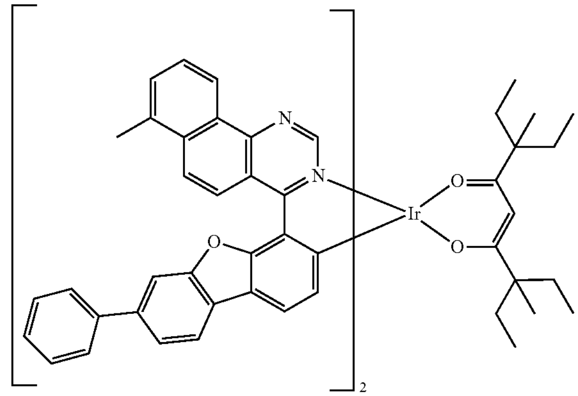

190
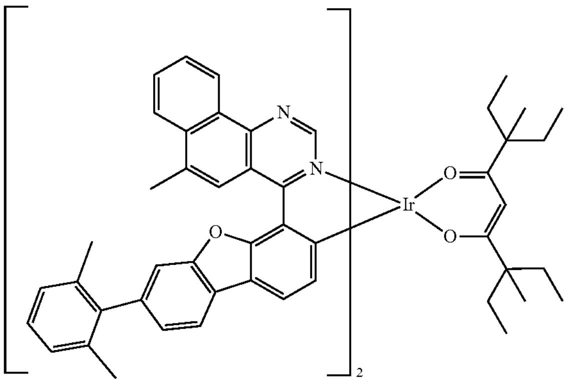
191
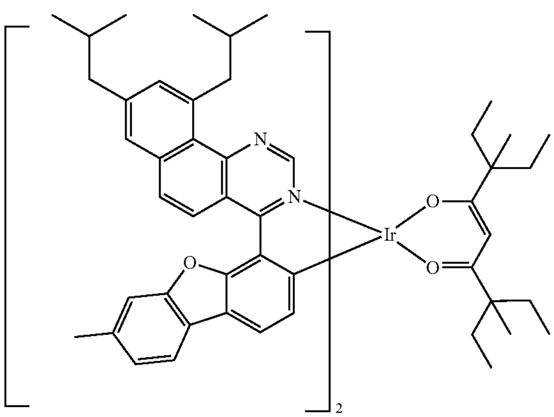
192
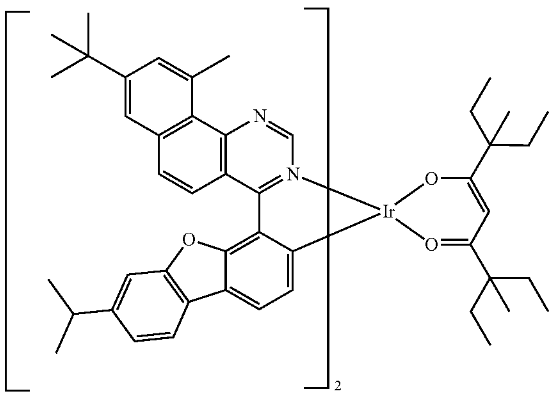
193
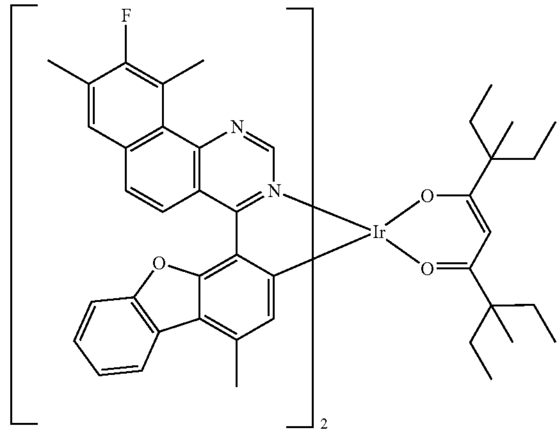
194
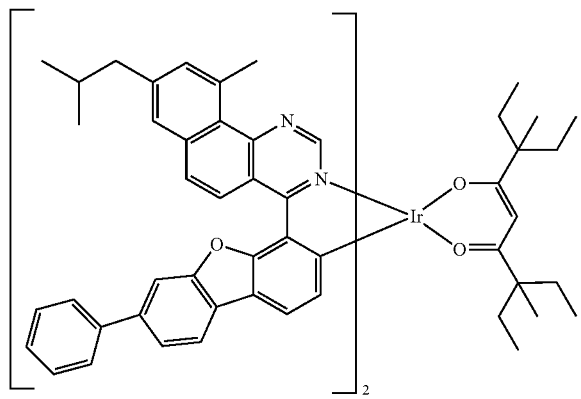
195
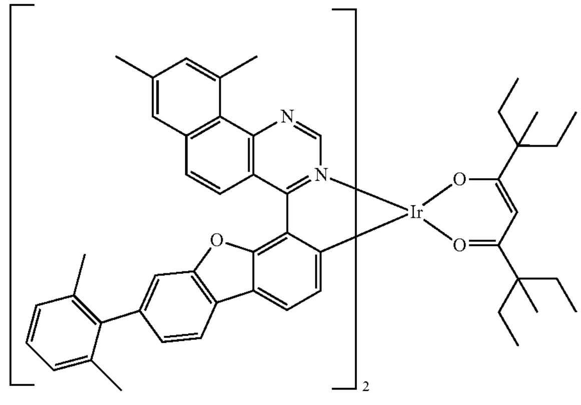

196
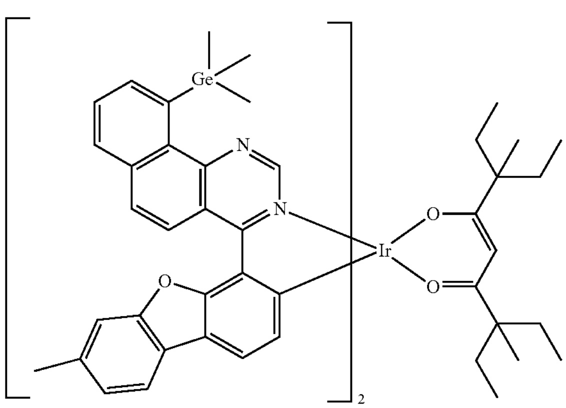
197
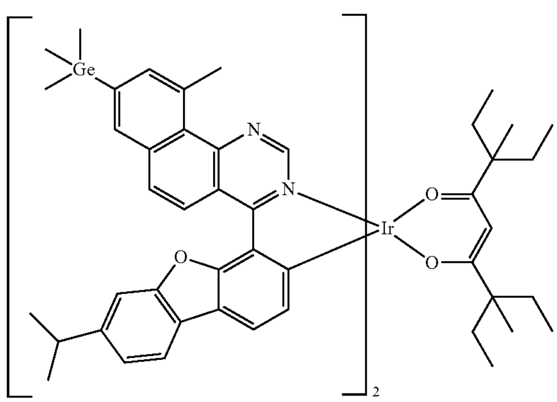
198
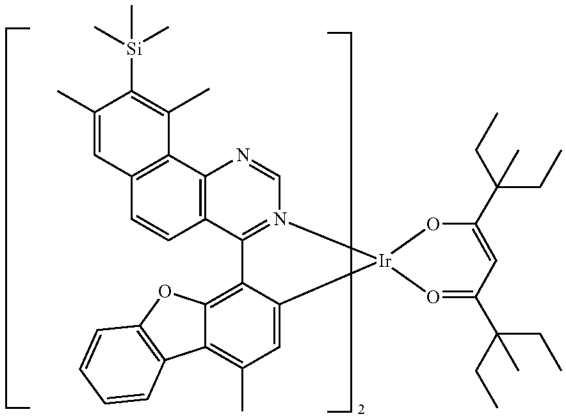
199
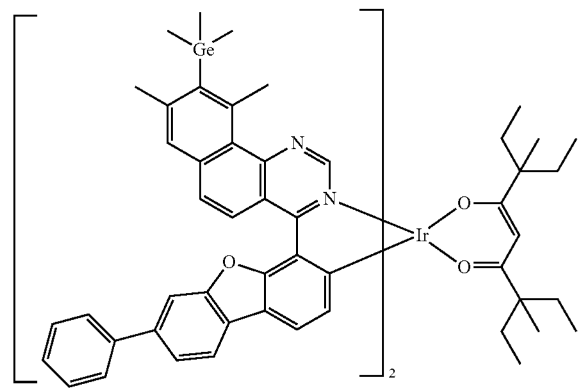
200
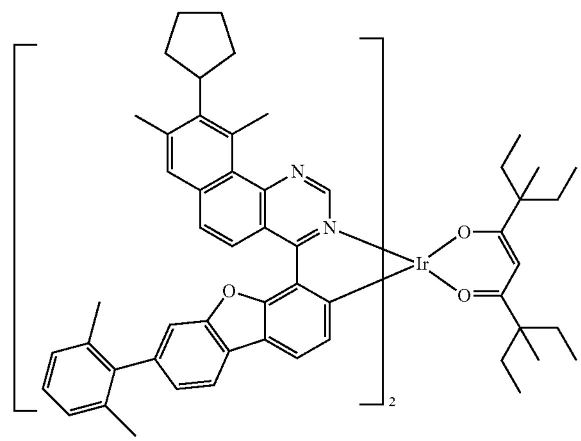
201
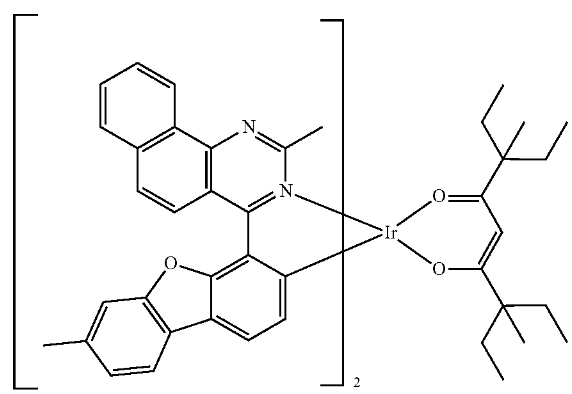
202
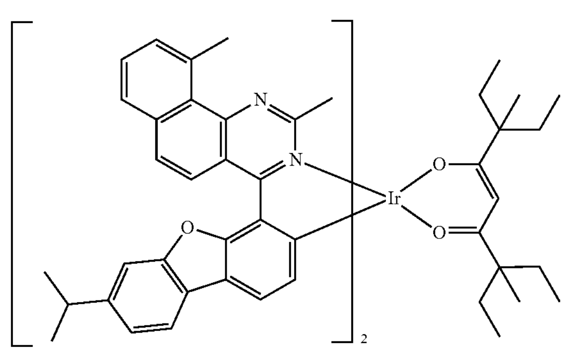

-continued
203
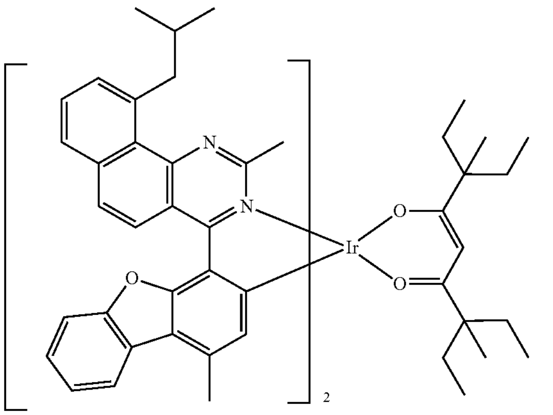
204
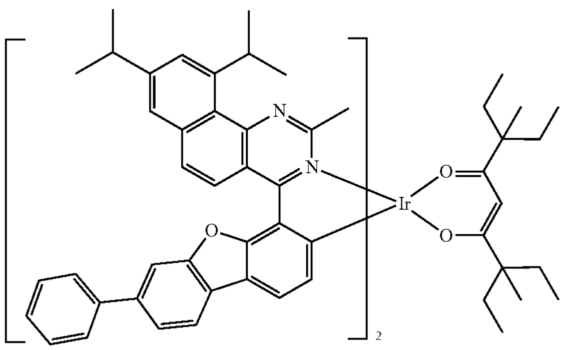
205
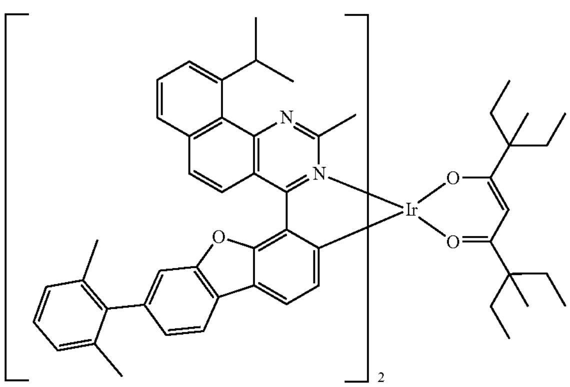
206
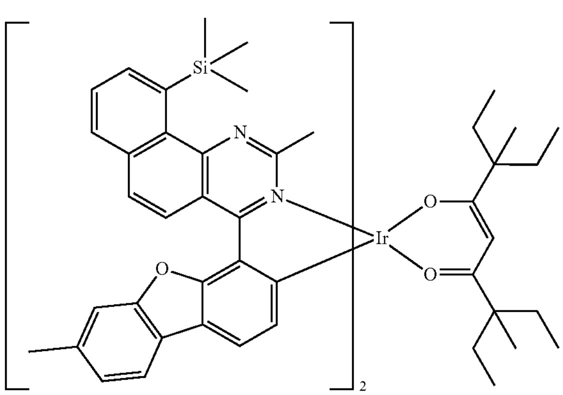
-continued
207
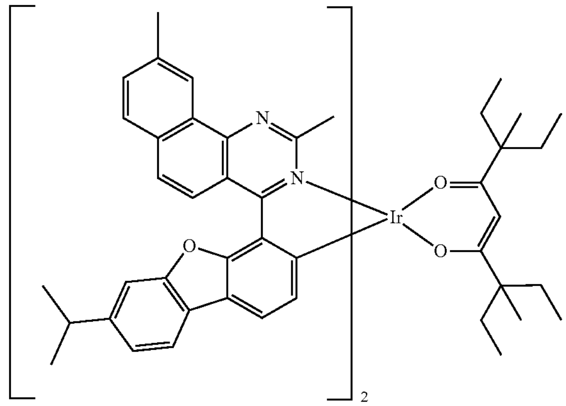
208
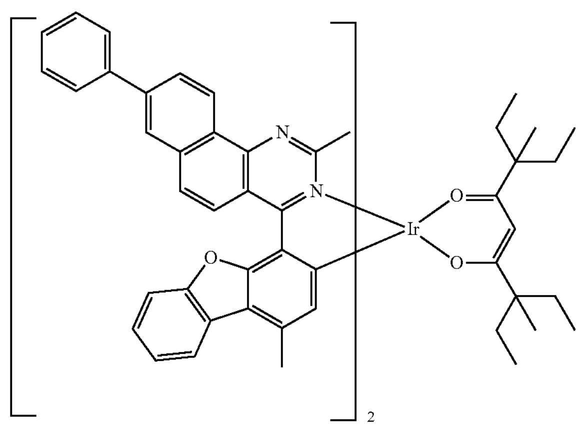
209
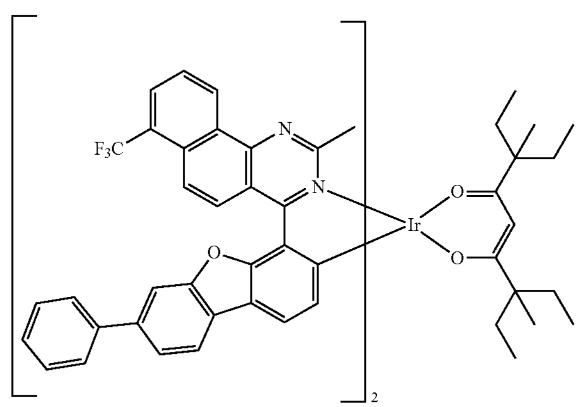

210
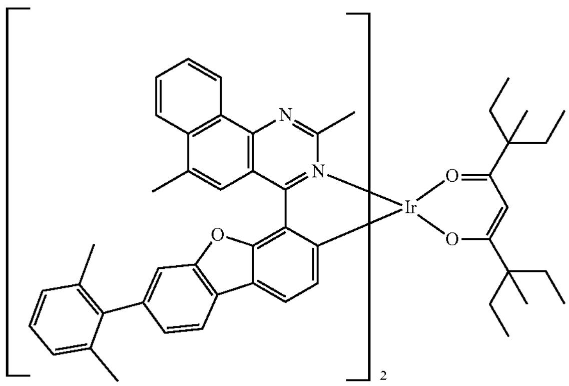
211
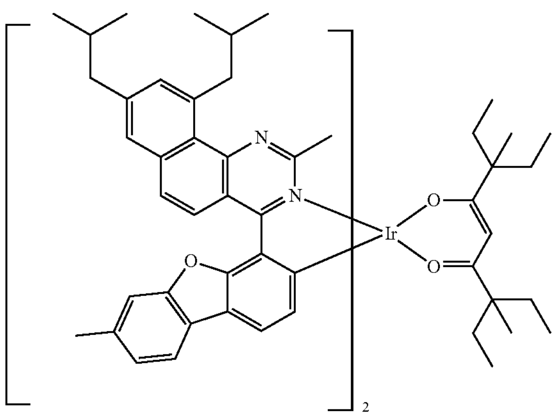
212
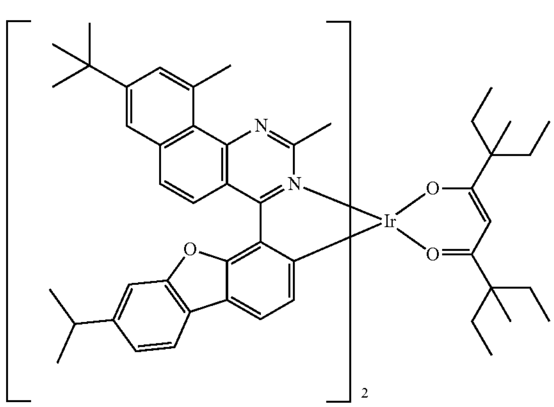
213
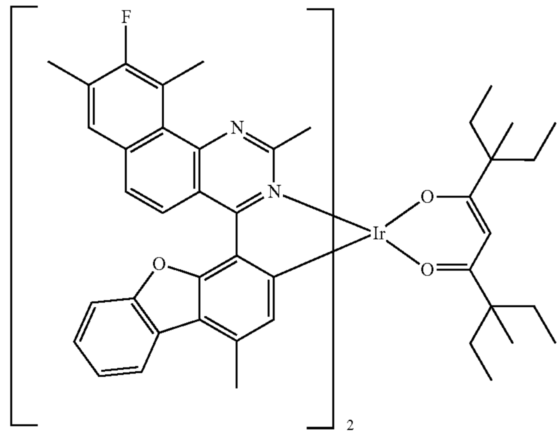
214
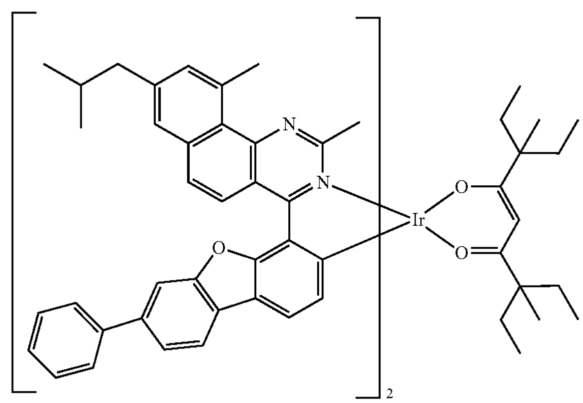
215
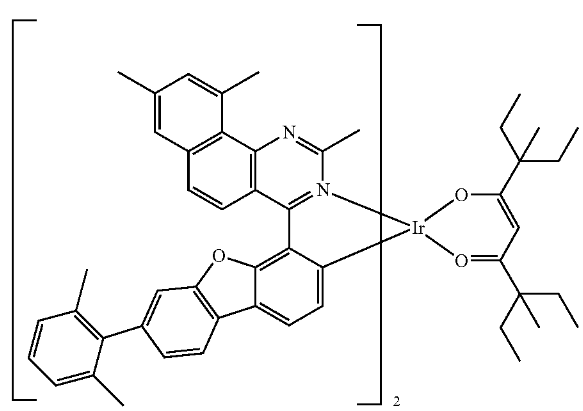

216
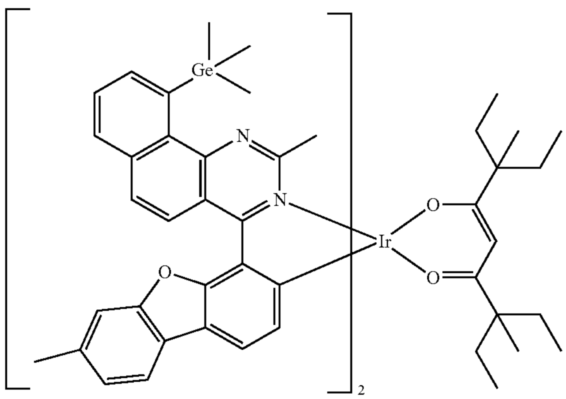
217
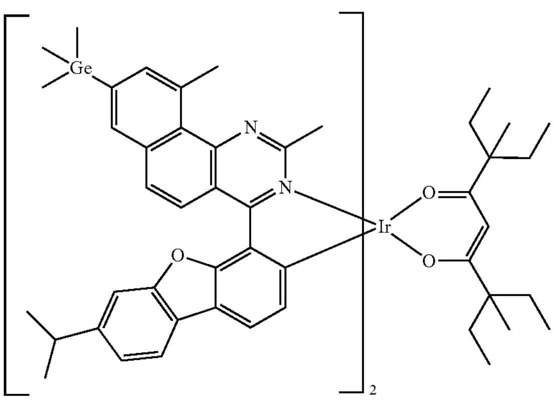
218
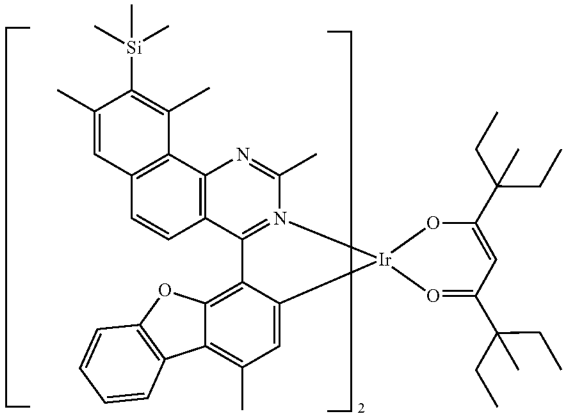
219
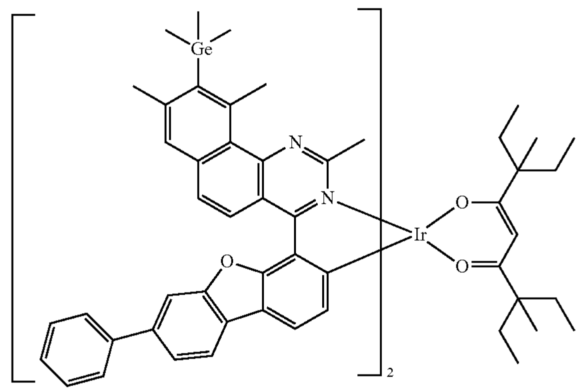
220
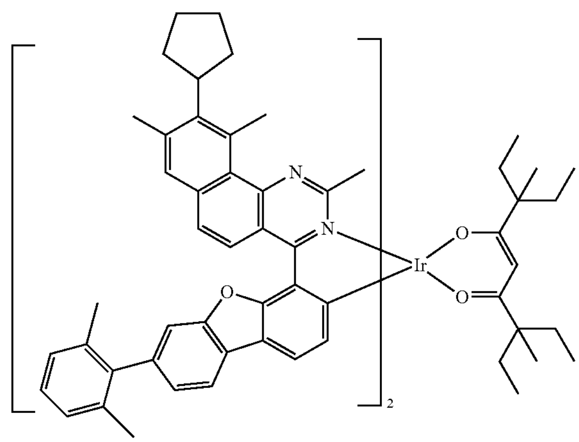
221
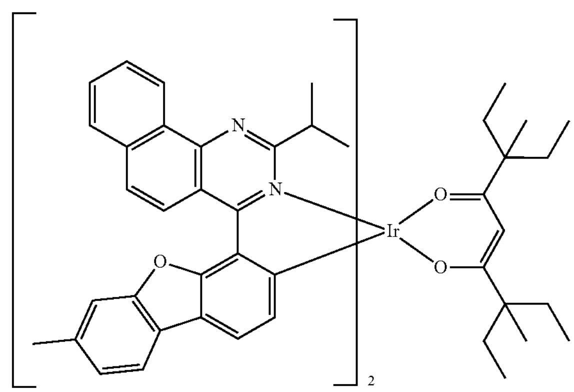
222
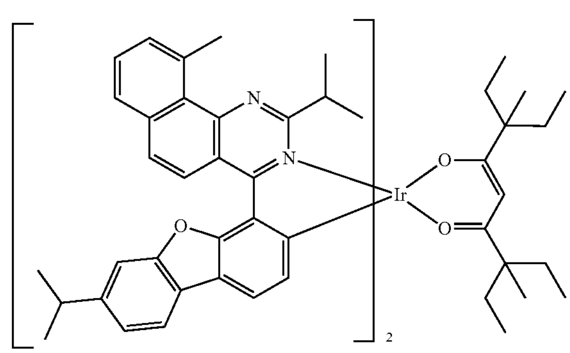

-continued
223
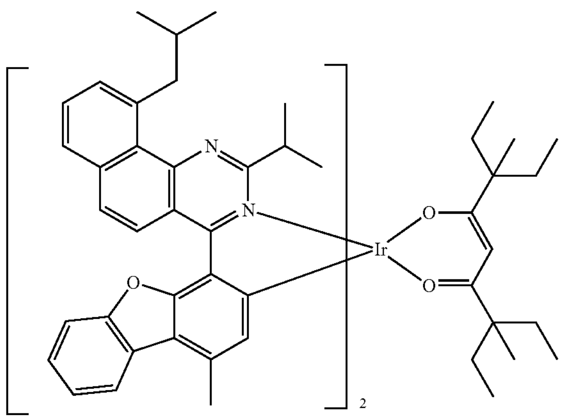
224
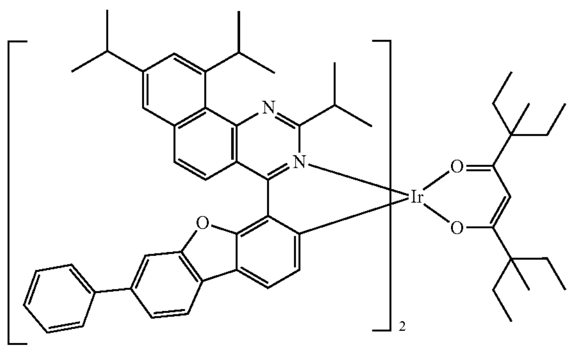
225
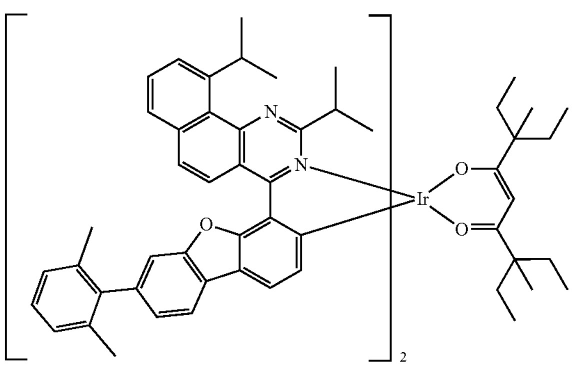
226
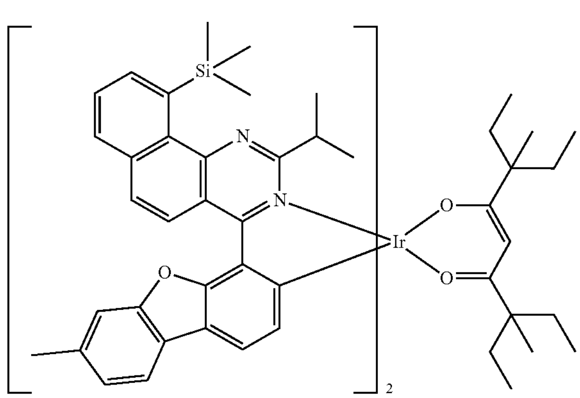
-continued
227
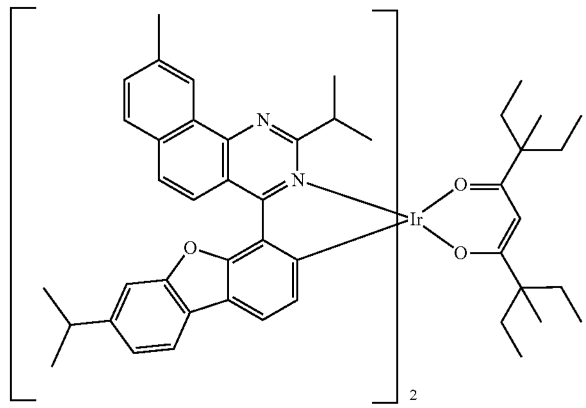
228
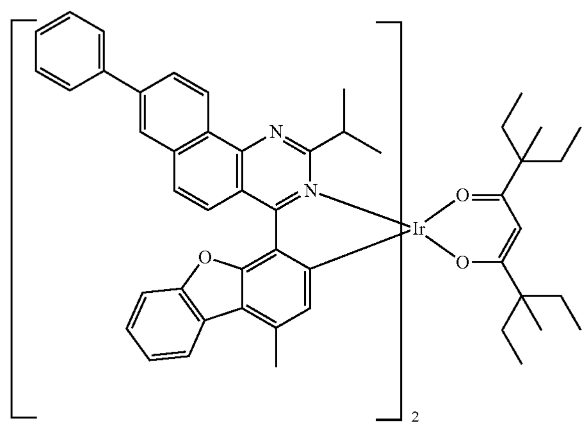
229
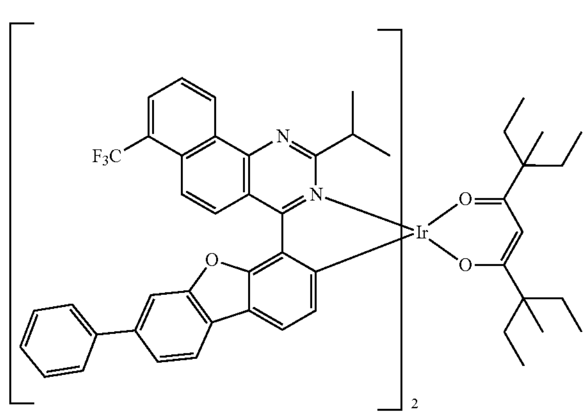

-continued
230
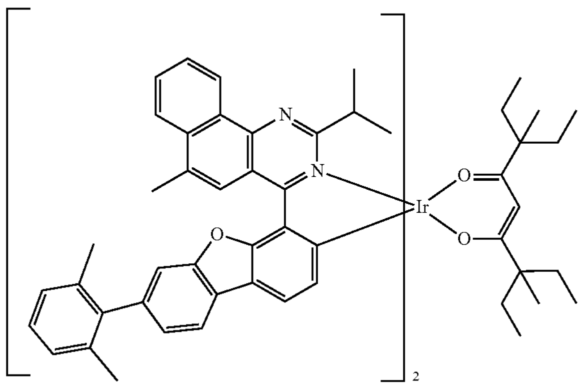
231
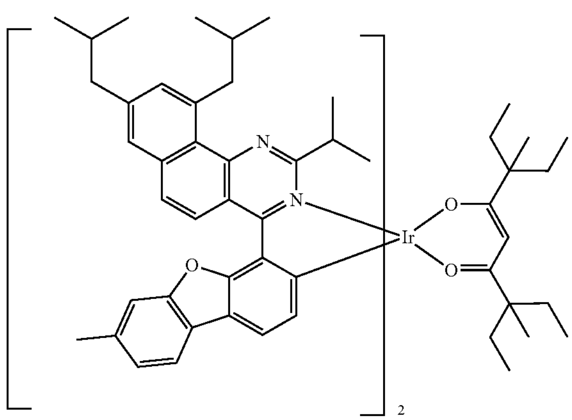
232
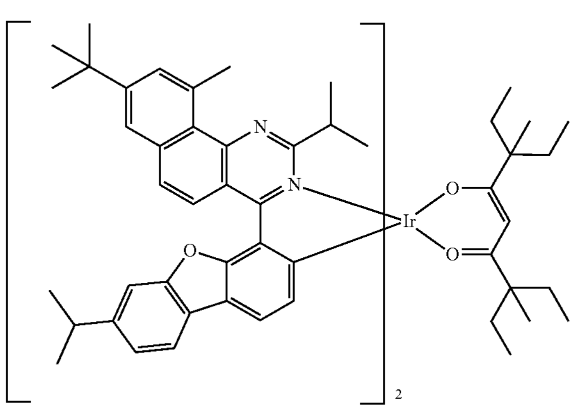
-continued
233
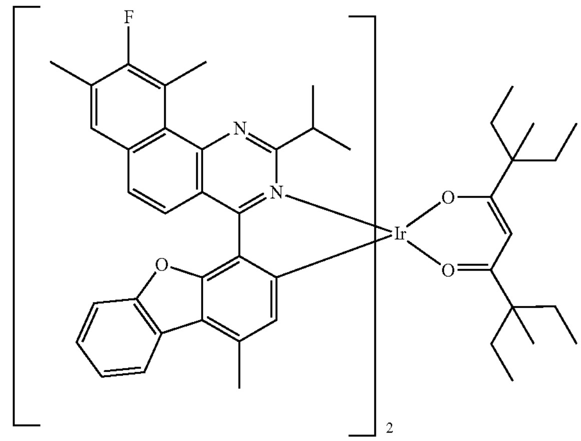
234
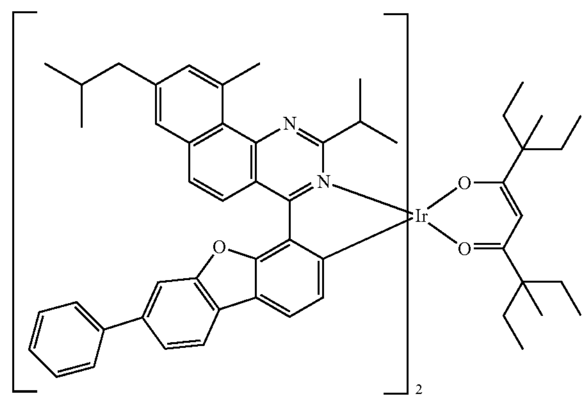
235
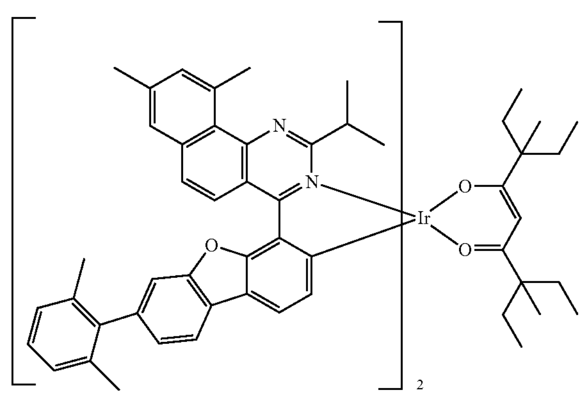

-continued
236
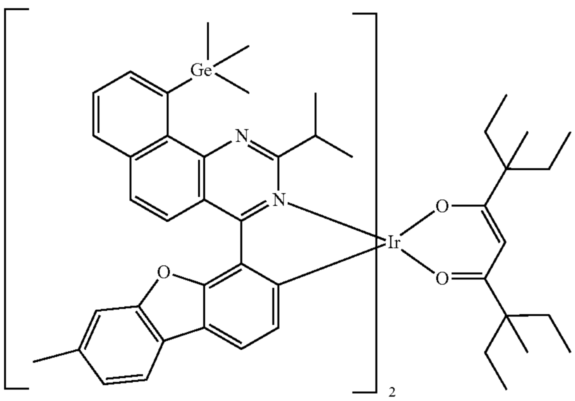
237
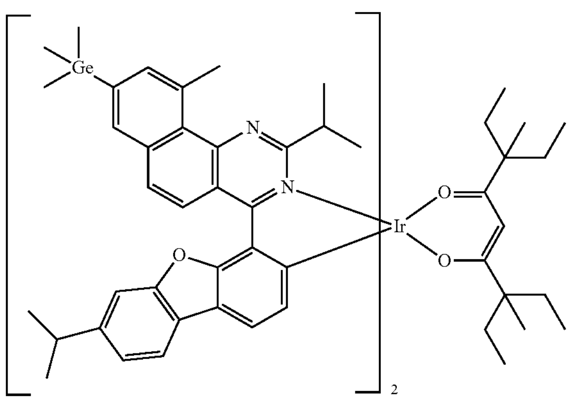
238
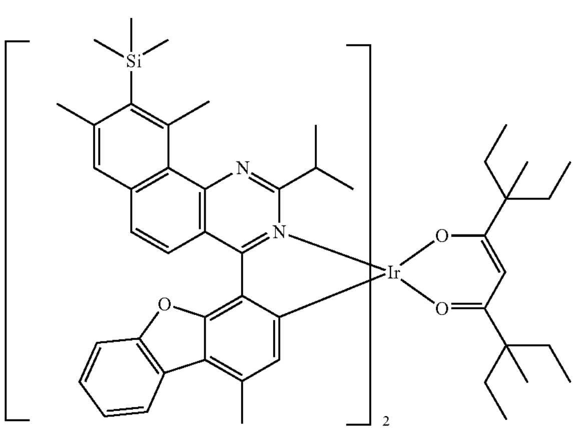
-continued
239
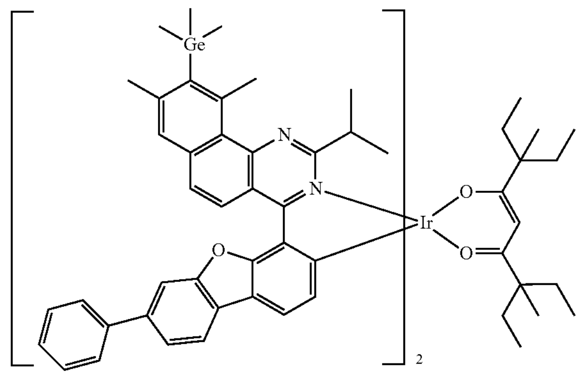
240
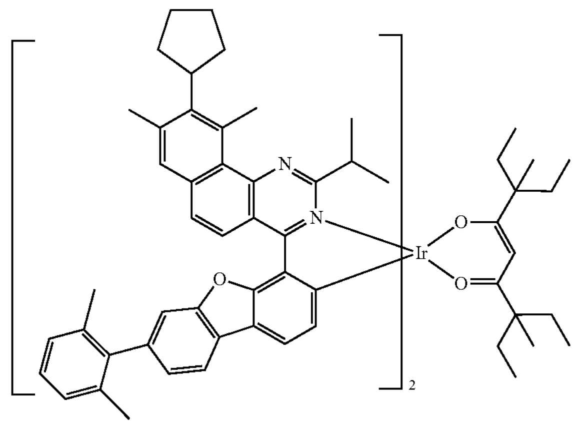
241
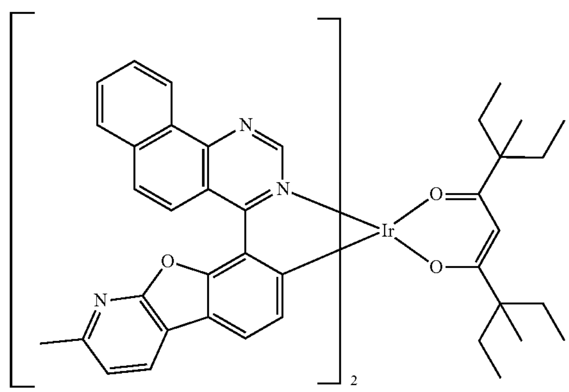
242
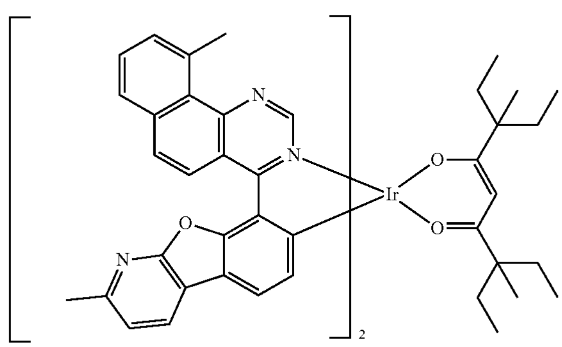

-continued
243
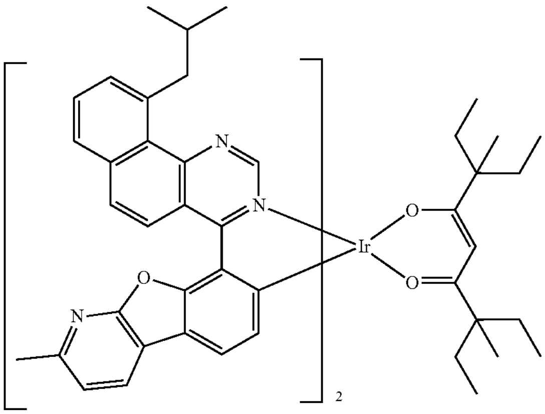
244
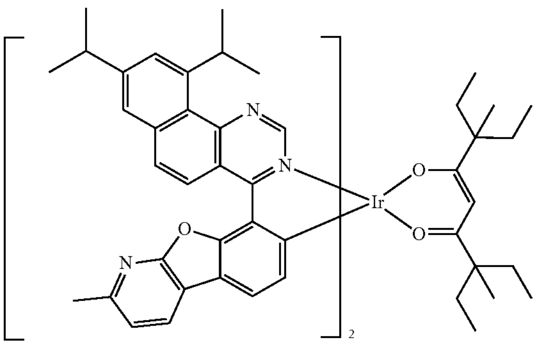
245
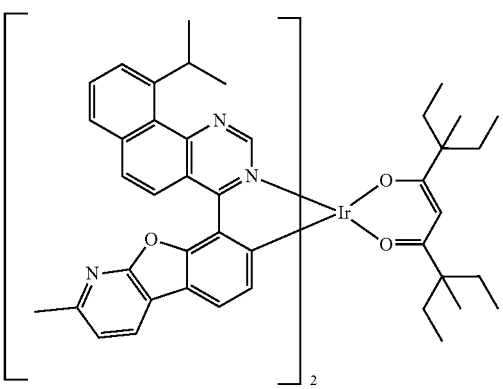
246
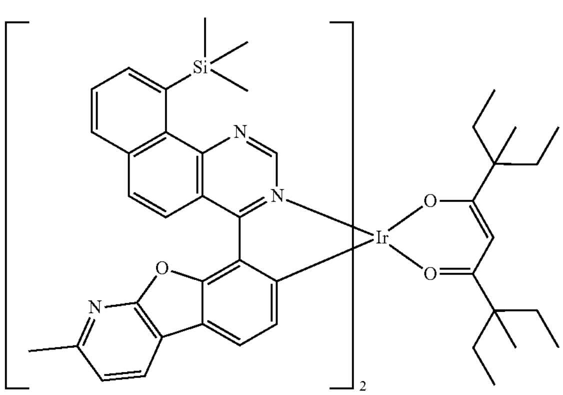
-continued
247
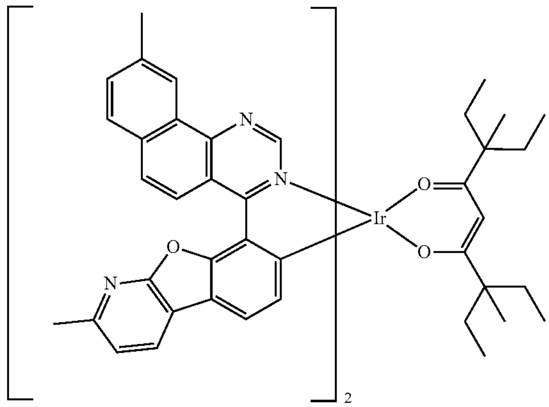
248
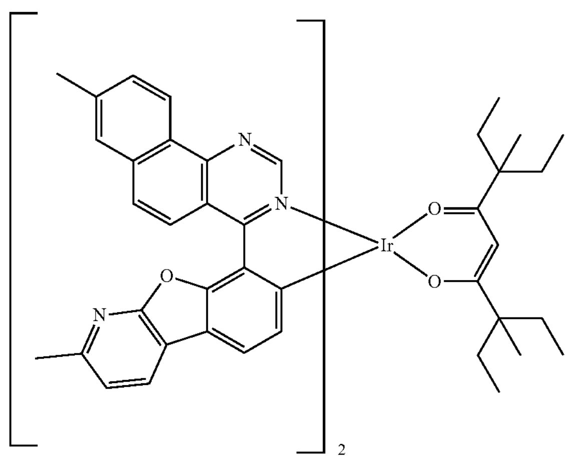
249
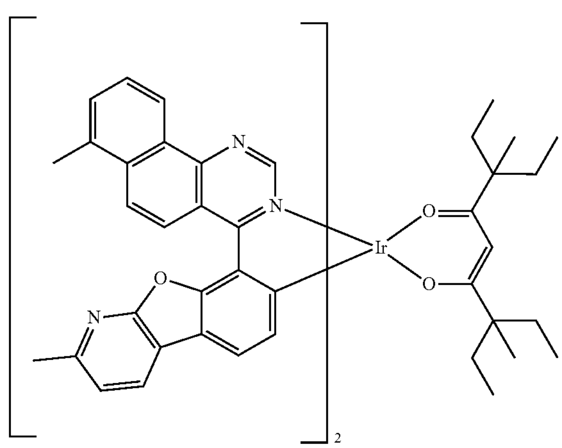

-continued
250
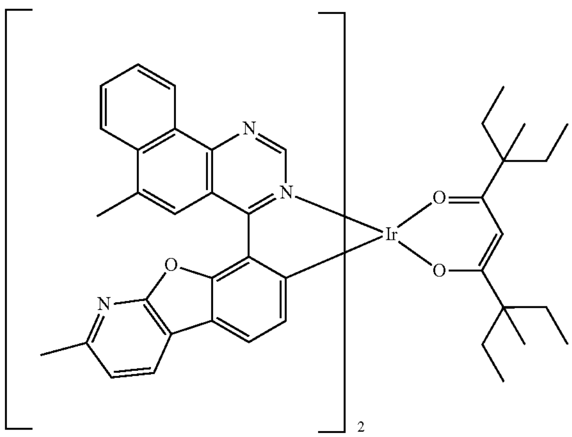
251
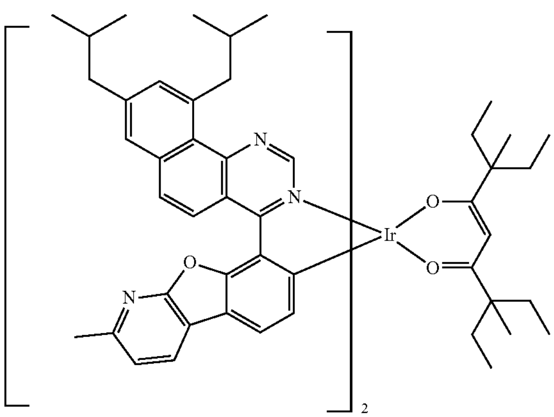
252
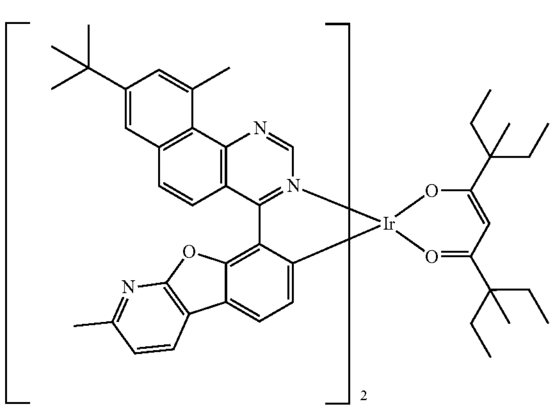
-continued
253
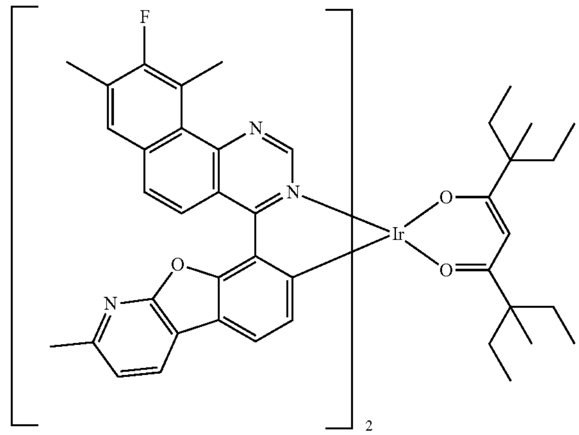
254
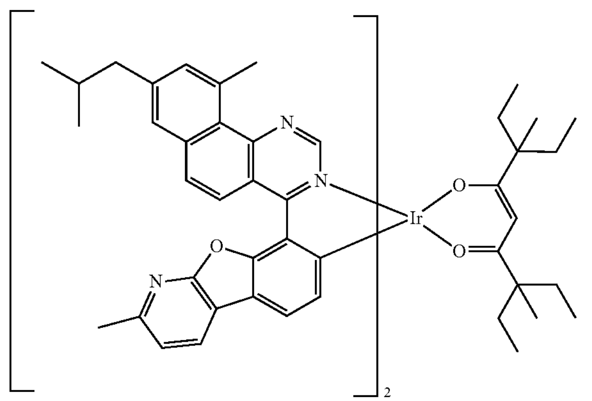
255
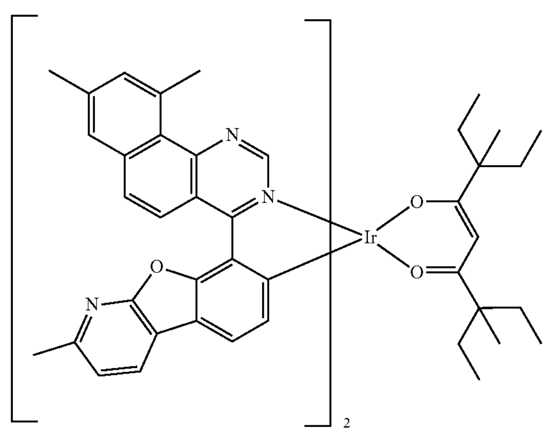

-continued
256
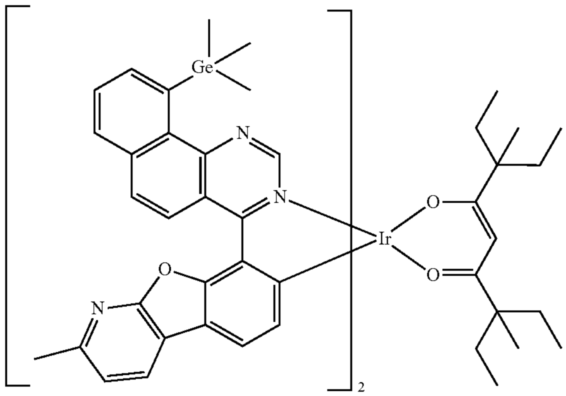
257
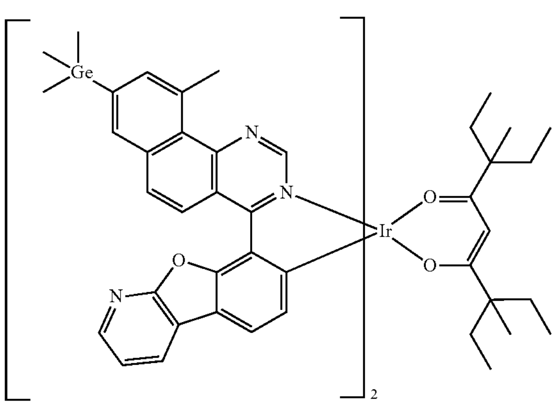
258
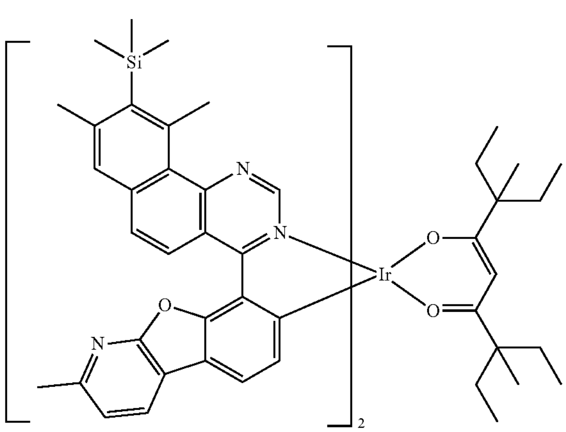
-continued
259
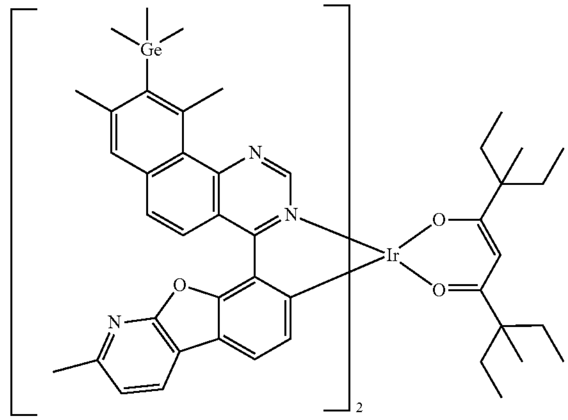
260
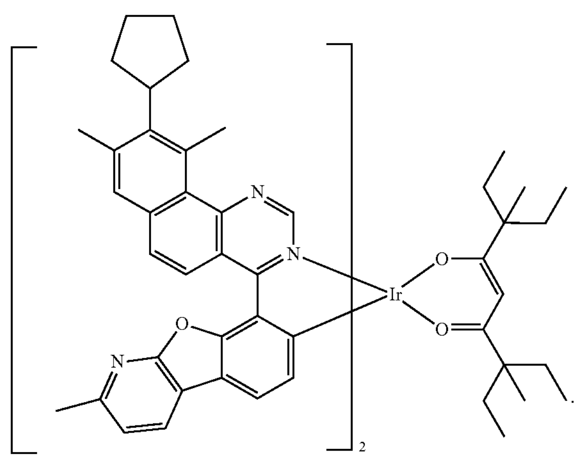
261
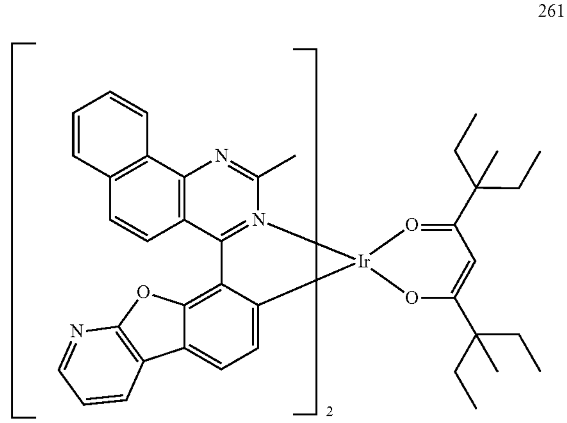

-continued
262
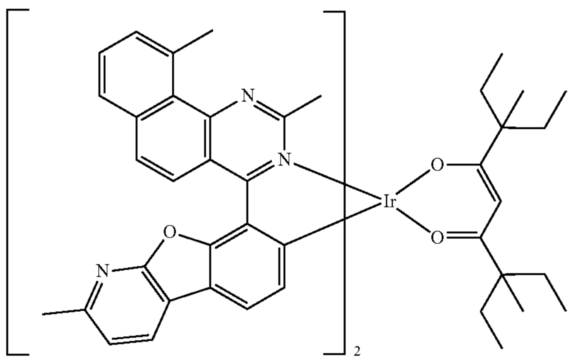
263
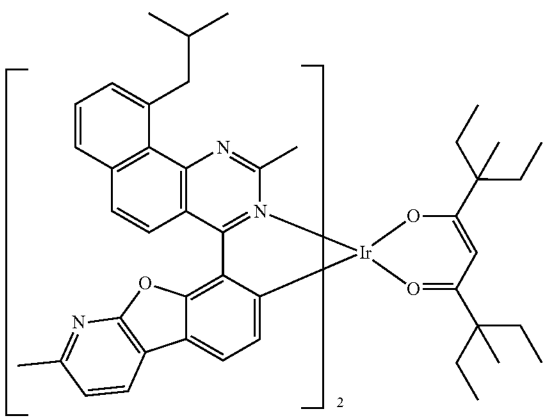
264
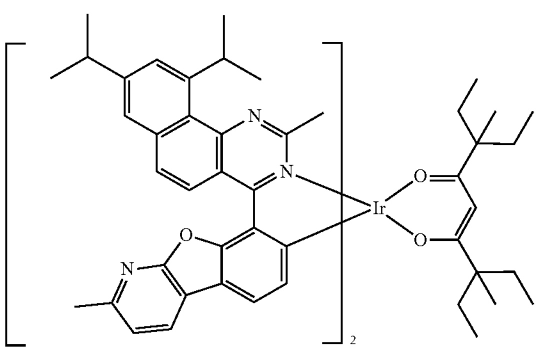
265
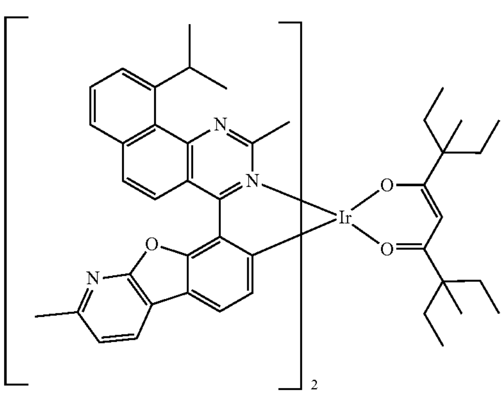
-continued
266
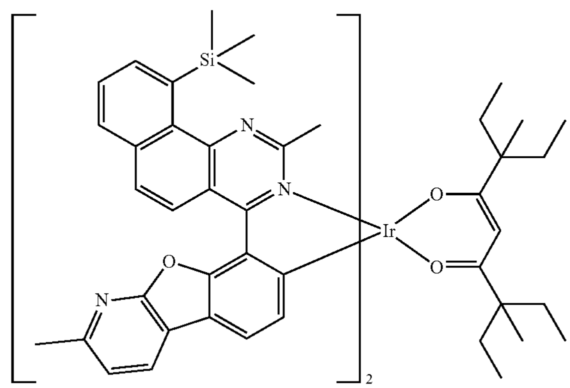
267
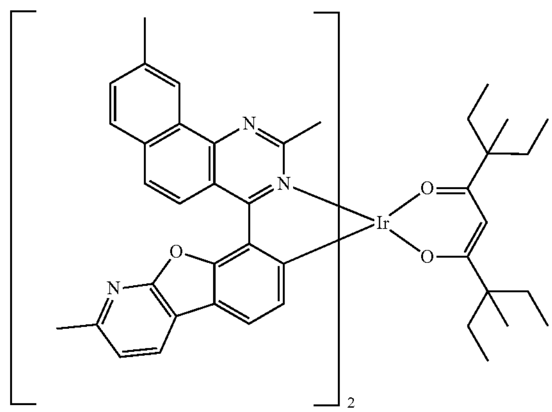
268
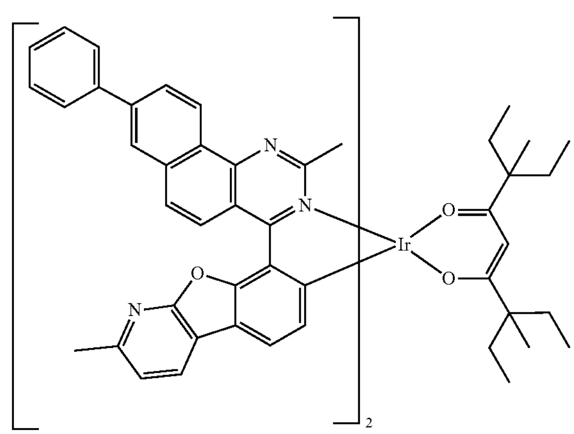

269
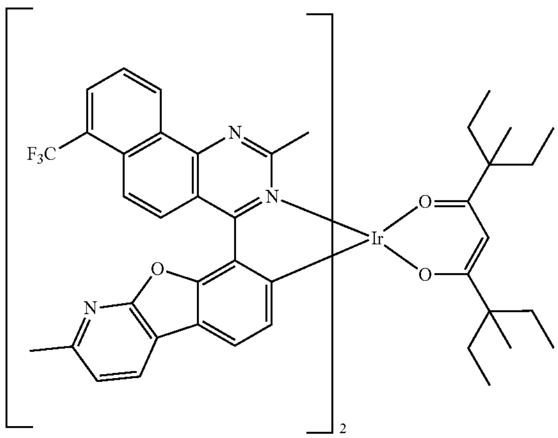
270
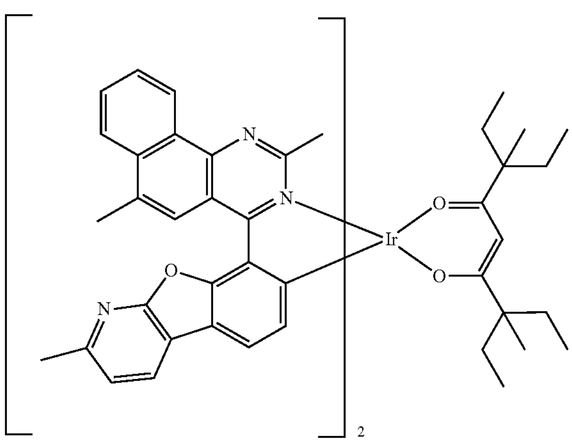
271
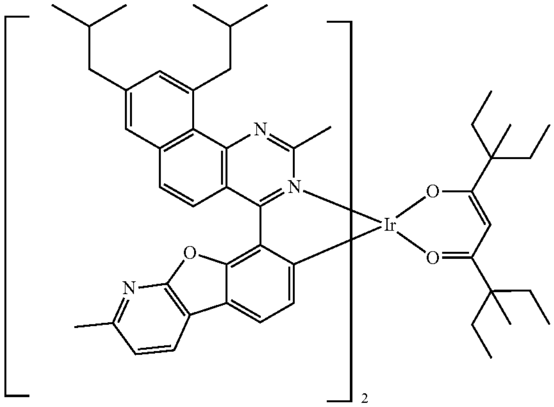
272
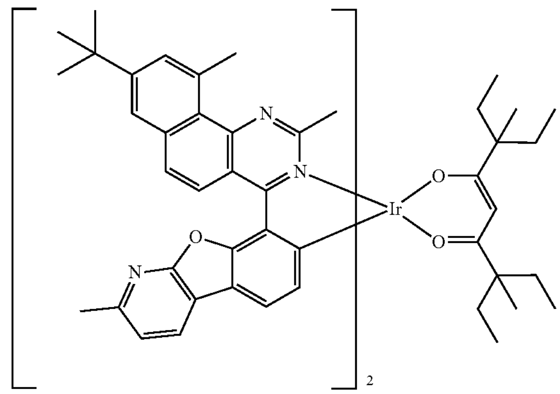
273
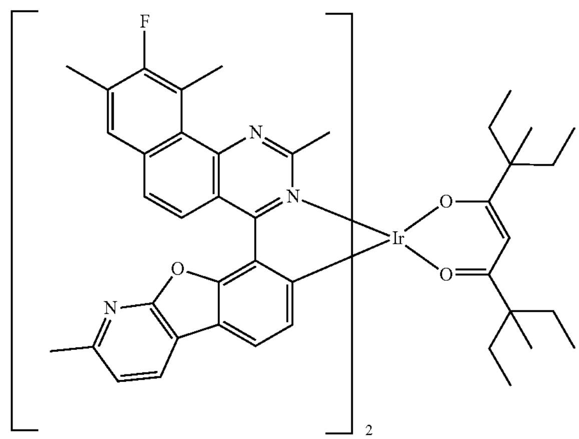
274
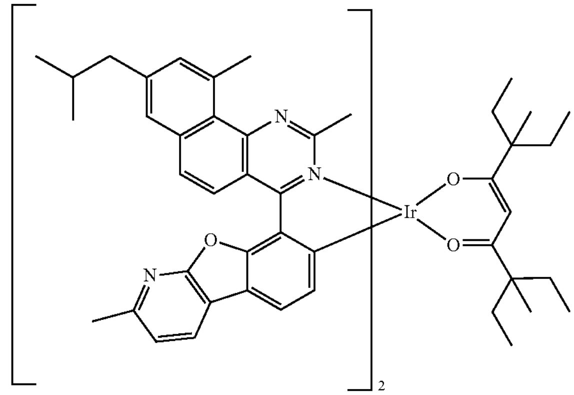

-continued
275
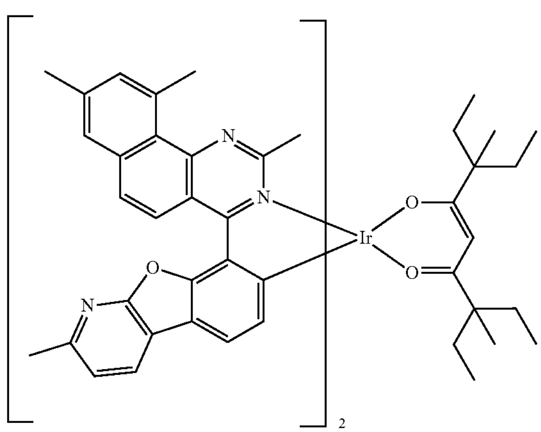
276
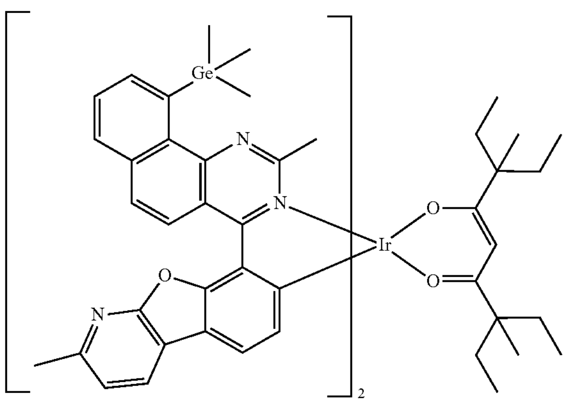
277
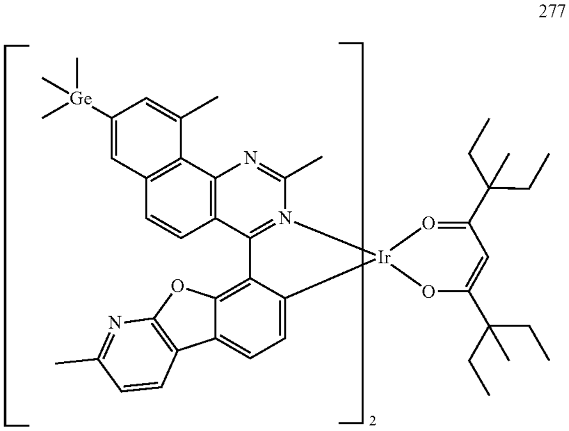
-continued
278
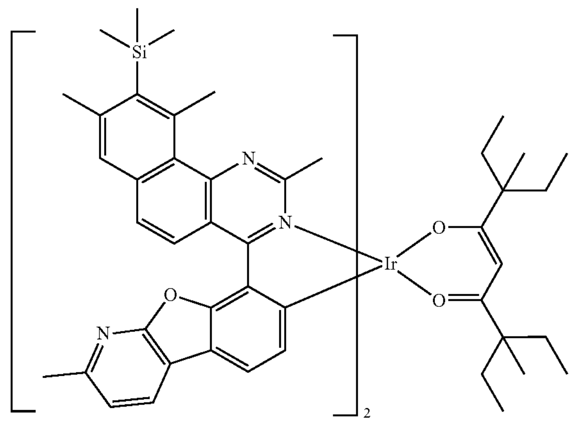
279
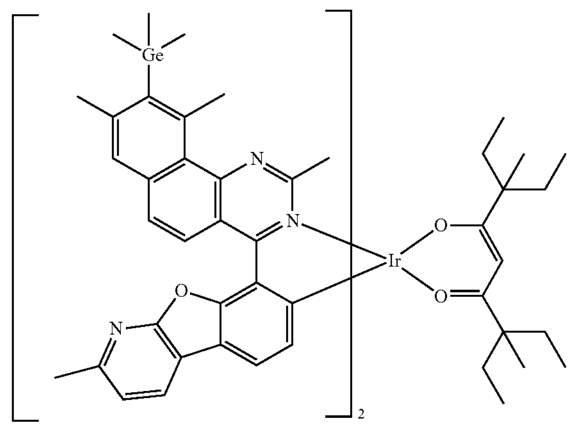
280
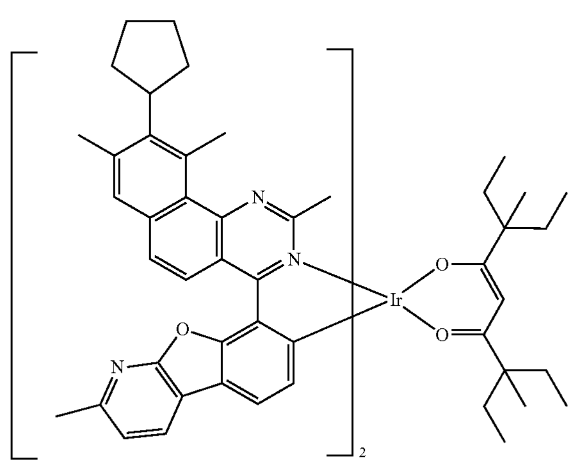

-continued
281
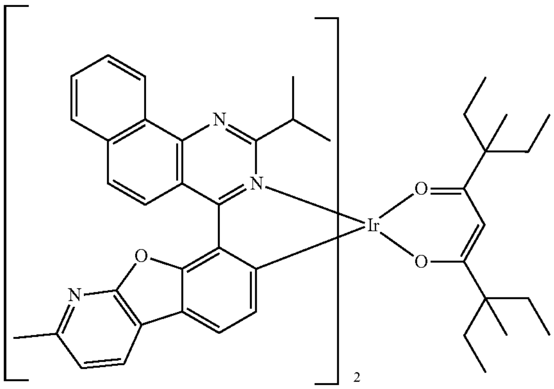
282
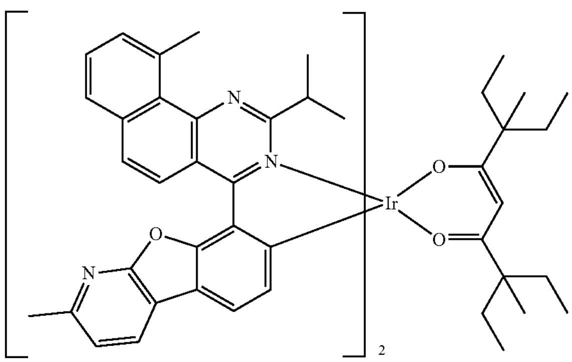
283
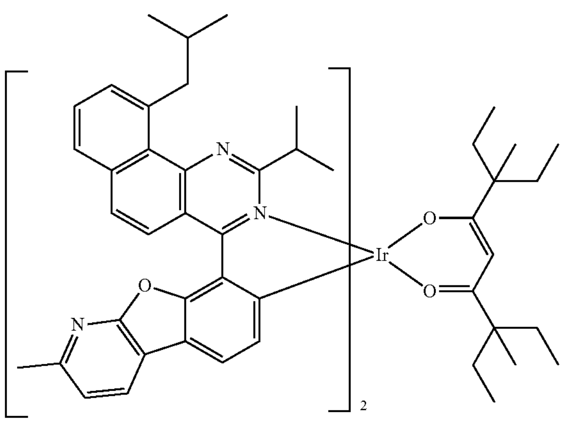
284
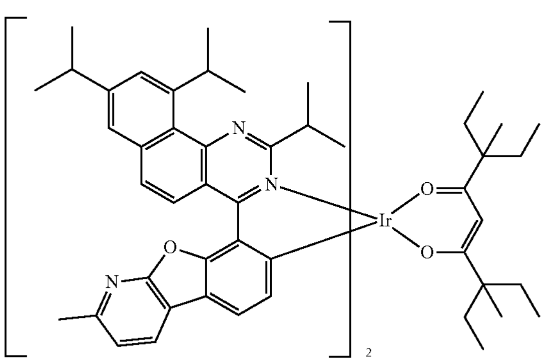
-continued
285
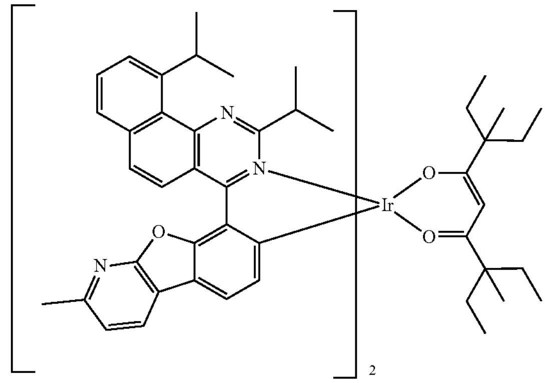
286
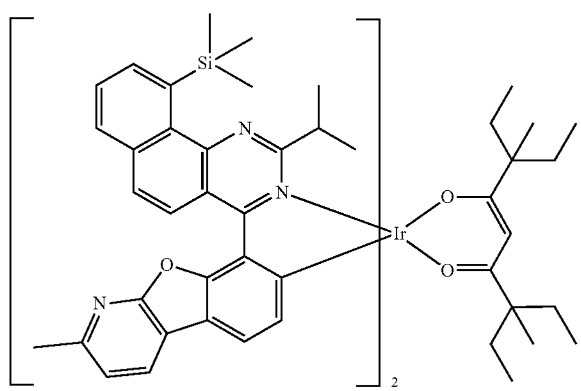
287
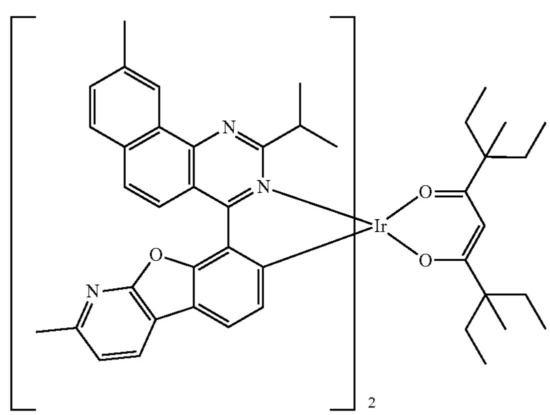

-continued
288
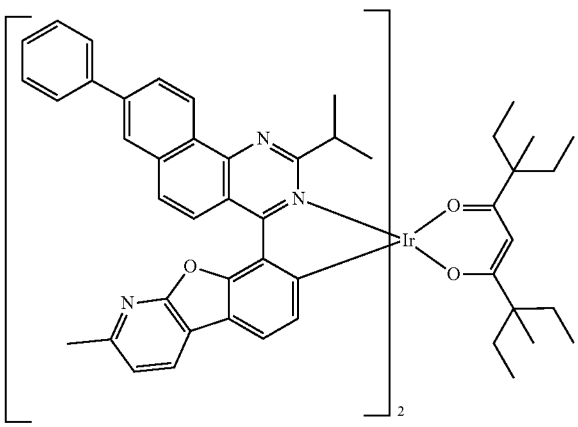
289
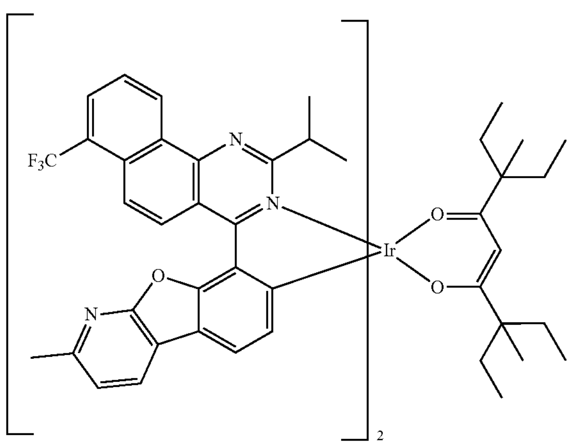
290
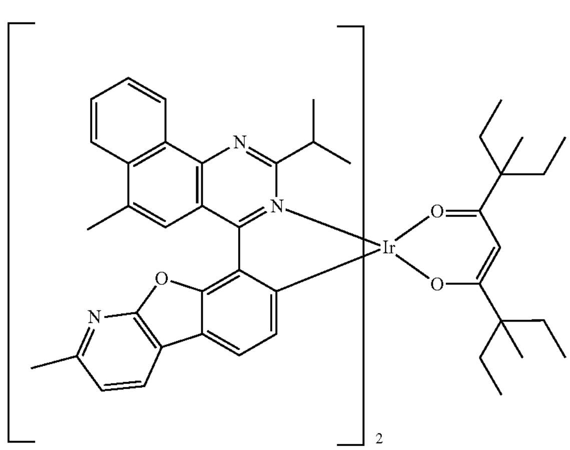
-continued
291
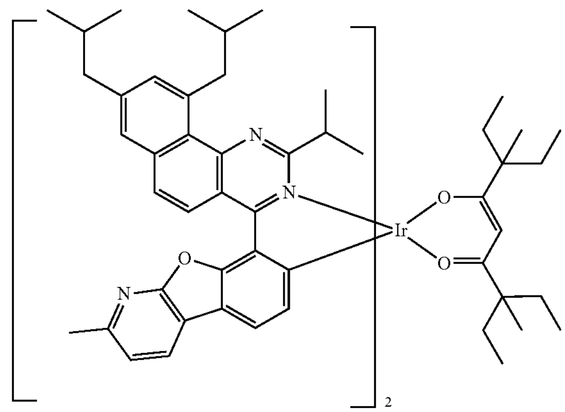
292
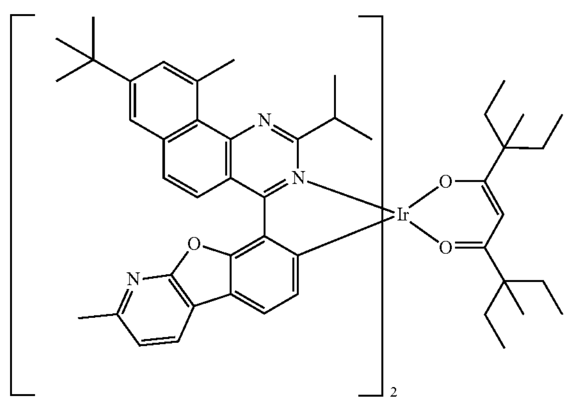
293
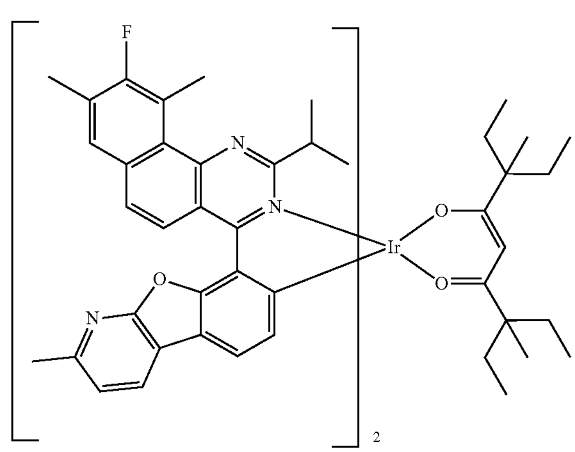

-continued
294
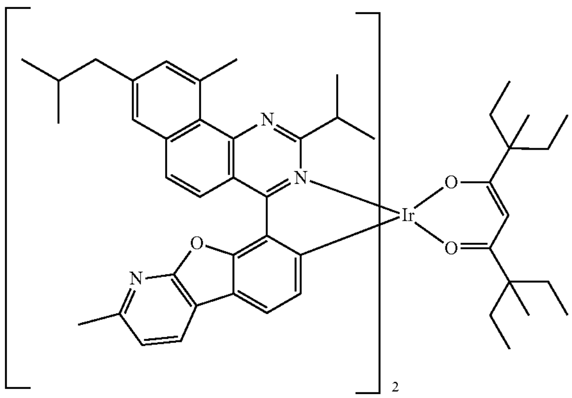
295
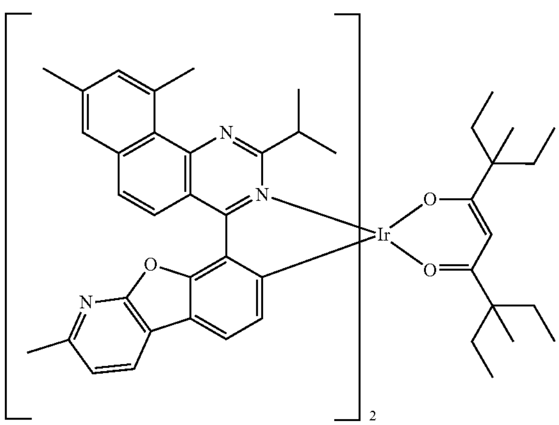
296
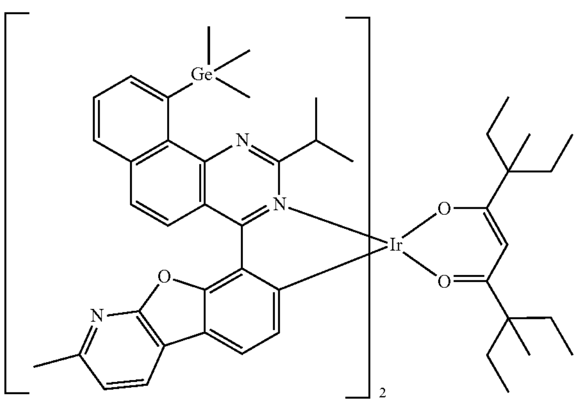
-continued
297
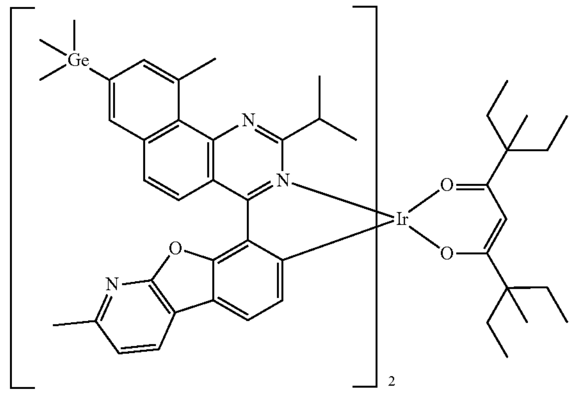
298
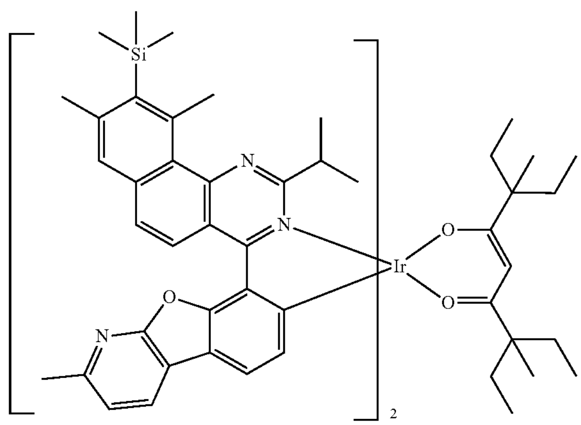
299
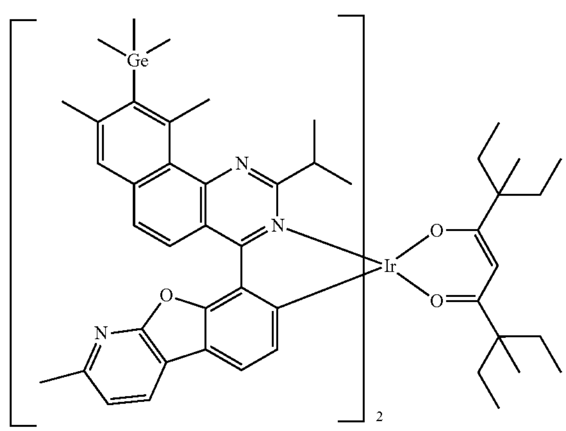

-continued
300
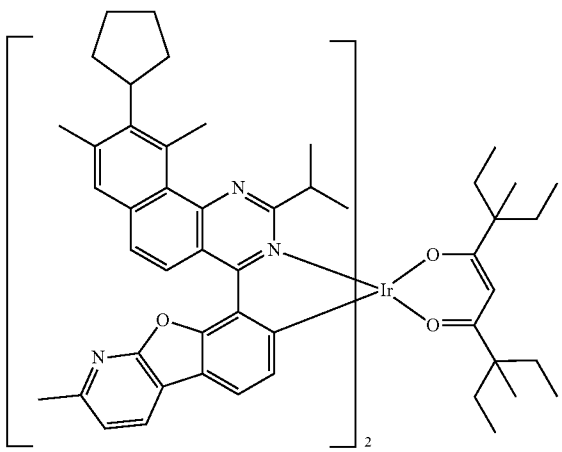
301
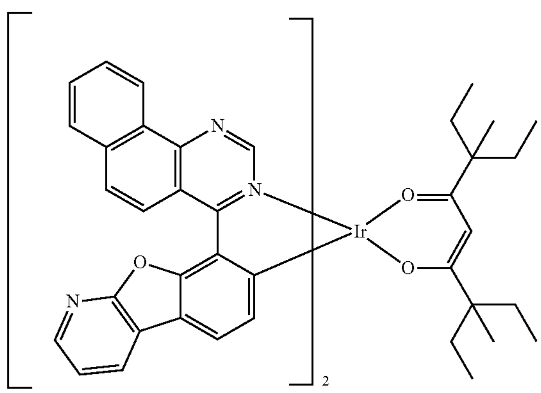
302
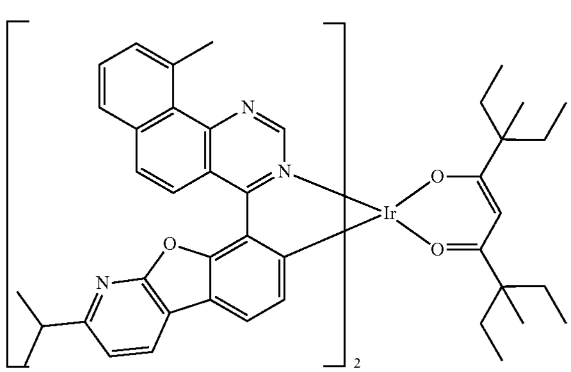
-continued
303
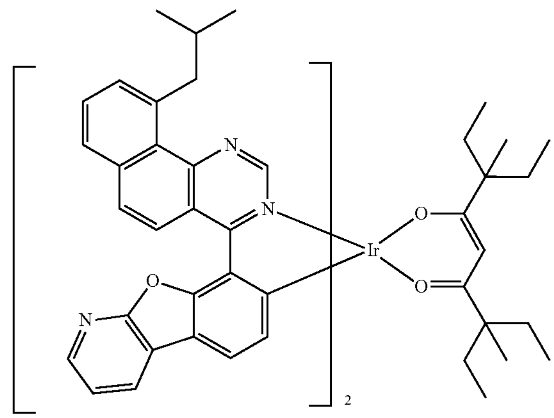
304
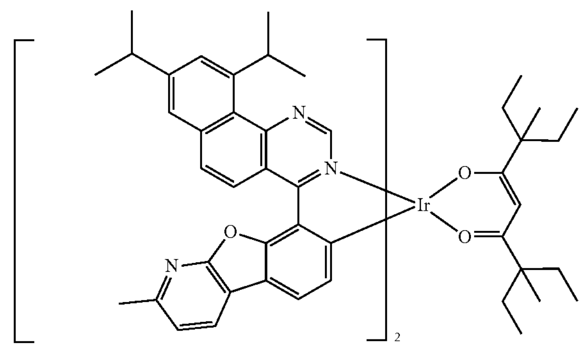
305
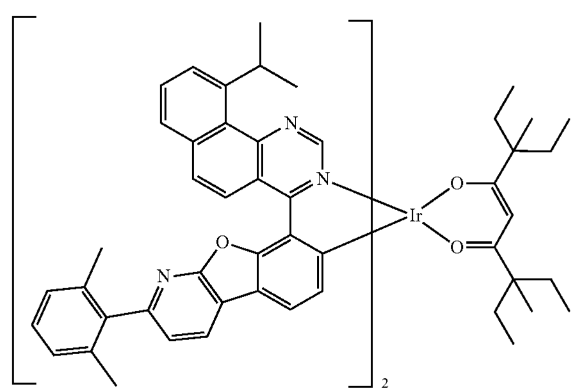
306
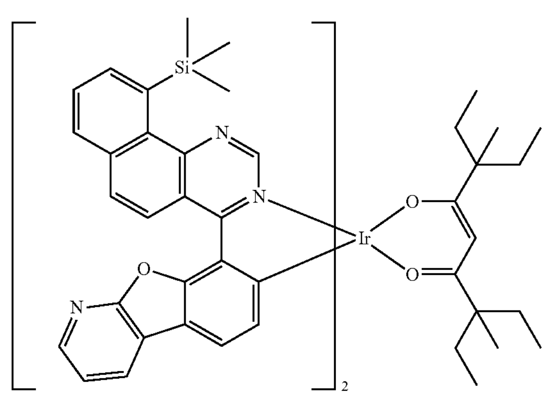

-continued
307
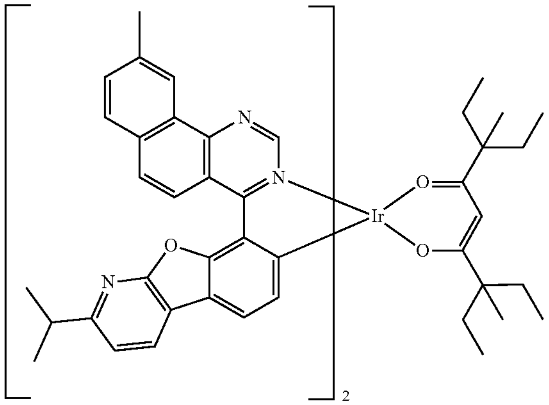
308
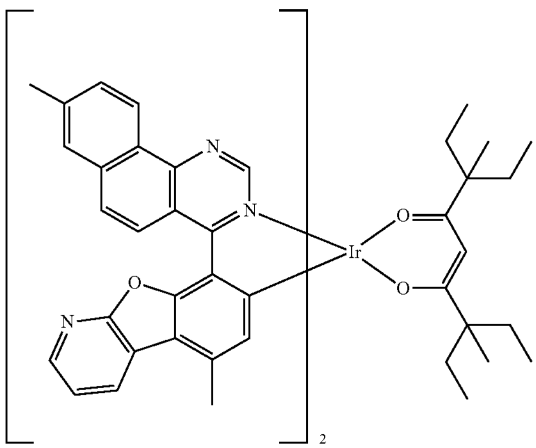
309
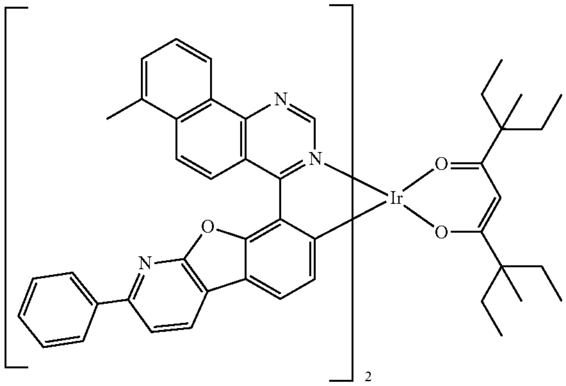
-continued
310
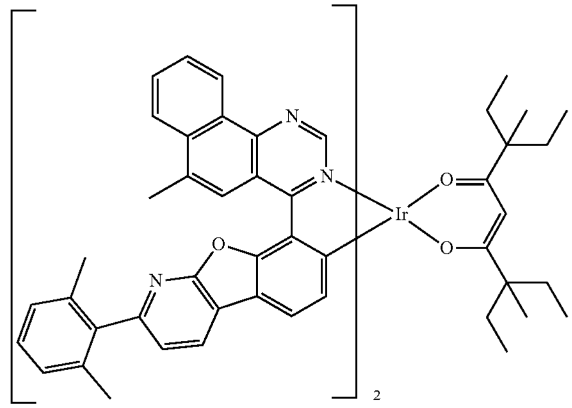
311
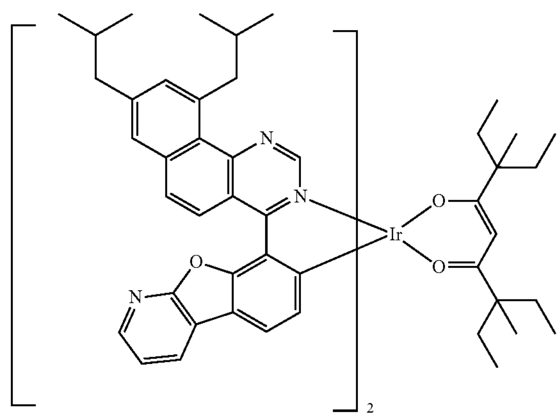
312
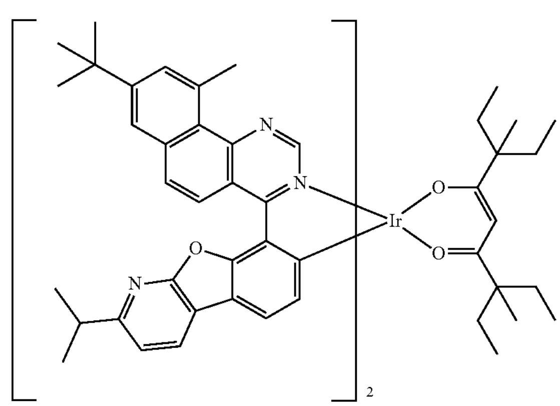

313
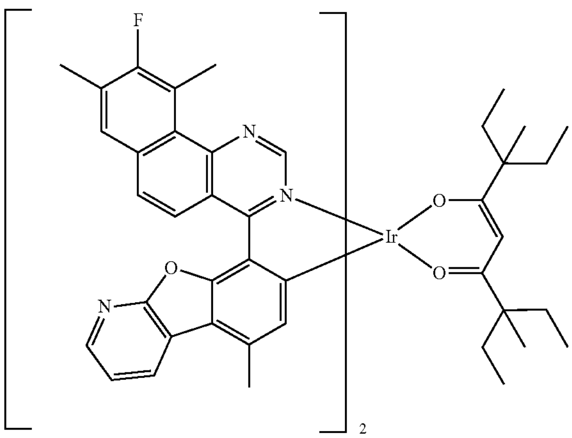
314
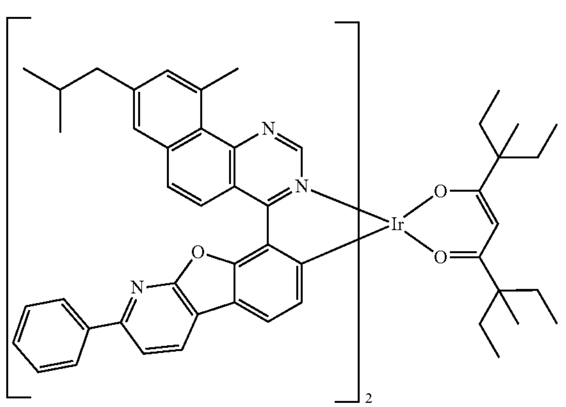
315
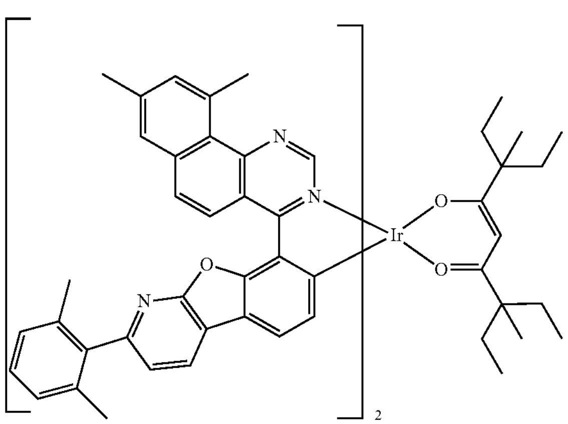
316
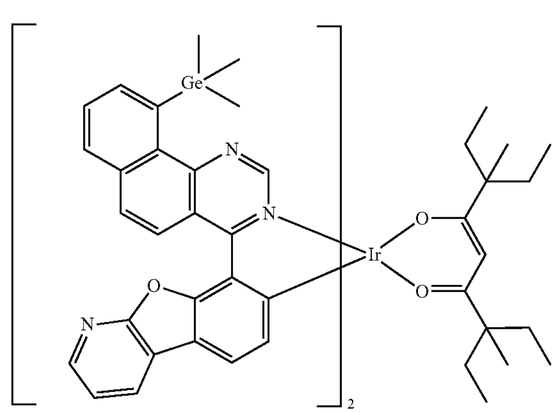
317
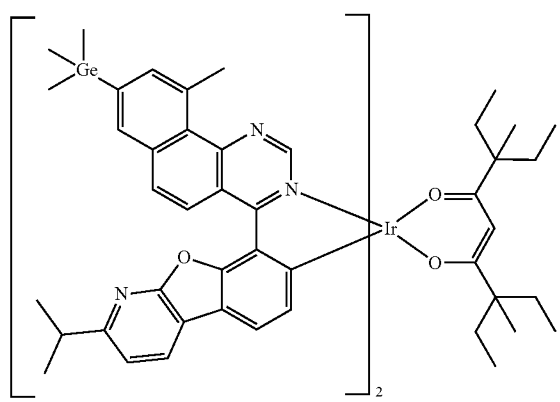
318
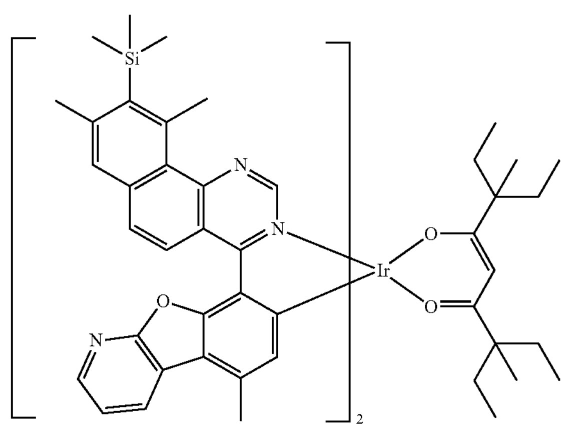

-continued
319
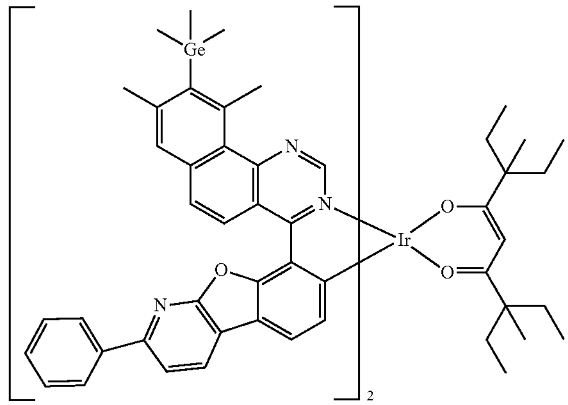
320
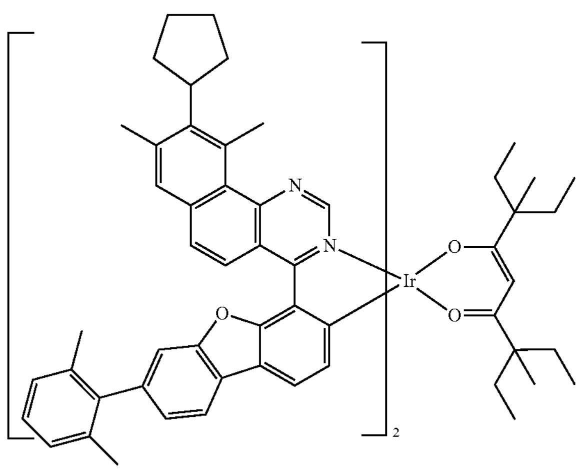
321
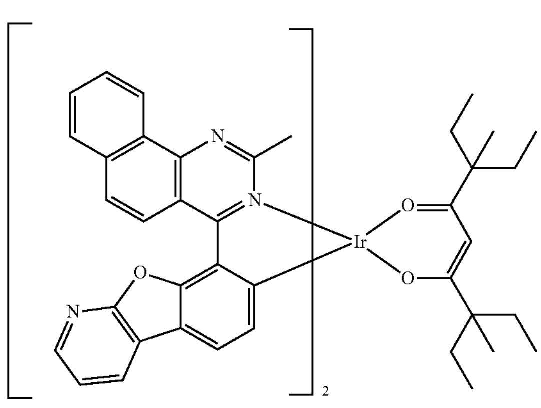
-continued
322
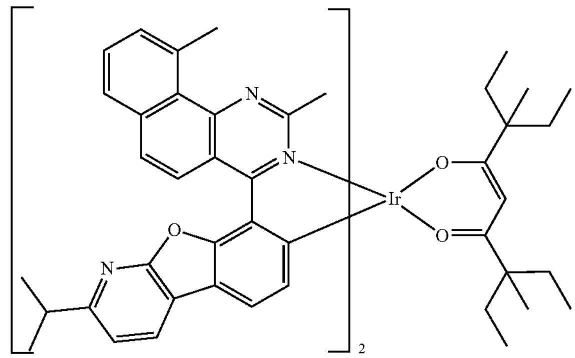
323
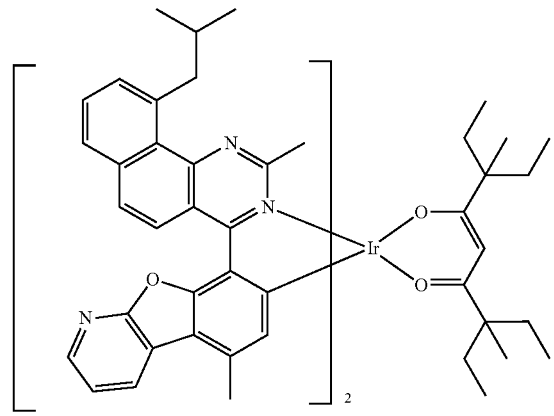
324
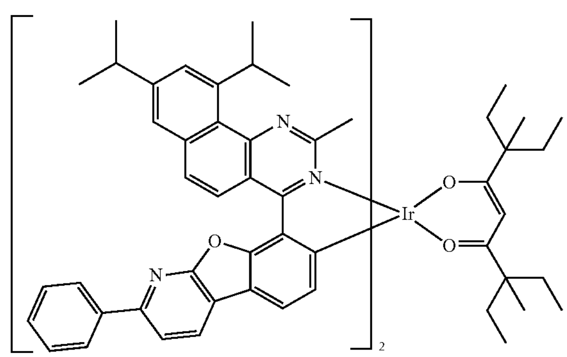
325
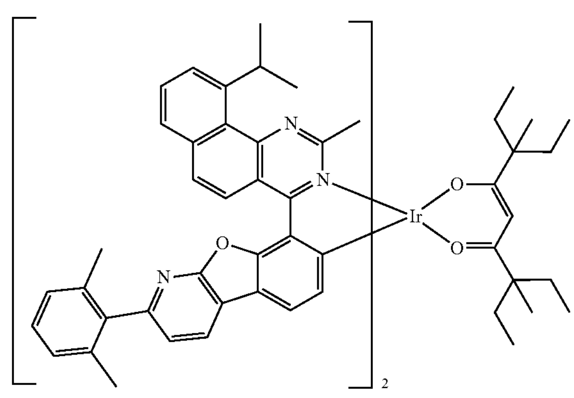

-continued
326
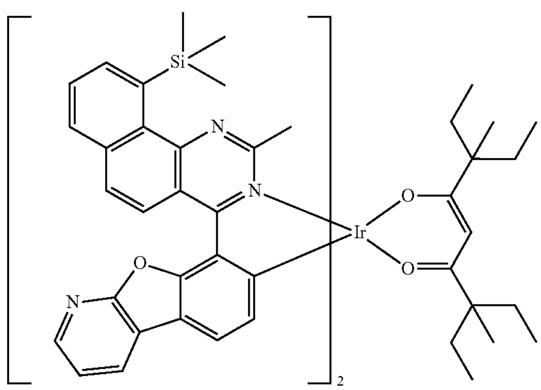
327
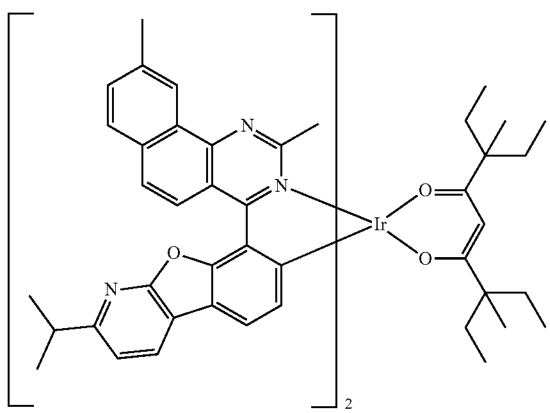
328
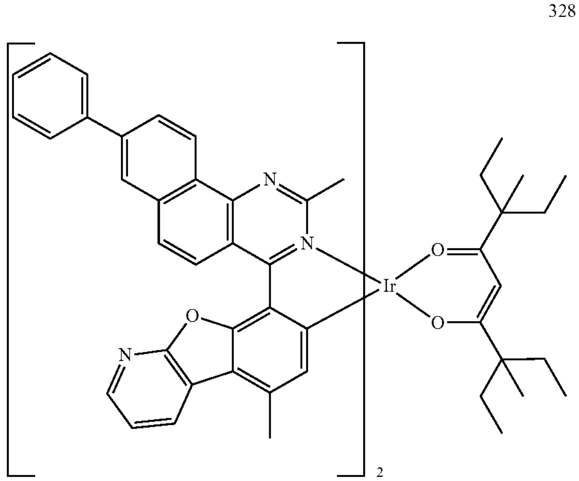
-continued
329
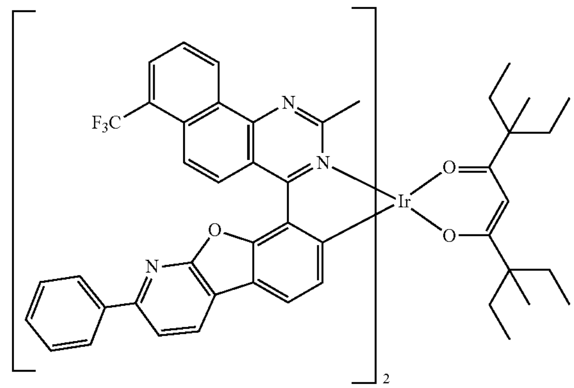
330
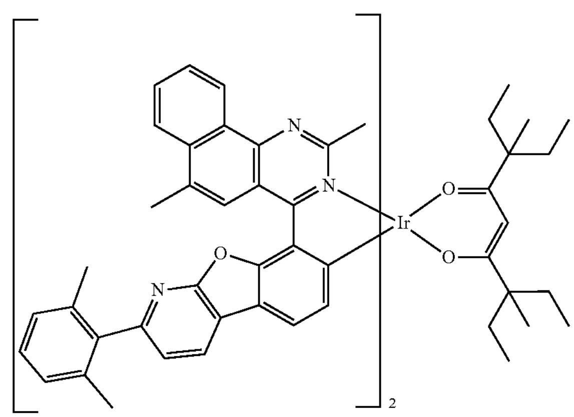
331
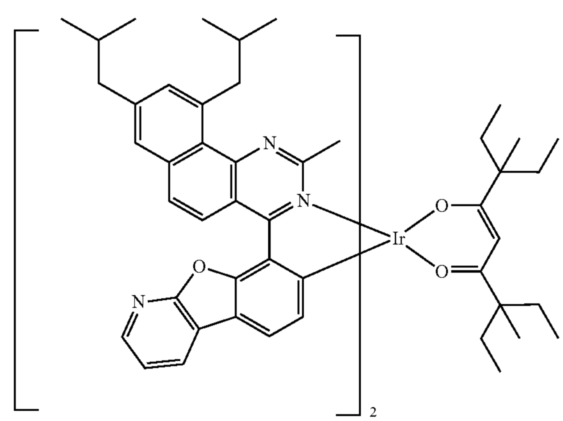

332
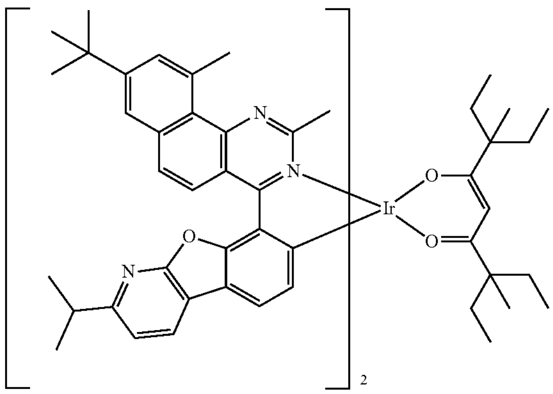
333
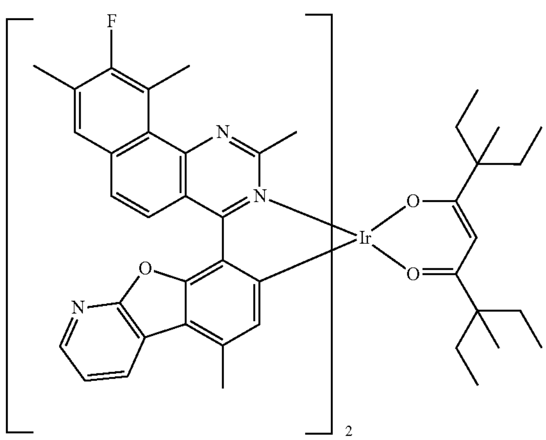
334
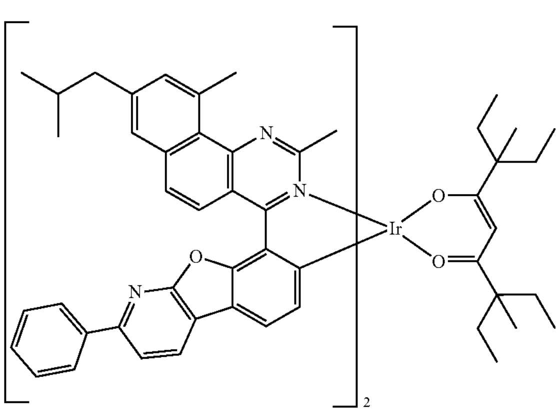
335
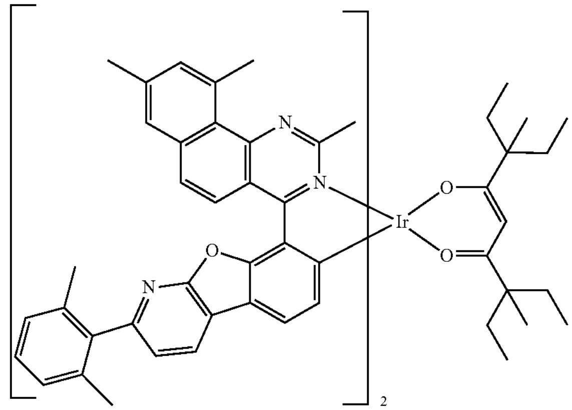
336
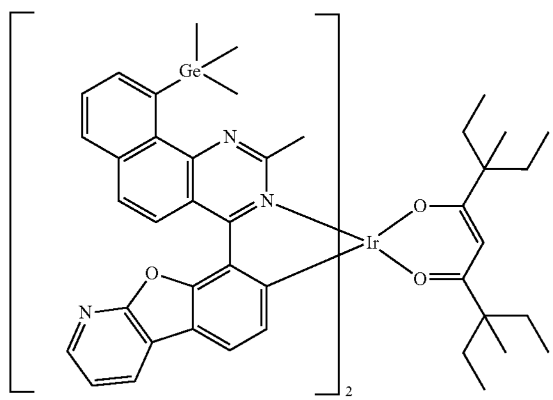
337
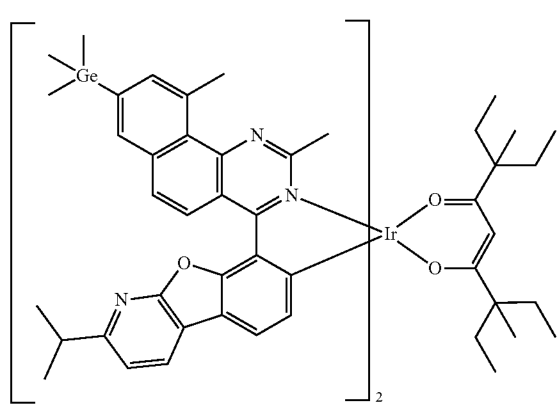

-continued
338
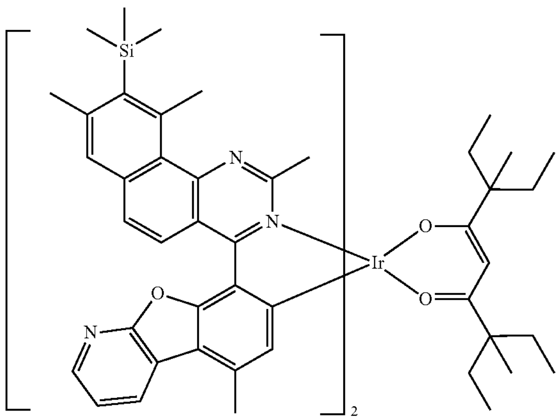
339
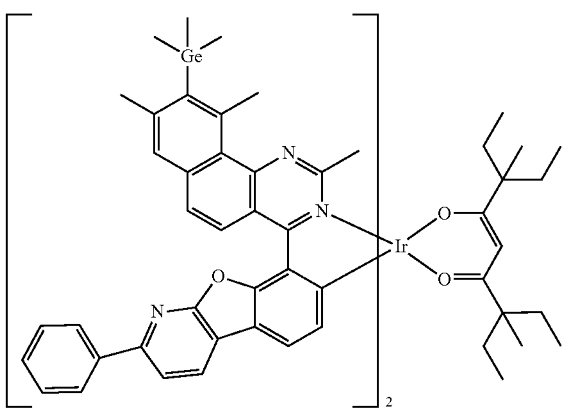
340
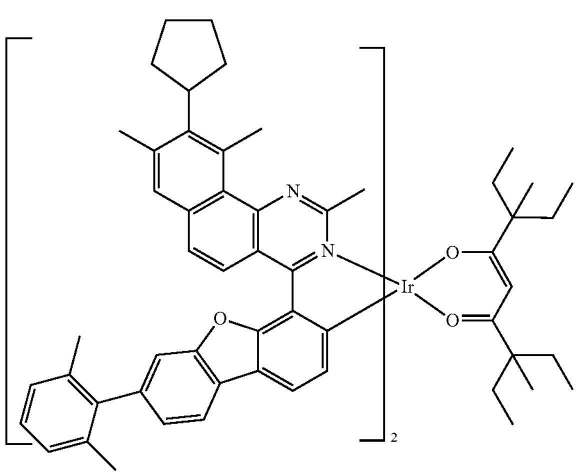
-continued
341
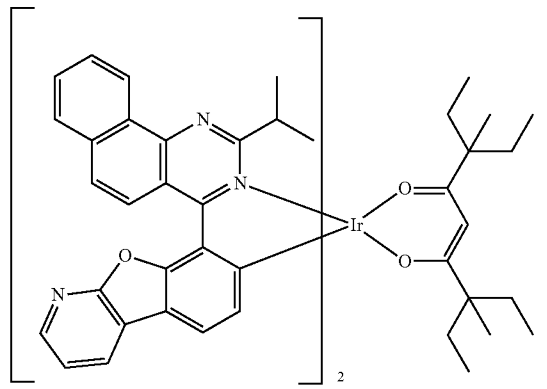
342
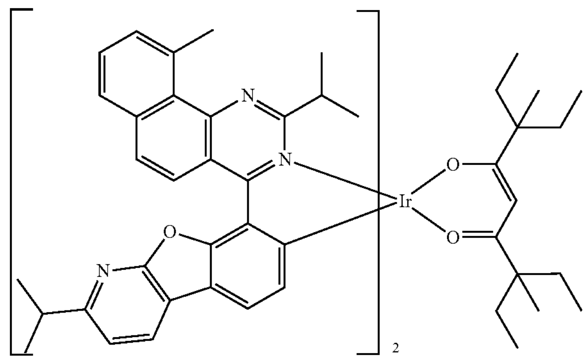
343
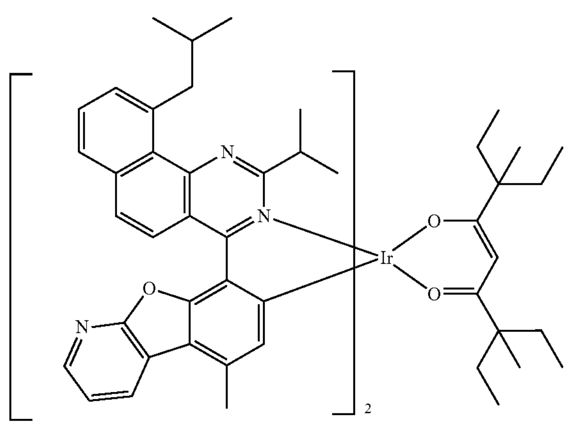
344
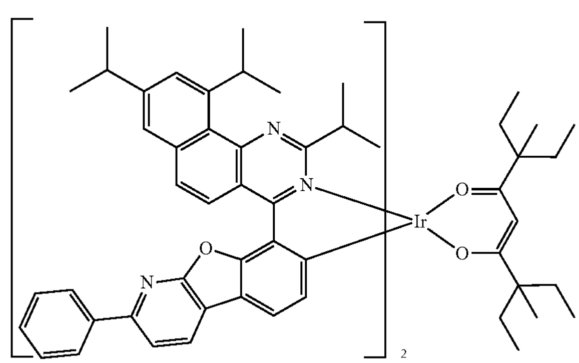

-continued
345
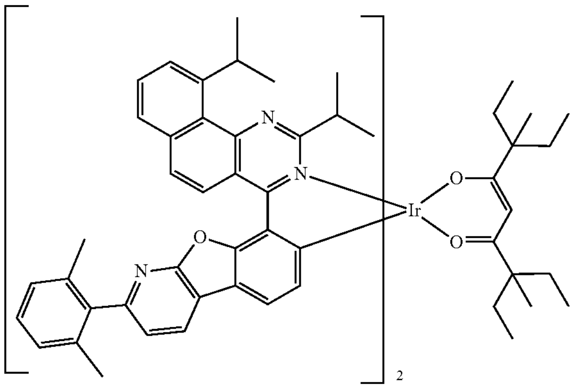
346
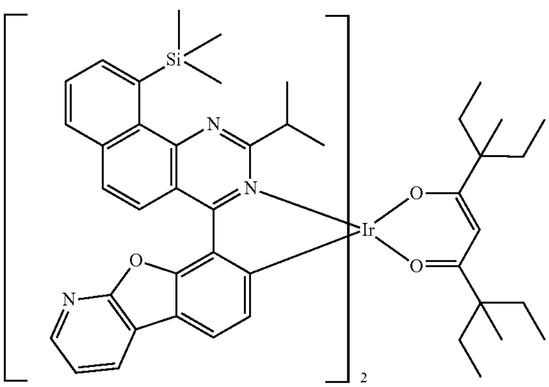
347
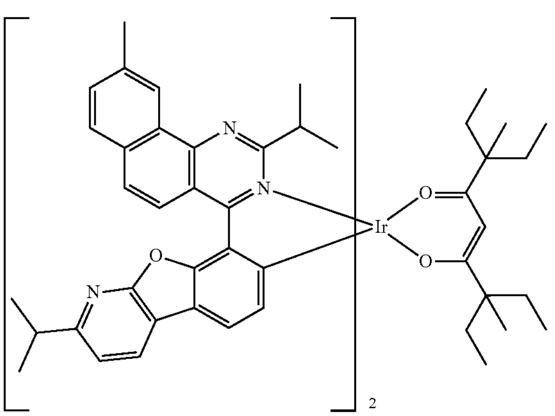
-continued
348
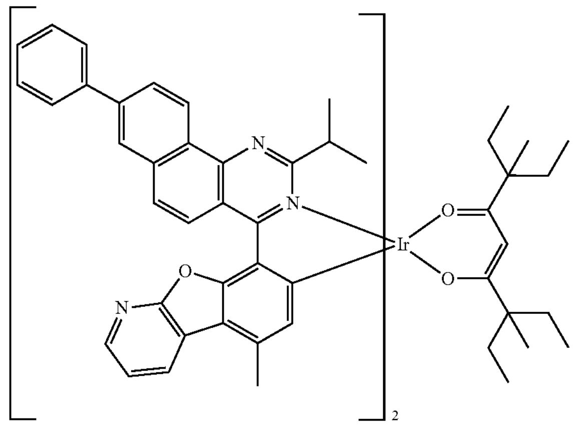
349
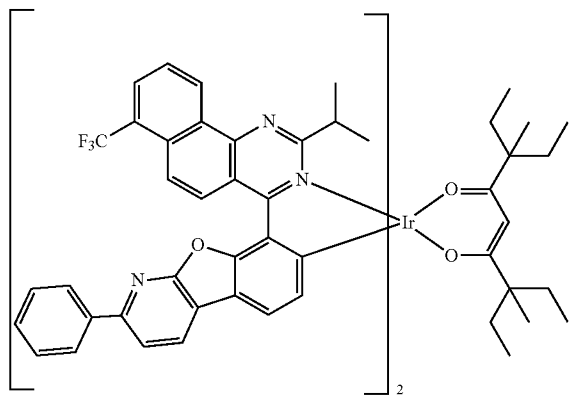
350
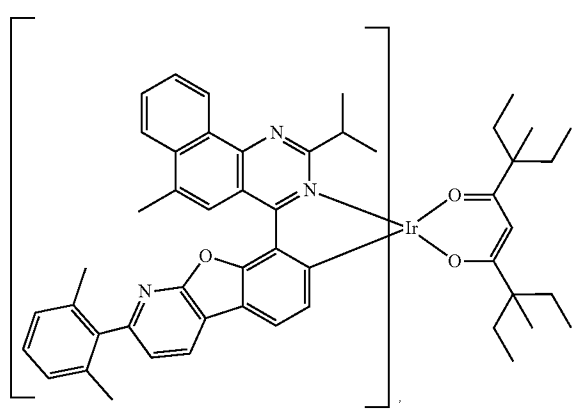

-continued
351
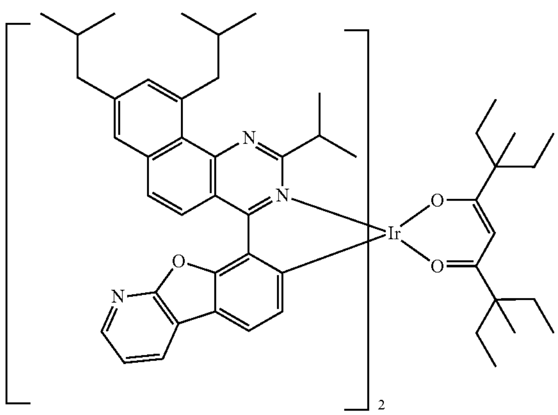
352
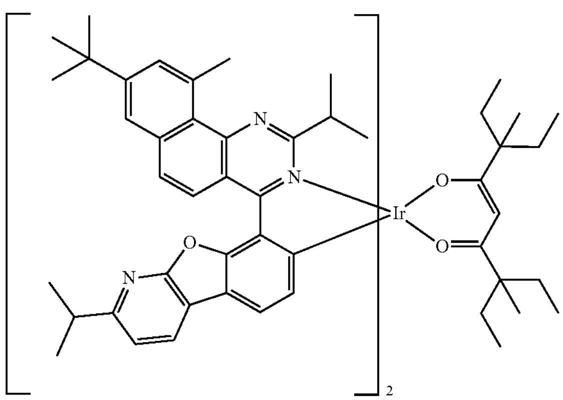
353
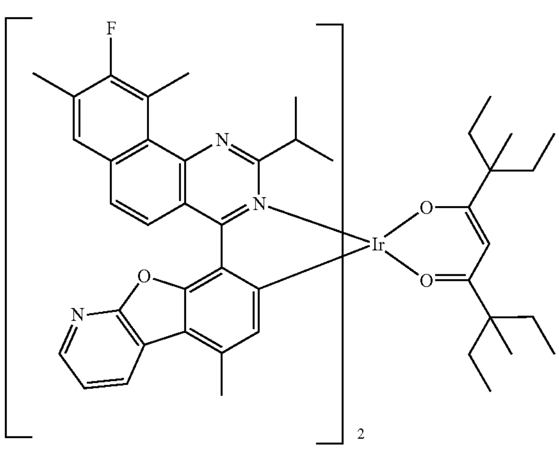
-continued
354
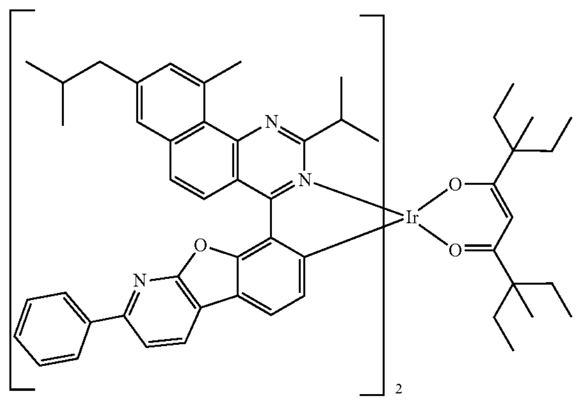
355
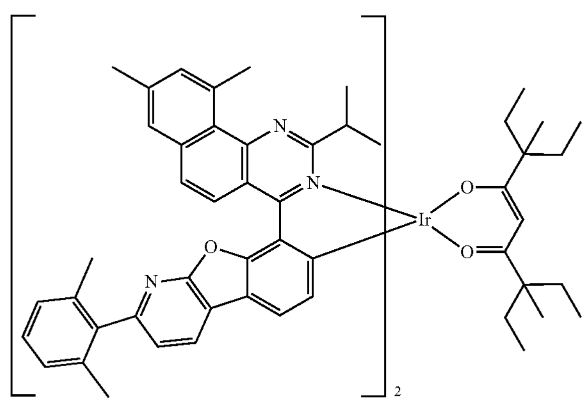
356
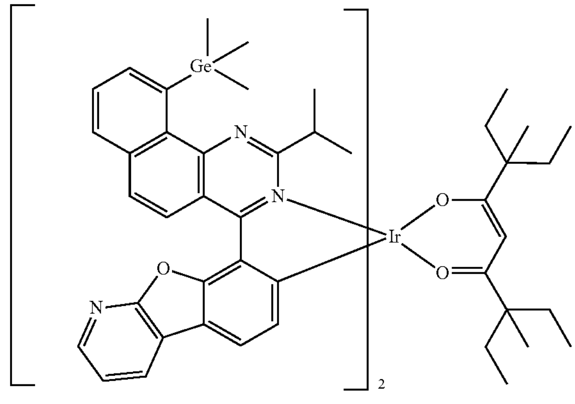

357
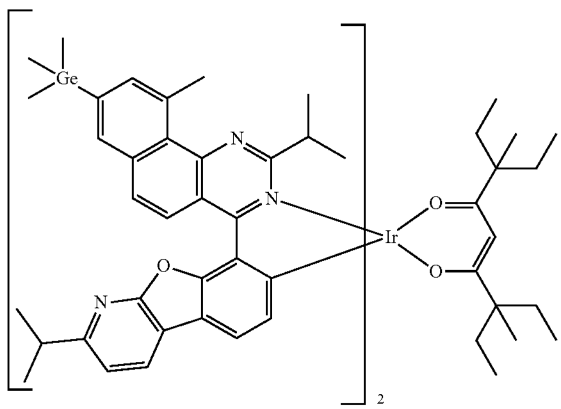
358
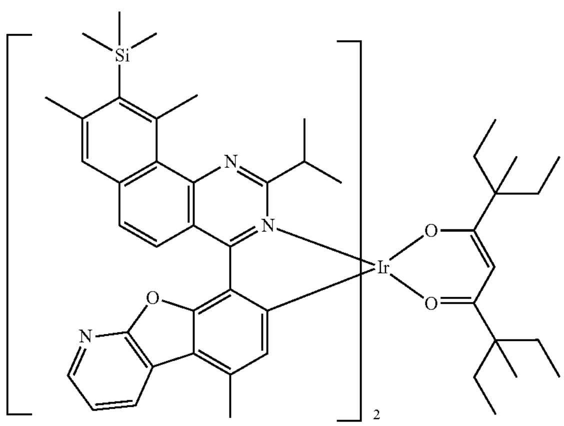
359
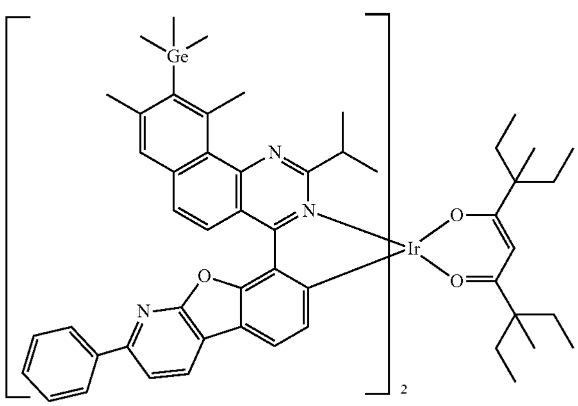
360
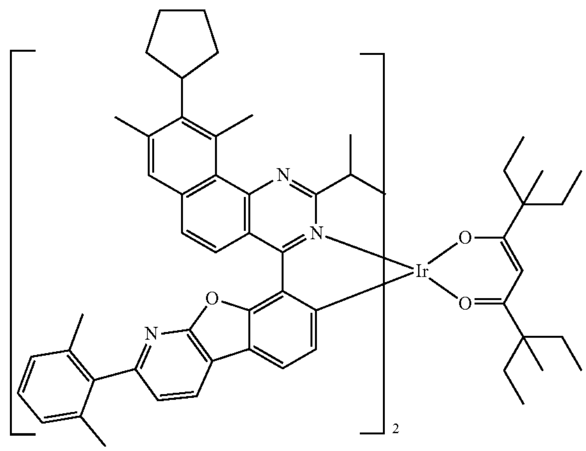
491
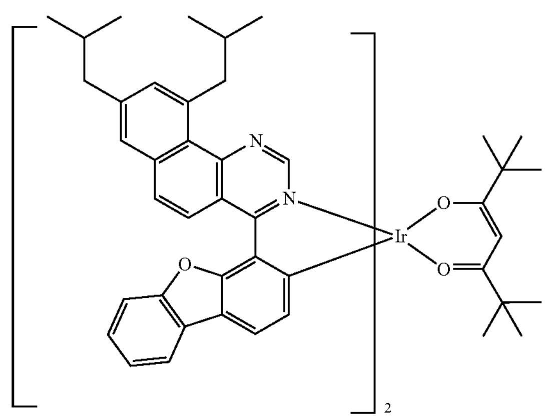
492
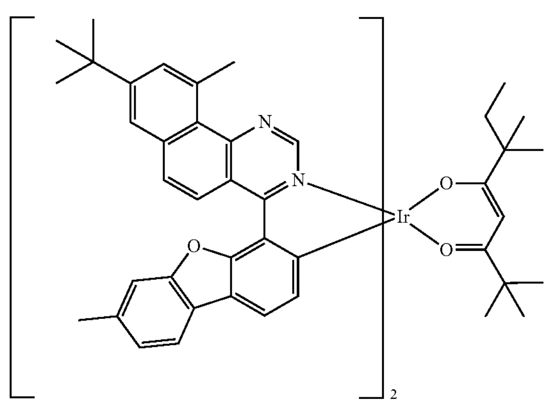

-continued
493
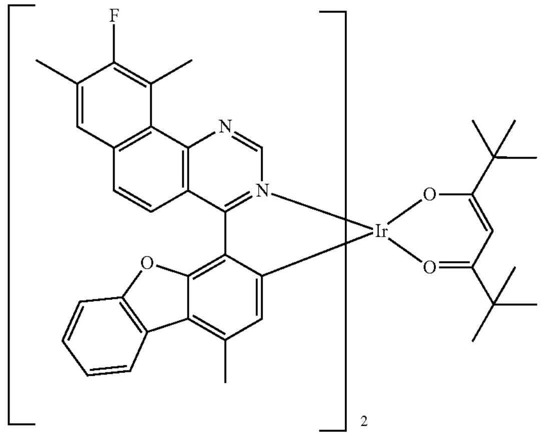
494
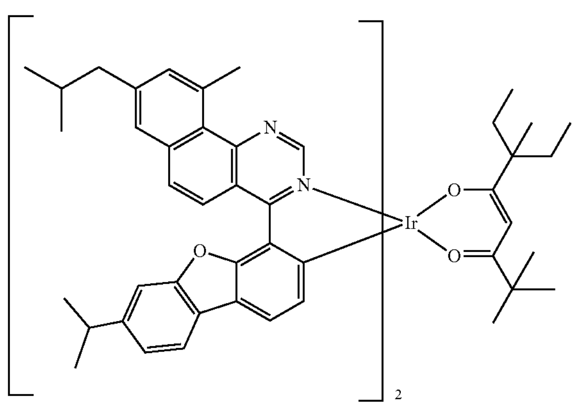
495
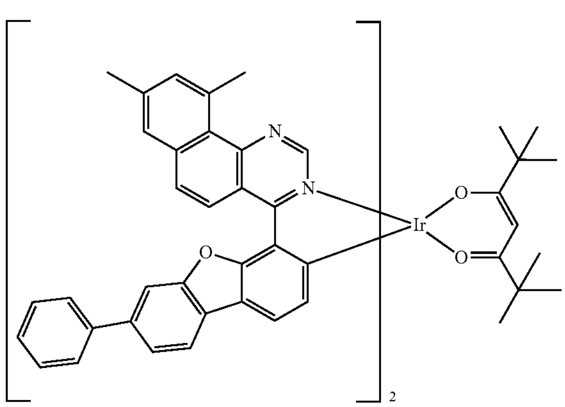
-continued
496
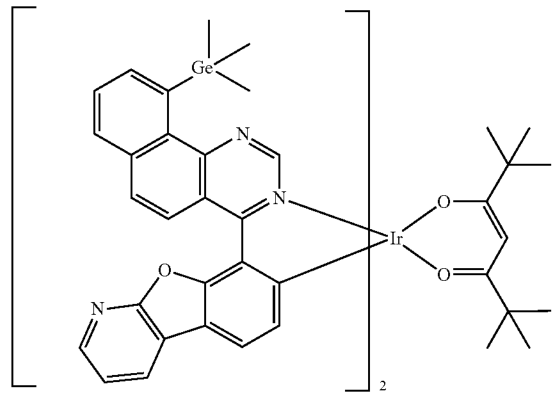
497
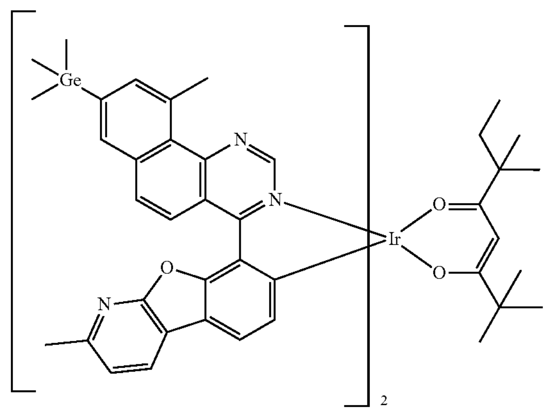
498
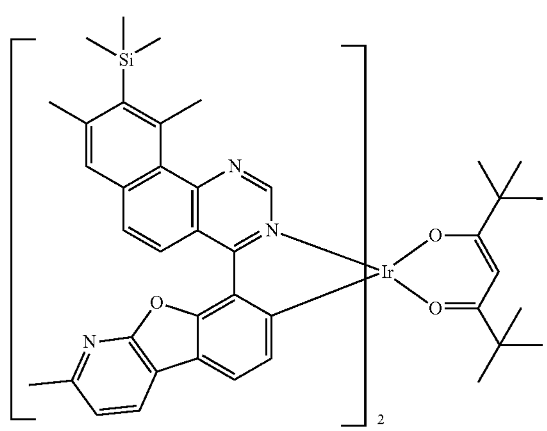

-continued
499
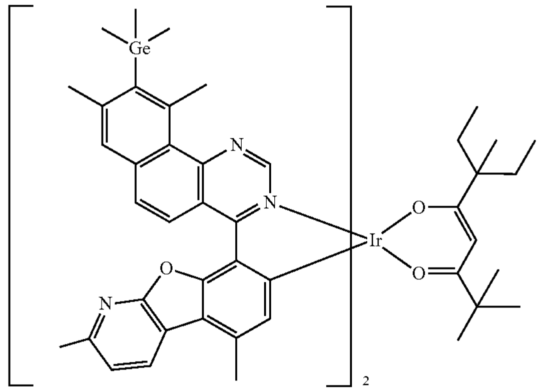
500
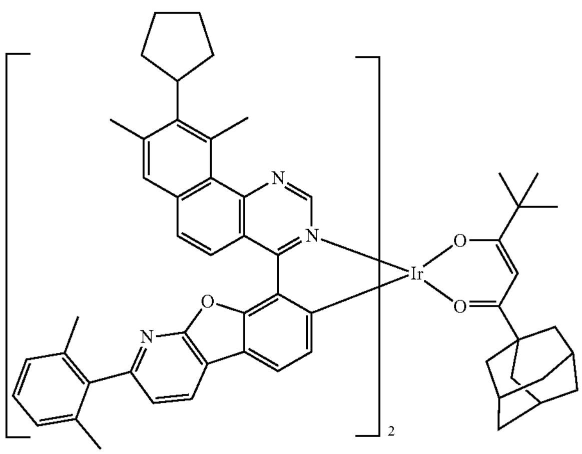
511
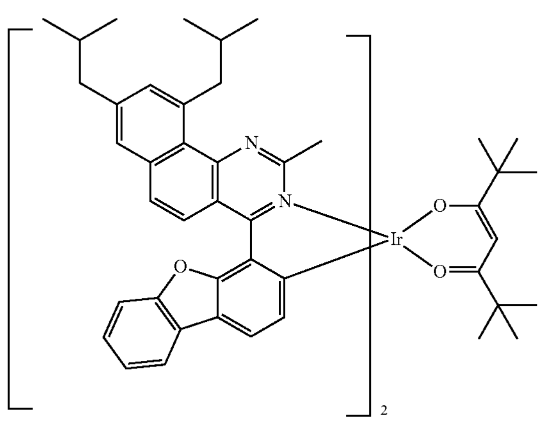
-continued
512
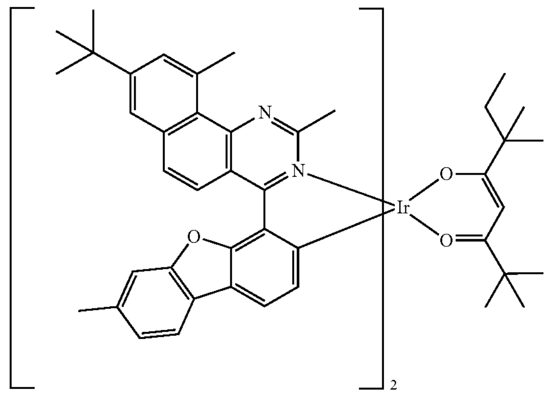
513
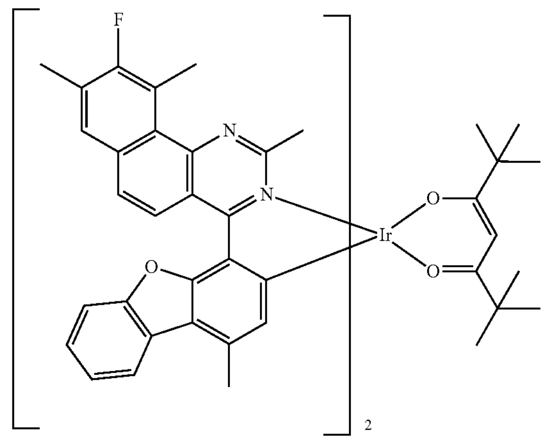
514
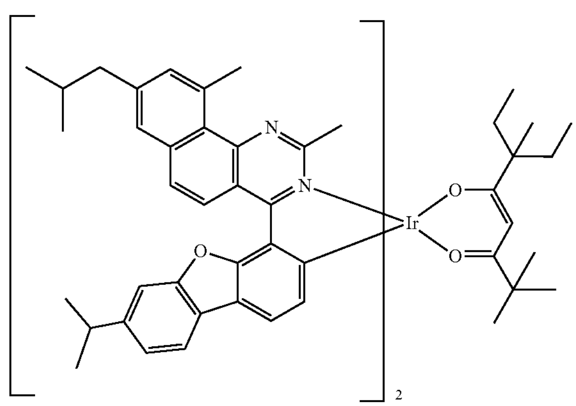

515
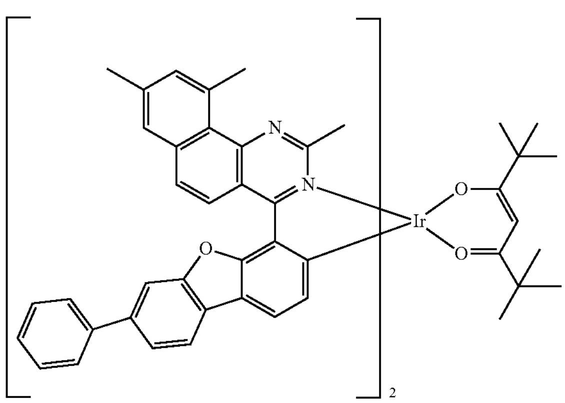
516
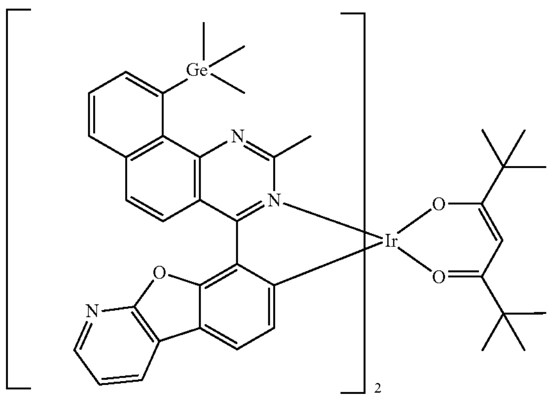
517
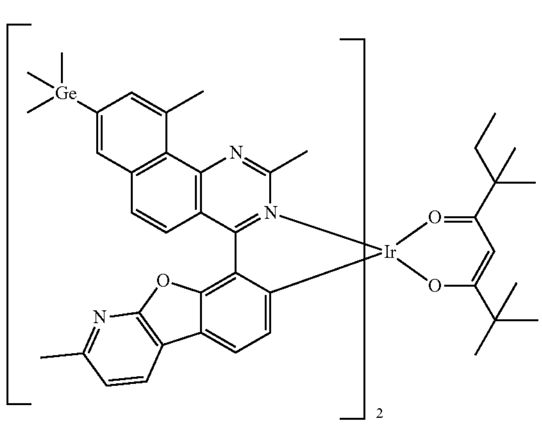
518
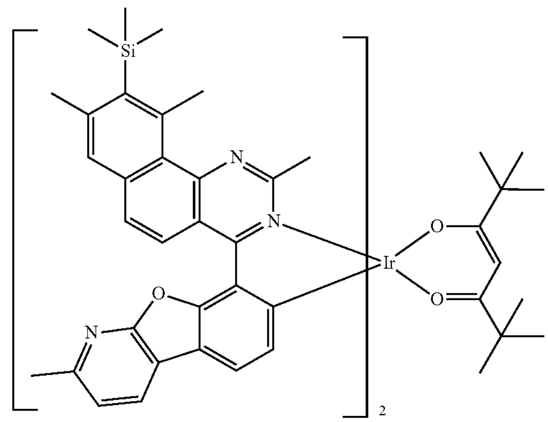
519
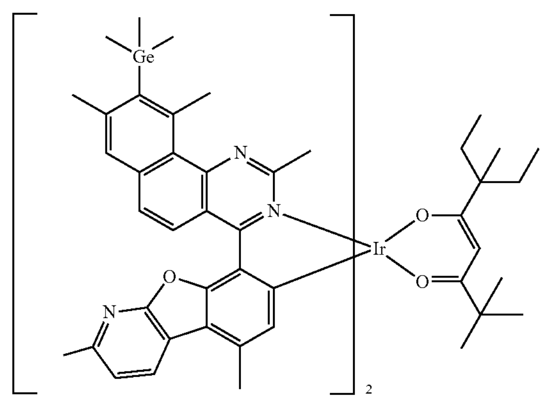
520
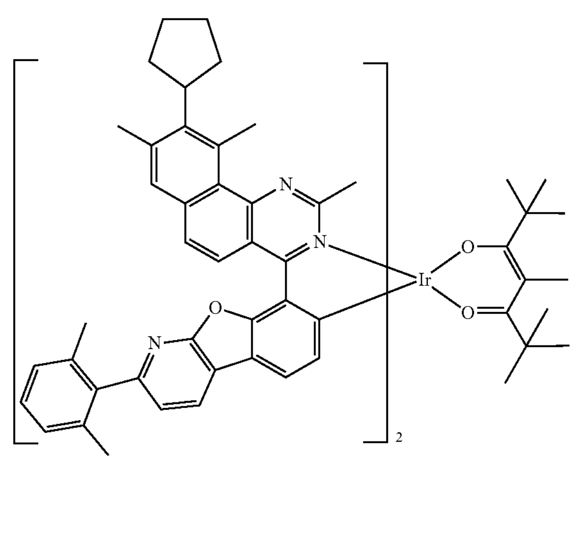

-continued
531
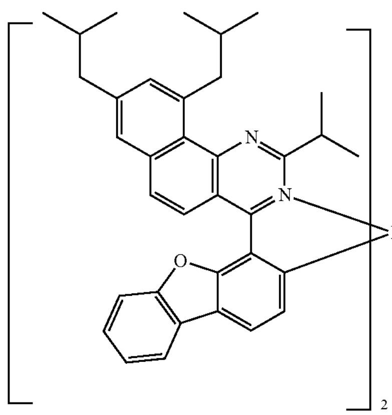
534
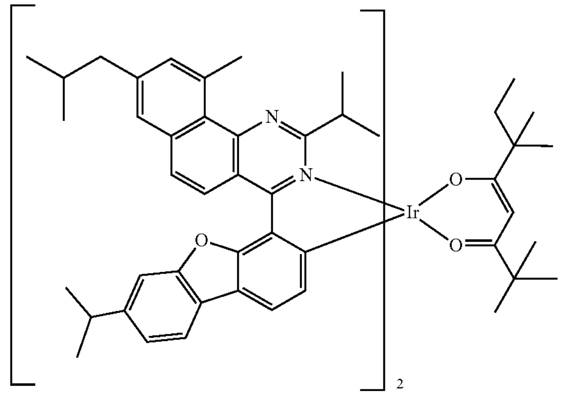
532
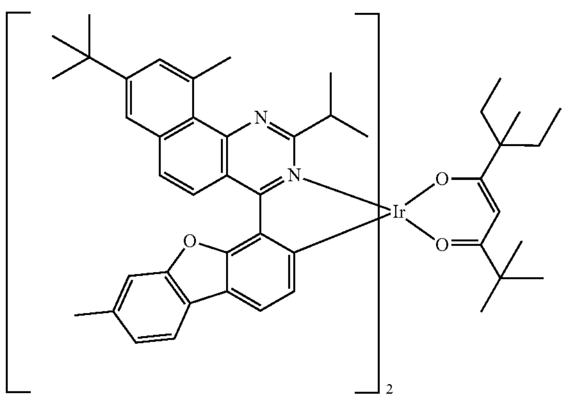
535
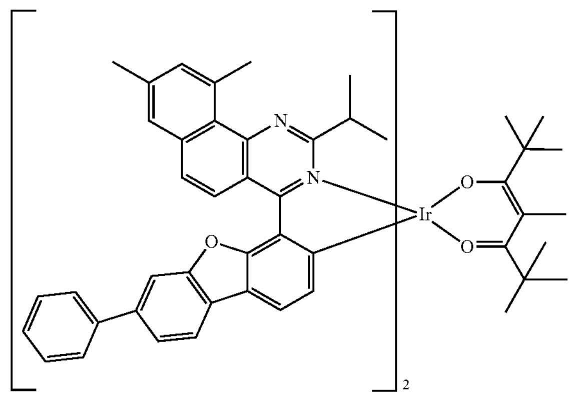
533
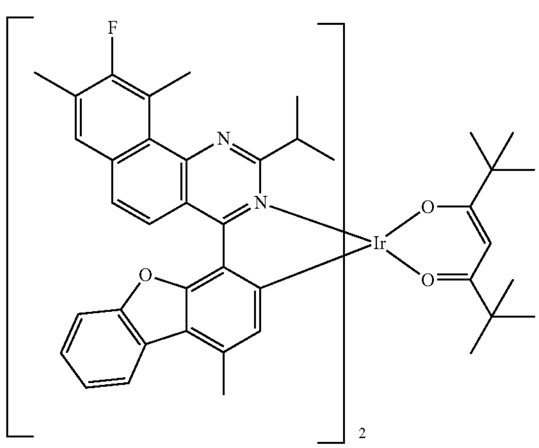
536
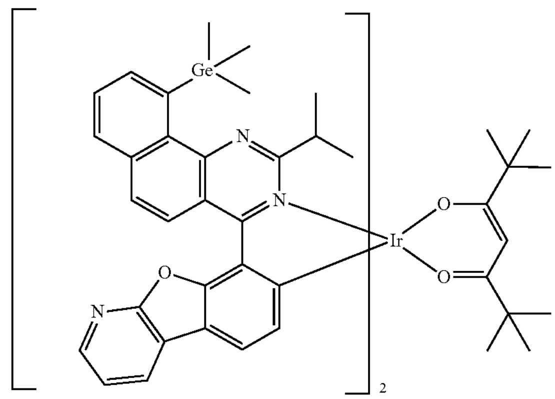

537
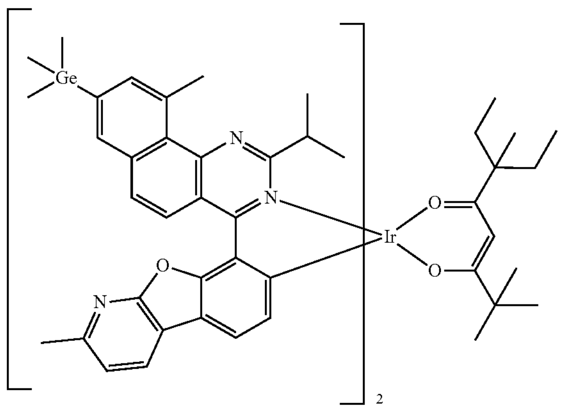
538
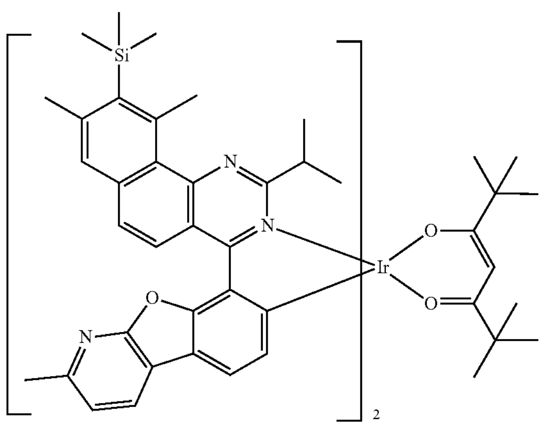
539
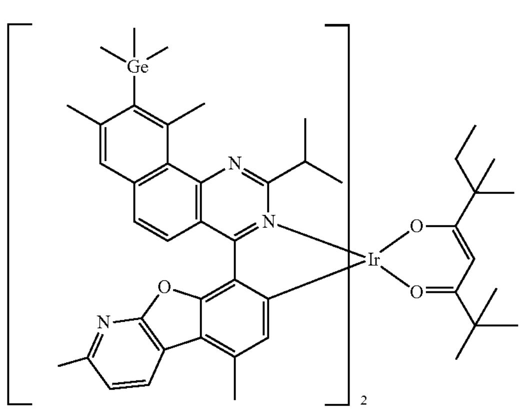
540
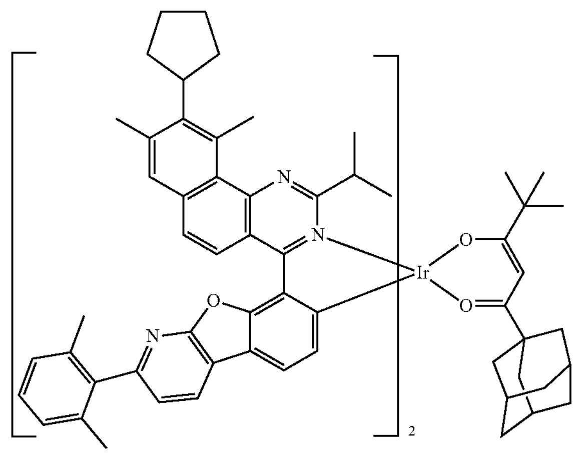
607
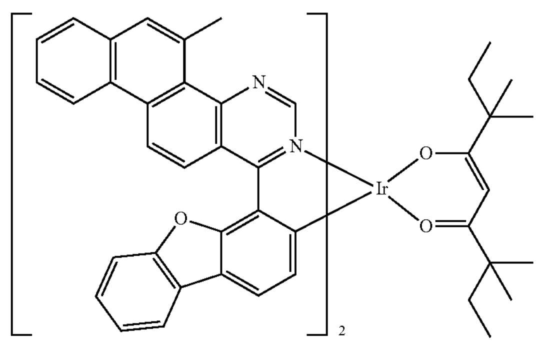
608
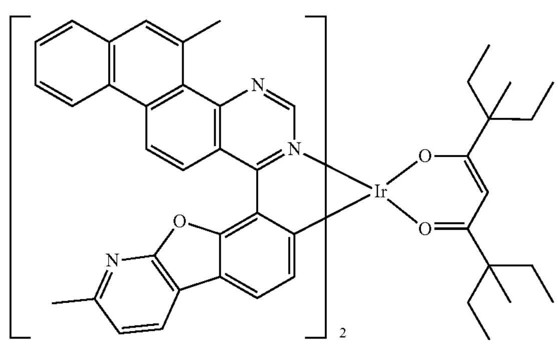
609
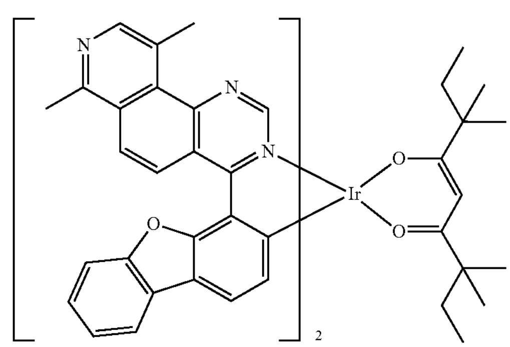

-continued

610

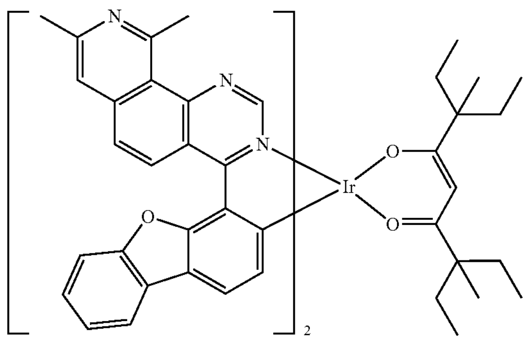

627

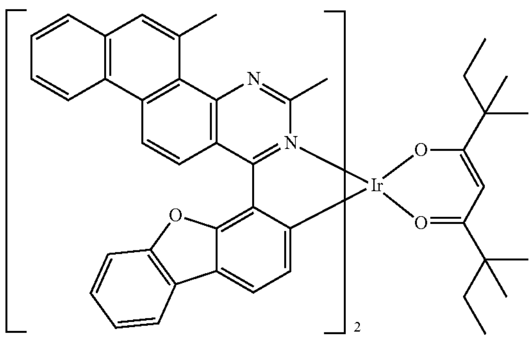

628

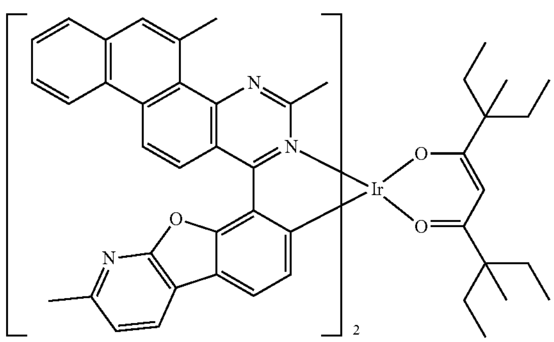

629

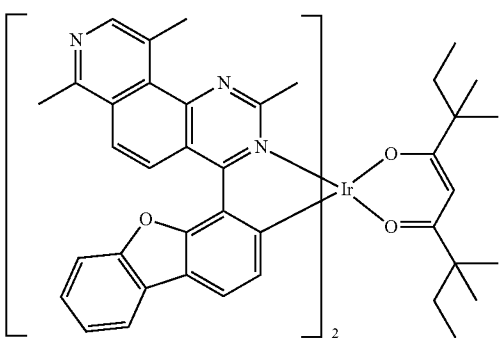

-continued

630

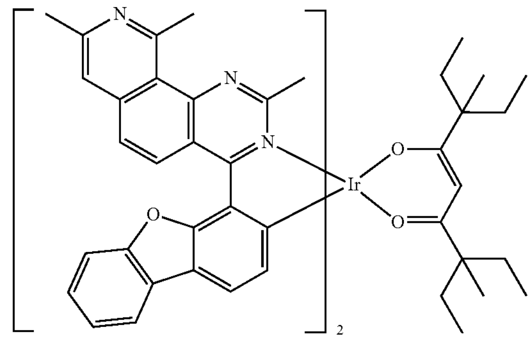

686

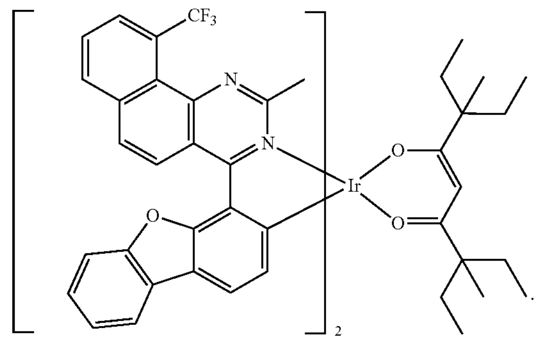

7. The organometallic compound of claim 1, wherein $R_1$ and $R_2$ are each independently:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, a $C_2$-$C_{20}$ alkenyl group, a $C_1$-$C_{20}$ alkoxy group, or a $C_1$-$C_{20}$ alkylthio group;

a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with at least one of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl) cyclohexyl group, a ($C_1$-$C_{20}$ alkyl)cycloheptyl group, a ($C_1$-$C_{20}$ alkyl)cyclooctyl group, a ($C_1$-$C_{20}$ alkyl) adamantanyl group, a ($C_1$-$C_{20}$ alkyl) norbornanyl group, a ($C_1$-$C_{20}$ alkyl) norbornenyl group, a ($C_1$-$C_{20}$ alkyl) cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl) bicyclo[1.1.1]pentyl group, a ($C_1$-$C_{20}$ alkyl) bicyclo[2.1.1]hexyl group, a ($C_1$-$C_{20}$ alkyl) bicyclo[2.2.2]octyl group, a phenyl group, a ($C_1$-$C_{20}$ alkyl)

phenyl group, a biphenyl group, a terphenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl) adamantanyl group, a ($C_1$-$C_{20}$ alkyl) norbornanyl group, a ($C_1$-$C_{20}$ alkyl) norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl) bicyclo[1.1.1]pentyl group, a ($C_1$-$C_{20}$ alkyl) bicyclo[2.1.1]hexyl group, a ($C_1$-$C_{20}$ alkyl) bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group; or $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$, wherein $Q_1$ to $Q_9$ are each independently:

deuterium, —F, $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, $—CD_2CDH_2$, $—CF_3$, $—CF_2H$, $—CFH_2$, $—CH_2CF_3$, $—CH_2CF_2H$, $—CH_2CFH_2$, $—CHFCH_3$, $—CHFCF_2H$, $—CHFCFH_2$, $—CHFCF_3$, $—CF_2CF_3$, $—CF_2CF_2H$, or $—CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, or a phenyl group.

8. The organometallic compound of claim 1, wherein a group represented by

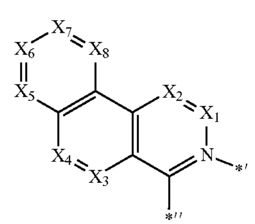

in Formula 2 is represented by one of Formulae CY1-A to CY1-C:

CY1-A

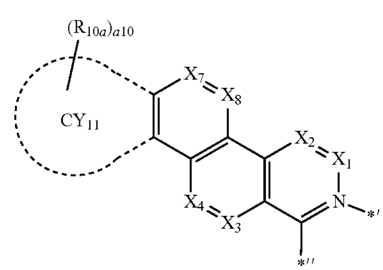

-continued

CY1-B

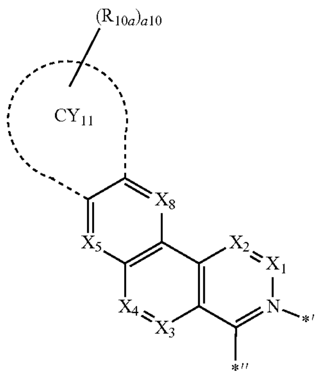

CY1-C

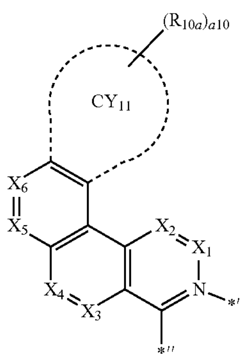

wherein, in Formulae CY1-A to CY1-C, $X_1$ to $X_8$ are each independently C or N, at least one of $X_1$, $X_2$, $X_3$, $X_4$, $X_7$, and $X_8$ in Formula CY1-A is N, at least one of $X_1$, $X_2$, $X_3$, $X_4$, $X_5$, and $X_8$ in Formula CY1-B is N, and at least one of $X_1$ to $X_6$ in Formula CY1-C is N, ring $CY_{11}$ is a $C_5$-$C_{30}$ carbocyclic group or a $C_1$-$C_{30}$ heterocyclic group, a10 is an integer from 0 to 20,

*' indicates a binding site to M in Formula 1, and

*" indicates a binding site to ring CY2 in Formula 2.

9. The organometallic compound of claim 1, wherein a group represented by

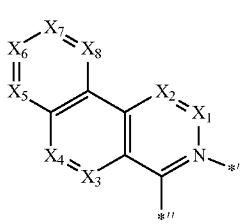

in Formula 2 is represented by one of Formulae CY1(1) to CY1(27):

CY1(1)

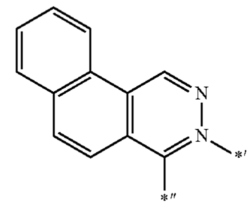

CY1(2)

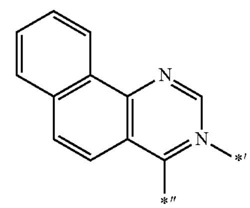

CY1(3)

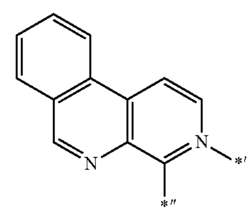

CY1(4)

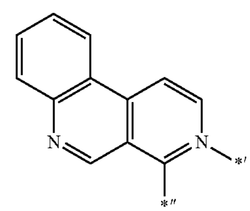

CY1(5)

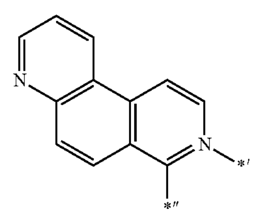

CY1(6)

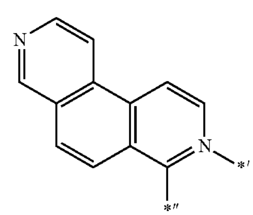

CY1(7)

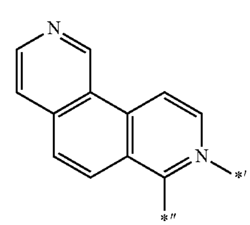

-continued
CY1(8)
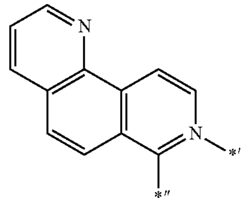
CY1(9)
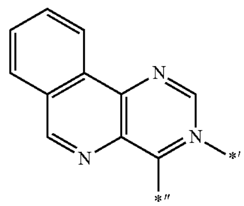
CY1(10)
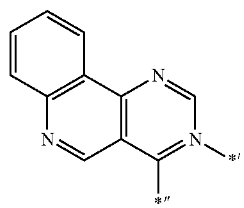
CY1(11)
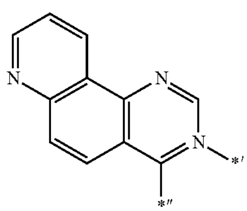
CY1(12)
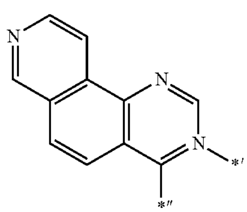
CY1(13)
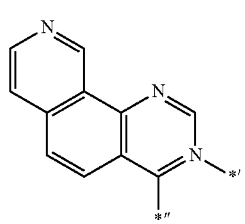
CY1(14)
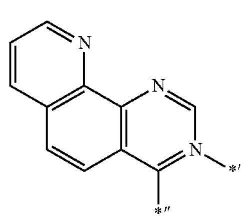
-continued
CY1(15)
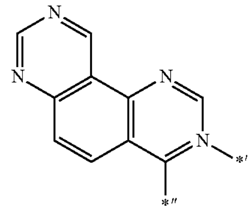
CY1(16)
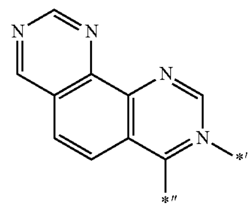
CY1(17)
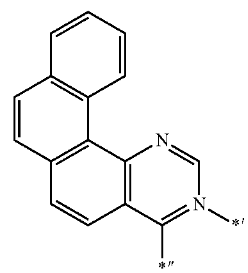
CY1(18)
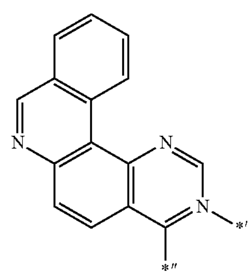
CY1(19)
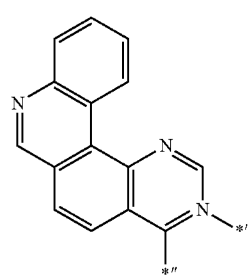
CY1(20)
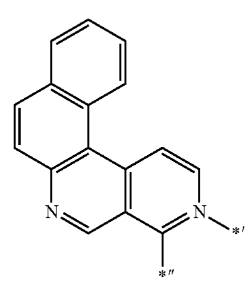

-continued
CY1(21)
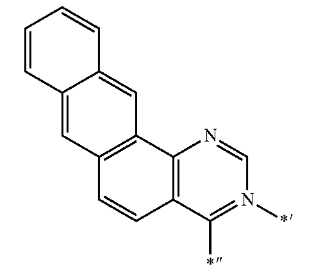
CY1(22)
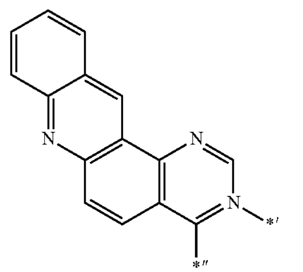
CY1(23)
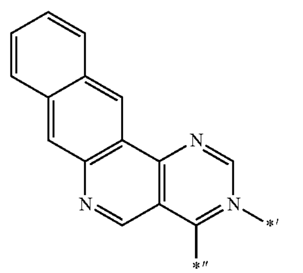
CY1(24)
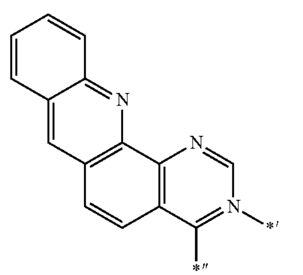
CY1(25)
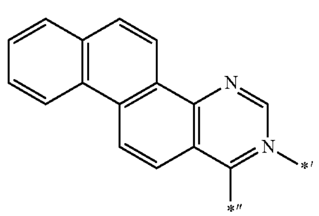
CY1(26)
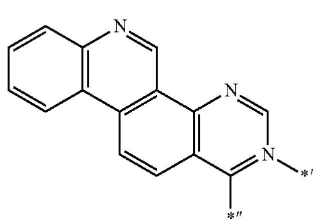
-continued
CY1(27)
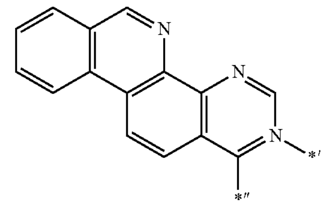
wherein, in Formulae CY1(1) to CY1(27), *' indicates a binding site to M in Formula 1, and *" indicates a binding site to ring CY2 in Formula 2.
10. The organometallic compound of claim 1, wherein a group represented by
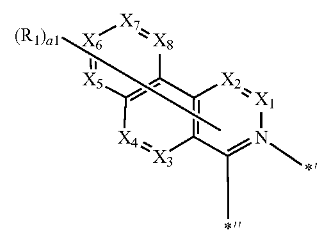
in Formula 2 is represented by one of Formulae CY1-1 to CY1-128:
CY1-1
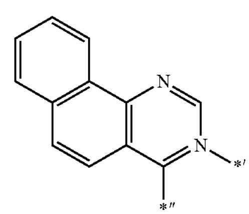
CY1-2
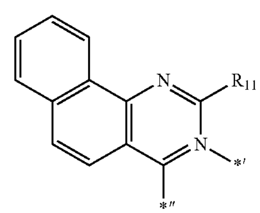
CY1-3
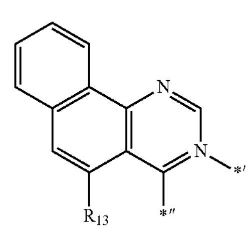
CY1-4
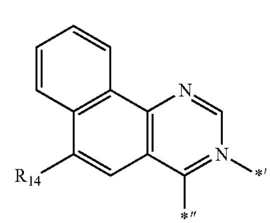

-continued
CY1-5
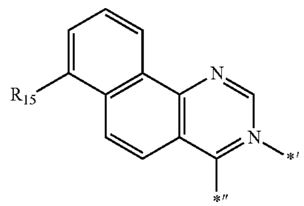
CY1-6
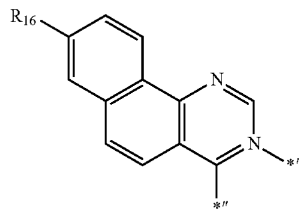
CY1-7
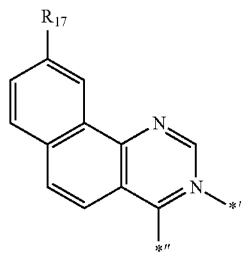
CY1-8
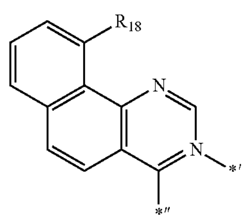
CY1-9
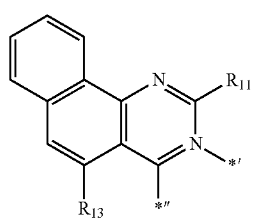
CY1-10
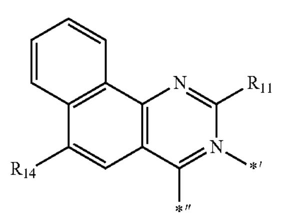
CY1-11
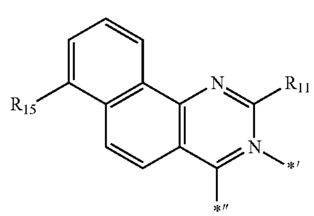
-continued
CY1-12
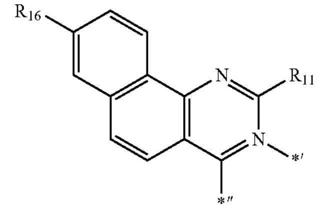
CY1-13
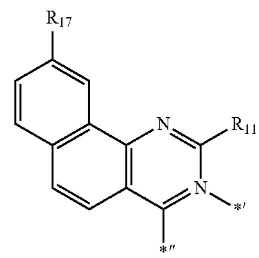
CY1-14
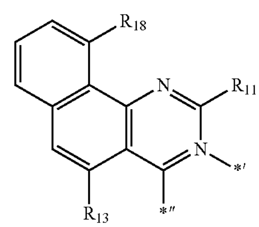
CY1-15
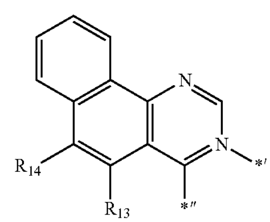
CY1-16
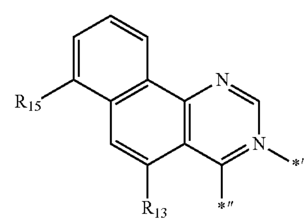
CY1-17
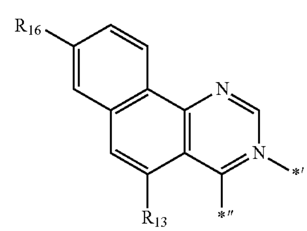
CY1-18
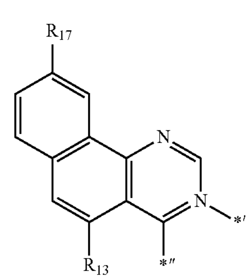

-continued
CY1-19
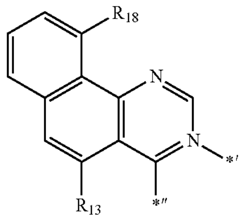
CY1-20
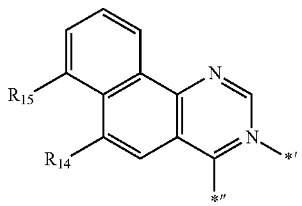
CY1-21
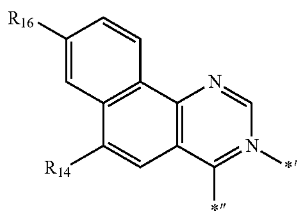
CY1-22
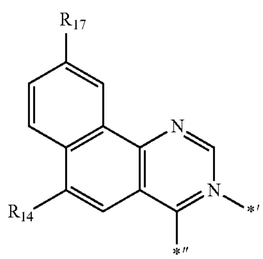
CY1-23
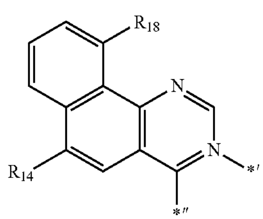
CY1-24
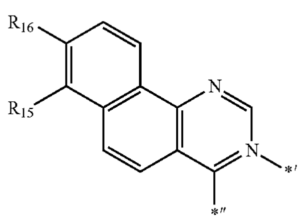
CY1-25
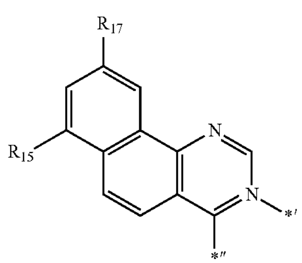
-continued
CY1-26
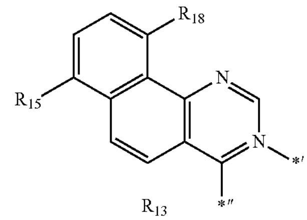
CY1-27
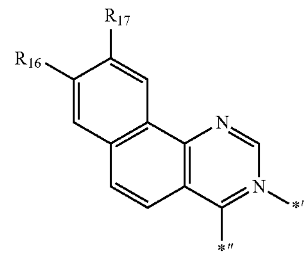
CY1-28
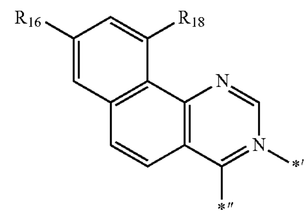
CY1-29
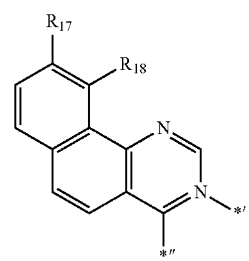
CY1-30
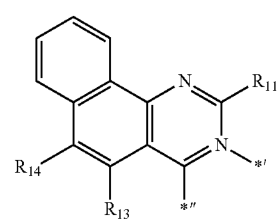
CY1-31
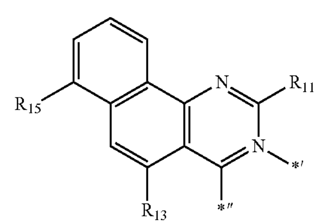
CY1-32
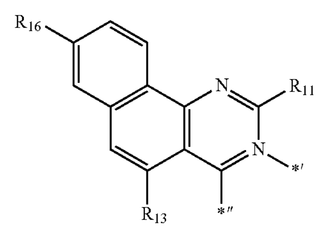

CY1-33
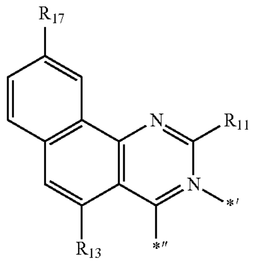
CY1-34
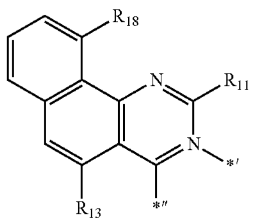
CY1-35
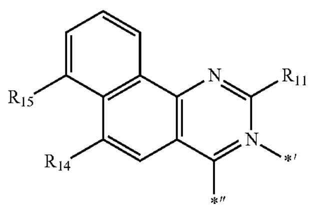
CY1-36
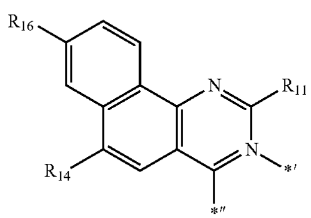
CY1-37
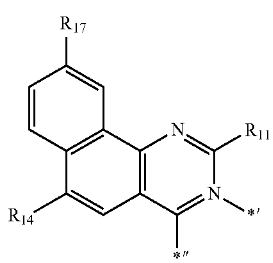
CY1-38
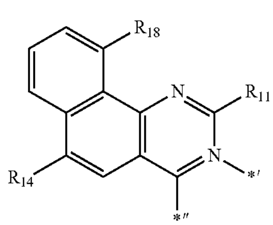
CY1-39
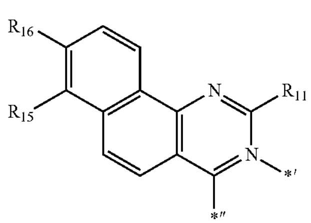
CY1-40
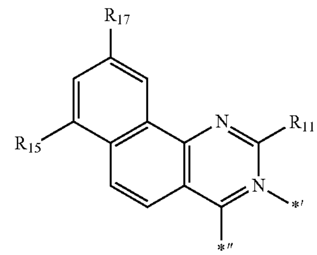
CY1-41
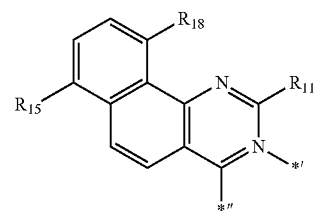
CY1-42
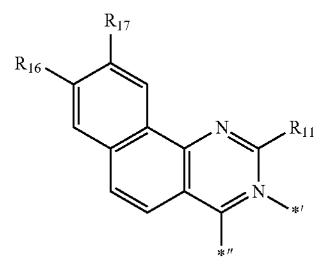
CY1-43
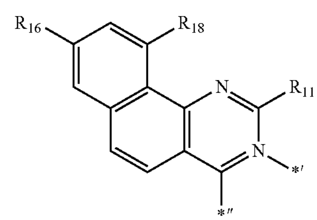
CY1-44
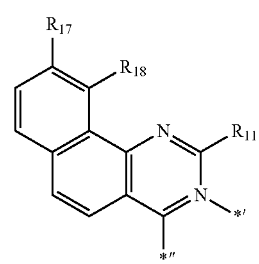
CY1-45
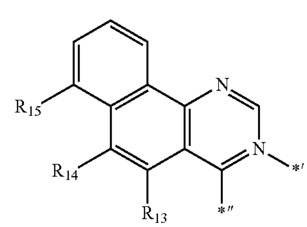

-continued
CY1-46
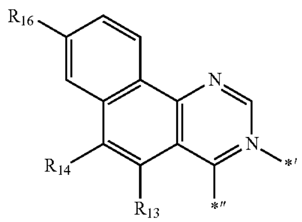
CY1-47
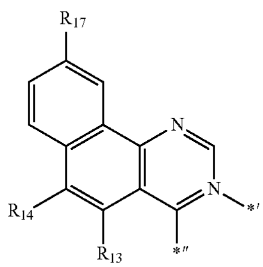
CY1-48
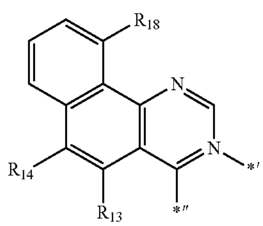
CY1-49
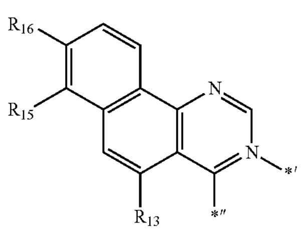
CY1-50
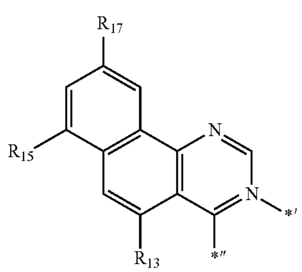
CY1-51
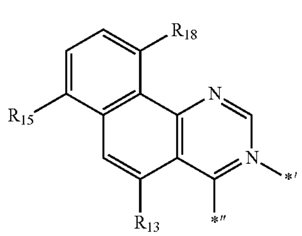
-continued
CY1-52
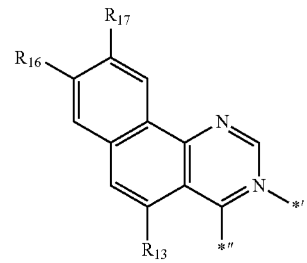
CY1-53
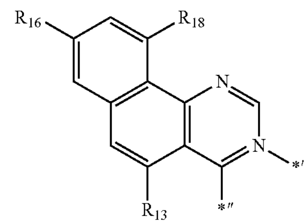
CY1-54
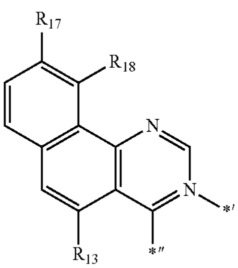
CY1-55
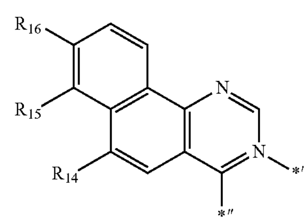
CY1-56
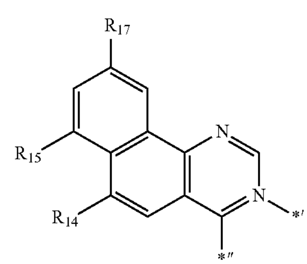
CY1-57
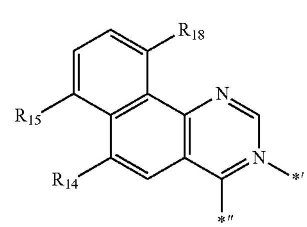

-continued
CY1-58
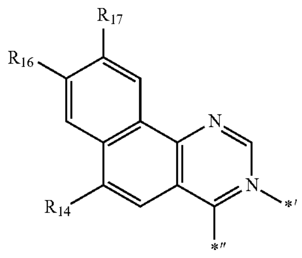
CY1-59
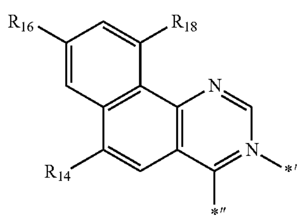
CY1-60
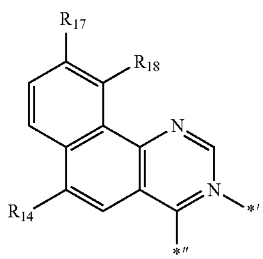
CY1-61
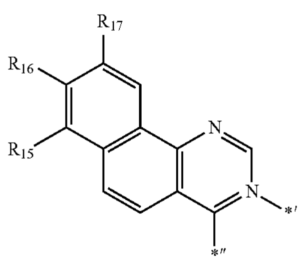
CY1-62
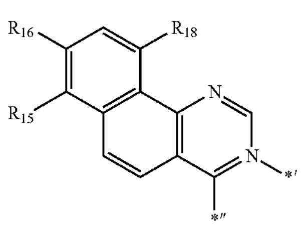
CY1-63
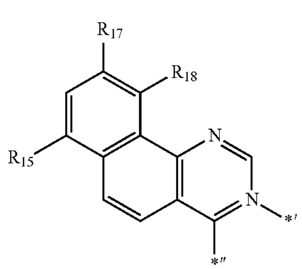
-continued
CY1-64
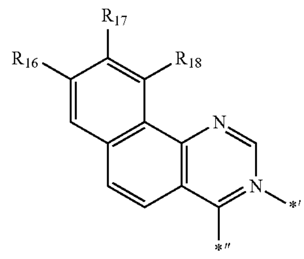
CY1-65
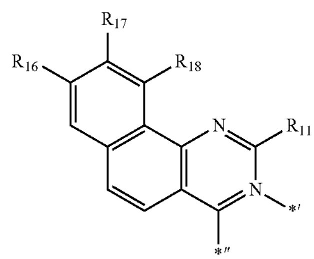
CY1-66
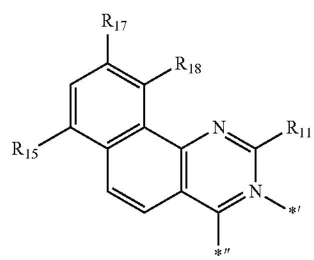
CY1-67
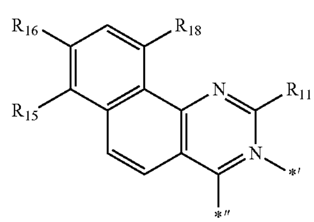
CY1-68
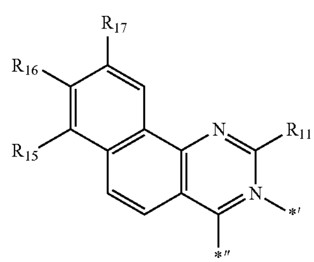
CY1-69
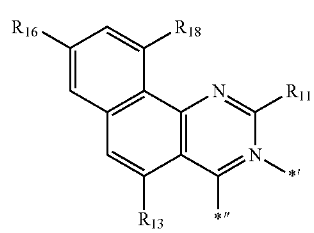

CY1-70
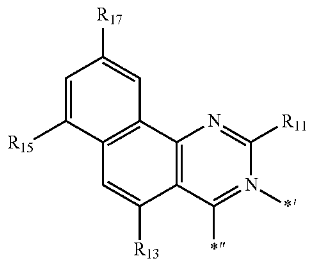
CY1-71
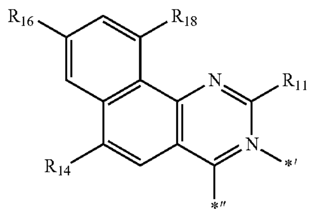
CY1-72
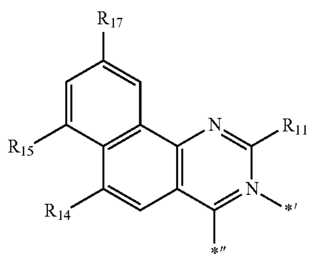
CY1-73
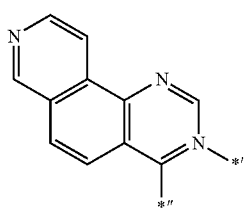
CY1-74
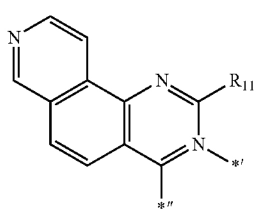
CY1-75
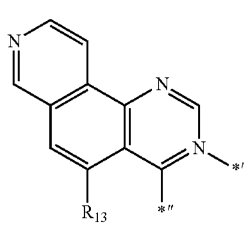
CY1-76
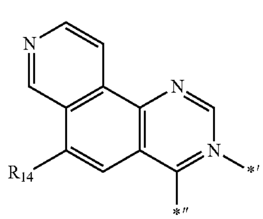
CY1-77
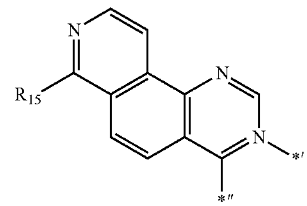
CY1-78
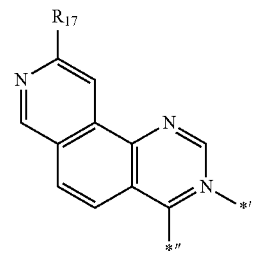
CY1-79
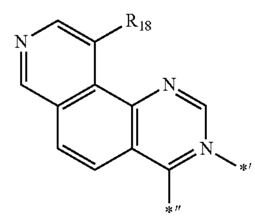
CY1-80
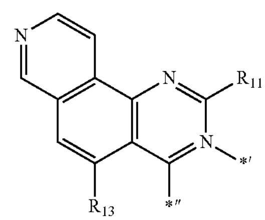
CY1-81
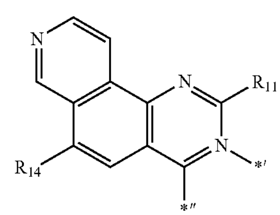
CY1-82
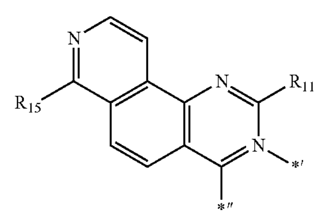
CY1-83
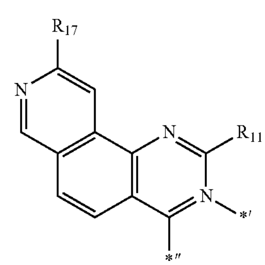

-continued
CY1-84
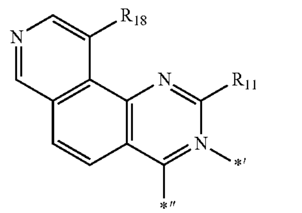
CY1-85
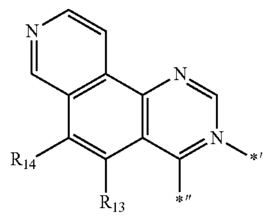
CY1-86
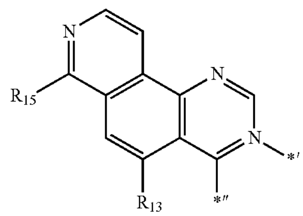
CY1-87
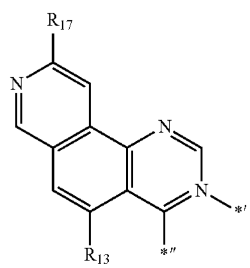
CY1-88
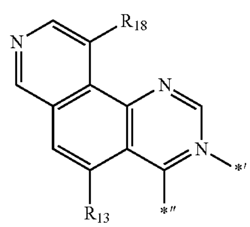
CY1-89
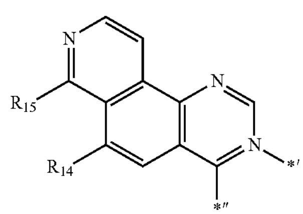
CY1-90
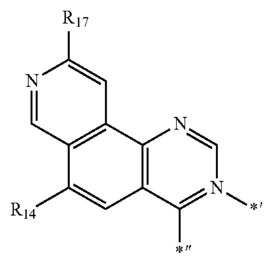
-continued
CY1-91
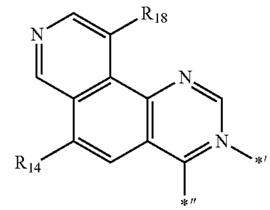
CY1-92
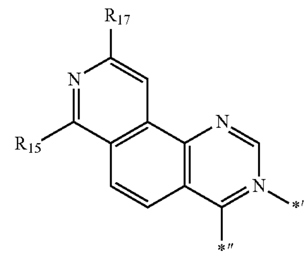
CY1-93
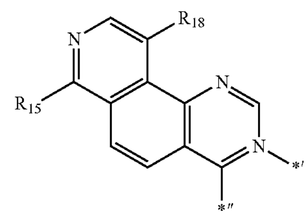
CY1-94
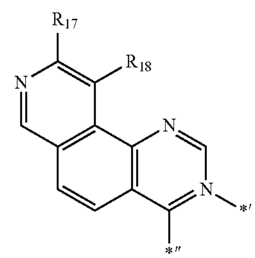
CY1-95
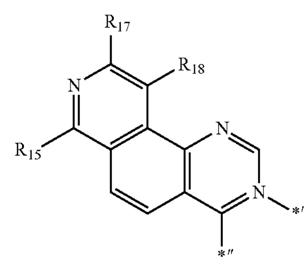
CY1-96
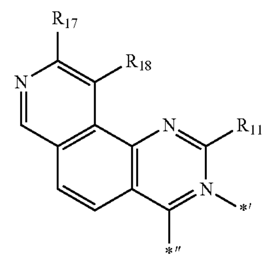

-continued
CY1-97
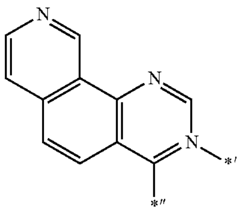
CY1-98
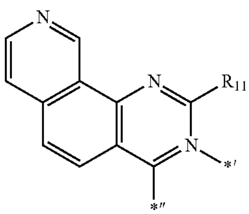
CY1-99
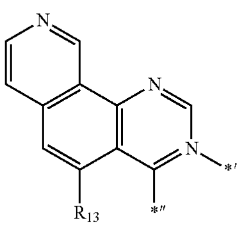
CY1-100
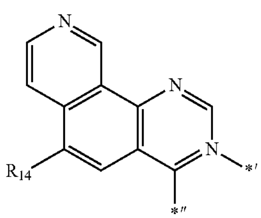
CY1-101
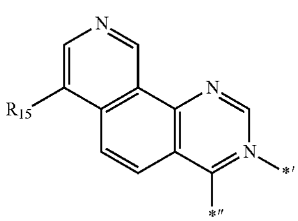
CY1-102
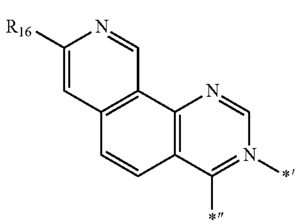
CY1-103
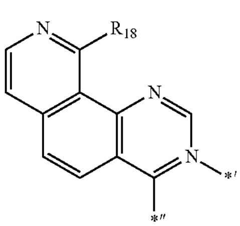
-continued
CY1-104
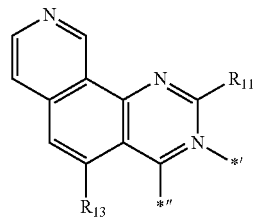
CY1-105
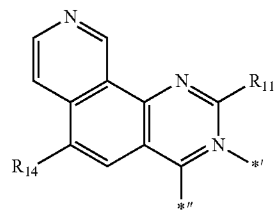
CY1-106
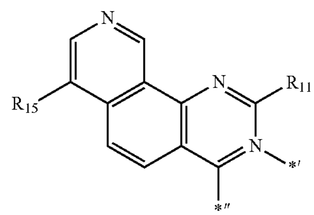
CY1-107
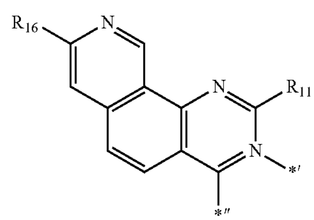
CY1-108
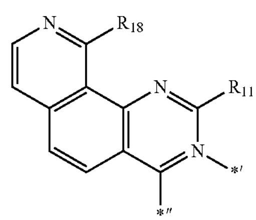
CY1-109
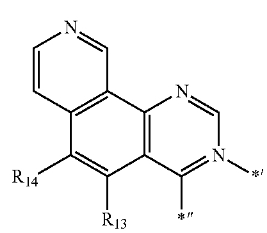
CY1-110
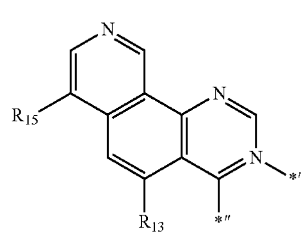

-continued
CY1-111
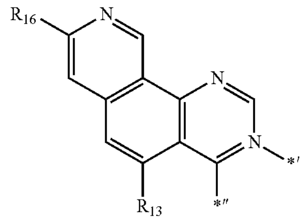
CY1-112
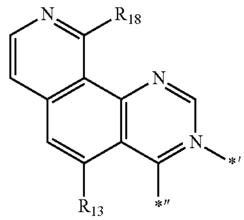
CY1-113
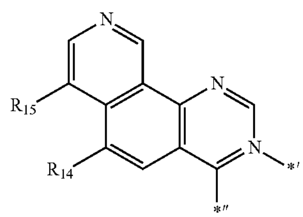
CY1-114
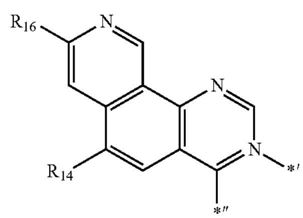
CY1-115
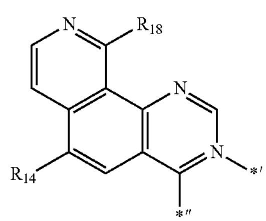
CY1-116
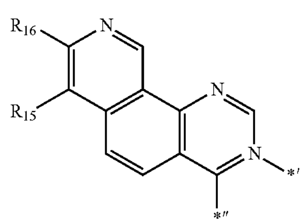
CY1-117
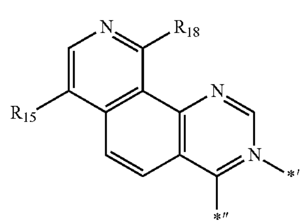
-continued
CY1-118
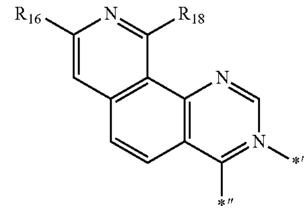
CY1-119
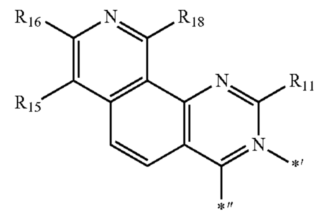
CY1-120
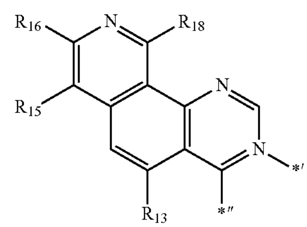
CY1-121
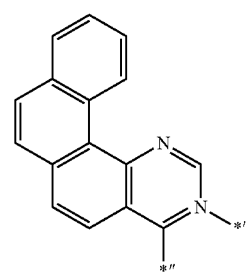
CY1-122
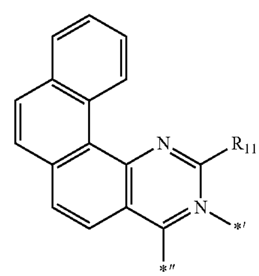
CY1-123
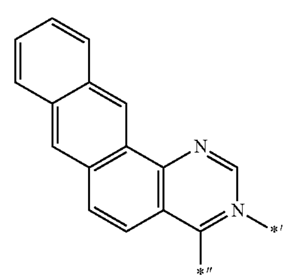

-continued

CY1-124

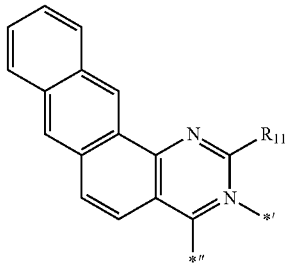

CY1-125

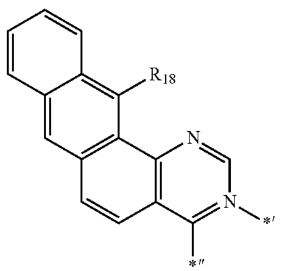

CY1-126

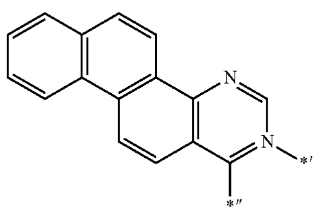

CY1-127

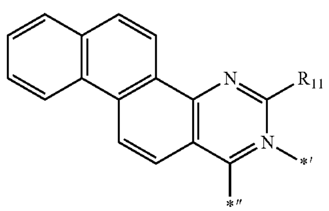

-continued

CY1-128

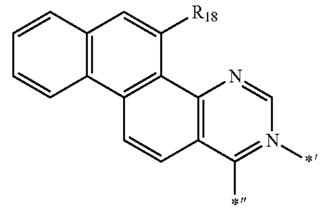

wherein, in Formulae CY1-1 to CY1-128, $R_{11}$ to $R_{18}$ are the same as described in connection with $R_1$, and each of $R_{11}$ to $R_{18}$ is not hydrogen,

*' indicates a binding site to M in Formula 1, and

*" indicates a binding site to ring CY2 in Formula 2.

11. An organic light-emitting device comprising:

a first electrode;

a second electrode; and an organic layer disposed between the first electrode and the second electrode and comprising an emission layer, wherein the organic layer comprises at least one organometallic compound of claim 1.

12. The organic light-emitting device of claim 11, wherein the first electrode is an anode, the second electrode is a cathode, the organic layer further comprises a hole transport region disposed between the first electrode and the emission layer and an electron transport region disposed between the emission layer and the second electrode, the hole transport region includes a hole injection layer, a hole transport layer, an electron blocking layer, a buffer layer, or a combination thereof, and the electron transport region comprises a hole blocking layer, an electron transport layer, an electron injection layer, or a combination thereof.

13. The organic light-emitting device of claim 11, wherein the emission layer comprises the at least one organometallic compound.

14. The organic light-emitting device of claim 13, wherein the emission layer further comprises a host, and an amount of the host is greater than an amount of the at least one organometallic compound.

15. An electronic apparatus comprising the organic light-emitting device of claim 11.

* * * * *